US011081875B2

(12) United States Patent
Fisher

(10) Patent No.: US 11,081,875 B2
(45) Date of Patent: Aug. 3, 2021

(54) SYSTEM, METHOD AND APPARATUS FOR POWER DISTRIBUTION IN AN ELECTRIC MOBILE APPLICATION USING A COMBINED BREAKER AND RELAY

(71) Applicant: Eaton Intelligent Power Limited, Dublin (IE)

(72) Inventor: Brandon William Fisher, Portland, OR (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/710,859

(22) Filed: Dec. 11, 2019

(65) Prior Publication Data

US 2020/0119542 A1   Apr. 16, 2020

Related U.S. Application Data

(63) Continuation of application No. 16/380,857, filed on Apr. 10, 2019, and a continuation-in-part of
(Continued)

(51) Int. Cl.
*H02H 7/085*    (2006.01)
*H01H 71/32*    (2006.01)
(Continued)

(52) U.S. Cl.
CPC ............ *H02H 7/085* (2013.01); *H01H 71/32* (2013.01); *H01H 89/00* (2013.01);
(Continued)

(58) Field of Classification Search
CPC ........ H02H 7/085; H02H 1/0007; H02H 3/00; H01H 71/32; H01H 71/00; H01H 89/00;
(Continued)

(56) References Cited

U.S. PATENT DOCUMENTS 2,545,639 A    3/1951  Wolff et al.
2,618,688 A   11/1952  Pulvari
(Continued)

FOREIGN PATENT DOCUMENTS

CN    101499673 A    8/2009
CN    102903580 A    1/2013
(Continued)

OTHER PUBLICATIONS

PCT/EP2019/059070 , "International Application Serial No. PCT/EP2019/059070, International Preliminary Report on Patentability dated Oct. 13, 2020", Eaton Intelligent Power Limited, 29 pages.
(Continued)

*Primary Examiner* — Antony M Paul
(74) *Attorney, Agent, or Firm* — GTC Law Group PC & Affiliates

(57) ABSTRACT

A system including a vehicle having a motive electrical power path; a power distribution unit including a current protection circuit comprising a breaker/relay including: a fixed contact; a movable contact; a physical opening response portion responsive to a current value in the motive power circuit; a current source circuit electrically coupled to the breaker/relay and structured to inject a current across the fixed contact; and a voltage determination circuit electrically coupled to the breaker/relay and structured to determine at least one of an injected voltage amount and a contactor impedance value, wherein the voltage determination circuit comprises a high pass filter having a cutoff frequency selected in response to a frequency of the injected current.

10 Claims, 141 Drawing Sheets

Related U.S. Application Data application No. 16/184,185, filed on Nov. 8, 2018, and a continuation-in-part of application No. PCT/EP2018/080611, filed on Nov. 8, 2018.

(60) Provisional application No. 62/730,494, filed on Sep. 12, 2018, provisional application No. 62/687,197, filed on Jun. 19, 2018, provisional application No. 62/675,622, filed on May 23, 2018, provisional application No. 62/655,956, filed on Apr. 11, 2018, provisional application No. 62/655,631, filed on Apr. 10, 2018, provisional application No. 62/583,355, filed on Nov. 8, 2017, provisional application No. 62/583,367, filed on Nov. 8, 2017.

(51) Int. Cl.

| | | |
|---|---|---|
| *H02H 1/00* | (2006.01) | |
| *H01H 89/00* | (2006.01) | |
| *H02P 29/68* | (2016.01) | |
| *H02M 7/00* | (2006.01) | |
| *H05K 7/20* | (2006.01) | |
| *B60K 6/22* | (2007.10) | |

(52) U.S. Cl.
CPC .......... *H02H 1/0007* (2013.01); *H02M 7/003* (2013.01); *H02P 29/68* (2016.02); *H05K 7/2089* (2013.01); *B60K 6/22* (2013.01); *B60Y 2200/91* (2013.01); *B60Y 2200/92* (2013.01)

(58) Field of Classification Search
CPC ..... B60K 6/22; H02P 1/00; H02P 1/04; H02P 1/12; H02P 1/16; H02P 1/24; H02P 1/46; H02P 1/465; H02P 1/42; H02P 3/00; H02P 3/12; H02P 3/16; H02P 3/18; H02P 7/00; H02P 21/00; H02P 23/00; H02P 25/00; H02P 27/00; H02P 27/04; H02P 27/06
USPC ..... 318/400.01, 400.02, 700, 701, 727, 799, 318/800, 801, 430
See application file for complete search history.

(56) References Cited

U.S. PATENT DOCUMENTS

| | | | |
|---|---|---|---|
| 3,147,467 A * | 9/1964 | Laakmann | G08B 13/1672 |
| | | | 340/566 |
| 3,172,010 A | 3/1965 | John | |
| 3,211,958 A | 10/1965 | Miller et al. | |
| 3,240,930 A * | 3/1966 | Porter | B61K 7/12 |
| | | | 246/182 A |
| 3,272,949 A | 9/1966 | Lawrence | |
| 3,718,875 A | 2/1973 | Kussy et al. | |
| 3,914,723 A | 10/1975 | Goodbar | |
| 4,023,127 A | 5/1977 | Mune | |
| 4,181,922 A | 1/1980 | Matsko et al. | |
| 4,208,689 A | 6/1980 | Dunham et al. | |
| 4,213,165 A | 7/1980 | Jansen et al. | |
| 4,262,179 A | 4/1981 | Bauer | |
| 4,518,055 A | 5/1985 | Yagi et al. | |
| 4,633,207 A | 12/1986 | McClellan et al. | |
| 4,816,792 A | 3/1989 | Belbel et al. | |
| 4,879,535 A | 11/1989 | Mori et al. | |
| 4,982,060 A | 1/1991 | Streich et al. | |
| 5,020,801 A | 6/1991 | Negron | |
| 5,021,760 A | 6/1991 | Krubsack et al. | |
| 5,047,603 A | 9/1991 | Pardini | |
| 5,654,859 A | 8/1997 | Shi | |
| 5,796,175 A | 8/1998 | Itoh et al. | |
| 5,872,497 A | 2/1999 | Yerkovich et al. | |
| 6,020,801 A | 2/2000 | Passow | |
| 6,768,402 B2 | 7/2004 | Davidson et al. | |
| 6,894,463 B2 | 5/2005 | Kernahan | |
| 7,210,304 B2 | 5/2007 | Nagashima et al. | |
| 7,514,990 B1 * | 4/2009 | Voo | H03F 1/56 |
| | | | 327/552 |
| 7,561,448 B2 | 7/2009 | Katayama et al. | |
| 7,595,710 B2 | 9/2009 | Deboer et al. | |
| 7,692,903 B2 | 4/2010 | Dwyer et al. | |
| 7,777,600 B2 | 8/2010 | Brooks | |
| 7,952,875 B2 | 5/2011 | Woody et al. | |
| 7,957,169 B2 | 6/2011 | Nakajima et al. | |
| 8,134,438 B2 | 3/2012 | Brooks | |
| 8,378,623 B2 | 2/2013 | Kusch et al. | |
| 8,520,381 B2 | 8/2013 | Hobein et al. | |
| 8,653,913 B2 | 2/2014 | Vellaiyanaicken et al. | |
| 8,805,314 B2 * | 8/2014 | Katsube | H03H 11/1252 |
| | | | 455/232.1 |
| 8,829,722 B2 | 9/2014 | Kusch et al. | |
| 8,981,727 B2 | 3/2015 | Kusch et al. | |
| 8,994,327 B2 | 3/2015 | Kusch et al. | |
| 9,148,946 B1 | 9/2015 | Singh et al. | |
| 9,493,077 B2 | 11/2016 | Yamasaki et al. | |
| 9,520,764 B1 | 12/2016 | Bundschuh et al. | |
| 9,538,691 B2 | 1/2017 | Kikuchi et al. | |
| 9,691,562 B2 | 6/2017 | Neuhaus | |
| 9,726,726 B2 | 8/2017 | Bock et al. | |
| 9,758,047 B2 | 9/2017 | Hou et al. | |
| 9,923,546 B2 * | 3/2018 | Nagahisa | H03H 11/1204 |
| 10,010,011 B2 | 6/2018 | Donth et al. | |
| 10,032,588 B2 | 7/2018 | Gonzales et al. | |
| 10,149,413 B1 | 12/2018 | Dede et al. | |
| 10,242,829 B2 | 3/2019 | Hasegawa et al. | |
| 10,269,520 B2 | 4/2019 | Honick et al. | |
| 10,361,051 B2 | 7/2019 | Bock et al. | |
| 2003/0142449 A1 | 7/2003 | Iwata et al. | |
| 2004/0105664 A1 | 6/2004 | Ivankovic | |
| 2004/0189319 A1 | 9/2004 | Stanisic et al. | |
| 2004/0207968 A1 | 10/2004 | Martin et al. | |
| 2005/0006956 A1 | 1/2005 | Shi | |
| 2007/0058303 A1 | 3/2007 | Hirai et al. | |
| 2007/0076355 A1 | 4/2007 | Oohama | |
| 2007/0290646 A1 | 12/2007 | Hasenour et al. | |
| 2008/0137253 A1 | 6/2008 | George et al. | |
| 2009/0057112 A1 | 3/2009 | Bennett et al. | |
| 2010/0172515 A1 * | 7/2010 | Kimura | H03H 7/01 |
| | | | 381/97 |
| 2011/0043307 A1 | 2/2011 | Gonzales et al. | |
| 2011/0101904 A1 | 5/2011 | Sakamoto | |
| 2012/0068663 A1 | 3/2012 | Tanikawa et al. | |
| 2013/0062724 A1 | 3/2013 | Tokuyama et al. | |
| 2013/0154352 A1 | 6/2013 | Tokarz et al. | |
| 2013/0257375 A1 | 10/2013 | Ang et al. | |
| 2013/0320905 A1 | 12/2013 | Uryu | |
| 2014/0009162 A1 | 1/2014 | Barrenscheen et al. | |
| 2014/0092655 A1 | 4/2014 | Igarashi et al. | |
| 2014/0151337 A1 | 6/2014 | Hiraiwa et al. | |
| 2014/0316735 A1 | 10/2014 | Jao et al. | |
| 2015/0084724 A1 | 3/2015 | Gonzales et al. | |
| 2016/0169945 A1 | 6/2016 | Mauder et al. | |
| 2016/0233777 A1 | 8/2016 | Murakami et al. | |
| 2016/0380563 A1 | 12/2016 | Fukuta | |
| 2017/0368941 A1 | 12/2017 | Chow | |
| 2018/0182587 A1 | 6/2018 | Koepf et al. | |
| 2018/0222333 A1 | 8/2018 | Khaligh et al. | |
| 2019/0140245 A1 | 5/2019 | Mensch et al. | |
| 2019/0296541 A1 | 9/2019 | Mensch et al. | |
| 2020/0114776 A1 | 4/2020 | Fisher | |
| 2020/0114777 A1 | 4/2020 | Fisher et al. | |
| 2020/0114778 A1 | 4/2020 | Fisher | |
| 2020/0114779 A1 | 4/2020 | Fisher et al. | |
| 2020/0114780 A1 | 4/2020 | Douglass et al. | |
| 2020/0114781 A1 | 4/2020 | Douglass | |
| 2020/0114782 A1 | 4/2020 | Douglass | |
| 2020/0114783 A1 | 4/2020 | Douglass | |
| 2020/0114784 A1 | 4/2020 | Fisher | |
| 2020/0119543 A1 | 4/2020 | Fisher | |
| 2020/0119544 A1 | 4/2020 | Fisher | |
| 2020/0144809 A1 | 5/2020 | Fisher | |
| 2020/0185907 A1 | 6/2020 | Griffiths | |
| 2020/0185908 A1 | 6/2020 | Shah et al. | |

(56) References Cited

U.S. PATENT DOCUMENTS

| | | |
|---|---|---|
| 2020/0185909 A1 | 6/2020 | Fisher |
| 2020/0194995 A1 | 6/2020 | Shah et al. |
| 2020/0194996 A1 | 6/2020 | Fisher |
| 2020/0194997 A1 | 6/2020 | Fisher |
| 2020/0194998 A1 | 6/2020 | Fisher |
| 2020/0194999 A1 | 6/2020 | Fisher |
| 2020/0195000 A1 | 6/2020 | Douglass |
| 2020/0195001 A1 | 6/2020 | Griffiths |
| 2020/0235564 A1 | 7/2020 | Shah et al. |
| 2020/0235565 A1 | 7/2020 | Griffiths et al. |
| 2020/0235566 A1 | 7/2020 | Fisher |
| 2020/0235567 A1 | 7/2020 | Griffiths et al. |
| 2020/0274375 A1 | 8/2020 | Griffiths et al. |
| 2020/0381915 A1 | 12/2020 | Mensch et al. |
| 2021/0006061 A9 | 1/2021 | Shah et al. |
| 2021/0036505 A9 | 2/2021 | Fisher |
| 2021/0044102 A9 | 2/2021 | Douglass |

FOREIGN PATENT DOCUMENTS

| | | |
|---|---|---|
| DE | 102009023801 A1 | 2/2010 |
| DE | 102012224223 A1 | 7/2014 |
| EP | 3017992 A1 | 5/2016 |
| EP | 3608153 A1 | 2/2020 |
| FR | 2741994 A1 | 6/1997 |
| FR | 3041143 A1 | 3/2017 |
| GB | 201811874 | 9/2018 |
| JP | H08154311 A | 6/1996 |
| JP | H09284902 A | 10/1997 |
| JP | H10322880 | 12/1998 |
| JP | 2000324674 A | 11/2000 |
| JP | 2001078350 A | 3/2001 |
| JP | 5675337 B2 | 1/2015 |
| JP | 2016205866 A | 12/2016 |
| JP | 2017139902 A | 8/2017 |
| JP | 6255429 B2 | 12/2017 |
| KR | 20140030458 A | 3/2014 |
| KR | 20160119604 A | 10/2016 |
| WO | 2011141785 A1 | 11/2011 |
| WO | 2018186573 A1 | 10/2018 |
| WO | 2019092103 A2 | 5/2019 |
| WO | 2019092103 A3 | 7/2019 |
| WO | 2019197459 A2 | 10/2019 |
| WO | 2019197459 A3 | 2/2020 |
| WO | PCT/EP2020/057951 | 3/2020 |
| WO | 2020193466 A1 | 10/2020 |
| WO | 2021009217 A2 | 1/2021 |

OTHER PUBLICATIONS

PCT/EP2020/069987, "International Application Serial No. PCT/EP2020/069987, International Preliminary Report on Patentability dated Feb. 19, 2021", Eaton Intelligent Power Limited, 17 pages.

PCT/EP2020/069987, "International Application Serial No. PCT/EP2020/069987, Invitation to Pay Additional Fees and, Where Applicable, Protest Fee dated Oct. 26, 2020", Eaton Intelligent Power Limited, 12 pages.

U.S. Appl. No. 16/994,196, filed Aug 14, 2020, Pending, Mensch, Martin Wayne, et al.

"Second Quarter 2019 Results", Delphi Technologies [PowerPoint Slides], Aug. 1, 2019, 26 pages.

1811874.5, "United Kingdom Application Serial No. 1811874.5, Search Report dated Jan. 7, 2019", 5 pages.

PCT/EP18/80611, "International Application Serial No. PCT/EP18/80611, International Search Report and Written Opinion dated Jun. 18, 2019", Eaton Corporation, 21 pages.

PCT/EP18/80611, "International Application Serial No. PCT/EP18/80611, Invitation to Pay Additional Fees and, Where Applicable, Protest Fee", Eaton Corporation, 12 pages.

PCT/EP2019/059070, "International Application Serial No. PCT/EP2019/059070, International Search Report and Written Opinion dated Jan. 7, 2020", Eaton Corporation, 39 pages.

PCT/EP2019/059070, "International Application Serial No. PCT/EP2019/059070, Invitation to Pay Additional Fees and, Where Applicable, Protest Fee dated Aug. 27, 2019", Eaton Corporation, 14 pages.

PCT/EP2020/057951, "International Application Serial No. PCT/EP2020/057951, International Search Report and Written Opinion dated Aug. 14, 2020", Eaton Intelligent Power Limited, 23 pages.

PCT/EP2020/057951, "International Application Serial No. PCT/EP2020/057951, Invitation to Pay Additional Fees and, Where Applicable, Protest Fee dated Jun. 24, 2020", Eaton Intelligent Power Limited, 16 pages.

* cited by examiner

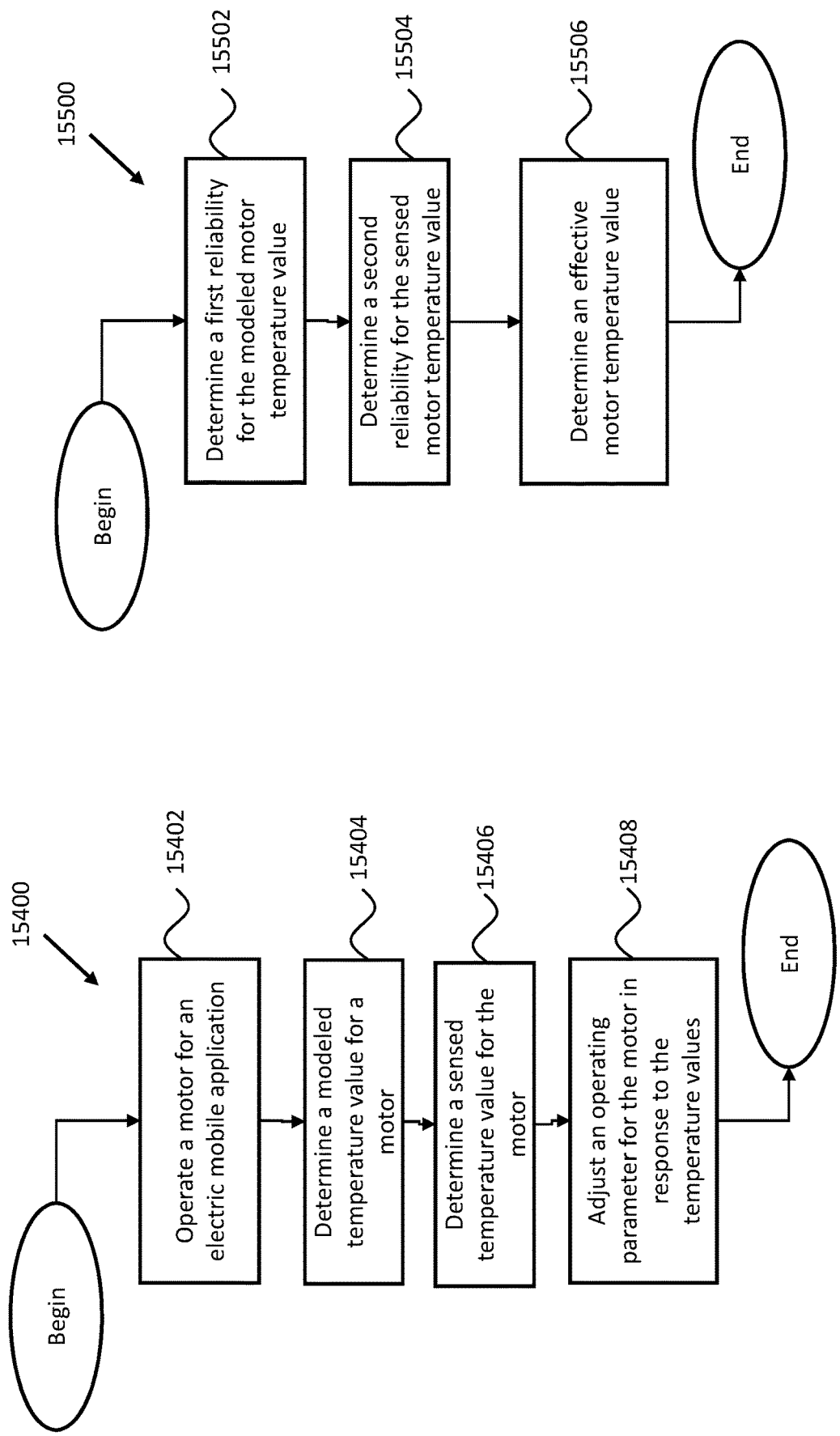

SYSTEM, METHOD AND APPARATUS FOR POWER DISTRIBUTION IN AN ELECTRIC MOBILE APPLICATION USING A COMBINED BREAKER AND RELAY

CLAIM OF PRIORITY

This application is a continuation of U.S. patent application Ser. No. 16/380,857, filed Apr. 10, 2019, and entitled "SYSTEM, METHOD, AND APPARATUS FOR POWER DISTRIBUTION IN AN ELECTRIC MOBILE APPLICATION USING A COMBINED BREAKER AND RELAY".

U.S. patent application Ser. No. 16/380,857 claims priority to the following U.S. Provisional Patent Applications: Ser. No. 62/730,494, filed Sep. 12, 2018, and entitled "BREAKER/RELAY WITH INTEGRATED PRECHARGE CIRCUIT"; Ser. No. 62/687,197, filed Jun. 19, 2018, and entitled "COMBINED DUAL-POLE BREAKER AND RELAY IN AN ELECTRIFIED MOBILE APPLICATION"; Ser. No. 62/675,622, filed May 23, 2018, and entitled "SYSTEM, METHOD, AND APPARATUS USING A COMBINED BREAKER AND RELAY IN A MOBILE APPLICATION"; Ser. No. 62/655,956, filed Apr. 11, 2018, and entitled "SYSTEM, METHOD, AND APPARATUS USING A COMBINED BREAKER AND RELAY IN A MOBILE APPLICATION"; and Ser. No. 62/655,631, filed Apr. 10, 2018, and entitled "SYSTEM, METHOD, AND APPARATUS USING A COMBINED BREAKER AND RELAY IN A MOBILE APPLICATION".

U.S. patent application Ser. No. 16/380,857 is a continuation-in-part of and claims priority to U.S. patent application Ser. No. 16/184,185, filed Nov. 8, 2018, and entitled "POWER DISTRIBUTION UNIT AND FUSE MANAGEMENT FOR AN ELECTRIC MOBILE APPLICATION".

U.S. patent application Ser. No. 16/184,185 claims priority to the following U.S. Provisional Patent Applications: Ser. No. 62/583,355, filed Nov. 8, 2017, and entitled "ACTIVE/PASSIVE THERMAL PROTECTION OF TEMPERATURE SENSITIVE COMPONENTS"; and Ser. No. 62/583,367, filed Nov. 8, 2017, and entitled "FUSE AND CONTACTOR FOR CIRCUIT PROTECTION".

U.S. patent application Ser. No. 16/380,857 is a continuation-in-part of and claims priority to International Application Serial No. PCT/EP18/80611, filed Nov. 8, 2018, and entitled "POWER DISTRIBUTION UNIT AND FUSE MANAGEMENT FOR AN ELECTRIC MOBILE APPLICATION".

PCT/EP18/80611 claims priority to the following U.S. Provisional Patent Applications: Ser. No. 62/583,355, filed Nov. 8, 2017, and entitled "ACTIVE/PASSIVE THERMAL PROTECTION OF TEMPERATURE SENSITIVE COMPONENTS"; and Ser. No. 62/583,367, filed Nov. 8, 2017, and entitled "FUSE AND CONTACTOR FOR CIRCUIT PROTECTION".

All of the above patent documents are incorporated herein by reference in their entirety.

FIELD

Without limitation to a particular field of technology, the present disclosure is directed to electrical power distribution and circuit protection, and more particularly to electronic power distribution and circuit protection for highly variable load applications.

BACKGROUND

Electrical power distribution in many applications is subject to a number of challenges. Applications having a highly variable load, such as mobile applications or vehicles, subject fuses in the power channels to rapid swings in power throughput and induce thermal and mechanical stresses on the fuses. Certain applications have a high cost for downtime of the application. Certain applications, including mobile applications, are subject to additional drawbacks from loss of power, such as loss of mobility of the application unexpectedly, including at an inconvenient location, while in traffic, or the like. Electrical systems in many applications are complex, with multiple components in the system, and variations in the wiring and environment of the electrical system, leading to variations in the electrical system response, introduction of noise, variations in system resonant frequencies, and/or variations in system capacitance and/or inductance, even for nominally identical installations. These complexities introduce additional challenges for high resolution and/or highly precise determinations of the electrical characteristics of aspects of the system. Additionally, highly variable and/or mobile systems provide additional challenges for diagnostics and determinations about aspects of the electrical system, as highly invasive active determinations may not be acceptable to application performance, and/or the system may not provide many opportunities, or only brief opportunities, for making determinations about the electrical system.

Electric mobile applications, such as electric vehicles and high-capability hybrid vehicles provide numerous challenges for previously known inverter and power electronics systems. Mobile applications include on-highway vehicles, off-highway vehicles, commercial and passenger car vehicles, and/or off road applications including any type of vehicle or mobile equipment.

For example, many mobile applications, such as commercial and passenger vehicles, are highly cost sensitive to both initial costs of a system, and to ongoing operating costs. Additionally, downtime for service, maintenance, or system failures has a very high cost, due to large volumes and competitive markets. Accordingly, even modest improvements to initial costs, operating costs, and reliability can make a significant impact on the outcome of the system, or make a non-marketable system competitive.

Mobile applications have limited space and weight available for components of the drive system. For example, vehicle sizing and fuel efficiency concerns drive many applications to reduce both the size and the weight of the vehicle, and to accommodate vehicle shape for aerodynamics, according to the specific application, and/or according to user or customer preferences. Additionally, mobile applications have a large number of features, and application requirements and customer preferences are such that additional features are almost always value added if the system can accommodate them while meeting other constraints. Accordingly, reducing the size and weight of a given component provides value to the application, whether through a net reduction of the application size and weight, or through the ability to accommodate additional features within the same size and weight.

Mobile applications generally have a large number of components, and often many of the components are provided by third parties and integrated by a primary manufacturer or original equipment manufacturer (OEM). Accordingly, reductions in the size or weight of a component provide for easier integration of components, and/or are required to accommodate a limited space claim during the design phase, upgrades, retro-fits, or the like. Additionally, both the large number of components and the integration of many components from separate component providers introduce complexities into the integration of the mobile application. Further, each component and sub-component, and each interface between components, creates a failure point that can cause a service event, undesirable operation, application downtime, and/or a mission disabling failure. Failures occurring in mobile applications often occur at a location that is inconvenient for service access, and may require moving the degraded or disabled vehicle to a service location before the failure can be corrected. Accordingly, components that have a reduced number of sub-components, that can utilize standardized interfaces, and/or that have a reduced number of interfaces are desirable for mobile applications. Some mobile applications are produced in very high volume, and even modest reductions in either the number of interfaces or the number of sub-components can add high value to the system.

Some mobile applications are produced in small volumes with short engineering design time, and accordingly a reduction in the number of interfaces can greatly reduce the design cycle time, providing a significant benefit where engineering costs cannot be distributed across a high volume of products. Some mobile applications are produced as retro-fit or upgrades, and/or include a number of options where a component may appear on certain models or versions of the mobile application, but may not be on other models or versions, and/or may be installed in a different location on the vehicle than on other models or versions. For example, mobile applications may have components added post-manufacturing as part of a customer option, to accommodate new regulations, to support an environmental policy (e.g., of a company, or for a fleet of vehicles), to upgrade a vehicle, and/or to repurpose or remanufacture a vehicle. Accordingly, components having a reduced size, a reduced weight, and/or a reduced number of interfaces provide for easier post-manufacturing changes, a greater number of options in the post-manufacturing changes, and/or greater reliability for components that are installed using non-standardized or low volume processes that may not be as refined as a standardized process for a high volume application. Additionally, size and weight savings in components of the application can provide for the inclusion of additional features within the same cost and weight profile.

Mobile applications often have a large differential in duty cycle even for systems that have similar power ratings. Further, mobile applications often involve systems that are sold or otherwise transferred, where the same system can experience a significant change in the duty cycle and operating conditions after the system is in the hands of a user. Accordingly, a lack of flexibility in design parameters at the time of initial sale can limit the available markets for a system, and a lack of flexibility in design parameters in use can result in increased failures later in the life cycle of the system.

Electrical power distribution in many applications is subject to a number of challenges. Presently available systems for providing conversion between electric power and other power sources and loads suffer from a number of drawbacks. Variability in the load types, performance characteristics, and overall system arrangements lead to difficult integration issues that reduce the desirability of hybrid power utilization for many applications, and reduce the available system efficiencies as many aspects of an application are not integrated into the hybrid power arrangement. Additionally, many applications, such as off-road applications, and certain specific on-road applications that have unusual equipment or duty cycles, are low volume and are not economically justifiable to design and integrate a hybrid power system. Systems having a number of varying load and power devices and subsystems additionally create integration challenges, leading to a multiplicity of power conversion devices distributed around the system and customized for the particular system. Accordingly, it may not be economically justifiable to create a hybrid power system for such systems using presently known technologies.

SUMMARY

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU may include a breaker/relay positioned on one of a high side and a low side of the power storage device; wherein the breaker/relay includes a fixed contact electrically coupled to the power bus; a moveable contact selectively electrically coupled to the fixed contact, and wherein the moveable contact allows power flow through the power bus when electrically coupled to the fixed contact, and prevents power flow through the power bus when not electrically coupled to the fixed contact; and an armature operationally coupled to the moveable contact, such that the armature in a first position prevents electrical coupling between the moveable contact and the fixed contact, and the armature in a second position allows electrical coupling between the moveable contact and the fixed contact; and a first biasing member biasing the armature into one of the first position or the second position. In embodiments, the mobile application may include a standard on/off circuit having at least two states, wherein the standard on/off circuit in a first state provides an actuating signal and in a second state prevents the actuating signal; a current response circuit structured to determine a current in the power bus, and further structured to block the actuating signal of the standard on/off circuit in response to the current in the power bus indicating a high current value; and wherein the armature may be responsive to the actuating signal to electrically couple the moveable contact to the fixed contact. The breaker/relay may include an auxiliary off circuit structured to interpret an auxiliary command, and further structured to block the actuating signal of the standard on/off circuit in response to the auxiliary command indicating that the moveable contact should not be electrically coupled to the fixed contact. The auxiliary command may include at least one command selected from the commands consisting of: an emergency shutdown command, a service event indicator, a maintenance event indicator, an accident indicator, a vehicle controller request, and a device protection request. The standard on/off circuit may include one of a keyswitch voltage and a keyswitch indicator. The breaker/relay may include a contact force spring operationally interposed between the armature and the moveable contact, such that in response to the armature being in the second position, the contact force spring may be at least partially compressed, and wherein the contact force spring may be configured such that a Lorentz force acting between the fixed contact and the moveable contact further compresses the contact force spring in response to a selected current value. The high current value may be lower than the selected current value. The moveable contact may include a body extending away from the fixed contact, wherein the body of the moveable contact may be disposed within a plurality of splitter plates, and wherein the plurality of splitter plates may be at least partially disposed within a permanent magnet. The mobile application may include a charging circuit, and wherein the breaker/relay may be further positioned on the charging circuit. The charging circuit may include a quick charging circuit having a higher current throughput value than a rated current for operations of the electrical load. The mobile application may include a standard on/off circuit having at least two states, wherein the standard on/off circuit in a first state provides an actuating signal and in a second state prevents the actuating signal; a current response circuit structured to determine a current in the power bus, and further structured to block the actuating signal of the standard on/off circuit in response to the current in the power bus indicating a high current value; wherein the current response circuit may be further structured to utilize a first threshold current value for the high current value in response to the motive power circuit powering the electrical load, and the utilized a second threshold current value for the high current value in response to the charging circuit coupled to a quick charging device; and wherein the armature may be responsive to the actuating signal to electrically couple the moveable contact to the fixed contact. The electrical load may include at least one load selected from the loads consisting of a motive power load, a regeneration load, a power take-off load, an auxiliary device load, and an accessory device load. The mobile application may include a second breaker/relay disposed on the other of the high side or the low side of the power storage device. The power storage device may include a rechargeable device. The power storage device may include at least one device selected from the devices consisting of a battery, a capacitor, and a fuel cell.

In an aspect, a breaker-relay may include a fixed contact electrically coupled to a power bus for a mobile application; a moveable contact selectively electrically coupled to the fixed contact; an armature operationally coupled to the moveable contact, such that the armature in a first position prevents electrical coupling between the moveable contact and the fixed contact, and the armature in a second position allows electrical coupling between the moveable contact and the fixed contact; a first biasing member biasing the armature into one of the first position or the second position; a standard on/off circuit having at least two states, wherein the standard on/off circuit in a first state provides an actuating signal and in a second state prevents the actuating signal; a current response circuit structured to determine a current in the power bus, and further structured to block the actuating signal of the standard on/off circuit in response to the current in the power bus indicating a high current value; and wherein the armature may be responsive to the actuating signal to electrically couple the moveable contact to the fixed contact. In embodiments, the mobile application may include at least two electrical current operating regions. The current response circuit may be further structured to adjust the high current value in response to an active one of the at least two electrical current operating regions.

In an aspect, a method may include detecting a current value, the current value including an electrical current flow through a power bus electrically coupled to a breaker/relay; determining whether the current value exceeds a threshold current value; and in response to the current value exceeding the threshold current value, actuating an armature to open contacts in the breaker/relay, thereby preventing the electrical current flow through the power bus. In embodiments, the method may include applying a contact force to a moveable one of the contacts of the breaker/relay; and opening the contacts in response to a repulsive force generated between the contacts in response to the electrical current flow through the power bus. The method may further include selecting the contact force such that the opening the contacts occurs at a selected current flow value of the electrical current flow. The method may further include actuating the armature to open the contacts in the breaker/relay such that the moveable one of the contacts does not return to a closed position after the opening the contacts in response to the repulsive force. The actuating the armature may be commenced before the opening the contacts in response to the repulsive force.

In an aspect, a breaker/relay may include a fixed contact electrically coupled to a power bus; a moveable contact selectively electrically coupled to the fixed contact; an armature operationally coupled to the moveable contact, such that the armature in a first position prevents electrical coupling between the moveable contact and the fixed contact, and the armature in a second position allows electrical coupling between the moveable contact and the fixed contact; a first biasing member biasing the armature into one of the first position or the second position; a current response circuit structured to determine a current in the power bus, and further structured to command the armature to the first position in response to the current in the power bus indicating a high current value. In embodiments, the breaker/relay may further include a contact force spring operationally interposed between the armature and the moveable contact, such that in response to the armature being in the second position, the contact force spring may be at least partially compressed, and wherein the contact force spring may be configured such that a Lorentz force acting between the fixed contact and the moveable contact further compresses the contact force spring in response to a selected current value. The high current value may be lower than the selected current value. The moveable contact may include a body extending away from the fixed contact, wherein the body of the moveable contact may be disposed within a plurality of splitter plates, and wherein the plurality of splitter plates may be at least partially disposed within a permanent magnet. The power bus may be a power bus for a mobile application. The mobile application may include at least two electrical current operating regions.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU may include a breaker/relay positioned on one of a high side and a low side of the power storage device; wherein the breaker/relay may include: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; and an arc suppression assembly structured to guide and disperse an opening arc between each of the plurality of moveable contacts and the corresponding fixed contacts. In embodiments, the plurality of moveable contacts may be linked as a dual pole single throw contacting arrangement. The armature may be operationally coupled to both of the moveable contacts. The plurality of moveable contacts may be separately controllable. The mobile application may further include a pre-charge circuit coupled in parallel with at least one of the fixed contacts. The pre-charge circuit may include a solid state pre-charge circuit. The moveable contacts and the fixed contacts may be disposed within a single housing. The mobile application may further include a magnetic actuator coupled to one of the moveable contacts, and wherein all of the plurality of moveable contacts may be responsive to the magnetic actuator. The arc suppression assembly may include a plurality of splitter plates and at least one permanent magnet. At least one of the plurality of splitter plates may be positioned within arc dispersion proximity of more than one of the moveable contacts. The permanent magnet may be positioned within arc guidance proximity of more than one of the moveable contacts. The mobile application may further include a current sensor structured to determine an electrical current value in response to electrical current flowing through at least one of the moveable contacts, the mobile application may further include a controller structured to interpret the electrical current value and to command the at least one of the moveable contacts to the first position in response to the electrical current value exceeding a threshold value. The at least one of the moveable contacts may be responsive to a Lorentz force to physically move to the first position in response to the electrical current value exceeding a second threshold value. The second threshold value may be greater than the threshold value. The controller may be further structured to adjust the threshold value in response to an expected electrical current value. The controller may be further structured to increase the threshold value in response to determining that a charge operation of a battery may be active. The mobile application may further include a bus bar electrically coupling two of the plurality of moveable contacts. The bus bar may include a hardware configuration in the region of each of the moveable contacts, wherein the hardware configuration provides for a physical response force of the moveable contacts in response to a current value through the power bus. The hardware configuration may include at least one configuration selected from the configurations consisting of: an area of the bus bar in proximity to a current providing portion of the power bus; and a positioning of a portion of the bus bar in proximity to the current providing portion of the power bus. The mobile application may further include a plurality of current sensors, each of the plurality of current sensors operationally coupled to one of the plurality of moveable contacts. A first one of the plurality of moveable contacts may couple a first circuit of the power bus, and wherein a second one of the plurality of moveable contacts couples a second circuit of the power bus, and wherein the first circuit and the second circuit may be power circuits for separate electrical loads. The PDU further may include a coolant coupling configured to interface with a coolant source of the mobile application, and an active cooling path configured to thermally couple the coolant source with the fixed contacts.

In an aspect, a breaker/relay may include a plurality of fixed contacts electrically coupled electric load circuits for a mobile application; a plurality of moveable contacts, each moveable contact selectively electrically coupled to a corresponding one of the plurality of fixed contacts; a plurality of armatures each operationally coupled to a corresponding one of the moveable contacts, such that each armature in a first position prevents electrical coupling between the corresponding moveable contact and the corresponding fixed contact, and each armature in a second position allows electrical coupling between the corresponding moveable contact and the corresponding fixed contact; and a current response circuit structured to determine a current in each of the electric load circuits, and further structured to provide an armature command to open the corresponding one of the moveable contacts in response to the current in the corresponding electrical load circuit indicating a high current value. In embodiments, the breaker/relay may further include a plurality of biasing members each operationally coupled to a corresponding one of the plurality of moveable contacts, and configured to bias the corresponding one of the plurality of armatures into one of the first position or the second position. A first high current value for a first one of the electric load circuits may include a distinct value from a second high current value for a second one of the electric load circuits. The breaker/relay may further include a first biasing member operationally coupled to a corresponding one of the moveable contacts for the first electric load circuit, a second biasing member operationally coupled to a corresponding one of the moveable contacts for the second electric load circuit, and wherein the first biasing member may include a distinct biasing force from the second biasing member. A first moveable contact for the first electric load may include a distinct mass value from a second moveable contact for the second electric load.

In an aspect, a method may include determining a first current value in a first electric load circuit for a mobile application; determining a second current value in a second electric load circuit for the mobile application; and in response to one of the first current value exceeding a first high current value or the second current value exceeding a second high current value, providing armature command to open a contactor for a corresponding one of the first electric load circuit or the second electric load circuit. In embodiments, the method may further include diffusing an arc for the opened contactor to a plurality of splitter plates positioned in proximity to the opened contactor. The method may further include determining a first physical current opening value for the first electric load circuit and a second physical current opening value for the second electric load circuit, providing the first high current value as a value lower than the first physical current opening value, and providing the second high current value as a value lower than the second physical current opening value.

In an aspect, a system may include a housing; a breaker/relay device positioned in the housing, wherein the breaker/relay device may be configured to interrupt a motive power circuit for an electrical vehicle system, where the housing may be disposed on the electrical vehicle system; wherein the breaker/relay device may include a physical opening response portion responsive to a first current value in the motive power circuit, and a controlled opening response portion responsive to a second current value in the motive power circuit; and a precharge circuit electrically coupled in parallel to the breaker/relay device. In embodiments, the precharge circuit may be positioned within the housing. The first current value may be greater than the second current value. The physical opening response portion may include a first biasing member biasing an armature of the breaker/relay device into an open position for a contactor of the motive power circuit, and a selected difference between a first force of the armature closing the contactor and a second force of the first biasing member opening the contactor. The controlled opening response portion may include a current sensor providing a current value through the motive power circuit, and a current response circuit structured to command an armature to open a contactor in response to the current value exceeding the second current value. The breaker/relay device may include a dual-pole breaker/relay device. The breaker/relay device may include a single-pole breaker/relay device. The breaker/relay device may be positioned on one of a high side circuit or a low side circuit of the motive power circuit. The system may further include a pyro-switch device positioned on the other of the high side circuit or the low side circuit. The system may further include a physical opening response adjustment circuit structured to determine a first current value adjustment, and to adjust the physical opening response portion in response to the first current value adjustment. The physical opening response adjustment circuit may be further structured to adjust the physical opening response portion by performing at least one operation selected from the operations consisting of: adjusting a compression of the first biasing member, adjusting the first force; and adjusting the second force. The physical opening response adjustment circuit may be further structured to adjust the physical opening response portion in response to an operating condition of the electrical vehicle system. The controlled opening response portion may be further structured to command the armature to open the contactor in response to at least one value selected from the values consisting of: a time-current profile of the motive power circuit; a time-current trajectory of the motive power circuit; a time-current area value of the motive power circuit; a rate of change of a current value through the motive power circuit; and a difference between a current value through the motive power circuit and the second current value.

In an aspect, a method may include determining a current value through a motive power circuit of an electrical vehicle system; opening the motive power circuit with a physical response of a breaker/relay device in response to the current value exceeding a first current value; and opening the motive power circuit with a controlled response of an armature operationally coupled to a contactor of the breaker/relay device in response to the current value exceeding a second current value. In embodiments, the first current value may be greater than the second current value. The method may further include determining a first current value adjustment in response to an operating condition of the electrical vehicle system, and adjusting the first current value in response to the first current value adjustment. The method may further include adjusting the physical opening response portion by performing at least one operation selected from the operations consisting of: adjusting a compression of a first biasing member operationally coupled to the contactor of the breaker/relay device; adjusting a first force of the first biasing member operationally coupled to the contactor of the breaker/relay device; and adjusting a second force of the armature operationally coupled to the contactor of the breaker/relay device. The method may further providing controlling the response of the armature to open the contactor in response to at least one value selected from the values consisting of: a time-current profile of the motive power circuit; a time-current trajectory of the motive power circuit; a time-current area value of the motive power circuit; a rate of change of the current value through the motive power circuit; and a difference between the current value through the motive power circuit and the second current value.

In an aspect, a breaker/relay may include a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the fixed contact may include a first fixed contact, the breaker/relay may further include a second fixed contact, wherein the moveable contact may include a first moveable contact corresponding to the first fixed contact, the breaker/relay may further include a second moveable contact corresponding to the second fixed contact, and a bus bar electrically coupling the first moveable contact to the second moveable contact. The bus bar may include a hardware configuration in the region of each of the moveable contacts, wherein the hardware configuration provides for a physical response force of the moveable contacts in response to a current value through the motive power circuit. The hardware configuration may include at least one configuration selected from the configurations consisting of: an area of the bus bar in proximity to a current providing portion of the motive power circuit; and a positioning of a portion of the bus bar in proximity to the current providing portion of the motive power circuit. The physical opening response portion may include a contact area between the fixed contact and the moveable contact, and a biasing member providing a contact force to the moveable contact, wherein the contact area and the contact force may be configured to move the moveable contact to the second position in response to the current value exceeding the threshold current value. The physical opening response portion further may include a mass value of the moveable contacts, wherein the contact area, the contact force, and the mass value may be configured to move the moveable contact away from the first position at a selected velocity value in response to the current value exceeding the threshold current value. The breaker/relay may further include an armature operatively coupled to the moveable contact and capable to move the moveable contact between the first position and the second position; a current response circuit structured to determine a current in mobile power circuit, and further structured to provide an armature command to command the moveable contact to the first position in response to the current in the mobile power circuit exceeding a second current threshold value. The second current threshold value may be lower than the threshold current value. The selected velocity value may be configured to be high enough such that the moveable contact does not return to the first position after moving away from the first position. The moveable contact may be pivotally coupled to a pivoting arm.

In an aspect, a method may include operating a moveable contact between a first position in contact with a fixed contact and allowing power to flow through a motive power circuit for a mobile application, and a second position not in contact with the fixed contact and preventing power flow through the motive power circuit for the mobile application; and configuring a physical opening response portion of a breaker/relay including the moveable contact and the fixed contact, such that the physical opening response portion moves the moveable contact to the second position in response to a current value exceeding a threshold current value. Configuring the physical opening response portion may include selecting a biasing force of a biasing member providing contact force to the moveable contact. Configuring the physical opening response portion may include selecting a contact area between the moveable contact and the fixed contact. Configuring the physical opening response portion may include selecting a mass of the moveable contact. Configuring the physical opening response portion may include selecting a bus bar configuration, wherein the bus bar couples two moveable contacts, and wherein the bus bar configuration may include at least one of a bus bar area in proximity to a current providing portion of the mobile power circuit or a positioning of a portion of the bus bar in proximity to the current providing portion of the mobile power circuit. The method may further include determining a current in the mobile power circuit, and providing an armature command to command the moveable contact to the first position in response to the current in the mobile power circuit exceeding a second current threshold value. The method may further include configuring the physical opening response portion such that the moveable contact does not return to the first position after moving away from the first position.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU may include a breaker/relay positioned on one of a high side and a low side of the power storage device; wherein the breaker/relay may include: a fixed contact electrically coupled to the power bus; a moveable contact selectively electrically coupled to the fixed contact, and wherein the moveable contact allows power flow through the power bus when electrically coupled to the fixed contact, and prevents power flow through the power bus when not electrically coupled to the fixed contact; an armature operationally coupled to the moveable contact, such that the armature in a first position prevents electrical coupling between the moveable contact and the fixed contact, and the armature in a second position allows electrical coupling between the moveable contact and the fixed contact; a first biasing member biasing the armature into one of the first position or the second position; a breaker/relay electronics component, including a standard on/off circuit having at least two states, wherein the standard on/off circuit in a first state provides an actuating signal and in a second state prevents the actuating signal; a current response circuit structured to determine a current in the power bus, and further structured to block the actuating signal of the standard on/off circuit in response to the current in the power bus indicating a high current value; and wherein the armature may be responsive to the actuating signal to electrically couple the moveable contact to the fixed contact. In embodiments, the breaker/relay further may include an auxiliary off circuit structured to interpret an auxiliary command, and further structured to block the actuating signal of the standard on/off circuit in response to the auxiliary command indicating that the moveable contact should not be electrically coupled to the fixed contact. The auxiliary command may include at least one command selected from the commands consisting of: an emergency shutdown command, a service event indicator, a maintenance event indicator, an accident indicator, a vehicle controller request, and a device protection request. The standard on/off circuit may include one of a keyswitch voltage and a keyswitch indicator. The breaker/relay further may include a contact force spring operationally interposed between the armature and the moveable contact, such that in response to the armature being in the second position, the contact force spring may be at least partially compressed, and wherein the contact force spring may be configured such that a Lorentz force acting between the fixed contact and the moveable contact further compresses the contact force spring in response to a selected current value. The high current value may be lower than the selected current value. The moveable contact may include a body extending away from the fixed contact, wherein the body of the moveable contact may be disposed within a plurality of splitter plates, and wherein the plurality of splitter plates may be at least partially disposed within a permanent magnet. The mobile application may further include a charging circuit, and wherein the breaker/relay may be further positioned on the charging circuit. The charging circuit may include a quick charging circuit having a higher current throughput value than a rated current for operations of the electrical load. The electrical load may include at least one load selected from the loads consisting of: a motive power load, a regeneration load, a power take-off load, an auxiliary device load, and an accessory device load. The mobile application may further include a second breaker/relay disposed on the other of the high side or the low side of the power storage device. The power storage device may include a rechargeable device. The power storage device may include at least one device selected from the devices consisting of: a battery, a capacitor, and a fuel cell.

In an aspect, a system may include a vehicle having a motive electrical power circuit; a power distribution unit having a current protection circuit disposed in a motive electrical power path, the current protection circuit including a first leg of the current protection circuit including a breaker/relay, the breaker/relay including a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value; and a second leg of the current protection circuit electrically coupled in parallel with the first leg of the current protection circuit, the second leg including a contactor. In embodiments, the breaker/relay may include a first breaker/relay, and wherein the contactor may include a second breaker/relay. The second leg further may include a thermal fuse in series with the contactor.

In an aspect, a system may include a vehicle having a motive electrical power circuit; a power distribution unit having a current protection circuit disposed in a motive electrical power path, the current protection circuit including: a breaker/relay including a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value; and a contactor in series with the breaker/relay.

In an aspect, a system may include a vehicle having a motive electrical power path; a power distribution unit including a current protection circuit disposed in the motive electrical power path, the current protection circuit including breaker/relay, the breaker/relay including: a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value; a current source circuit electrically coupled to the breaker/relay and structured to inject a current across the fixed contact; and a voltage determination circuit electrically coupled to the breaker/relay and structured to determine at least one of an injected voltage amount and a contactor impedance value 15014, wherein the voltage determination circuit may include a high pass filter 14684 having a cutoff frequency selected in response to a frequency of the injected current. In embodiments, the voltage determination circuit further may include a bandpass filter having a bandwidth selected to bound the frequency of the injected current. The high pass filter may include an analog hardware filter. The high pass filter may include a digital filter. The voltage determination circuit may be further structured to determine the contactor impedance value in response to an injected voltage drop. The system may further include a contactor characterization circuit 15012 structured to store one of a contactor resistance value and the contactor impedance value, and wherein the contactor characterization circuit may be further structured to update the stored one of the contactor resistance value and the contactor impedance value in response to the contactor impedance value. The contactor characterization circuit may be further structured to update the stored one of the contactor resistance value and the contactor impedance value by performing at least one operation selected from the operations consisting of: updating a value to the contactor impedance value; filtering a value using the contactor impedance value as a filter input; rejecting the contactor impedance value for a period of time or for a number of determinations of the contactor impedance value; and updating a value by performing a rolling average of a plurality of contactor impedance values over time. The power distribution unit further may include a plurality of breaker/relay devices disposed therein, and wherein the current source circuit may be further electrically coupled to the plurality of breaker/relay devices, and to sequentially inject a current across each fixed contact of the plurality of breaker/relay devices; and wherein the voltage determination circuit may be further electrically coupled to each of the plurality of breaker/relay devices, and further structured to determine at least one of an injected voltage amount and a contactor impedance value for each of the plurality of breaker/relay devices. The current source circuit may be further structured to sequentially inject the current across each of the plurality of breaker/relay devices in a selected order of the breaker/relay devices. The current source circuit may be further structured to adjust the selected order in response to at least one of: a rate of change of a temperature of each of the fixed contacts of the breaker/relay devices; an importance value of each of the breaker/relay devices; a criticality of each of the breaker/relay devices; a power throughput of each of the breaker/relay devices; and one of a fault condition or a contactor health condition of each of the breaker/relay devices. The current source circuit may be further structured to adjust the selected order in response to one of a planned duty cycle and an observed duty cycle of the vehicle. The current source circuit may be further structured to sweep the injected current through a range of injection frequencies. The current source circuit may be further structured to inject the current across the fixed contact at a plurality of injection frequencies. The current source circuit may be further structured to inject the current across the fixed contact at a plurality of injection voltage amplitudes. The current source circuit may be further structured to inject the current across the fixed contact at an injection voltage amplitude determined in response to a power throughput of the breaker/relay devices. The current source circuit may be further structured to inject the current across the fixed contact at an injection voltage amplitude determined in response to a duty cycle of the vehicle.

In an aspect, a system may include a vehicle having a motive electrical power path; a power distribution unit including a current protection circuit disposed in the motive electrical power path, the current protection circuit including breaker/relay, the breaker/relay including a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value; a current source circuit electrically coupled to the breaker/relay and structured to inject a current across the fixed contact; and a voltage determination circuit electrically coupled to the breaker/relay and structured to determine an injected voltage amount and a contactor impedance value, wherein the voltage determination circuit may be structured to perform a frequency analysis operation to determine the injected voltage amount. In embodiments, the voltage determination circuit may be further structured to determine the injected voltage amount by determining an amplitude of a voltage across the fixed contact at a frequency of interest. The frequency of interest may be determined in response to a frequency of the injected voltage. The current source circuit may be further structured to sweep the injected current through a range of injection frequencies. The current source circuit may be further structured to inject the current across the fixed contact at a plurality of injection frequencies. The current source circuit may be further structured to inject the current across the fixed contact at a plurality of injection voltage amplitudes. The current source circuit may be further structured to inject the current across the fixed contact at an injection voltage amplitude determined in response to a power throughput of the breaker/relay. The current source circuit may be further structured to inject the current across the fixed contact at an injection voltage amplitude determined in response to a duty cycle of the vehicle.

In an aspect, a multi-port power converter may include a housing may include a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The plurality of ports may include at least two AC interface ports and at least three DC interface ports. The multi-port power converter may further include a controller, the controller including a component bank configuration circuit structured to interpret a port electrical interface description, the port electrical interface description including a description of at least a portion of the distinct electrical characteristics; and a component bank implementation circuit structured to provide solid switch states in response to the port electrical interface description, and wherein the plurality of solid state switches may be responsive to the solid switch states. The controller further may include a load/source drive description circuit structured to interpret a source/load drive characteristic, wherein the source/load drive characteristic may include at least one electrical characteristic requirement of a load; and a load/source drive implementation circuit structured to provide a component driver configuration in response to the source/load drive characteristic. The multi-port power converter may further include at least one of wherein the solid state switches may be further responsive to the source/load drive characteristic; wherein a gate driver controller may be responsive to the source/load drive characteristic; and wherein a requestor component for a gate driver controller may be responsive to the source/load drive characteristic. The plurality of loads having distinct electrical characteristics may be a superset of a plurality of loads having distinct electrical characteristics sufficient to encompass a selected class of applications, each application including at least one of: a vehicle, an off-road vehicle, and a set of load types for a vehicle. The multi-port power converter includes a sufficient number of solid state components, solid state switches, and ports, such that the multi-port power converter can provide the plurality of loads having distinct electrical characteristics for any member of the selected class of applications. The plurality of loads having distinct electrical characteristics may be a superset of a plurality of loads having distinct electrical characteristics sufficient to encompass a selected class of applications, each application including at least one of: a vehicle, an off-road vehicle, and a set of load types for a vehicle. The multi-port power converter may further include a first application of the selected class of applications having a first set of distinct electrical characteristics, wherein a second application of the selected class of applications has a second set of distinct electrical characteristics, wherein a first multi-port power converter supports the first application, wherein a second multi-port power converter supports the second application, and wherein the first multi-port power converter and the second multi-port power converter have identical ports, solid state components, and solid state switches. The first multi-port power converter and the second multi-port power converter have distinct solid switch states. The plurality of loads having distinct electrical characteristics may be a superset of a plurality of loads having distinct electrical characteristics sufficient to encompass a selected class of applications, each application including at least one of: a vehicle, an off-road vehicle, and a set of load types for a vehicle. The multi-port power converter may further include a first application of the selected class of applications having a first set of distinct electrical characteristics, wherein a second application of the selected class of applications has a second set of distinct electrical characteristics, wherein a first multi-port power converter supports the first application, wherein a second multi-port power converter supports the second application, and wherein the first multi-port power converter and the second multi-port power converter have identical ports, solid state components, and solid state switches. The first multi-port power converter and the second multi-port power converter have distinct solid switch states and distinct component driver configurations.

In an aspect, a power converter have a plurality of ports including a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller, including: a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller further may include a load/source drive description circuit structured to interpret a source/load drive characteristic, wherein the source/load drive characteristic may include at least one electrical characteristic requirement of a load; and a load/source drive implementation circuit structured to provide a component driver configuration in response to the source/load drive characteristic. The component bank implementation circuit further provides the solid switch states in response to the source/load drive characteristic; and wherein a gate driver controller for at least one of the solid state components may be responsive to the source/load drive characteristic. Each of the solid state components may include at least one of an inverter or a DC/DC converter. The component bank configuration circuit may be further structured to interpret a port configuration service request value, and wherein the component bank implementation circuit further provides the solid switch states in response to the port configuration service request value. The component bank configuration circuit may be further structured to interpret a port configuration definition value, and wherein the component bank implementation circuit further provides the solid switch states in response to the port configuration definition value.

In an aspect, a method may include interpreting a port electrical interface description, the port electrical interface description including a description of electrical characteristics for at least one of a plurality of ports of a power converter for an electric mobile application; and providing solid switch states in response to the port electrical interface description, thereby configuring at least one of an AC inverter or a DC/DC converter to provide power to the at least one of the plurality of ports according to the port electrical interface description. In embodiments, the method may further include interpreting the port electrical interface description during run time operations of the electric mobile application. The method may further include interpreting the port electrical interface description from a service tool communicating with a controller of the power converter. The method may further include interpreting the port electrical interface description from a manufacturing tool in communicating with a controller of the power converter. Providing the solid state switch states may be performed as a remanufacture operation for the power converter. Providing the solid state switch states may be performed as an operation selected from the operations consisting of: an upfit operation for the electric mobile application, an application change operation for the electric mobile application, and a refit operation for the electric mobile application. The method may further include interpreting a source/load drive characteristic for at least one of the plurality of ports of the power converter, wherein the source/load drive characteristic may include at least one electrical characteristic requirement of a load, and providing a component driver configuration in response to the source/load drive characteristic. The method may further include interpreting the source/load drive characteristic during run time operations of the electric mobile application. The method may further include interrogating at least one load electrically coupled to the at least one port of the power converter, and interpreting the source/load drive characteristic in response to the interrogating. The method may further include interpreting the source/load drive characteristic from a service tool communicating with a controller of the power converter. The method may further include interpreting the source/load drive characteristic from a manufacturing tool in communicating with a controller of the power converter. Providing the component driver configuration may be performed as a remanufacture operation for the power converter. The providing the component driver configuration may be performed as an operation selected from the operations consisting of: an upfit operation for the electric mobile application, an application change operation for the electric mobile application, and a refit operation for the electric mobile application.

In an aspect, a method may include providing a power converter having a plurality of ports; determining an electrical interface description for at least one power source of an electric mobile application and at least one electrical load of the electric mobile application; providing solid switch states in response to the electrical interface description, thereby configuring at least one of an AC inverter or a DC/DC converter to provide or accept power to the at least one of the plurality of ports according to the port electrical interface description; and installing the power converter into the electric mobile application. In embodiments, the method may further include determining which ports of the power converter are to be coupled to the at least one power source and the at least one electrical load, and wherein providing the solid switch states may include configuring electrical characteristics of the determined ports according to the port electrical interface description. The method may further include a plurality of the electric loads, wherein a first one of the electrical loads may include an AC load, and wherein a second one of the electrical loads may include a DC load. The method may further include a plurality of the power sources, wherein a first one of the power sources may include a DC source at a first voltage, and wherein a second one of the power sources may include a DC source at a second voltage. The method may further include determining a source/load drive characteristic for at least one of electric loads of the electric mobile application, and providing a component driver configuration in response to the source/load drive characteristic. The component driver configuration may include a gate driver controller for an inverter component coupled to one of the plurality of ports corresponding to the at least one of the electric loads of the electric mobile application. The method may further include coupling a coolant inlet port and a coolant outlet port to a cooling system of the electric mobile application.

In an aspect, an integrated inverter assembly may include a main cover and an opposing back cover, a coolant channel disposed between a coolant channel cover and a coolant channel separating body; wherein power electronics of the inverter assembly may be thermally coupled to the coolant channel; and wherein at least one of a coolant inlet or a coolant outlet of the coolant channel may include a quick connector without a locking element. In embodiments, the quick connector further may include a fir tree hose coupling disposed on an outer housing wall of the quick connector. The coolant channel separating body further may include an integrated hose nipple configured to couple with the quick connector. The inverter assembly may further include a hose configured to couple to the integrated hose nipple at a first end, and to the quick connector at a second end. The hose may include a baffled hose.

In an aspect, an integrated inverter assembly may include a main cover and an opposing back cover, a plurality of IGBTs, each of the plurality of IGBTs configured to provide at least one phase of AC power to a motor, and a potted DC link capacitor operationally disposed between the IGBTs and a DC power source, and wherein the potted DC link capacitor may include a bus bar, a common-mode choke, and a capacitor disposed in a housing of the potted DC link capacitor. In embodiments, the inverter assembly may further include a first welded connection between the potted DC link capacitor and each of the IGBTs, and a second welded connection between each of the IGBTs and an AC motor connector of the inverter assembly. The AC motor connector may include a plurality of AC blades. Each of the plurality of AC blades may extend through a foam seal, thereby forming the AC motor connector. The potted DC link capacitor may be thermally coupled to an integral coolant channel of the inverter assembly. The potted DC link capacitor may project from one of the main cover and the opposing back cover.

In an aspect, an integrated inverter assembly may include a main cover and an opposing back cover, a coolant channel disposed between a coolant channel cover and a coolant channel separating body; and wherein power electronics of the inverter assembly may be thermally coupled to the coolant channel. In embodiments, the coolant channel separating body may be friction-stir welded to each of the main cover and the coolant channel separating body. The assembly may further include a second coolant channel, wherein the coolant channel may be disposed on a first side of the coolant channel separating body, and wherein the second coolant channel may be disposed on a second side of the coolant channel separating body. The assembly may further include where the main cover may be cast, the coolant channel separating body may be forged, and the coolant channel cover may be stamped. The assembly may further include wherein the main cover defines a plurality of coupling threaded bores, and wherein the back cover defines a corresponding plurality of coupling threaded bores. The corresponding plurality of coupling threaded bores further each include an unthreaded pilot portion of the bores, and wherein the unthreaded pilot portion of the bores may include a first height, wherein a plurality of coupling screws each include a threaded portion having a second height, and wherein the first height may be greater than the second height. The main cover further defines a narrowed portion of each of the plurality of coupling threaded bores, and wherein each of the plurality of coupling screws further may include a thin neck portion, and wherein the threaded portion of each of the plurality of coupling screws has a diameter greater than the thin neck portion. The assembly may further include a cure-in-place-gasket positioned between the main cover and the back cover. The assembly may further include wherein the cure-in-place-gasket may be dispensed on the main cover. At least one of the main cover and the back cover may include a ledge having a selected height such that the cure-in-place-gasket has a selected compression when the main cover may be coupled to the back cover.

In an aspect, a method may include operating a motor for an electric mobile application; determining a motor temperature value in response to at least one parameter selected from the parameters consisting of: a power throughput of the motor, a voltage input value to the motor, and a current input value to the motor, interpreting a sensed motor temperature value for the motor, and adjusting an operating parameter for the motor in response to the motor temperature value and the sensed motor temperature value. In embodiments, the method may further include using a combination of the motor temperature value and the sensed motor temperature value to determine a motor effective temperature value, and wherein the adjusting the operating parameter may be further in response to the motor effective temperature value. The method may further include determining a first reliability value for the motor temperature value in response to a first operating condition for the motor, determining a second reliability value for the sensed motor temperature value in response to a second operating condition for the motor, and wherein determining the motor effective temperature value may be further in response to the first reliability value and the second reliability value. The method may further include using the sensed motor temperature value as the motor effective temperature value in response to the second reliability value exceeding a threshold value. The sensed motor temperature value for the motor may include a sensed temperature from a first component within the motor, the method may further include applying a correction to the sensed motor temperature value to determine a second sensed temperature value including an estimated temperature for a second component within the motor, and further using the second sensed temperature value to determine the motor effective temperature value. The method may further include applying a hot spot adjustment correction to the sensed motor temperature value, and further using the adjusted sensed motor temperature value to determine the motor effective temperature value. The method may further include determining the first reliability value in response to at least one operating condition selected from the operating conditions consisting of: a power throughput of the motor, a rate of change of power throughput of the motor, a defined range value for a model used to determine the motor temperature value; and a rate of change of one of the motor temperature value or the effective motor temperature value. The method may further include determining the second reliability value in response to at least one operating condition selected from the operating conditions consisting of: a power throughput of the motor, a rate of change of power throughput of the motor, a defined range value for a temperature sensor providing the sensed motor temperature value; a response time for a temperature sensor providing the sensed motor temperature value; and a fault condition for a temperature sensor providing the sensed motor temperature value. The method may further include using one or the other of the motor temperature value and the sensed motor temperature value as the motor effective temperature value. The method may further include mixing the motor temperature value, the sensed motor temperature value, and a previous value of the motor effective temperature value to determine the motor effective temperature value. The method may further include applying a low-pass filter to the motor effective temperature value. The adjusting the operating parameter may include at least one operation selected from the operations consisting of: adjusting a rating of the motor, adjusting a rating of a load of the electric mobile application; adjusting an active cooling amount for the motor, and adjusting an operating space of the motor based on an efficiency map of the motor.

In an aspect, an apparatus may include a motor control circuit structured to operate a motor for an electric mobile application; an operating conditions circuit structured to interpret a sensed motor temperature value for the motor, and further structured to interpret at least one parameter selected from the parameters consisting of: a power throughput of the motor, a voltage input value to the motor, a current input value to the motor, an ambient temperature value; and an active cooling amount for the motor, a motor temperature determination circuit structured to determine a motor temperature value in response to the at least one of the a power throughput of the motor, a voltage input value to the motor, a current input value to the motor, an ambient temperature value; and an active cooling amount for the motor, and determine a motor effective temperature value in response to the motor temperature value and the sensed motor temperature value; and wherein the motor control circuit may be further structured to adjust at least one operating parameter for the motor in response to the motor effective temperature value. In embodiments, the motor temperature determination circuit may be further structured to determine a first reliability value for the motor temperature value in response to a first operating condition for the motor, determine a second reliability value for the sensed motor temperature value in response to a second operating condition for the motor, and determine the motor effective temperature value further in response to the first reliability value and the second reliability value. The motor temperature determination circuit may be further structured to use the sensed motor temperature value as the motor effective temperature value in response to the second reliability value exceeding a threshold value. The motor temperature determination circuit may be further structured to apply one of an offset component adjustment or a hot spot adjustment to the sensed motor temperature value; and determine the motor effective temperature value further in response to the adjusted sensed motor temperature value. The motor temperature determination circuit may be further structured to determine the first reliability value in response to at least one operating condition selected from the operating conditions consisting of: the power throughput of the motor, a rate of change of power throughput of the motor, a defined range value for a model used to determine the motor temperature value; and a rate of change of one of the motor temperature value or the effective motor temperature value. The motor temperature determination circuit may be further structured to determine the second reliability value in response to at least one operating condition selected from the operating conditions consisting of: the power throughput of the motor, a rate of change of power throughput of the motor, a defined range value for a temperature sensor providing the sensed motor temperature value; a response time for a temperature sensor providing the sensed motor temperature value; and a fault condition for a temperature sensor providing the sensed motor temperature value. The motor control circuit may be further structured to adjust at least one operating parameter selected from the operating parameters consisting of: a rating of the motor, a rating of a load of the electric mobile application; the active cooling amount for the motor, and an operating space of the motor based on an efficiency map of the motor.

In an aspect, a system may include an electric mobile application having a motor and an inverter, wherein the inverter may include a plurality of driving elements for the motor, a controller, including a motor control circuit structured to provide driver commands, and wherein the plurality of driving elements may be responsive to the driver commands; an operating conditions circuit structured to interpret a motor performance request value including at least one of a power, speed, or torque request for the motor, a driver efficiency circuit structured to interpret a driver activation value for each of the plurality of driving elements of the inverter in response to the motor performance request value; and wherein the motor control circuit may be further structured to provide the driver commands to de-activate at least one of the plurality of driving elements for the motor in response to the driver activation value for each of the plurality of driving elements of the inverter. In embodiments, the motor may include a three-phase AC motor, wherein the plurality of driving elements include six driving elements, and wherein the driver efficiency circuit provides the driver activation value to de-activate three of the six driving elements in response to the motor performance request value being below a threshold value.

In an aspect, a method may include providing driver commands to a plurality of driving elements of an inverter electrically coupled to a motor for an electric mobile application; interpreting a motor performance request value including at least one of a power, speed, or torque request for the motor, interpreting a driver activation value for each of the plurality of driving elements of the inverter in response to the motor performance request value; and providing the driver commands to de-activate at least one of the plurality of driving elements for the motor in response to the driver activation value for each of the plurality of driving elements of the inverter. In embodiments, the method may further include providing the driver commands to de-activate three out of six total driving elements in response to the motor performance request value being below a threshold value. The method may further include de-activating a first three out of the six total driving elements during a first de-activation operation, and de-activating a second three out of the six total driving elements during a second de-activation operation.

In an aspect, a system may include an electric mobile application having a plurality of electric motors, each one of the plurality of electric motors operationally coupled to a corresponding one of a plurality of electric loads; a controller, including an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; and wherein the plurality of electric motors may be responsive to the plurality of motor commands. In embodiments, the performance servicing circuit may be further structured to determine the plurality of motor commands in response to one of a fault condition or a failure condition for at least one of the plurality of electric motors. The performance servicing circuit may be further structured to provide the plurality of motor commands to meet the application performance request value by at least partially redistributing load requirements from one of the plurality of electric motors having the fault condition or the failure condition, to at least one of the plurality of electric motors having available performance capacity. The performance servicing circuit may be further structured to derate one of the plurality of electric motors in response to the one of the fault condition or the failure condition. The system may further include a first data store associated with a first one of the plurality of electric motors, a second data store associated with a second one of the plurality of electric motors, and wherein the controller further may include a data management circuit structured to command at least partial data redundancy between the first data store and the second data store. The at least partial data redundancy may include at least one data value selected from the data values consisting of: a fault value, a system state, and a learning component value. The data management circuit may be further structured to command the at least partial data redundancy in response to one of a fault condition or a failure condition related to at least one of: one of the plurality of electric motors, or a local controller operationally coupled to one of the plurality of electric motors. The performance servicing circuit may be further structured to determine the plurality of motor commands in response to the one of the fault condition or the failure condition, and further in response to data from the at least partial data redundancy. The performance servicing circuit may be further structured to suppress an operator notification of one of a fault condition or a failure condition in response to a performance capability of the plurality of electric motors being capable of delivering the application performance request value. The performance servicing circuit may be further structured to communicate the suppressed operator notification to at least one of a service tool or an external controller, wherein the external controller may be at least intermittently communicatively coupled to the controller. The performance servicing circuit may be further structured to adjust the application performance request value in response to a performance capability of the plurality of electric motors being incapable of delivering the application performance request value.

In an aspect, a method may include interpreting an application performance request value; determining a plurality of motor commands in response to a motor capability description and the application performance request value; and providing the plurality of motor commands to corresponding motors of a plurality of electric motors operationally coupled to corresponding ones of a plurality of electric loads of an electric mobile application. In embodiments, the method may further include determining the plurality of motor commands in response to one of a fault condition or a failure condition for at least one of the plurality of electric motors. The method may further include providing the plurality of motor commands to meet the application performance request value by at least partially redistributing load requirements from one of the plurality of electric motors having the fault condition or the failure condition, to at least one of the plurality of electric motors having available performance capacity. The method may further include derating one of the plurality of electric motors in response to the one of the fault condition or the failure condition. The method may further include commanding at least partial data redundancy between a first data store associated with a first one of the plurality of electric motors and a second data store associated with a second one of the plurality of electric motors. The at least partial data redundancy may include at least one data value selected from the data values consisting of: a fault value, a system state, and a learning component value. The method may further include commanding the at least partial data redundancy in response to one of a fault condition or a failure condition related to at least one of: one of the plurality of electric motors, or a local controller operationally coupled to one of the plurality of electric motors. The method may further include determining the plurality of motor commands in response to the one of the fault condition or the failure condition, and further in response to data from the at least partial data redundancy. One of a fault condition or a failure condition may relate to a first local contoller operationally coupled to one of the plurality of electric motors, the method may further include controlling the one of the plurality of electric motors with a second local controller communicatively coupled to the one of the plurality of electric motors. The method may further include suppressing an operator notification of one of a fault condition or a failure condition in response to a performance capability of the plurality of electric motors being capable of delivering the application performance request value. The method may further include communicating the suppressed operator notification to at least one of a service tool or an external controller, wherein the external controller may be at least intermittently communicatively coupled to a controller of the electric mobile application. The method may further include adjusting the application performance request value in response to a performance capability of the plurality of electric motors being incapable of delivering the application performance request value.

In an aspect, a system may include a vehicle having a motive electrical power path; a power distribution unit having a current protection circuit disposed in the motive electrical power path, the current protection circuit including: a first leg of the current protection circuit including a pyro-fuse; a second leg of the current protection circuit including a thermal fuse; and wherein the first leg and the second leg may be coupled in a parallel arrangement; a controller may include a current detection circuit structured to determine a current flow through the motive electrical power path; and a pyro-fuse activation circuit structured to provide a pyro-fuse activation command in response to the current flow exceeding a threshold current flow value; wherein the pyro-fuse may be responsive to the pyro-fuse activation command; and a fuse management circuit structured to provide a switch activation command in response to the current flow, wherein the solid state switch may be responsive to the switch activation command. In embodiments, a first resistance through the first leg and a second resistance through the second leg may be configured such that a resulting current through the second leg after the pyro-fuse activates may be sufficient to activate the thermal fuse. The system may further include a contactor coupled to the current protection circuit, wherein the contactor in the open position disconnects one of the current protection circuit or the second leg of the current protection circuit.

In an aspect, a system may include a vehicle having a motive electrical power path; a power distribution unit having a current protection circuit disposed in the motive electrical power path, the current protection circuit including: a first leg of the current protection circuit including a thermal fuse, a second leg of the current protection circuit including a solid state switch, wherein the first leg and the second leg may be coupled in a parallel arrangement, and a thermal fuse and a contactor in a series arrangement with the thermal fuse; a controller may include a current detection circuit structured to determine a current flow through the motive electrical power path; and a fuse management circuit structured to provide a switch activation command in response to the current flow; wherein the solid state switch may be responsive to the switch activation command; a high voltage power input coupling including a first electrical interface for a high voltage power source; and a high voltage power output coupling including a second electrical interface for a motive power load; wherein the current protection circuit electrically couples the high voltage power input to the high voltage power output, and wherein the current protection circuit may be at least partially disposed in a laminated layer of the power distribution unit, the laminated layer including an electrically conductive flow path disposed two electrically insulating layers. In embodiments, the system may further include a contactor coupled to the current protection circuit, wherein the contactor in the open position disconnects one of the current protection circuit or the second leg of the current protection circuit. The current protection circuit may include a motive power bus bar disposed in the laminated layer of the power distribution unit.

In an aspect, an integrated inverter assembly with power converter having a plurality of ports may include a main cover and an opposing back cover, a coolant channel disposed between a coolant channel cover and a coolant channel separating body; wherein power electronics of the inverter assembly may be thermally coupled to the coolant channel; wherein at least one of a coolant inlet or a coolant outlet of the coolant channel includes a quick connector without a locking element; a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the quick connector may further include a fir tree hose coupling disposed on an outer housing wall of the quick connector. The controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic.

In an aspect, an integrated inverter assembly may include a main cover and an opposing back cover, a coolant channel disposed between a coolant channel cover and a coolant channel separating body; wherein power electronics of the inverter assembly may be thermally coupled to the coolant channel; wherein at least one of a coolant inlet or a coolant outlet of the coolant channel includes a quick connector without a locking element; a plurality of IGBTs, each of the plurality of IGBTs configured to provide at least one phase of AC power to a motor, and a potted DC link capacitor operationally disposed between the IGBTs and a DC power source, and wherein the potted DC link capacitor includes a bus bar, a common-mode choke, and a capacitor disposed in a housing of the potted DC link capacitor. In embodiments, the quick connector may further include a fir tree hose coupling disposed on an outer housing wall of the quick connector. The inverter assembly may further include a first welded connection between the potted DC link capacitor and each of the IGBTs, and a second welded connection between each of the IGBTs and an AC motor connector of the inverter assembly.

In an aspect, a system may include an electric mobile application having a motor and an inverter, wherein the inverter includes a plurality of driving elements for the motor, a controller may include a motor control circuit structured to provide driver commands, and wherein the plurality of driving elements may be responsive to the driver commands; an operating conditions circuit structured to interpret a motor performance request value including at least one of a power, speed, or torque request for the motor, a driver efficiency circuit structured to interpret a driver activation value for each of the plurality of driving elements of the inverter in response to the motor performance request value; wherein the motor control circuit may be further structured to provide the driver commands to de-activate at least one of the plurality of driving elements for the motor in response to the driver activation value for each of the plurality of driving elements of the inverter, and a breaker/relay including: a fixed contact electrically coupled to a motive power circuit; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the motor may include a three-phase AC motor, wherein the plurality of driving elements include six driving elements, and wherein the driver efficiency circuit provides the driver activation value to de-activate three of the six driving elements in response to the motor performance request value being below a threshold value. The fixed contact may include a first fixed contact, the breaker/relay further including a second fixed contact, wherein the moveable contact includes a first moveable contact corresponding to the first fixed contact, the breaker/relay further including a second moveable contact corresponding to the second fixed contact, and a bus bar electrically coupling the first moveable contact to the second moveable contact.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; and wherein the plurality of electric motors may be responsive to the plurality of motor commands; a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the performance servicing circuit may be further structured to determine the plurality of motor commands in response to one of a fault condition or a failure condition for at least one of the plurality of electric motors. The plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; a motor control circuit structured to provide the plurality of motor commands to corresponding motors of the plurality of electric motors; wherein the plurality of electric motors may be responsive to the plurality of motor commands; a housing; a breaker/relay device positioned in the housing, wherein the breaker/relay device may be configured to interrupt a motive power circuit for an electrical vehicle system, where the housing may be disposed on the electrical vehicle system; wherein the breaker/relay device includes a physical opening response portion responsive to a first current value in the motive power circuit, and a controlled opening response portion responsive to a second current value in the motive power circuit; and a precharge circuit electrically coupled in parallel to the breaker/relay device. In embodiments, the performance servicing circuit may be further structured to determine the plurality of motor commands in response to one of a fault condition or a failure condition for at least one of the plurality of electric motors. The first current value may be greater than the second current value.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; wherein the plurality of electric motors may be responsive to the plurality of motor commands; and a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the performance servicing circuit may be further structured to determine the plurality of motor commands in response to one of a fault condition or a failure condition for at least one of the plurality of electric motors. The plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; wherein the plurality of electric motors may be responsive to the plurality of motor commands; a breaker/relay may include a plurality of fixed contacts electrically coupled electric load circuits for a mobile application; a plurality of moveable contacts, each moveable contact selectively electrically coupled to a corresponding one of the plurality of fixed contacts; a plurality of armatures each operationally coupled to a corresponding one of the moveable contacts, such that each armature in a first position prevents electrical coupling between the corresponding moveable contact and the corresponding fixed contact, and each armature in a second position allows electrical coupling between the corresponding moveable contact and the corresponding fixed contact; and a current response circuit structured to determine a current in each of the electric load circuits, and further structured to provide an armature command to open the corresponding one of the moveable contacts in response to the current in the corresponding electrical load circuit indicating a high current value. In embodiments, the performance servicing circuit may be further structured to determine the plurality of motor commands in response to one of a fault condition or a failure condition for at least one of the plurality of electric motors. The system may further include a plurality of biasing members each operationally coupled to a corresponding one of the plurality of moveable contacts, and configured to bias the corresponding one of the plurality of armatures into one of the first position or the second position.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; wherein the plurality of electric motors may be responsive to the plurality of motor commands; a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the performance servicing circuit may be further structured to determine the plurality of motor commands in response to one of a fault condition or a failure condition for at least one of the plurality of electric motors. The plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; wherein the plurality of electric motors may be responsive to the plurality of motor commands; a breaker/relay may include a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the performance servicing circuit may be further structured to determine the plurality of motor commands in response to one of a fault condition or a failure condition for at least one of the plurality of electric motors. The fixed contact may include a first fixed contact, the breaker/relay further including a second fixed contact, wherein the moveable contact includes a first moveable contact corresponding to the first fixed contact, the breaker/relay further including a second moveable contact corresponding to the second fixed contact, and a bus bar electrically coupling the first moveable contact to the second moveable contact.

In an aspect, a system may include an electric mobile application having a plurality of electric motors, each one of the plurality of electric motors operationally coupled to a corresponding one of a plurality of electric loads; a controller may include an application load circuit structured to interpret an application performance request value; a performance servicing circuit structured to determine a plurality of motor commands in response to a motor capability description and the application performance request value; and a motor control circuit structured to provide the plurality of motor commands to corresponding motors of the plurality of electric motors; wherein the plurality of electric motors may be responsive to the plurality of motor commands; a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the performance servicing circuit may be further structured to determine the plurality of motor commands in response to one of a fault condition or a failure condition for at least one of the plurality of electric motors. The plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic.

In an aspect, an integrated inverter assembly may include a main cover and an opposing back cover, a coolant channel disposed between a coolant channel cover and a coolant channel separating body; wherein power electronics of the inverter assembly may be thermally coupled to the coolant channel; wherein at least one of a coolant inlet or a coolant outlet of the coolant channel includes a quick connector without a locking element; and a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The quick connector may further include a fir tree hose coupling disposed on an outer housing wall of the quick connector.

In an aspect, an integrated inverter assembly may include a main cover and an opposing back cover, a plurality of IGBTs, each of the plurality of IGBTs configured to provide at least one phase of AC power to a motor, a potted DC link capacitor operationally disposed between the IGBTs and a DC power source, and wherein the potted DC link capacitor includes a bus bar, a common-mode choke, and a capacitor disposed in a housing of the potted DC link capacitor, and a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the plurality of distinct electrical characteristics may be selected from the electrical characteristics consisting of: a DC voltage, an AC voltage or voltage equivalent, a load power rating, a regenerative power rating, a current rating, a current directional-ity, a response time characteristic, a frequency characteristic, and a phase characteristic. The inverter assembly may further include a first welded connection between the potted DC link capacitor and each of the IGBTs, and a second welded connection between each of the IGBTs and an AC motor connector of the inverter assembly.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; and an arc suppression assembly structured to guide and disperse an opening arc between each of the plurality of moveable contacts and the corresponding fixed contacts; and a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The plurality of moveable contacts may be linked as a dual pole single throw contacting arrangement.

In an aspect, a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; a plurality of solid state switches configured to provide selected connectivity between the plurality of solid state components and the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic.

In an aspect, a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports; and a breaker/relay may include a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The fixed contact may include a first fixed contact, the breaker/relay further including a second fixed contact, wherein the moveable contact includes a first moveable contact corresponding to the first fixed contact, the breaker/relay further including a second moveable contact corresponding to the second fixed contact, and a bus bar electrically coupling the first moveable contact to the second moveable contact.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; and an arc suppression assembly structured to guide and disperse an opening arc between each of the plurality of moveable contacts and the corresponding fixed contacts; and a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The plurality of moveable contacts may be linked as a dual pole single throw contacting arrangement.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; and an arc suppression assembly structured to guide and disperse an opening arc between each of the plurality of moveable contacts and the corresponding fixed contacts; and a power converter having a plurality of ports, wherein the power converter determines an electrical interface description for at least one power source of an electric mobile application and at least one electrical load of the electric mobile application and provides solid switch states in response to the electrical interface description, thereby configuring at least one of an AC inverter or a DC/DC converter to provide or accept power to the at least one of the plurality of ports according to the port electrical interface description, and installing the power converter into the electric mobile application. In embodiments, the mobile application may further include determining which ports of the power converter may be to be coupled to the at least one power source and the at least one electrical load, and wherein providing the solid switch states includes configuring electrical characteristics of the determined ports according to the port electrical interface description. The plurality of moveable contacts may be linked as a dual pole single throw contacting arrangement.

In an aspect, a system may include a housing; a breaker/relay device positioned in the housing, wherein the breaker/relay device may be configured to interrupt a motive power circuit for an electrical vehicle system, where the housing may be disposed on the electrical vehicle system; wherein the breaker/relay device includes a physical opening response portion responsive to a first current value in the motive power circuit, and a controlled opening response portion responsive to a second current value in the motive power circuit; a precharge circuit electrically coupled in parallel to the breaker/relay device; and a power converter having a plurality of ports, wherein the power converter determines an electrical interface description for at least one power source of an electric mobile application and at least one electrical load of the electric mobile application and provides solid switch states in response to the electrical interface description, thereby configuring at least one of an AC inverter or a DC/DC converter to provide or accept power to the at least one of the plurality of ports according to the port electrical interface description, and installing the power converter into the electric mobile application. In embodiments, the system may further include determining which ports of the power converter may be to be coupled to the at least one power source and the at least one electrical load, and wherein providing the solid switch states includes configuring electrical characteristics of the determined ports according to the port electrical interface description. The first current value may be greater than the second current value.

In an aspect, an integrated inverter assembly may include a main cover and an opposing back cover, a coolant channel disposed between a coolant channel cover and a coolant channel separating body; wherein power electronics of the inverter assembly may be thermally coupled to the coolant channel; wherein at least one of a coolant inlet or a coolant outlet of the coolant channel includes a quick connector without a locking element; and a power converter have a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller may further include: a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The quick connector may further include a fir tree hose coupling disposed on an outer housing wall of the quick connector.

In an aspect, a power converter with a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states; and a breaker/relay may include a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the controller may further include: a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The fixed contact may include a first fixed contact, the breaker/relay further including a second fixed contact, wherein the moveable contact includes a first moveable contact corresponding to the first fixed contact, the breaker/relay further including a second moveable contact corresponding to the second fixed contact, and a bus bar electrically coupling the first moveable contact to the second moveable contact.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; and an arc suppression assembly structured to guide and disperse an opening arc between each of the plurality of moveable contacts and the corresponding fixed contacts; and a power converter have a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The plurality of moveable contacts may be linked as a dual pole single throw contacting arrangement.

In an aspect, an integrated inverter assembly may include a main cover and an opposing back cover, a coolant channel disposed between a coolant channel cover and a coolant channel separating body; wherein power electronics of the inverter assembly may be thermally coupled to the coolant channel; and wherein at least one of a coolant inlet or a coolant outlet of the coolant channel includes a quick connector without a locking element; and a power converter having a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The quick connector may further include a fir tree hose coupling disposed on an outer housing wall of the quick connector.

In an aspect, a system may include a vehicle having a motive electrical power path; a power distribution unit including a current protection circuit disposed in the motive electrical power path, the current protection circuit including a thermal fuse and a contactor in a series arrangement with the thermal fuse; a fuse thermal model circuit structured to determine a fuse temperature value of the thermal fuse, and to determine a fuse condition value in response to the fuse temperature value; and a power converter having a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The system may further include a current source circuit electrically coupled to the thermal fuse and structured to inject a current across the thermal fuse; a voltage determination circuit electrically coupled to the thermal fuse and structured to determine at least one of an injected voltage amount and a thermal fuse impedance value, wherein the voltage determination circuit includes a high pass filter having a cutoff frequency selected in response to a frequency of the injected current; and wherein the fuse thermal model circuit may be structured to determine the fuse temperature value of the thermal fuse further in response to the at least one of the injected voltage amount and the thermal fuse impedance value.

In an aspect, a power converter have a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states; and a breaker/relay may include a plurality of fixed contacts electrically coupled electric load circuits for a mobile application; a plurality of moveable contacts, each moveable contact selectively electrically coupled to a corresponding one of the plurality of fixed contacts; a plurality of armatures each operationally coupled to a corresponding one of the moveable contacts, such that each armature in a first position prevents electrical coupling between the corresponding moveable contact and the corresponding fixed contact, and each armature in a second position allows electrical coupling between the corresponding moveable contact and the corresponding fixed contact; and a current response circuit structured to determine a current in each of the electric load circuits, and further structured to provide an armature command to open the corresponding one of the moveable contacts in response to the current in the corresponding electrical load circuit indicating a high current value. In embodiments, the controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The power converter may further include a plurality of biasing members each operationally coupled to a corresponding one of the plurality of moveable contacts, and configured to bias the corresponding one of the plurality of armatures into one of the first position or the second position.

In an aspect, an integrated inverter assembly may include a main cover and an opposing back cover, a plurality of IGBTs, each of the plurality of IGBTs configured to provide at least one phase of AC power to a motor, a potted DC link capacitor operationally disposed between the IGBTs and a DC power source, and wherein the potted DC link capacitor includes a bus bar, a common-mode choke, and a capacitor disposed in a housing of the potted DC link capacitor, and a power converter have a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The inverter assembly may further include a first welded connection between the potted DC link capacitor and each of the IGBTs, and a second welded connection between each of the IGBTs and an AC motor connector of the inverter assembly.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; an arc suppression assembly structured to guide and disperse an opening arc between each of the plurality of moveable contacts and the corresponding fixed contacts; and wherein the motive electrical power path of a vehicle may be provided through a current protection circuit including a thermal fuse and a contactor in a series arrangement with the thermal fuse, wherein the mobile application: determines a current flow through the motive electrical power path; opens the contactor in response to the current flow exceeding a threshold value; confirms that vehicle operating conditions allow for a re-connection of the contactor, and commands the contactor to close in response to the vehicle operating conditions. In embodiments, the confirming the vehicle operating conditions may include at least one vehicle operating condition selected from the conditions consisting of: an emergency vehicle operating condition; a user override vehicle operating condition; a service event vehicle operating condition; and a re-connection command communicated on a vehicle network. The plurality of moveable contacts may be linked as a dual pole single throw contacting arrangement.

In an aspect, a system may include a vehicle having a motive electrical power path; a power distribution unit including a current protection circuit disposed in the motive electrical power path, the current protection circuit including breaker/relay, the breaker/relay including: fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value; a current source circuit electrically coupled to the breaker/relay and structured to inject a current across the fixed contact; a voltage determination circuit electrically coupled to the breaker/relay and structured to determine at least one of an injected voltage amount and a contactor impedance value, wherein the voltage determination circuit includes a high pass filter having a cutoff frequency selected in response to a frequency of the injected current; and a breaker/relay may include a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the fixed contact may include a first fixed contact, the breaker/relay further including a second fixed contact, wherein the moveable contact includes a first moveable contact corresponding to the first fixed contact, the breaker/relay further including a second moveable contact corresponding to the second fixed contact, and a bus bar electrically coupling the first moveable contact to the second moveable contact. The voltage determination circuit may further include a bandpass filter having a bandwidth selected to bound the frequency of the injected current.

In an aspect, a system may include an electric mobile application having a motor and an inverter, wherein the inverter includes a plurality of driving elements for the motor, a controller may include a motor control circuit structured to provide driver commands, and wherein the plurality of driving elements may be responsive to the driver commands; an operating conditions circuit structured to interpret a motor performance request value including at least one of a power, speed, or torque request for the motor, a driver efficiency circuit structured to interpret a driver activation value for each of the plurality of driving elements of the inverter in response to the motor performance request value; wherein the motor control circuit may be further structured to provide the driver commands to de-activate at least one of the plurality of driving elements for the motor in response to the driver activation value for each of the plurality of driving elements of the inverter, and a breaker/relay may include a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value. In embodiments, the fixed contact may include a first fixed contact, the breaker/relay further including a second fixed contact, wherein the moveable contact includes a first moveable contact corresponding to the first fixed contact, the breaker/relay further including a second moveable contact corresponding to the second fixed contact, and a bus bar electrically coupling the first moveable contact to the second moveable contact. The motor may include a three-phase AC motor, wherein the plurality of driving elements include six driving elements, and wherein the driver efficiency circuit provides the driver activation value to de-activate three of the six driving elements in response to the motor performance request value being below a threshold value.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; an arc suppression assembly structured to guide and disperse an opening arc between each of the plurality of moveable contacts and the corresponding fixed contacts; and a power converter have a plurality of ports may include a plurality of solid state components configured to provide selected electrical power outputs and to accept selected electrical power inputs; a plurality of solid state switches electrically interposed between the plurality of ports and the plurality of solid state components, wherein the plurality of solid state switches may be configured to selectively couple sets of the plurality of solid state components to the plurality of ports; and a controller may include a component bank configuration circuit structured to interpret a port electrical interface description, the port electrical interface description including a description of electrical characteristics for one of the plurality of ports; and a component bank implementation circuit structured to provide solid switch states in response to the port electrical interface description, and wherein the plurality of solid state switches may be responsive to the solid switch states. In embodiments, the controller may further include a load/source drive description circuit structured to interpret a source/load drive characteristic, wherein the source/load drive characteristic includes at least one electrical characteristic requirement of a load; and a load/source drive implementation circuit structured to provide a component driver configuration in response to the source/load drive characteristic. The plurality of moveable contacts may be linked as a dual pole single throw contacting arrangement.

In an aspect, a mobile application may include a motive power circuit, the motive power circuit including a power storage device and an electrical load, wherein the power storage device and the electrical load may be selectively electrically coupled through a power bus; a power distribution unit (PDU) electrically interposed between the power storage device and the electrical load, wherein the PDU includes a breaker/relay positioned on one of a high side and a low side of the power storage device; wherein the breaker/relay includes: a plurality of fixed contacts electrically coupled to the power bus; a plurality of moveable contacts corresponding to the plurality of fixed contacts, wherein the plurality of moveable contacts may be selectively electrically coupled to the plurality of fixed contacts, and wherein the moveable contacts allow power flow through the power bus when electrically coupled to the fixed contacts, and prevent power flow through the power bus when not electrically coupled to the fixed contacts; an armature operationally coupled to at least one of the moveable contacts, such that the armature in a first position prevents electrical coupling between the at least one of the moveable contacts and the corresponding one of the fixed contacts, and the armature in a second position allows electrical coupling between the at least one of the moveable contacts and the corresponding one of the fixed contacts; a first biasing member biasing the armature into one of the first position or the second position; an arc suppression assembly structured to guide and disperse an opening arc between each of the plurality of moveable contacts and the corresponding fixed contacts; and a multi-port power converter may include a housing including a plurality of ports structured to electrically interface to a plurality of loads, the plurality of loads having distinct electrical characteristics; a plurality of solid state components configured to provide selected electrical power outputs and to accept selected electrical power inputs; and a plurality of solid state switches configured to provide selected connectivity between the plurality of solid state components and the plurality of ports. In embodiments, the plurality of distinct electrical characteristics may be selected from the electrical characteristics consisting of: a DC voltage, an AC voltage or voltage equivalent, a load power rating, a regenerative power rating, a current rating, a current directionality, a response time characteristic, a frequency characteristic, and a phase characteristic. The plurality of moveable contacts may be linked as a dual pole single throw contacting arrangement.

Electrical power distribution in many applications is subject to a number of challenges. Presently available systems for controlling electrical power distribution, such as on/off control of power supplies and circuit paths, circuit and device protection (e.g., from overcurrent conditions) utilize a combined contactor and fuse.

Presently known contactors suffer from a number of drawbacks, including wear and deterioration from arcs during open and close events under high power, and deterioration during high current operation.

Presently known fuse components also suffer from a number of drawbacks. Fuses suffer from a difficulty in providing a consistent and reliable disconnection profile, as a fuse ultimately activates from temperature rather than current, and the temperature history, aging profile of the fuse, wear and deterioration, as well as the dynamics of current throughput through the fuse can all affect the actual current where fuse activation (e.g., breaking the circuit) occurs. Additionally, fuses experience deterioration and premature aging at high current loads, and accordingly designing a long-lasting and consistent fuse is difficult for systems having a high turndown ratio in the operating current range, as well as for systems having a highly variable current load during operations. Additionally, fuse activation is an unrecoverable event, resulting in a period of shutdown and/or system maintenance or repair after fuse activation before the system is operable again.

Additionally, presently known combined fuse-contactor systems suffer from a number of drawbacks. Because the contactor is required to remain engaged throughout the rated operation of the system, and because even an ideal fuse should not activate during rated operation of the system, there is necessarily an operational gap between rated operation of the system and the current protection level of the fuse. A fuse contactor design accordingly requires that a fuse be slightly undersized, risking fuse activation in the upper range of otherwise normal rated operation, or the fuse must be slightly oversized, risking components in the system to exposure to current levels above a rated current level. Additionally, a fuse may be undersized to protect for a contactor failure mode where an arc build-up in the contactor delays the current dynamics in the circuit, resulting in a delayed activation, or even failure to activate, of the fuse and accordingly an increased risk of damage to the contactor or components in the system. The previously described difficulties in tuning the fuse activation profile leads to increased design, operational, and/or capital expense, or to reduced system capability. For example, a presently known design may be overly conservative—such as utilizing components that are able to withstand current significantly higher than rated current values, or a true system performance significantly below rated current values during at least certain operating conditions. Additionally or alternatively, a risk of component failure may be accepted driving higher operational costs and/or lower system reliability, or fuse and/or contactor maintenance schedules may be more frequent, increasing operational costs and reducing the uptime of the overall system. Additionally or alternatively, additional power sources, power storage, or the like may be provided to enhance the operating capability of the system to meet desired performance characteristics.

Applications that have a highly variable load, highly dynamic load profiles, and/or high turndown ratios within the operating current range exacerbate all of the challenges of combined fuse-contactor systems. For example, mobile applications such as vehicles or mobile equipment often have highly variability and low predictability of the load profile during operations. Certain types of systems have varying categories of loads driving different duty cycles and load profiles—for example mobile applications that also operate additional equipment (e.g., pumps, PTO devices, communication equipment, etc.) either during mobile operations or while stationary. Additionally, load profiles may vary considerably depending upon the load direction or operation—for example it may be desirable to charge much more quickly than discharge, for example where charging is associated with useful operation of the system and discharging is associated with downtime of the system. In other examples, motive power loads on the system may be highly distinct from regenerative recovery of power from a load, and/or certain energy recovery operations may have very small currents associated therewith (e.g., solar power, waste heat recovery, etc.). Presently known systems that are highly variable, including in load values and load types, and/or highly dynamic, further increase the design and/or operational expense of the system, through conservative design, redundant and/or duplicative systems to manage variability, lowered system capability, and/or acceptance of operational risk.

Mobile applications provide further challenges for previously known combined fuse-contactor systems. For example, many mobile applications, such as commercial and passenger vehicles, are cost sensitive to both initial costs of a system, and to ongoing operating costs. Additionally, downtime for service, maintenance, or system failures has a very high cost, due to large volumes and competitive markets. Accordingly, even modest improvements to initial costs, operating costs, and reliability can make a significant impact on the outcome of the system, or make a non-marketable system competitive. Mobile applications often have a large differential in duty cycle even for systems that have similar power ratings. Further, mobile applications often involve systems that are sold or otherwise transferred, where the same system can experience a significant change in the duty cycle and operating conditions after the system is in the hands of a user. Accordingly, a lack of flexibility in design parameters at the time of initial sale can limit the available markets for a system, and a lack of flexibility in design parameters in use can result in increased failures later in the life cycle of the system. An example system includes a vehicle having a motive electrical power path; a power distribution unit having a current protection circuit disposed in the motive electrical power path, the current protection circuit including: a first leg of the current protection circuit including a pyro-fuse; a second leg of the current protection circuit including a thermal fuse; and where the first leg and the second leg are coupled in a parallel arrangement; a controller, including: a current detection circuit structured to determine a current flow through the motive electrical power path; and a pyro-fuse activation circuit structured to provide a pyro-fuse activation command in response to the current flow exceeding a threshold current flow value; and where the pyro-fuse is responsive to the pyro-fuse activation command.

Certain further aspects of an example system are described following, any one or more of which may be present in certain embodiments. An example system includes where a first resistance through the first leg and a second resistance through the second leg are configured such that a resulting current through the second leg after the pyro-fuse activates is sufficient to activate the thermal fuse. An example includes a resistor coupled in a series arrangement with the thermal fuse, such that a resulting current through the second leg after the pyro-fuse activates is below a second threshold current flow value. An example system includes a contactor coupled in a series arrangement with the thermal fuse, the controller further including a contactor activation circuit structured to provide a contactor open command in response to at least one of the pyro-fuse activation command or the current flow exceeding the threshold current flow value; and/or a resistor coupled in a series arrangement with the thermal fuse, such that a resulting current through the second leg after the pyro-fuse activates is below a second threshold current flow value. An example includes a resistor coupled in a series arrangement with the pyro-fuse, such that a resulting current through the first leg after the thermal fuse activates is below a second threshold current flow value; and/or a second thermal fuse coupled in a series arrangement with the pyro-fuse, such that a resulting current through the first leg after the thermal fuse activates is sufficient to activate the second thermal fuse.

An example procedure includes an operation to determine a current flow through a motive electrical power path of a vehicle; an operation to direct the current flow through a current protection circuit having a parallel arrangement, with a pyro-fuse on a first leg of the current protection circuit and a thermal fuse on a second leg of the current protection circuit; and an operation to provide a pyro-fuse activation command in response to the current flow exceeding a threshold current flow value.

Certain further aspects of an example procedure are described following, any one or more of which may be present in certain embodiments. An example procedure further includes an operation to configure a first resistance through the first leg and a second resistance through the second leg such that a resulting current through the second leg after the pyro-fuse activates is sufficient to activate the thermal fuse. An example procedure includes an operation to configure a second resistance through the second leg such that a resulting current through the second leg after the pyro-fuse activates is below a second threshold current flow value. An example procedure includes an operation to a contactor coupled in a series arrangement with the thermal fuse, the procedure further including providing a contactor open command in response to at least one of providing the pyro-fuse activation command or the current flow exceeding the threshold current flow value; and/or an operation to configure a second resistance through the second leg such that a resulting current through the second leg after the pyro-fuse activates is below a second threshold current flow value. An example procedure further including a resistor coupled in a series arrangement with the pyro-fuse such that a resulting current through the first leg after the thermal fuse activates is below a second threshold current flow value; and/or further including a second thermal fuse coupled in a series arrangement with the pyro-fuse, such that a resulting current through the first leg after the thermal fuse activates is sufficient to activate the second thermal fuse.

An example system includes a vehicle having a motive electrical power path; a power distribution unit having a current protection circuit disposed in the motive electrical power path, the current protection circuit including: a first leg of the current protection circuit including a thermal fuse; a second leg of the current protection circuit including a contactor, and where the first leg and the second leg are coupled in a parallel arrangement; a controller, including: a current detection circuit structured to determine a current flow through the motive electrical power path; and a fuse management circuit structured to provide a contactor activation command in response to the current flow; and where the contactor is responsive to the contactor activation command.

Certain further aspects of an example system are described following, any one or more of which may be present in certain embodiments. An example system includes where the contactor is open during nominal operations of the vehicle, and where the fuse management circuit is structured to provide the contactor activation command as a contactor closing command in response to determining that the current flow is a above a thermal wear current for the thermal fuse; and/or where the fuse management circuit is further structured to provide the contactor activation command as the contactor closing command in response to determining that the current flow is below a current protection value for the motive electrical power path. An example system includes where the contactor is closed during nominal operations of the vehicle, and where the fuse management circuit is structured to provide the contactor activation command as a contactor opening command in response to determining that the current flow is above a current protection value for the motive electrical power path. An example system includes where the fuse management circuit is further structured to provide the contactor activation command in response to the current flow by performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing.

An example procedure includes an operation to determine a current flow through a motive electrical power path of a vehicle; an operation to direct the current flow through a current protection circuit having a parallel arrangement, with a thermal fuse on a first leg of the current protection circuit and a contactor on a second leg of the current protection circuit; and an operation to provide a contactor activation command in response to the current flow.

Certain further aspects of an example procedure are described following, any one or more of which may be present in certain embodiments. An example procedure further includes an operation to close the contactor in response to the current flow. An example procedure includes an operation to determine that the current flow is below a current protection value for the motive electrical power path before the closing the contactor. An example procedure includes at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing. An example procedure includes an operation to open the contactor in response to the current flow; an operation to determine that the current flow is above a current protection value for the motive electrical power path before opening the contactor, an operation to open the contactor including performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing.

An example system includes a vehicle having a motive electrical power path; a power distribution unit having a current protection circuit disposed in the motive electrical power path, the current protection circuit including: a first leg of the current protection circuit including a thermal fuse; a second leg of the current protection circuit including a solid state switch; and where the first leg and the second leg are coupled in a parallel arrangement; a controller, including: a current detection circuit structured to determine a current flow through the motive electrical power path; and a fuse management circuit structured to provide a switch activation command in response to the current flow; and where the solid state switch is responsive to the switch activation command.

Certain further aspects of an example system are described following, any one or more of which may be present in certain embodiments. An example system includes a contactor coupled to the current protection circuit, where the contactor in the open position disconnects one of the current protection circuit or the second leg of the current protection circuit.

An example procedure includes an operation to determine a current flow through a motive electrical power path of a vehicle; an operation to direct the current flow through a current protection circuit having a parallel arrangement, with a thermal fuse on a first leg of the current protection circuit and a solid state switch on a second leg of the current protection circuit; and an operation to provide a switch activation command in response to the current flow.

Certain further aspects of an example procedure are described following, any one or more of which may be present in certain embodiments. An example procedure further includes an operation to close the solid state switch in response to the current flow; and/or determine that the current flow is below a current protection value for the motive electrical power path before the closing the solid state switch. An example procedure includes an operation to close the solid state switch includes performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing. An example procedure includes an operation to open the solid state switch in response to the current flow; and/or determine that the current flow is above a current protection value for the motive electrical power path before opening the solid state switch. An example procedure includes an operation to open the solid state switch includes performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing. An example procedure includes an operation to open a contactor after the opening the solid state switch, where opening the contactor disconnects one of the current protection circuit or the second leg of the current protection circuit.

An example system includes a vehicle having a motive electrical power path; a power distribution unit having a current protection circuit disposed in the motive electrical power path, the current protection circuit including: a first leg of the current protection circuit including a first thermal fuse; a second leg of the current protection circuit including a second thermal fuse and a contactor, and where the first leg and the second leg are coupled in a parallel arrangement; a controller, including: a current detection circuit structured to determine a current flow through the motive electrical power path; and a fuse management circuit structured to provide a contactor activation command in response to the current flow; and where the contactor is responsive to the contactor activation command.

Certain further aspects of an example system are described following, any one or more of which may be present in certain embodiments. An example system includes where the contactor is open during nominal operations of the vehicle, and where the fuse management circuit is structured to provide the contactor activation command as a contactor closing command in response to determining that the current flow is a above a thermal wear current for the first thermal fuse; and/or where the fuse management circuit is further structured to provide the contactor activation command as a contactor closing command in response to determining that the current flow is below a current protection value for the motive electrical power path. An example system includes a vehicle operating condition circuit structured to determine an operating mode for the vehicle, and where the fuse management circuit is further structured to provide the contactor activation command in response to the operating mode; and/or where the fuse management circuit is further structured to provide the contactor activation command as a contactor closing command in response to the operating mode including at least one operating mode selected from the operating modes consisting of: a charging mode; a high performance mode; a high power request mode; an emergency operation mode; and a limp home mode. An example system includes where the contactor is closed during nominal operations of the vehicle, and where the fuse management circuit is structured to provide the contactor activation command as a contactor opening command in response to determining that the current flow is above a current protection value for the motive electrical power path; where the contactor is closed during nominal operations of the vehicle, and where the fuse management circuit is structured to provide the contactor activation command as a contactor opening command in response to the operating mode; and/or where the fuse management circuit is further structured to provide the contactor activation command as a contactor opening command in response to the operating mode including at least one of an economy mode or a service mode.

An example procedure includes an operation to determine a current flow through a motive electrical power path of a vehicle; an operation to direct the current flow through a current protection circuit having a parallel arrangement, with a first thermal fuse on a first leg of the current protection circuit and a second thermal fuse and a contactor on a second leg of the current protection circuit; and an operation to provide a contactor activation command in response to the current flow.

Certain further aspects of an example procedure are described following, any one or more of which may be present in certain embodiments. An example procedure further includes an operation to close the contactor in response to the current flow being above a thermal wear current for the first thermal fuse; and/or closing the contactor further in response to the current flow being below a current protection value for the motive electrical power path. An example procedure includes an operation to determine an operating mode for the vehicle, and providing the contactor activation command further in response to the operating mode. An example procedure includes an operation to provide the contactor activation command as a contactor closing command in response to the operating mode including at least one operating mode selected from the operating modes consisting of: a charging mode; a high performance mode; a high power request mode; an emergency operation mode; and a limp home mode. An example procedure includes an operation to provide the contactor activation command as a contactor opening command in response to determining that the current flow is above a current protection value for the motive electrical power path; and/or provide the contactor activation command as a contactor opening command in response to the operating mode including at least one of an economy mode or a service mode.

An example system includes a vehicle having a motive electrical power path; a power distribution unit having a current protection circuit disposed in the motive electrical power path, the current protection circuit including: a first leg of the current protection circuit including a first thermal fuse and a first contactor, a second leg of the current protection circuit including a second thermal fuse and a second contactor, and where the first leg and the second leg are coupled in a parallel arrangement; a controller, including: a current detection circuit structured to determine a current flow through the motive electrical power path; and a fuse management circuit structured to provide a plurality of contactor activation commands in response to the current flow; and where the first contactor and the second contactor are responsive to the plurality of contactor activation commands, thereby providing a selected configuration of the current protection circuit.

Certain further aspects of an example system are described following, any one or more of which may be present in certain embodiments. An example system includes where the current protection circuit further includes: at least one additional leg, where each additional leg includes an additional thermal fuse and an additional contactor, and where each additional contactor is further responsive to the plurality of contactor activation commands, thereby providing the selected configuration of the current protection circuit. An example system includes a vehicle operating condition circuit structured to determine an operating mode for the vehicle, and where the fuse management circuit is further structured to provide the plurality of contactor activation commands in response to the operating mode; and/or where the fuse management circuit is further structured to determine an active current rating for the motive electrical power path in response to the operating mode, and to provide the plurality of contactor activation commands in response to the active current rating. An example system includes where the first leg of the current protection circuit further includes an additional first contactor in a parallel arrangement with the first thermal fuse, where the current detection circuit is further structured to determine a first leg current flow, where the fuse management circuit is further structured to provide the plurality of contactor activation commands further in response to the first leg current flow, and where the additional first contactor is responsive to the plurality of contactor activation commands; where the additional first contactor is open during nominal operations of the vehicle, and where the fuse management circuit is structured to provide the plurality of contactor activation commands including an additional first contactor closing command in response to determining that the first leg current flow is a above a thermal wear current for the first thermal fuse: where the fuse management circuit is structured to provide the additional first contactor closing command in response to determining at least one of: that the first leg current flow is below a first leg current protection value, or that the current flow is below a motive electrical power path current protection value; and/or where the additional first contactor is closed during nominal operations of the vehicle, and where the fuse management circuit is structured to provide the plurality of contactor activation commands including an additional first contactor opening command in response to determining at least one of: that the first leg current flow is above a first leg current protection value, or that the current flow is above a motive electrical power path current protection value.

An example procedure includes an operation to determine a current flow through a motive electrical power path of a vehicle; an operation to direct the current flow through a current protection circuit having a parallel arrangement, with a first thermal fuse and a first contactor on a first leg of the current protection circuit, and a second thermal fuse and a second contactor on a second leg of the current protection circuit; and an operation to provide a selected configuration of the current protection circuit in response to the current flow through the motive electrical power path of the vehicle, where providing the selected configuration includes providing a contactor activation command to each of the first contactor and the second contactor.

Certain further aspects of an example procedure are described following, any one or more of which may be present in certain embodiments. An example procedure includes an operation further including at least one additional leg of the current protection circuit, each additional leg of the current protection circuit having an additional thermal fuse and an additional contactor, and where the providing the selected configuration of the current protection circuit includes providing a contactor activation command to each additional contactor. An example procedure includes an operation to determine an operating mode for the vehicle, and providing the selected configuration further in response to the operating mode; and/or an operation to determine an active current rating for the motive electrical power path in response to the operating mode, and where providing the selected configuration of the current protection circuit is further in response to the active current rating. An example procedure includes an operation to determine an active current rating for the motive electrical power path, and where providing the selected configuration of the current protection circuit is further in response to the active current rating. An example procedure includes an operation where the first leg of the current protection circuit further includes an additional first contactor in a parallel arrangement with the first thermal fuse, the method further including: determining a first leg current flow, and where providing the selected configuration further includes providing a contactor activation command to the additional first contactor, an operation to close the additional first contactor in response to determining that the first leg current flow is a above a thermal wear current for the first thermal fuse; an operation to close the additional first contactor further in response to determining at least one of: that the first leg current flow is below a first leg current protection value, or that the current flow is below a motive electrical power path current protection value; and/or an operation to open the additional first contactor in response to determining at least one of: that the first leg current flow is above a first leg current protection value, or that the current flow is above a motive electrical power path current protection value.

An example system includes a vehicle having a motive electrical power path; a power distribution unit having a current protection circuit disposed in the motive electrical power path, the current protection circuit including a fuse; a controller, including: a fuse status circuit structured to determine a fuse event value; and a fuse management circuit structured to provide a fuse event response based on the fuse event value.

Certain further aspects of an example system are described following, any one or more of which may be present in certain embodiments. An example system includes a fuse life description circuit structured to determine a fuse life remaining value, where the fuse event value includes a representation that the fuse life remaining value is below a threshold value, and where the fuse management circuit is further structured to provide the fuse event response further based on the fuse life remaining value; where providing the fuse event response includes providing at least one of a fault code or a notification of the fuse event value; where providing the fuse event response includes adjusting a maximum power rating for the motive electrical power path; where providing the fuse event response includes adjusting a maximum power slew rate for the motive electrical power path; and/or where providing the fuse event response includes adjusting a configuration of the current protection circuit. An example system includes where the current protection circuit further includes a contactor coupled in a parallel arrangement to the fuse; where the fuse management circuit is further structured to provide a contactor activation command in response to the fuse event value; and where the contactor is responsive to the contactor activation command. An example system includes where the fuse management circuit is further structured to provide the contactor activation command as a contactor closing command in response to the fuse event value including one of a thermal wear event or an imminent thermal wear event for the fuse. An example system includes where the fuse management circuit is further structured to adjust a current threshold value for the contactor activation command in response to the fuse life remaining value; and/or where providing the fuse event response includes adjusting a cooling system interface for a cooling system at least selectively thermally coupled to the fuse in response to the fuse life remaining value.

An example procedure includes an operation to determine a fuse event value for a fuse disposed in a current protection circuit, the current protection circuit disposed in a motive electrical power path of a vehicle; and an operation to provide a fuse event response based on the fuse event value.

Certain further aspects of an example procedure are described following, any one or more of which may be present in certain embodiments. An example procedure further includes an operation to determine a fuse life remaining value, where the fuse event value includes a representation that the fuse life remaining value is below a threshold value, and providing the fuse event response further based on the fuse life remaining value; an operation to provide the fuse event response includes providing at least one of a fault code or a notification of the fuse event value; an operation to provide the fuse event response includes adjusting a maximum power rating for the motive electrical power path; an operation to provide the fuse event response includes adjusting a maximum power slew rate for the motive electrical power path; an operation to provide the fuse event response includes adjusting a configuration of the current protection circuit. An example procedure includes an operation where the current protection circuit further includes a contactor coupled in a parallel arrangement to the fuse; where the fuse management circuit is further structured to provide a contactor activation command in response to the fuse event value; and where the contactor is responsive to the contactor activation command; where the fuse management circuit is further structured to provide the contactor activation command as a contactor closing command in response to the fuse event value including one of a thermal wear event or an imminent thermal wear event for the fuse; and/or where the fuse management circuit is further structured to adjust a current threshold value for the contactor activation command in response to the fuse life remaining value. An example procedure includes an operation to provide the fuse event response includes adjusting a cooling system interface for a cooling system at least selectively thermally coupled to the fuse in response to the fuse life remaining value. An example procedure includes an operation to provide the fuse event response includes providing at least one of a fault code or a notification of the fuse event value. An example procedure includes an operation to determine an accumulated fuse event description in response to the fuse event response, and storing the accumulated fuse event description. An example procedure includes an operation to provide the accumulated fuse event description, where providing the accumulated fuse event description includes at least one of providing at least one of a fault code or a notification of the accumulated fuse event description; and an operation to provide the accumulated fuse event description in response to at least one of a service event or a request for the accumulated fuse event description.

An example system includes a vehicle having a motive electrical power path and at least one auxiliary electrical power path; a power distribution unit having a motive current protection circuit disposed in the motive electrical power path, the current protection circuit including a fuse; and an auxiliary current protection circuit disposed in each of the at least one auxiliary electrical power paths, each auxiliary current protection circuit including an auxiliary fuse; a controller, including: a current determination circuit structured to interpret a motive current value corresponding to the motive electrical power path, and an auxiliary current value corresponding to each of the at least one auxiliary electrical power paths.

Certain further aspects of an example system are described following, any one or more of which may be present in certain embodiments. An example system includes a motive current sensor electrically coupled to the motive electrical power path, where the motive current sensor is configured to provide the motive current value. An example system includes at least one auxiliary current sensor each electrically coupled to one of the at least one auxiliary electrical power paths, each auxiliary current sensor configured to provide the corresponding auxiliary current value. An example system includes where the controller further includes a vehicle interface circuit, the vehicle interface circuit structured to provide the motive current value to a vehicle network; where the vehicle interface circuit is further structured to provide the auxiliary current value corresponding to each of the at least one auxiliary electrical power paths to the vehicle network; and/or further including a battery management controller configured to receive the motive current value from the vehicle network.

An example procedure includes an operation to provide a power distribution unit having a motive current protection circuit and at least one auxiliary current protection circuit; an operation to power a vehicle motive electrical power path through the motive current protection circuit; an operation to power at least one auxiliary load through a corresponding one of the at least one auxiliary current protection circuit; an operation to determine a motive current value corresponding to the motive electrical power path; and an operation to determine an auxiliary current value corresponding to each of the at least one auxiliary current protection circuits.

Certain further aspects of an example procedure are described following, any one or more of which may be present in certain embodiments. An example procedure further includes an operation to provide the motive current value to a vehicle network; and/or an operation to receive the motive current value with a battery management controller.

An example system includes a vehicle having a motive electrical power path; a power distribution unit having a current protection circuit disposed in the motive electrical power path, the current protection circuit including: a thermal fuse; a contactor in a series arrangement with the thermal fuse; and a controller, including: a current detection circuit structured to determine a current flow through the motive electrical power path; and a fuse management circuit structured to provide a contactor activation command in response to the current flow; and where the contactor is responsive to the contactor activation command.

Certain further aspects of an example system are described following, any one or more of which may be present in certain embodiments. An example system includes where the thermal fuse includes a current rating that is higher than a current corresponding to a maximum power throughput of the motive electrical power path. An example system includes where the thermal fuse includes a current rating that is higher than a current corresponding to a quick charging power throughput of the motive electrical power path. An example system includes where the contactor includes a current rating that is higher than a current corresponding to a maximum power throughput of the motive electrical power path. An example system includes where the contactor includes a current rating that is higher than a current corresponding to a quick charging power throughput of the motive electrical power path. An example system includes where the fuse management circuit is further structured to provide the contactor activation command as a contactor opening command in response to the current flow indicating a motive electrical power path protection event; and/or where the current detection circuit is further structured to determine the motive electrical power path protection event by performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing.

An example procedure includes an operation to power a motive electrical power path of a vehicle through a current protection circuit including a thermal fuse and a contactor in a series arrangement with the thermal fuse; an operation to determine a current flow through the motive electrical power path; and an operation to selectively open the contactor in response to the current flow.

Certain further aspects of an example procedure are described following, any one or more of which may be present in certain embodiments. An example procedure further includes an operation to provide the thermal fuse having a current rating that is higher than a current corresponding to a maximum power throughput of the motive electrical power path. An example procedure includes an operation to provide the thermal fuse having a current rating that is higher than a current corresponding to a quick charging power throughput of the motive electrical power path. An example procedure includes an operation to provide the contactor having a current rating that is higher than a current corresponding to a maximum power throughput of the motive electrical power path. An example procedure includes an operation to provide the contactor having a current rating that is higher than a current corresponding to a quick charging power throughput of the motive electrical power path. An example procedure includes an operation to open the contactor is further in response to at least one of: a rate of change of the current flow; a comparison of the current flow to a threshold value; one of an integrated or accumulated value of the current flow; and an expected or predicted value of any of the foregoing.

An example procedure includes an operation to power a motive electrical power path of a vehicle through a current protection circuit including a thermal fuse and a contactor in a series arrangement with the thermal fuse; an operation to determine a current flow through the motive electrical power path; an operation to open the contactor in response to the current flow exceeding a threshold value; an operation to confirm that vehicle operating conditions allow for a re-connection of the contactor, and an operation to command the contactor to close in response to the vehicle operating conditions.

Certain further aspects of an example procedure are described following, any one or more of which may be present in certain embodiments. An example procedure further includes an operation to confirm the vehicle operating conditions includes at least one vehicle operating condition selected from the conditions consisting of: an emergency vehicle operating condition; a user override vehicle operating condition; a service event vehicle operating condition; and a re-connection command communicated on a vehicle network. An example procedure includes an operation to monitor the motive electrical power path during the commanding the contactor to close, and re-opening the contactor in response to the monitoring. An example procedure includes an operation to determine an accumulated contactor open event description in response to the opening the contactor, an operation to prevent the commanding the contactor to close in response to the accumulated contactor open event description exceeding a threshold value; and/or an operation to adjust the accumulated contactor open event description in response to the current flow during the opening the contactor. An example procedure includes an operation to diagnose a welded contactor in response to one of the current flow during the opening the contactor, and a monitoring of the motive electrical power path during the commanding the contactor to close. An example procedure includes an operation to diagnose a welded contactor in response to a monitoring of at least one of a contactor actuator position, a contactor actuator response, or the motive electrical power path during the opening the contactor, and/or an operation to prevent the commanding the contactor to close in response to the diagnosed welded contactor.

An example apparatus includes a motive electrical power current protection circuit structured to: determine a current flow through a motive electrical power path of a vehicle; and open a contactor disposed in a current protection circuit including a thermal fuse and the contactor in a series arrangement with the thermal fuse in response to the current flow exceeding a threshold value; a vehicle re-power circuit structured to: confirm that vehicle operating conditions allow for a re-connection of the contactor, and close the contactor in response to the vehicle operating conditions.

Certain further aspects of an example apparatus are described following, any one or more of which may be present in certain embodiments. An example apparatus includes where the vehicle re-power circuit is further structured to confirm the vehicle operating conditions by confirming at least one vehicle operating condition selected from the conditions consisting of: an emergency vehicle operating condition; a user override vehicle operating condition; a service event vehicle operating condition; and a re-connection command communicated on a vehicle network. An example apparatus includes where the motive electrical power current protection circuit is further structured to monitor the motive electrical power path during the closing the contactor to close, and where the vehicle re-power circuit is further structured to re-open the contactor in response to the monitoring. An example apparatus includes a contactor status circuit structured to determine an accumulated contactor open event description in response to the opening the contactor, where the vehicle re-power circuit is further structured to prevent the closing the contactor in response to the accumulated contactor open event description exceeding a threshold value; and/or where the contactor status circuit is further structured to adjust the accumulated contactor open event description in response to the current flow during the opening the contactor. An example apparatus includes a contactor status circuit structured to diagnose a welded contactor in response to one of, during the commanding the contactor to close: the current flow during the opening the contactor, and a monitoring of the motive electrical power path by the motive electrical power current protection circuit. An example apparatus includes a contactor status circuit structured to diagnose a welded contactor in response to a monitoring of, during the opening of the contactor, at least one of: a contactor actuator position by the vehicle re-power circuit; a contactor actuator response by the vehicle re-power circuit; and the motive electrical power path by the motive electrical power current protection circuit; and/or where the contactor status circuit is further structured to prevent the closing the contactor in response to the diagnosed welded contactor.

An example system includes a vehicle having a motive electrical power path; a power distribution unit including: a current protection circuit disposed in the motive electrical power path, the current protection circuit including a thermal fuse and a contactor in a series arrangement with the thermal fuse; a high voltage power input coupling including a first electrical interface for a high voltage power source; a high voltage power output coupling including a second electrical interface for a motive power load; and where the current protection circuit electrically couples the high voltage power input to the high voltage power output, and where the current protection circuit is at least partially disposed in a laminated layer of the power distribution unit, the laminated layer including an electrically conductive flow path disposed two electrically insulating layers.

Certain further aspects of an example system are described following, any one or more of which may be present in certain embodiments. An example system includes where current protection circuit includes a motive power bus bar disposed in the laminated layer of the power distribution unit. An example system includes where the vehicle further includes an auxiliary electrical power path; where the power distribution unit further includes: an auxiliary current protection circuit disposed in the auxiliary electrical power path, the auxiliary current protection circuit including a second thermal fuse; an auxiliary voltage power input coupling including a first auxiliary electrical interface for a low voltage power source; an auxiliary voltage power output coupling including a second auxiliary electrical interface for a an auxiliary load; and where the auxiliary current protection circuit electrically couples the auxiliary voltage power input to the auxiliary voltage power output, and where the auxiliary current protection circuit is at least partially disposed in the laminated layer of the power distribution unit. An example system includes where the laminated layer of the power distribution unit further includes at least one thermally conductive flow path disposed between two thermally insulating layers; where the at least one thermally conductive flow path is configured to provide thermal coupling between a heat sink, and a heat source, where the heat source includes at least one of the contactor, the thermal fuse, and the second thermal fuse; where the heat sink includes at least one of a thermal coupling to an active cooling source and a housing of the power distribution unit; and/or further including a thermal conduit disposed between the at least one thermally conductive flow path and the heat source.

An example system includes a vehicle having a motive electrical power path; a power distribution unit including a current protection circuit disposed in the motive electrical power path, the current protection circuit including a thermal fuse and a contactor in a series arrangement with the thermal fuse; a current source circuit electrically coupled to the thermal fuse and structured to inject a current across the thermal fuse; and a voltage determination circuit electrically coupled to the thermal fuse and structured to determine at least one of an injected voltage amount and a thermal fuse impedance value.

Certain further aspects of an example system are described following, any one or more of which may be present in certain embodiments. An example system includes where the motive electrical power path includes a direct current power path; where the current source circuit includes at least one of an alternating current source and a time varying current source, further including a hardware filter electrically coupled to the thermal fuse, the hardware filter configured in response to an injection frequency of the current source circuit; where the hardware filter includes a high pass filter having a cutoff frequency determined in response to the injection frequency of the current source circuit; where the hardware filter includes a low pass filter having a cutoff frequency determined in response to at least one of the injection frequency of the current source circuit or a load change value of the motive electrical power path; where the hardware filter includes a low pass filter having a cutoff frequency determined in response to at least one of the injection frequency of the current source circuit or a load change value of the motive electrical power path; where the voltage determination circuit is further structured to determine to determine an injected voltage drop of the thermal fuse in response to an output of the high pass filter, where the voltage determination circuit is further structured to determine the thermal fuse impedance value in response to the injected voltage drop; and/or where the voltage determination circuit is further structured to determine a load voltage drop of the thermal fuse in response to an output of the low pass filter, the system further including a load current circuit structured to determine a load current through the fuse in response to the thermal fuse impedance value, and further in response to the load voltage drop.

An example system includes a vehicle having a motive electrical power path; a power distribution unit including a current protection circuit disposed in the motive electrical power path, the current protection circuit including a thermal fuse and a contactor in a series arrangement with the thermal fuse; a current source circuit electrically coupled to the thermal fuse and structured to inject a current across the thermal fuse; a voltage determination circuit electrically coupled to the thermal fuse and structured to determine at least one of an injected voltage amount and a thermal fuse impedance value, where the voltage determination circuit includes a high pass filter having a cutoff frequency selected in response to a frequency of the injected current.

Certain further aspects of an example system are described following, any one or more of which may be present in certain embodiments. An example system includes where the voltage determination circuit further includes a bandpass filter having a bandwidth selected to bound the frequency of the injected current. An example system includes where the high pass filter includes an analog hardware filter, and where the bandpass filter includes a digital filter. An example system includes where the high pass filter and the bandpass filter comprise digital filters; where the voltage determination circuit is further structured to determine the thermal fuse impedance value in response to the injected voltage drop; and/or further including a fuse characterization circuit structured to store one of a fuse resistance value and a fuse impedance value, and where the fuse characterization circuit is further structured to update the stored one of the fuse resistance value and the fuse impedance value in response to the thermal fuse impedance value. An example system includes where the fuse characterization circuit is further structured to update the stored one of the fuse resistance value and the fuse impedance value by performing at least one operation selected from the operations consisting of: updating a value to the thermal fuse impedance value; filtering a value using the thermal fuse impedance value as a filter input; rejecting the thermal fuse impedance value for a period of time or for a number of determinations of the thermal fuse impedance value; and updating a value by performing a rolling average of a plurality of thermal impedance values over time. An example system includes where the power distribution unit further includes a plurality of thermal fuses disposed therein, and where the current source circuit is further electrically coupled to the plurality of thermal fuses, and to sequentially inject a current across each of the plurality of thermal fuses; and where the voltage determination circuit is further electrically coupled to each of the plurality of thermal fuses, and further structured to determine at least one of an injected voltage amount a thermal fuse impedance value for each of the plurality of thermal fuses; where the current source circuit is further structured to sequentially inject the current across each of the plurality of thermal fuses in a selected order of the fuses; where the current source circuit is further structured to adjust the selected order in response to at least one of: a rate of change of a temperature of each of the fuses; an importance value of each of the fuses; a criticality of each of the fuses; a power throughput of each of the fuses; and one of a fault condition or a fuse health condition of each of the fuses; and/or where the current source circuit is further structured to adjust the selected order in response to one of a planned duty cycle and an observed duty cycle of the vehicle. An example system includes where the current source circuit is further structured to sweep the injected current through a range of injection frequencies; where the current source circuit is further structured to inject the current across the thermal fuse at a plurality of injection frequencies. An example system includes where the current source circuit is further structured to inject the current across the thermal fuse at a plurality of injection voltage amplitudes. An example system includes where the current source circuit is further structured to inject the current across the thermal fuse at an injection voltage amplitude determined in response to a power throughput of the thermal fuse. An example system includes where the current source circuit is further structured to inject the current across the thermal fuse at an injection voltage amplitude determined in response to a duty cycle of the vehicle.

An example procedure includes an operation to determine null offset voltage for a fuse current measurement system, including an operation to determine that no current is demanded for a fuse load for a fuse electrically disposed between an electrical power source and an electrical load; an operation to determine a null offset voltage in response to no current demanded for the fuse load; and an operation to store the null offset voltage.

Certain further aspects of an example procedure are described following, any one or more of which may be present in certain embodiments. An example procedure further includes an operation to update a stored null offset voltage in response to the determined null offset voltage. An example procedure includes an operation to diagnose a component in response to the null offset voltage; and/or an operation to determine which one of a plurality of components is contributing to the null offset voltage. An example procedure includes an operation to determine that no current is demanded for the fuse load includes at least one operation selected from the operations consisting of an operation to determine that a key-off event has occurred for a vehicle including the fuse, the electrical power source, and the electrical load; an operation to determine that a key-on event has occurred for the vehicle; and operation to determine that the vehicle is powering down; and an operation to determine that the vehicle is in an accessory condition, where the vehicle in the accessory condition does not provide power through the fuse.

An example apparatus to determine offset voltage to adjust a fuse current determination includes a fuse load circuit structured to determine that no current is demanded for a fuse load, and to further determine that contactors associated with the fuse are open; an offset voltage determination circuit structured to determine an offset voltage corresponding to at least one component in a fuse circuit associated with the fuse, in response to the determining that no current is demanded for the fuse load; and an offset data management circuit structured to store the offset voltage, and to communicate a current calculation offset voltage for use by a controller to determine current flow through the fuse.

An example procedure includes an operation to provide digital filters for a fuse circuit in power distribution unit, including an operation to inject an alternating current across a fuse, the fuse electrically disposed between an electrical power source and an electrical load; an operation to determine the base power through a fuse by performing a low-pass filter operation on one of a measured current value and a measured voltage value for the fuse; and an operation to determine an injected current value by performing a high-pass filter operation on one of the measured current value and the measured voltage value for the fuse.

Certain further aspects of an example procedure are described following, any one or more of which may be present in certain embodiments. An example procedure further includes an operation to adjust parameters of at least one of the low-pass filter and the high-pass filter in response to a duty cycle of one of power and current through the fuse. An example procedure includes an operation to sweep the injected alternating current through a range of injection frequencies. An example procedure includes an operation to inject the alternating current across the fuse at a plurality of injection frequencies. An example procedure includes an operation where the current source circuit is further structured to inject the current across the fuse at a plurality of injection voltage amplitudes. An example procedure includes an operation where the current source circuit is further structured to inject the current across the fuse at an injection voltage amplitude determined in response to a power throughput of the fuse.

An example procedure includes an operation to calibrate a fuse resistance determination algorithm, including: an operation to store a plurality of calibration sets corresponding to a plurality of duty cycle values, the duty cycles including an electrical throughput value corresponding to a fuse electrically disposed between an electrical power source and an electrical load; where the calibration sets include current source injection settings for a current injection device operationally coupled to the fuse; an operation to determine a duty cycle of a system including the fuse, the electrical power source, and the electrical load; an operation to determine injection settings for the current injection device in response to the plurality of calibration sets and the determined duty cycle; and an operation to operate the current injection device in response to the determined injection settings.

Certain further aspects of an example procedure are described following, any one or more of which may be present in certain embodiments. An example procedure further includes an operation where the calibration sets further comprise filter settings for at least one digital filter, where the method further includes determining the fuse resistance utilizing the at least one digital filter.

An example procedure includes an operation to 1. A method to provide unique current waveforms to improve fuse resistance measurement for a power distribution unit, including: confirming that contactors electrically positioned in a fuse circuit are open, where the fuse circuit includes a fuse electrically disposed between an electrical power source and an electrical load; determining a null voltage offset value for the fuse circuit; conducting a plurality of current injection sequences across the fuse, each of the current injection sequences including a selected current amplitude, current frequency, and current waveform value; determining a fuse resistance value in response to the current injection sequences and the null voltage offset value.

Certain further aspects of an example procedure are described following, any one or more of which may be present in certain embodiments. An example procedure further includes an operation to adjust filtering characteristics for a digital filter in response to each of the plurality of current injection sequences, and measuring one of the fuse circuit voltage and the fuse circuit current with the digital filter during the corresponding one of the plurality of current injection sequences using the adjusted filtering characteristics.

An example system includes a vehicle having a motive electrical power path; a power distribution unit including a current protection circuit disposed in the motive electrical power path, the current protection circuit including a thermal fuse and a contactor in a series arrangement with the thermal fuse; a current source circuit electrically coupled to the thermal fuse and structured to inject a current across the thermal fuse; a voltage determination circuit electrically coupled to the thermal fuse and structured to determine an injected voltage amount and a thermal fuse impedance value, where the voltage determination circuit is structured to perform a frequency analysis operation to determine the injected voltage amount.

Certain further aspects of an example system are described following, any one or more of which may be present in certain embodiments. An example system includes where the voltage determination circuit is further structured to determine the injected voltage amount by determining an amplitude of a voltage across the fuse at a frequency of interest; and/or where the frequency of interest is determined in response to a frequency of the injected voltage. An example system includes where the current source circuit is further structured to sweep the injected current through a range of injection frequencies. An example system includes where the current source circuit is further structured to inject the current across the thermal fuse at a plurality of injection frequencies. An example system includes where the current source circuit is further structured to inject the current across the thermal fuse at a plurality of injection voltage amplitudes. An example system includes where the current source circuit is further structured to inject the current across the thermal fuse at an injection voltage amplitude determined in response to a power throughput of the thermal fuse. An example system includes where the current source circuit is further structured to inject the current across the thermal fuse at an injection voltage amplitude determined in response to a duty cycle of the vehicle.

An example system includes a vehicle having a motive electrical power path; a power distribution unit including a current protection circuit disposed in the motive electrical power path, the current protection circuit including a thermal fuse and a contactor in a series arrangement with the thermal fuse; a current source circuit electrically coupled to the thermal fuse and structured to determine that a load power throughput of the motive electrical power path is low, and to inject a current across the thermal fuse in response to the load power throughput of the motive electrical power path being low; a voltage determination circuit electrically coupled to the thermal fuse and structured to determine at least one of an injected voltage amount and a thermal fuse impedance value, where the voltage determination circuit includes a high pass filter having a cutoff frequency selected in response to a frequency of the injected current.

Certain further aspects of an example system are described following, any one or more of which may be present in certain embodiments. An example system includes where the current source circuit is further structured to determine the load power throughput of the motive electrical power path is low in response to the vehicle being in a shutdown state. An example system includes where the current source circuit is further structured to determine the load power throughput of the motive electrical power path is low in response to the vehicle being in a keyoff state. An example system includes where the current source circuit is further structured to determine the load power throughput of the motive electrical power path is low in response to a motive torque request for the vehicle being zero. An example system includes where the power distribution unit further includes a plurality of fuses, and where the current source circuit is further structured to inject the current across each of the plurality of fuses in a selected sequence; and/or where the current source circuit is further structured to inject the current across a first one of the plurality of fuses at a first shutdown event of the vehicle, and to inject the current across a second one of the plurality of fuses at a second shutdown event of the vehicle.

An example system includes a vehicle having a motive electrical power path; a power distribution unit including a current protection circuit disposed in the motive electrical power path, the current protection circuit including a thermal fuse and a contactor in a series arrangement with the thermal fuse; a current source circuit electrically coupled to the thermal fuse and structured to inject a current across the thermal fuse; a voltage determination circuit electrically coupled to the thermal fuse and structured to determine at least one of an injected voltage amount and a thermal fuse impedance value, where the voltage determination circuit includes a high pass filter having a cutoff frequency selected in response to a frequency of the injected current; and a fuse status circuit structured to determine a fuse condition value in response to the at least one of the injected voltage amount and the thermal fuse impedance value.

Certain further aspects of an example system are described following, any one or more of which may be present in certain embodiments. An example system includes where the fuse status circuit is further structured to provide the fuse condition value by providing at least one of a fault code or a notification of the fuse condition value; where the fuse status circuit is further structured to adjust a maximum power rating for the motive electrical power path in response to the fuse condition value; where the fuse status circuit is further structured to adjust a maximum power slew rate for the motive electrical power path in response to the fuse condition value; where the fuse status circuit is further structured to adjust a configuration of the current protection circuit in response to the fuse condition value; where the power distribution unit further includes an active cooling interface, and where the fuse status circuit is further structured to adjust the active cooling interface in response to the fuse condition value; where the fuse status circuit is further structured to clear the at least one of the fault code or the notification of the fuse condition value in response to the fuse condition value indicating that the fuse condition has improved; where the fuse status circuit is further structured to clear the at least one of the fault code or the notification of the fuse condition value in response to a service event for the fuse; where the fuse status circuit is further structured to determine a fuse life remaining value in response to the fuse condition value; where the fuse status circuit is further structured to determine the fuse life remaining value further in response to a duty cycle of the vehicle; and/or where the fuse status circuit is further structured to determine the fuse life remaining value further in response to one of an adjusted maximum power rating for the motive electrical power path or an adjusted maximum power slew rate for the motive electrical power path.

An example system includes a vehicle having a motive electrical power path; a power distribution unit including a current protection circuit disposed in the motive electrical power path, the current protection circuit including a thermal fuse and a contactor in a series arrangement with the thermal fuse; a fuse thermal model circuit structured to determine a fuse temperature value of the thermal fuse, and to determine a fuse condition value in response to the fuse temperature value.

Certain further aspects of an example system are described following, any one or more of which may be present in certain embodiments. An example system includes a current source circuit electrically coupled to the thermal fuse and structured to inject a current across the thermal fuse; a voltage determination circuit electrically coupled to the thermal fuse and structured to determine at least one of an injected voltage amount and a thermal fuse impedance value, where the voltage determination circuit includes a high pass filter having a cutoff frequency selected in response to a frequency of the injected current; and where the fuse thermal model circuit is structured to determine the fuse temperature value of the thermal fuse further in response to the at least one of the injected voltage amount and the thermal fuse impedance value. An example system includes where the fuse thermal model circuit is further structured to determine the fuse condition value by counting a number of thermal fuse temperature excursion events; and/or where the thermal fuse temperature excursion events each comprise a temperature rise threshold value within a time threshold value. An example system includes where the fuse thermal model circuit is further structured to determine the fuse condition value by integrating the fuse temperature value; and/or where the fuse thermal model circuit is further structured to determine the fuse condition value by integrating the fuse temperature value above a temperature threshold.

BRIEF DESCRIPTION OF THE DRAWINGS

The present disclosure will become more fully understood from the detailed description and the accompanying drawings, wherein:

FIG. 118A depicts a front view of an integrated inverter assembly.

FIG. 118B depicts a side view of an integrated inverter assembly.

FIG. 119 depicts a view of an integrated inverter assembly with a perspective view depicting the gate driver PCB and the DC link capacitor.

FIG. 120 depicts a view of an integrated inverter assembly with AC bus bars and motor temperature/position sensor.

FIG. 121 depicts a view of an integrated inverter assembly with cure-in-place gasket.

FIG. 122 depicts a view of an integrated inverter assembly with close-up of one corner of the main cover.

FIG. 123 depicts a view of an integrated inverter assembly with example installation for the IGBTs.

FIGS. 124-127 depict views of an example embodiment of a main cover portion of an integrated inverter assembly.

FIG. 128 depicts an example embodiment of an upper and lower cooling channel.

FIG. 129 depicts an example embodiment of a coupling mechanism.

FIG. 130 depicts an example embodiment of a coupling mechanism.

FIG. 131 depicts a view of an integrated inverter assembly showing a coolant channel cover.

Figure 132:
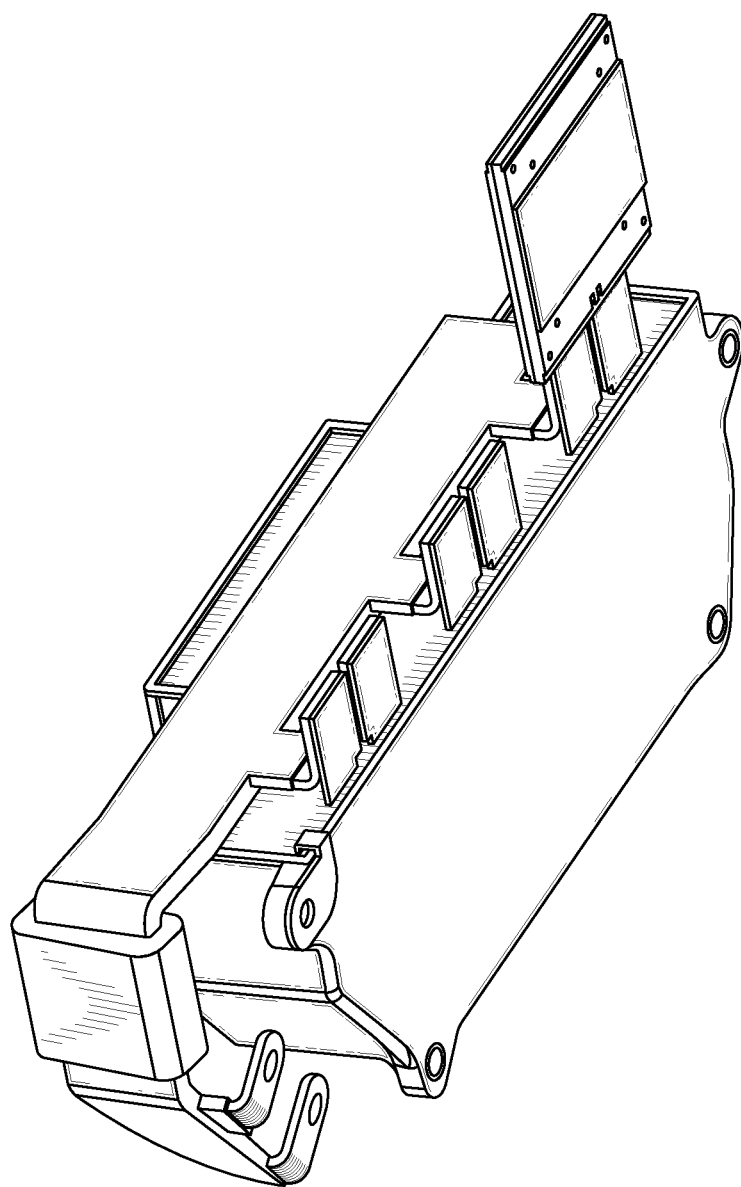

FIG. 132 depicts a DC Link Capacitor in the prior art.

Figure 133:
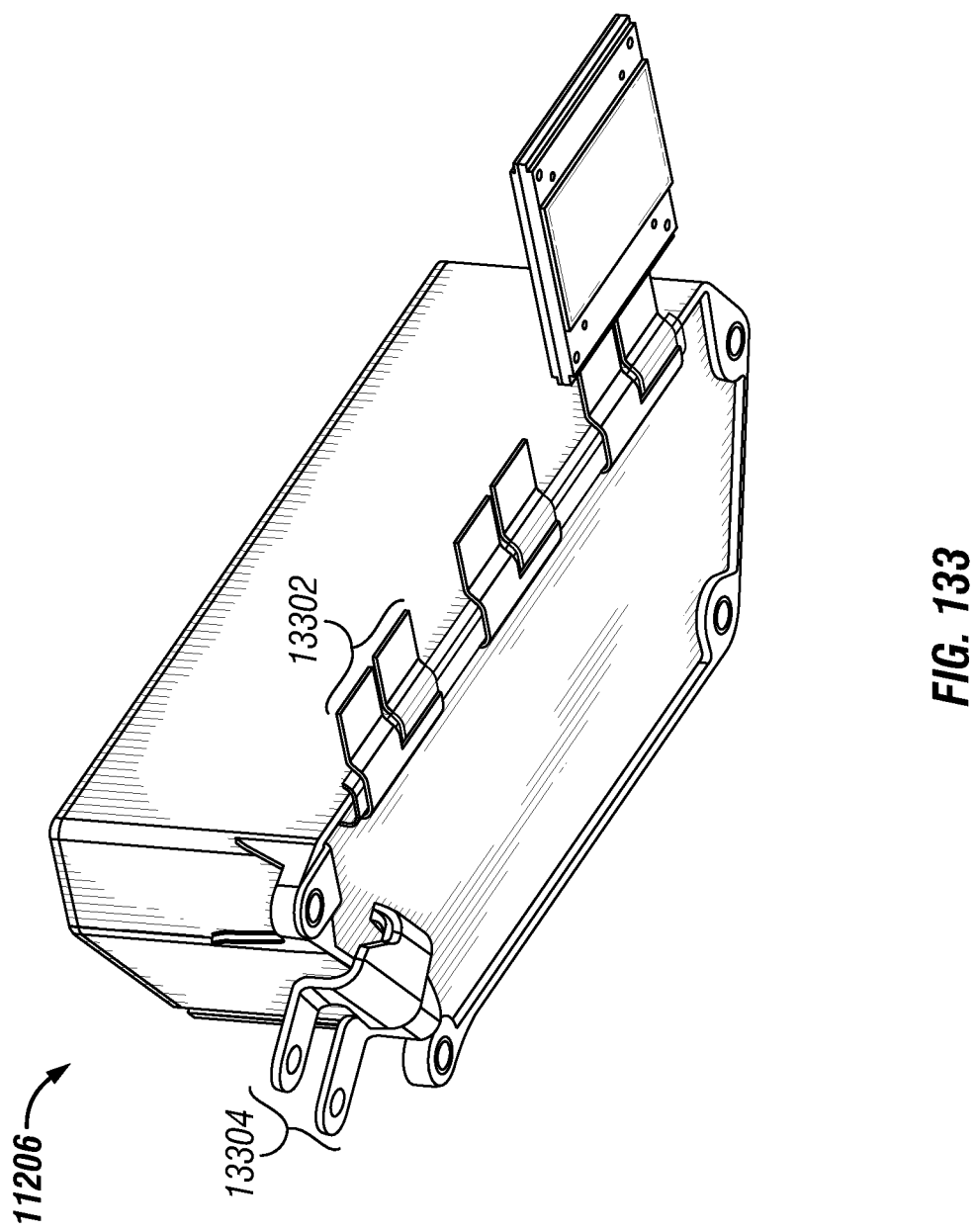

FIG. 133 depicts an embodiment DC Link Capacitor.

Figure 134:
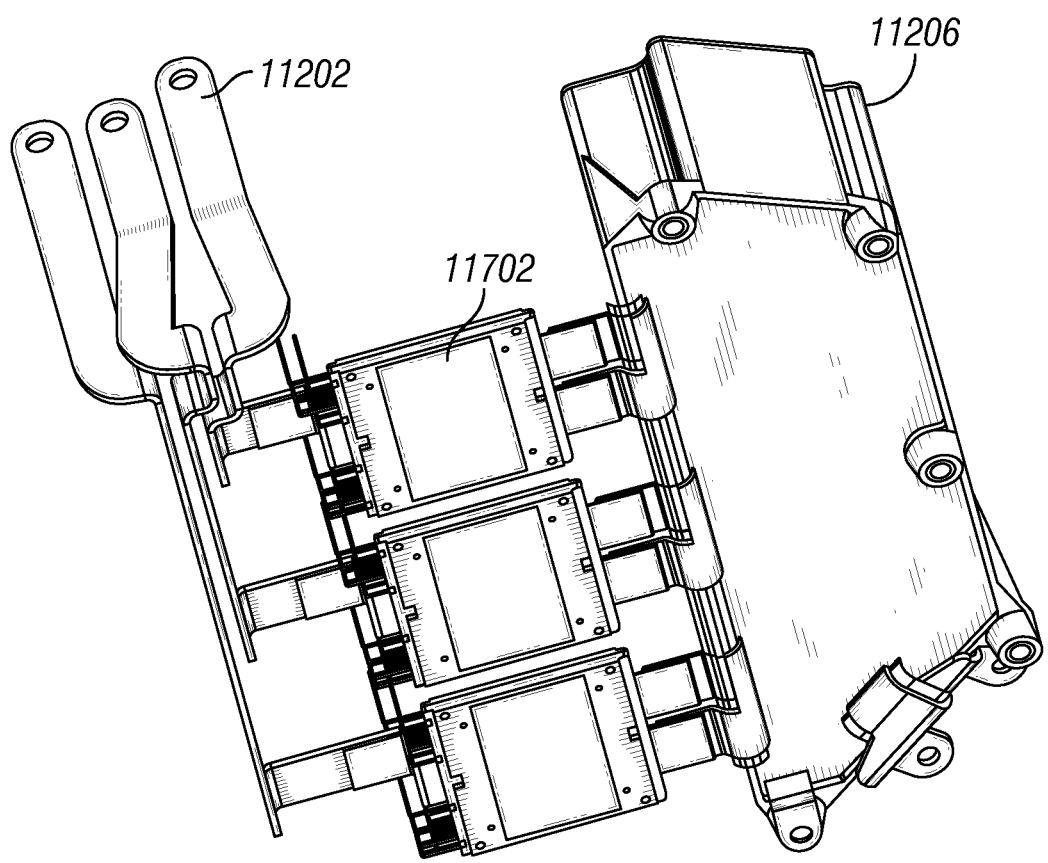

FIG. 134 depicts an embodiment potted DC Link Capacitor.

Figure 135:
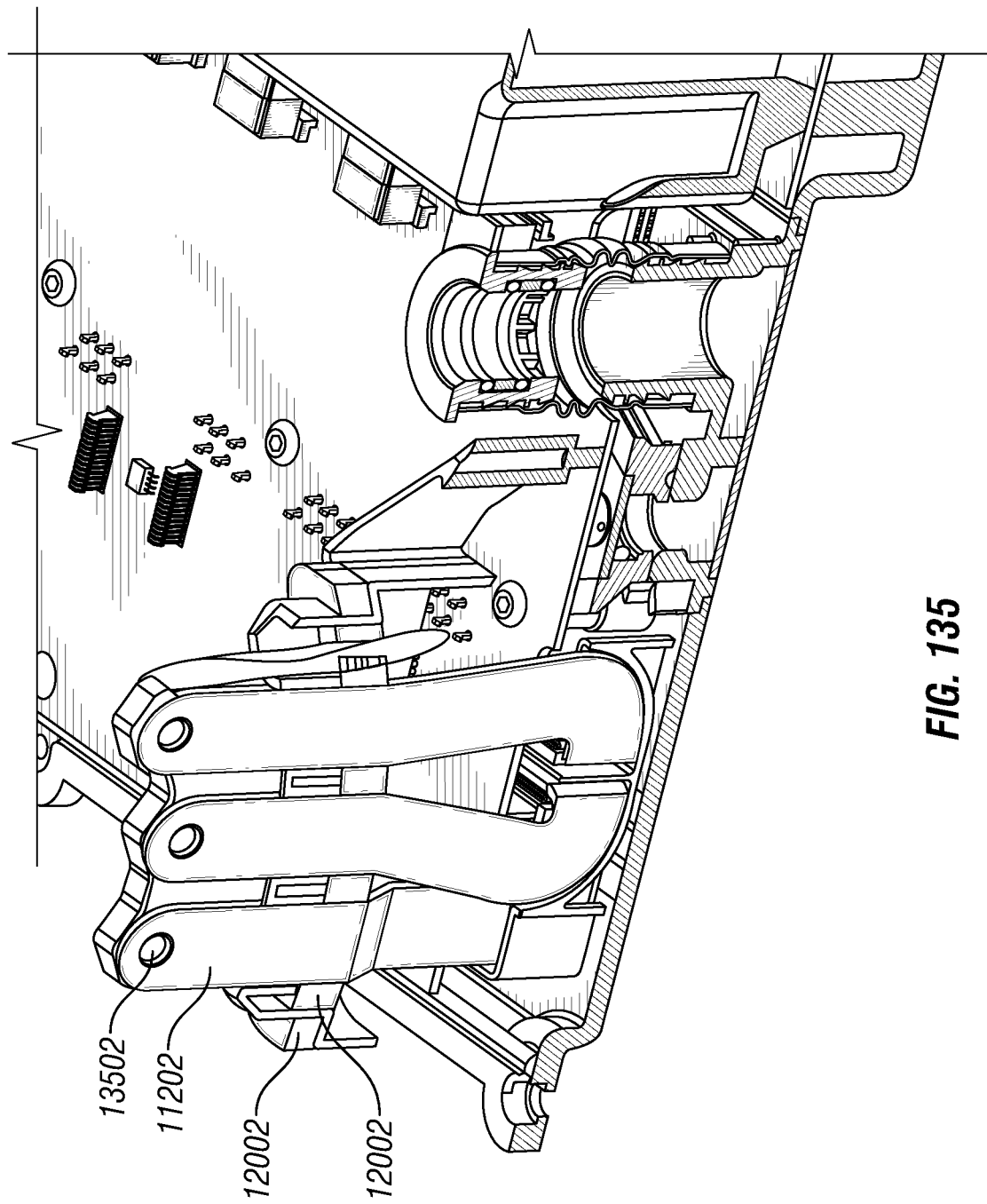

FIG. 135 depicts a view of an integrated inverter assembly with AC bus bars and motor temperature/position sensor.

Figure 136:
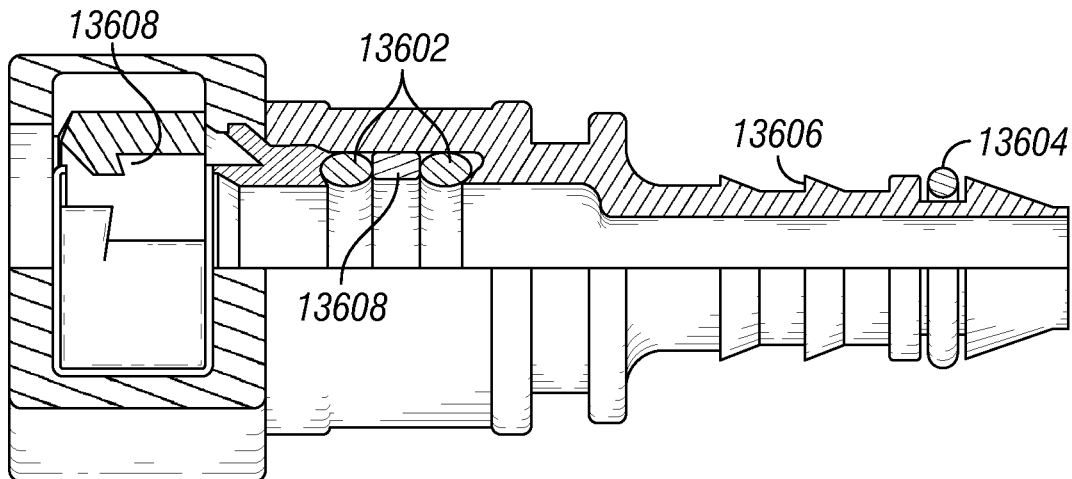

FIG. 136 depicts a quick connector in the prior art.

Figure 137:
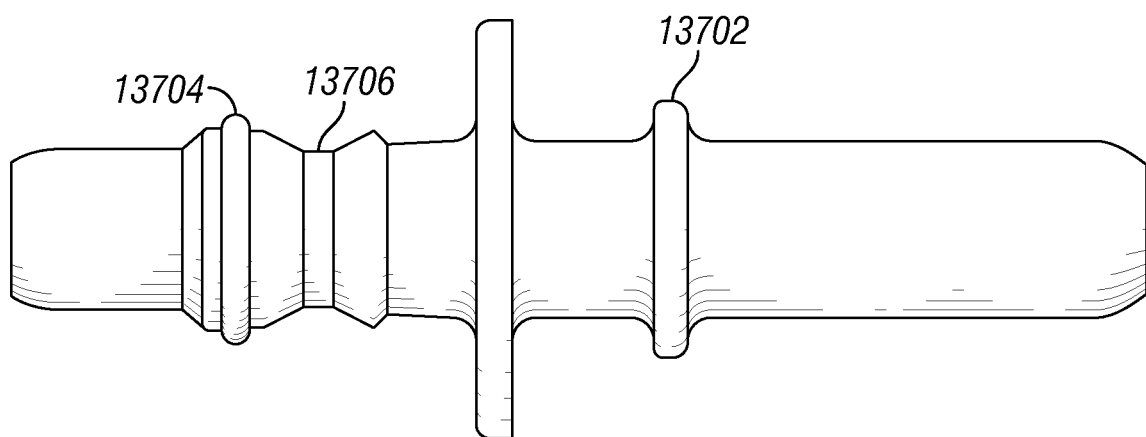

FIG. 137 depicts a quick connector in the prior art.

Figure 138:
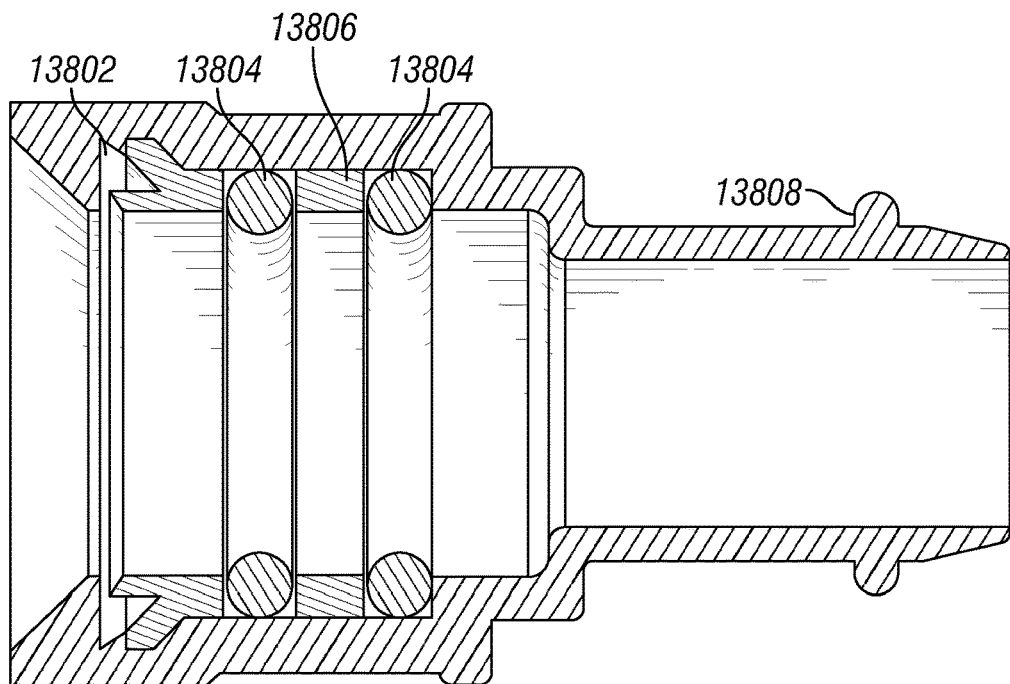

FIG. 138 depicts an embodiment fluid connector.

Figure 139:
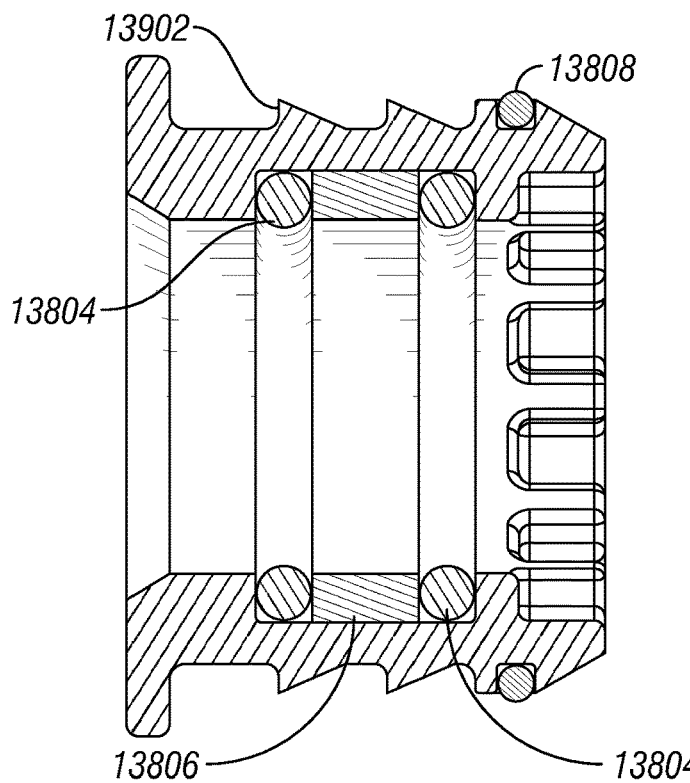

FIG. 139 depicts an embodiment fluid connector.

Figure 140:
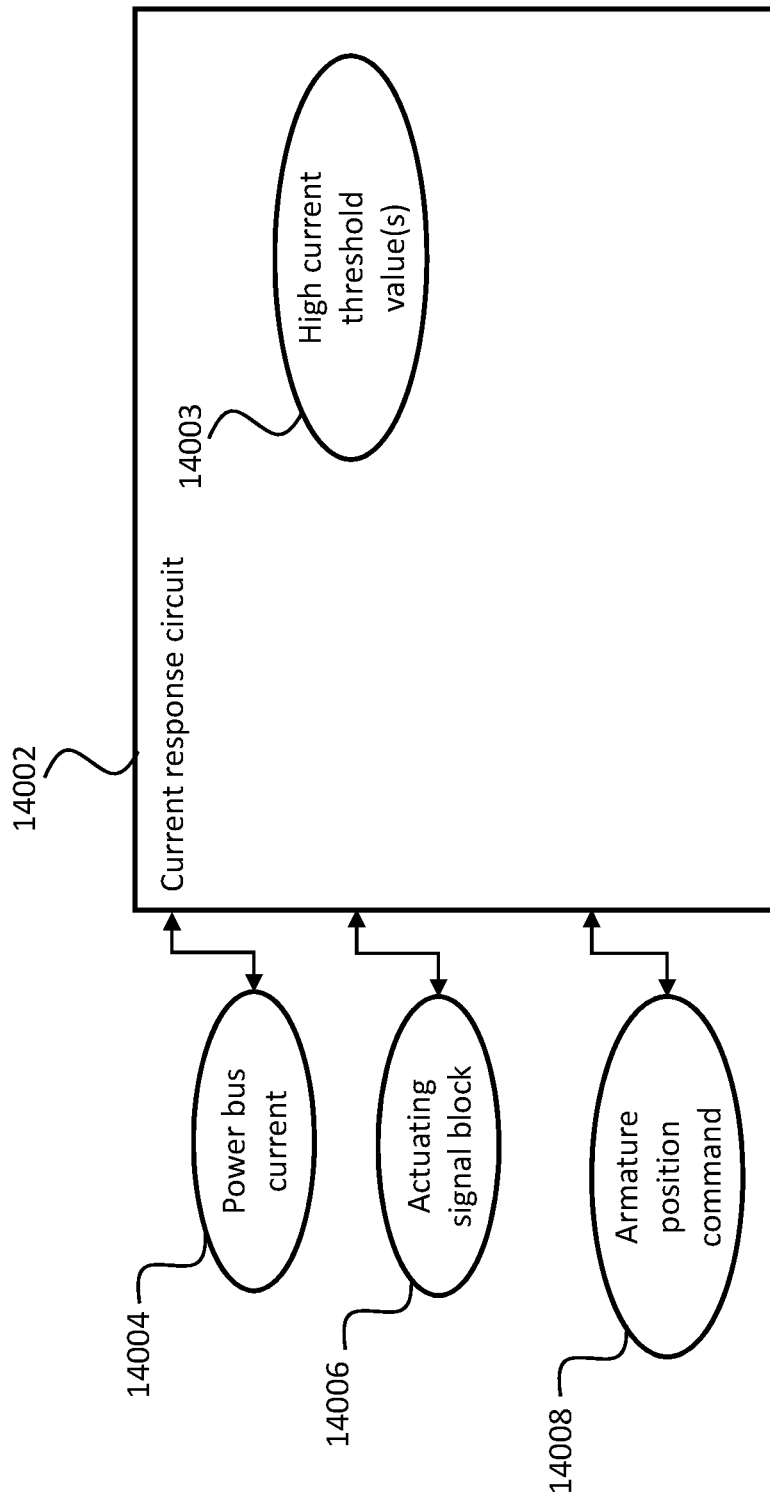

FIG. 140 depicts a schematic diagram of a controller.

Figure 141:
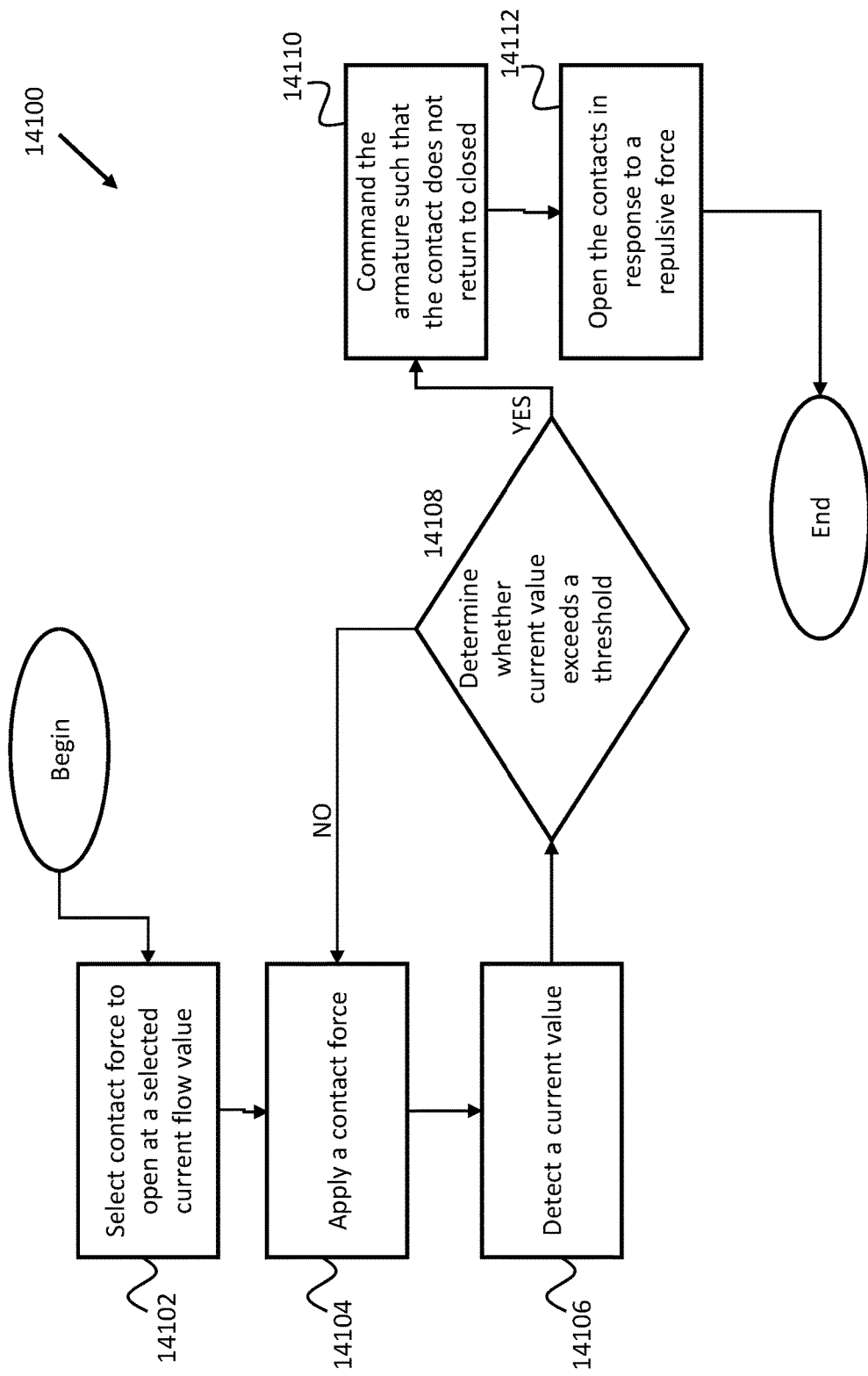

FIG. 141 depicts a schematic flow diagram of a procedure to open a motive power circuit.

Figure 142:
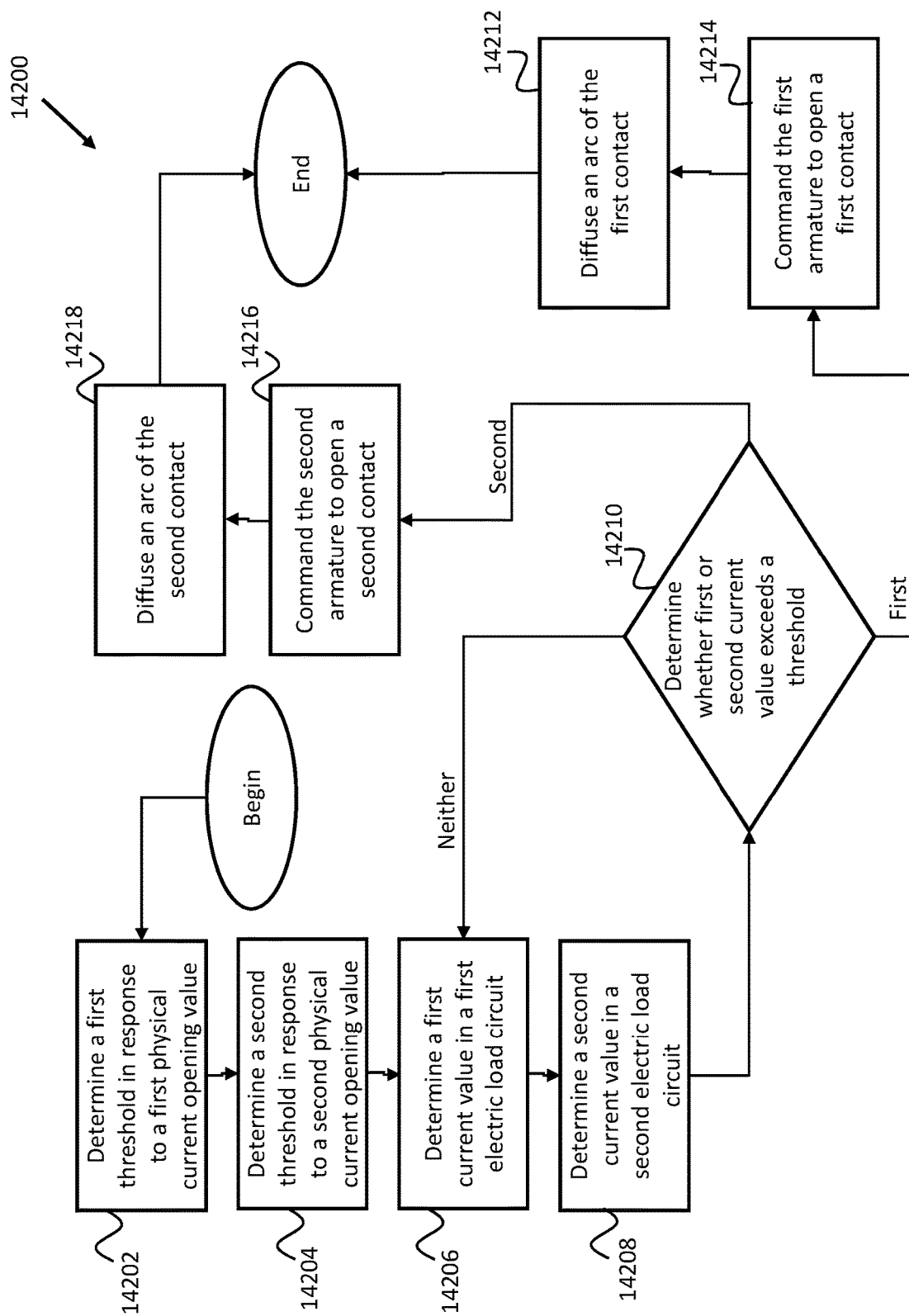

FIG. 142 depicts a schematic flow diagram of a procedure to open a motive power circuit.

Figure 143:
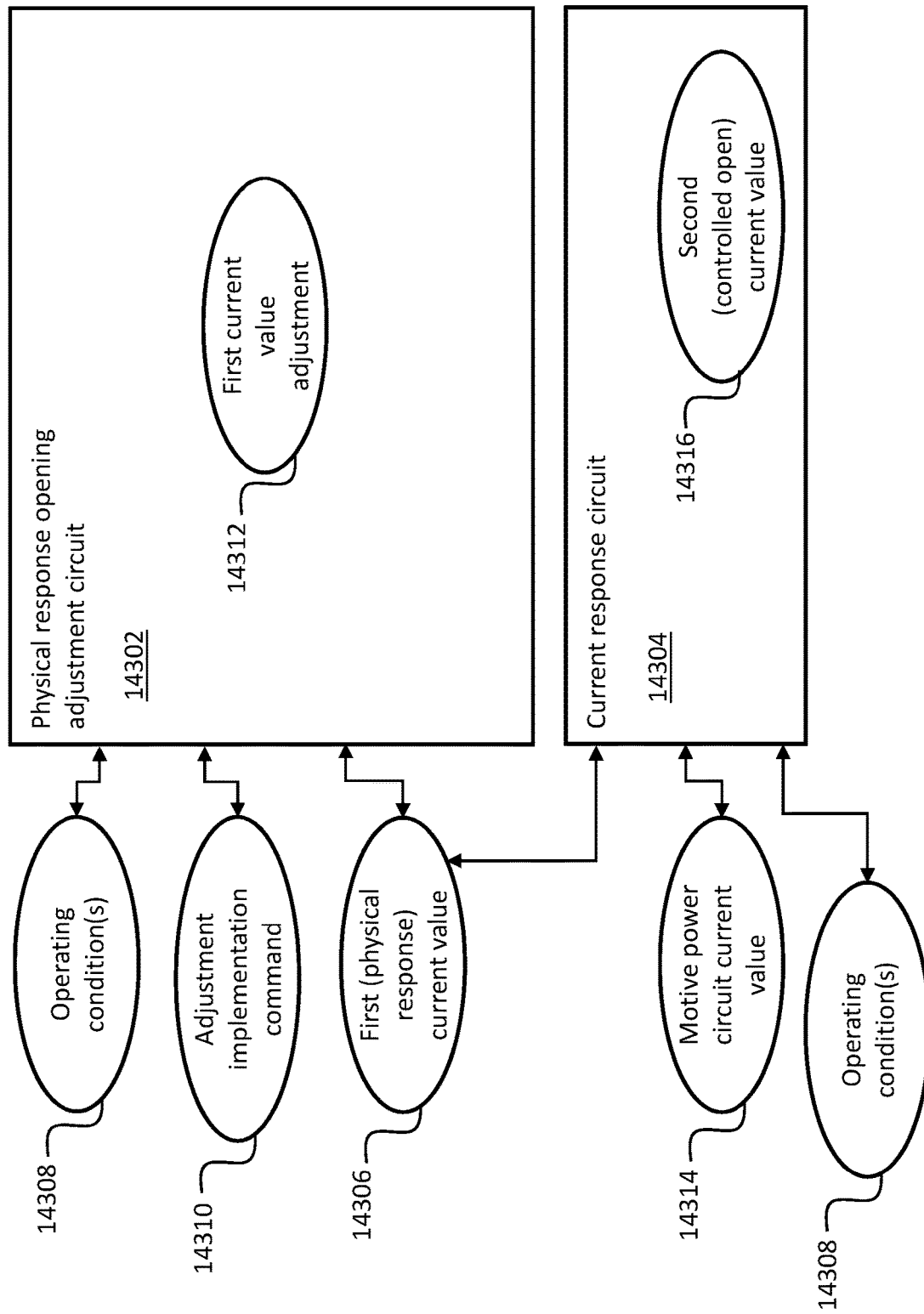

FIG. 143 depicts a schematic diagram of a controller.

Figure 144:
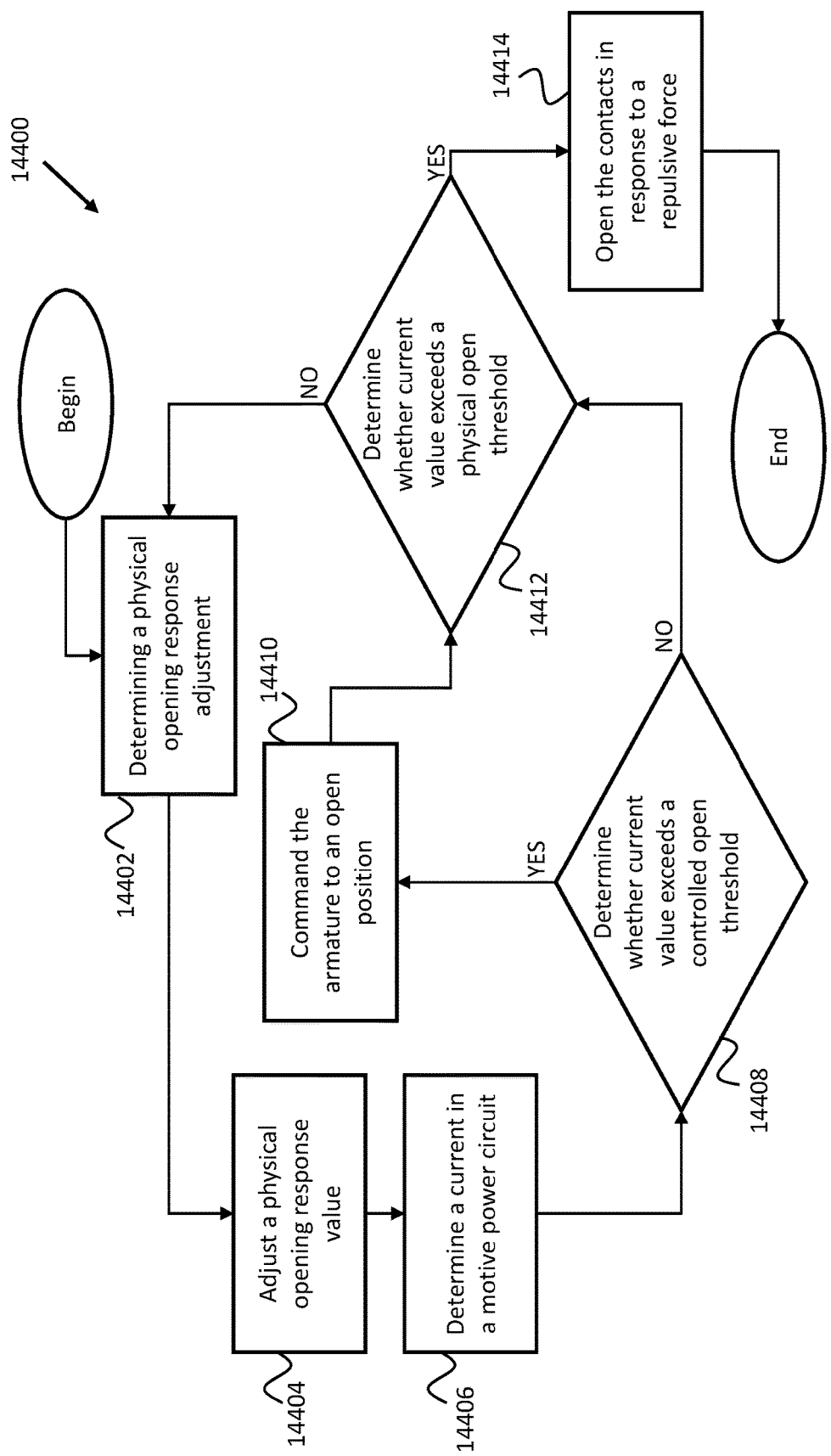

FIG. 144 depicts a schematic flow diagram of a procedure to open a motive power circuit.

Figure 145:
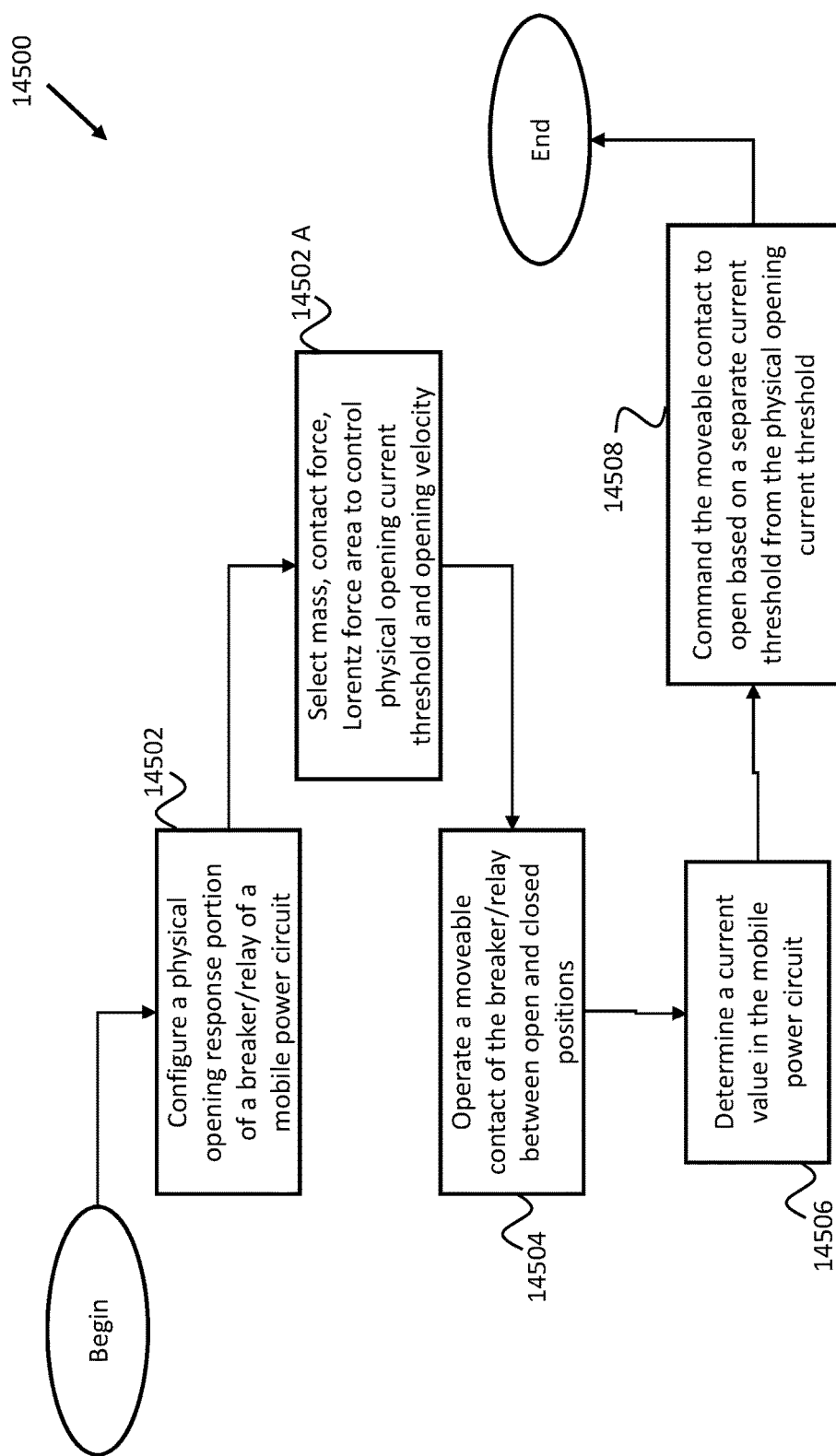

FIG. 145 depicts a schematic flow diagram of a procedure to open a motive power circuit.

Figure 146:
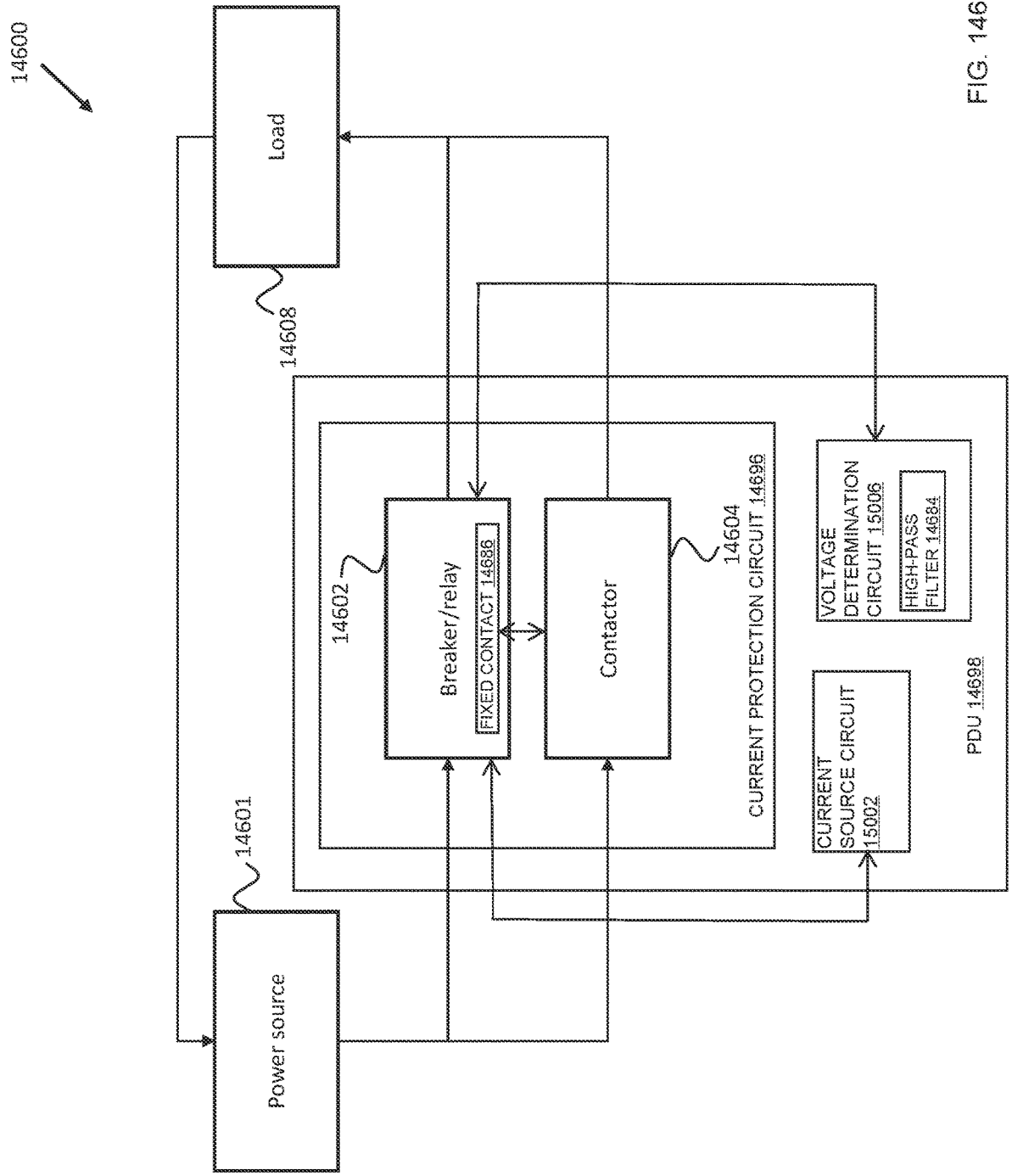

FIG. 146 depicts an embodiment of a system having a breaker/relay.

Figure 147:
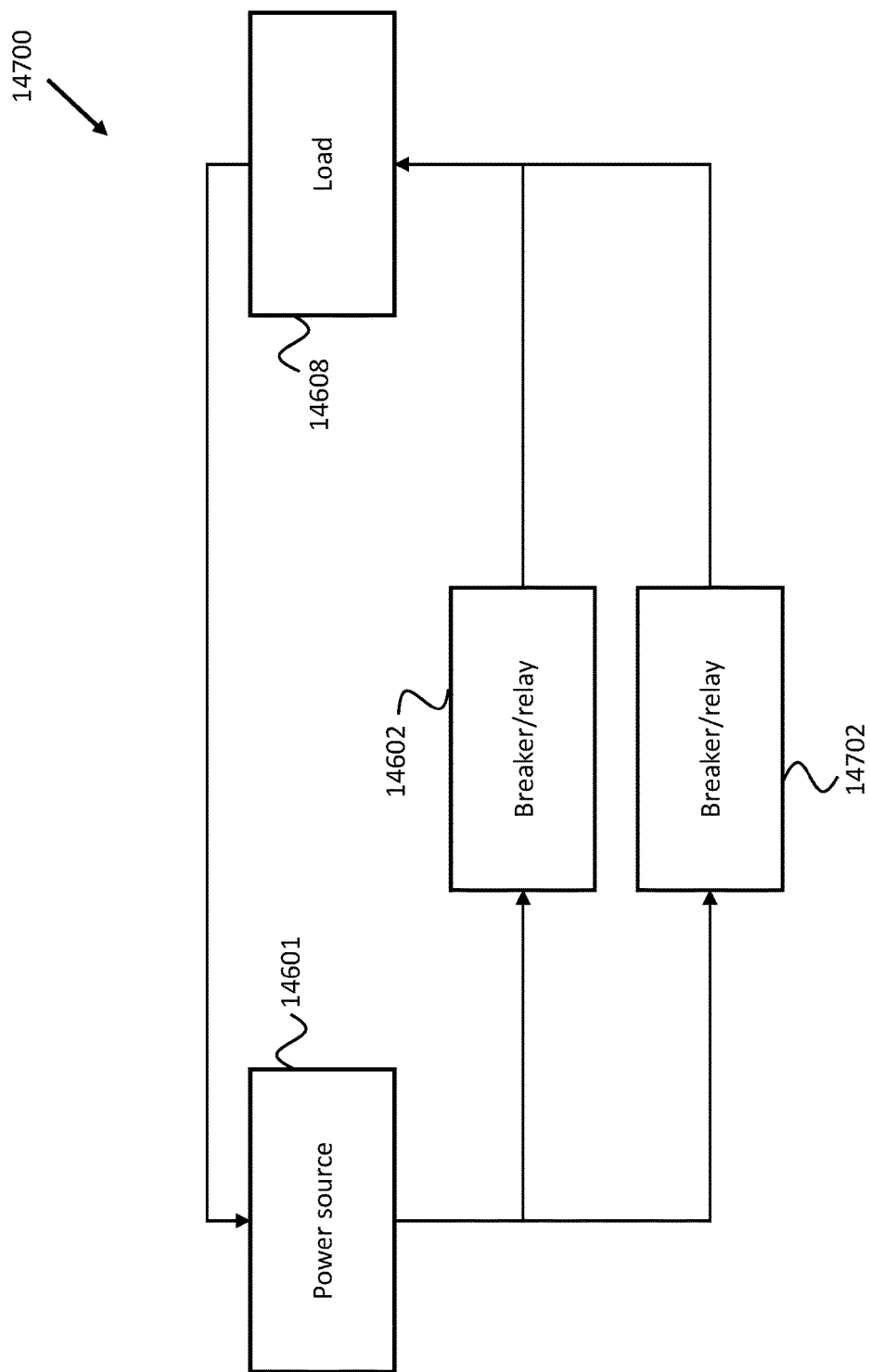

FIG. 147 depicts an embodiment of a system having a breaker/relay.

Figure 148:
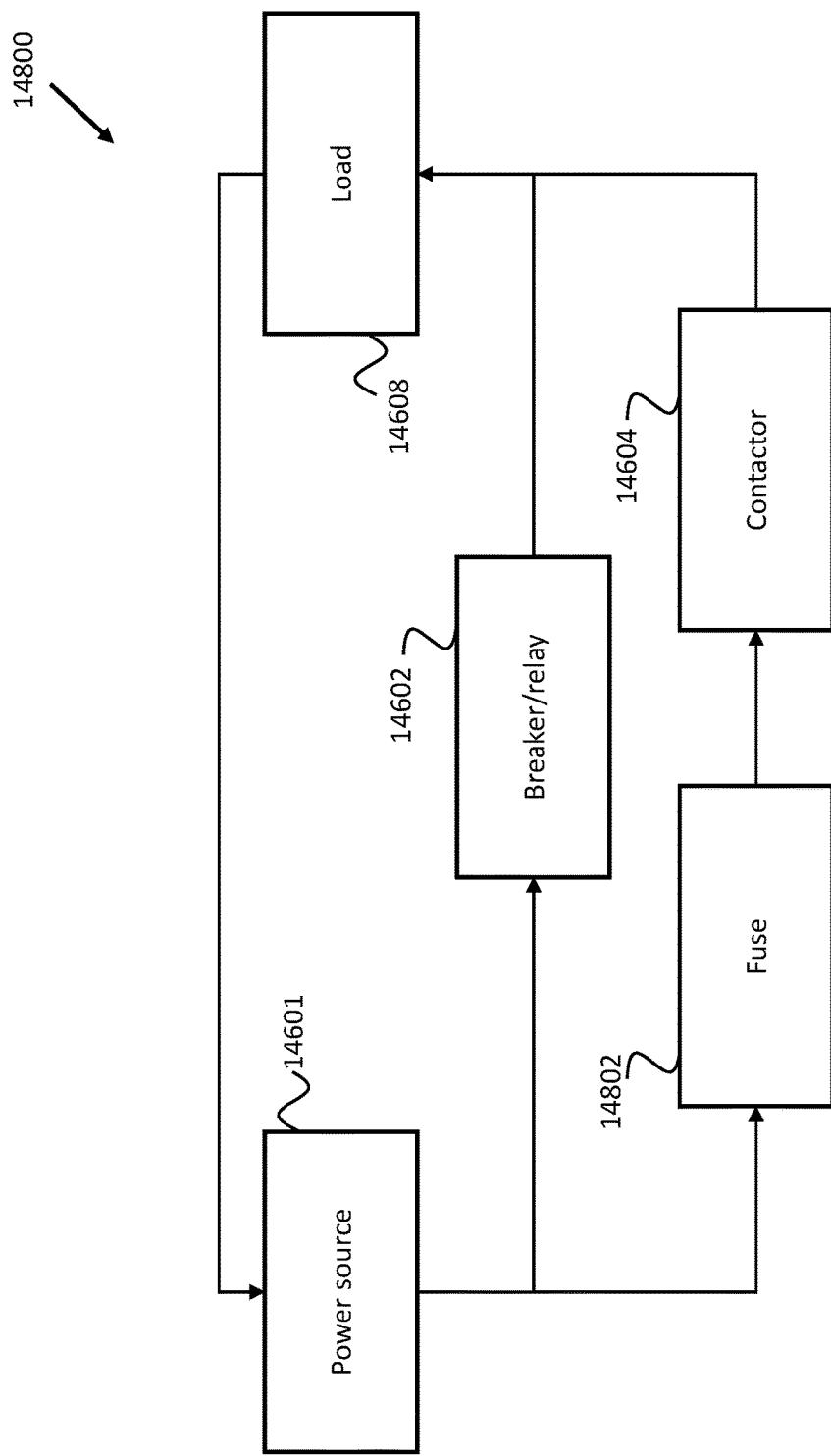

FIG. 148 depicts an embodiment of a system having a breaker/relay.

Figure 149:
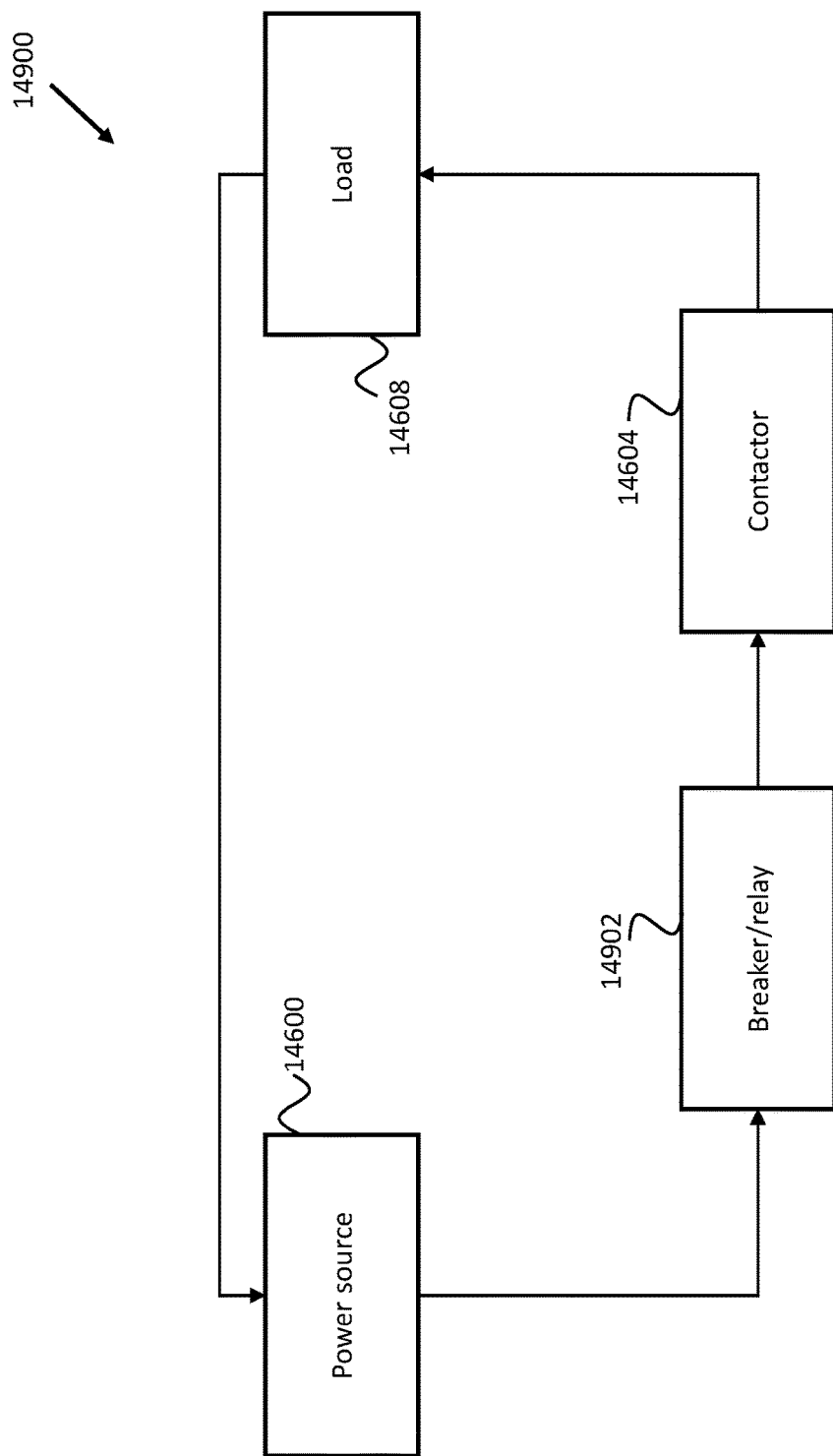

FIG. 149 depicts an embodiment of a system having a breaker/relay.

Figure 150:
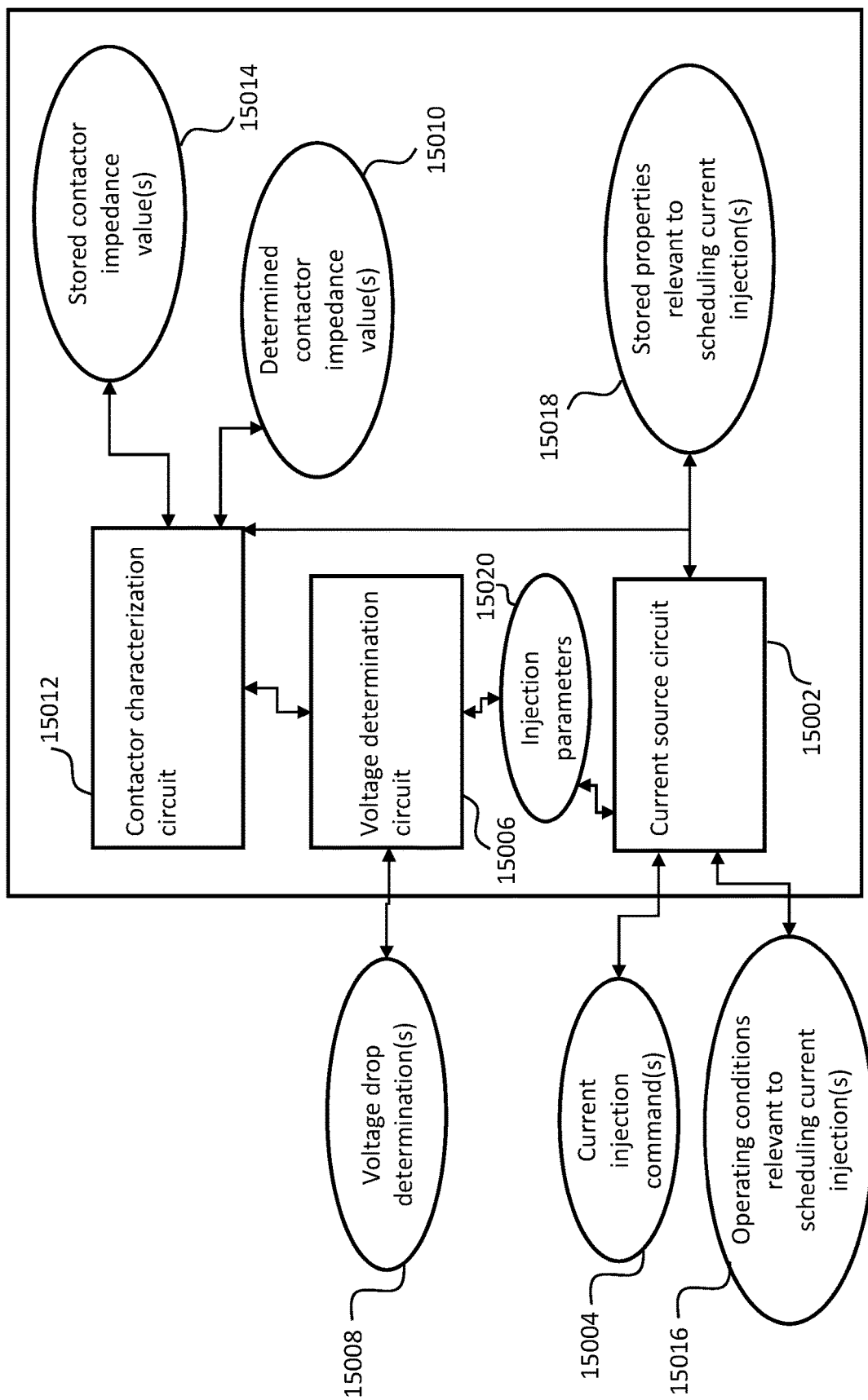

FIG. 150 depicts a schematic diagram of a controller.

Figure 151:
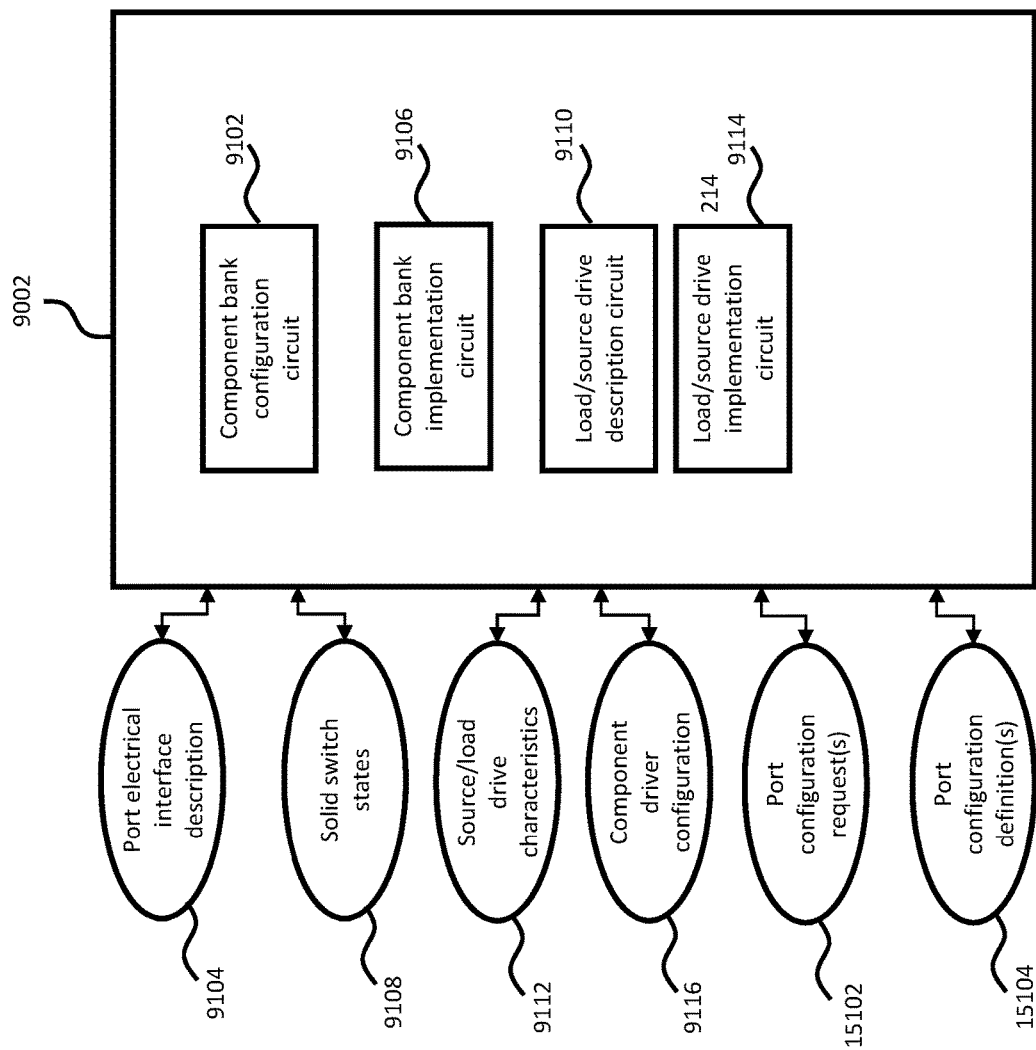

FIG. 151 depicts a schematic diagram of a controller.

Figure 152:
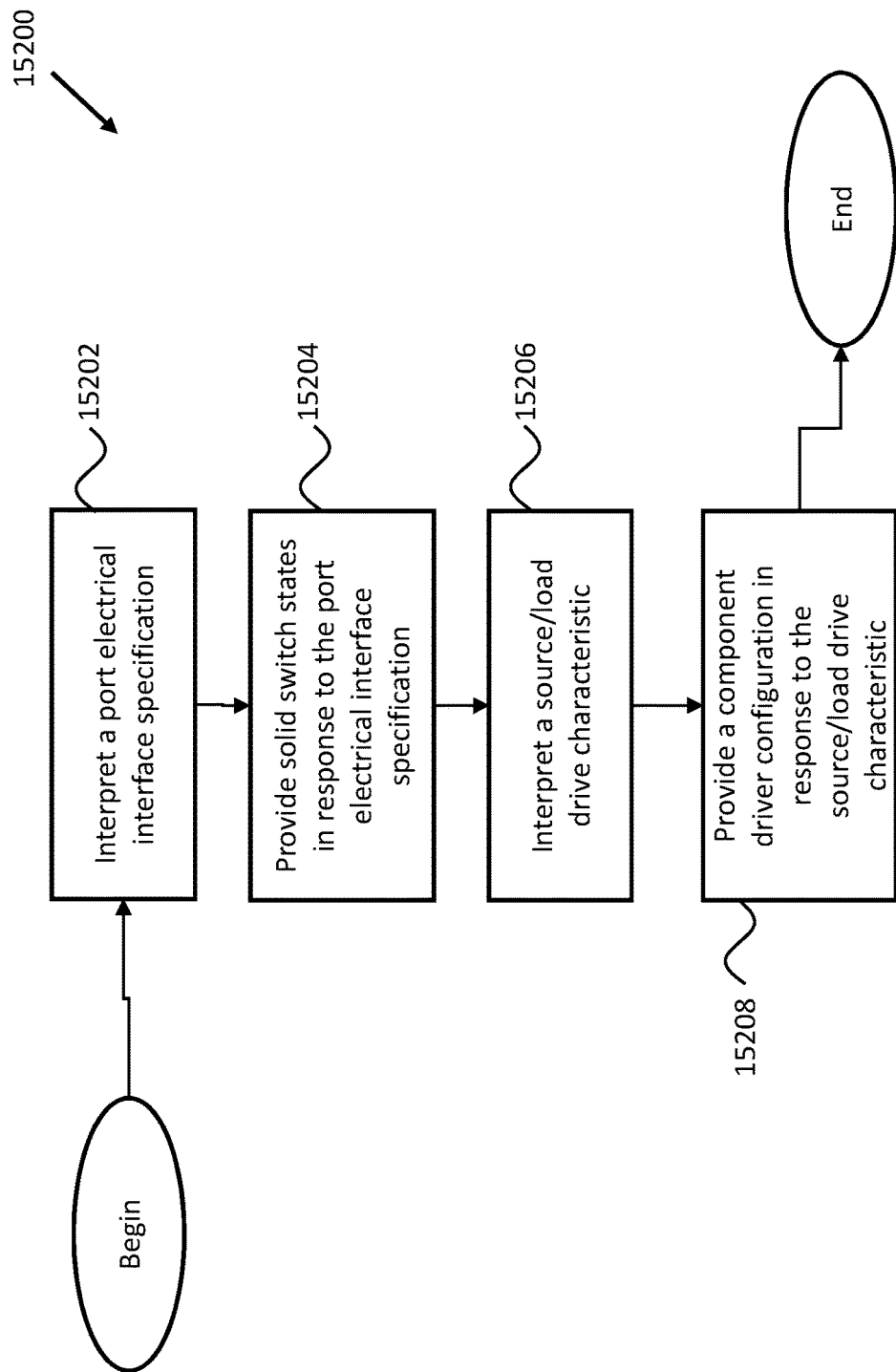

FIG. 152 depicts a schematic flow diagram of a procedure to configure a power converter.

Figure 153:
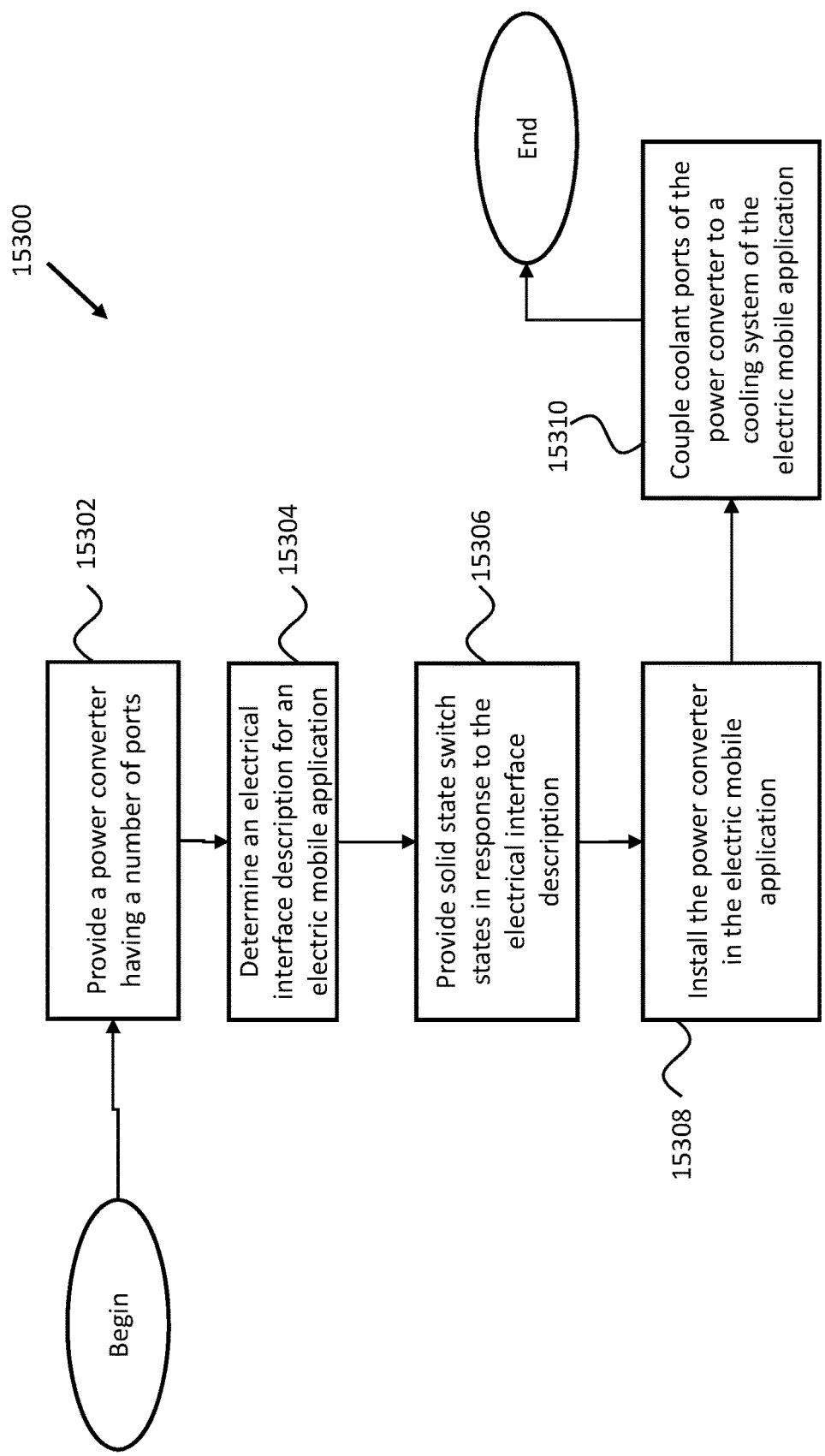

FIG. 153 depicts a schematic flow diagram of a procedure to integrate a power converter.

FIG. 154 depicts a schematic flow diagram of a procedure to adjust operations of a motor.

FIG. 155 depicts a schematic flow diagram of a procedure to adjust operations of a motor.

Figure 156:
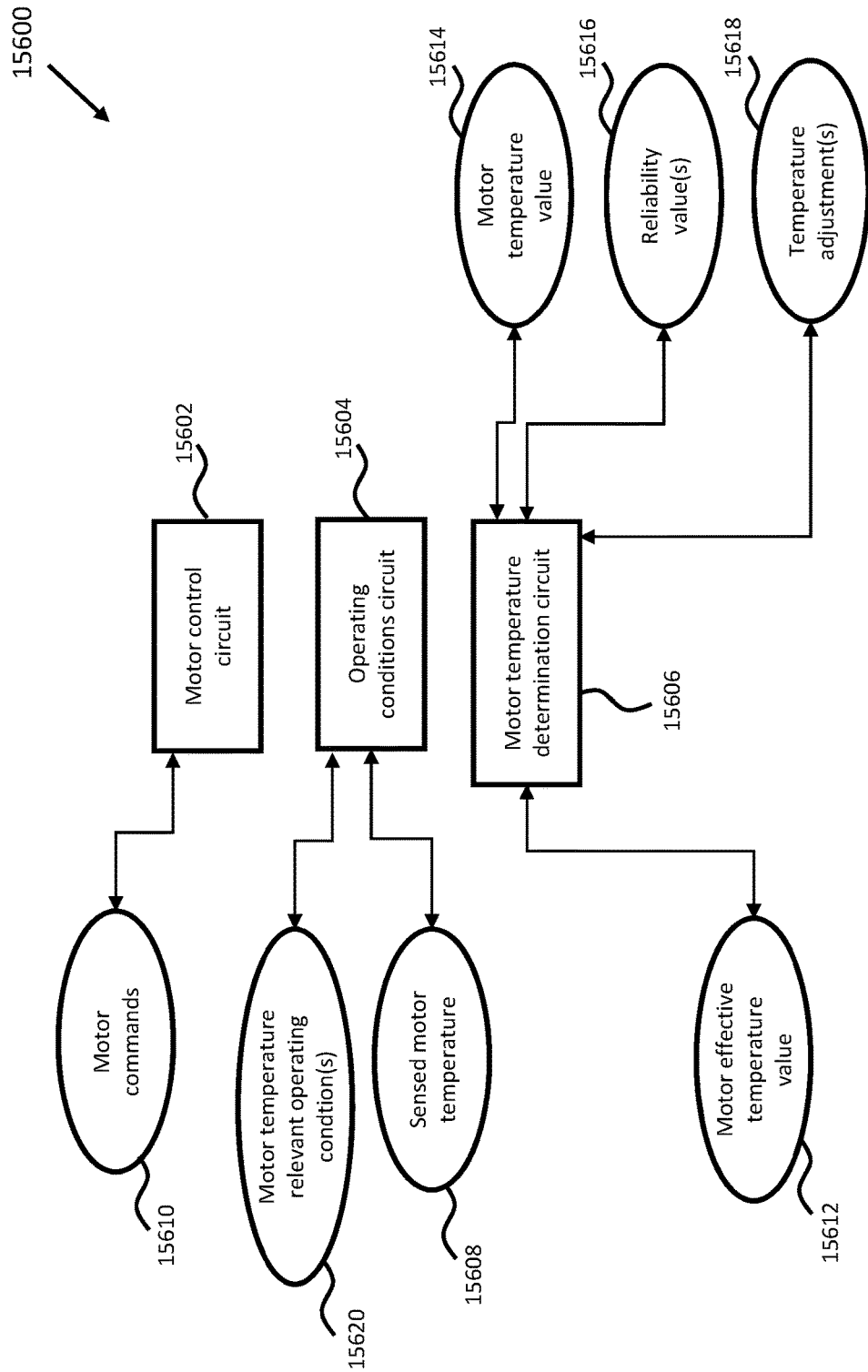

FIG. 156 depicts a schematic diagram of a controller.

Figure 157:
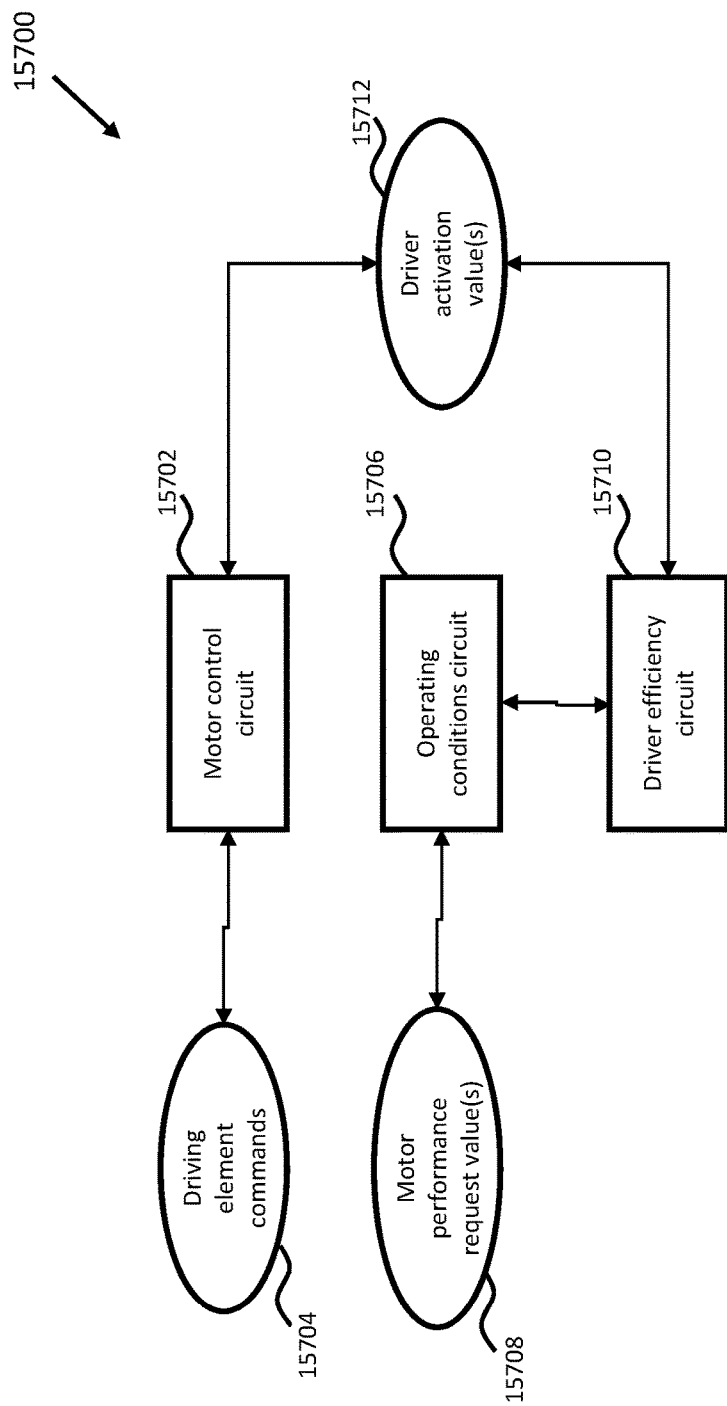

FIG. 157 depicts a schematic diagram of a controller.

Figure 158:
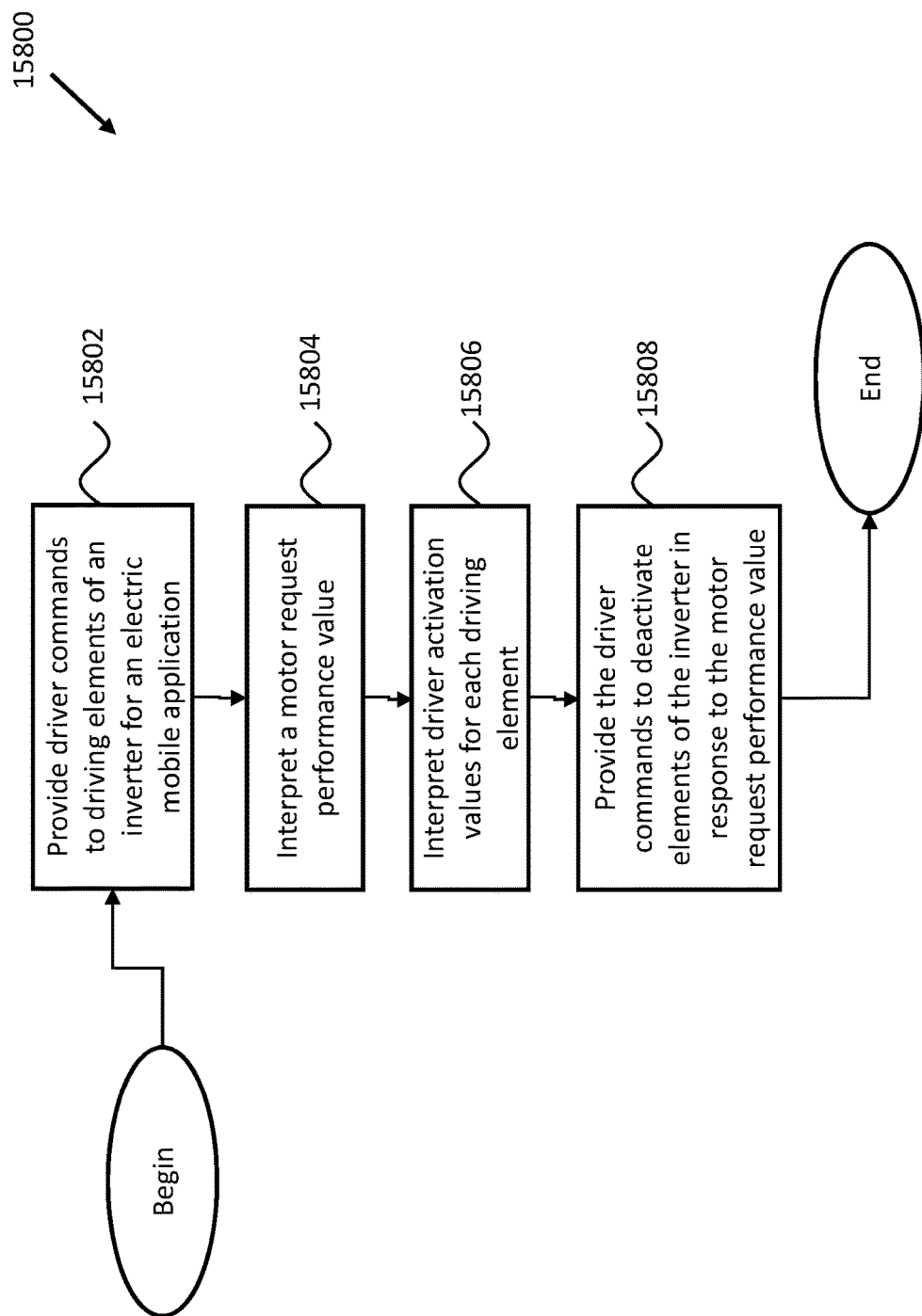

FIG. 158 depicts a schematic flow diagram of a procedure to adjust operations of an inverter.

Figure 159:
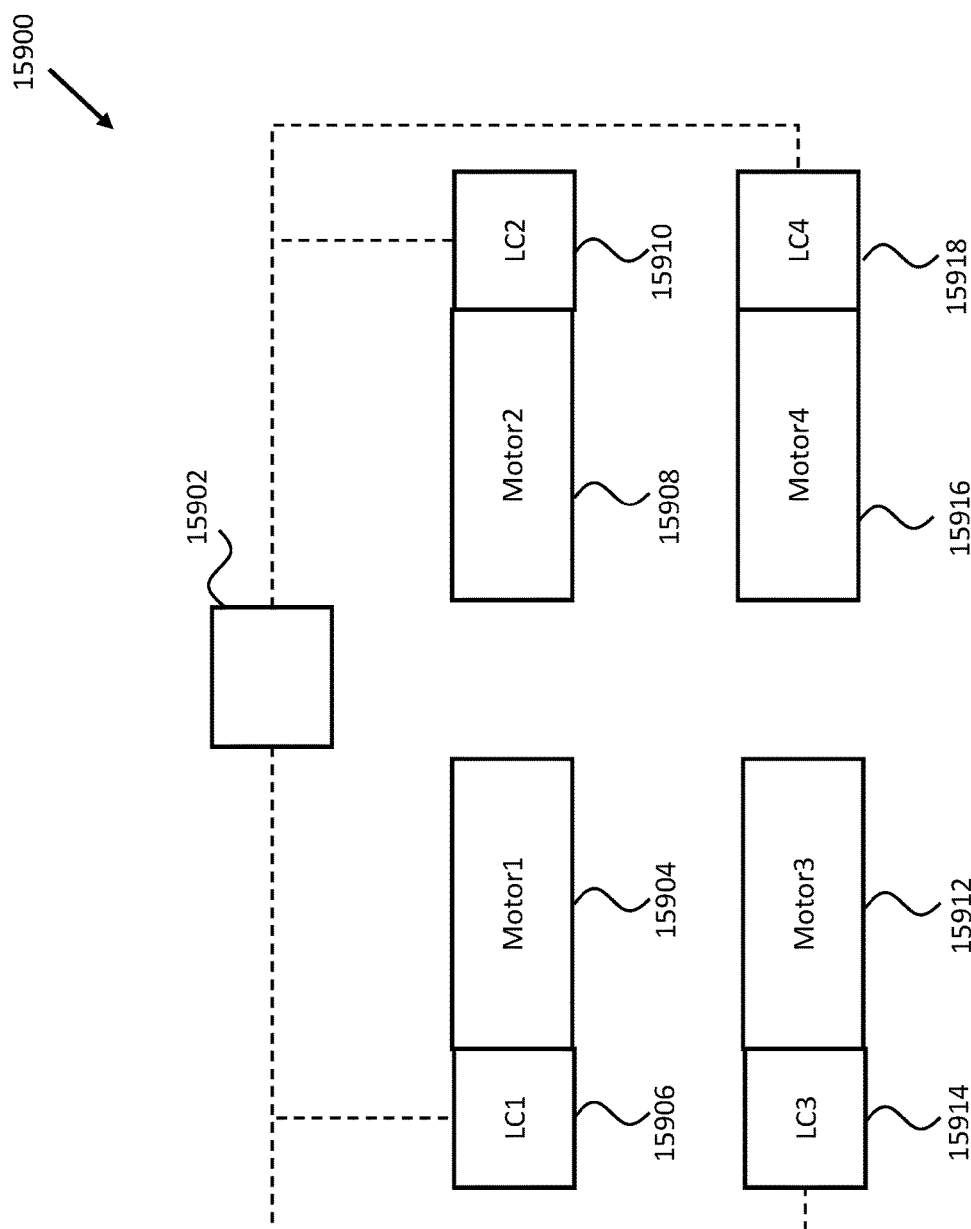

FIG. 159 depicts an embodiment of a system having multiple motors.

Figure 160:
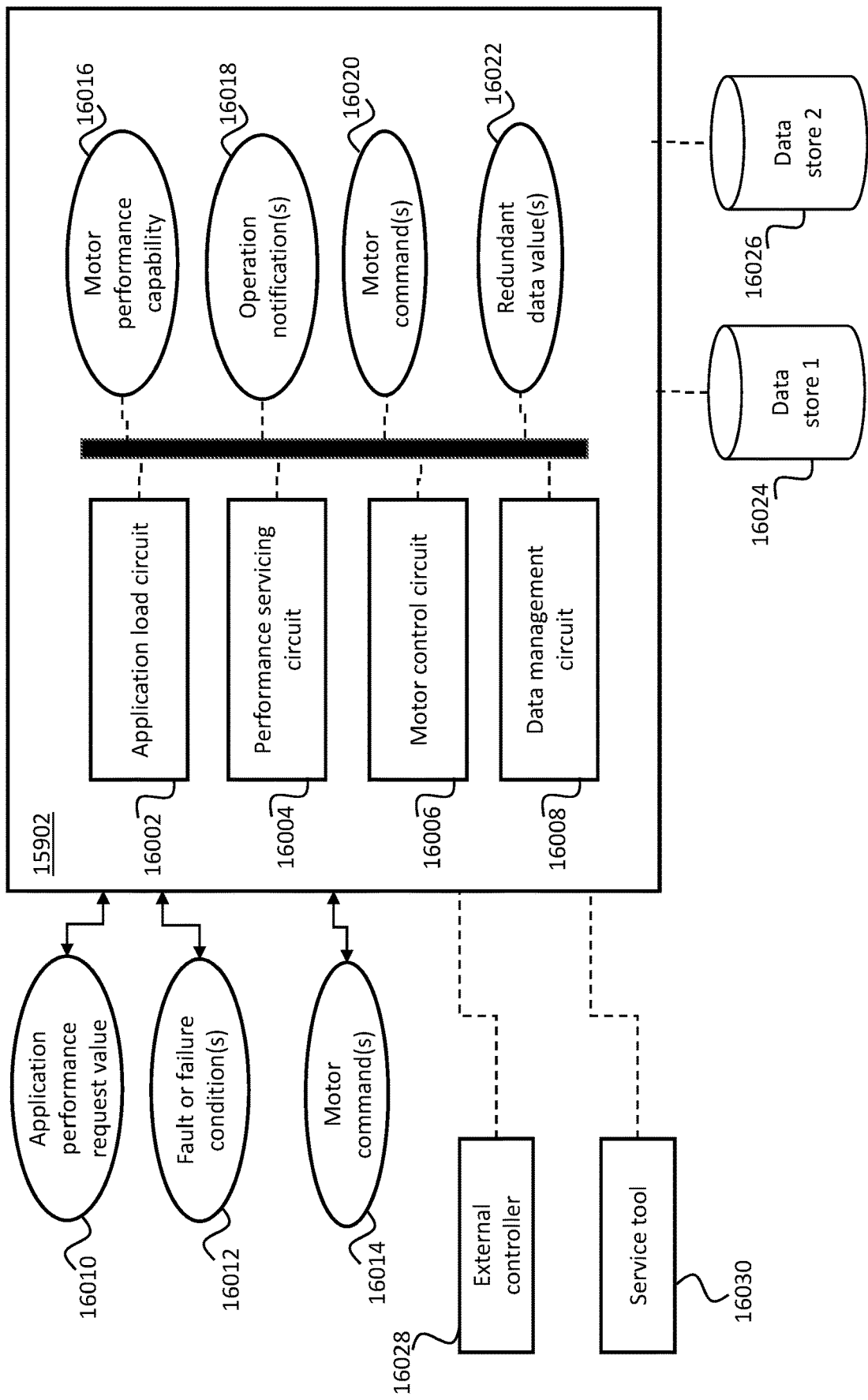

FIG. 160 depicts a schematic diagram of a controller.

Figure 161:
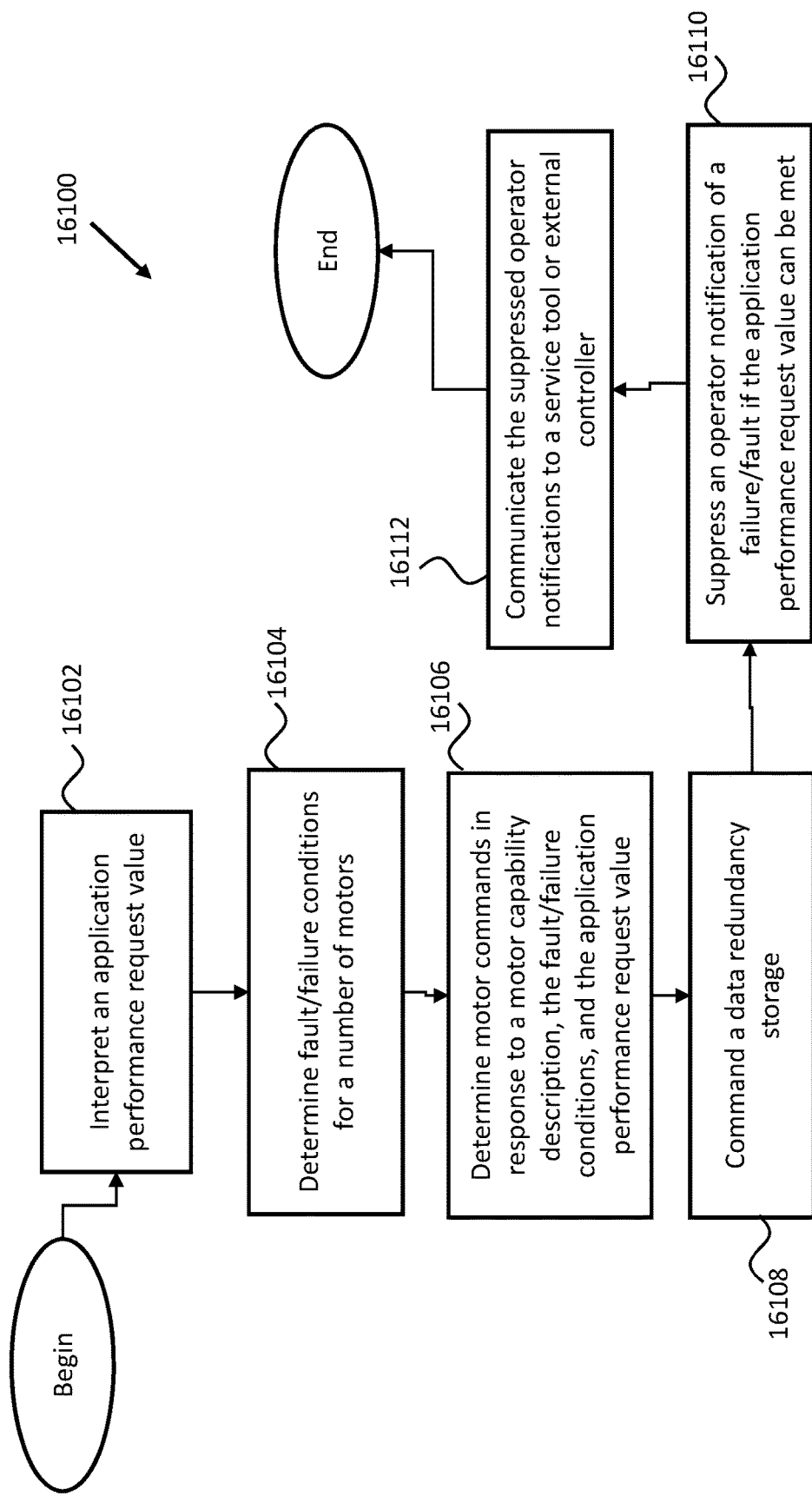

FIG. 161 depicts a schematic flow diagram of a procedure to operate multiple motors.

DETAILED DESCRIPTION

Figure 1:
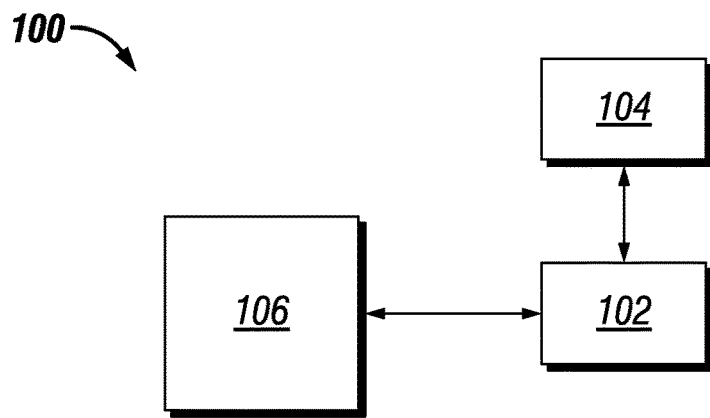
FIG. 1 shows an embodiment system schematically depicting a power distribution unit (PDU) operationally positioned between a power source and a load.

Referencing FIG. 1, an example system 100 is schematically depicted including a power distribution unit (PDU) 102 operationally positioned between a power source 104 and a load 106. The power source 104 may be any type—including at least a battery, generator, and/or capacitor. The power source 104 may include multiple sources or lines of power, which may be distributed according to the type of power (e.g., a battery input separated from a generator input) and/or may be distributed according to the devices powered (e.g., auxiliary and/or accessory power separated from main load power such as motive force power, and/or divisions within the accessories, divisions within the motive force power, etc.). The load 106 may be any type, including one or more motive force loads (e.g., to individual drive wheel motors, to a global motive drive motor, etc.), one or more accessories (e.g., on-vehicle accessories such as steering, fan, lights, cab power, etc.). In certain embodiments, the PDU 102 provides for ease of integration of the electrical system of the application including the system 100, such as by utilizing uniform input and output access, grouping all power distribution into a single box, single area, and/or to a single logically integrated group of components. In certain embodiments, the PDU 102 provides for protection of the electrical system, including fusing and/or connection or disconnection (manual and/or automated) of the electrical system or individual aspects of the electrical system. In certain embodiments, one or more power sources 104 may be high voltage (e.g., motive power sources, which may be 96V, 230V-360V, 240V, 480V, or any other value) or low voltage (e.g., 12V, 24V, 42V, or any other value). In certain embodiments, one or more power sources 104 may be a direct current (DC) power source or an alternating current (AC) power source, including multi-phase (e.g., three phase) AC power. In certain embodiments, the PDU 102 is a pass-through device, providing power to the load 106 approximately as configured by the power source 104—for example only as affected by sensing and other operations from the PDU 102 that are not provided for power configuration. In certain embodiments, the PDU 102 may include power electronics, for example rectifying, adjusting voltage, cleaning up noisy electrical power, etc. to provide selected electrical power characteristics to the load 106.

Figure 2:
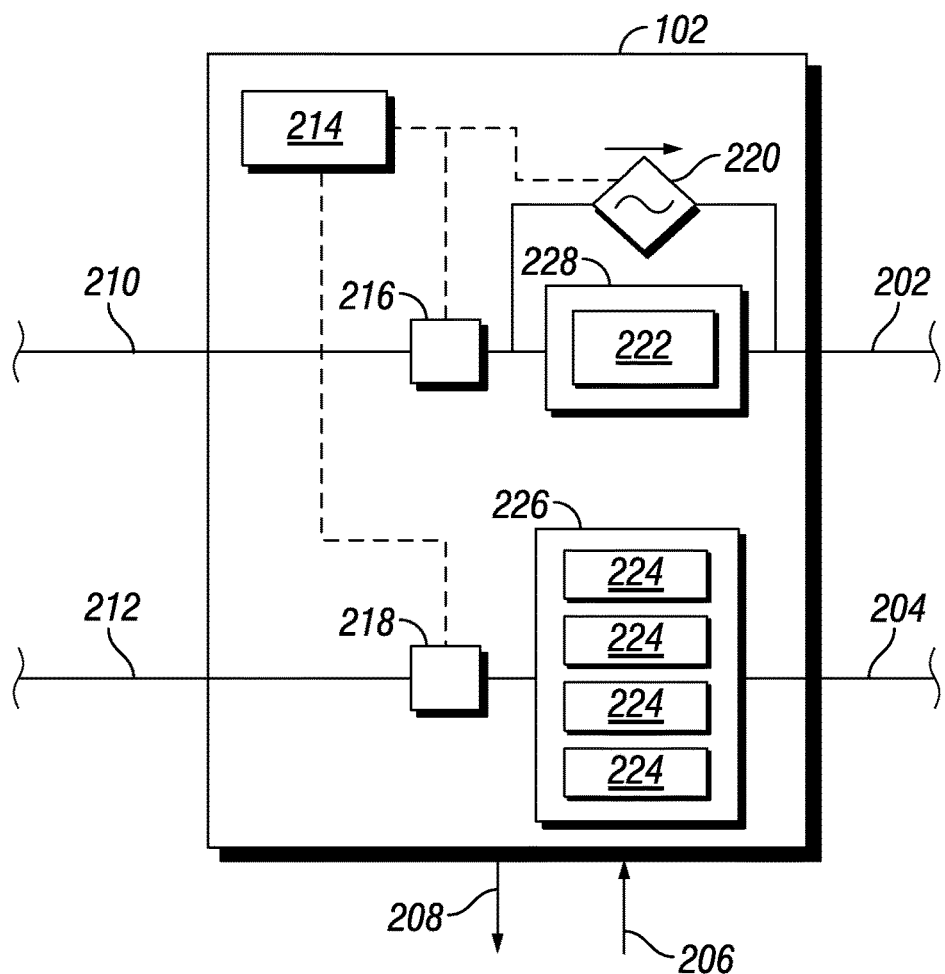
FIG. 2 depicts a more detailed embodiment system schematically depicting a PDU.

Referencing FIG. 2, a more detailed view of an example PDU 102 is schematically depicted. The example PDU 102 includes a main power source 202 (e.g., high voltage, main load power, motive power, etc.) which may be provided by one or more power sources 104, and an auxiliary power source 204 (e.g., auxiliary, accessory, low voltage, etc.) which may be provided by one or more power sources 104. The example PDU 102 depicts a single main power source 202 and a single auxiliary power source 204, but a given application may include one or more main power sources 202, and may include separated auxiliary power sources 204 and/or omit auxiliary power sources 204.

The example PDU 102 further includes a coolant inlet 206 and a coolant outlet 204. The provision of coolant to the PDU 102 is optional and may not be included in certain embodiments. The coolant may be of any type according to availability in the application, including for example an on-vehicle coolant available (e.g., engine coolant, transmission coolant, a coolant stream associated with an auxiliary device or other power components such as a power source 104, etc.) and/or may be a coolant dedicated to the PDU 102. Where present, the amount of cooling provided by the coolant may be variable—for example by changing an amount of coolant flowing through a coolant loop through the PDU 102—such as by operating hardware (e.g. a valve or restriction) within the PDU 102, providing a request for a coolant flow rate to another device in the system, etc.

The example PDU 102 further includes a main power outlet 210 and an auxiliary power outlet 212. As described preceding, the PDU 102 may include multiple main power outlets 210, and/or divided, multiple, multiplexed, and/or omitted auxiliary power outlets 212. The example PDU 102 is a pass-through power device where, except for effects on the power due to sensing and/or active diagnostics, the power outlets 210, 212 have approximately the same electrical characteristics of the corresponding power inlets 202, 204. However, the PDU 102 can include power electronics (solid state or otherwise) to configure power in any desired manner.

The example PDU 102 further includes a controller 214 configured to functionally execute certain operations of the PDU 102. The controller 214 includes and/or is communicatively coupled to one or more sensors and/or actuators in the PDU 102, for example to determine current values, voltage values, and/or temperatures of any power source or input, fuse, connector, or other device in the PDU 102. Additionally or alternatively, the controller 214 is communicatively coupled to the system 100 including the PDU 102, including for example a vehicle controller, engine controller, transmission controller, application controller, and/or network device or server (e.g., a fleet computer, cloud server, etc.). The controller 214 may be coupled to an application network (e.g., a CAN, a datalink, a private or public network, etc.), an outside network, and/or another device (e.g., an operator's portable device, an in-cab computer for a vehicle, etc.). The controller 214 is depicted schematically as a single stand-alone device for convenience of illustration. It will be understood that the controller 214 and/or aspects of the controller 214 may be distributed across multiple hardware devices, included within another hardware device (e.g., a controller for the power source, load, vehicle, application, etc.), and/or configured as hardware devices, logic circuits, or the like to perform one or more operations of the controller 214. The PDU 102 is depicted schematically as a device within a single enclosure, but may be within a single enclosure and/or distributed in two or more places within an application. In certain embodiments, the inclusion of the PDU 102 within a single enclosure provides certain advantages for integration, reduction of footprint, and/or simplification of interfaces. Additionally or alternatively, inclusion of the PDU 102 in more than one location in an application is contemplated herein, and/or the inclusion of more than one PDU 102 within an application is contemplated herein.

The example PDU 102 includes a main contactor 216 selectively controlling the main power throughput of the PDU 102. In the example, the main contactor 216 is communicatively coupled to and controlled by the controller 214. The main contactor 216 may additionally be controllable manually, and/or other main contactors 216 may be in-line for the main power that are controllable manually. An example main contactor 216 includes a solenoid (or other coil-based) contactor, such that energizing the solenoid provides for either connected main power (e.g., normally open, or power is disconnected when not energized) and/or energizing the solenoid provides for disconnected main power (e.g., normally closed, or power is connected when not energized). The characteristics of the system 100, including design choices about whether power should be active when controller 214 power fails, servicing plans, regulations and/or policies in place, the consequences of power loss for the system 100, the voltage typically carried on the main power source, the availability of a positive manual disconnect option, and the like, may inform or dictate the decision of whether the main contactor 216 is normally open or normally closed. In certain embodiments, the main contactor 216 may be a solid state device such as a solid state relay. Where more than one main contactor 216 is present, the various contactors may include the same or distinct hardware (e.g., one is a solenoid and one is a solid state relay), and/or may include the same or distinct logic for being normally open or normally closed. The main contactor 216 may be additionally controllable by devices outside the PDU 102—for example a keyswitch lockout, another controller in the system 100 having access to control the main contactor 216, etc., and/or the controller 214 may be responsive to outside commands to open or close the main contactor 216, and/or additional contactors in-line for the main power may be responsive to devices outside the PDU 102.

The example PDU 102 includes an auxiliary contactor 218 selectively controlling the auxiliary power throughput of the PDU 102. In the example, the auxiliary contactor 218 is communicatively coupled to and controlled by the controller 214. The auxiliary contactor 218 may additionally be controllable manually, and/or other auxiliary contactor 218 may be in-line for the auxiliary power that are controllable manually. An example auxiliary contactor 218 includes a solenoid (or other coil-based) contactor, such that energizing the solenoid provides for either connected auxiliary power (e.g., normally open, or power is disconnected when not energized) and/or energizing the solenoid provides for disconnected auxiliary power (e.g., normally closed, or power is connected when not energized). The characteristics of the system 100, including design choices about whether power should be active when controller 214 power fails, servicing plans, regulations and/or policies in place, the consequences of power loss for the system 100, the voltage typically carried on the auxiliary power source(s), the availability of a positive manual disconnect option, and the like, may inform or dictate the decision of whether the auxiliary contactor 218 is normally open or normally closed. In certain embodiments, the auxiliary contactor 218 may be a solid state device such as a solid state relay. The auxiliary contactor 218 may be additionally controllable by devices outside the PDU 102—for example a keyswitch lockout, another controller in the system 100 having access to control the auxiliary contactor 218, etc., and/or the controller 214 may be responsive to outside commands to open or close the auxiliary contactor 218, and/or additional contactors in-line for the auxiliary power may be responsive to devices outside the PDU 102. In certain embodiments, auxiliary contactors 218 may be provided for each auxiliary line, for subsets of the auxiliary lines (e.g., four auxiliary power inputs, with 2, 3, or 4 auxiliary contactors 218), etc.

An example PDU 102 includes a current source 220, which may be an alternating current source, and/or which may be provided as solid state electronics on the controller 214. The current source 220 is capable of providing a selected current injection to the main power across a main fuse 222, for example as AC current, DC current, and/or controllable current over time. For example, the PDU 102 may include sensors such as voltage and/or current sensors on the main power, and the current source 220 provides an electrical connection to a power source (which may be an external power source and/or sourced through the controller) in a manner configured to inject the desired current to the main power. The current source 220 may include feedback to ensure the desired current is injected, for example to respond to system noise, variability, and aging, and/or may apply the nominal electrical connection to inject current, and the controller 214 determines sensor inputs to determine what current was actually injected on the main power. The example PDU 102 depicts a current source 220 associated with the main fuse 222, but the PDU 102 may further include one or more current sources 220 associated with any one or more of the fuses 222, 224 in the PDU 102, including across fuses individually, in subsets, or across all of the fuses (subject to compatibility of power on the fuses—for example simultaneous current injection across electrically coupled fuses should generally be avoided) at once. It can be seen that the inclusion of additional current sources 220 provides for greater resolution in injecting current across individual fuses and in managing variation of the fuses over time, which the inclusion of fewer current sources 220 reduces system cost and complexity. In certain embodiments the current source 220 is configured to selectively inject current across each fuse in the PDU 102, and/or across each fuse of interest, in a sequence or schedule, and/or as requested by a controller 214.

Figure 3:
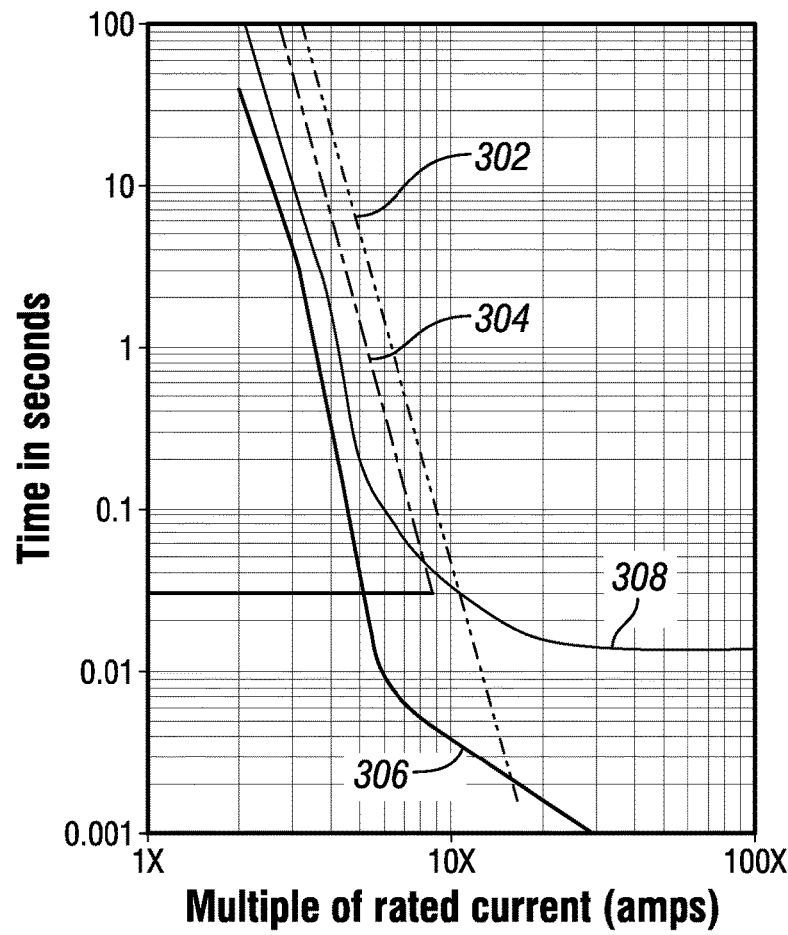
FIG. 3 depicts a non-limiting example response curve for a fuse.

The example PDU 102 includes the main fuse 222 and the auxiliary fuses 224. The main fuse 222 or fuses are associated with the main power, and the auxiliary fuses 224 are associated with the auxiliary power. In certain embodiments, the fuses are thermal fuses, such as resistive devices that exhibit heating, and are intended to fail if a given current profile is exceeded in the associated power line. Referencing FIG. 3, a typical and non-limiting example response curve for a fuse is depicted. The curve 302 represents an application damage curve, depicting a current-time space over which some aspect of the application will be damaged if the curve is exceeded. For example, in the example application damage curve 302, if 10× rated current is exceeded for about 50 milliseconds, damage to some aspect of the application will occur. It will be understood that an application may contain many components, and that the components may differ in the application damage curve 302. Additionally, each fuse 222, 224 may be associated with distinct components having a different damage curve than other components. The curve 304 represents a control space, wherein in certain embodiments, the controller 114 provides control protection to keep the system from reaching the application damage curve 302 in the event of a fuse failure or off-nominal operation. The application damage curve 302 may be a specified value, for example a system requirement to be met, where exceedance of the application damage curve 302 does not meet the system requirement, although actual damage to components may be experienced at some other value in the current-time space. The curve 306 represents the fuse melting line for an illustrative fuse. At the position of the fuse melting line 306, the fuse temperature exceeds the fuse design temperature, and the fuse melts. However, the fuse continues conducting for a period of time after melting commences, as depicted by the fuse conduction line 308 (e.g., due to conduction through the melted material before the connection is broken, arcing, and the like). When the time-current space reaches the fuse conduction line 308, the fuse is no longer conducting on the power line, and the line is disconnected. It will be understood that specific system dynamics, fuse-to-fuse variability, fuse aging (e.g., induced mechanical or thermal degradation, changes in composition or oxidation, and the like), the exact nature of the current experienced (e.g., the rise time of the current), and other real-world variables will affect the exact timing of both fuse melting and fuse disconnection. However, even with a nominal fuse as depicted in FIG. 3, it can be seen that for very high currents, the nominal fuse conduction line 308, and even the fuse melting line 306, can cross the application damage curve 302—for example because certain dynamics of the fuse disconnection operation are less responsive (in the time domain) or unresponsive to the current applied at very high current values.

The example PDU 102 further includes a conduction layer 226 associated with the auxiliary power, and a conduction layer 228 associated with the main power. The conduction layers 226, 228 include the power couplings of the power lines to the fuses. In certain embodiments, the conduction layers 226, 228 are just wires or other conductive couplings between the fuses and the power connections to the PDU 102. Additionally or alternatively, conduction layers 226, 228 may include flat or laminated portions, for example with stamped or formed conductive layers, to provide power connections within the PDU 102, and/or portions of the conduction layers 226, 228 may include flat or laminated portions. Without limitation to any other disclosures provided herein, the utilization of flat or laminated portions provides for flexibility in the manufacture of the conduction layers 226, 228, flexibility in the installation and/or a reduced installed footprint of the conduction layers 226, 228, and/or provides for greater contact area between the conduction layers 226, 228 and portions of the PDU 102—for example the fuses, controller, contactors, or other devices within the PDU 102 where thermal and/or electrical contact between the conduction layers 226, 228 and the other devices are desired. The example conduction layers 226, 228 are depicted in association with the fuses, but the conduction layers 226, 228 may additionally or alternatively be associated with the controller 214 (e.g., power coupling, communications within or outside the PDU 102, coupling to actuators, coupling to sensors, and/or thermal coupling), contactors 216, 218, and/or any other device within the PDU 102.

Figure 4:
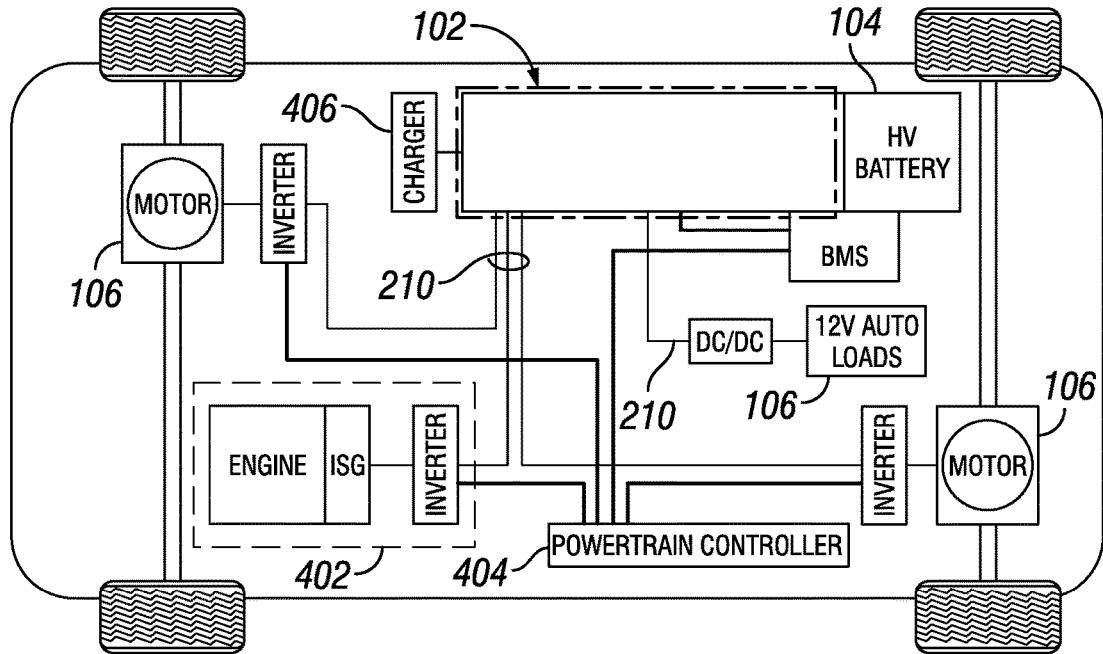
FIG. 4 depicts a non-limiting example system for mobile application such as a vehicle.

Referencing FIG. 4, an example system 400 is a mobile application such as a vehicle. The example system 400 includes the high voltage battery 104 electrically coupled to high voltage loads 106 through the PDU 102. In the example system 400, an auxiliary prime mover, such as an internal combustion engine 402 (with associated conversion electronics, such as a generator, motor-generator, and/or inverter) is additionally coupled to the PDU 102. It is understood that the high voltage battery 104 and/or the auxiliary prime mover 402 may act as a power source or a load during certain operating conditions of the system 400, and additionally the high voltage loads 106 (e.g., electric motors or motor-generators coupled to the wheels) may act as a load or a source during certain operating conditions. The description of loads 106 and sources 104 herein is non-limiting, and references only nominal operation, ordinary operation, and/or operational conditions selected for conceptual description, even if the described load 106 and/or source 104 often, usually, or always operates in a mode that is not the described name. For example, the high voltage battery 104 may operate as a power source during motive operations where net energy is being taken from the battery, and/or as a load during charging operations, motive operations where the wheels or auxiliary prime mover are charging the battery, etc.

The example system 400 further includes a powertrain controller 404 to control operations of the powertrain, which may be associated with another component in the system 400, and/or part of another controller in the system (e.g., a vehicle controller, battery controller, motor or motor-generator controller, and/or engine controller). The example system 400 further includes a charger 406 coupled to the high voltage batter 404 through the PDU 102, and low voltage loads ("12V Auto Loads" in the example of FIG. 4) representing auxiliary and accessory loads in the system 400. One of skill in the art will recognize the system 400 as including a serial hybrid powertrain for a vehicle—for example where auxiliary power (e.g., the internal combustion engine) interacts only with the electrical system to re-charge batteries and/or provide additional real-time electrical power during operations, but does not mechanically interact with the drive wheels. Additionally or alternatively, a system may include a parallel hybrid system, where auxiliary power can interact mechanically with the drive wheels, and/or interact with the electrical system (either, or both). Additionally or alternatively, a system may be a fully electric system, where auxiliary power is not present, and/or where auxiliary power is present but does not interact with the high voltage/motive power system (e.g., an alternative power unit to drive accessories, refrigeration, or the like—which power may be communicated through the PDU 102 but separated from the motive power electrical system). In certain embodiments, motive systems such as vehicles experience highly transient load cycles—for example during acceleration, deceleration, stop-and-go traffic, emergency operations, and the like—and accordingly management of power in such system is complex, and certain devices such as fuses can be vulnerable to the highly transient load cycle. Additionally or alternatively, loss of operations for vehicles can result in costs for system down-time, loss or untimely delivery of cargo, and/or significant operational risks due to failures (e.g., stranding the operator and/or vehicle, loss of operations in traffic, loss of operations on a motor-way, etc.). In certain embodiments, other systems that may be hybrid electric and/or fully electric are additionally or alternatively subject to highly variable duty cycles and/or specific vulnerabilities to operational interruptions, such as, without limitation, pumping operations, process operations for a larger process (e.g., chemical, refining, drilling, etc.), power generation operations, mining operations, and the like. System failures for these and other operations may involve externalities such as losses associated with the process failure that go beyond the down-time for the specific system, and/or down-time for such systems can incur a significant cost.

Figure 5:
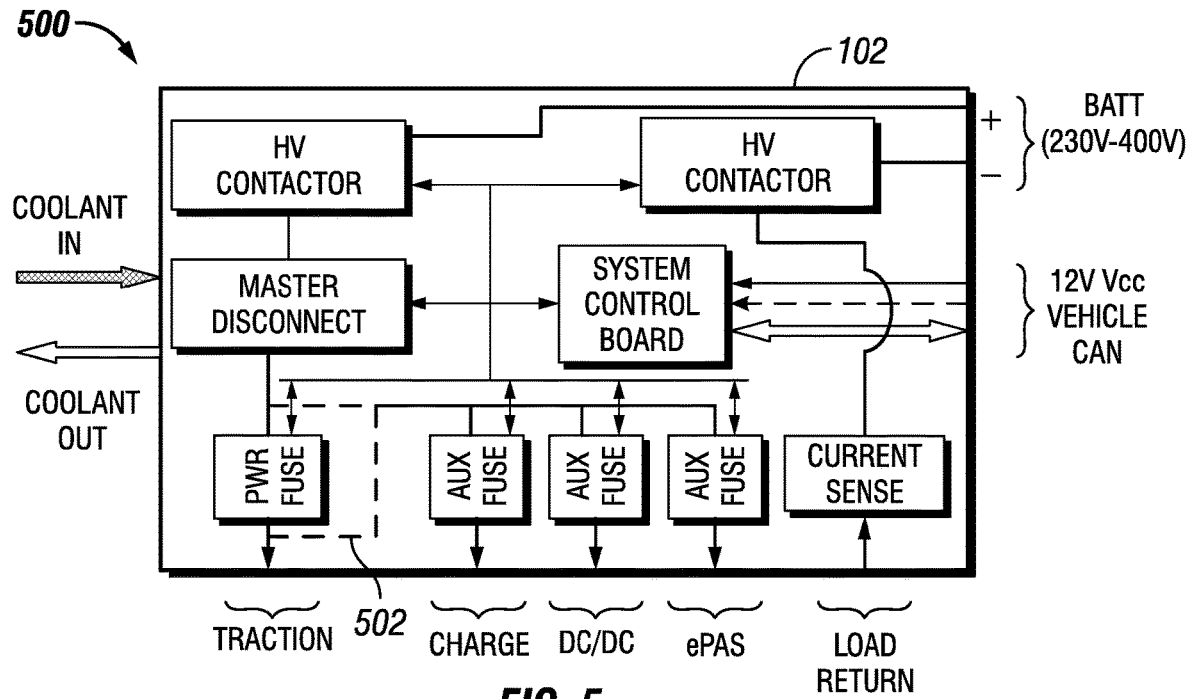
FIG. 5 depicts a non-limiting example system including a PDU.

Referencing FIG. 5, an example system is depicted including a PDU 102. The example PDU 102 has a number of auxiliary power connections (e.g., charging, power steering, vehicle accessories, and a load return for current detection, in the example), and a main motive/traction power connection. The example system 500 includes two high voltage contactors, one for each of the battery high side and low side, where in the example two high voltage contactors are controllable by the system control board but may be additionally or alternatively manual (e.g., a switch accessible by an operator). The system control board additionally can control a master disconnect that can disconnect all power through the PDU 102. The system 500 further depicts a power fuse bypass 502, controllable by the system control board, that supports certain operations of the present disclosure as described throughout. The system 500 depicts a power fuse bypass 502, but may additionally or alternatively include an auxiliary bypass for one or more of the auxiliary fuses, any subset of the auxiliary fuses, and/or for all of the auxiliary fuses together. The example system 500 includes an optional coolant supply and return coupling. The battery coupling in the system 500 depicts a 230V to 400V battery coupling, but the high voltage coupling may be any value. The system control board is depicted as communicatively coupled to a 12V CAN network, although the communicative coupling of the system control board to the surrounding application or system can be any network understood in the art, multiple networks (e.g., vehicle, engine, powertrain, private, public, OBD, etc.), and/or may be or may include a wireless network connection.

Figure 6:
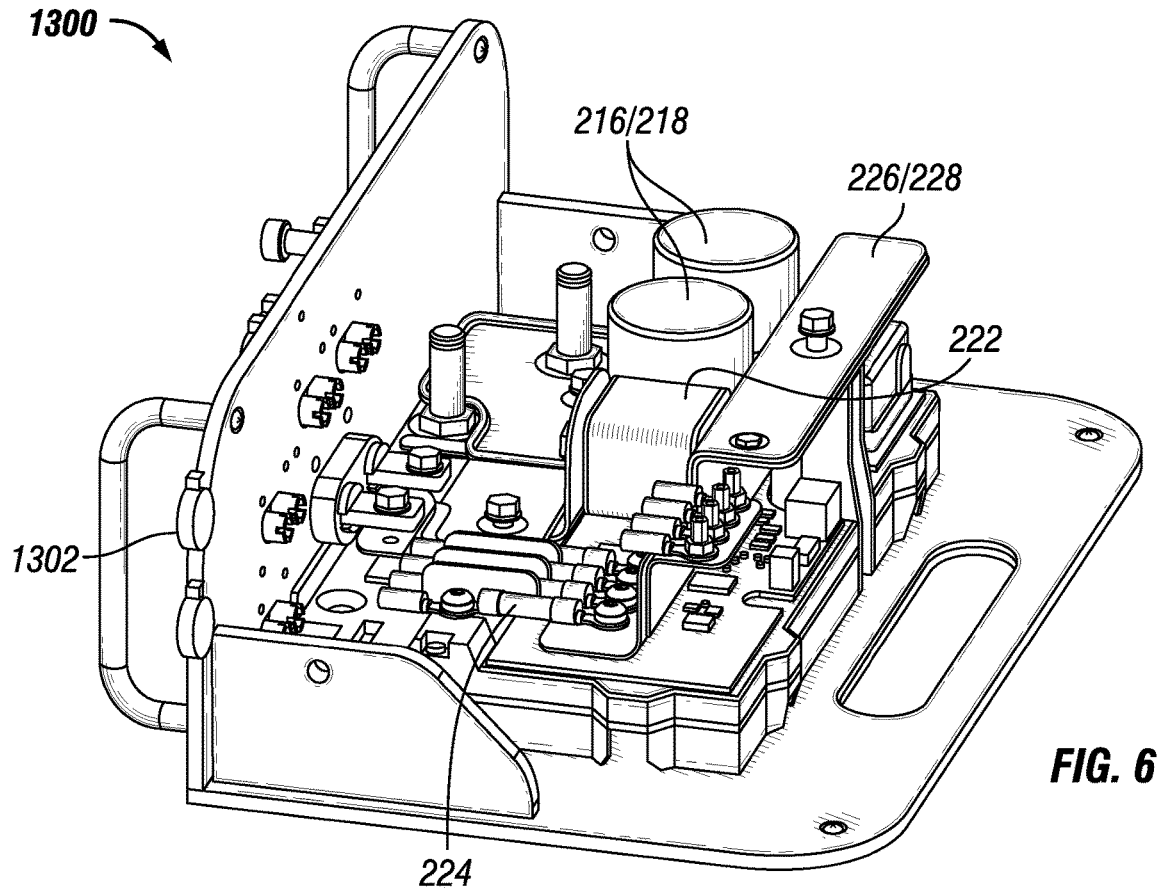
FIG. 6 depicts an embodiment apparatus including all or portions of a PDU.

Referencing FIG. 6, an illustrative apparatus 1300 is depicted, which may include all or portions of a PDU 102. Any descriptions referencing interactions between the main fuse 222 and laminated layers 226/228 herein additionally or alternatively contemplate interactions between any fuses and/or connectors in the apparatus 1300, and/or any other component of a PDU 102 as described throughout the present disclosure. The example apparatus 1300 includes contactors 216/218 which may be high voltage contactors, and/or may be associated with various ones of the fuses 222, 224 in the apparatus 1300. The apparatus 1300 includes laminated layers 226/228, which may include conductive layers for certain aspects of the conductive circuitry in the apparatus 1300. The laminated layers 226/228 may additionally or alternatively provide stiffness and/or structural support for various components in the apparatus 1300. The laminated layers 226/228 may be configured to interact with any components in a manner desired to support the functions of the laminated layers 226/228, including structural functions, heat transfer functions, and/or electrical conductivity functions. The example laminated layers 226/228 interact with all contactors and fuses in the apparatus 1300, although laminated layers 226/228 can readily be configured to interact with selected ones of the contactors and/or fuses, and/or with other components in the apparatus, for example in a manner similar to a printed circuit board (PCB) design. The example apparatus 1300 is positioned on a L-bracket, which may be a final configuration, and/or may be a test configuration. In certain embodiments, the apparatus 1300 is enclosed in a dedicated housing, and/or enclosed in a housing of another device in a system 100—such as the battery housing. In certain embodiments, the apparatus 1300 includes a removable housing portion (e.g., a top portion, lid, etc.) for service and/or maintenance access to the components of the apparatus. The example apparatus 1300 includes connectors 1302—for example to provide power, datalink access, connections to the power source 104, connections to loads 106, connections to sensors (not shown), and/or any other type of connection to the system 100 or otherwise.

Figure 7:
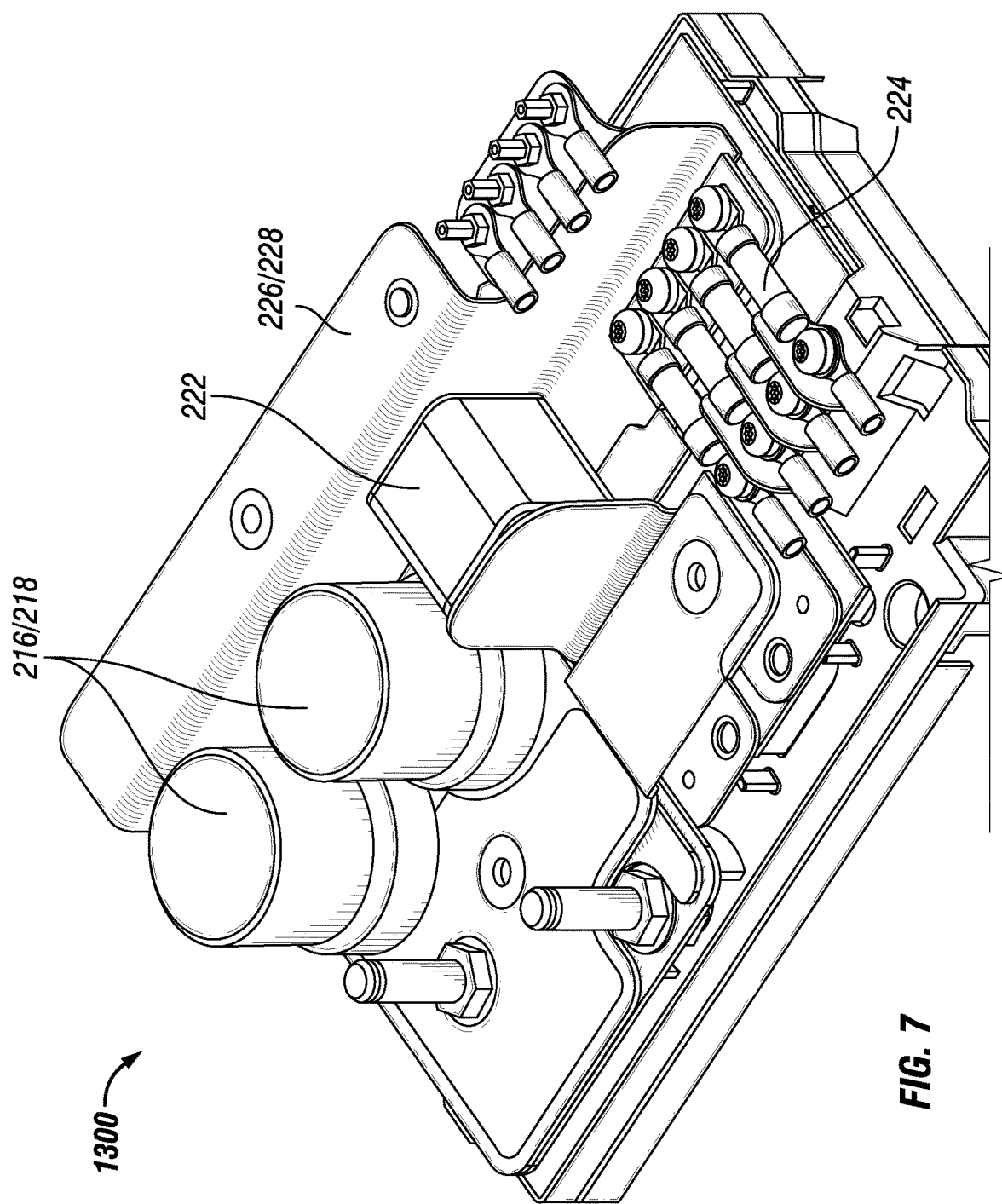
FIG. 7 shows a non-limiting example of interactions between a main fuse and laminated layers.
Figure 8:
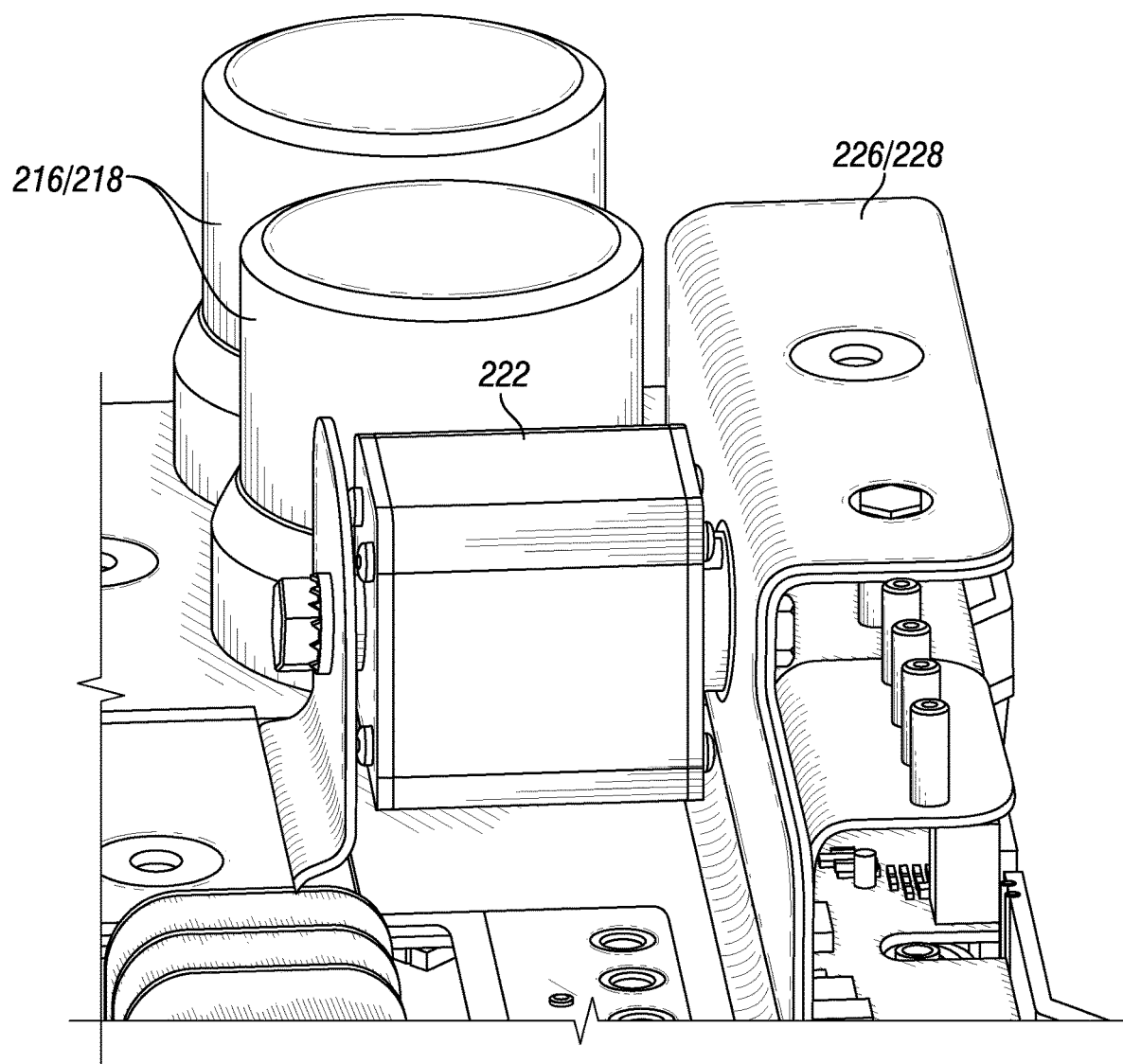
FIG. 8 shows closer detail of a non-limiting example of interactions between a main fuse and laminated layers.

Referencing FIG. 7, an alternate view of an apparatus 1300 is depicted. The apparatus 1300 depicted in FIG. 7 shows the physical interaction between the main fuse 222 and the laminated layers 226/228 for an example embodiment. Referencing FIG. 8, a closer detail view of interactions between the main fuse 222 and the laminated layers 226/228 is depicted for an example embodiment. In the example of FIG. 8, it can be seen that the main fuse 222 includes a relatively large thermal contact area with the laminated layers 226/228 on a bottom side of the fuse, and a relatively small thermal contact area with the laminated layers 226/228 on the mounting sides (e.g., through the mounting components). The thermal contact area between the main fuse 222 and the laminated layers 226/228 is selectable, and in certain embodiments the mounting side or an open side of the main fuse 222 includes a greater thermal contact area, and/or the bottom side includes a large thermal contact area or is not in significant thermal contact with the laminated layers 226/228.

Figure 9:
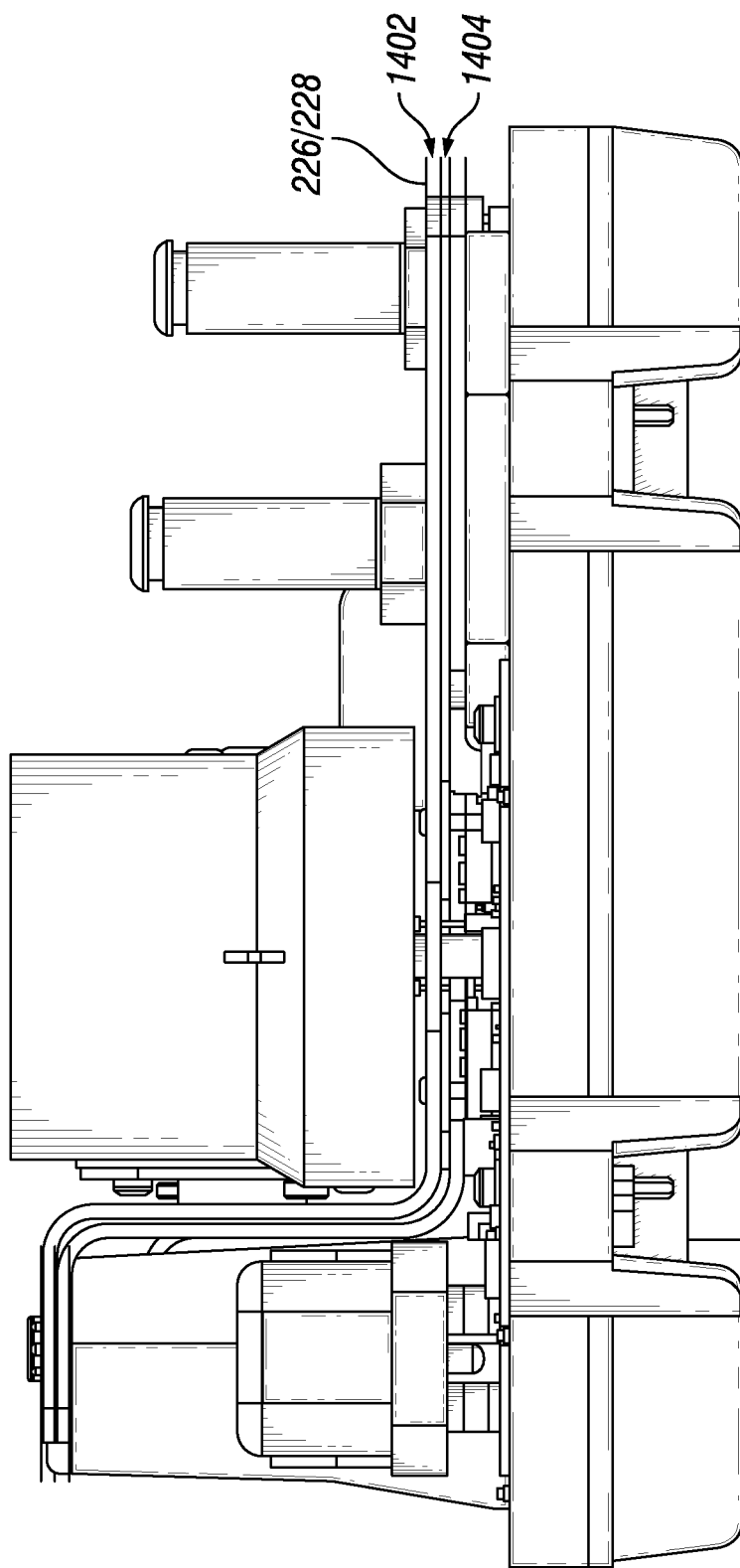
FIG. 9 depicts an embodiment detailed view of a side section of the laminated layers.

Referencing FIG. 9, a detail view of a side section of the laminated layers 226/228 is depicted. The laminated layers 226/228 in the example include an outer structural layer 1402 and an opposing outer structural layer (not numbered), with an interstitial space 1404 between the outer structural layers. In certain embodiments, conductive flow paths and/or thermal flow paths are provided in the interstitial space 1404 between the structural layers. It will be understood that the use of two outer structural layers 1402 provides certain mechanical advantages, including increased durability to shocks and minor impacts, denting of a layer, and bending or flexing of the PDU 102. Additionally or alternatively, the use of two outer structural layers 1402 provides for improved mechanical moments for certain types of stresses. Accordingly, in certain embodiments, the interstitial space 1404 is empty (e.g., it forms a gap), and/or negligible (e.g., the outer layers are sandwiched directly together at least in certain portions of the PDU 102), and nevertheless an improved design is achieved. In certain embodiments, the interstitial space 1404 includes thermally conductive members (e.g., high thermal conductivity paths at selected locations), electrically conductive members (e.g., high electrical conductivity paths at selected locations), active and/or convective thermal paths (e.g., coolant or other convective thermal materials that flow through selected paths in the interstitial space 1404), insulating materials (e.g., to direct electrical or heat flow, and/or to separate components or layers electrically and/or thermally), and/or dielectric materials (e.g., to improve electric isolation of components and/or layers).

Figure 10:
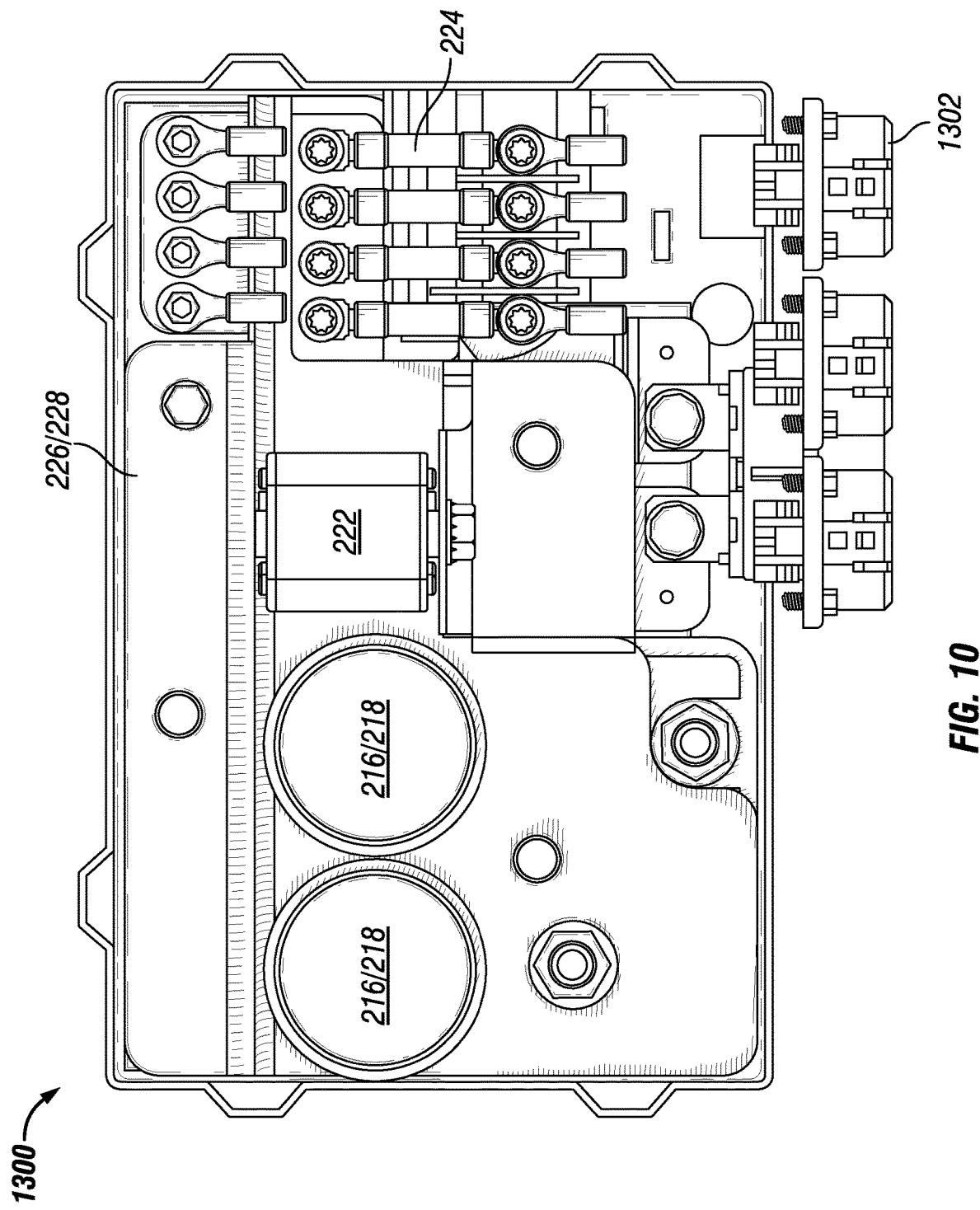
FIG. 10 shows a top view of a non-limiting example apparatus.
Figure 11:
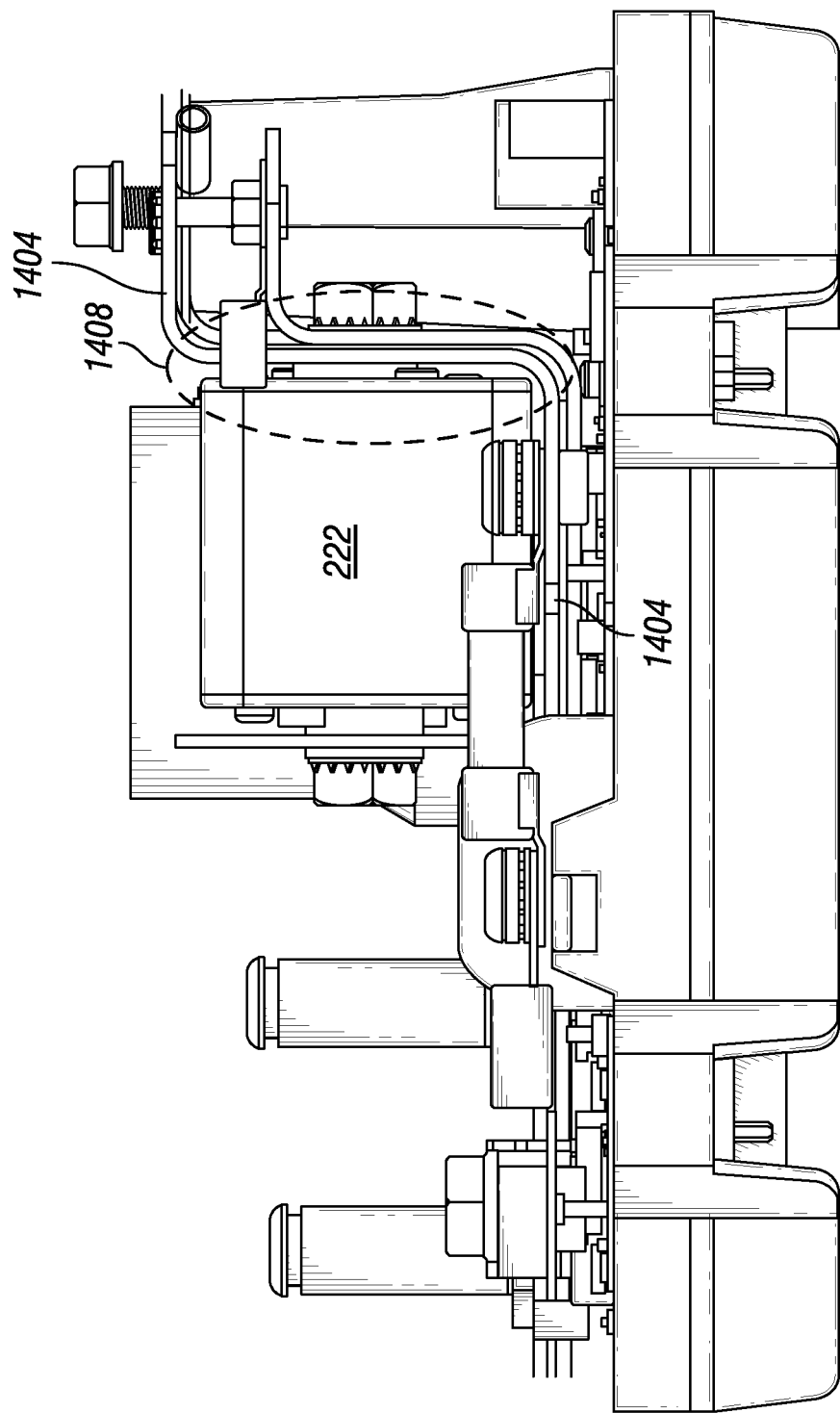
FIG. 11 shows an alternate side view of a non-limiting example apparatus.

Referencing FIG. 10, a top view of an example apparatus 1300 is depicted. The laminated layers 226/228 are distributed throughout the apparatus 1300, providing selectable support, thermal conductivity paths, and/or electrical conductivity paths, to any desired components in the apparatus. Referencing FIG. 11, a side detail view of the interactive space 1408 between the laminated layers 226/228 and the main fuse 222 is depicted. The interactive space includes thermally conductive paths between mount points on the main fuse 222 and the laminated layers 226/228. Additionally, the interstitial space 1404 between the layers is present, in the example, along both the bottom and side of the main fuse 222. Accordingly, desired thermal transfer and/or electrical communication between the main fuse 222 and the interstitial layer 226/228 (and thereby with any other selected components in the apparatus 1300) is available as desired. In certain embodiments, greater thermal and/or electrical coupling between the main fuse 222 and the laminated layers 226/228 is provided—for example by running the laminated layers 226/228 along the housing of the main fuse 222 rather than offset from the housing, and/or by providing a thermally conductive connection (e.g., thermal grease, silicone, and/or contact utilizing any other thermally coupling material such as a metal or other conductor) between the main fuse 222 and the laminated layers 226/228.

Figure 12:
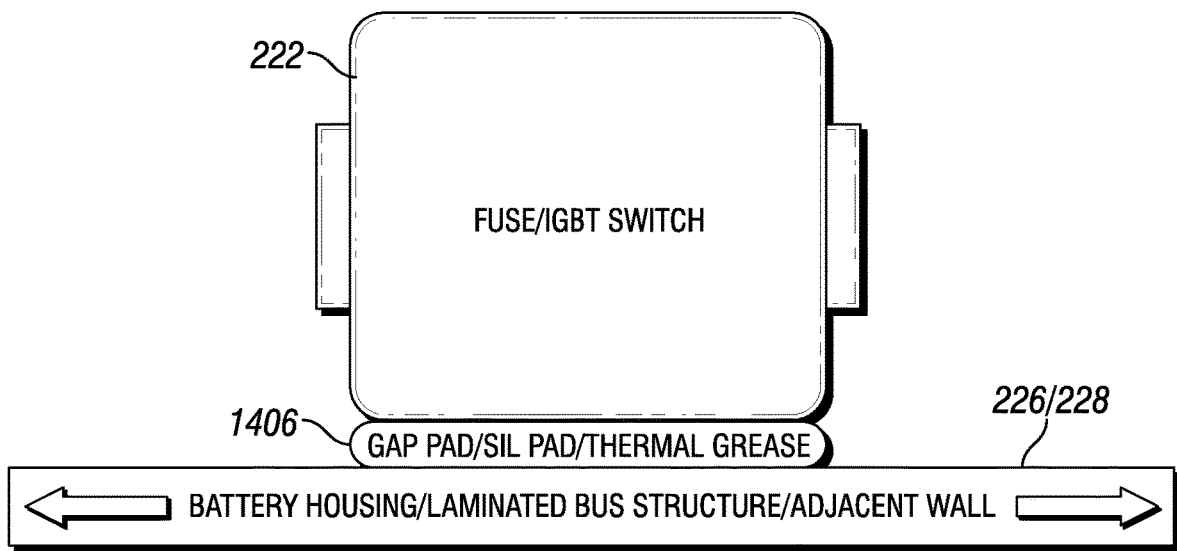
FIG. 12 depicts an embodiment configuration showing a main fuse coupled to laminated layers on a bottom side of the main fuse.
Figure 13:
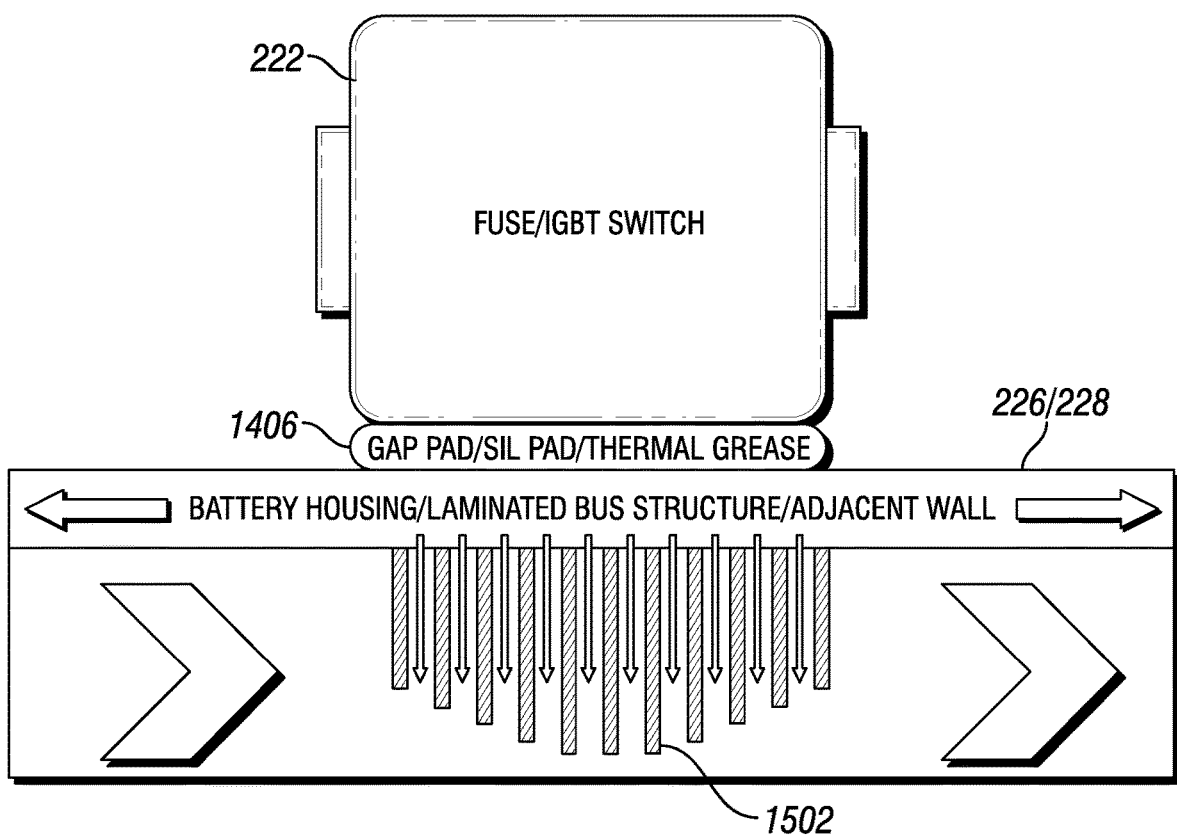
FIG. 13 depicts an embodiment configuration showing a main fuse coupled to laminated layers on a bottom side of the main fuse with thermal fins.

Referencing FIG. 12, a main fuse 222 coupled to laminated layers 226/228 on a bottom side of the main fuse 222 is depicted. The example of FIG. 12 depicts a thermally conductive layer 1406 disposed between the main fuse 222 and the laminated layers 226/228—for example thermal grease, silicone, a silicone pad, a mounted metal material, and/or any other thermally conductive layer understood in the art. In the example of FIG. 12, the increased effective thermal contact area provides for greater heat transfer away from the main fuse 222 when the main fuse 222 gets hotter than the laminated layer 226, 228. Additionally, the heat can be directed away by the inclusion of a thermally conductive material within the interstitial space 1404 (e.g., reference FIG. 14), including for example utilizing a conductive path the direct heat to a selected portion of a PDU housing, to an active cooling exchange, heating fins, or the like. In the example of FIG. 12, the support layers 226/228 that the fuse 222 is coupled to in FIG. 12 may additionally or alternatively include be only a single layer (e.g., not a laminated layer, and/or layers 226, 228 having no interstitial space 1404), a housing of the PDU 102, and/or another component in a system 100 such as a battery pack housing. In certain embodiments, the heat conductivity in FIG. 12 is enhanced by the laminated layers 226/228, for example by the inclusion of a highly conductive channel in the interstitial space 1404, which may be improved by the structural support, routing availability, and/or environmental isolation provided by the laminated layers 226/228. Referencing FIG. 13, in addition to the features depicted in FIG. 12, fins 1502 for improved heat transfer and/or structural rigidity are depicted upon the laminated layers 226/228 (which may be laminated layers, a single layer, a housing wall, etc.). In certain embodiments, the fins are oriented such that fluid flows past them in a direction to enhance heat transfer (e.g., oriented for improved effective flow area and/or turbulence generation in a liquid flow, to maximize effective area in a gas flow, and/or to allow natural convection of fluid—such as gas rising—to cause a high effective flow area of the fins 1502). In certain embodiments, for example where the support layers 226, 228 (and/or layer 226) is a portion of a housing, battery pack housing, or other device, the fins 1502 may instead be presented into ambient air, a forced air flow region, or in a region to be in contact with any selected fluid to facilitate heat transfer to the fluid.

Convective heat transfer, as utilized herein, includes any heat transfer path wherein convective heat transfer forms at least a portion of the overall heat transfer mechanism. For example, where a portion of the heat transfer is conductive (e.g., through a wall, thermal grease, etc.) into a flowing fluid (where generally convective heat transfer dominates), then the heat transfer mechanism is convective and/or includes a convective portion. In certain embodiments, heat transfer utilizing an active or passively flowing fluid include convective heat transfer as utilized herein. The heat transfer may be dominated by conduction under certain operating conditions, dominated by convection under certain operating conditions, and/or include contributing mixes of conductive and convective heat transfer under certain operating conditions.

Figure 14:
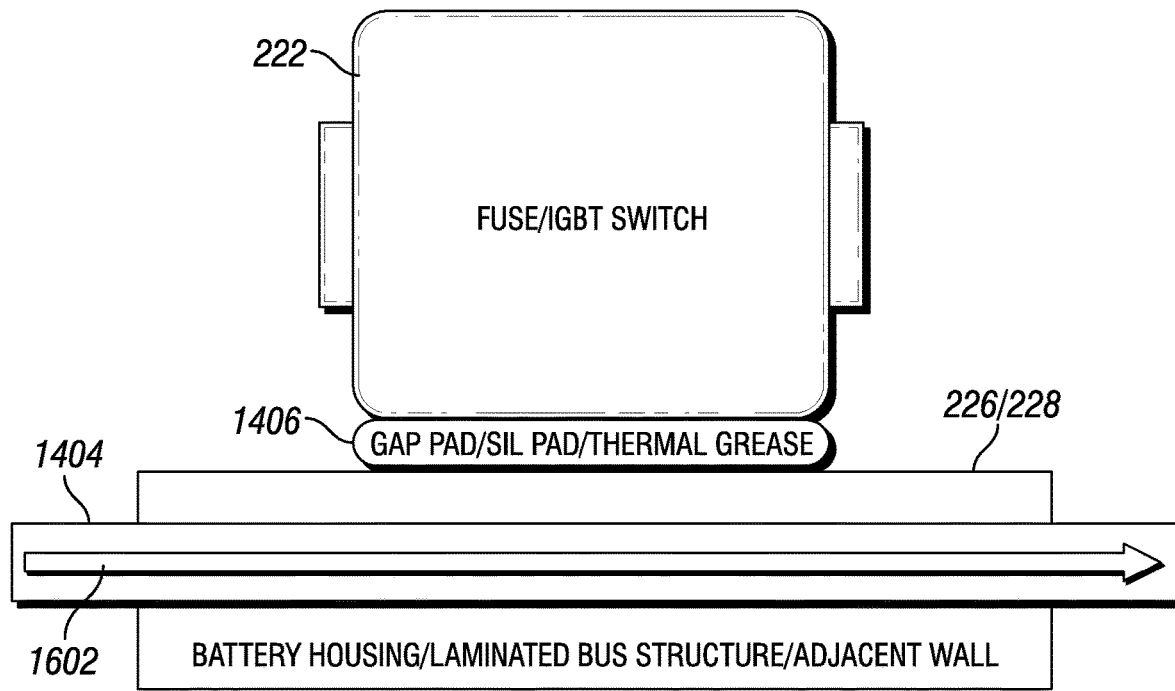
FIG. 14 depicts an embodiment configuration showing a main fuse coupled to laminated layers on a bottom side of the main fuse with features for enhanced heat flow.

Referencing FIG. 14, in addition to the features depicted in FIG. 12, a fluid flow 1602 through the interstitial space 1404 is provided, which in certain embodiments enhances the heat flow from the main fuse 222 to the laminated layers 226/228. The fluid flow 1602 may be a coolant (e.g., a vehicle, engine, battery pack, and/or transmission coolant, or other coolant source available in the system), and/or may be a dedicated coolant such as a closed system for the PDU 102 and/or power source 104. In certain embodiments, the fluid flow 1602 includes a gas (e.g., air, compressed air, etc.). In certain embodiments, coolant flow may be active (e.g., through a valve from a pressurized source, and/or pumped) or passive (e.g., configured to occur during normal operations without further control or input).

Figure 15:
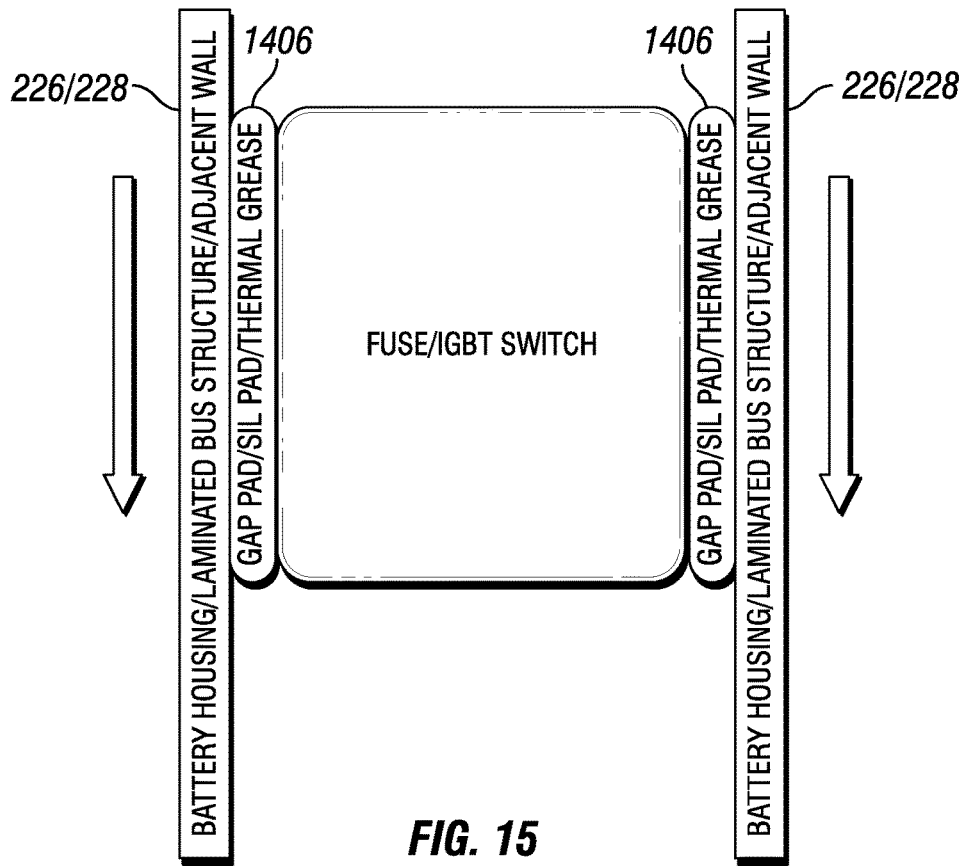
FIG. 15 depicts an alternate embodiment configuration showing a main fuse coupled to laminated layers on a bottom side of the main fuse with features for heat flow.

Referencing FIG. 15, a main fuse 222 is depicted having enhanced thermal connectivity to laminated layers 226, 228 (which may be laminated, a single layer, a housing, etc.). In the example, enhanced thermal conductivity is provided by a thermal coupling layer 1406, but may alternatively or additionally include positioning the layers 226, 228 in proximity to the main fuse 222, and/or providing another high conductivity path (e.g., a metal, etc.) to a selected location of the layer 226, 228 and/or the thermal coupling layer 1406. The embodiment of FIG. 15 provides additional heat transfer capability for the main fuse 222, similar to that depicted in FIG. 12, and the embodiments of FIGS. 12, 13, 14, and 15 may be fully or partially combined.

Figure 16:
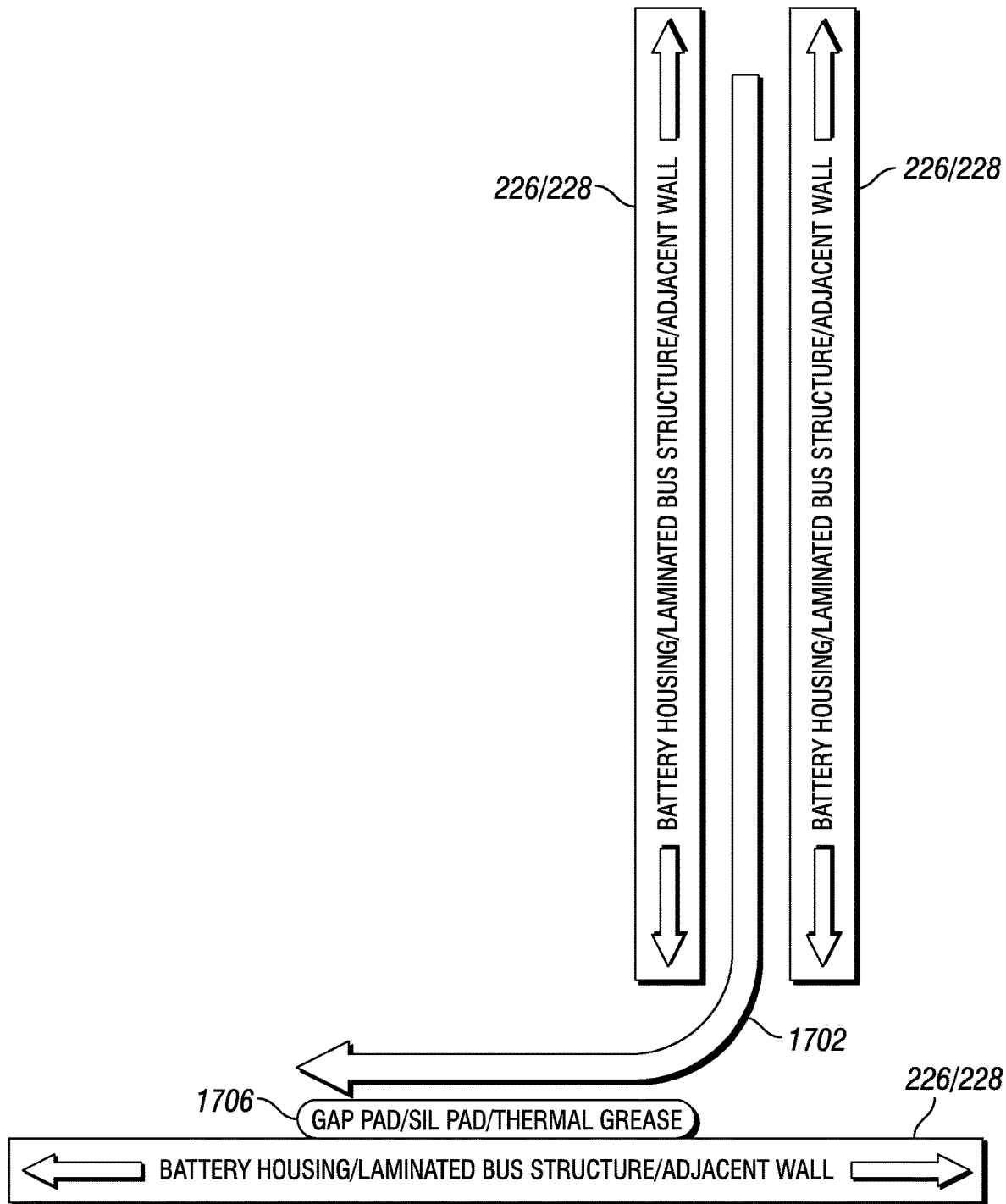
FIG. 16 depicts an alternate embodiment configuration showing a main fuse coupled to laminated layers on a bottom side of the main fuse with features for heat flow.

Referencing FIG. 16, a high conductivity thermal path 1702 to move heat out of the laminated layers 226/228 is depicted. The high conductivity thermal path 1702 may be combined with any other embodiments described throughout the present disclosure to control heat flow in a desired manner. In certain embodiments, the high conductivity thermal path 1702 is thermally coupled 1706 to another portion of the laminated layers 226, 228, to a housing, to a single layer, or to any other desired component in the PDU 102 or within thermal connectivity of the PDU 102. The portion of FIG. 16 receiving the transferred heat may additionally or alternatively be coupled to active or passive heat transfer components, include fins or other heat transfer enhancement aspects, and/or may be thermally coupled to a convective heat transfer component or fluid.

Figure 17:
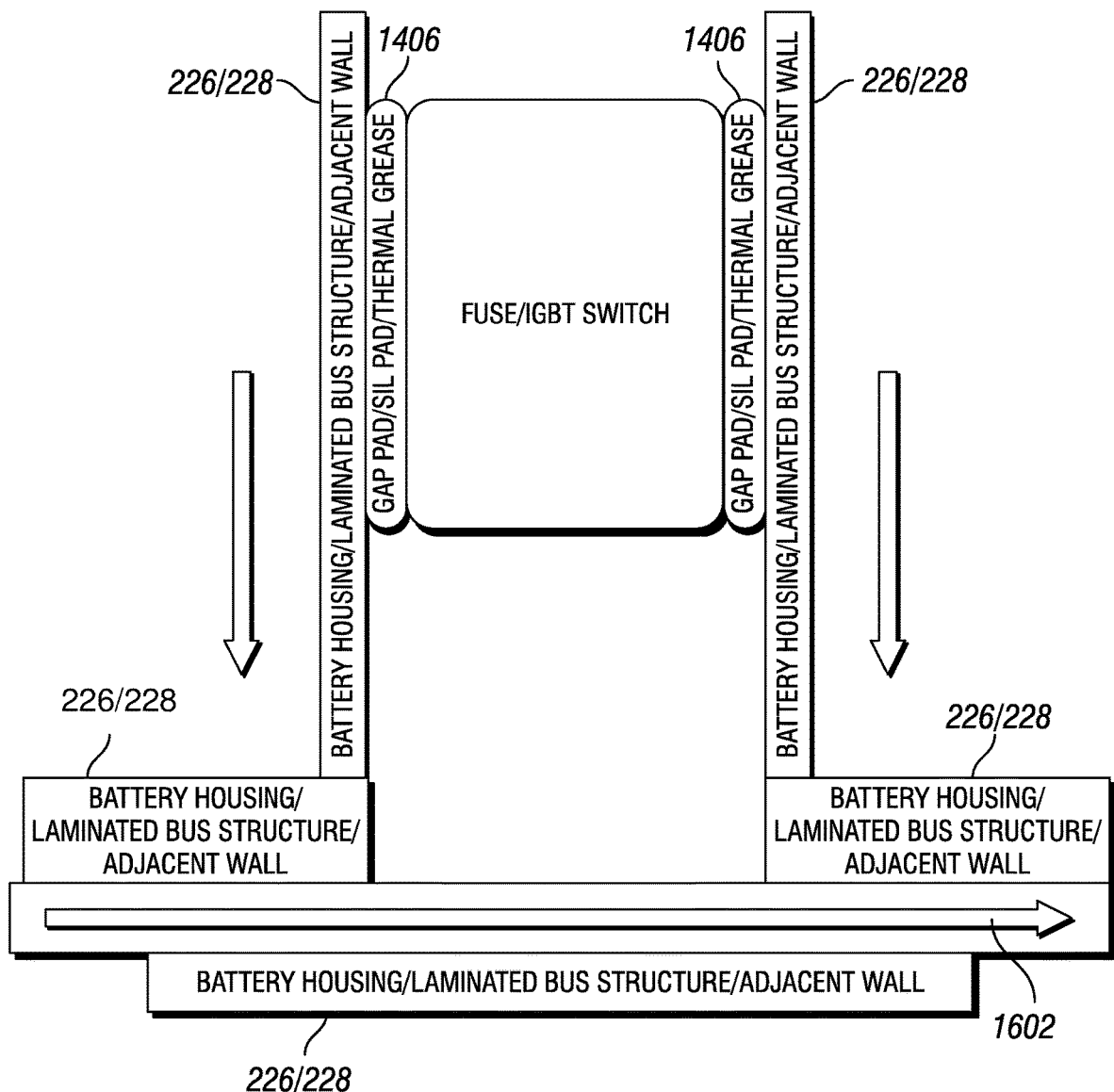
FIG. 17 depicts an alternate embodiment configuration showing a main fuse coupled to laminated layers on a bottom side of the main fuse with features for heat flow.

Referencing FIG. 17, the fluid flow 1602 is displaced from the portion of the laminated layers 226/228 in direct thermal contact to the main fuse 222. The example includes the fluid flow 1602 below the main fuse 222, and the main fuse 222 thermally coupled to the laminated layers 226/228 on the sides of the fuse, but the fluid flow 1602 may be on either side or both sides of the main fuse 222, with the main fuse 222 thermally coupled to another one of the sides and/or the bottom of the main fuse 222, and combinations of any of the foregoing. The descriptions of FIGS. 12 through 17 are described in the context of the main fuse 222, but the embodiments therein may apply to any one or more selected components of the PDU 102, including without limitation any fuse, connector, and/or controller positioned within the PDU 102.

Figure 18:
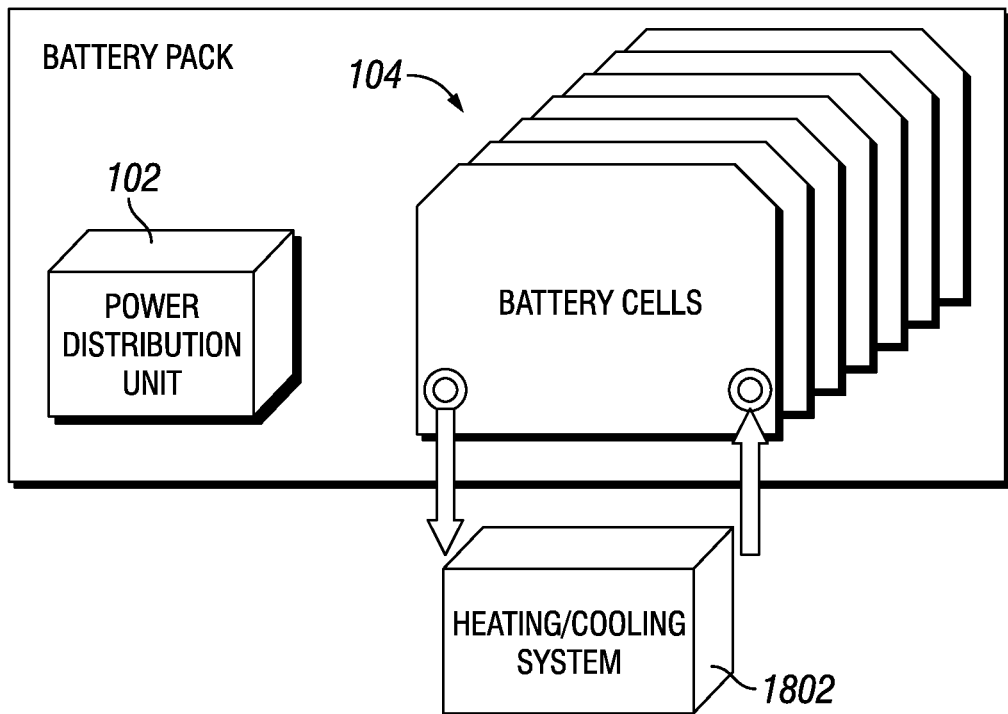
FIG. 18 shows a non-limiting example system including a PDU positioned within a battery pack housing or enclosure.
Figure 19:
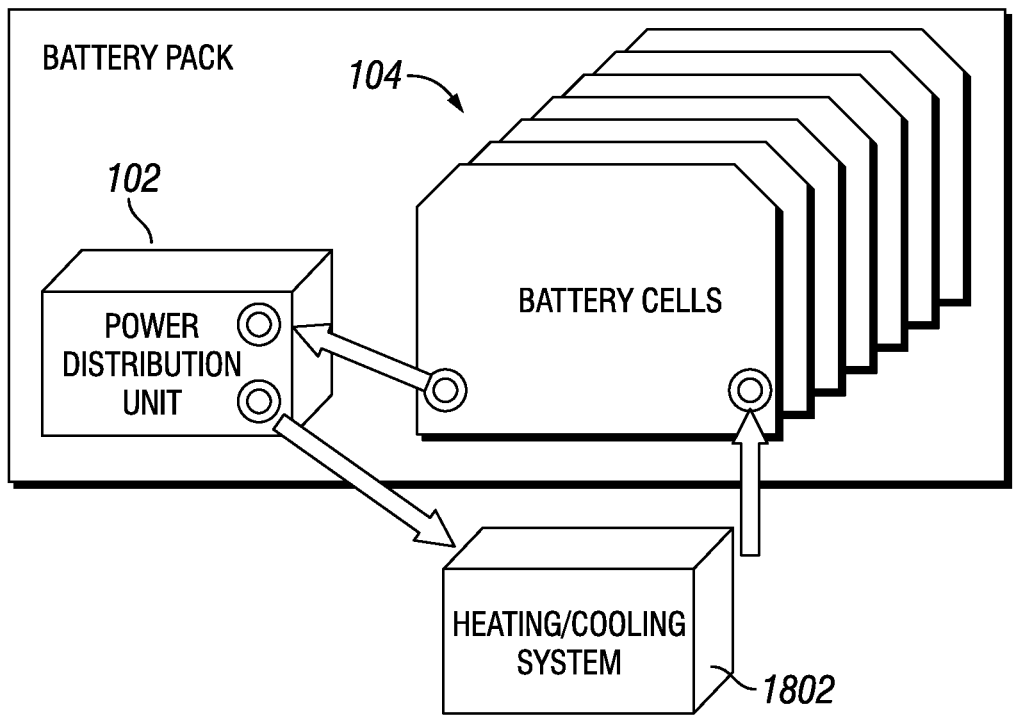
FIG. 19 shows a non-limiting example system including a PDU in a coolant loop for a heat transfer system.

Referencing FIG. 18, an example system includes the PDU 102 positioned within a battery pack housing or enclosure, where the battery cells (e.g., power source 104) are thermally coupled to a heating/cooling system 1802 present in the system. Additionally or alternatively, the PDU 102 may be thermally coupled to the battery cells 104, for example with conductive paths, at a housing interface, or the like, and/or the PDU 102 may be thermally isolated from the battery cells 104 and/or only in nominal thermal connectivity with the battery cells 104 (e.g., an arrangement where some heat transfer therebetween is expected, but without intentional design elements to increase the heat transfer between the PDU 102 and the battery cells 104). Referencing FIG. 19, an example system includes the PDU 102 in the coolant loop for the heat transfer system 1802, for example with thermal coupling aspects provided to transfer heat from the PDU 102 to the coolant loop and/or with the coolant loop including a flow branch in thermal contact with the PDU 102. The example in FIG. 19 depicts a series coolant arrangement between the battery cells 104 and the PDU 102, but any arrangement is contemplated herein including at least a parallel arrangement, a series arrangement with the PDU 102 contacted first, and/or mixed arrangements (e.g., portions of one of the battery cells 104 and the PDU 102 contacted, then all or a portion of the other, etc.).

An example procedure includes an operation to provide active and/or passive cooling to a temperature sensitive component on a PDU 102. The example procedure further includes cooling the temperature sensitive component sufficiently to extend a life of the component to a designed service life, to a predetermined maintenance interval, to a life and/or predetermined maintenance interval of the PDU 102 and/or a battery pack, and/or to reduce a temperature of a fuse to avoid thermal/mechanical damage to the fuse, a "nuisance fault" of the fuse (e.g., a failure of the fuse not occurring due to a designed protective mechanism of the fuse, such as over-current operation).

In certain embodiments, fuse design imposes complications on system—for example a fuse threshold may be desired for the fuse to engage between about 135% up to 300% of the system overcurrent threshold value. However, a fuse on the smaller end of the scale may fail due to thermal and/or mechanical fatigue over the life of the system, causing a "nuisance failure" or a fuse failure that is not due to the protective function of the fuse. Such failures cause high costs, down-time, degraded perception of the product embodying the system, potentially dangerous situations or stranding due to power loss, and the like. Designing a larger fuse to avoid nuisance failures can impose the external system to increased risk of an overcurrent event, and/or significant costs to upgrade the rest of the power system. Additionally, design of a system for multiple maximum power availabilities (e.g., one power system for two different power ratings) requires that the fuse plan be altered or designed to accommodate multiple systems. In certain embodiments, the same hardware may be utilized for different power ratings, and/or changed after the system is in operation, providing for an off-nominal fuse sizing for at least one of the multiple power ratings.

Figure 20:
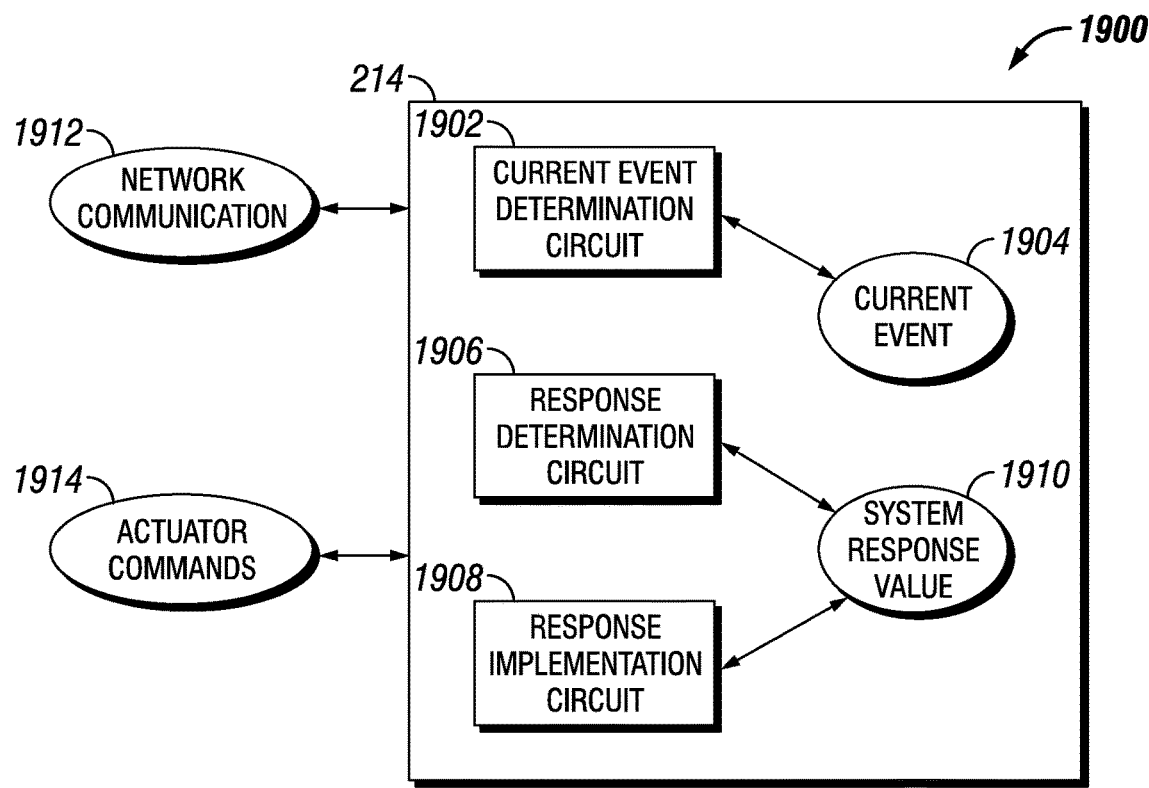
FIG. 20 shows a non-limiting example apparatus for providing additional protection against fuse nuisance faults and system failures.

Referencing FIG. 20, an example apparatus 1900 for providing additional protection against fuse nuisance faults and system failures is described. The example apparatus 1900, for example implemented on the controller 214, includes a current event determination circuit 1902 that determines a current event 1904 is active or predicted to occur, where the current event includes a component experiencing (or about to experience) a wear event—such as a current value that will cause thermal and/or mechanical stress on the component but may not cause an immediate failure or observable damage. An example component includes the fuse, but may be any other component in the system including a battery cell, a switch or connector, a motor, etc. Another example current event includes a system failure value—for example a current value that will possibly or is expected to cause a system failure (e.g., a cable failure, connector failure, etc.).

The apparatus 1900 further includes a response determination circuit 1906 that determines a system response value 1910 to the current event 1904. Example and non-limiting responses include notifying an operator to reduce power, reducing power, notifying a system controller that a current event 1904 is present or imminent, opening a contactor on the circuit related to the event, delaying circuit protection, monitoring the event and a cause for response delay and responding at a later time, and/or scheduling a response according to an operating condition in the system. The apparatus 1900 further includes a response implementation circuit 1908, where the response implementation circuit 1908 determines communications and/or actuator responses according to the system response value 1910, and provides network communications 1912 and/or actuator commands 1914 to implement the system response value 1910. Example and non-limiting actuator responses include operating a contactor, operating an active coolant actuator to modulate thermal conduction away from the fuse, or the like.

Figure 21:
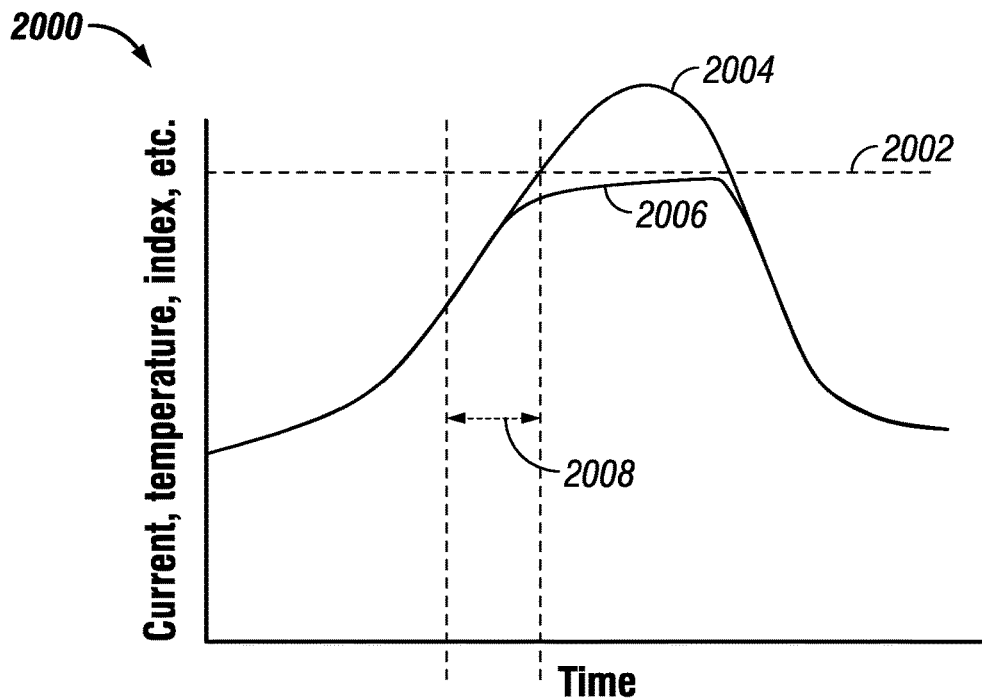
FIG. 21 depicts an embodiment illustrative data for implementing a system response value.

Referencing FIG. 21, illustrative data 2000 for implementing a system response value 1910 is depicted. The illustrative data 2000 includes a threshold value 2002—for example a current, temperature, index parameter, or other value at which component wear and/or system failure is expected to occur, and utilized as a threshold by the current event determination circuit 1902—at least under certain operating conditions at a point in time for the system. It is understood that the current event determination circuit 1902 may utilize multiple thresholds, and/or dynamic thresholds, as described throughout the present disclosure. The curve 2004 represents the nominal system performance, for example the current, temperature, index parameter, or the like that will be experienced by the system in the absence of operations of the apparatus 1900. In the example, the response determination circuit 1906 determines that the threshold value 2002 will be crossed, and accounts for a contactor disconnection time 2008 (and/or an active coolant loop response time), commanding the contactor and/or increasing thermal conduction away from the fuse, in time to avoid crossing the threshold value 2002. The illustrative data 2000 depicts a resulting system response curve 2006, wherein the resulting system performance is kept below the threshold value 2002. The system may experience alternative response trajectories (e.g., the resulting system response curve 2006 may fall well below the threshold value 2002 depending upon the dynamics of the system, how long the contactor is kept open, etc.). Additionally or alternatively, the response determination circuit 1906 may nevertheless allow the threshold value 2002 to be crossed, for example according to any operations or determinations described throughout the present disclosure. In certain embodiments, the response determination circuit 1906 allows the threshold value 2002 to be crossed, but results in a lower peak value of the response, and/or a lower area under the response curve that is above the threshold value 2002, than would occur without the operations of the response determination circuit 1906.

An example procedure, which may be performed by an apparatus such as apparatus 1900, includes an operation to determine that a current event (or other response event) is exceeding or predicted to exceed a wear threshold value, and/or determining that the current event is exceeding or predicted to exceed a system failure value. In response to determining the current event is exceeding or predicted to exceed either value, the procedure includes an operation to perform a mitigating action. The component for the wear threshold value may be a fuse (e.g., the fuse is experiencing or expected to experience a current event that will cause mechanical stress, thermal stress, or high usage of the fuse life), a component in the system (e.g., a contactor, a cable, a switch, a battery cell, etc.), and/or a defined threshold value that is nominally determined (e.g., calibration for a value that is expected to be relevant to possible component damage, without being necessarily tied to a specific component). In certain embodiments, the wear threshold value and/or the system failure value are compensated for the age or wear state of the system or a component in the system (e.g., thresholds are reduced, and/or responses are increased, as the system ages).

Non-limiting mitigating actions, which may be system response values 1910, include, without limitation: 1) disconnecting a circuit having the wear component (e.g., the fuse, system component, and/or the specific power line experiencing the event); 2) notifying an operator to reduce a power request; 3) notifying a vehicle or powertrain controller of the current event; 4) adjusting or limiting available power to the operator, 5) delaying circuit protection (disconnection and/or power reduction) in response to circumstances (e.g., in traffic, moving vehicle, application type, notification from an operator that continued operation is required, etc.)—including allowing a component in the system to experience the underlying wear event and/or failure event; 6) continued monitoring and disconnecting the circuit (or reducing power, etc.) if the event persists and if later conditions allow; 7) scheduling the response according to an operating mode of the system (e.g., sport, economy, emergency, fleet operator (and/or policy), owner/operator (and/or policy), geographic policy, and/or regulatory policy); and/or 8) bypassing the wear component (e.g., bypassing current around a fuse as a response action).

In certain embodiments, the operation to determine that the current event is exceeding the wear threshold value and/or the system failure value is based upon a calculation such as: 1) determining the current through the circuit exceeds a threshold value (e.g., an amp value); 2) determining a rate of change of the current through the circuit exceeds a threshold value (e.g., an amp/second value); and/or 3) determining that an index parameter exceeds a threshold value (e.g., the index including accumulated amp-seconds; amp/sec-seconds; a counting index for periods above a threshold value or more than one threshold value; a counting index weighted by the instantaneous current value; an integrated current, heat transfer, and/or power value; and/or counting down or resetting these based on current operating conditions).

In certain embodiments, the operation to determine that the current event is exceeding the wear threshold value and/or the system failure value includes or is adjusted based upon one or more of: 1) a trip curve (e.g., a power-time or current-time trajectory, and/or an operating curve on a data set or table such as that represented in FIG. 3); 2) a fuse temperature model, including a first or second derivative of the temperature, and one or more temperature thresholds for scheduled and/or escalating response; 3) a measured battery voltage (e.g., current values may be higher as battery voltage lowers, and/or dynamic response of current may change causing changes for the wear threshold value, system failure value, and/or current event determination); 4) a first derivative of current, temperature, power demand, and/or an index parameter, 5) a second derivative of current, temperature, power demand, and/or an index parameter, 6) information from a battery management system (e.g., voltage, current, state of charge, state of health, rate of change of any of these, which parameters may affect current values, expected current values, and/or dynamic response of current values, causing changes for the wear threshold value, system failure value, and/or current event determination); 7) determination of and monitoring of contactor disconnect times, and accounting for the contactor disconnect time in determining the response to the current event; 8) utilizing ancillary system information and adjusting the response (e.g., a power request from operations that is expected to create an upcoming change, a supplemental restraint system active/deploying—open contactors (cut power); collision avoidance system active—keep contactors closed for maximum system control; and/or an anti-lock brake system and/or traction control system active—keep contactors closed for maximum system control). In certain embodiments, a degree of activation may also be considered, and/or system status may be communicated to the PDU—for example the system may report critical operation requiring power as long as possible, or shut-down operations requiring power to be cut as soon as possible, etc.

Figure 22:
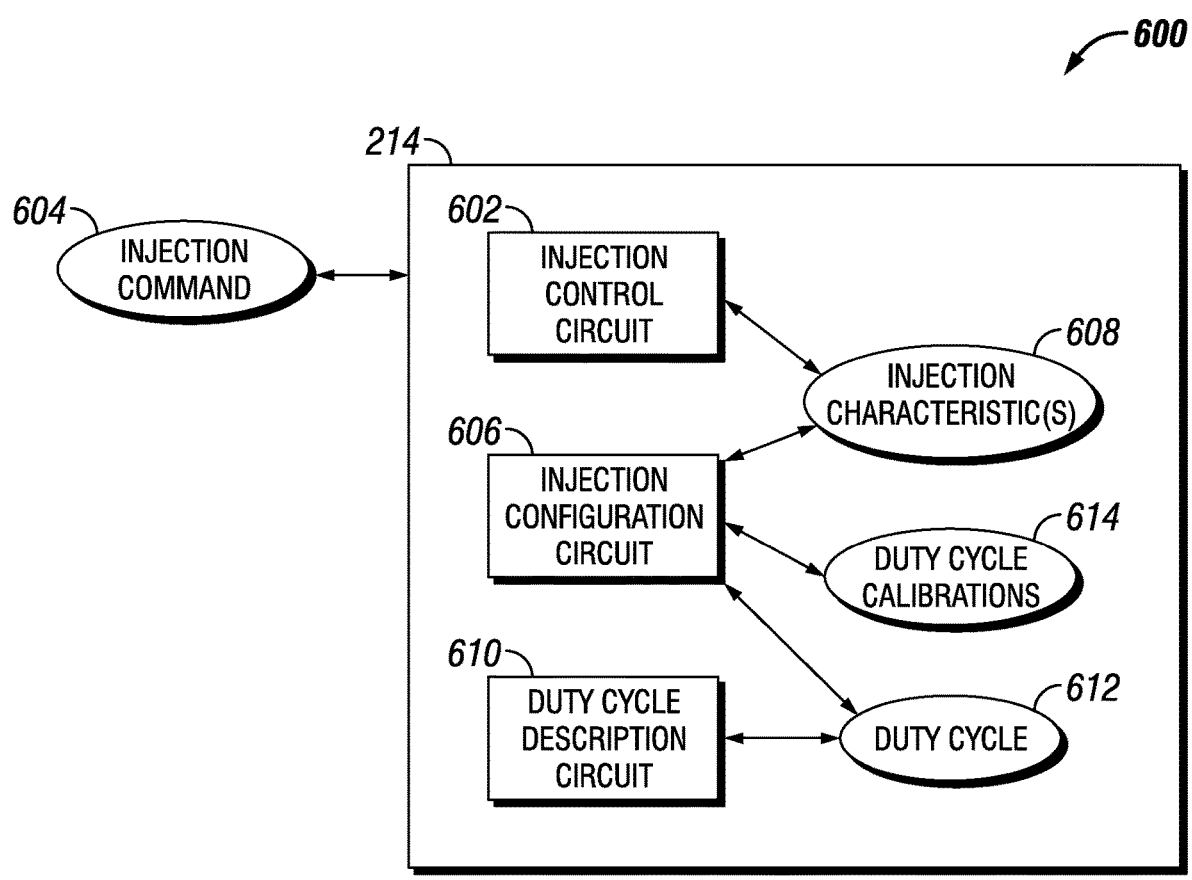
FIG. 22 depicts a non-limiting example apparatus to measure current through a fuse utilizing active current injection.

Referencing FIG. 22, an example apparatus 600 to measure current through a fuse utilizing active current injection is schematically depicted. The apparatus 600 includes the controller 214 having a number of circuits configured to functionally execute operations of the controller 214. The controller 214 includes an injection control circuit 602 that provides an injection command 604, where the current source 220 is responsive to the injection command 604. The controller 214 further includes an injection configuration circuit 606 that selects a frequency, amplitude, and/or waveform characteristic (injection characteristic 608) for the injection command 604. The controller 214 further includes a duty cycle description circuit 610 that determines a duty cycle 612 for a system including the controller 214, where the duty cycle includes a description of currents and voltages experienced by the fuse. In certain embodiments, the duty cycle description circuit 612 further updates the duty cycle 612, for example by observing the duty cycle over time, over a number of trips, over a number of operating hours, and/or over a number of miles traveled. In certain embodiments, the duty cycle description circuit 612 provides the duty cycle as an aggregated duty cycle, such as a filtered duty cycle, averaged duty cycle, weighted average duty cycle, bucketed duty cycle with a quantitative description of a number of operating regions, or the like, and selects or mixes a calibration from a number of calibrations 614, each calibration corresponding to a defined duty cycle.

An example procedure to determine fuse current throughput is described following. In certain embodiments, one or more aspects of the procedure may be performed by an apparatus 600. The procedure includes an operation to inject a current having a selected frequency, amplitude, and/or waveform characteristic into the circuit through the fuse, and to estimate the fuse resistance (including dynamic resistance and/or impedance) in response to the measured injected AC voltages and the injected current. In certain embodiments, the selected frequency, amplitude, and/or waveform characteristic is selected to provide for an acceptable, improved, or optimized measurement of the fuse resistance. For example, the base power current through the fuse to support operations of the application have a certain amplitude and frequency characteristic (where frequency includes both the power frequency if AC, and the long term variability of the amplitude if AC or DC). The injected current may have a selected frequency and/or amplitude to allow for acceptable detection of the fuse resistance in view of the base power current characteristics, and also selected to avoid interference with the operations of the application. For example, if the base power current is high, a higher amplitude of the injection current may be indicated, both to support measurement of the injected AC voltage, and because the base power current will allow for a higher injected current without interfering with the operations of the system. In another example, a frequency may be selected that is faster than current variability due to operations, that does not impinge upon a resonant frequency or harmonic frequency of a component in the system, or the like.

An example procedure includes storing a number of calibration values corresponding to various duty cycles of the system (e.g., current-voltage trajectories experienced by the system, bucketed time windows of current-voltage values, etc.), determining the duty cycle of the system, and selecting a calibration value from the calibration values in response to the determined duty cycle. The calibration values correspond to the current injection settings for the current injection source, and/or to filter values for digital filters to measure the fuse voltage and/or fuse current values. In certain embodiments, the duty cycle can be tracked during operations, and updated in real-time or at shutdown. In certain embodiments, an aggregated duty cycle description is stored, which is updated by data as observed. An example aggregated duty cycle includes a moving average of the duty cycle observed (e.g., a duty cycle defined as a trip, power on to power off cycle, operating time period, and/or distance traveled), a filtered average of the duty cycle (e.g., with selected filter constants to provide the desired response to a change—for example to respond within one trip, five trips, 30 trips, one day, one week, one month, etc.). In certain embodiments, the duty cycle updates occur with a weighted average (e.g., longer trips, higher confidence determinations, and/or operator selections or inputs may be weighted more heavily in determining the duty cycle).

A response indicates the period until the system is acting substantially based upon the changed duty cycle information, for example where calibration A is for a first duty cycle and calibration B is for the changed duty cycle, the system may be deemed to have responded to the change when 60% of calibration B is utilized, 90% of calibration B is utilized, 96% of calibration B is utilized, and/or when the system has switched over to calibration B. The utilization of multiple calibrations may be continuous or discrete, and certain aspects of the calibrations individually may be continuous or discrete. For example, where calibration A is selected, a particular amplitude (or trajectory of amplitudes), frequency (or trajectory of frequencies), and/or waveform (or number of waveforms) may be utilized, and where calibration B is selected, a different set of amplitudes, frequencies, and/or waveforms may be utilized. Where a duty cycle is positioned between A and B, and/or where the duty cycle response is moving between A and B, the system can utilize mixtures of the A and B duty cycles, and/or switch between the A and B duty cycles. In a further example, the switching between the A and B duty cycles can occur in a mixed fashion—for example where the current response is at 80% of B, then calibration B may be utilized 80% of the time and calibration A may be utilized 20% of the time. In certain embodiments, the calibration may be switched abruptly at a certain threshold (e.g., at 70% response toward the new calibration), which may include hysteresis (e.g., switch to calibration B at 80% of the distance between calibration A and B, but switch back only when at 40% of the distance between calibration A and B). In certain embodiments, certain aspects (e.g., the amplitude) may move continuously between calibrations, where other aspects (e.g., the waveform) utilize only one calibration or the other. In certain embodiments, indicators of quality feedback may be utilized to adjust the calibration response (e.g., where, during movement toward calibration B, the indicated fuse resistance appears to be determined with greater certainty, the system moves the response toward calibration B more quickly than otherwise, which may include utilizing more of calibration B than indicated by the current aggregated duty cycle, and/or adjusting the aggregated duty cycle to reflect a greater confidence that the duty cycle is going to be maintained).

Example amplitude selections include both the peak amplitude of the injected current, the adjustment from the baseline (e.g., higher increase than decrease, or the reverse), and/or the shape of amplitude generation (e.g., which may be in addition to or incorporated within the waveform selection). Additionally or alternatively, the amplitude for a given calibration may be adjusted throughout a particular current injection event—for example to provide observations at a number of amplitudes within the current injection event. Example frequency selections include adjusting the frequency of the periods of the current injection events, and may further include testing at a number of discrete frequencies, sweeping the frequencies through one or more selected ranges, and combinations of these. Example waveform selections include waveform selections to induce desired responses, to be more robust to system noise (e.g., variability in the base current, inductance and/or capacitance of components in the system, or the like), to enhance the ability of the current injection detection to isolate the injected current from the load current, and/or may include utilization of multiple waveforms in a given calibration to provide a number of different tests. In certain embodiments, where multiple amplitudes, frequencies, and/or waveforms are utilized, the injected AC voltage (and corresponding fuse resistance) can be determined by averaging measured parameters, by using higher confidence measurements, and/or by eliminating outlying measurements from the injected AC voltage determination.

According to the present description, operations to provide a high confidence determination of a fuse resistance value in a PDU 102 are described. In certain embodiments, the high confidence determination of the fuse resistance can be utilized to determine the fuse condition, to provide a high accuracy or high precision determination of current through the fuse and of power consumption by the system 100, and/or to perform system diagnostics, fault management, circuit management, or the like.

Figure 23:
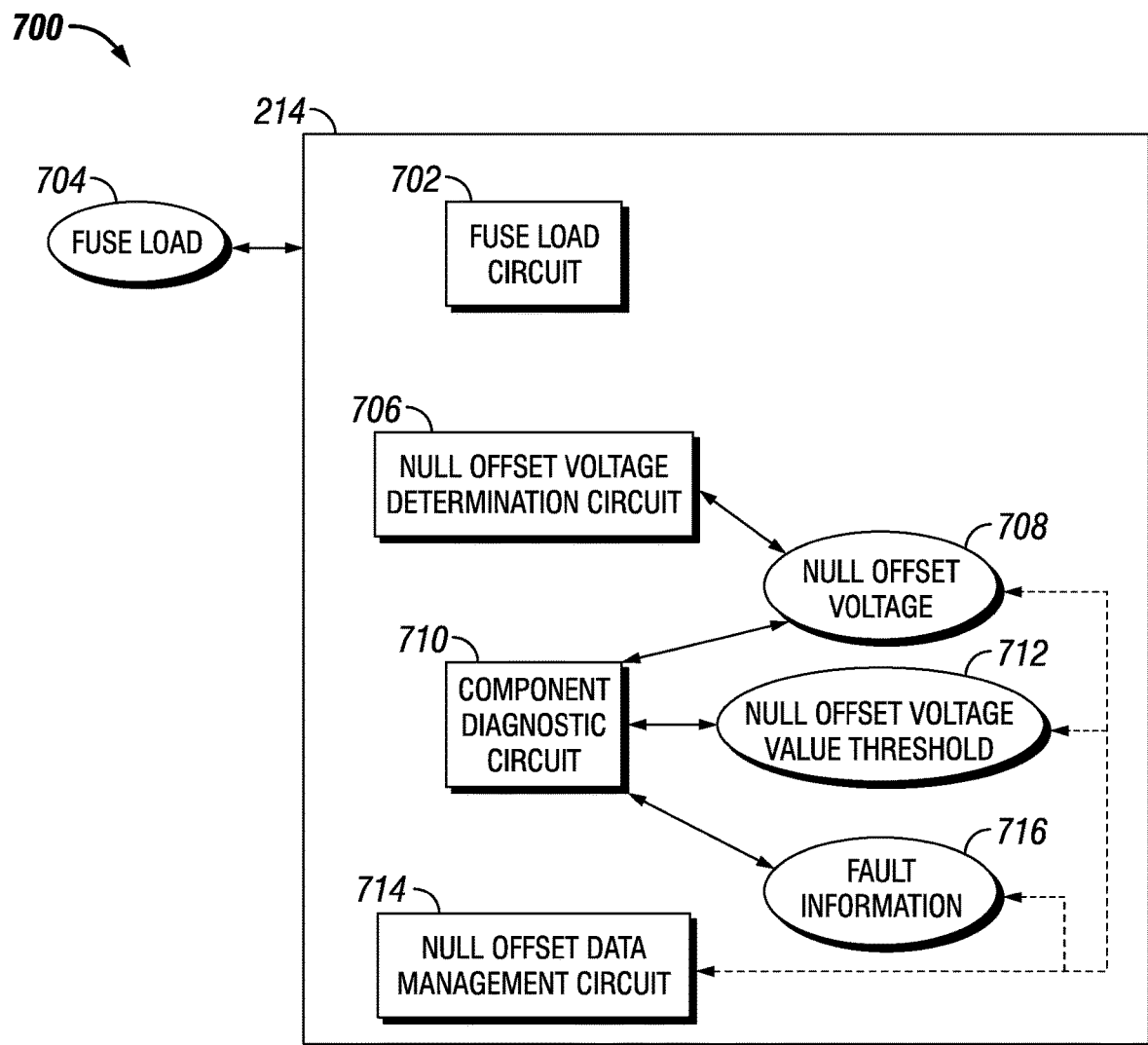
FIG. 23 depicts a non-limiting example apparatus to determine a null offset voltage and/or diagnose a system component.

Referencing FIG. 23, an example apparatus 700 to determine a null offset voltage and/or diagnose a system component are schematically depicted. The example apparatus 700 includes a controller 214 having a fuse load circuit 702 that determines that no current is demanded for a fuse load 704. The example apparatus 700 further includes a null offset voltage determination circuit 706 that determines a null offset voltage 708 in response to the fuse load 704 indicating that no current is demanded. The example apparatus 700 further includes a component diagnostic circuit 710 that determines whether a component is degraded, failed, and/or in a fault or off-nominal condition in response to the null offset voltage 708, and determines fault information 716 in response to the determining whether a component is degraded, failed, and/or in a fault or off-nominal condition (e.g., fault counters, fault values, and/or component-specific information). Operations of the component diagnostic circuit 710 include comparing the null offset nominal voltage 708 to a null offset voltage threshold value 712, and/or performing operations to determine which component is causing an off-nominal null offset voltage 708. The example apparatus 700 further includes a null offset data management circuit 714 that stores the null offset voltage 708, and/or any diagnostic or fault information 706 such as fault counters, fault values, and/or indications of which component is causing the off-nominal null offset voltage 708. In certain embodiments, where contributions to the null offset voltage 708 are determined separately for certain components, an example null offset data management circuit 714 stores individual contributions of the null offset voltage 708 separately. In certain embodiments, the utilization of the null offset voltage 708 improves the accuracy of determining the fuse resistance from the injected current.

An example procedure to determine null offset voltage for a fuse current measurement system is described following. The example procedure may be performed by a system component such as an apparatus 700. Null offset voltages occur in a controller 214 due to individual offsets of op-amps and other solid state components in the controller 214, as well as due to part-to-part variations, temperature drift, and degradation of one or more components in the system over time. The presence of a null offset voltage limits the accuracy with which current measurement through a fuse is available, and can thereby limit the types of controls and diagnostics that can be performed in the system.

An example procedure includes an operation to determine that no current is demanded for a fuse load. Example operations to determine that no current is demanded for a fuse load include a recent key-on or key-off event for a vehicle (e.g., the vehicle is starting, powering down, is in an accessory position, and/or has not yet engaged power to the fuse of interest), observation of the fuse circuit, and/or by a status observation provided by another controller in the system (e.g., a powertrain controller is explicitly indicating that no power is being provided, is indicating a status inconsistent with power being provided, etc.). An example operation determines that no current is demanded for a fuse during a key-off event, and/or within a time period after a key-on event.

The example procedure further includes an operation to determine the null offset voltage in response to determining that no current is demanded for the fuse load, and an operation to store the null offset voltage. In certain embodiments, the stored null offset voltage is stored in non-volatile memory, for example to be utilized in a subsequent operation of the system. In certain embodiments, the null offset voltage is stored in a volatile memory and utilized for a current operation cycle. The stored null offset voltage may be replaced when a new value is determined for the null offset voltage, and/or updated in a scheduled manner (e.g., by averaging in or filtering in updated values, by holding new values for subsequent confirmation before being applied, etc.).

An example procedure further includes diagnosing a component of the system in response to the null offset voltage. For example, as the null offset voltage increases over time, a degradation of the controller 214 may be indicated, and a fault (visible or service available) may be provided to indicate that the controller 214 is operating off-nominally or failed. Additionally or alternatively, a contactor (e.g., the main contactor 216) may be diagnosed in response to the null offset voltage. In certain embodiments, further operations such as engaging another contactor in-line with the diagnosed contactor may be utilized to confirm which component of the system is degraded or failed. In certain embodiments, the controller 214 may cut power to one or more components within the controller 214 to confirm that the controller 214 components are causing the offset voltage. In certain embodiments, the procedure includes determining the individual contributions of components to the offset voltage—for example by separating the controller 214 contribution and the contactor contribution. In response to the offset voltage being above a threshold value and/or confirming which component of the system is causing the off-nominal offset voltage, the controller 214 may increment a fault value, set a fault value, and/or set a service or diagnostic value. In certain embodiments, the null offset voltage and/or any fault values may be made available to the system, to a network, and/or communicated to another controller on the network.

According to the present description, operations to provide a nominal offset voltage for high confidence determination of a fuse current and a fuse resistance value in a PDU 102 are described. In certain embodiments, the high confidence determination of the fuse resistance can be utilized to determine the fuse condition, to provide a high accuracy or high precision determination of current through the fuse and of power consumption by the system 100, and/or to perform system diagnostics, fault management, circuit management, or the like.

Figure 24:
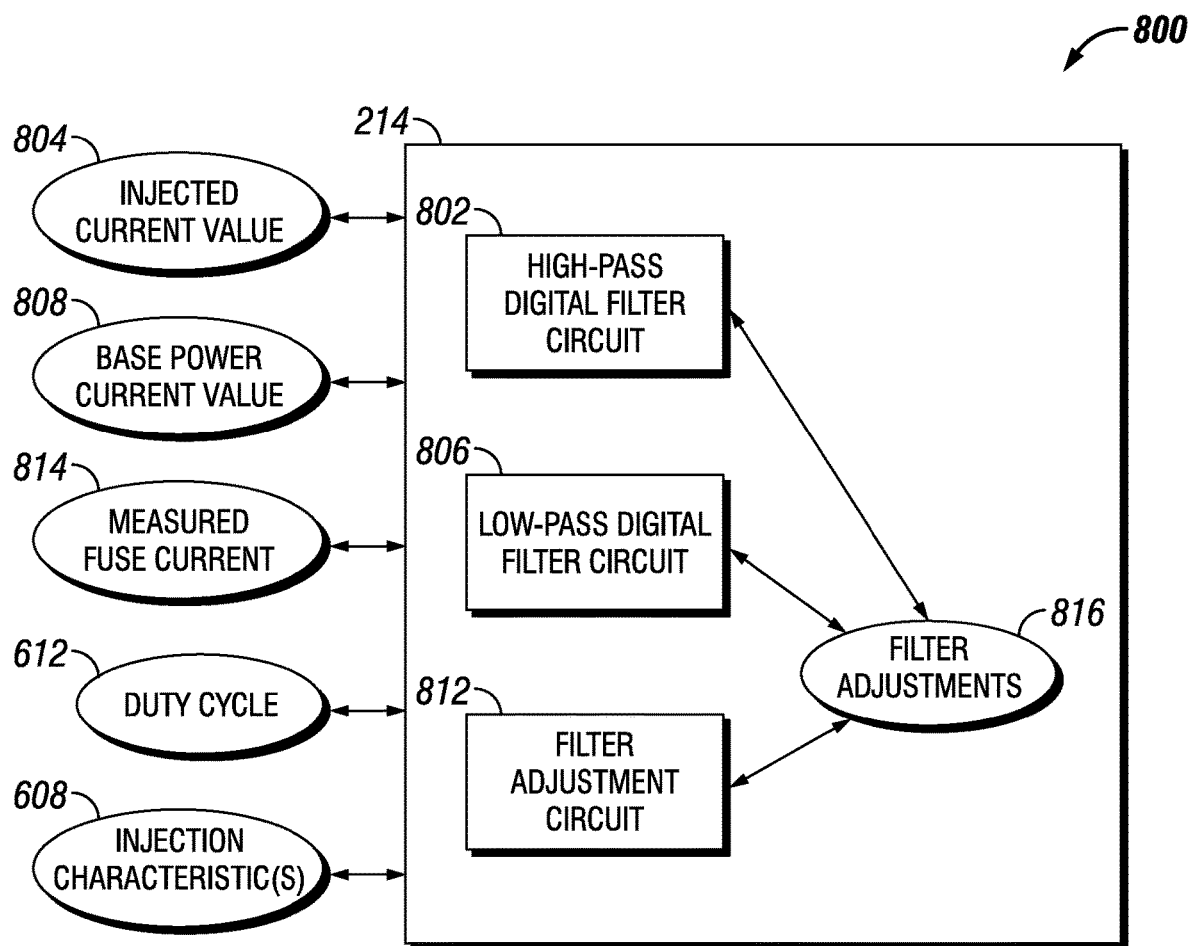
FIG. 24 depicts a non-limiting example apparatus to provide for digital filtering of a current measurement through a fuse circuit.

Referencing FIG. 24, an example apparatus 800 to provide for digital filtering of a current measurement through a fuse circuit is depicted schematically. In certain embodiments, where current is injected through a fuse, the measurement of the base power current and the injected AC current through the fuse are de-coupled utilizing a low-pass filter (pulling out the base power signal) and a high-pass filter (pulling out the injected current signal). Previously known systems utilize an analog filter system—for example constructed of capacitors, resistors, and/or inductive devices, that provide the selected filtering of the signal and thereby provide the separated base power signal and injected current signal. However, analog filter systems suffer from a number of drawbacks. First, analog systems are not configurable, are only configurable to a discrete number of pre-considered options, and/or are expensive to implement. Accordingly, a wide range of base power signals and injected AC current signals are not typically available for high accuracy determination of the fuse current with an analog filter system. Additionally, analog filter systems suffer from phase variance between the low-pass filter and the high-pass filter, and/or between the filtered output and the injected current signal. Accordingly, post-processing and/or acceptance of a less accurate signal are required, and accuracy is diminished on the measured current even with post-processing. Further, if the system has a component that has a base frequency or harmonic that interferes with the filter, the analog filter is not able to respond and will not provide reliable measurements. Because the frequency dynamics of the system can change over time, for example as components degrade, are service or replaced, and/or due to environmental or duty-cycle driven changes, even careful system design cannot fully resolve the inability of analog filters to respond to interference from frequency dynamics in the system. The example apparatus 800 includes a high-pass digital filter circuit 802 that determines the injected current value 804 for the fuse circuit by providing a high-pass filter operation on a measured fuse current 814, and a low-pass digital filter circuit 806 that determines the base power current value 808 for the fuse circuit by providing a low-pass filter operation on the measured fuse current. The example apparatus 800 further includes a filter adjustment circuit 812 that interprets a duty cycle 612 and/or an injection characteristic 608, and adjusts the filtering for the high-pass digital filter circuit 802 and/or the injection characteristic 608—for example by providing filter adjustments 816 such as providing distinct cutoff frequencies to ensure separation of the signals, to raise or lower cutoff frequencies to ensure a descriptive energy portion of the signal is captured, and/or to manipulate the filters to avoid a frequency or a harmonic in the system. While the example embodiment of FIG. 24 utilizes a digital filter, in certain embodiments the available controller processing resources and/or time response of digital filtering may lead certain systems to utilize analog filters and/or a combination of analog filters with digital filters.

An example procedure includes an operation to provide digital filters in a PDU 102 to determine base power and injected current values from a measured current value through the fuse. The example procedure further includes an operation to determine the base power by performing a low-pass filter operation on the measured current value, and to determine the injected current value by performing a high-pass filter operation on the measured current value. The example procedure further includes an operation to adjust parameters of the low-pass filter and/or the high-pass filter in response to a duty cycle of the system including the PDU 102 (including, for example, power, voltage, and/or current values passing through the fuse), and/or in response to an injection characteristic of the injected current through the fuse. The example procedure includes adjusting the parameters to improve the separation of the base power and/or injected current values, to improve the accuracy of determining the injected current amount, to adjust to a frequency and/or a harmonic of a component in the system in electrical communication with the fuse, and/or to respond to a system or environmental noise affecting one or both of the high-pass and low-pass filters.

According to the present description, operations to implement digital filters for de-convoluting a voltage characteristic and current measurement through a fuse are provided. The digital filtering allows for the system to provide a high confidence determination of a fuse current and a fuse resistance value in a PDU 102. In certain embodiments, the high confidence determination of the fuse resistance can be utilized to determine the fuse condition, to provide a high accuracy or high precision determination of current through the fuse and of power consumption by the system 100, and/or to perform system diagnostics, fault management, circuit management, or the like.

Fuses for highly transient load applications and/or high duty cycle variability applications, such as but not limited to electrical systems for mobile applications and vehicles experience a number of challenges. Load variation can change considerably throughout operations, including experiencing both high positive and high negative current operations, and often in a short period of time (e.g., acceleration and regenerative braking cycles in stop-and-go traffic; high load operation going up a hill followed by significant regeneration down the other side, etc.). Additionally, current transients and reversals can result in significant in-rush currents that are experienced by the fuse. Fuses are designed to fail at a protective current value, which is intended to correspond to a fuse temperature value. Because they are designed to fail at a relatively close value to the maximum current demands, they are consequently one of the most delicate physical parts in the system—both electrically and physically. Sub-critical current values and current transient values can cause the fuse to suffer thermal and mechanical stresses, both from temperatures experienced and temperature transients. Fuses subject to significant sub-critical cycling can fail—either by melting even though the designed failure current has not been exceeded, or by breaking due to mechanical stress. Mobile applications, as discussed throughout the present disclosure, are subject to particularly high costs and risks when a mission critical component such as a fuse fails (e.g., the vehicle generally does not have motive power available if a main power fuse fails). Additionally, mobile applications are subject to high transient loads through the motive power system.

Figure 25:
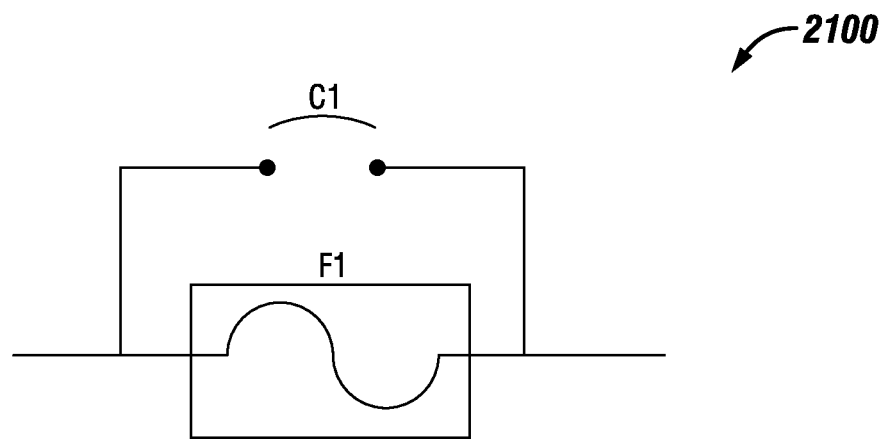
FIG. 25 depicts a non-limiting example fuse circuit that may be present on a PDU.

Referencing FIG. 25, an example fuse circuit 2100 is depicted, which may be present on a PDU 102. The example fuse circuit 2100 may be associated with a main fuse, an auxiliary fuse, and/or a group of fuses or a subset of a group of fuses. The fuse circuit 2100 includes a contactor (C1) in parallel with the fuse (F1). During normal operations the contactor is open, and the current in the fuse circuit 2100 passes through the fuse. In certain embodiments, the contactor may include physical components (e.g., a solenoid and/or coil-based switch or relay), and/or the contactor may be a solid state relay. In certain embodiments, the contactor may be normally-open (e.g., power applied closes the contactor) or normally-closed (e.g., power applied opens the contactor). The example fuse circuit 2100 allows for the contactor to selectively bypass the fuse circuit, for example in accordance with operations of an apparatus 1900 (reference FIG. 20 and the corresponding disclosure).

Figure 26:
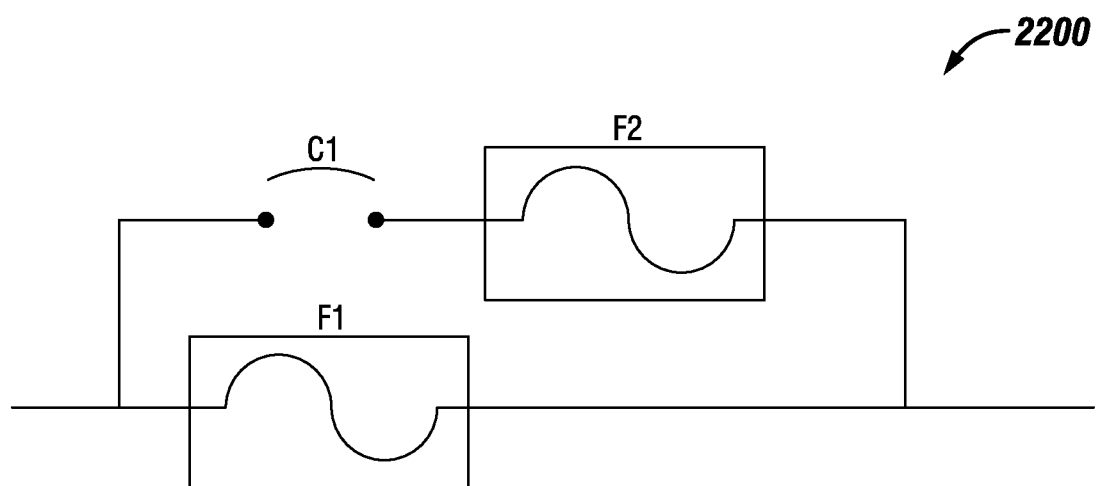
FIG. 26 depicts an embodiment of a fuse circuit with a contactor.

Referencing FIG. 26, another embodiment of a fuse circuit 2200 is disclosed, with a contactor (C1) in series with a second fuse (F2), and the C1-F2 branch in parallel with a first fuse F1. The fuse circuit 2200 provides for additional flexibility and a number of additional features for operations of an apparatus 1900. For example, normal operation may be performed with the contactor closed, dividing current between F1 and F2 (in the resistance ratios of the two fuses). An example includes a fuse F2 with a low current threshold value, set such that the divided current would fail fuse F2 if the system design current is exceeded by a designed amount (e.g., between 135% and 300% of system design current—although any value is contemplated herein). The fuse F1 may be set at a very high value, allowing for the opening of the contactor to briefly increase the fusing capacity of the circuit but still be fused. Additionally or alternatively, fuse F2 may be a relatively cheap and/or accessible fuse, and being at a lower current threshold F2 is likely to suffer greater mechanical and thermal fatigue, and act as the failure point for the fuse circuit 2200, which may greatly extend the life of the fuse F1 which may be more expensive and/or less accessible. Additionally or alternatively, normal operation may be performed with the contactor open, with fuse F1 defining the ordinary fusing of the circuit. When a high transient or other current event occurs, the contactor is closed, and the branch C1-F2 shares the current load, keeping the fuse F1 within normal or lower wear operating conditions. In certain embodiments, fuses F1 and F2 may be similarly sized—for example to allow fuse F2 to operate as a backup fuse and to keep similar failure conditions in place for F1 and F2. Alternatively, fuse F2 may be smaller than fuse F1, allowing for alternate operations as described, the intermittent use of the C1-F2 circuit to take up some current to protect fuse F1, and/or to provide back-up fusing for F1—which may be at a reduced power limit for the system if the fuse F2 is smaller (e.g., as a de-rated mode of operation, and/or a limp-home mode of operation). Alternatively, fuse F2 may be larger than fuse F1, for example to allow fuse F2 to manage very high transient current conditions where it is desired that operation still continues. The utilization of a fuse circuit 2200 allows for a high degree of control of the fusing system, to be protective of the power system during nominal operation and still provide a high degree of capability during failure modes, for off-nominal operation, and/or during transient operation. In certain embodiments, a resistor may be provided on the C1-F2 branch, for example to control the current sharing load between F1 and F2 when the contactor C1 is closed.

Figure 27:
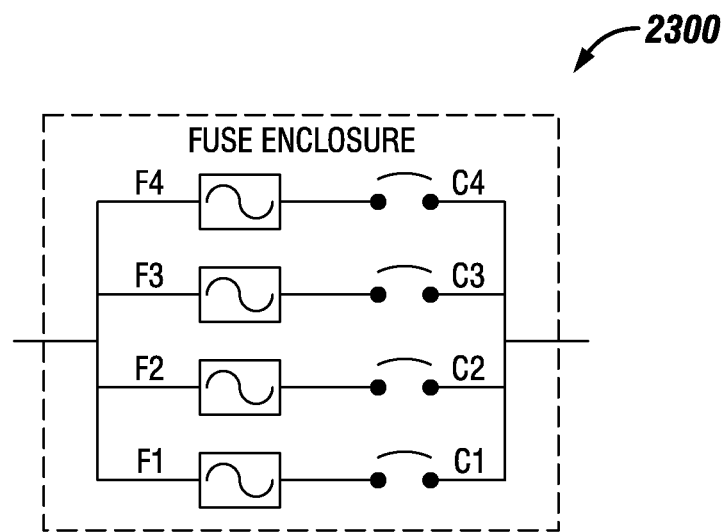
FIG. 27 depicts an embodiment fuse circuit including a plurality of fuses.

Referencing FIG. 27, a fuse circuit 2300 includes a plurality of fuses F1, F2, F3, F4 depicted in parallel, with a corresponding contactor in series with each. An example fuse circuit 2300 is for auxiliary fuses, although fuse circuit 2300 can be any fuse, including a main fuse. The example fuse circuit 2300 allows for either the removal of fuses from operation—for example where one of the fuses is experiencing a transient event—or for the addition of fuses, such as when a high transient event occurs to share the current load. In certain embodiments, one or more of the fuses in the fuse circuit 2300 does not have an associated contactor, and is a primary load bearing fuse for the fuse circuit 2300. The relative sizing of the fuses in the fuse circuit 2300 may be according to any selected values, and will depend upon the purpose of the fuse circuit 2300 (e.g., to provide a limp-home feature, to provide additional capacity, to act as a back-up, and/or to allow for the cut-off of individual fuses in the system). Additionally or alternatively, any one or more of the fuses in fuse circuit 2300 may be positioned serially with a resistor, for example to control current load balancing. In certain embodiments, the fuses F1, F2, F3, F4 are not in parallel, and/or one or more of the fuses is not in parallel. Accordingly, the opening of a contactor for such a fuse will not shunt current to another one of the fuses. An example embodiment includes the contactors for fuses individually to allow for shutting down of certain system capability (e.g., due to a failure, high transient, or the like) without shutting down all system capability (e.g., a fuse supporting braking may remain active even in a high transient event, while an accessory fuse for non-critical systems may be cut off to protect the fuse and/or the system).

Figure 28:
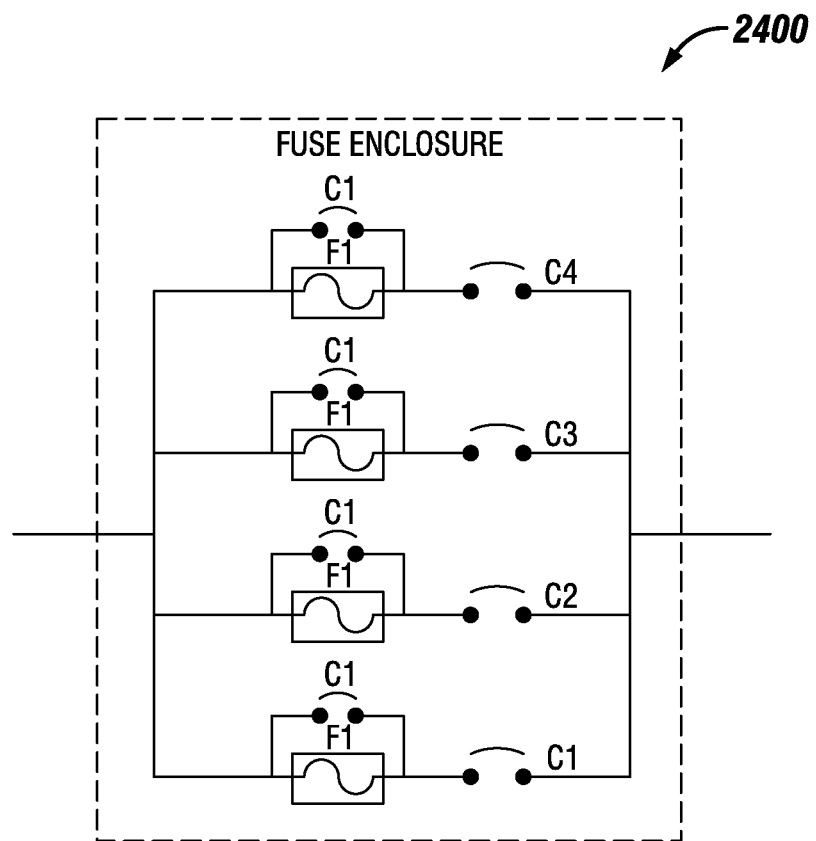
FIG. 28 depicts a fuse circuit with fuses in parallel with a contactor.

Referencing FIG. 28, a fuse circuit 2400 is depicted, similar to fuse circuit 2300, except that each fuse has a contactor in parallel, allowing for the shorting of the particular fuse while keeping current flowing on that fuse's path. In certain embodiments, the parallel path for each fuse may include an additional fuse and/or a resistor, such that when the fuses are connected in parallel, the load across each fuse circuit remains at least partially balanced. The embodiments of FIGS. 25 to 28 may be referenced as current protection circuits, and embodiments such as those depicted in FIGS. 25 to 28, and/or as described, allow for selectable configuration of the current protection circuit. Selectable configuration of the current protection circuit may include run-time operations (e.g., reconfiguring the current protection circuit in response to events or operating conditions) and/or design-time operations (e.g., allowing a same hardware device to support multiple power ratings, electrical connection configurations, and/or service event or upgrade changes).

Figure 29:
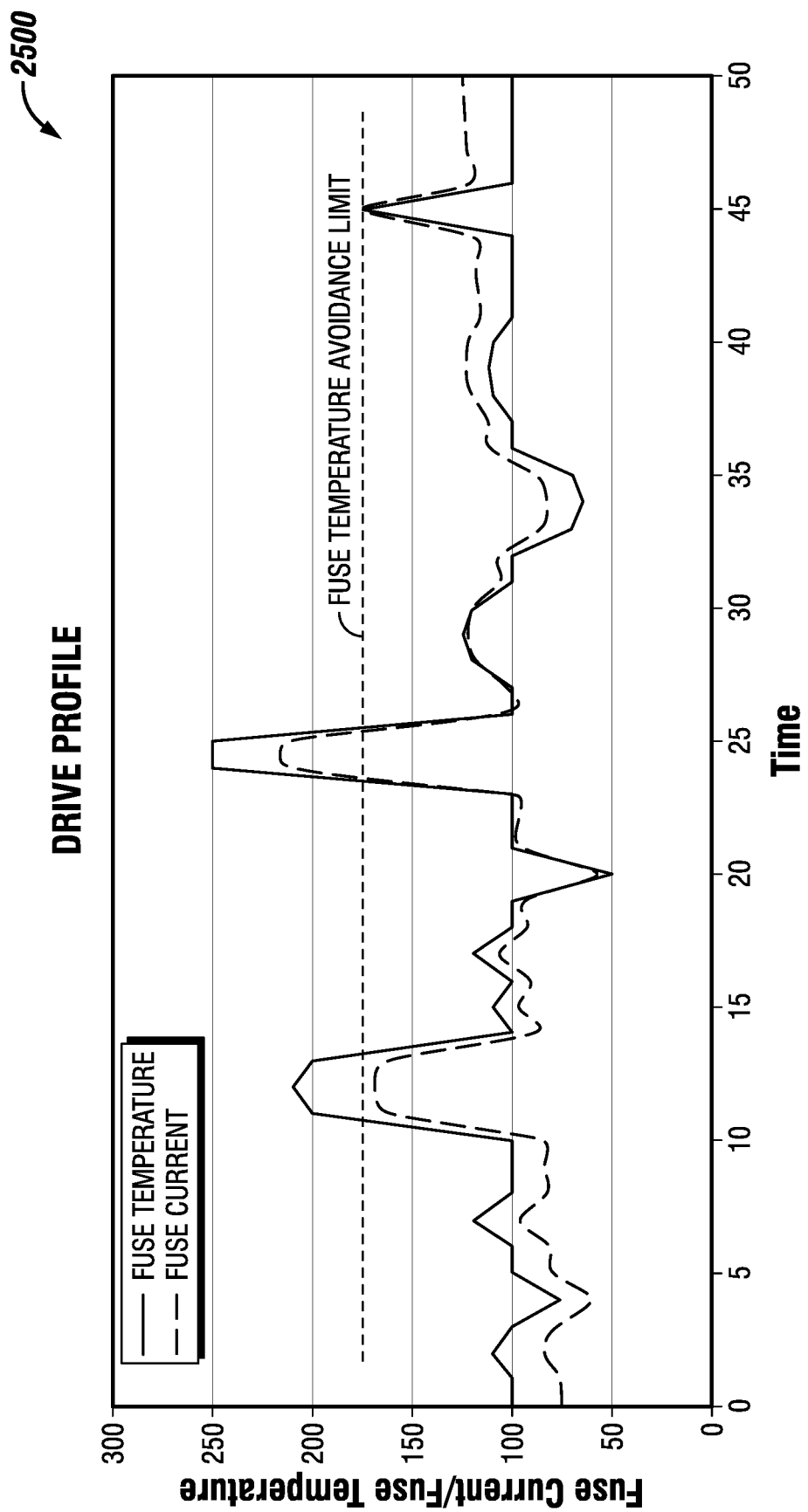
FIG. 29 depicts illustrative data showing a fuse response to a drive cycle for a vehicle.

Referencing FIG. 29, illustrative data 2500 showing a fuse response to a drive cycle for a vehicle is depicted. In the example, fuse current (e.g., the dashed line lower curve at times of 12 and 25 units) and fuse temperature (e.g., the solid line upper curve at times of 12 and 25 units) are depicted. It will be understood that another parameter describing the fuse performance and/or limits may be utilized, including at least any values described in the portion referencing FIG. 21. The operations of the drive cycle exhibit high transients where, in the example, the fuse temperature is expected to exceed the "fuse temperature avoidance limit"—for example, a temperature or temperature transient at which the fuse experiences mechanical stress. An apparatus 1900 may consider a number of thresholds for the fuse—for example a light wear threshold, a heavy wear threshold, and a potential failure threshold, which may be set at distinct values of the fuser performance indicator being utilized (e.g., temperature). In certain embodiments, more than one type of threshold value may be utilized—for example a threshold or set of thresholds for temperature, a second threshold or set of thresholds for temperature change with time (e.g., dT/dt), etc. In the example, an apparatus 1900 may take mitigating action at the transient points, for example bypassing the corresponding fuse briefly to avoid the transient and/or control the rate of transient experienced by the fuse.

Figure 30:
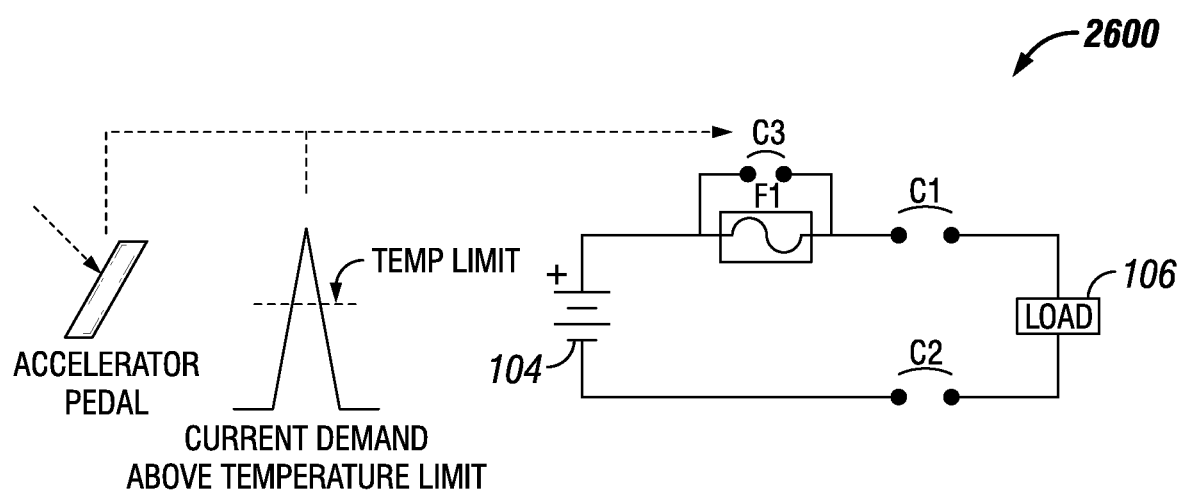
FIG. 30 depicts a non-limiting example system including a power source and s load with a fuse electrically disposed between the load and the source.

Referencing FIG. 30, an example system 2600 include the power source 104 and load 106, with a fuse (F1) electrically disposed between the load 106 and the source 104. An operator provides a power request (accelerator pedal input), and an apparatus 1900 determines that the load request will exceed a threshold for the fuse (e.g., according to the current demand above temperature limit, or some other determination) but may further determine that the transient event will not otherwise exceed system operating condition limits. In the example, apparatus 1900 commands the contactor (C3) to close for a period of time before or during the transient to protect the fuse. The system 2600 depicts the high-side (C1) and low-side (C3) high voltage contactors (e.g., 216, 218 from system 100), which are distinct from the fuse bypass contactor C3.

Referencing FIG. 21, illustrative data 2000 for implementing a system response value 1910 is depicted. The illustrative data 2000 includes a threshold value 2002—for example a current, temperature, index parameter, or other value at which fuse wear and/or failure is expected to occur, and utilized as a threshold by the current event determination circuit 1902—at least under certain operating conditions at a point in time for the system. It is understood that the current event determination circuit 1902 may utilize multiple thresholds, and/or dynamic thresholds, as described throughout the present disclosure. The curve 2004 represents the nominal system performance, for example the current, temperature, index parameter, or the like that will be experienced by the fuse in the absence of operations of the apparatus 1900. In the example, the response determination circuit 1906 determines that the threshold value 2002 will be crossed, and accounts for a contactor connection/disconnection time 2008 (e.g., to bypass the fuse, engage a second fuse branch, and/or close off a more vulnerable fuse branch), commanding the contactor to connect or disconnect in time to avoid crossing the threshold value 2002. Additionally or alternatively, the response determination circuit 1906 may nevertheless allow the threshold value 2002 to be crossed, for example according to any operations or determinations described throughout the present disclosure—for example when a more critical system parameter requires the fuse to remain connected, and the fuse is allowed to experience the wear and/or failure event.

In certain embodiments, the operation to determine that the current event is exceeding the wear threshold value and/or the fuse failure value is based upon a calculation such as: 1) determining the current through the fuse exceeds a threshold value (e.g., an amp value); 2) determining a rate of change of the current through the fuse exceeds a threshold value (e.g., an amp/second value); 3) determining that an index parameter exceeds a threshold value (e.g., the index including accumulated amp-seconds; amp/sec-seconds; a counting index for periods above a threshold value or more than one threshold value; a counting index weighted by the instantaneous current value; an integrated current, heat transfer, and/or power value; and/or counting down or resetting these based on current operating conditions).

In certain embodiments, the operation to determine that the current event is exceeding the wear threshold value and/or the fuse failure value includes or is adjusted based upon one or more of: 1) a trip curve (e.g., a power-time or current-time trajectory, and/or an operating curve on a data set or table such as that represented in FIG. 3); 2) a fuse temperature model, including a first or second derivative of the temperature, and one or more temperature thresholds for scheduled and/or escalating response; 3) a measured battery voltage (e.g., current values may be higher as battery voltage lowers, and/or dynamic response of current may change causing changes for the wear threshold value, system failure value, and/or current event determination); 4) first derivative of current, temperature, power demand, and/or an index parameter, 5) second derivative of current, temperature, power demand, and/or an index parameter, 6) information from a battery management system (e.g., voltage, current, state of charge, state of health, rate of change of any of these, which parameters may affect current values, expected current values, and/or dynamic response of current values, causing changes for the wear threshold value, fuse failure value, and/or current event determination); 7) determination of and monitoring of contactor connection or disconnection times, and accounting for the contactor connection or disconnection time in determining the response to the current event; 8) utilizing ancillary system information and adjusting the response (e.g., collision avoidance system active—allow the fuse to fail, and/or bypass the fuse allowing potential damage to the system, to keep power flowing; anti-lock brake system and/or traction control system active—keep power flowing for maximum system control (degree of activation may also be considered, and/or system status communicated to the PDU—for example the system may report critical operation requiring power as long as possible, or shut-down operations requiring power to be cut as soon as possible, etc.)).

Referencing FIG. 20, an example apparatus 1900 to reduce or prevent fuse damage and/or a fuse failure is depicted. The example apparatus 1900 includes a current event determination circuit 1902, which may determine that current event 1904 indicates that a fuse threshold value (wear, failure, fatigue, or other threshold value) is exceeded or is predicted to be exceeded. The current event 1904 may be a current, temperature, or any other parameter described, for example, in relation to FIGS. 21, 29, and 30. The example apparatus 1900 further includes a response determination circuit 1906 that determines a system response value 1910—for example opening or closing one or more contactors in a fuse circuit (e.g., 2100, 2200, 2300, 2400, or any other fuse circuit or current protection circuit). The apparatus 1900 further includes a response implementation circuit 1908 that provides network communications 1912 and/or actuator commands 1914 in response to the system response value 1910. For example, the system response value 1910 may determine to close one or more contactors, and the actuator commands 1914 provides commands to the selected contactors which are responsive to the actuator commands 1914.

In certain embodiments, operations to bypass and/or engage one or more fuses are performed in coordination with a vehicle battery management system and/or an accelerator pedal input (or other load request indicator)—for example to time inrush currents that would be experienced on the fuses, to provide an indication to the battery management system or other vehicle power systems that momentary un-fused operation is going to occur, and/or that a higher fuse limit will be briefly applicable. In certain embodiments, during un-fused operation and/or higher fuse limit operation, the apparatus 1900 may operate a virtual fuse—for example if the experienced current is higher than predicted (e.g., it was predicted to exceed a fuse wear limit but be less than a system failure limit, but in fact appears that a system failure limit will be exceeded), the apparatus 1900 may operate to open a main high voltage contactor, re-engage the fuse, or make another system adjustment to protect the system in the absence of ordinarily available fusing operations.

Figure 31:
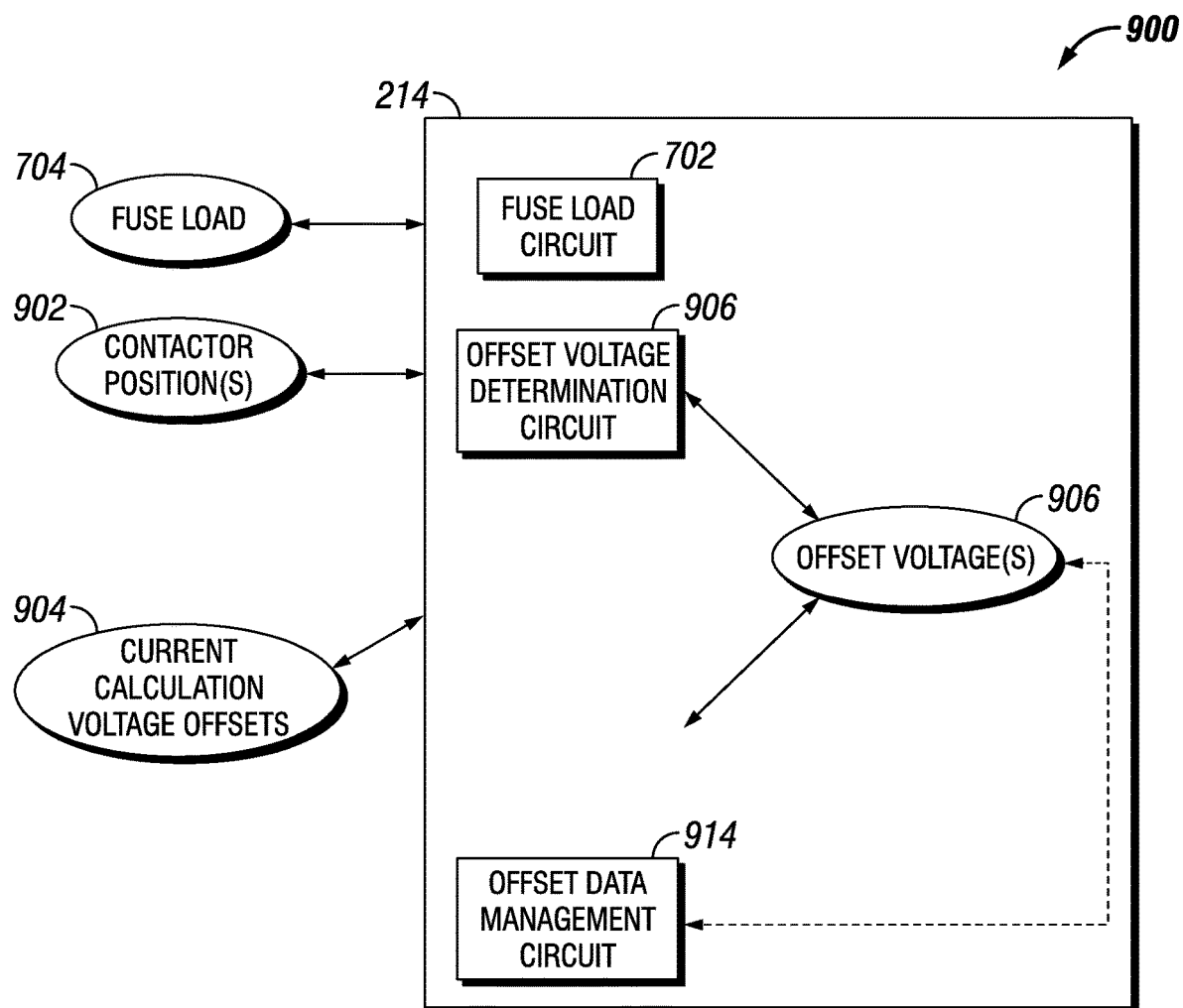
FIG. 31 depicts a non-limiting example apparatus to determine an offset voltage to adjust a fuse current determination.

Referencing FIG. 31, an example apparatus 900 to determine an offset voltage to adjust a fuse current determination are schematically depicted. The example apparatus 900 includes a controller 214 having a fuse load circuit 702 that determines that no current is demanded for a fuse load 704, and further determines that contactors associated with the fuse are open. The example apparatus 900 further includes an offset voltage(s) determination circuit 906 that determines offset voltages for components in the fuse circuit observed during the no current demanded portion of the operating cycle. In certain embodiments, the contactors remain open while pre-charge capacitors are still charging after a key-on cycle, whereupon the fuse load circuit 702 determines that no current is demanded for the fuse load 704. In certain embodiments, the contactors are opened during an operation of the system, and an example fuse load circuit 702 determines that no current is demanded for a fuse load 704, including potentially waiting for observed voltages to settle before determining that no current is demanded for the fuse load 704.

The example apparatus 900 further includes an offset data management circuit 914 that stores the offset voltages 906, and communicates current calculation offset voltages 904 for use in the system to determine current flow through the one or more fuses in the system. The current calculation offset voltages 904 may be the offset voltages 906 for the applicable components, and/or may be processed or conditioned values determined from the offset voltages 906.

An example procedure to determine an offset voltage for a fuse current measurement system is described following. The example procedure may be performed by a system component such as an apparatus 900. Offset voltages occur in a controller 214 due to individual offsets of op-amps and other solid state components in the controller 214, as well as due to part-to-part variations, temperature drift, and degradation of one or more components in the system over time. The presence of an offset voltage limits the accuracy with which current measurement through a fuse is available, and can thereby limit the types of controls and diagnostics that can be performed in the system.

An example procedure includes an operation to determine that no current is demanded for a fuse load. Example operations to determine that no current is demanded for a fuse load include a recent key-on or key-off event for a vehicle (e.g., the vehicle is starting, powering down, is in an accessory position, and/or has not yet engaged power to the fuse of interest), observation of the fuse circuit, and/or by a status observation provided by another controller in the system (e.g., a powertrain controller is explicitly indicating that no power is being provided, is indicating a status inconsistent with power being provided, etc.). An example operation determines that no current is demanded for a fuse during a key-off event, and/or within a time period after a key-on event.

The example procedure further includes an operation to determine the offset voltage in response to determining that no current is demanded for the fuse load, and an operation to store the offset voltage. In certain embodiments, the stored offset voltage is stored in non-volatile memory, for example to be utilized in a subsequent operation of the system. In certain embodiments, the offset voltage is stored in a volatile memory and utilized for a current operation cycle. The stored offset voltage may be replaced when a new value is determined for the offset voltage, and/or updated in a scheduled manner (e.g., by averaging in or filtering in updated values, by holding new values for subsequent confirmation before being applied, etc.).

According to the present description, operations to provide an offset voltage for components in the fuse circuit, for high confidence determination of a fuse current and a fuse resistance value in a PDU 102 are described. In certain embodiments, the high confidence determination of the fuse resistance can be utilized to determine the fuse condition, to provide a high accuracy or high precision determination of current through the fuse and of power consumption by the system 100, and/or to perform system diagnostics, fault management, circuit management, or the like.

Figure 32:
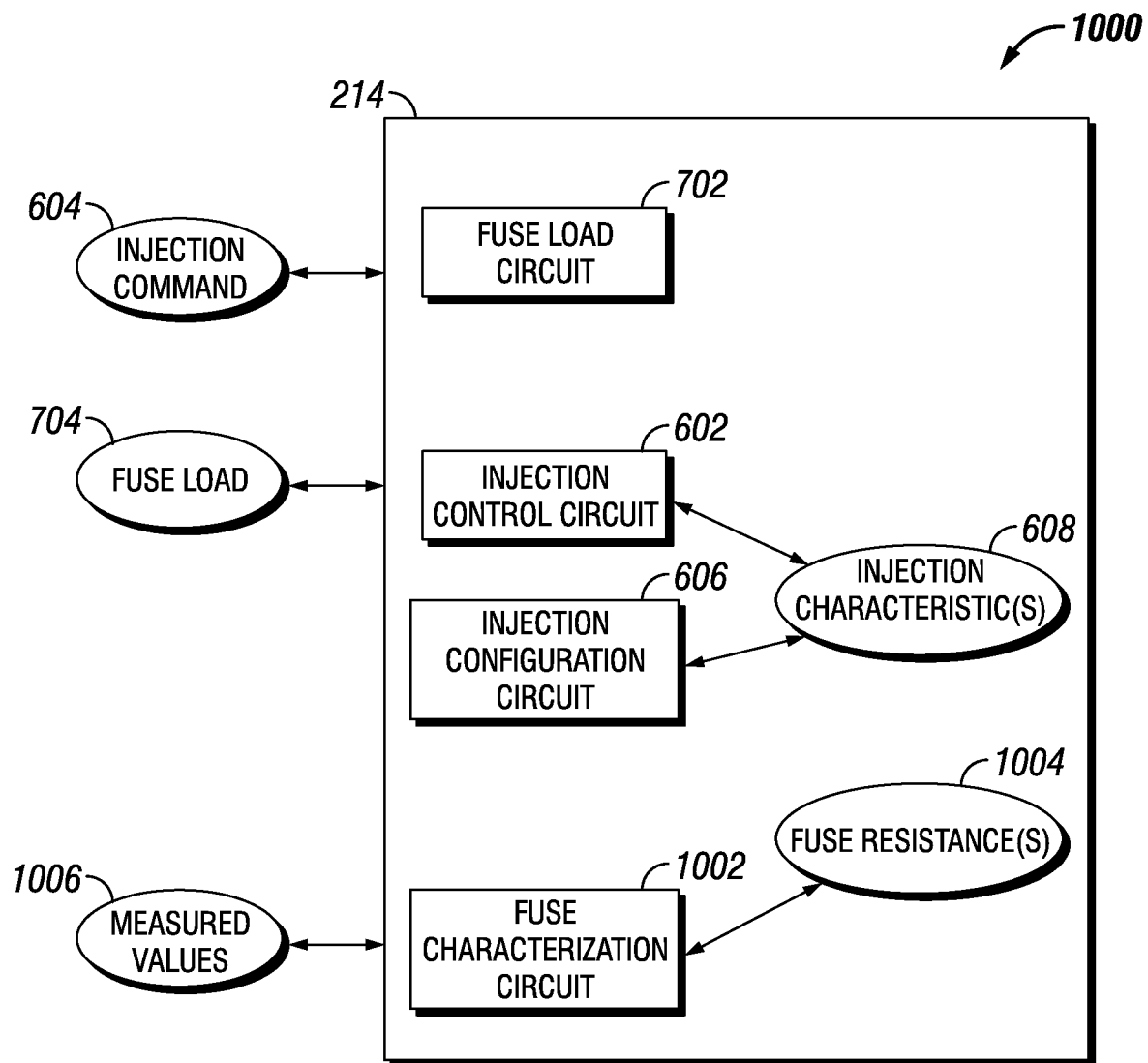
FIG. 32 depicts a non-limiting example apparatus is depicted to provide unique current waveforms to improve fuse resistance measurement for a PDU.

Referencing FIG. 32, an example apparatus 1000 to provide unique current waveforms to improve fuse resistance measurement for a PDU 102 is schematically depicted. The example apparatus 1000 includes a fuse load circuit 702 that determines that no current is demanded for a fuse load 704, and further determines that contactors associated with the fuse are open. The example apparatus 1000 further includes an injection configuration circuit 606 that determines injection characteristics 608, including frequency, amplitude, and waveform characteristics for test injection currents through one or more fuses to be tested. The example apparatus 1000 further includes an injection control circuit 602 that injects current through the fuses according to the injection characteristics 608, and a fuse characterization circuit 1002 that determines one or more fuse resistance(s) 1004 in response to the measured values 1006 during the test. An example injection control circuit 602 waits for the determination of voltage offset values while the fuse load 704 is still zero, and the fuse characterization circuit 1002 further utilized the voltage offset values in determining the fuse resistance(s) 1004 for the fuses. In certain embodiments, the injection configuration circuit 606 determines injection characteristics 608 in response to the characteristics of the system (e.g., the inherent capacitance and/or inductance of the system, the size of the fuse, the current ranges of the system during operation, and/or the resistance range and/or desired precision to support operations determinations utilizing the fuse resistance value). In certain embodiments, a high accuracy of the fuse resistance supports diagnostics, fuse protection control, and/or high accuracy on battery state of charge determinations.

In certain embodiments, the fuse characterization circuit 1002 determines the fuse resistance(s) 1004 for a given response based upon a number of current injection events, each of which may have a distinct one or more of an amplitude, frequency, and/or waveform. Additionally or alternatively, frequency sweeping, amplitude sweeping, and/or waveform shape management may be manipulated between injection events and/or within a given injection event. The fuse characterization circuit 1002 determines the fuse resistance 1004 by determining, for example, an averaged resistance value determined over the course of the tests. In certain embodiments, the fuse characterization circuit 1002 utilizes only a portion of each test window—for example to allow circuit settling time after an injection characteristic 608 switch, to allow for the injection provision circuit (e.g., a solid state op-amp, PWM, relay, or the like, which is configured to provide a selected current through the fuse circuit) to settle after switching the injection characteristic 608, to utilize a selected amount of data from each of the tests (e.g., for weighting purposes), and the like. In certain embodiments, the fuse characterization circuit 1002 may exclude outlying data (e.g., two of the tests agree, but a third test provides a far different value), and/or data which appears to indicate a rapid change which may appear to not be valid data. In certain embodiments, filtering, moving averages, rolling buffers, counters for delay in switching values (e.g., to confirm that a new value appears to be a real change) and the like are applied by the fuse characterization circuit 1002 to the fuse resistance 1004 to smooth changing values of the fuse resistance 1004 over time and/or to confirm that new information is repeatable. In certain embodiments, each period or a group of periods of a given injection waveform may be treated as a separate data point for resistance determinations. In certain embodiments, for example where the amplitude is swept for a given waveform, and/or where the frequency is swept for a given waveform, the resistance contribution for a given period may also be weighted (e.g., higher amplitudes and/or lower frequencies provide for a lower designed area under the current-time curve—see, e.g. FIG. 35—which may provide a higher quantity of information about the resistance relative to a lower amplitude and/or higher frequency period of the same waveform). Additionally or alternatively, measurement confidence may be dependent upon the frequency and/or amplitude of the current injection, and accordingly resistance determinations for those injection events may be weighted accordingly (e.g., given lower weight with lower confidence, and higher weight with higher confidence). Additionally or alternatively, conformance of the current injection source may be dependent upon the frequency, amplitude, and/or waveform of the current injection, and accordingly resistance determinations for those injection events may be weighted accordingly, and/or adjusted by feedback on the injector outlet about what frequency, amplitude, and/or waveform was actually provided relative to what was commanded.

In certain embodiments, the resistance determinations made by the fuse characterization circuit 1002, including how the resistance is determined and the average indicated by a given test, depend upon the waveform and other parameters. For example, if a sine wave waveform is utilized, resistance may be determined from the area under the voltage and current curves, from an rms determination (for current and/or voltage), and/or from high resolution time slices within the voltage determinations utilizing the injected current characterization. Other waveforms will utilize similar techniques for determining the resistance. If the circuit exhibits significant impedance (e.g. from latent capacitance and/or inductance, and/or from components in communication with the circuit that exhibit impedance), the impedance can be calculated by varying the frequency and determining the common impedance effects between the tests. The availability of multiple tests utilizing varying amplitudes, waveforms, and/or frequency values ensures that high accuracy can be determined even for circuits with complex effects or that exhibit changes due to age, degradation, or component servicing or replacing. Further, adjusting the frequency throughout the tests, and/or sweeping the frequency for a given amplitude or waveform can assist in de-coupling the phase-shifted aspects of impedance (e.g., capacitance effects versus inductance effects) to more confidently determine a resistance for the fuse. Typically for a fuse circuit having a closely coupled current source, impedance will be minimal. The desired degree of accuracy for the resistance measurement, which may depend upon the diagnostics, battery state of charge algorithms, and/or fuse protection algorithms in use on the system, may also affect whether impedance must be accounted for, and accordingly the selection of injection characteristics 608 utilized.

It can be seen that the use of multiple injection characteristics 608 during a test leverages comparisons between the tests to de-couple system characteristics from the resistance determination, provides for a range of system excitement parameters to ensure that system characteristics do not dominate a single test, and overall increase the amount of information available for a test to develop statistical confidence in the determined resistance value. Also, manipulation of injection characteristics 608 allows for better averaging—for example to prepare waveforms with high confidence that the resistance calculation is correct such as utilizing frequency values that avoid resonant or harmonic frequencies in the system, provide a large area under the current-time (or voltage-time) curve, and/or provide for a stabilized system during the test to ensure that measurement is correct.

Additionally or alternatively, the fuse characterization circuit 1002 adjusts digital filter values before the test, between changes in injection characteristics 608 for the test, and/or dynamically during the test (e.g., where a frequency sweep, amplitude sweep, and/or waveform change is utilized during a given injection event). In certain embodiments, the measurement of the voltage out of the filter circuit utilizes a high-pass filter to determine the injection voltage (and/or current), and the filter characteristics can be manipulated in real time to provide for an appropriate filter, such as cutoff frequencies. The utilization of digital filters for measurement can also eliminate phase lags between different filter types—such as a low pass filter and a high pass filter (e.g., where the low pass filter determines base power current during operation, and/or confirms that base power current remains zero or negligible during the test).

Figure 35:
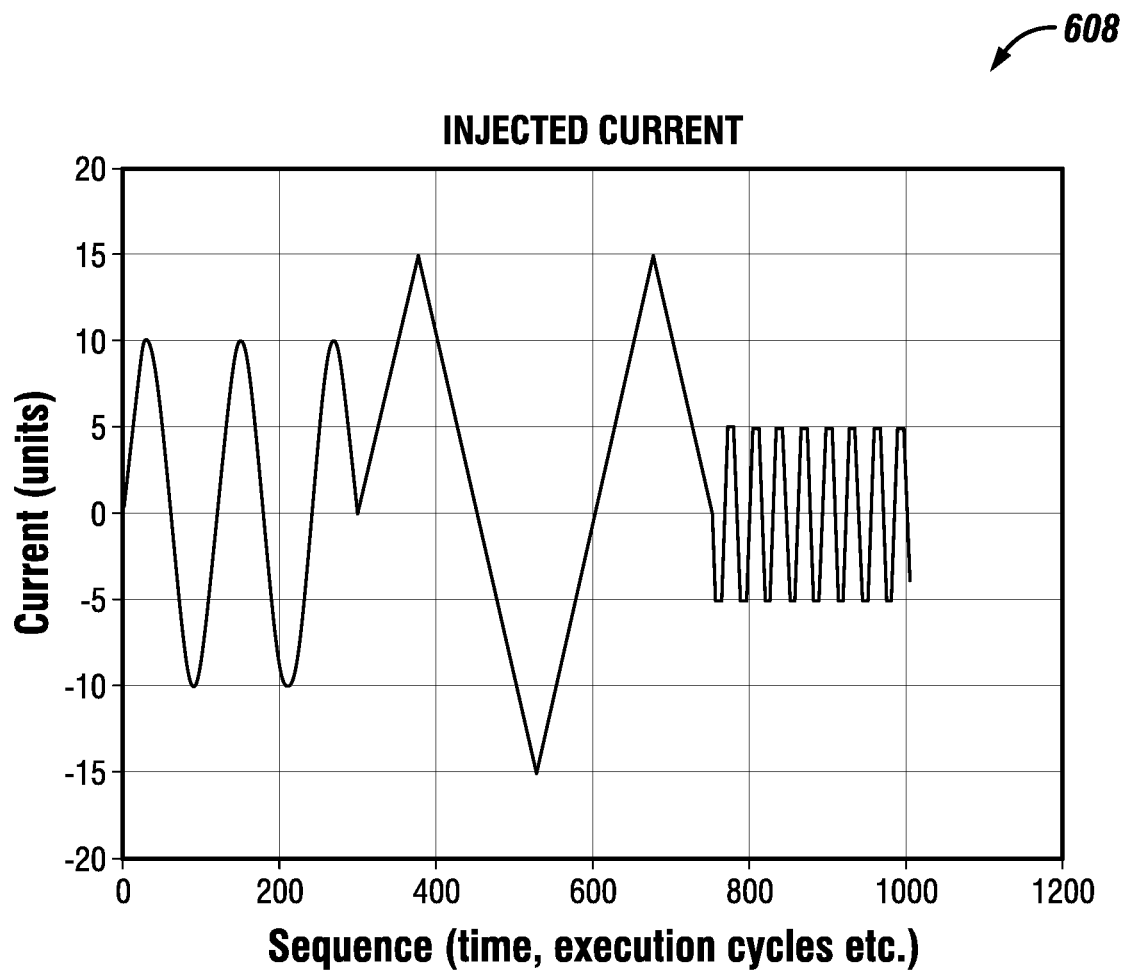
FIG. 35 depicts an illustrative injection characteristic for an example test.

Referencing FIG. 35, an illustrative injection characteristic 608 is depicted for an example test. The injection characteristic 608 includes a first injection portion having an amplitude of 10 current units (e.g., amps—but any current units are contemplated herein), a sinusoidal waveform, and a period of approximately 150 time units (e.g., execution cycles of the controller 214, milliseconds, seconds, or any other parameter). The units and values depicted in FIG. 35 are non-limiting examples, and are used to illustrate that sequential changes in the injection characteristic 608 can be applied. The injection characteristic 608 includes a second injection portion having an amplitude of 15 current units, a sawtooth waveform, and a period of approximately 250 time units. The injection characteristic 608 further includes a third injection portion having an amplitude of 5 current units, a near square waveform (a slightly trapezoidal waveform is depicted), and a period of approximately 80 time units. The embodiment depicted in FIG. 35 is non-limiting, and other features may be added to the test, including more or less than three distinct waveforms, gaps between waveforms, and adjustments within a waveform (including sweeping, stepping, or otherwise adjusting frequency or amplitude, and/or adjusting the waveform itself). The example of FIG. 35 shows a trajectory reversal between the first and second injection characteristic (e.g., decreasing sine wave to increasing sawtooth wave) and a continuation of the trajectory between the second and third injection characteristic (e.g., decreasing sawtooth wave to an increasing square wave), although any possibilities, including step changes of the current and the like, are contemplated herein.

Figure 33:
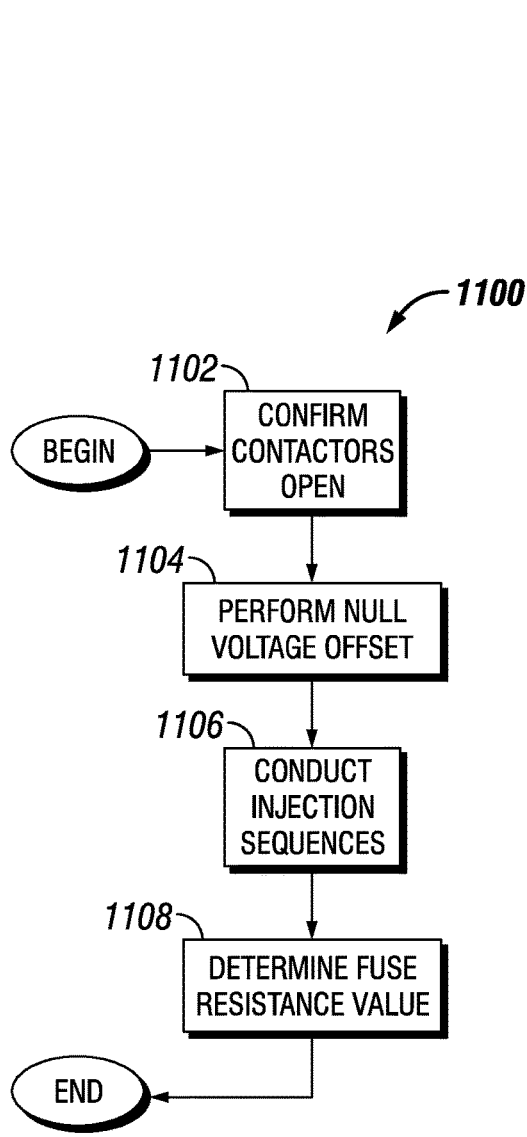
FIG. 33 depicts a non-limiting example procedure to provide unique current waveforms to improve fuse resistance measurement for a PDU.

Referencing FIG. 33, an example procedure 1100 to provide unique current waveforms to improve fuse resistance measurement for a PDU 102 is schematically depicted. The procedure 1100 includes an operation 1102 to confirm that the contactors are open (and/or to confirm that the fuse load is zero or intended to be zero), and an operation 1104 to perform a null voltage offset determination—for example to determine offset voltage of op-amps and other components of the controller 214 and/or in the system 100 electrically coupled to the fuse circuit. An example operation 1102 is commenced during a key-on or system startup event with the contactors open, although any operating condition meeting the criteria for operation 1102 may be utilized. The procedure 1100 further includes an operation 1106 to conduct a number of injection sequences—for example three sequences each having a distinct frequency, amplitude, and waveform. The operation 1106 may include more than three sequences, and one or more of the sequences may share a frequency, an amplitude, and/or a waveform. The operation 1106 may be configured to perform as many sequences as desired, and may be carried over multiple tests (e.g., where a test is interrupted by operations of the system or exceeds a desired time, the test may be continued on a later sequence initiated by operation 1102). The procedure 1100 further includes an operation 1108 to determine fuse resistance values for one or more of the fuses in the system. The procedure 1100 may be operated on individual fuses where hardware in the system is configured to support that, including across subsets of the fuses or the like.

Figure 34:
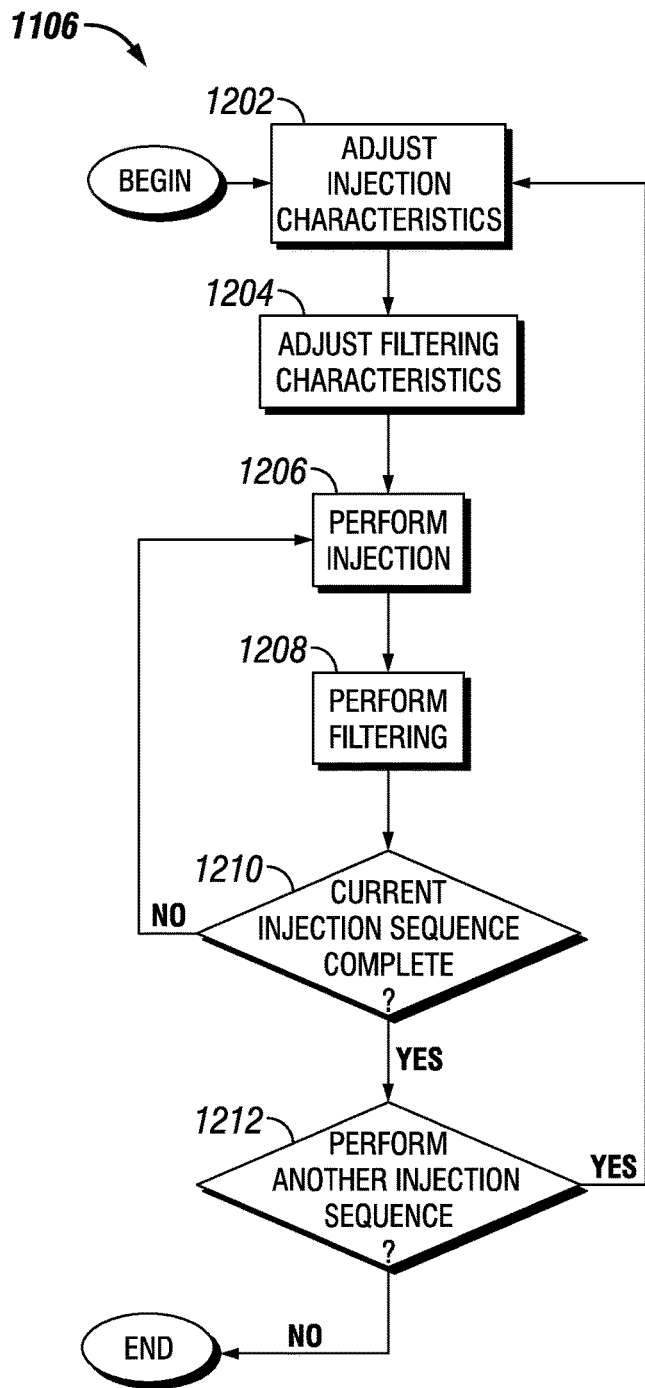
FIG. 34 depicts a non-limiting example procedure to conduct a number of injection sequences.

Referencing FIG. 34, an example procedure 1106 to conduct a number of injection sequences is depicted. The example procedure 1106 includes an operation 1202 to adjust injection characteristics for a current injection source associated with the fuse(s) to be tested, and an operation 1204 to adjust filtering characteristics for one or more digital filters associated with measuring voltage and/or current values on the filtering circuit. The procedure 1106 further includes an operation 1206 to perform the injection sequence in response to the injection characteristic, and an operation 1208 to perform the filtering (e.g., thereby measuring the current and/or voltage on the fuse circuit in response to the injection events). The procedure 1106 further includes an operation 1210 to determine if the current injection sequence is completed, returning to continue the injection event at operation 1206 until the sequence is complete (at operation 1210 determining YES). For example, referencing FIG. 35, at time step 200 the operation 1210 would determine NO, as the sine wave portion of the test is still being performed. If the operation 1210 determines YES (e.g., in FIG. 35, where the sine wave portion transitions to the sawtooth portion), the procedure 1106 includes an operation 1212 to determine whether another injection sequence is desired, and returns to operation 1202 to adjust the injection sequence in response to operation 1212 determining YES (e.g., in FIG. 9, where the sine wave portion is completed and the sawtooth portion commences). In response to the operation 1212 determining NO (e.g., where the square wave portion is completed, and no further sequences are scheduled in the test), the procedure 1106 completes—for example returning to operation 1108 to determine the fuse resistance value from the test.

According to the present description, operations to provide varying waveforms for current injection, thereby enhancing determination of the fuse resistance value in a PDU 102 are described. In certain embodiments, the high confidence determination of the fuse resistance can be utilized to determine the fuse condition, to provide a high accuracy or high precision determination of current through the fuse end of power consumption by the system 100, and/or to perform system diagnostics, fault management, circuit management, or the like.

Figure 36:
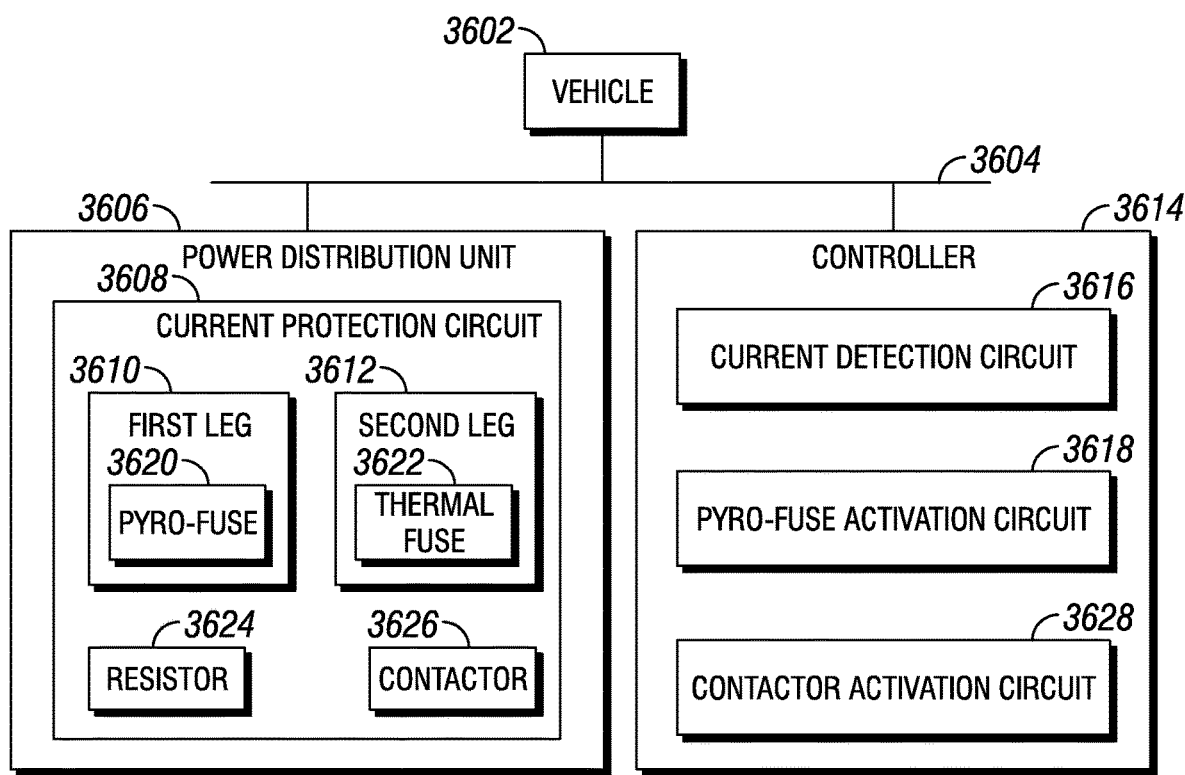
FIG. 36 depicts a schematic diagram of a vehicle having a PDU.

Referencing FIG. 36, an example system includes a vehicle 3602 having a motive electrical power path 3604; and a power distribution unit 3606 having a current protection circuit 3608 disposed in the motive electrical power path 3604. The example current protection circuit 3608 includes a first leg 3610 of the current protection circuit 3608 including a pyro-fuse 3620 (e.g., a controllable activated fuse that can be commanded to activate and open the first leg of the current protection circuit; a second leg 3612 of the current protection circuit 3608 including a thermal fuse 3622; and where the first leg 3610 and the second leg 3612 are coupled in a parallel arrangement (e.g., in a similar manner to the depiction of any one of FIGS. 26 to 28). The example system includes a controller 3614 having a current detection circuit 3616 structured to determine a current flow through the motive electrical power path 3614, and a pyro-fuse activation circuit 3618 structured to provide a pyro-fuse activation command in response to the current flow exceeding a threshold current flow value. The pyro-fuse 3620 is responsive to the pyro-fuse activation command, for example to activate and open the second leg 3612 upon command. Upon activation of the pyro-fuse 3620, the second leg 3612 is opened, providing for normal fused operation on the first leg 3610 (e.g., thermal failure of the thermal fuse 3622 thereby opens the motive electrical power path 3604), and/or opening the motive electrical power path 3604 directly when a contactor 3626 in series with the thermal fuse 3622 is already opened.

Certain further aspects of an example system are described following, any one or more of which may be present in certain embodiments. An example system includes where a first resistance through the first leg 3620 and a second resistance through the second leg 3612 are configured such that a resulting current through the second leg 3612 after the pyro-fuse 3620 activates is sufficient to activate the thermal fuse 3622. For example, a high current event may be experienced such that, if the second leg 3622 were not drawing a portion of the high current event, the thermal fuse 3622 would be activated. In the example, the opening of the second leg 3612 will cause the current in the first leg 3620 to increase and activate the thermal fuse 3622. An example includes a resistor 3624 coupled in a series arrangement with the thermal fuse 3622, such that a resulting current through the second leg 3612 after the pyro-fuse 3620 activates is below a second threshold current flow value. For example, an undersized thermal fuse 3622 may be utilized in the system, with the operating current through the second leg 3612 reduced by the resistor 3624. When the pyro-fuse 3620 opens, the current through the second leg 3612 is increased, but still reduced by the resistor 3624 to prevent high current transients in the motive electrical power path 3604, and still allowing sufficient current through the second leg 3612 to activate the thermal fuse 3622.

An example system includes a contactor coupled 3626 in a series arrangement with the thermal fuse 3622, the controller further including a contactor activation circuit 3628 structured to provide a contactor open command in response to at least one of the pyro-fuse activation command or the current flow exceeding the threshold current flow value. In certain embodiments, the contactor 3626 coupled in the series arrangement with the thermal fuse 3622 allows for control of the current through the second leg 3612, including opening the second leg 3612 to open the motive electrical power path 3604 in combination with activation of the pyro-fuse 3620. The resistor 3624 may additionally be utilized with the contactor 3626, for example reducing the current through the second leg 3612 when the pyro-fuse 3620 activates (e.g., where contactor 3626 dynamics may be slower than the pyro-fuse 3620 dynamics). An example includes a resistor 3624 coupled in a series arrangement with the pyro-fuse 3620, such that a resulting current through the first leg 3610 after the thermal fuse 3622 activates is below a second threshold current flow value—for example to reduce the current through the motive electrical power path 3604 if the thermal fuse 3622 activates when the pyro-fuse 3620 has not already activated (e.g., an unmeasured current spike, and/or a current spike occurring after a controller has failed and is unable to command the pyro-fuse 3620 to open). An example system includes a second thermal fuse (not shown) coupled in a series arrangement with the pyro-fuse 3620, such that a resulting current through the first leg 3610 after the thermal fuse 3622 activates is sufficient to activate the second thermal fuse. For example, the use of a second thermal fuse provides for all branches of the motive electrical power path 3604 to have fuses with physical responses present, avoiding failures due to loss of ability to detect currents in the system or to command a pyro-fuse 3620 to activate. In the example, the sizing of the thermal fuse 3622 and the second thermal fuse can be made to avoid thermal wear during normal operations, but sufficient such that either thermal fuse 3622 will readily protect the system when the other leg (the first leg 3610 or second leg 3612) is opened during high current events. It can be seen that embodiments of the system depicted in FIG. 36 provide for both the high controllability of a pyro-fuse 3620 to disconnect the power, along with the robust protection of a thermal fuse that will physically respond to high current values regardless of failures in current sensing or controller operation, as may occur during a system failure, vehicle accident, etc. Additionally, the utilization of the two legs 3610, 3612, including potentially current management therethrough with resistor(s) 3624 and/or contactor(s) 3626, allows for the utilization of fuses that can be sized to avoid thermal wear and/or nuisance failures over the life of the vehicle, while still providing for reliable power disconnection for high current events.

Figure 37:
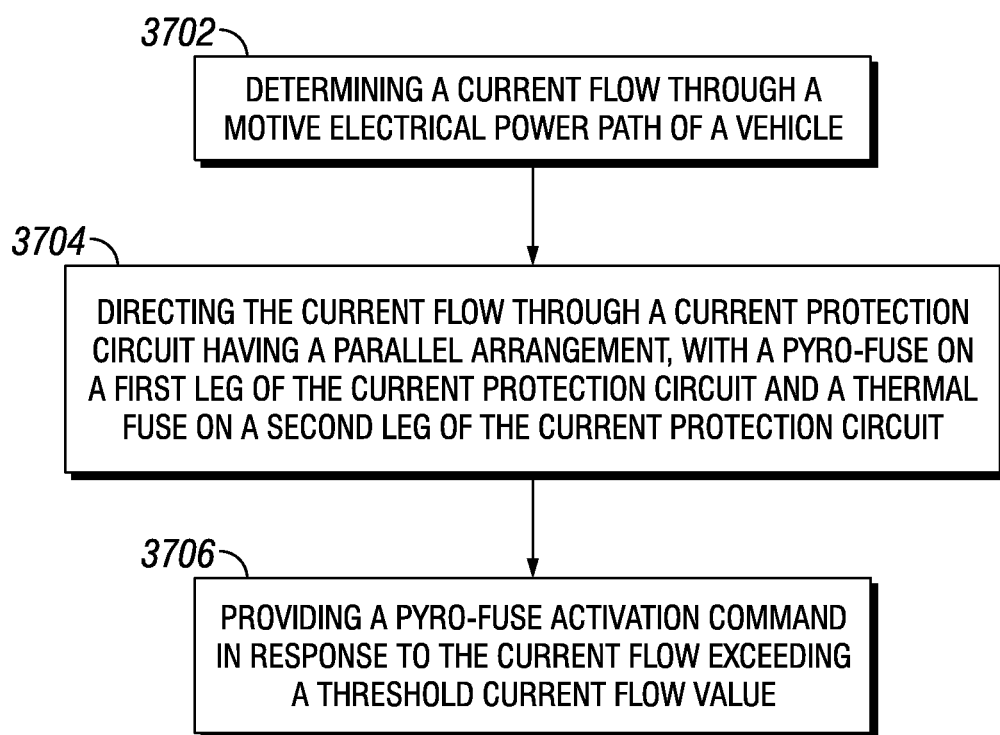
FIG. 37 depicts a schematic flow diagram of a procedure to utilize a parallel thermal fuse and pyro-fuse.

Referencing FIG. 37, an example procedure includes an operation 3702 to determine a current flow through a motive electrical power path of a vehicle; an operation 3704 to direct the current flow through a current protection circuit having a parallel arrangement, with a pyro-fuse on a first leg of the current protection circuit and a thermal fuse on a second leg of the current protection circuit; and an operation 3706 to provide a pyro-fuse activation command in response to the current flow exceeding a threshold current flow value.

Certain further aspects of an example procedure are described following, any one or more of which may be present in certain embodiments. An example procedure further includes an operation to configure a first resistance through the first leg and a second resistance through the second leg such that a resulting current through the second leg after the pyro-fuse activates is sufficient to activate the thermal fuse. An example procedure includes an operation to configure a second resistance through the second leg such that a resulting current through the second leg after the pyro-fuse activates is below a second threshold current flow value. An example procedure includes an operation to a contactor coupled in a series arrangement with the thermal fuse, the procedure further including providing a contactor open command in response to at least one of providing the pyro-fuse activation command or the current flow exceeding the threshold current flow value; and/or an operation to configure a second resistance through the second leg such that a resulting current through the second leg after the pyro-fuse activates is below a second threshold current flow value. An example procedure further including a resistor coupled in a series arrangement with the pyro-fuse such that a resulting current through the first leg after the thermal fuse activates is below a second threshold current flow value; and/or further including a second thermal fuse coupled in a series arrangement with the pyro-fuse, such that a resulting current through the first leg after the thermal fuse activates is sufficient to activate the second thermal fuse.

Figure 38:
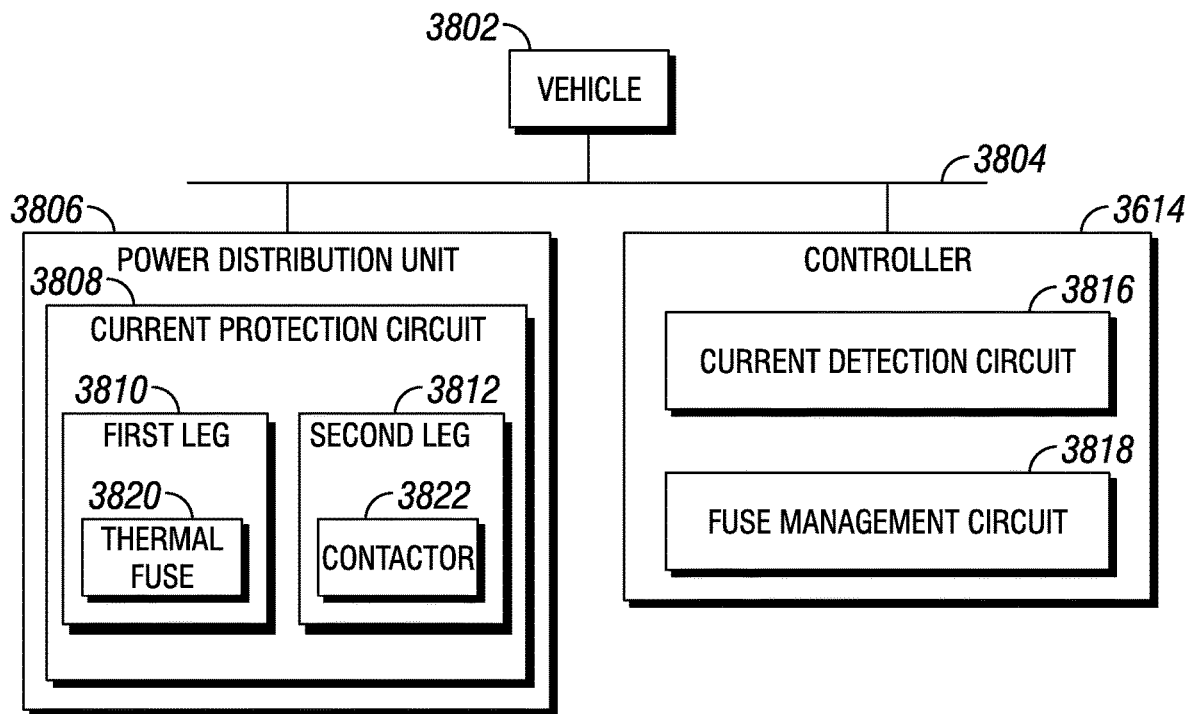
FIG. 38 depicts a schematic diagram of a vehicle having a PDU.

Referencing FIG. 38, an example system includes a vehicle 3802 having a motive electrical power path 3804; a power distribution unit 3806 having a current protection circuit 3808 disposed in the motive electrical power path 3804, where the current protection circuit includes a first leg 3810 of the including a thermal fuse 3820 and a second leg 3812 including a contactor 3822. The first leg 3810 and the second leg 3812 are coupled in a parallel arrangement. The system includes a controller 3614 having a current detection circuit 3816 structured to determine a current flow through the motive electrical power path 3804; and a fuse management circuit 3818 structured to provide a contactor activation command in response to the current flow. The contactor 3822 is responsive to the contactor activation command.

Certain further aspects of an example system are described following, any one or more of which may be present in certain embodiments. An example system includes where the contactor 3822 is open during nominal operations of the vehicle, and where the fuse management circuit is structured to provide the contactor activation command as a contactor closing command in response to determining that the current flow is a above a thermal wear current for the thermal fuse 3820; and/or where the fuse management circuit is further structured to provide the contactor activation command as the contactor closing command in response to determining that the current flow is below a current protection value for the motive electrical power path 3804. An example system includes where the contactor 3822 is closed during nominal operations of the vehicle, and where the fuse management circuit is structured to provide the contactor activation command as a contactor opening command in response to determining that the current flow is above a current protection value for the motive electrical power path 3804. An example system includes where the fuse management circuit is further structured to provide the contactor activation command in response to the current flow by performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing. It can be seen that the embodiments of the system depicted in FIG. 38 allow for the utilization of an oversized fuse 3820 that will experience reduced wear and increased life, while still allowing for circuit protection for moderate overcurrent (e.g., utilizing the contactor) and fused protection for high overcurrent values. It can be seen that the embodiments of the system depicted FIG. 38 allow for utilization of a nominally sized or undersized fuse 3820 that can reliably open the circuit at moderate overcurrent values, but experience reduced wear and increased life (e.g., by sharing current through the contactor branch).

Figure 39:
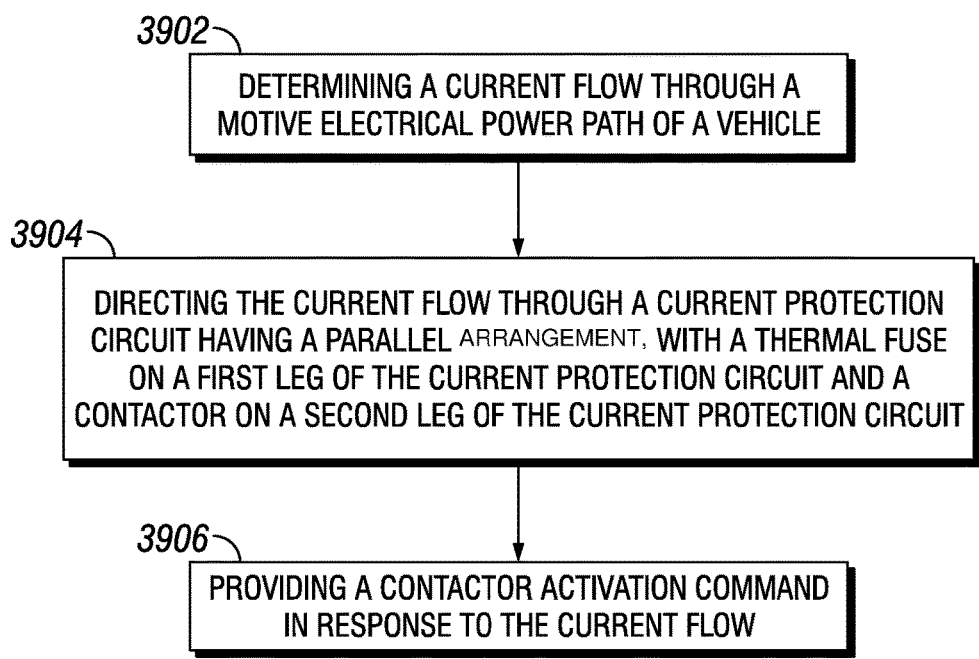
FIG. 39 depicts a schematic flow diagram of a procedure to operate a thermal fuse bypass.

Referencing FIG. 39, an example procedure includes an operation 3902 to determine a current flow through a motive electrical power path of a vehicle; an operation 3904 to direct the current flow through a current protection circuit having a parallel arrangement, with a thermal fuse on a first leg of the current protection circuit and a contactor on a second leg of the current protection circuit; and an operation 3906 to provide a contactor activation command in response to the current flow.

Certain further aspects of an example procedure are described following, any one or more of which may be present in certain embodiments. An example procedure further includes an operation to close the contactor in response to the current flow. An example procedure includes an operation to determine that the current flow is below a current protection value for the motive electrical power path before the closing the contactor. An example procedure includes at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing. An example procedure includes an operation to open the contactor in response to the current flow; an operation to determine that the current flow is above a current protection value for the motive electrical power path before opening the contactor, and/or an operation to open the contactor including performing any one or more of: responding to a rate of change of the current flow; responding to a comparison of the current flow to a threshold value; responding to one of an integrated or accumulated value of the current flow; and responding to one of an expected or a predicted value of any of the foregoing.

Figure 40:
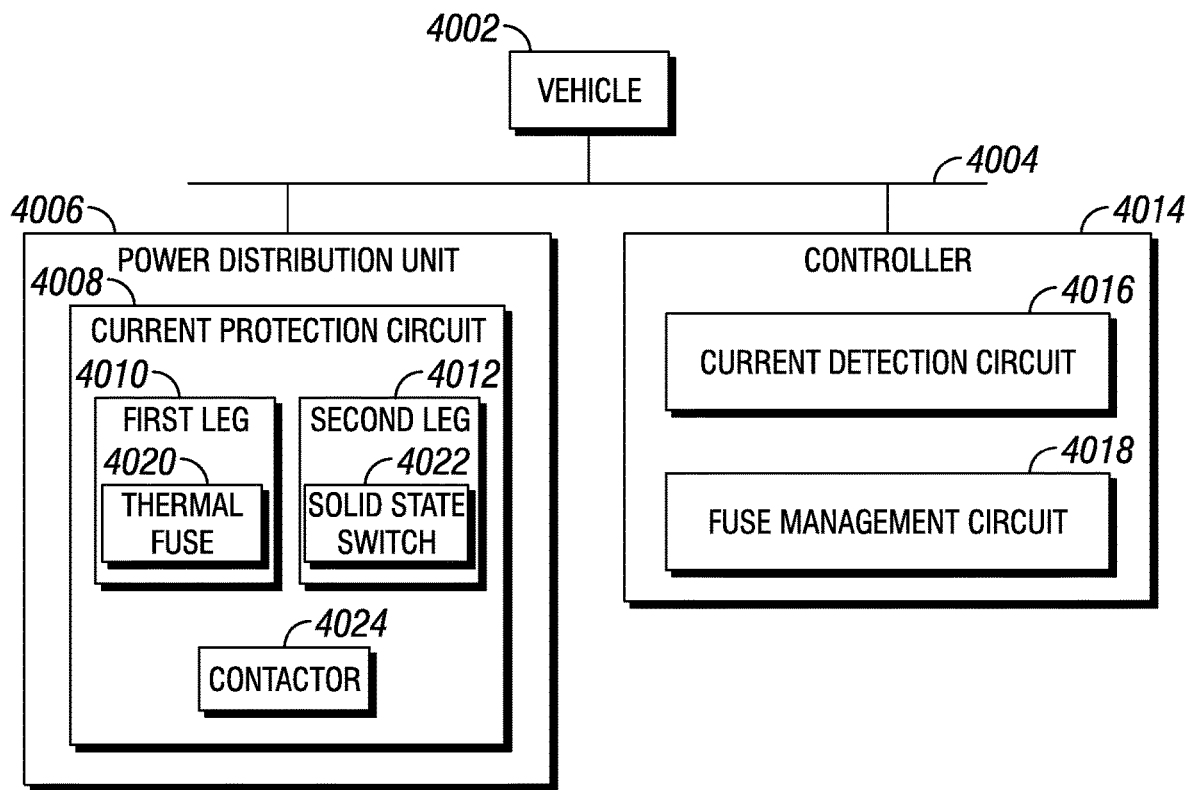
FIG. 40 depicts a schematic diagram of a vehicle having a PDU.

Referencing FIG. 40, an example system includes a vehicle 4002 having a motive electrical power path 4004; a power distribution unit 4006 having a current protection circuit 4008 disposed in the motive electrical power path 4004, where the current protection circuit includes a first leg 4010 of the current protection circuit 4008 including a thermal fuse 4020 and a second leg 4012 of the current protection circuit 4008 including a solid state switch 4022. The first leg 4010 and the second leg 4012 are coupled in a parallel arrangement. The example system includes a controller 4014 including a current detection circuit 4016 structured to determine a current flow through the motive electrical power path 4004 and a fuse management circuit 4018 structured to provide a switch activation command in response to the current flow. The solid state switch 4022 is responsive to the switch activation command. In certain embodiments, the system includes a contactor 4024 coupled to the current protection circuit 4008, where the contactor 4024 in the open position disconnects the current protection circuit 4008 (e.g., the contactor 4024 in series with both legs 4010, 4012), and/or the contactor 4024 in series with the solid state switch 4022 on the second leg 4012). Any contactor described throughout the present disclosure may, in certain embodiments, be a solid state switch instead of, or in series with, a conventional contactor device. Solid state switches are known to have rapid response and are robust to opening during high current events. However, solid state switches also experience a small leakage current, which may be acceptable in certain embodiments, or not acceptable in other embodiments. In certain embodiments, the utilization of a conventional contactor with a solid state switch allows for the rapid response time and survivability of the solid state switch, as well as the enforced zero current of a conventional contactor. In certain embodiments, the solid state switch is utilized to open the circuit first, and then the conventional contactor opens the circuit second, allowing for the avoidance of conditions where the conventional contactor opens under high current conditions.

Figure 41:
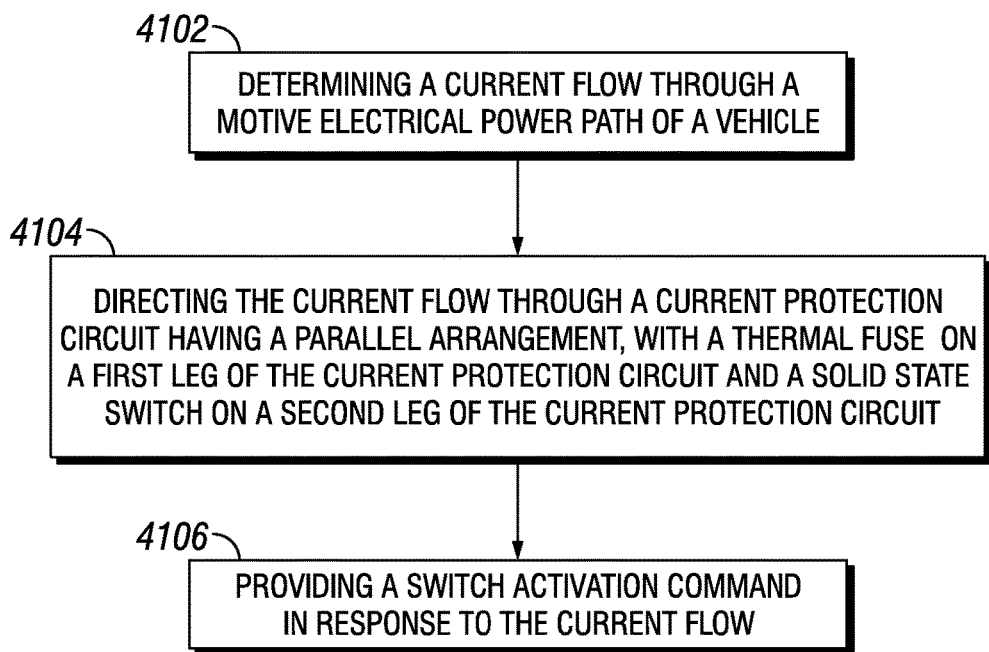
FIG. 41 depicts a schematic flow diagram of a procedure to operate a thermal fuse bypass.

Referencing FIG. 41, an example procedure includes an operation 4102 to determine a current flow through a motive electrical power path of a vehicle; an operation 4104 to direct the current flow through a current protection circuit having a parallel arrangement, with a thermal fuse on a first leg of the current protection circuit and a solid state switch on a second leg of the current protection circuit; and an operation 4106 to provide a switch activation command in response to the current flow.

Certain further aspects of an example procedure are described following, any one or more of which may be present in certain embodiments. An example procedure further includes an operation to close the solid state switch in response to the current flow; and/or determine that the current flow is below a current protection value for the motive electrical power path before the closing the solid state switch. For example, a current flow value or transient may be sufficiently high to cause degradation of the thermal fuse, but lower than a threshold where a system protection response from the thermal fuse is required. In certain embodiments, closing the solid state switch reduces the current flow and/or transient through the thermal fuse, reducing the wear and/or a nuisance failure of the thermal fuse. An example procedure includes an operation to close the solid state switch includes performing at least one operation such as: responding to a rate of change of the current flow; responding to a comparison of the current flow to a threshold value; responding to one of an integrated or accumulated value of the current flow; and responding to one of an expected or a predicted value of any of the foregoing. An example procedure includes an operation to open the solid state switch in response to the current flow; and/or determine that the current flow is above a current protection value for the motive electrical power path before opening the solid state switch. An example procedure includes an operation to open the solid state switch includes performing at least one operation selected from the operations consisting of: responding to a rate of change of the current flow; responding to a comparison of the current flow to a threshold value; responding to one of an integrated or accumulated value of the current flow; and responding to one of an expected or a predicted value of any of the foregoing. An example procedure includes an operation to open a contactor after the opening the solid state switch, where opening the contactor disconnects one of the current protection circuit or the second leg of the current protection circuit.

Figure 42:
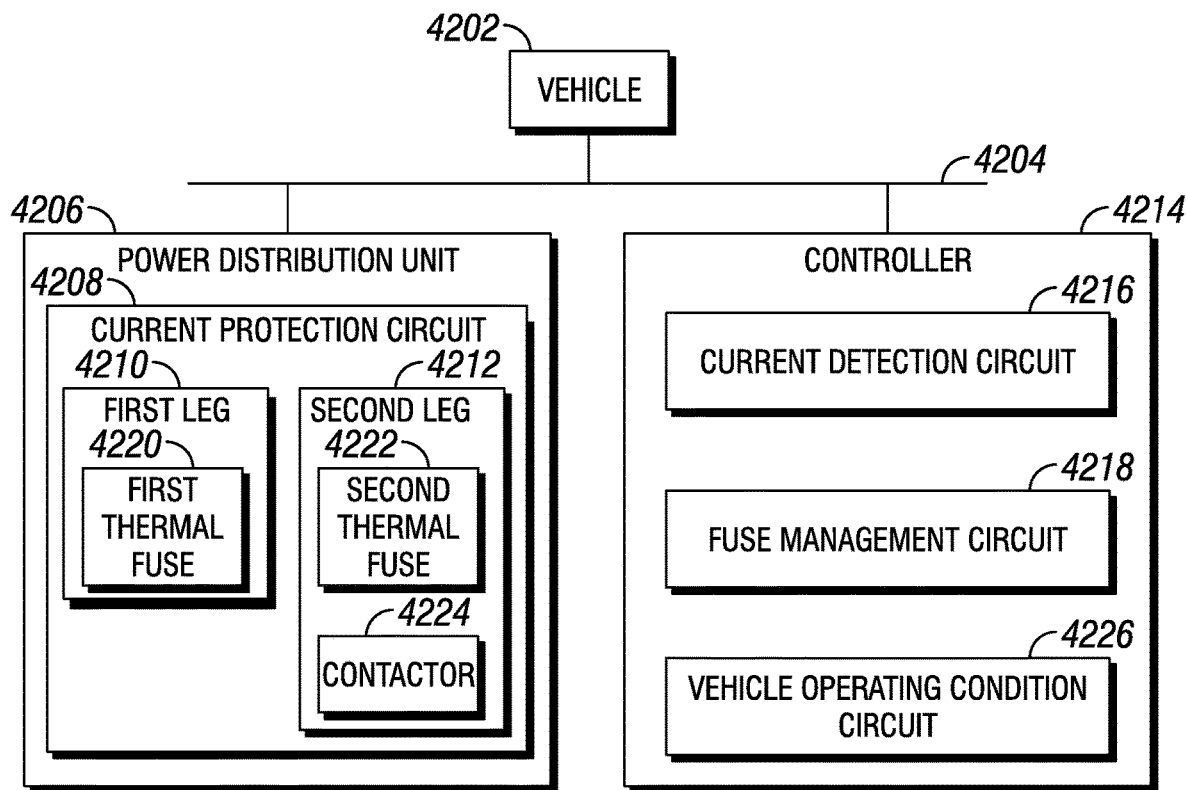
FIG. 42 depicts a schematic diagram of a vehicle having a PDU.

Referencing FIG. 42, an example system includes a vehicle having a motive electrical power path 4204; a power distribution unit 4206 having a current protection circuit 4208 disposed in the motive electrical power path 4204, where the current protection circuit includes a first leg 4220 of the current protection circuit 4208 including a first thermal fuse 4220, a second leg 4212 of the current protection circuit 4208 including a second thermal fuse 4222 and a contactor 4224, and where the first leg 4220 and the second leg 4212 are coupled in a parallel arrangement. The example system includes a controller, including: a current detection circuit 4216 structured to determine a current flow through the motive electrical power path 4204; and a fuse management circuit 4218 structured to provide a contactor activation command in response to the current flow. The contactor 4224 is responsive to the contactor activation command.

Certain further aspects of an example system are described following, any one or more of which may be present in certain embodiments. An example system includes where the contactor 4224 is open during nominal operations of the vehicle, and where the fuse management circuit 4218 is structured to provide the contactor activation command as a contactor closing command in response to determining that the current flow is a above a thermal wear current for the first thermal fuse 4220. An example system includes the fuse management circuit 4218 further structured to provide the contactor activation command as a contactor closing command in response to determining that the current flow is below a current protection value for the motive electrical power path 4204. An example system includes a vehicle operating condition circuit 4226 structured to determine an operating mode for the vehicle (e.g., moving, stopped, high performance, high economy, charging, quick charging, etc.), and where the fuse management circuit 4218 is further structured to provide the contactor activation command in response to the operating mode. An example system includes the fuse management circuit 4218 further structured to provide the contactor activation command as a contactor closing command in response to the operating mode including at least one operating mode selected from the operating modes consisting of: a charging mode; a quick charging mode; a high performance mode; a high power request mode; an emergency operation mode; and/or a limp home mode. An example system includes where the contactor 4224 is closed during nominal operations of the vehicle, and where the fuse management circuit 4218 is structured to provide the contactor activation command as a contactor opening command in response to determining that the current flow is above a current protection value for the motive electrical power path 4204. An example system includes where the contactor is closed during nominal operations of the vehicle, and where the fuse management circuit 4218 is structured to provide the contactor activation command as a contactor opening command in response to the operating mode; and/or where the fuse management circuit 4218 is further structured to provide the contactor activation command as a contactor opening command in response to the operating mode including at least one of an economy mode or a service mode. For example, during certain operating conditions such as an economy mode or during a service event, a reduced maximum power throughput through the motive electrical power path 4204 may be enforced, where the opening of the contactor 4224 is utilized to provide configured fuse protection for the reduced maximum power throughput.

Figure 43:
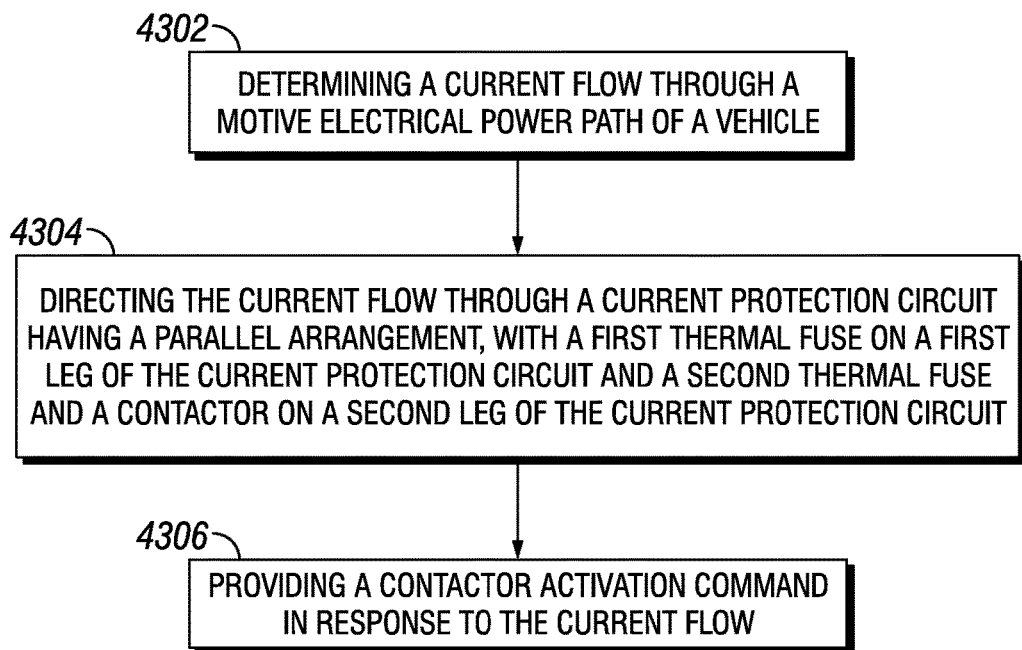
FIG. 43 depicts a schematic flow diagram of a procedure to operate parallel thermal fuses.

Referencing FIG. 43, an example procedure includes an operation 4302 to determine a current flow through a motive electrical power path of a vehicle; an operation 4304 to direct the current flow through a current protection circuit having a parallel arrangement, with a first thermal fuse on a first leg of the current protection circuit and a second thermal fuse and a contactor on a second leg of the current protection circuit; and an operation 4306 to provide a contactor activation command in response to the current flow.

Certain further aspects of an example procedure are described following, any one or more of which may be present in certain embodiments. An example procedure further includes an operation to close the contactor in response to the current flow being above a thermal wear current for the first thermal fuse; and/or closing the contactor further in response to the current flow being below a current protection value for the motive electrical power path. An example procedure includes an operation to determine an operating mode for the vehicle, and providing the contactor activation command further in response to the operating mode. An example procedure includes an operation to provide the contactor activation command as a contactor closing command in response to the operating mode including at least one operating mode selected from the operating modes consisting of: a charging mode; a high performance mode; a high power request mode; an emergency operation mode; and a limp home mode. An example procedure includes an operation to provide the contactor activation command as a contactor opening command in response to determining that the current flow is above a current protection value for the motive electrical power path; and/or provide the contactor activation command as a contactor opening command in response to the operating mode including at least one of an economy mode or a service mode.

Figure 44:
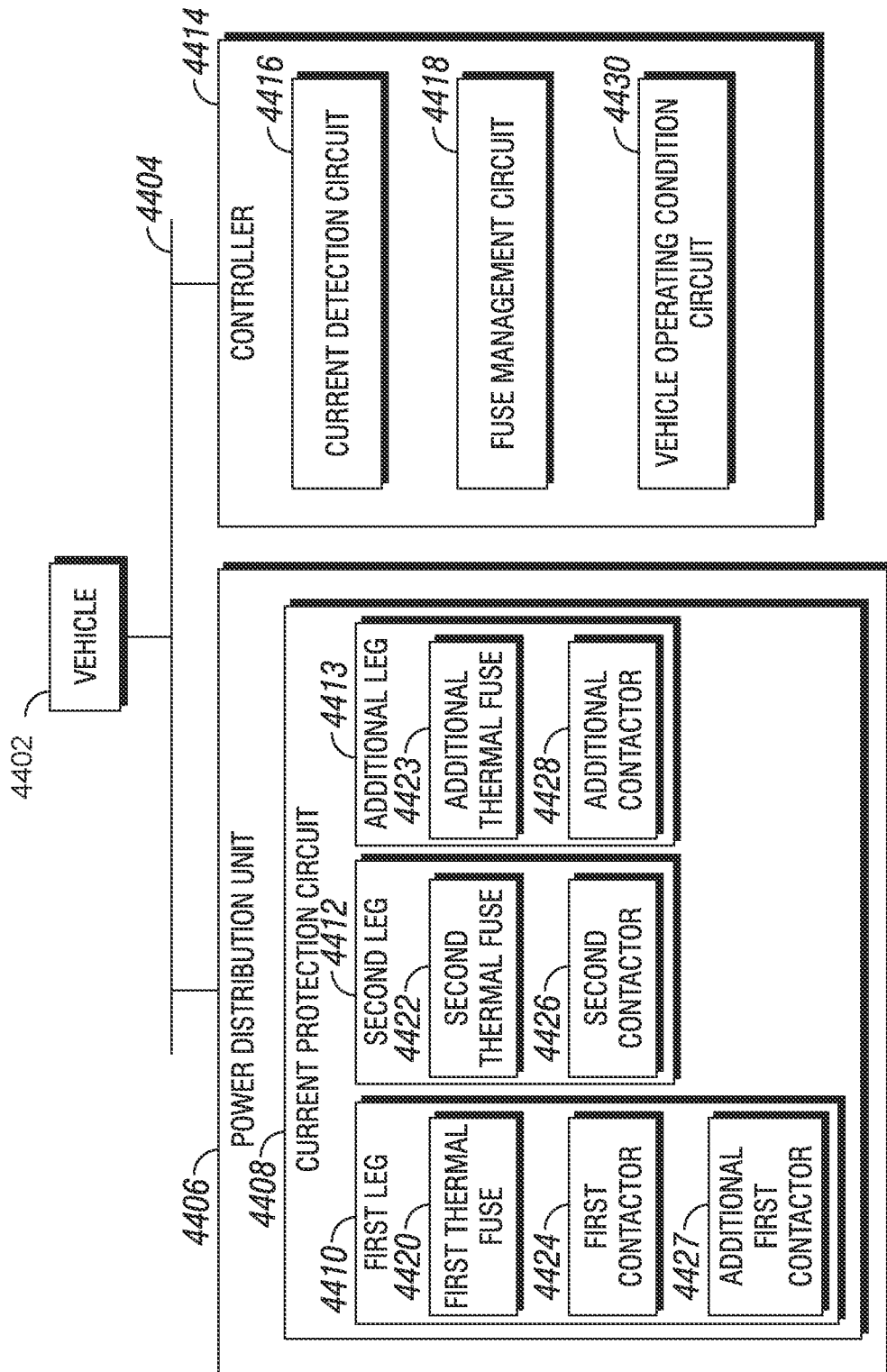
FIG. 44 depicts a schematic diagram of a vehicle having a PDU.

Referencing FIG. 44, an example system includes a vehicle 4402 having a motive electrical power path 4404; a power distribution unit 4406 having a current protection circuit 4408 disposed in the motive electrical power path 4404, where the current protection circuit includes: a first leg 4410 of the current protection circuit 4408 including a first thermal fuse 4420 and a first contactor 4424; a second leg 4412 of the current protection circuit 4408 including a second thermal fuse 4422 and a second contactor 4426; and where the first leg 4410 and the second leg 4412 are coupled in a parallel arrangement. The example system includes a controller 4414 including a current detection circuit 4416 structured to determine a current flow through the motive electrical power path 4404; and a fuse management circuit 4418 structured to provide a plurality of contactor activation commands in response to the current flow. The first contactor 4424 and the second contactor 4426 are responsive to the contactor activation commands, thereby providing a selected configuration of the current protection circuit 4408.

Certain further aspects of an example system are described following, any one or more of which may be present in certain embodiments. An example system includes where the current protection circuit further includes: one or more additional legs 4413, where each additional leg 4413 includes an additional thermal fuse 4423 and an additional contactor 4428; and where each additional contactor 4428 is further responsive to the contactor activation commands, thereby providing the selected configuration of the current protection circuit 4408. An example system includes a vehicle operating condition circuit 4430 structured to determine an operating mode for the vehicle, and where the fuse management circuit 4418 is further structured to provide the contactor activation commands in response to the operating mode. An example fuse management circuit 4418 is further structured to determine an active current rating for the motive electrical power path 4404 in response to the operating mode, and to provide the contactor activation commands in response to the active current rating. An example system includes where the first leg 4410 of the current protection circuit 4408 further includes an additional first contactor 4427 in a parallel arrangement with the first thermal fuse 4420, where the current detection circuit 4416 is further structured to determine a first leg current flow, where the fuse management circuit 4418 is further structured to provide the contactor activation commands further in response to the first leg current flow, and where the additional first contactor 4427 is responsive to the contactor activation commands. An example system includes the additional first contactor 4427 being open during nominal operations of the vehicle, and where the fuse management circuit 4418 is structured to provide the contactor activation commands including an additional first contactor closing command in response to determining that the first leg current flow is a above a thermal wear current for the first thermal fuse 4420. An example system includes the fuse management circuit 4418 structured to provide the additional first contactor closing command in response to determining at least one of: that the first leg current flow is below a first leg current protection value, or that the current flow is below a motive electrical power path current protection value. An example system includes where the additional first contactor 4427 is closed during nominal operations of the vehicle, and where the fuse management circuit 4418 is structured to provide the contactor activation commands including an additional first contactor opening command in response to determining at least one of: that the first leg current flow is above a first leg current protection value, or that the current flow is above a motive electrical power path current protection value. The example system may further include additional contactors 4428 positioned on any one or more of the legs 4410, 4412, 4413. Any one or more of the contactors 4424, 4426, 4428 may be configured in series and/or parallel with the associated thermal fuse 4420, 4422, 4423 on the associated leg.

Figure 45:
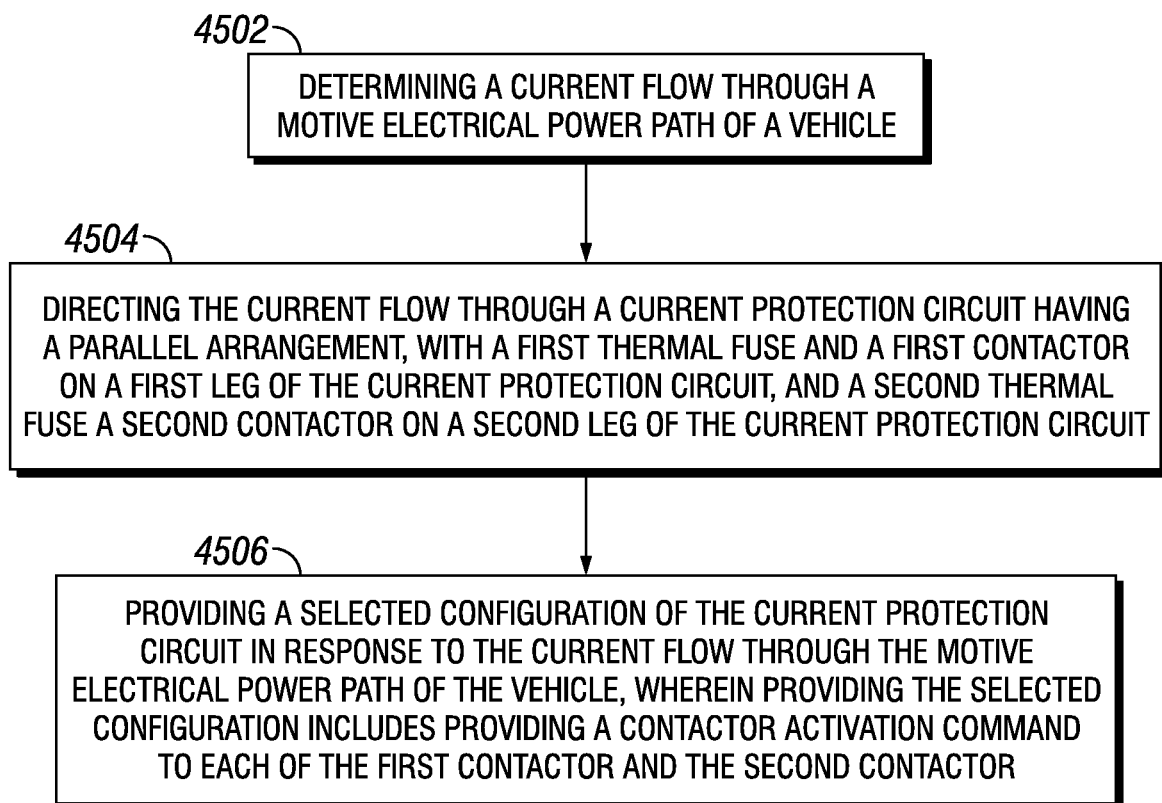
FIG. 45 depicts a schematic flow diagram of a procedure to selectively configure a current protection circuit.

Referencing FIG. 45, an example procedure includes an operation 4502 to determine a current flow through a motive electrical power path of a vehicle; an operation 4504 to direct the current flow through a current protection circuit having a parallel arrangement, with a first thermal fuse and a first contactor on a first leg of the current protection circuit, and a second thermal fuse and a second contactor on a second leg of the current protection circuit; and an operation 4506 to provide a selected configuration of the current protection circuit in response to the current flow through the motive electrical power path of the vehicle, where providing the selected configuration includes providing a contactor activation command to each of the first contactor and the second contactor.

Certain further aspects of an example procedure are described following, any one or more of which may be present in certain embodiments. An example procedure includes an operation further including at least one additional leg of the current protection circuit, each additional leg of the current protection circuit having an additional thermal fuse and an additional contactor, and where the providing the selected configuration of the current protection circuit includes providing a contactor activation command to each additional contactor. An example procedure includes an operation to determine an operating mode for the vehicle, and providing the selected configuration further in response to the operating mode; and/or an operation to determine an active current rating for the motive electrical power path in response to the operating mode, and where providing the selected configuration of the current protection circuit is further in response to the active current rating. An example procedure includes an operation to determine an active current rating for the motive electrical power path, and where providing the selected configuration of the current protection circuit is further in response to the active current rating. An example procedure includes an operation where the first leg of the current protection circuit further includes an additional first contactor in a parallel arrangement with the first thermal fuse, the procedure further including: determining a first leg current flow, and where providing the selected configuration further includes providing a contactor activation command to the additional first contactor, an operation to close the additional first contactor in response to determining that the first leg current flow is a above a thermal wear current for the first thermal fuse; an operation to close the additional first contactor further in response to determining at least one of: that the first leg current flow is below a first leg current protection value, or that the current flow is below a motive electrical power path current protection value; and/or an operation to open the additional first contactor in response to determining at least one of: that the first leg current flow is above a first leg current protection value, or that the current flow is above a motive electrical power path current protection value.

Figure 46:
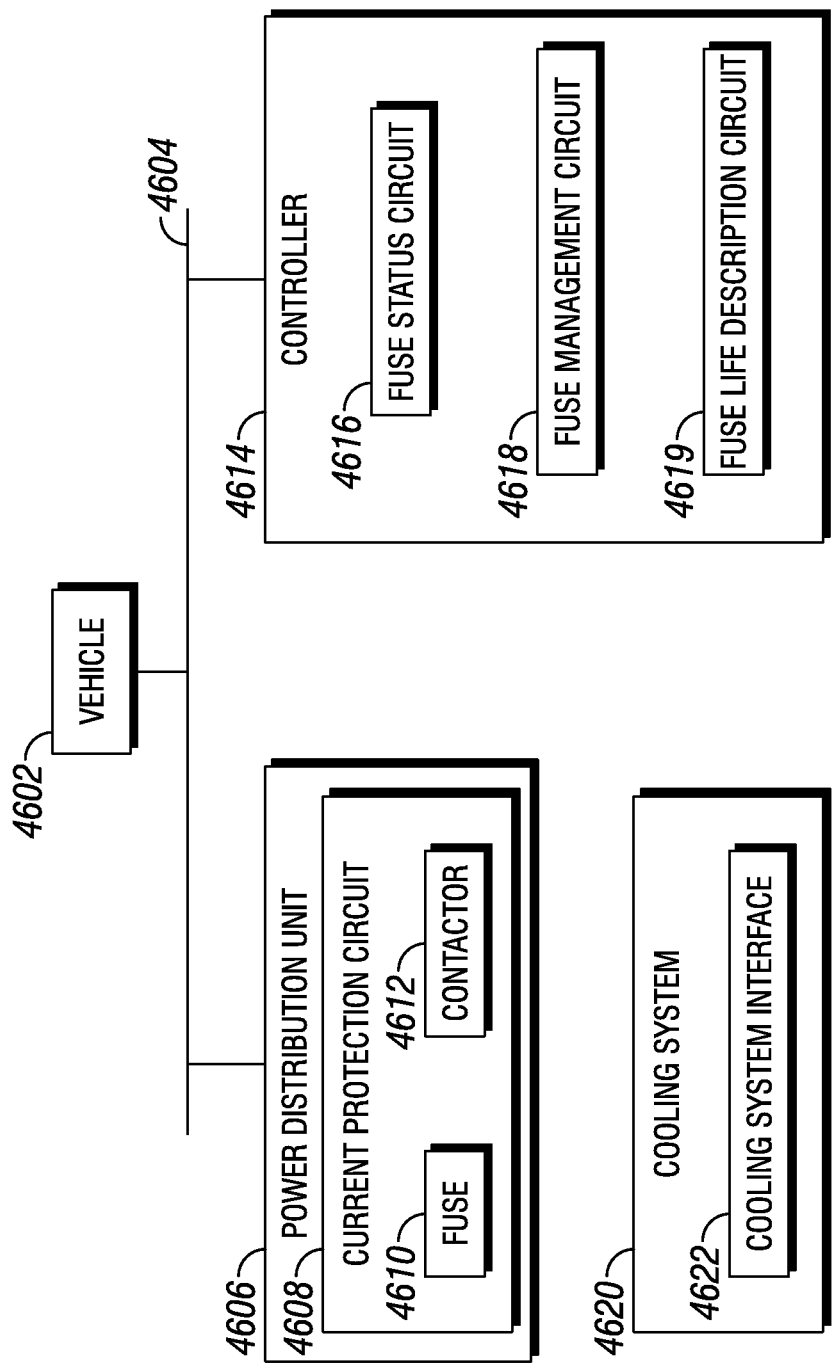
FIG. 46 depicts a schematic diagram of a vehicle having a PDU.

Referencing FIG. 46, an example system includes a vehicle 4602 having a motive electrical power path 4604; a power distribution unit 4606 having a current protection circuit 4608 disposed in the motive electrical power path 4604, where the current protection circuit 4608 includes a fuse 4610. The example system further includes a controller 4614 including a fuse status circuit 4616 structured to determine a fuse event value; and a fuse management circuit 4618 structured to provide a fuse event response based on the fuse event value.

Certain further aspects of an example system are described following, any one or more of which may be present in certain embodiments. An example system includes a fuse life description circuit 4619 structured to determine a fuse life remaining value, where the fuse event value includes a representation that the fuse life remaining value is below a threshold value, and where the fuse management circuit 4618 is further structured to provide the fuse event response further based on the fuse life remaining value. Example and non-limiting operations to provide the fuse event include providing a fault code and/or a notification of the fuse event value, for example to a datalink, another controller in the system, as a service notification, to a fleet owner (e.g., a maintenance manager), stored as a fault code for service access, and/or as a notification to an operator, a mobile device, a service report, or the like. Example and non-limiting operations to provide the fuse event response include: adjusting a maximum power rating for the motive electrical power path; adjusting a maximum power slew rate for the motive electrical power path; and/or adjusting a configuration of the current protection circuit. An example system includes where the current protection circuit 4606 further includes a contactor 4612 coupled in a parallel arrangement to the fuse 4610; and/or where the fuse management circuit 4618 is further structured to provide a contactor activation command in response to the fuse event value. In the example, the contactor 4612 is responsive to the contactor activation command. An example system includes where the fuse management circuit 4618 is further structured to provide the contactor activation command as a contactor closing command in response to the fuse event value being one of a thermal wear event or an imminent thermal wear event for the fuse 4610. An example system includes where the fuse management circuit 4618 is further structured to adjust a current threshold value for the contactor activation command in response to the fuse life remaining value (e.g., open the contactor at a lower or higher threshold as the fuse ages). An example system includes a cooling system 4620 at least selectively thermally coupled to the fuse, and a cooling system interface 4622 (e.g., hardware interfaces such as flow couplings, valves, etc., and/or communication interfaces such as network commands, electrical couplings, etc.); and/or where providing the fuse event response includes adjusting a cooling system interface 4622 for the cooling system 4620 in response to the fuse life remaining value (e.g., increasing active cooling capability to the fuse as the fuse ages).

Figure 47:
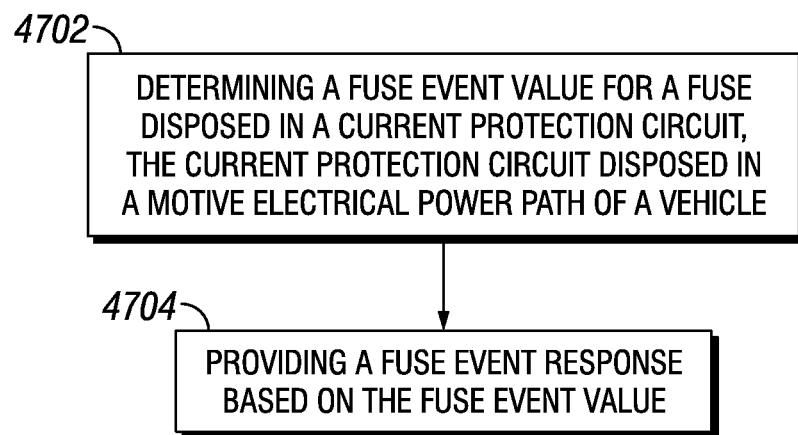
FIG. 47 depicts a schematic flow diagram of a procedure to determine a fuse event value, and to respond thereto.

Referencing FIG. 47, an example procedure includes an operation 4702 to determine a fuse event value for a fuse disposed in a current protection circuit, the current protection circuit disposed in a motive electrical power path of a vehicle; and an operation 4704 to provide a fuse event response based on the fuse event value.

Certain further aspects of an example procedure are described following, any one or more of which may be present in certain embodiments. An example procedure further includes an operation to determine a fuse life remaining value, where the fuse event value includes a representation that the fuse life remaining value is below a threshold value, and providing the fuse event response further based on the fuse life remaining value; an operation to provide the fuse event response includes providing at least one of a fault code or a notification of the fuse event value; an operation to provide the fuse event response includes adjusting a maximum power rating for the motive electrical power path; an operation to provide the fuse event response includes adjusting a maximum power slew rate for the motive electrical power path; an operation to provide the fuse event response includes adjusting a configuration of the current protection circuit. An example procedure includes an operation where the current protection circuit further includes a contactor coupled in a parallel arrangement to the fuse;

where the fuse management circuit is further structured to provide a contactor activation command in response to the fuse event value; and where the contactor is responsive to the contactor activation command; where the fuse management circuit is further structured to provide the contactor activation command as a contactor closing command in response to the fuse event value including one of a thermal wear event or an imminent thermal wear event for the fuse; and/or where the fuse management circuit is further structured to adjust a current threshold value for the contactor activation command in response to the fuse life remaining value. An example procedure includes an operation to provide the fuse event response includes adjusting a cooling system interface for a cooling system at least selectively thermally coupled to the fuse in response to the fuse life remaining value. An example procedure includes an operation to provide the fuse event response includes providing at least one of a fault code or a notification of the fuse event value. An example procedure includes an operation to determine an accumulated fuse event description in response to the fuse event response, and storing the accumulated fuse event description. An example procedure includes an operation to provide the accumulated fuse event description, where providing the accumulated fuse event description includes at least one of providing at least one of a fault code or a notification of the accumulated fuse event description; and an operation to provide the accumulated fuse event description in response to at least one of a service event or a request for the accumulated fuse event description.

Figure 48:
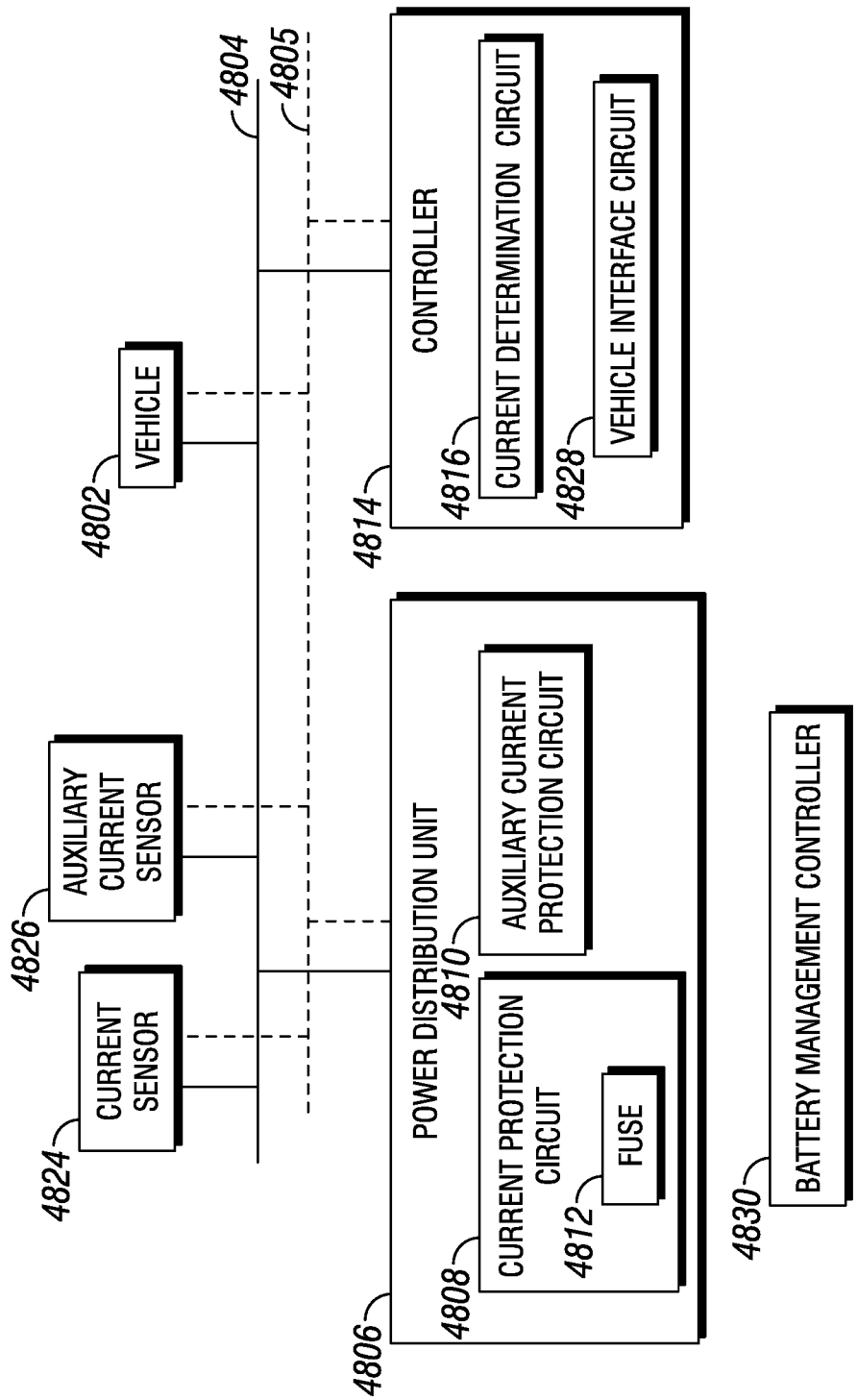
FIG. 48 depicts a schematic diagram of a vehicle having a PDU.

Referencing FIG. 48, an example system includes a vehicle 4802 having a motive electrical power path 4804 and at least one auxiliary electrical power path 4805; a power distribution unit 4806 having a motive current protection circuit 4808 disposed in the motive electrical power path 4804, the motive current protection circuit including a fuse; and an auxiliary current protection circuit 4810 disposed in each of the at least one auxiliary electrical power paths 4805, each auxiliary current protection circuit 4810 including an auxiliary fuse (not shown). The system includes a controller 4814 including: a current determination circuit 4816 structured to interpret a motive current value corresponding to the motive electrical power path, and an auxiliary current value corresponding to each of the at least one auxiliary electrical power paths.

Certain further aspects of an example system are described following, any one or more of which may be present in certain embodiments. An example system includes a motive current sensor 4824 electrically coupled to the motive electrical power path 4804, where the motive current sensor 4824 is configured to provide the motive current value. An example system includes at least one auxiliary current sensor 4826 each electrically coupled to one of the at least one auxiliary electrical power paths, each auxiliary current sensor 4826 configured to provide the corresponding auxiliary current value. An example system includes where the controller 4814 further includes a vehicle interface circuit 4828, the vehicle interface circuit structured to provide the motive current value to a vehicle network (not shown); where the vehicle interface circuit 4828 is further structured to provide the auxiliary current value corresponding to each of the at least one auxiliary electrical power paths 4805 to the vehicle network; and/or further including a battery management controller (not shown) configured to receive the motive current value from the vehicle network. In certain embodiments, one or more of the motive current value and/or the auxiliary current value(s) are provided by a fuse current model, for example determined in accordance with a load voltage drop across the fuse and/or a fuse resistance (and/or fuse dynamic resistance or fuse impedance) value determined from an injected current operation across the fuse. The utilization of a fuse current model can provide for higher accuracy (e.g. relative to a moderately capable or inexpensive current sensor) and/or faster response time for current determination than a sensor. In certain embodiments, a current sensor may be combined with the utilization of a fuse current model, for example favoring one or the other of the sensor or the model depending upon the operating conditions, and the expected accuracies of the sensor or the model in view of the operating conditions.

Figure 49:
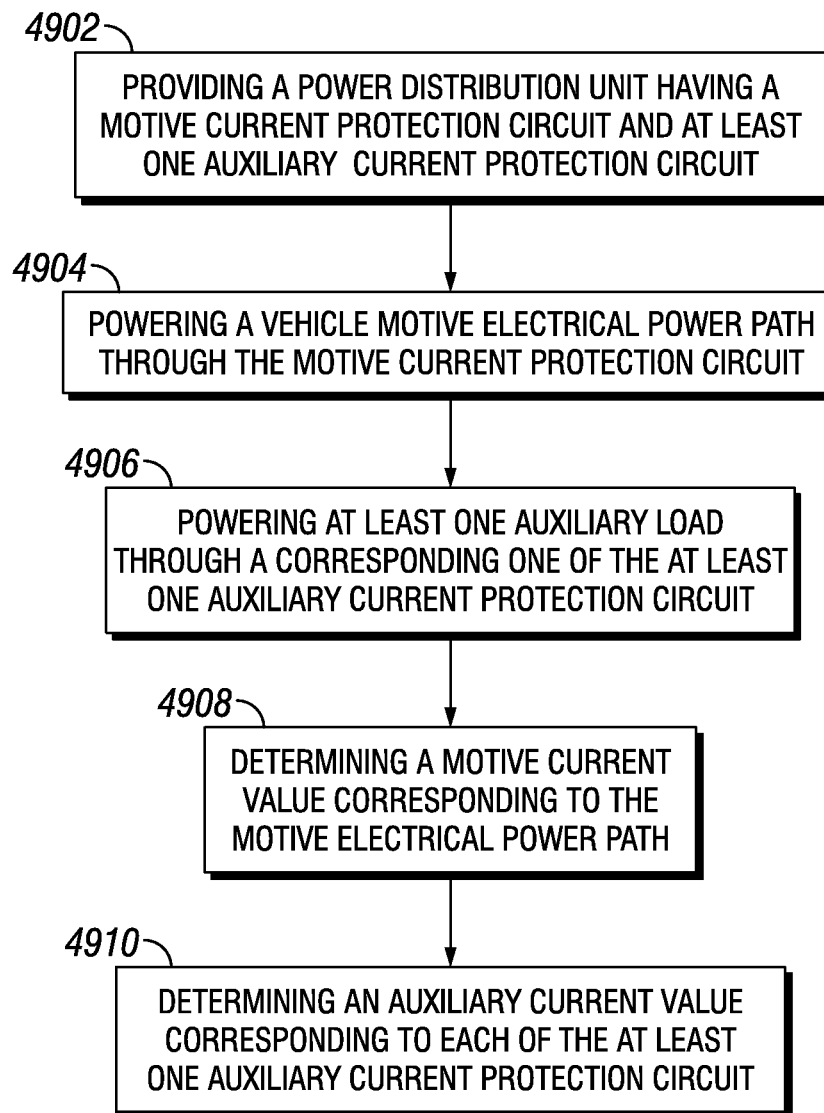
FIG. 49 depicts a schematic flow diagram of a procedure to determine current flow through a number of fuses.

Referencing FIG. 49, an example procedure includes an operation 4902 to provide a power distribution unit having a motive current protection circuit and at least one auxiliary current protection circuit; an operation 4904 to power a vehicle motive electrical power path through the motive current protection circuit; an operation 4906 to power at least one auxiliary load through a corresponding one of the at least one auxiliary current protection circuit; an operation 4908 to determine a motive current value corresponding to the motive electrical power path; and an operation 4910 to determine an auxiliary current value corresponding to each of the at least one auxiliary current protection circuits.

Certain further aspects of an example procedure are described following, any one or more of which may be present in certain embodiments. An example procedure further includes an operation to provide the motive current value to a vehicle network; and/or an operation to receive the motive current value with a battery management controller.

Figure 50:
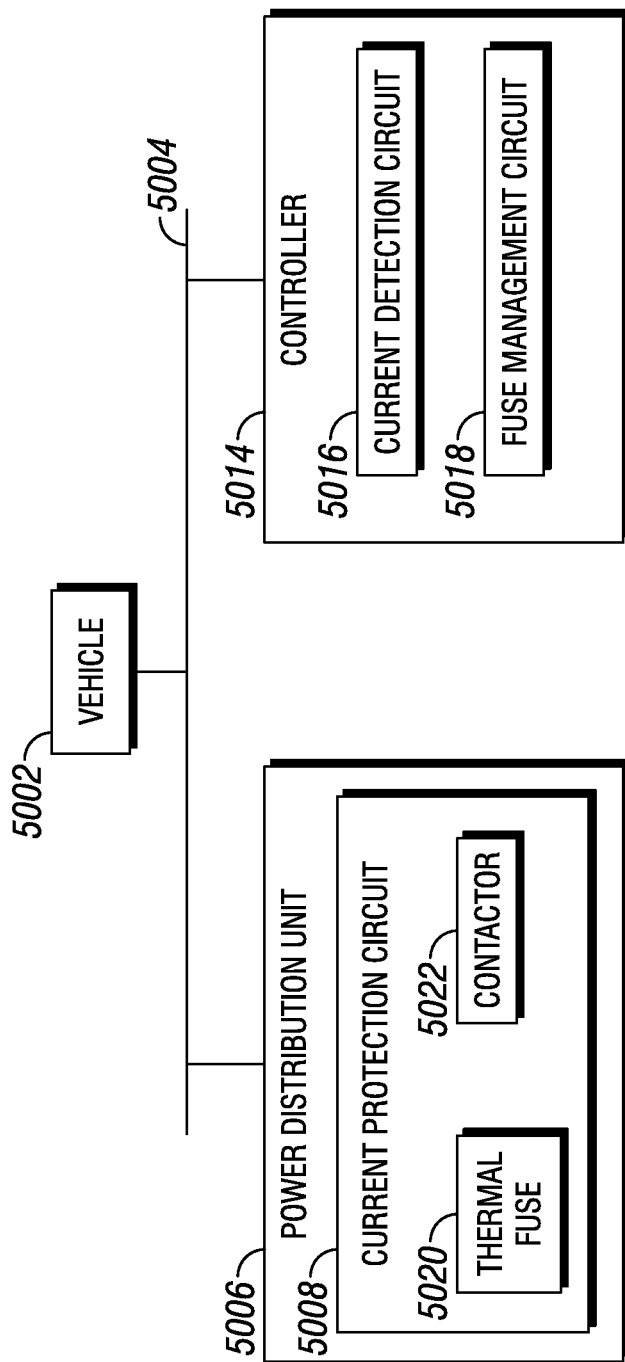
FIG. 50 depicts a schematic diagram of a vehicle having a PDU.

Referencing FIG. 50, an example system includes a vehicle 5002 having a motive electrical power path 5004; a power distribution unit 5006 having a current protection circuit 5008 disposed in the motive electrical power path 5004, where the current protection circuit includes: a thermal fuse 5020; and a contactor 5022 in a series arrangement with the thermal fuse 5020. The system further includes a controller 5014, including: a current detection circuit 5016 structured to determine a current flow through the motive electrical power path 5004; and a fuse management circuit 5018 structured to provide a contactor activation command in response to the current flow; and where the contactor 5022 is responsive to the contactor activation command.

Certain further aspects of an example system are described following, any one or more of which may be present in certain embodiments. An example system includes where the thermal fuse 5020 includes a current rating that is higher than a current corresponding to a maximum power throughput of the motive electrical power path 5004 (e.g., where the fuse is sized to avoid wear or degradation up to the maximum power throughput, where the fuse is sized to accommodate a higher power rating and/or a quick charging power throughput, etc.). An example system includes where the thermal fuse 5020 includes a current rating that is higher than a current corresponding to a quick charging power throughput of the motive electrical power path 5004. An example system includes where the contactor 5020 includes a current rating that is higher than a current corresponding to a maximum power throughput of the motive electrical power path 5004. In certain embodiments, the current corresponding to the maximum power throughput of the motive electrical power path 5004 may correspond to a current at nominal voltage, and/or a current at a degraded and/or failure mode voltage (e.g., as the battery pack ages, and/or if one or more cells are deactivated). An example system includes where the contactor 5022 includes a current rating that is higher than a current corresponding to a quick charging power throughput of the motive electrical power path 5004. An example system includes where the fuse management circuit 5018 is further structured to provide the contactor activation command as a contactor opening command in response to the current flow indicating a motive electrical power path protection event. An example current detection circuit 5016 determines the motive electrical power path protection event by performing at least one operation such as: responding to a rate of change of the current flow; responding to a comparison of the current flow to a threshold value; responding to one of an integrated or accumulated value of the current flow; and/or responding to one of an expected or a predicted value of any of the foregoing.

Figure 51:
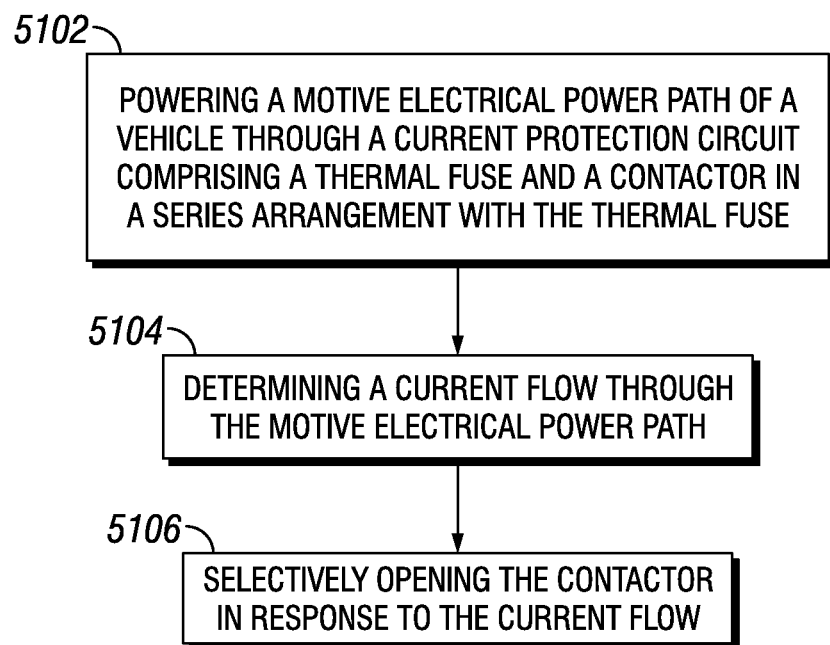
FIG. 51 depicts a schematic flow diagram of a procedure to operate a thermal fuse in series with a contactor.

Referencing FIG. 51, an example procedure includes an operation 5102 to power a motive electrical power path of a vehicle through a current protection circuit including a thermal fuse and a contactor in a series arrangement with the thermal fuse; and an operation 5104 to determine a current flow through the motive electrical power path; and an operation to selectively open the contactor in response to the current flow.

Certain further aspects of an example procedure are described following, any one or more of which may be present in certain embodiments. An example procedure further includes an operation to provide the thermal fuse having a current rating that is higher than a current corresponding to a maximum power throughput of the motive electrical power path. An example procedure includes an operation to provide the thermal fuse having a current rating that is higher than a current corresponding to a quick charging power throughput of the motive electrical power path. An example procedure includes an operation to provide the contactor having a current rating that is higher than a current corresponding to a maximum power throughput of the motive electrical power path. An example procedure includes an operation to provide the contactor having a current rating that is higher than a current corresponding to a quick charging power throughput of the motive electrical power path. An example procedure includes an operation to open the contactor is further in response to at least one of: a rate of change of the current flow; a comparison of the current flow to a threshold value; one of an integrated or accumulated value of the current flow; and/or an expected or predicted value of any of the foregoing.

Figure 52:
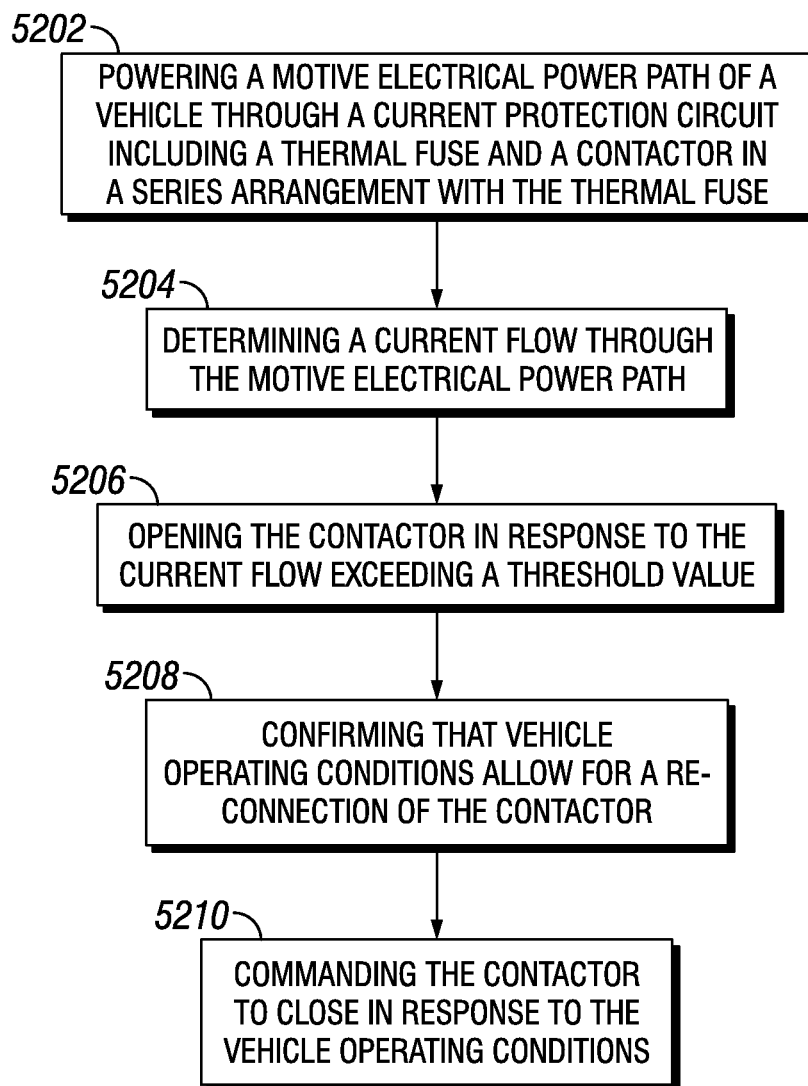
FIG. 52 depicts a schematic flow diagram of a procedure to re-connect a contactor.

Referencing FIG. 52, an example procedure includes an operation 5202 to power a motive electrical power path of a vehicle through a current protection circuit including a thermal fuse and a contactor in a series arrangement with the thermal fuse; an operation 5204 to determine a current flow through the motive electrical power path; an operation 5206 to open the contactor in response to the current flow exceeding a threshold value; an operation 5208 to confirm that vehicle operating conditions allow for a re-connection of the contactor, and an operation 5210 to command the contactor to close in response to the vehicle operating conditions. Previously known fused system, including systems having a controllable pyro-fuse, are not capable of restoring system power after an overcurrent event, as the fuse has opened the circuit and cannot be restored. Certain example embodiments throughout the present disclosure provide for a system that can open the circuit without activation of the fuse under certain circumstances. Accordingly, in certain embodiments, power can be restored after a high current event, providing for additional capability. However, in certain embodiments, it may be undesirable to restore power to the system, for example if the system is being accessed by emergency personnel and/or service after the overcurrent event. In certain embodiments, the controller is configured to perform certain checks, including checking current operating conditions and permissions, before attempting to restore power. Additionally or alternatively, the controller is configured to determine, during the attempted restoration of power and/or shortly thereafter, whether a condition causing an overcurrent event is still present. Additionally or alternatively, the controller is configured to determine whether the contactor or another electrical device has been damaged during the overcurrent event, or during the disconnection process being performed to halt the overcurrent event.

Certain further aspects of an example procedure are described following, any one or more of which may be present in certain embodiments. An example procedure further includes an operation to confirm the vehicle operating conditions, and in certain embodiments further includes determining at least one vehicle operating condition such as: an emergency vehicle operating condition; a user override vehicle operating condition; a service event vehicle operating condition; and a re-connection command communicated on a vehicle network. In certain embodiments, an emergency vehicle operating condition may indicate that a reconnection is desirable—for example where continued operation of the vehicle is more important than damage to the electrical system of the vehicle. In certain embodiments, an emergency vehicle operating condition may indicate that a reconnection is undesirable—for example where the vehicle has experienced an accident, and disconnection of power is desired to protect vehicle occupants and/or emergency response personnel. In certain embodiments, a service event vehicle operating condition indicates that a reconnection is desirable—for example where a servicing operator is requesting re-powering of the vehicle. In certain embodiments, a service event vehicle operating condition indicates that a reconnection is undesirable—for example when service personnel are performing service, maintenance, or repairs on the vehicle.

An example procedure includes an operation to monitor the motive electrical power path during the commanding the contactor to close, and re-opening the contactor in response to the monitoring (e.g., where the post-closing current and/or a current transient indicates that a condition causing the overcurrent may still be active). An example procedure includes an operation to determine an accumulated contactor open event description in response to the opening the contactor, and/or an operation to prevent the commanding the contactor to close in response to the accumulated contactor open event description exceeding a threshold value. For example, the accumulated contactor open event may be determined from a number of contactor open events under load, and/or according to a severity of those events. Where a number of open events under load are experienced, and/or where one or more severe open events are experienced, re-connection of the contactor may be undesirable to avoid the risk of further damage, overheating of the contactor, and/or sticking or welding of a damaged contactor that may prevent a subsequent re-opening of the contactor. An example procedure includes an operation to adjust the accumulated contactor open event description in response to the current flow during the opening of the contactor. An example procedure includes an operation to diagnose a welded contactor in response to one of the current flow during the opening the contactor, and/or a monitoring of the motive electrical power path during the commanding the contactor to close. An example procedure includes an operation to diagnose a welded contactor in response to a monitoring of at least one of a contactor actuator position (e.g., a failure of the actuator to respond as expected on command), a contactor actuator response, and/or the motive electrical power path during the opening the contactor. An example procedure further includes an operation to prevent the commanding the contactor to close in response to the diagnosed welded contactor.

Figure 53:
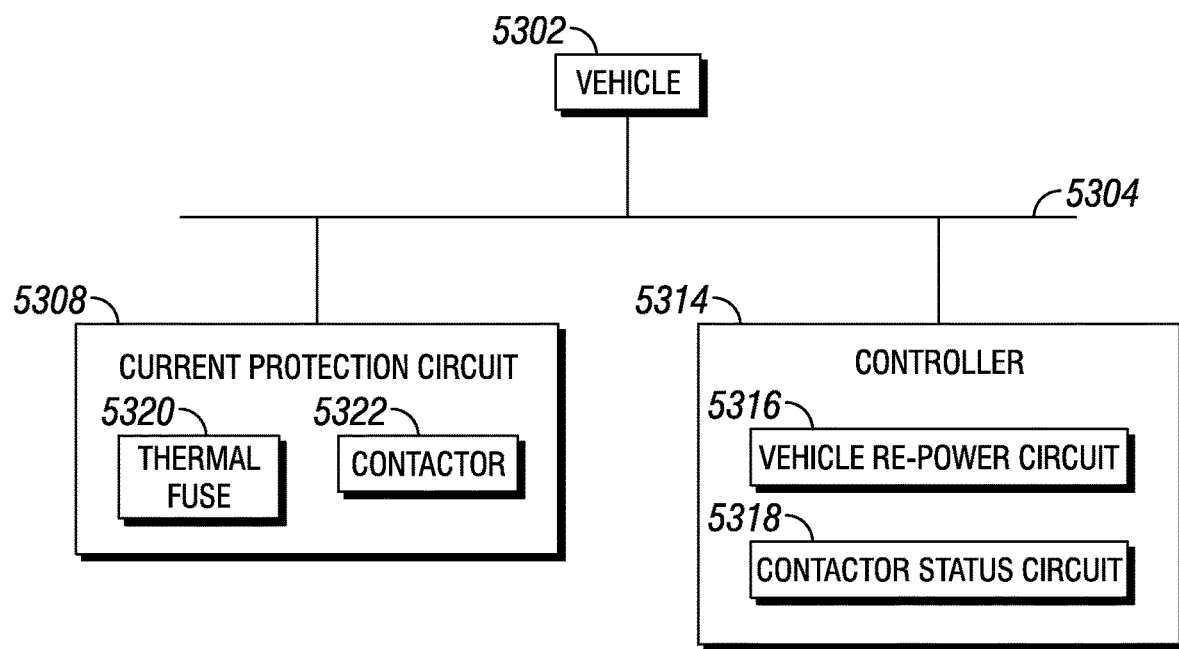
FIG. 53 depicts a schematic diagram of a vehicle having a PDU.

Referencing FIG. 53, an example apparatus includes a motive electrical power current protection circuit 5308 structured to: determine a current flow through a motive electrical power path 5304 of a vehicle; and open a contactor 5322 disposed in the current protection circuit 5308 including a thermal fuse 5320 and the contactor 5322 in a series arrangement with the thermal fuse 5320 in response to the current flow exceeding a threshold value. The apparatus further includes a vehicle re-power circuit 5316 structured to: confirm that vehicle operating conditions allow for a re-connection of the contactor, and to close the contactor 5322 in response to the vehicle operating conditions.

Certain further aspects of an example apparatus are described following, any one or more of which may be present in certain embodiments. An example apparatus includes where the vehicle re-power circuit 5316 is further structured to confirm the vehicle operating conditions by confirming at least one vehicle operating condition such as: an emergency vehicle operating condition; a user override vehicle operating condition; a service event vehicle operating condition; and a re-connection command communicated on a vehicle network (not shown). For example, a system may include an operator override interface (e.g., a button, a sequence of control inputs, or the like) that provide an input for the operator to request continued power operations where the motive electrical power current protection circuit 5308 has opened the contactor 5322 to protect the motive power system. In certain embodiments, operator access to the override is utilized by the vehicle re-power circuit 5316 to command a re-connection of the contactor. In certain embodiments, the re-connection by an operator input includes only allowing a re-connection for certain applications (e.g., an emergency or military vehicle), and/or only allowing a re-connection for a period of time (e.g., 10 seconds or 30 seconds), and/or only allowing a re-connection when the electrical conditions after the re-connection do not indicate that another overcurrent event is occurring. In certain embodiments, the vehicle re-power circuit 5316 additionally or alternatively may de-rate maximum power, de-rate the maximum power slew rate, provide a notification or warning to the operator during re-connection operations, and/or provide a notification or warning to the operator when a re-connection time period is about to expire (e.g., a first light or light sequence during re-connection operations, and a different light or light sequence when the re-connection time period is about to expire).

An example apparatus includes where the motive electrical power current protection circuit 5308 is further structured to monitor the motive electrical power path during the closing the contactor to close, and where the vehicle re-power circuit 5316 is further structured to re-open the contactor in response to the monitoring. An example apparatus includes a contactor status circuit 5318 structured to determine an accumulated contactor open event description in response to the opening the contactor 5322; where the vehicle re-power circuit 5316 is further structured to prevent the closing the contactor 5322 in response to the accumulated contactor open event description exceeding a threshold value; and/or where the contactor status circuit 5318 is further structured to adjust the accumulated contactor open event description in response to the current flow during the opening the contactor. An example apparatus includes a contactor status circuit 5318 structured to diagnose a welded contactor in response to one of, during the commanding the contactor to close: the current flow during the opening the contactor 5322, and/or a monitoring of the motive electrical power path by the motive electrical power current protection circuit 5308. An example apparatus includes a contactor status circuit 5318 structured to diagnose a welded contactor in response to a monitoring of, during the opening of the contactor, at least one of: a contactor actuator position by the vehicle re-power circuit 5316; a contactor actuator response by the vehicle re-power circuit 5316; and the motive electrical power path by the motive electrical power current protection circuit 5308; and/or where the contactor status circuit 5318 is further structured to prevent the closing the contactor in response to the diagnosed welded contactor.

An example system (e.g., referencing FIGS. 1 and 2) includes a vehicle having a motive electrical power path; a power distribution unit including: a current protection circuit disposed in the motive electrical power path, the current protection circuit including a thermal fuse and a contactor in a series arrangement with the thermal fuse; a high voltage power input coupling including a first electrical interface for a high voltage power source; a high voltage power output coupling including a second electrical interface for a motive power load; and where the current protection circuit electrically couples the high voltage power input to the high voltage power output, and where the current protection circuit is at least partially disposed in a laminated layer (e.g., referencing FIGS. 12 through 17) of the power distribution unit, where the laminated layer includes an electrically conductive flow path disposed between two electrically insulating layers.

Certain further aspects of an example system are described following, any one or more of which may be present in certain embodiments. An example system includes where current protection circuit includes a motive power bus bar disposed in the laminated layer of the power distribution unit. An example system includes where the vehicle further includes an auxiliary electrical power path; where the power distribution unit further includes: an auxiliary current protection circuit disposed in the auxiliary electrical power path, the auxiliary current protection circuit including a second thermal fuse; an auxiliary voltage power input coupling including a first auxiliary electrical interface for a low voltage power source; an auxiliary voltage power output coupling including a second auxiliary electrical interface for a an auxiliary load; and where the auxiliary current protection circuit electrically couples the auxiliary voltage power input to the auxiliary voltage power output, and where the auxiliary current protection circuit is at least partially disposed in the laminated layer of the power distribution unit. An example system includes where the laminated layer of the power distribution unit further includes at least one thermally conductive flow path disposed between two thermally insulating layers; where the at least one thermally conductive flow path is configured to provide thermal coupling between a heat sink (e.g., a cooling system, a housing or other system aspect having a high thermal mass, and/or ambient air), and a heat source, where the heat source includes at least one of the contactor, the thermal fuse, and the second thermal fuse; where the heat sink includes at least one of a thermal coupling to an active cooling source and a housing of the power distribution unit;

and/or further including a thermal conduit disposed between the at least one thermally conductive flow path and the heat source.

Figure 55:
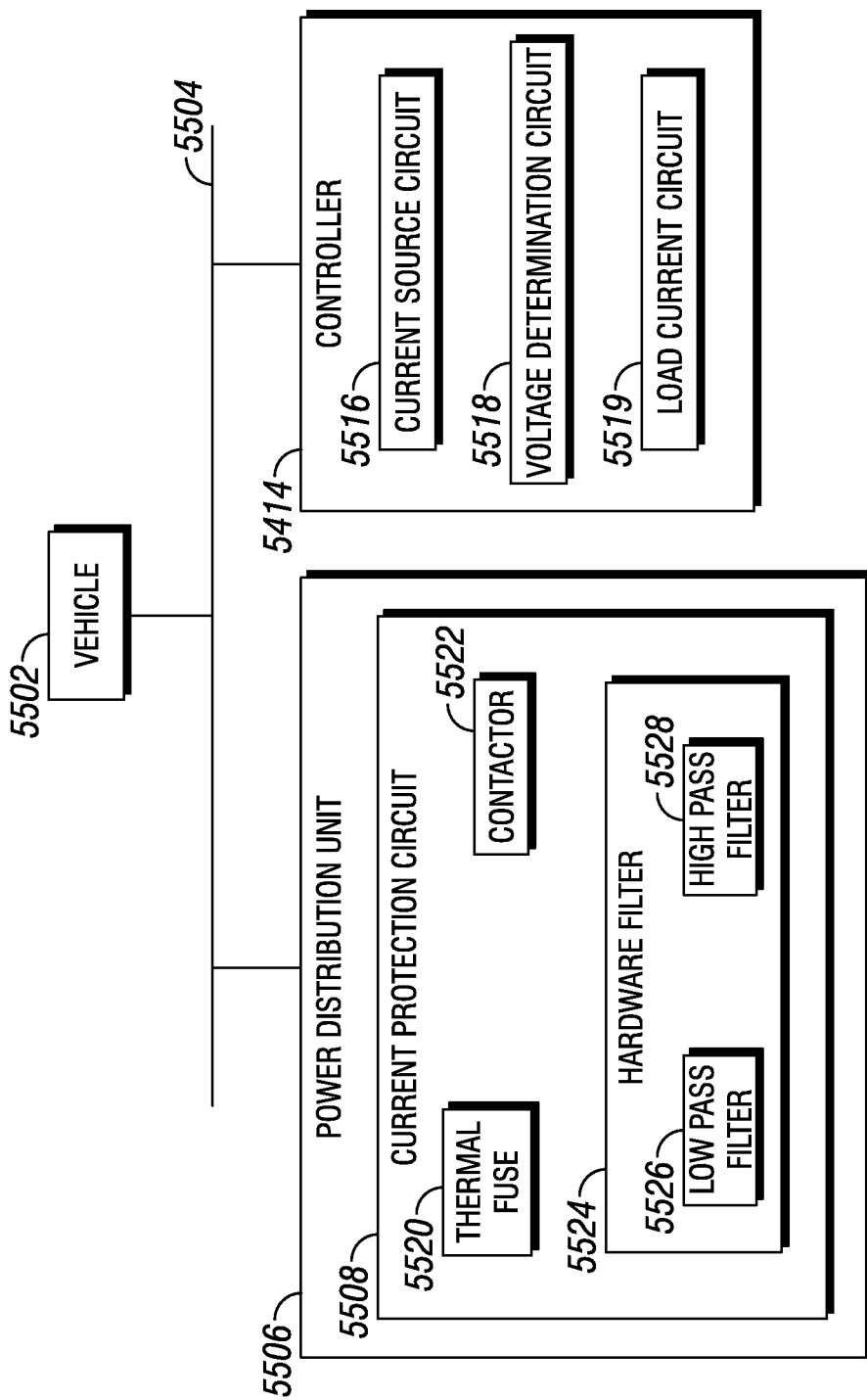
FIG. 55 depicts a schematic diagram of a vehicle having a PDU.

Referencing FIG. 55, an example system includes a vehicle 5502 having a motive electrical power path 5504; a power distribution unit 5506 including a current protection circuit 5508 disposed in the motive electrical power path 5504, the current protection circuit 5508 including a thermal fuse 5520 and a contactor 5522 in a series arrangement with the thermal fuse 5520; a current source circuit 5516 electrically coupled to the thermal fuse 5520 and structured to inject a current across the thermal fuse 5520 (e.g., using an op-amp driven current source); and a voltage determination circuit 5518 electrically coupled to the thermal fuse 5520 and structured to determine at least one of an injected voltage amount and a thermal fuse impedance value.

Certain further aspects of an example system are described following, any one or more of which may be present in certain embodiments. An example system includes where the motive electrical power path 5504 includes a direct current power path (e.g., the motive power path); where the current source circuit 5516 includes at least one of an alternating current source and a time varying current source, and further including a hardware filter 5524 electrically coupled to the thermal fuse 5520. In the example, the hardware filter 5524 is configured in response to an injection frequency of the current source circuit 5516; where the hardware filter 5524 includes a high pass filter 5526 having a cutoff frequency determined in response to the injection frequency of the current source circuit 5516 (e.g., to remove voltage fluctuations that are significantly lower than the injection AC frequency). An example system includes the hardware filter 5524 having a low pass filter 5528 having a cutoff frequency determined in response to at least one of the injection frequency of the current source circuit (e.g., to remove voltage fluctuations induced by the current injection) or a load change value of the motive electrical power path 5504 (e.g., to remove transient fluctuations caused by a change in the load). In certain embodiments, the high pass filtered voltage is analyzed separately from the low pass filtered voltage—e.g., where the base voltage signal is analyzed separately with a low pass filter applied and with a high pass filter applied, allowing for a separate determination of the response voltage to the injected current, and of the base voltage due to the current load. In certain embodiments, the voltage determination circuit 5518 is further structured to determine to determine an injected voltage drop of the thermal fuse in response to an output of the high pass filter, and/or where the voltage determination circuit 5518 is further structured to determine the thermal fuse impedance value in response to the injected voltage drop. In certain embodiments, the voltage determination circuit 5518 is further structured to determine a load voltage drop of the thermal fuse 5520 in response to an output of the low pass filter, and/or where the system further includes a load current circuit 5519 structured to determine a load current through the fuse in response to the thermal fuse impedance value (e.g., determined from the response voltage to the injected current), and further in response to the load voltage drop from the low pass filter.

Figure 54:
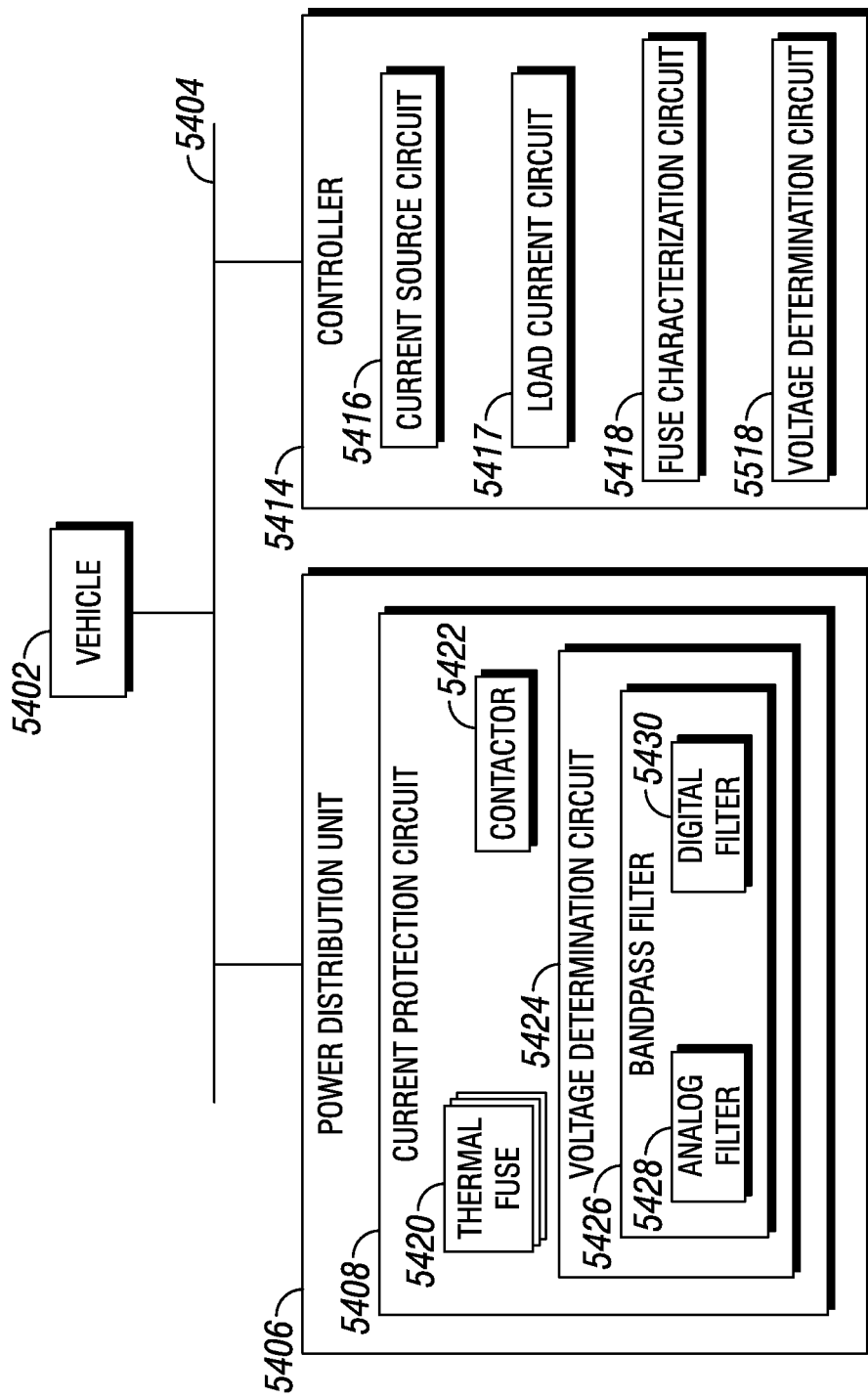
FIG. 54 depicts a schematic diagram of a vehicle having a PDU.

Referencing FIG. 54, an example system includes a vehicle 5402 having a motive electrical power path 5404; a power distribution unit 5406 including a current protection circuit 5408 disposed in the motive electrical power path 5404, the current protection circuit 5408 including a thermal fuse 5420 and a contactor 5422 in a series arrangement with the thermal fuse 5420. The example system further includes a current source circuit 5416 electrically coupled to the thermal fuse 5420 and structured to inject a current across the thermal fuse 5420; and a voltage determination circuit 5518 electrically coupled to the thermal fuse 5420 and structured to determine at least one of an injected voltage amount and a thermal fuse impedance value, where the voltage determination circuit 5518 includes a high pass filter (e.g., analog filter 5428, depicted in a bandpass filter 5426, but which may additionally or alternatively include a high pass filter) having a cutoff frequency selected in response to a frequency of the injected current.

Certain further aspects of an example system are described following, any one or more of which may be present in certain embodiments. An example system includes where the voltage determination circuit 5518 further includes a bandpass filter 5426 having a bandwidth selected to bound the frequency of the injected current. For example, where the frequency of the injected current is 200 Hz, the bandpass filter 5426 may be configured with cutoff frequencies of 190 Hz to 210 Hz, 195 Hz to 205 Hz, 199 Hz to 201 Hz, within 5% of the injected frequency, and/or within 1% of the injected frequency. One of skill in the art, having the benefit of the disclosures herein, can determine an appropriate injection frequency and/or range of injection frequencies to be utilized, and values for the high pass filter and/or the band pass filter to provide an appropriately conditioned voltage response determination to the injected current. Certain considerations for selecting an injected frequency and the band pass filter range include, without limitation, frequency components in electrical communication with the motive electrical power system including base frequencies and harmonics, the noise environment of the system, the desired accuracy of the thermal fuse impedance value determination, the dynamic response and capability of the current injector, the dynamic response and attenuation capability of the filters, the time available for performing an injection event, a number of fuses coupled to the current injector(s) that are to be checked, the desired time response for determining changes in the fuse impedance value, and/or the amount of statistical and/or frequency component analysis post-processing that is available on the controller 5414.

An example system includes where the high pass filter includes an analog hardware filter 5428, and where the bandpass filter 5426 includes a digital filter 5430. For example, the analog hardware filter 5428 may perform the high pass filtering function, and a downstream digital filter 5430 may perform a digital or analytical bandpass filtering function on the high pass filtered input. An example system includes where the high pass filter and the bandpass filter are both digital filters 5430. An example voltage determination circuit 5518 is further structured to determine the thermal fuse impedance value in response to the injected voltage drop from the high pass and band pass filtered input. An example system includes a fuse characterization circuit 5418 that stores a fuse resistance value and/or a fuse impedance value, and/or the fuse characterization circuit 5418 further updates the stored one of the fuse resistance value and the fuse impedance value in response to the thermal fuse impedance value. An example system includes where the fuse characterization circuit 5418 is further updates the stored one of the fuse resistance value and the fuse impedance value by performing at least one operation such as: updating a value to the thermal fuse impedance value (e.g., instantaneously or periodically replacing the stored value with the determined value); filtering a value using the thermal fuse impedance value as a filter input (e.g., moving continuously toward the determined value, such as with a selected time constant); rejecting the thermal fuse impedance value for a period of time or for a number of determinations of the thermal fuse impedance value (e.g., where a low trust and/or anomalous value is determined, setting the value aside or ignoring it for a period of time or selected number of determinations, and/or later confirming the value if it appears to be consistent over time); and/or updating a value by performing a rolling average of a plurality of thermal impedance values over time (e.g., utilizing a rolling buffer or other memory construct to replace older determinations with updated determinations). An example system includes where the power distribution unit 5406 further includes a number of thermal fuses 5420 disposed therein, and where the current source circuit 5416 is further electrically coupled to the number of thermal fuses (which maybe a single current source selectively coupled to various fuses, and/or separate current sources controllable by the current source circuit 5416). the example current source circuit 5416 further configured to sequentially inject a current across each of the number of thermal fuses (e.g., to check the thermal fuse impedance value and/or resistance for each of the fuses in a selected sequence). An example voltage determination circuit 5518 is further electrically coupled to each of the number of thermal fuses, and further structured to determine at least one of an injected voltage amount a thermal fuse impedance value for each of the number of thermal fuses. An example current source circuit 5416 is further configured to sequentially inject the current across each of the number of thermal fuses in a selected order of the fuses (e.g., the fuses need not be checked in any particular order, and need not be checked with the same frequency or the same number of times). An example current source circuit 5416 further structured adjusts the selected order in response to at least one of: a rate of change of a temperature of each of the fuses (e.g., a fuse that is changing temperature more quickly may be checked more frequently); an importance value of each of the fuses (e.g., a motive power fuse may be checked more frequently than a non-critical accessory fuse); a criticality of each of the fuses (e.g., a mission disabling fuse may be checked more frequently than another fuse); a power throughput of each of the fuses (e.g., similar to the rate of change of temperature, and/or indicative of the potential for increased wear or aging of the fuse); and/or one of a fault condition or a fuse health condition of each of the fuses (e.g., a fuse having a suspected or active fault, and/or a fuse that is worn or aged, may be checked more frequently to track the progress of the fuse, confirm or clear the diagnostic, and/or to more rapidly detect or respond to a failure). An example current source circuit 5416 is further structured to adjust the selected order in response to one of a planned duty cycle and an observed duty cycle of the vehicle (e.g., adjusting the fuse checking order and/or frequency based on the planned duty cycle of the vehicle or the motive power circuit, and/or based on the observed duty cycle of the vehicle or the motive power circuit, allowing adjustment for various applications and/or observed run-time changes). An example system includes where the current source circuit 5416 is further structured to sweep the injected current through a range of injection frequencies (e.g., ensuring robustness to system noise, informing a multi-frequency impedance model of the fuse, and/or passively or actively avoiding injected noise onto the power circuit including the fuse). An example current source circuit 5416 is further structured to inject the current across the thermal fuse at a number of injection frequencies (e.g., similar to a sweep, but using a selected number of discrete frequencies, which achieves some of the benefits of the sweep with more convenient filtering and processing, and includes updating the selected injection frequencies based on system changes such as loads, observed noise, and/or observed value of selected frequencies in characterizing the fuse). An example system includes where the current source circuit 5416 is further structured to inject the current across the thermal fuse at a number of injection voltage amplitudes. The injection voltage amplitude may be coupled with the injection current amplitude. Wherever an injection amplitude is described throughout the present disclosure, it is understood that an injection amplitude may be a current injection amplitude and/or a voltage injection amplitude, and in certain operating conditions these may be combined (e.g., selecting a voltage amplitude until a current limit in the current source is reached, selecting a current amplitude until a voltage limit in the current source is reached, and/or following an amplitude trajectory that may include a combination of voltage and/or current). An example system includes where the current source circuit 5416 is further structured to inject the current across the thermal fuse at an injection voltage amplitude determined in response to a power throughput of the thermal fuse (e.g., injecting a greater amplitude at high load to assist a signal-to-noise ratio, and/or a lower amplitude at high load to reduce the load on the fuse). An example system includes where the current source circuit 5416 is further structured to inject the current across the thermal fuse at an injection voltage amplitude determined in response to a duty cycle of the vehicle.

Figure 56:
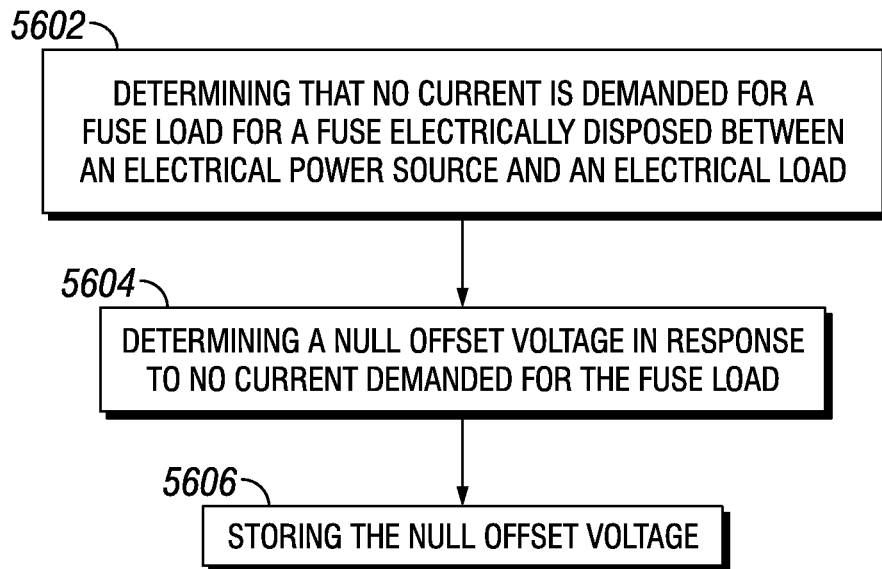
FIG. 56 depicts a schematic flow diagram of a procedure to determine a null offset voltage.

Referencing FIG. 56, an example procedure includes an operation 5602 to determine null offset voltage for a fuse current measurement system, including an operation 5604 to determine that no current is demanded for a fuse load for a fuse electrically disposed between an electrical power source and an electrical load; and the operation 5604 including determining a null offset voltage in response to the no current demanded for the fuse load; and an operation 5606 to store the null offset voltage.

Certain further aspects of an example procedure are described following, any one or more of which may be present in certain embodiments. An example procedure further includes an operation to update a stored null offset voltage in response to the determined null offset voltage. An example procedure includes an operation to diagnose a component in response to the null offset voltage, for example where a high null offset voltage indicates that a component in the system may not be operating properly. An example procedure includes an operation to determine which one of a plurality of components is contributing to the null offset voltage (e.g., by performing a null offset voltage determination with selected components coupled or de-coupled from the circuit having the fuse being checked). An example procedure includes an operation to determine that no current is demanded for the fuse load by performing at least one operation such as: determining that a key-off event has occurred for a vehicle including the fuse, the electrical power source, and the electrical load; determining that a key-on event has occurred for the vehicle; determining that the vehicle is powering down; and/or determining that the vehicle is in an accessory condition, where the vehicle in the accessory condition does not provide power through the fuse (e.g., a keyswitch accessory position for an application where the motive power fuse is not energized in the accessory position).

Figure 57:
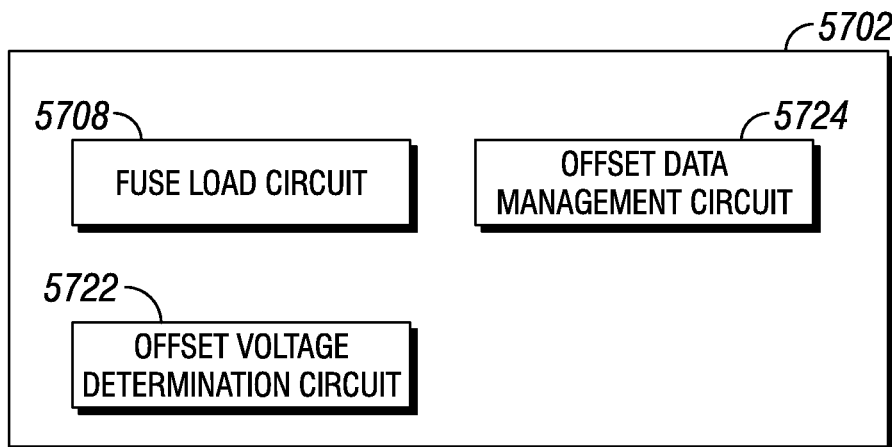
FIG. 57 depicts a schematic diagram of an apparatus for determining an offset voltage.

Referencing FIG. 57, an example apparatus to determine offset voltage to adjust a fuse current determination includes a controller 5702 having a fuse load circuit 5708 structured to determine that no current is demanded for a fuse load, and to further determine that contactors associated with the fuse are open; an offset voltage determination circuit 5722 structured to determine an offset voltage corresponding to at least one component in a fuse circuit associated with the fuse, in response to the determining that no current is demanded for the fuse load; and an offset data management circuit 5724 structured to store the offset voltage, and to communicate a current calculation offset voltage for use by a controller to determine current flow through the fuse.

Figure 58:
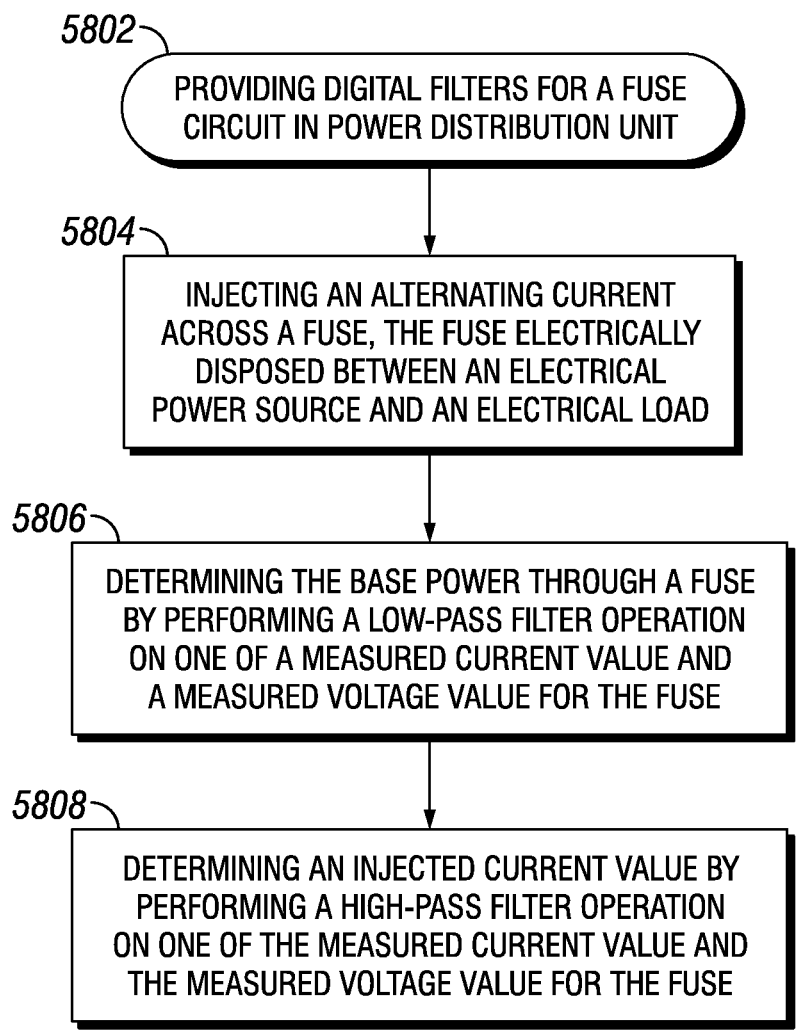
FIG. 58 depicts a schematic flow diagram of a procedure to determine an injected current value.

Referencing FIG. 58, an example procedure includes an operation 5802 to provide digital filters for a fuse circuit in a power distribution unit, including an operation 5804 to inject an alternating current across a fuse, where the fuse is electrically disposed between an electrical power source and an electrical load; an operation 5806 to determine the base power through a fuse by performing a low-pass filter operation on one of a measured current value and a measured voltage value for the fuse; and an operation 5808 to determine an injected current value by performing a high-pass filter operation on one of the measured current value and the measured voltage value for the fuse.

Certain further aspects of an example procedure are described following, any one or more of which may be present in certain embodiments. An example procedure further includes an operation to adjust parameters of at least one of the low-pass filter and the high-pass filter in response to a duty cycle of one of power and current through the fuse. An example procedure includes an operation to sweep the injected alternating current through a range of injection frequencies. An example procedure includes an operation to inject the alternating current across the fuse at a number of injection frequencies. An example procedure includes an operation where the current source circuit is further structured to inject the current across the fuse at a number of injection voltage amplitudes. An example procedure includes an operation where the current source circuit is further structured to inject the current across the fuse at an injection voltage amplitude determined in response to a power throughput of the fuse. In certain embodiments, the low-pass filter and/or the high-pass filter are digital filters, and where the adjusting parameters of the digital filters includes adjusting values for the digital filter(s). An example procedure includes further processing the measured voltage value with a digital bandpass filter after performing the high-pass filter, and determining a fuse resistance, fuse dynamic resistance, and/or fuse impedance value based on the high-pass and then bandpass filtered measured voltage value.

Figure 59:
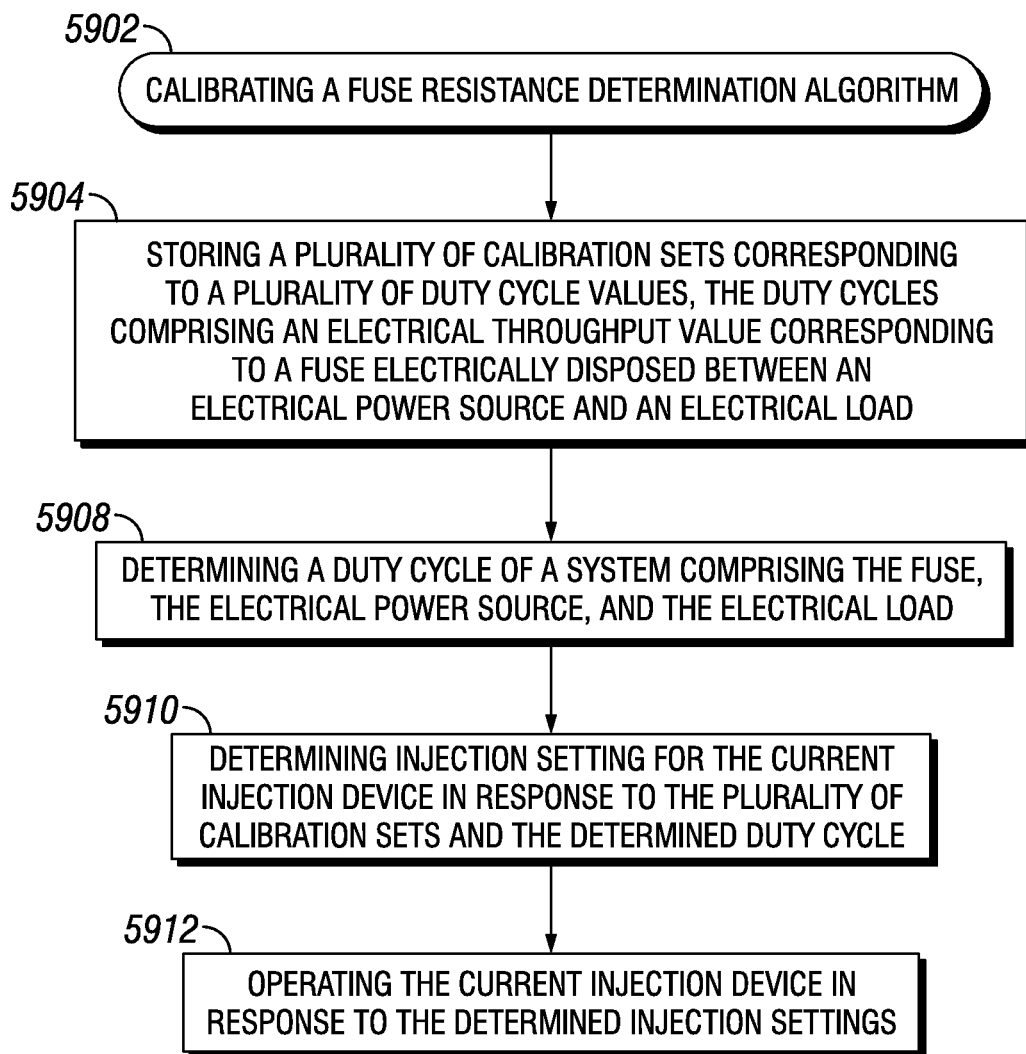
FIG. 59 depicts a schematic flow diagram of a procedure to calibrate a fuse resistance algorithm.

Referencing FIG. 59, an example procedure includes an operation 5902 to calibrate a fuse resistance determination algorithm, including: an operation 5904 to store a number of calibration sets corresponding to a number of duty cycle values, the duty cycles including an electrical throughput value corresponding to a fuse electrically disposed between an electrical power source and an electrical load. Example calibration sets include current source injection settings for a current injection device operationally coupled to the fuse, including injection frequencies, injection duty cycles (e.g., on-time for each cycle), injection waveform shapes, fuse sequence operations (e.g., the order and frequency to check each fuse), injection amplitudes, and/or injection run-times (e.g., the number of seconds or milliseconds for each injection sequence for each fuse, such as 130 ms, 20 ms, 1 second, etc.). The example procedure includes an operation 5908 to determine a duty cycle of a system including the fuse, the electrical power source, and the electrical load; an operation 5910 to determine injection settings for the current injection device in response to the number of calibration sets and the determined duty cycle (e.g., using the indicated calibration set according to the determined duty cycle, and/or interpolating between calibration sets); and an operation 5912 to operate the current injection device in response to the determined injection settings.

An example procedure further includes an operation where the calibration sets further comprise filter settings for at least one digital filter, where the method further includes determining the fuse resistance utilizing the at least one digital filter.

Figure 60:
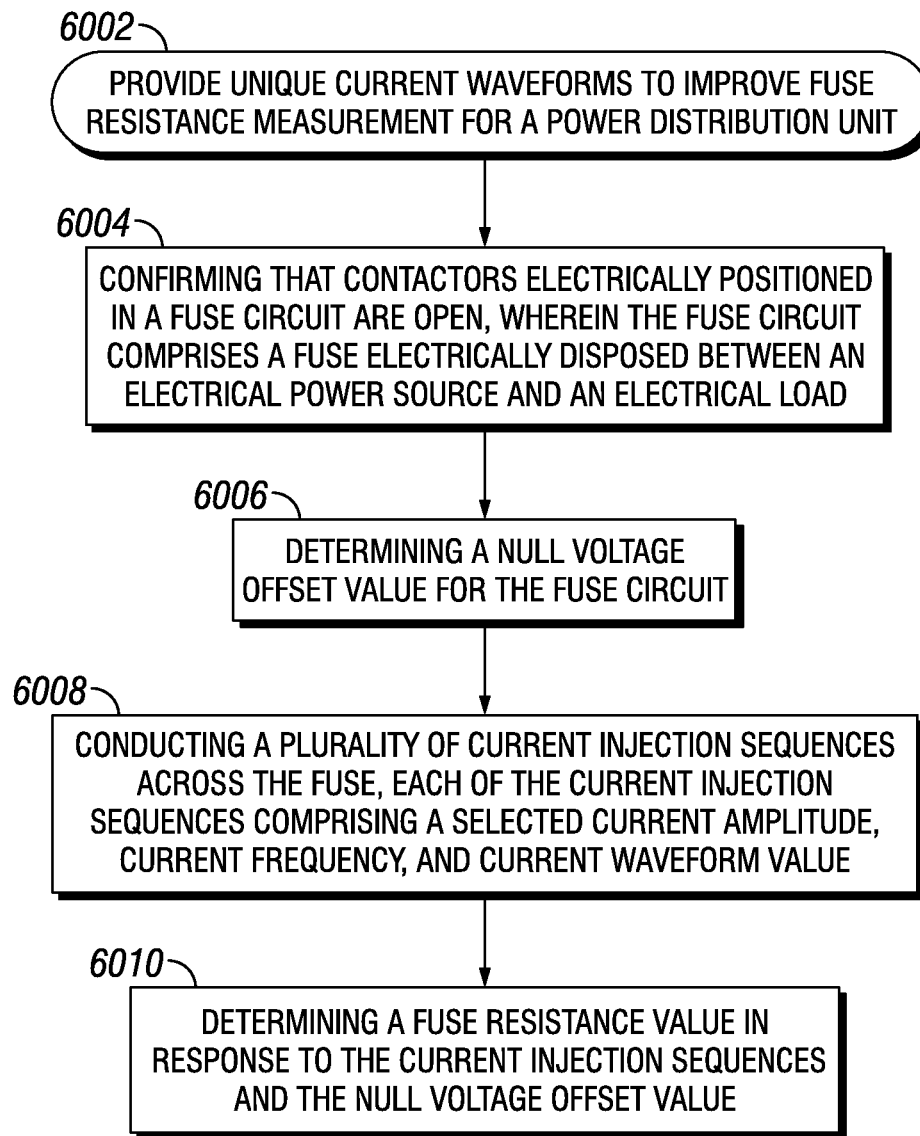
FIG. 60 depicts a schematic flow diagram of a procedure to determine a fuse resistance using a unique current waveform.

Referencing FIG. 60, an example procedure includes an operation 6002 to provide unique current waveforms to improve fuse resistance measurement for a power distribution unit. In certain embodiments, the procedure includes an operation 6004 to confirm that contactors electrically positioned in a fuse circuit are open, where the fuse circuit includes a fuse electrically disposed between an electrical power source and an electrical load, and/or an operation 6006 to determine a null voltage offset value for the fuse circuit. An example procedure includes an operation 6006 to conduct a number of current injection sequences across the fuse, where each of the current injection sequences includes a selected current amplitude, current frequency, and current waveform value. An example procedure further includes an operation 6010 to determine a fuse resistance value in response to the current injection sequences and/or the null voltage offset value.

Certain further aspects of an example procedure are described following, any one or more of which may be present in certain embodiments. An example procedure further includes an operation to adjust filtering characteristics for a digital filter in response to each of the number of current injection sequences, and to measure one of the fuse circuit voltage or the fuse circuit current with the digital filter during the corresponding current injection sequence using the adjusted filtering characteristics.

Figure 61:
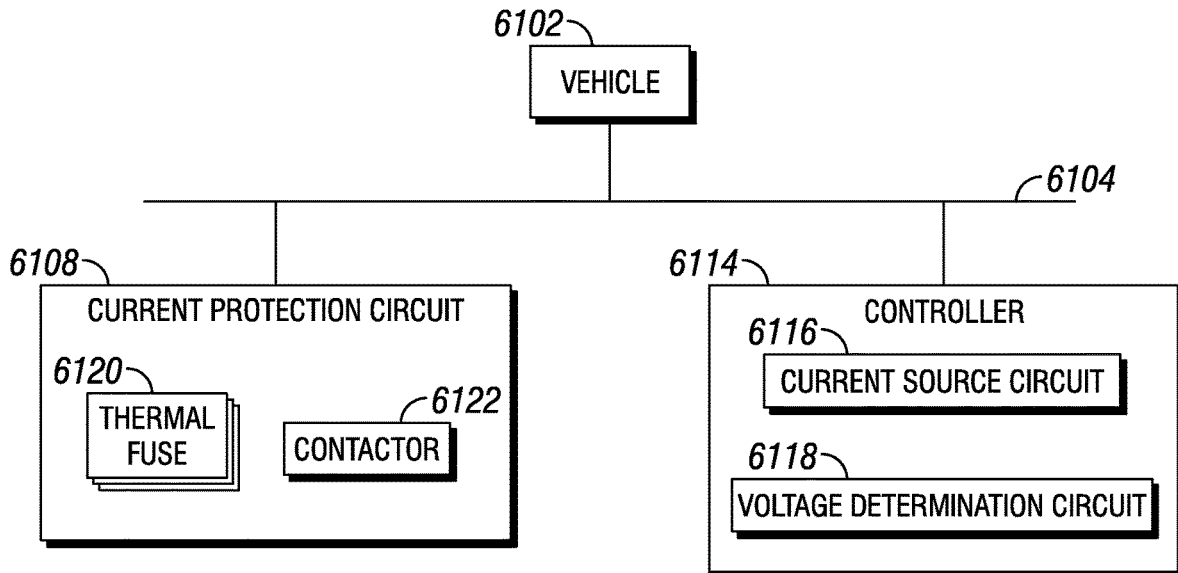
FIG. 61 depicts a schematic diagram of a vehicle having a current protection circuit.

Referencing FIG. 61, an example system includes a vehicle 6102 having a motive electrical power path 6104; a power distribution unit including a current protection circuit 6108 disposed in the motive electrical power path 6104, where the current protection circuit 6108 includes a thermal fuse 6120 and a contactor 6122 in a series arrangement with the thermal fuse 6120. The example system includes a controller 6114 having a current source circuit 6116 electrically coupled to the thermal fuse 6120 and structured to inject a current across the thermal fuse 6120, and a voltage determination circuit 6118 electrically coupled to the thermal fuse 6120 and structured to determine an injected voltage amount and a thermal fuse impedance value. The example voltage determination circuit 6118 is structured to perform a frequency analysis operation to determine the injected voltage amount. Example and non-limiting frequency analysis operations include applying analog and/or digital filters to remove frequency components of the fuse voltage that are not of interest and/or that are not related to the injected frequency. Example and non-limiting frequency analysis operations include utilizing at least one frequency analysis technique selected from the techniques such as: a Fourier transform, a fast Fourier transform, a Laplace transform, a Z transform, and/or a wavelet analysis. In certain embodiments, a frequency analysis operation is performed on filtered and/or unfiltered measurements of the thermal fuse voltage.

Certain further aspects of an example system are described following, any one or more of which may be present in certain embodiments. An example system includes where the voltage determination circuit 6118 further structured to determine the injected voltage amount by determining an amplitude of a voltage across the fuse at a frequency of interest; and/or where the frequency of interest is determined in response to a frequency of the injected voltage. An example system includes where the current source circuit 6116 is further structured to sweep the injected current through a range of injection frequencies. An example system includes where the current source circuit 6116 is further structured to inject the current across the thermal fuse 6120 at a number of injection frequencies. An example system includes where the current source circuit 6116 is further structured to inject the current across the thermal fuse 6120 at a number of injection voltage amplitudes. An example system includes where the current source circuit 6116 is further structured to inject the current across the thermal fuse 6120 at an injection voltage amplitude determined in response to a power throughput of the thermal fuse 6120. An example system includes where the current source circuit 6116 is further structured to inject the current across the thermal fuse 6120 at an injection voltage amplitude determined in response to a duty cycle of the vehicle 6102.

Figure 62:
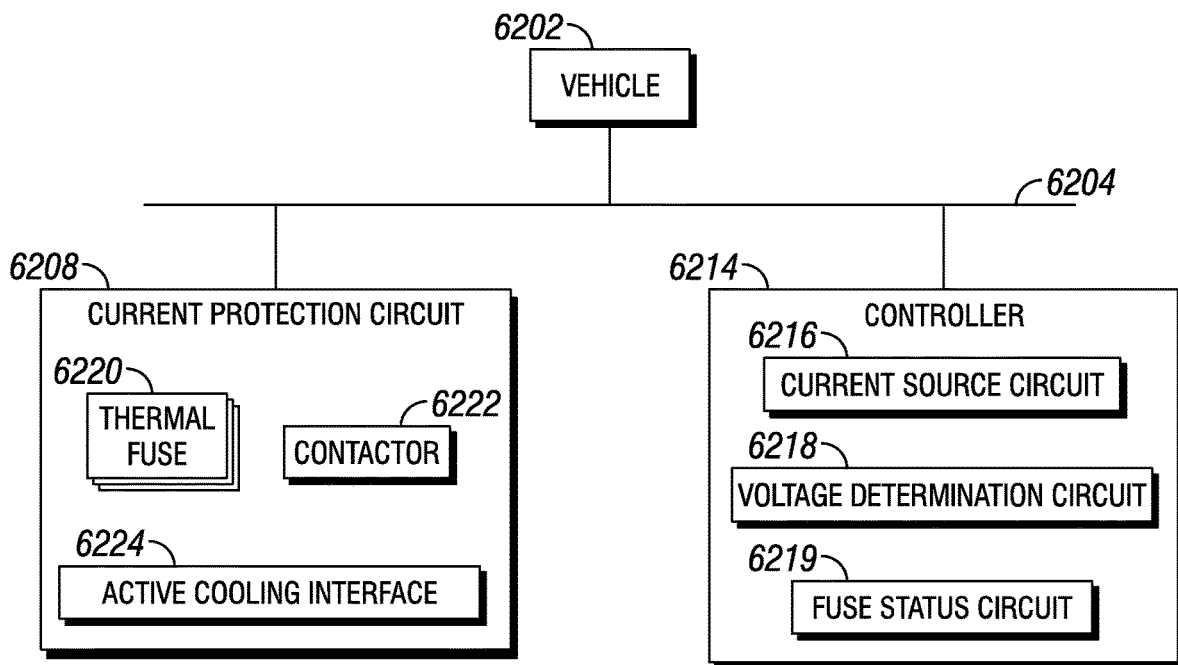
FIG. 62 depicts a schematic diagram of a vehicle having a current protection circuit.

Referencing FIG. 62, an example system includes a vehicle 6202 having a motive electrical power path 6204; a power distribution unit including a current protection circuit 6208 disposed in the motive electrical power path 6204, the current protection circuit 6208 including a thermal fuse 6220 and a contactor 6222 in a series arrangement with the thermal fuse. The example system further includes a controller 6214 having a current source circuit 6216 electrically coupled to the thermal fuse and structured to determine that a load power throughput of the motive electrical power path 6204 is low, and to inject a current across the thermal fuse 6220 in response to the load power throughput of the motive electrical power path 6204 being low. The controller 6214 further includes a voltage determination circuit 6218 electrically coupled to the thermal fuse 6220 and structured to determine at least one of an injected voltage amount and a thermal fuse impedance value, and where the voltage determination circuit 6218 includes a high pass filter having a cutoff frequency selected in response to a frequency of the injected current.

Certain further aspects of an example system are described following, any one or more of which may be present in certain embodiments. An example system includes where the current source circuit 6216 is further structured to determine the load power throughput of the motive electrical power path 6204 is low in response to the vehicle being in a shutdown state. An example system includes where the current source circuit 6216 is further structured to determine the load power throughput of the motive electrical power path 6204 is low in response to the vehicle being in a keyoff state. An example system includes where the current source circuit 6216 is further structured to determine the load power throughput of the motive electrical power path 6204 is low in response to a motive torque request for the vehicle being zero. An example system includes where the power distribution unit further includes a number of fuses, and where the current source circuit 6216 is further structured to inject the current across each of the fuses in a selected sequence; and/or where the current source circuit 6216 is further structured to inject the current across a first one of the plurality of fuses at a first shutdown event of the vehicle, and to inject the current across a second one of the plurality of fuses at a second shutdown event of the vehicle (e.g., to limit run-time of the controller 6214 during shutdown events that may be of limited duration, an example current source circuit 6216 checks only one or a subset of the fuses during a given shutdown event, only checking all of the fuses over a number of shutdown events).

Referencing FIG. 62, an example system includes a vehicle 6202 having a motive electrical power path 6204; a power distribution unit including a current protection circuit 6308 disposed in the motive electrical power path 6204, where the current protection circuit 6208 includes a thermal fuse 6220 and a contactor 6222 in a series arrangement with the thermal fuse 6220. An example system further includes a controller 6214 having a current source circuit 6218 electrically coupled to the thermal fuse 6220 and structured to inject a current across the thermal fuse 6220; and a voltage determination circuit 6218 electrically coupled to the thermal fuse 6220 and structured to determine at least one of an injected voltage amount and a thermal fuse impedance value. The example voltage determination circuit 6218 includes a high pass filter having a cutoff frequency selected in response to a frequency of the injected current. The example controller 6214 further includes a fuse status circuit 6219 structured to determine a fuse condition value in response to the at least one of the injected voltage amount and the thermal fuse impedance value. For example, a correlation between the fuse resistance (and/or dynamic resistance or impedance) may be established for a particular fuse or type of fuse, and the example fuse status circuit 6219 determines the fuse condition value in response to the observed fuse resistance or other related parameter. In certain embodiments, the fuse status circuit 6219 may additionally include other information, such as the power throughput accumulated through the fuse, power transient events accumulated and/or power excursion events accumulated through the fuse, temperature events and/or temperature transients accumulated by the fuse, and/or an operational longevity parameter such as hours of operation, miles of operation, hours of powered operation, or the like.

Certain further aspects of an example system are described following, any one or more of which may be present in certain embodiments. An example system includes where the fuse status circuit 6219 is further structured to provide the fuse condition value by providing at least one of a fault code or a notification of the fuse condition value (e.g., storing a parameter, communicating a fault parameter to a datalink, and/or providing a fault parameter to a service tool). An example fuse status circuit 6219 further adjusts a maximum power rating for the motive electrical power path 6204, a maximum power slew rate for the motive electrical power path; and/or adjusts a configuration of the current protection circuit in response to the fuse condition value (e.g., sharing a load between parallel fuses, bypassing the fuse at lower thresholds for power or power transients, etc.). An example power distribution unit further includes an active cooling interface 6224, and where the fuse status circuit 6219 further adjusts the active cooling interface 6224 in response to the fuse condition value (e.g., providing additional cooling for an aging fuse, and/or lowering a threshold for an active cooling increase request for an aging fuse). An example fuse status circuit 6219 is further structured to clear the at least one of the fault code or the notification of the fuse condition value in response to the fuse condition value indicating that the fuse condition has improved (e.g., where a previous indication from the fuse condition value indicated degradation, but continued observations indicate that degradation of the fuse is not present; upon a reset by an operator or a service technician, such as an indication that the fuse has been checked or changed, etc.). An example fuse status circuit 6219 is further structured to clear the at least one of the fault code or the notification of the fuse condition value in response to a service event for the fuse (e.g., through a service tool, planned sequence of inputs, or the like); where the fuse status circuit 6219 is further structured to determine a fuse life remaining value in response to the fuse condition value (e.g., through a correlation of the fuse condition value to the fuse life remaining value, and/or using a cutoff or threshold value of the fuse condition value to trigger an end-of-life condition or warning; for example it may be determined that a particular value of the fuse condition value indicates that the fuse is at 90% of a planned life, has 500 hours of operation remaining, etc.); where the fuse status circuit 6219 is further structured to determine the fuse life remaining value further in response to a duty cycle of the vehicle (e.g., in certain embodiments a heavier vehicle duty cycle will consume the remaining fuse life more quickly, which may be accounted for in determining the fuse life remaining value, and which may depend upon the units of fuse life remaining such as operating hours versus calendar days, and/or upon the notification type—e.g., a service light, a quantitative time remaining, etc.—to a service technician, operator, or the like); and/or where the fuse status circuit 6219 is further structured to determine the fuse life remaining value further in response to one of: an adjusted maximum power rating for the motive electrical power path, an adjusted maximum power slew rate for the motive electrical power path, and/or an adjusted configuration of the current protection circuit (e.g., where the fuse status circuit 6219 has adjusted system parameters such as power throughput, fuse loading and/or bypass configurations or thresholds, and/or cooling strategies, the fuse status circuit 6219 may account for the estimated life extension of the fuse due to these or any other mitigating strategies in place).

Figure 63:
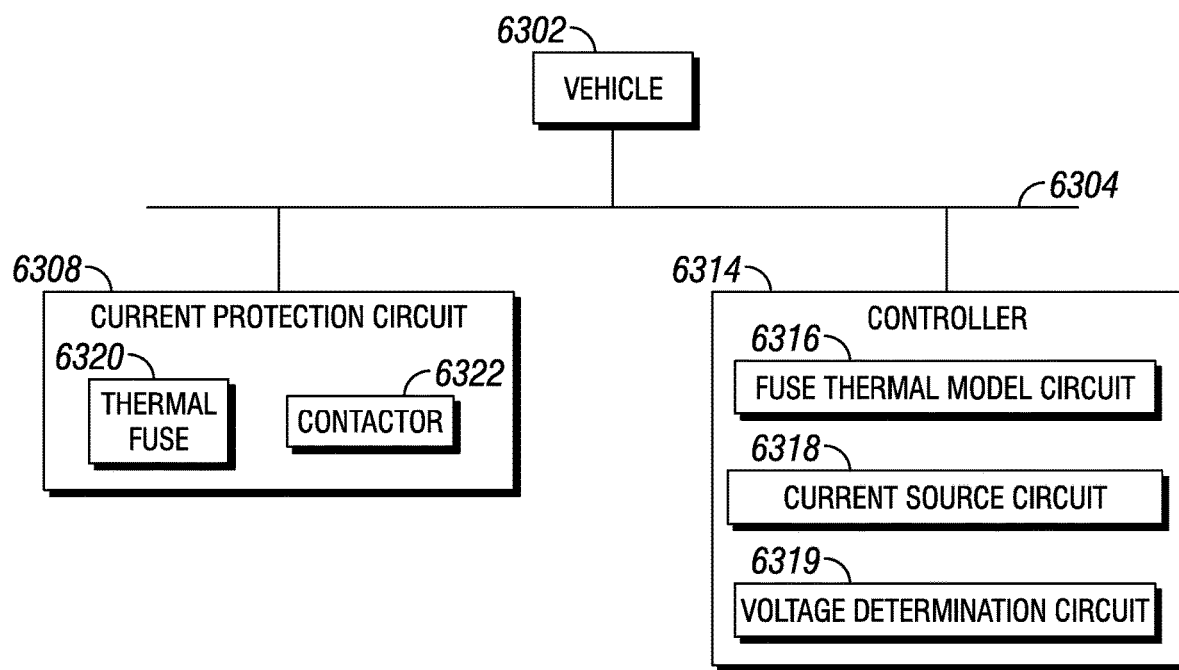
FIG. 63 depicts a schematic diagram of a vehicle having a current protection circuit.

Referencing FIG. 63, an example system includes a vehicle 6302 having a motive electrical power path 6304; a power distribution unit including a current protection circuit 6308 disposed in the motive electrical power path 6304, where the current protection circuit further includes a thermal fuse 6320 and a contactor 6322 in a series arrangement with the thermal fuse 6320. The example system further includes a controller 6314 having a fuse thermal model circuit 6316 structured to determine a fuse temperature value of the thermal fuse 6320, and to determine a fuse condition value in response to the fuse temperature value. An example system includes a current source circuit 6318 electrically coupled to the thermal fuse 6320 and structured to inject a current across the thermal fuse 6320; a voltage determination circuit 6319 electrically coupled to the thermal fuse 6320 and structured to determine at least one of an injected voltage amount and a thermal fuse impedance value, and where the voltage determination circuit 6319 includes a high pass filter having a cutoff frequency selected in response to a frequency of the injected current. An example fuse thermal model circuit 6316 further determines the fuse temperature value of the thermal fuse further in response to the at least one of the injected voltage amount and the thermal fuse impedance value. An example system includes where the fuse thermal model circuit 6316 is further structured to determine the fuse condition value by counting a number of thermal fuse temperature excursion events. Example thermal fuse temperature excursion events include: a temperature rise threshold value within a time threshold value, a temperature of the thermal fuse exceeding a threshold value, and/or more than one threshold of these (e.g., counting more severe occurrences as more than one temperature excursion event). An example system includes the fuse thermal model circuit is further determining the fuse condition value by integrating the fuse temperature value, integrating a temperature based index (e.g., based on temperatures and/or temperature change rates), and/or integrating the fuse temperature value for temperatures above a temperature threshold.

Figure 64:
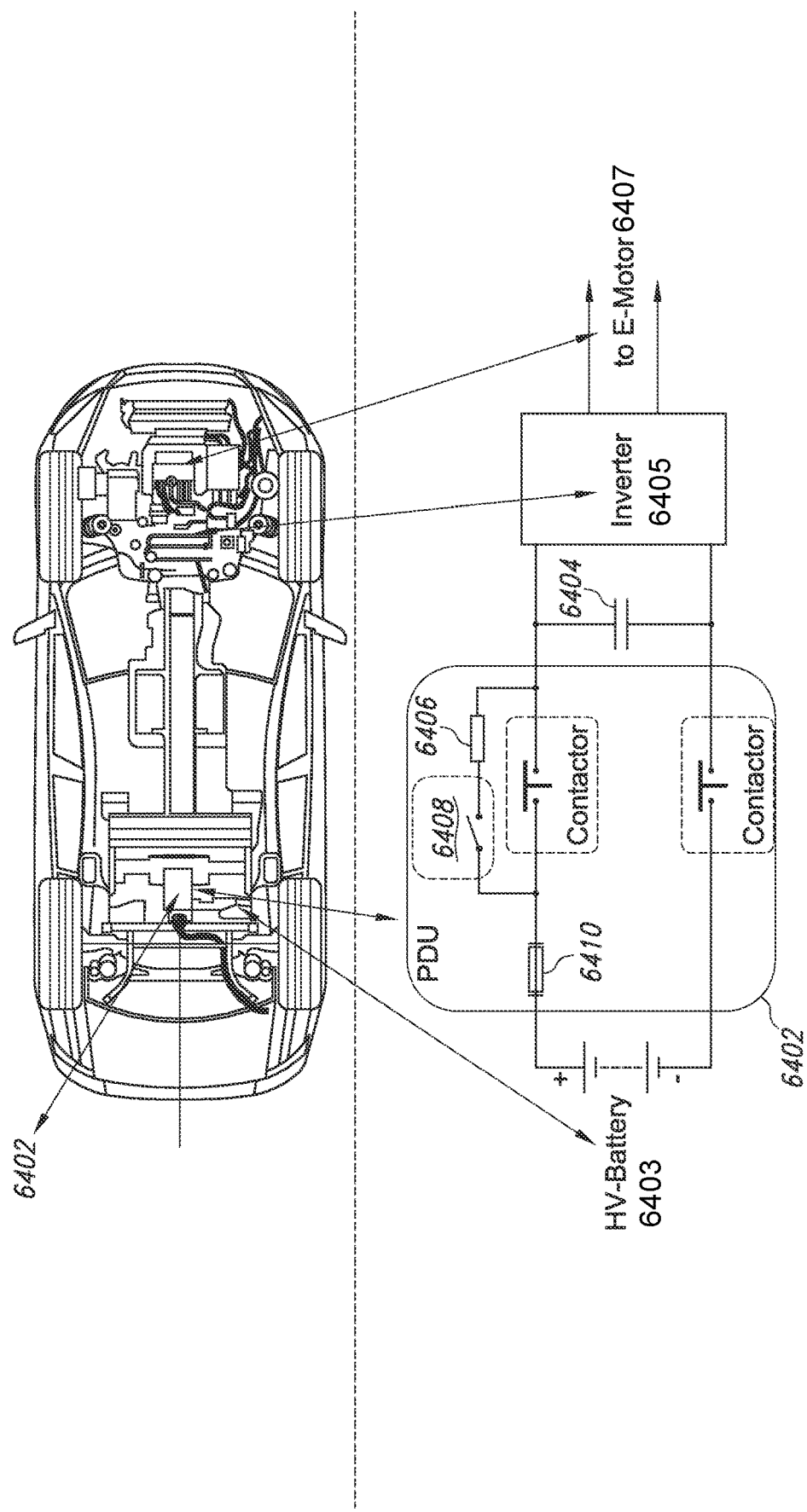
FIG. 64 depicts a schematic diagram of a vehicle having a PDU.

Referencing FIG. 64, an example previously known system is depicted having a contactor and fuse combination. The example system, for purposes of illustration, is provided as a part of a power distribution unit (PDU) 6402 for an electric or partially electric vehicle. The system includes electrical storage (e.g., a battery 6403) and a motor providing motive power for the vehicle. The electrical storage (or power storage) device may be of any type, including a battery 6403, a fuel cell, and/or a capacitor (e.g., a super-capacitor or a hyper-capacitor), and combinations of these (e.g., a capacitor included in the circuit to assist in peak power production or management of transient operations). In certain embodiments, the electrical storage device is rechargeable (e.g., any rechargeable battery technology such as lithium ion, nickel metal-hydride, or nickel-cadmium) or recoverable (e.g., a chemical based fuel cell having reversible chemistry to recover charge generating capability). In the example system, the battery operates as a DC device and the motor operates as an AC device, with an inverter 6405 positioned therebetween to condition power for the motor 6407. The example system includes filter capacitors 6404 providing conditioning for the main power circuit. The example system includes a low side contactor and a high side contactor. The high side contactor is in series with a fuse 6410 providing overcurrent protection for the circuit. The example system further includes a pre-charge circuit, depicted as a pre-charge relay 6408 and a pre-charge resistor 6406. In certain embodiments, the pre-charge relay 6408 is engaged before the high side contactor is engaged, allowing capacitive elements of the overall circuit to energize through the pre-charge resistor 6406, limiting in-rush currents or other charge-up artifacts on system start-up. It can be seen that overcurrent protection is provided by the system through the fuse 6410, and the characteristics of the fuse 6410 set the overcurrent protection for the motive circuit through the PDU. Additionally, the contactors are exposed to connection and disconnection events, including arcing, heating, and other wear.

Figure 65:
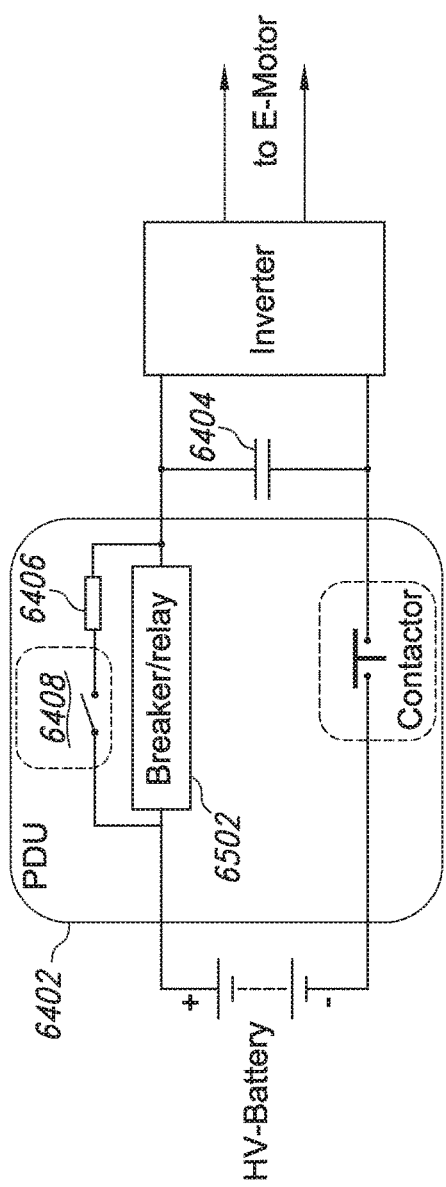
FIG. 65 depicts a schematic diagram of a breaker-relay and pre-charge relay.

Referencing FIG. 65, an example PDU 6402 of the present disclosure is schematically depicted. The example PDU 6402 is utilizable in a system such as that depicted in FIG. 64. The example PDU of FIG. 65 includes a breaker/relay 6502 component on the high side. The example arrangement of FIG. 65 is non-limiting, and any arrangement of the breaker/relay 6502 that provides designed overcurrent protection for a system using any of the principles described throughout the present disclosure is contemplated herein. The example PDU 6402 of FIG. 65 omits a fuse in series with a contactor, utilizing the breaker/relay 6502 for overcurrent protection. Any breaker/relay 6502 as described throughout the present disclosure may be utilized in a system such as that depicted in FIG. 65. The PDU 6402 of FIG. 65 additionally utilizes a pre-charge relay 6408 and a pre-charge resistor 6406, similar to that depicted in FIG. 64. In the example of FIG. 65, the breaker/relay 6502 is in parallel with the pre-charge circuit, and the relay portion of the breaker/relay 6502 may be engaged after the system has charged through the pre-charge circuit. As described throughout the present document, the breaker/relay 6502 provides for continuous and selectable overcurrent protection, while providing for full rated operation throughout range of designed operating current for the system. In previously known systems, a contactor/fuse arrangement necessarily provides for a gap in the operating range, either pushing fuse activation at least partially down into the operating current range, or moving fuse activation away from the rated range and providing for a gap in overcurrent protection above the rated current for the system. Additionally, as described throughout the present disclosure, the breaker/relay 6502 can provide for multiple current protection regimes, selectable current protection based on operating conditions, and provides for reduced wear on the contact elements of the breaker/relay relative to previously known contactors. Accordingly, a system such as that depicted in FIG. 65 can provide reliable, responsive, and recoverable overcurrent protection relative to previously known systems.

Figure 66:
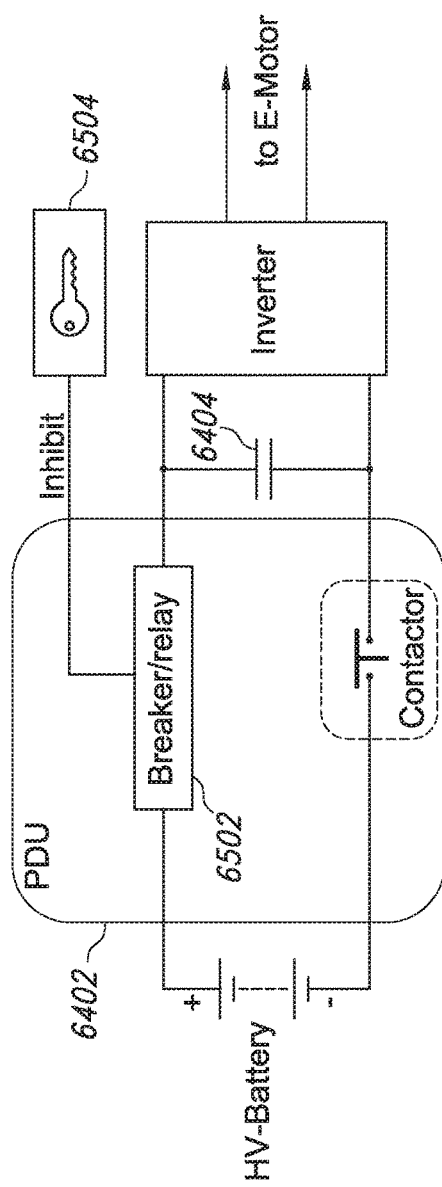
FIG. 66 depicts a schematic diagram of a breaker-relay and inhibit.

Referencing FIG. 66, an example PDU 6402 is schematically depicted. The example PDU 6402 is utilizable in a system such as that depicted in FIG. 1, and has features that may be additional to or alternative to features described with regard to FIG. 65. The example of FIG. 66 depicts an external input to the breaker/relay 6502 (Inhibit, with a schematic depiction of a keyswitch input 6504, in the example). The breaker/relay 6502 is responsive to the external signal in a configurable manner. For example, a keyswitch ON operation may be utilized to energize the breaker/relay 6502—either directly (e.g., hard-wiring the keyswitch circuit through a coil of the breaker/relay) or indirectly (e.g., receiving a network value representing the keyswitch position, receiving a voltage signal representing the keyswitch position, etc.), thereby charging the motive power circuit. In another example, a keyswitch OFF operation may be utilized to de-energize the breaker/relay 6502, thereby removing power from the motive power circuit. The external signal may be of any type or of several types, including external commands generated from any portion of the system, calculated values indicating whether power should be supplied or cut (e.g., a service event, a maintenance event, an accident indicator, an emergency shutdown command, a vehicle controller request, a device protection request for some device on the vehicle, a calculation that a temperature, voltage value, or current value has exceeded a threshold, etc.). The external signal may be supplied as a hard-wired signal (e.g., an electrical connection with a voltage representing the signal value), and/or as a communication (e.g., a datalink or network communication) which may be a wired or wireless communication, and may be generated by a controller on the PDU 6402 or external to the PDU 6402 (e.g., a vehicle controller, a power management controller, or the like). The example of FIG. 66 does not depict a pre-charge circuit for convenience of illustration, but embodiments such as those depicted in FIG. 65 or FIG. 66 may have a pre-charge circuit or omit a pre-charge circuit depending upon the characteristics of the system, the design goals and requirements for the system, and the like.

Figure 67:
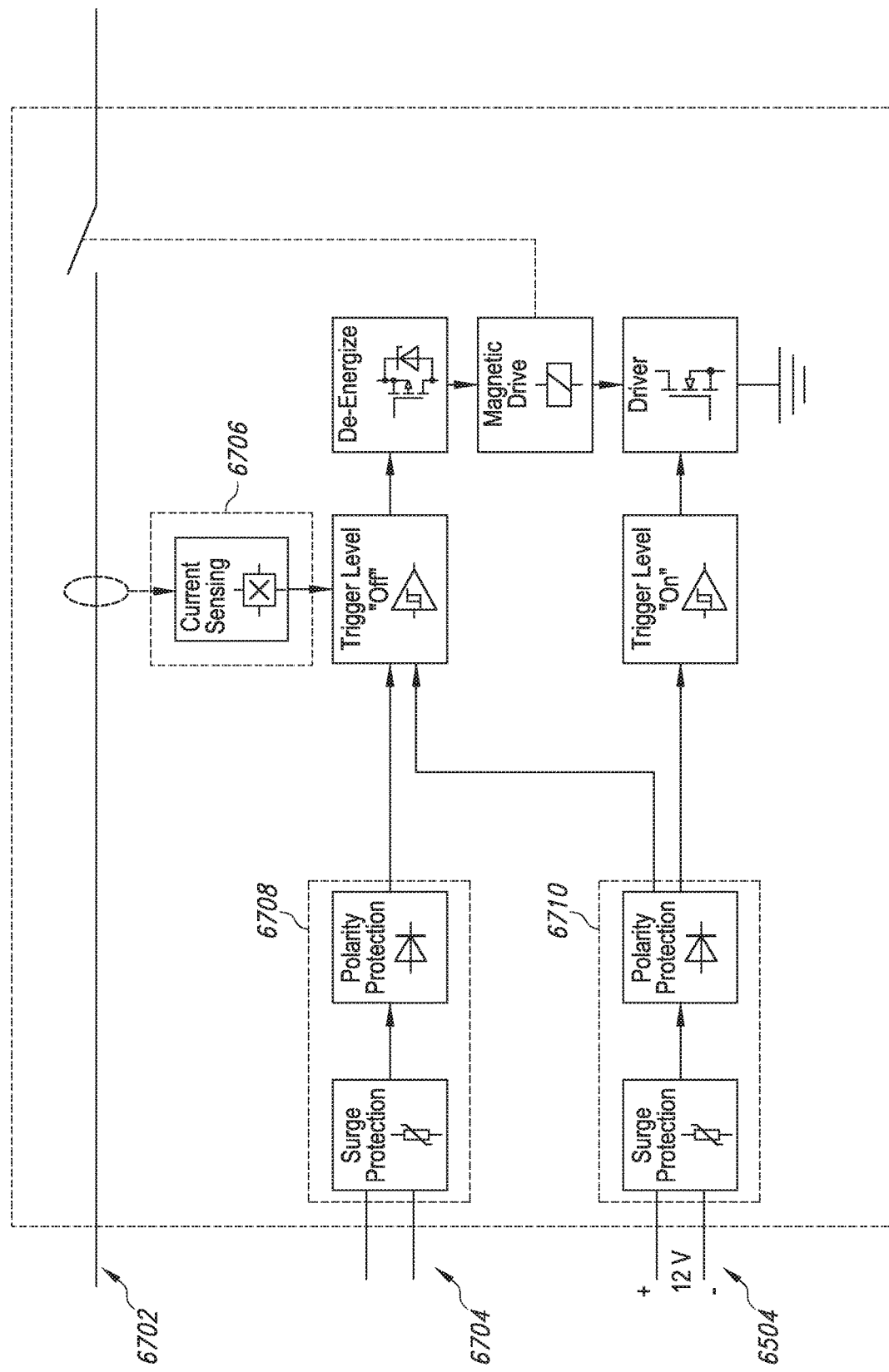
FIG. 67 depicts a schematic diagram of a power bus protection configuration.

Referencing FIG. 67, an example schematic block diagram of a breaker/relay is depicted. The example breaker/relay of FIG. 67 includes a power bus 6702 (e.g., the high voltage, motive power, load power, etc.) that operates the high voltage throughput and is connected or disconnected through a contact which is schematically depicted. A voltage that is a "high voltage" on the power bus may be any value, and depends upon the load being driven and other selection parameters for the system. In certain embodiments, a high voltage is any voltage above 42V, above 72V, above 110V, above 220V, above 300V, and/or above 360V. The voltage range may be different for a motive power load versus an auxiliary load (e.g., a PTO device, pump, or the like) and may be higher or lower than these ranges. In the example, the standard on/off 6504 or control voltage is depicted on the left side (depicted as 12 V, although any value such as 6 V, 12 V, 24 V, 42 V may be utilized). The standard voltage 6504 is depicted for purposes of illustration, although the standard voltage may additionally or alternatively be a datalink or network input (e.g., where the breaker/relay has independent access to control power) in communication with a controller of the breaker/relay. In certain embodiments, the standard voltage 6504 will be the same voltage as experienced at the keyswitch, by a vehicle controller, by auxiliary (e.g., not-motive or non-load) components in a system, or the like. In certain embodiments, the standard voltage 6504 will be the keyswitch 6504 signal. The standard voltage 6504 may be configured to be received through an input control isolation 6710.

Further in the example of FIG. 67, an auxiliary off isolation 6708 is depicted, which provides an input for auxiliary control of the breaker/relay. In certain embodiments, the auxiliary off isolation 6708 is coupled to an electrical input 6704, such as a selectable input at the standard voltage, an output from a controller (e.g., the controller providing electrical power as an output at a selected voltage to the auxiliary off isolation). In certain embodiments, the auxiliary off isolation 6708 may utilize a datalink or network input. In certain embodiments, for example where the breaker/relay has an internal controller, the standard on/off 6504 and the auxiliary off isolation input 6704 may be the same physical input—for example where a datalink input, network input, and/or controllable electrical signal (e.g., a controlled voltage value) provide the breaker/relay with information to determine the current requested state of the breaker/relay. In certain embodiments, the breaker/relay is a hardware only device that accepts a first voltage value at the standard on/off position, a second voltage value at the auxiliary off position, and responds through the hardware configuration of the breaker/relay to perform selected operations.

In the example of FIG. 67, the standard on/off input 6504 and the auxiliary off input 6704 include circuit protection components (e.g. isolations 6708, 6710), such as surge protection and polarity protection. The example breaker/relay includes a logic circuit that provides for energizing the relay (closing the contact on the power bus) when the standard on/off input 6504 is high, and de-energizing the relay (opening the contact on the power bus) when either the standard on/off input 6504 is low or the auxiliary off input is low 6704. In the example of FIG. 67, the logic circuit is depicted schematically, and may be implemented as hardware elements in the breaker/relay. Additionally or alternatively, a controller in the breaker/relay may interpret input voltages, datalink signals, and/or network communications to implement the logic and determine whether to open or close the relay. The logic in the present system is depicted as a "normally-open" relay that utilizes power to close (make contact), although the breaker/relay may be configured as a "normally-closed", latching, or any other logical configuration. Additionally or alternatively, the standard on/off inputs 6504 and/or the auxiliary off inputs 6704 may utilize logical highs or logical lows to implement operations of the breaker/relay.

The example breaker/relay of FIG. 67 additionally depicts a current sensing device 6706 ("current sensing") which may be a current sensor on the bus, a calculated current value based on other system parameters, a current value passed to the breaker/relay and/or a controller operatively coupled to the breaker/relay, or any other device, mechanism, or method to determine current values on the bus. In the example of FIG. 67, the current sensing device 6706 is coupled to the "trigger level 'off'" portion of the logical circuit, and operates to de-energize the relay when a high current value is sensed. The sensed high current value may be either a single threshold, for example as determined by the hardware in the logic circuit, and/or a selectable threshold, for example determined by a controller based on operating conditions or other values in the system. It can be seen that, either through hardware or utilizing a controller, functions of the sensed current value such as a rate of change, accumulated current value over a threshold, etc. may be utilized additionally or alternatively to the single sensed current value. It can be seen that a breaker/relay such as that depicted in FIG. 67 provides for controllable opening of the power bus circuit at a selected threshold current value and/or functions thereof, allowing for continuous operation throughout the range of rated current for the system. Additionally, a breaker/relay such as that depicted in FIG. 67 provides for a controllable disconnection of the power bus for any selected parameter which may not be current related, such as emergency shutdown operations, a request from somewhere else in the system (e.g., a vehicle controller), service or maintenance operations, or any other selected reason. Certain embodiments throughout the present disclosure provide for additional features of the breaker/relay, any one or more of which may be included in an embodiment such as that depicted in FIG. 67.

Figure 68:
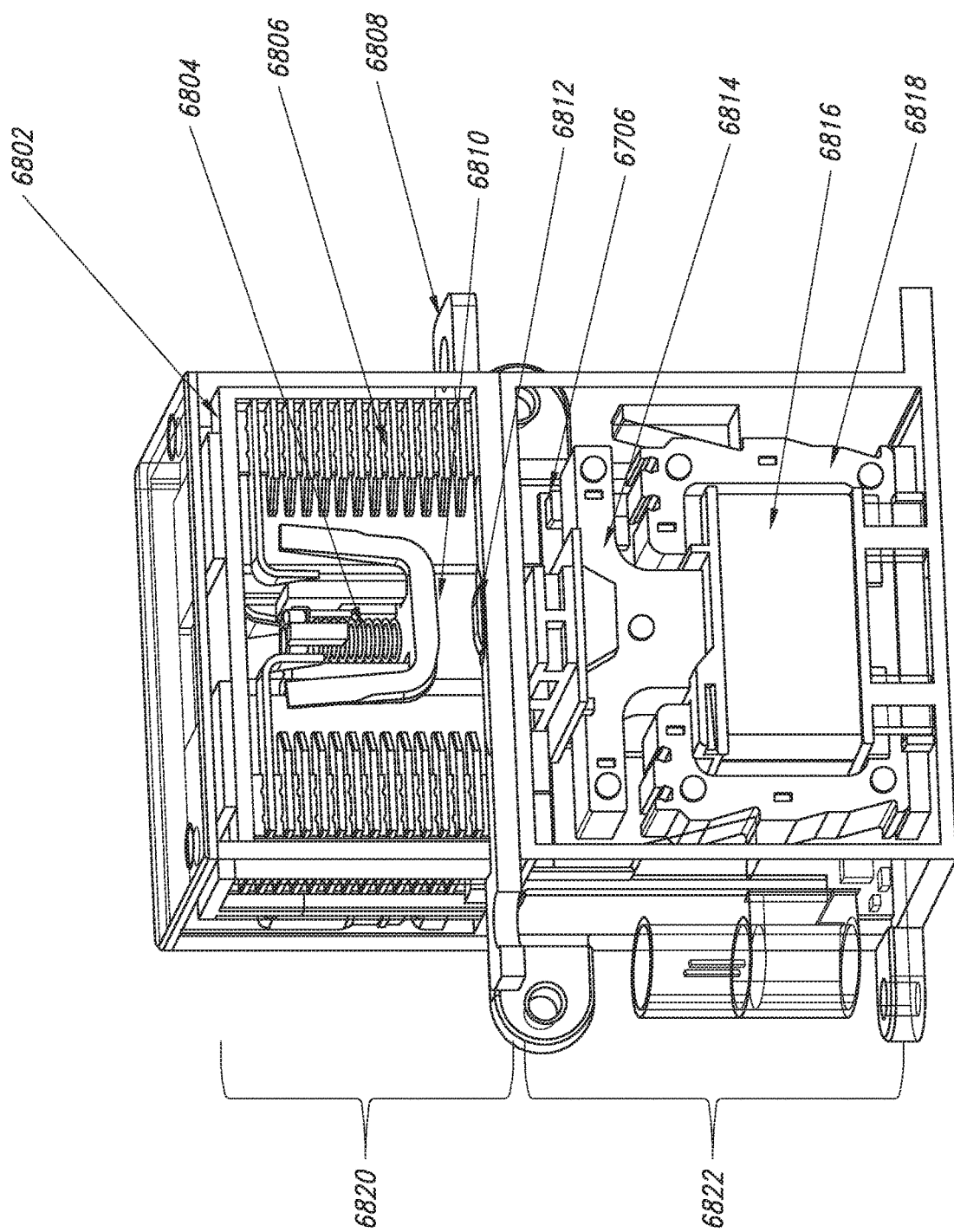
FIG. 68 depicts an embodiment detail of a breaker-relay component.

Referencing FIG. 68, an example breaker/relay is depicted schematically in a cutaway view. The example breaker/relay includes generally a switching portion 6820 (upper half, or "breaker") and an actuating portion 6822 (lower half, or "relay"). A few example components of the breaker/relay are depicted and described for illustration. The example breaker/relay includes a coil 6816 and magnet core 6818 in the relay portion. In the example, energizing the coil 6816 actuates the relay, pulling the armature 6814 down to the magnet core 6818. The armature 6814 is coupled to the movable contact 6810 in the upper portion, and is thereby moved into contact with the fixed contact 6812, completing the circuit and allowing current flow through the power bus. In the example of FIG. 68, the movable contact 6810 is pressed into the fixed contact 6812 by a contact force, which is a biasing spring 6804 of a selectable biasing force in the example of FIG. 68. The movable contact 6810 can be lifted from the fixed contact 6812 with sufficient force, compressing the contact force spring 6804, even if the armature 6814 is in the engaged (lower) position. The example of FIG. 68 depicts the armature 6814 in the disengaged (upper) position, where the movable contact 6810 is open or not in contact with the fixed contact 6812.

The breaker portion 6820 of the breaker/relay includes a number of splitter plates 6806 in proximity to a body of the main contact, and a permanent magnet system 6802 surrounding the splitter plates 6806 and/or the arcing path between the contact gap and the splitter plates 6806. During engagement or disengagement of the movable contact 6810 when the power bus is energized, the body of the main contact cooperates with the splitter plates 6806, in the presence of the magnetic fields provided by the permanent magnet system 6802, to dissipate and distribute the resulting arc, greatly reducing wear, degradation, and damage of the contacts. It has been shown that the combined aspects of the breaker portion greatly extend the life of the contacts and the switching chamber (e.g., due to lower arcing heat load over the life of the breaker/relay).

The current passing through the power bus generates a repulsive force between the contacts, or a Lorentz force. The Lorentz force is a complex function of the contact area of the contacts and the current value through the power bus. When the current is very high, the Lorentz force between the contacts sufficiently compresses the contact force spring 6804 to force the movable contact 6810 to lift off of the fixed contact 6812 and cause the relay to momentarily open. It has been found that the contact force spring 6804 can be readily tuned to provide for a physical disconnect of the contacts at a selectable value. Additionally or alternatively, the contact area between the contacts and other geometric aspects of the contacts can be manipulated to select or adjust the physical disconnect current. However, in certain embodiments, selection of the contact force spring 6804 provides for a straightforward tuning of the physical disconnect current. In certain embodiments, selection of the contact force spring 6804 includes changing the spring to change the physical disconnect current. Additionally or alternatively, the contact force spring 6804 can be adjusted in situ (e.g., compressing or releasing the spring axially) to adjust the physical disconnect current.

In certain embodiments, after the physical disconnect event (e.g., the movable contact 6810 is forced away from the fixed contact 6812, compressing the contact force spring 6812, while the armature 6814 is in the lower or contact position), the current through the power bus falls rapidly, and the Lorentz force decreases, causing the movable contact 6810 to be pushed by the contact force spring 6804 back toward an engaged position. In certain embodiments, the current sensor 6706 will have detected the high current event, triggering the coil 6816 to de-energize, and moving the armature 6814 back up to the disengaged position. Accordingly, as the movable contact 6810 returns to the engaged position, the armature 6814 has already moved it away such that the movable contact 6810 does not touch the fixed contact 6812 after a physical disconnect event. In certain embodiments, the threshold detected by the current sensor 6706 to disengage the armature 6814 is lower than the physical disconnect current, giving the armature 6814 a "head start" and decreasing the likelihood of a re-contact of the movable contact 6810 with the fixed contact 6812. In many systems, a re-contact between the movable contact 6810 and the fixed contact 6812 during a very high current event can result in significant damage to the breaker/relay and/or welding of the contacts.

Figure 69:
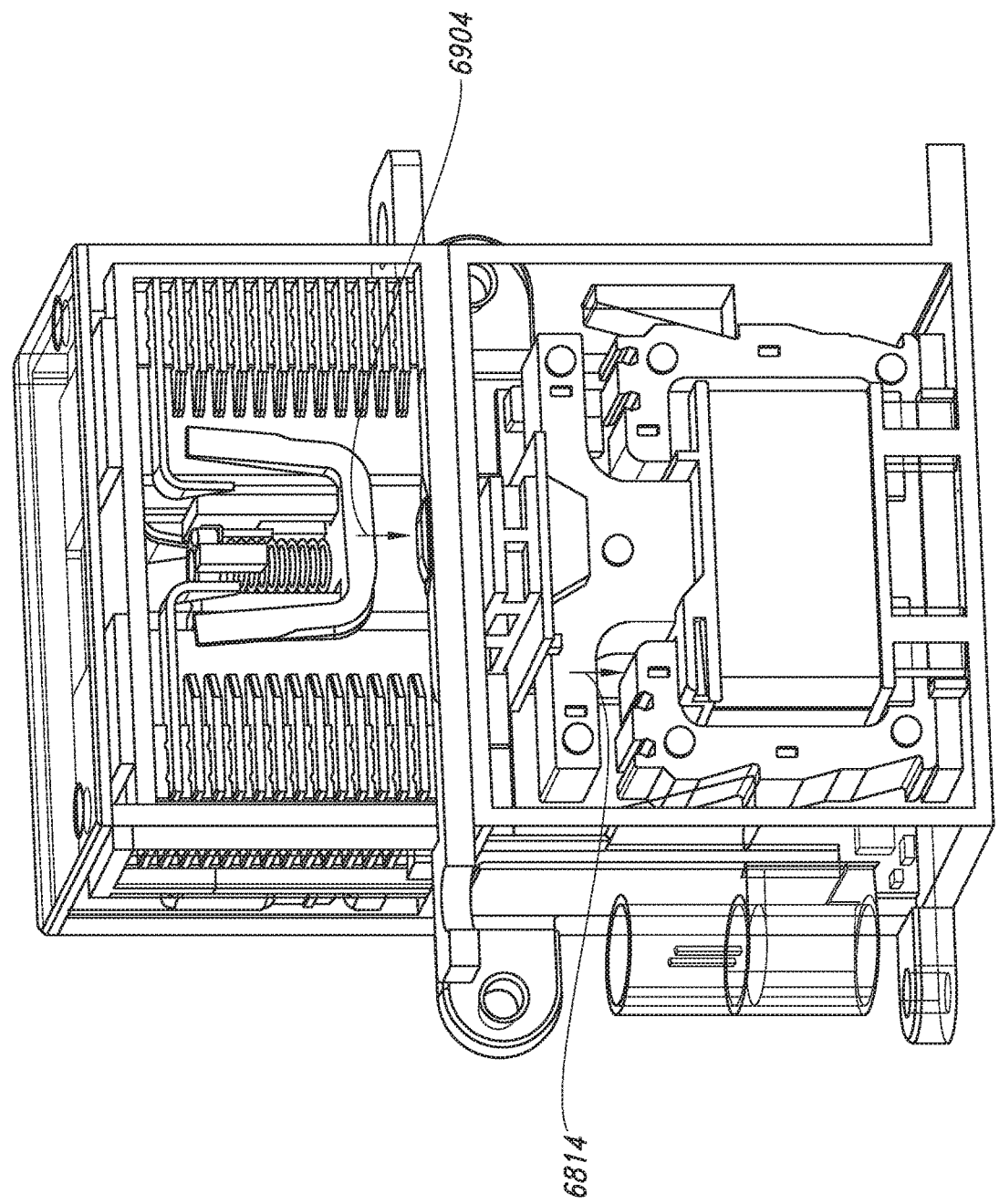
FIG. 69 depicts an embodiment detail of a breaker-relay component.

Referencing FIG. 69, an example breaker/relay is depicted showing the relative movement of the armature and the movable contact. In the example, the armature at the top enforces the movable contact away from the fixed contact, resulting in a disconnection of the power bus. The armature at the bottom pulls the moving contact down to engage the fixed contact, resulting in a connection of the power bus. The motion arrow 6904 in FIG. 69 references the movement of the armature that will occur as the armature moves from the open state to the closed state after the coil is energized. Any reference throughout the disclosure to "up" or "down" are for clarity of description, and do not reference actual vertical relationships of any components of the breaker/relay. A breaker/relay may be positioned such that movement of the armature is along any axis, including up-down, down-up, a horizontal orientation, and/or any other orientation. In certain embodiments, the armature returns to the up or disengaged position utilizing a passive element, such as a biasing spring or reverse spring (e.g., positioned between the armature and the permanent magnet, and/or a housing of one or more of these), resulting in a "normally-open" logical operation for the breaker/relay. The biasing spring or reverse spring does not appear in the schematic cutaway view of FIG. 69. As described throughout the present disclosure, the breaker/relay may be normally-open, normally-closed, latching, or in any other logical configuration, with appropriate adjustments to the hardware and/or control elements to provide such a configuration.

Figure 69A:
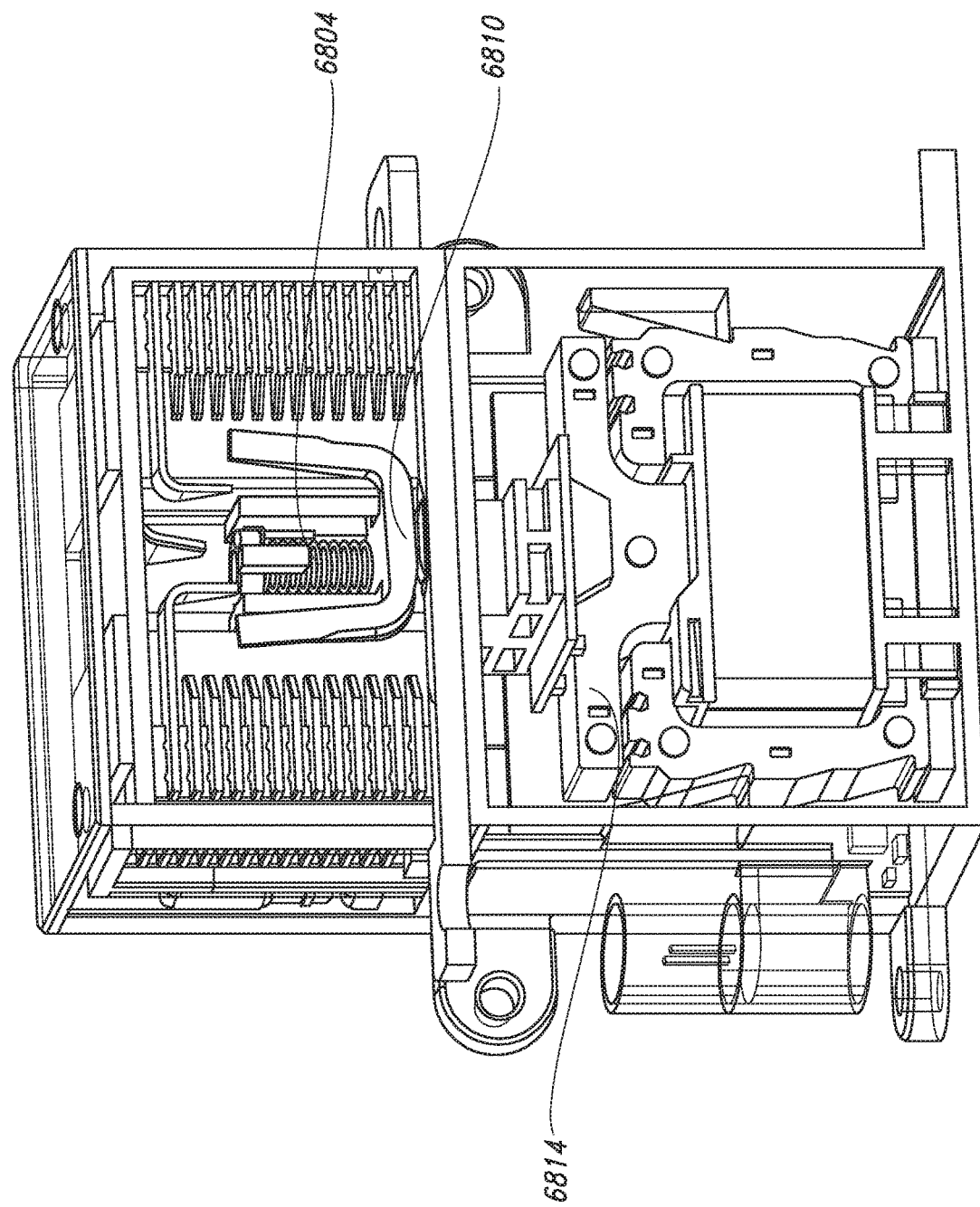
FIG. 69A depicts an embodiment detail of a breaker-relay component.

Referencing FIG. 69A, an example breaker/relay is depicted in a closed position. The armature in the example of FIG. 69A has moved down, and the movable contact 6810 has additionally moved down with the armature 6814 to an engaged position with the fixed contact, closing the circuit and allowing power to pass through the power bus. The contact force spring 6804 in the position depicted in FIG. 69A is compressed, providing a contact force to the movable contact 6810 against the fixed contact. It can be seen that the movable contact is provided with movement space, where a force sufficient to overcome the contact force 6804 spring can lift the movable contact 6810 off of the fixed contact, thereby opening the circuit and preventing power to pass through the power bus.

Figure 70:
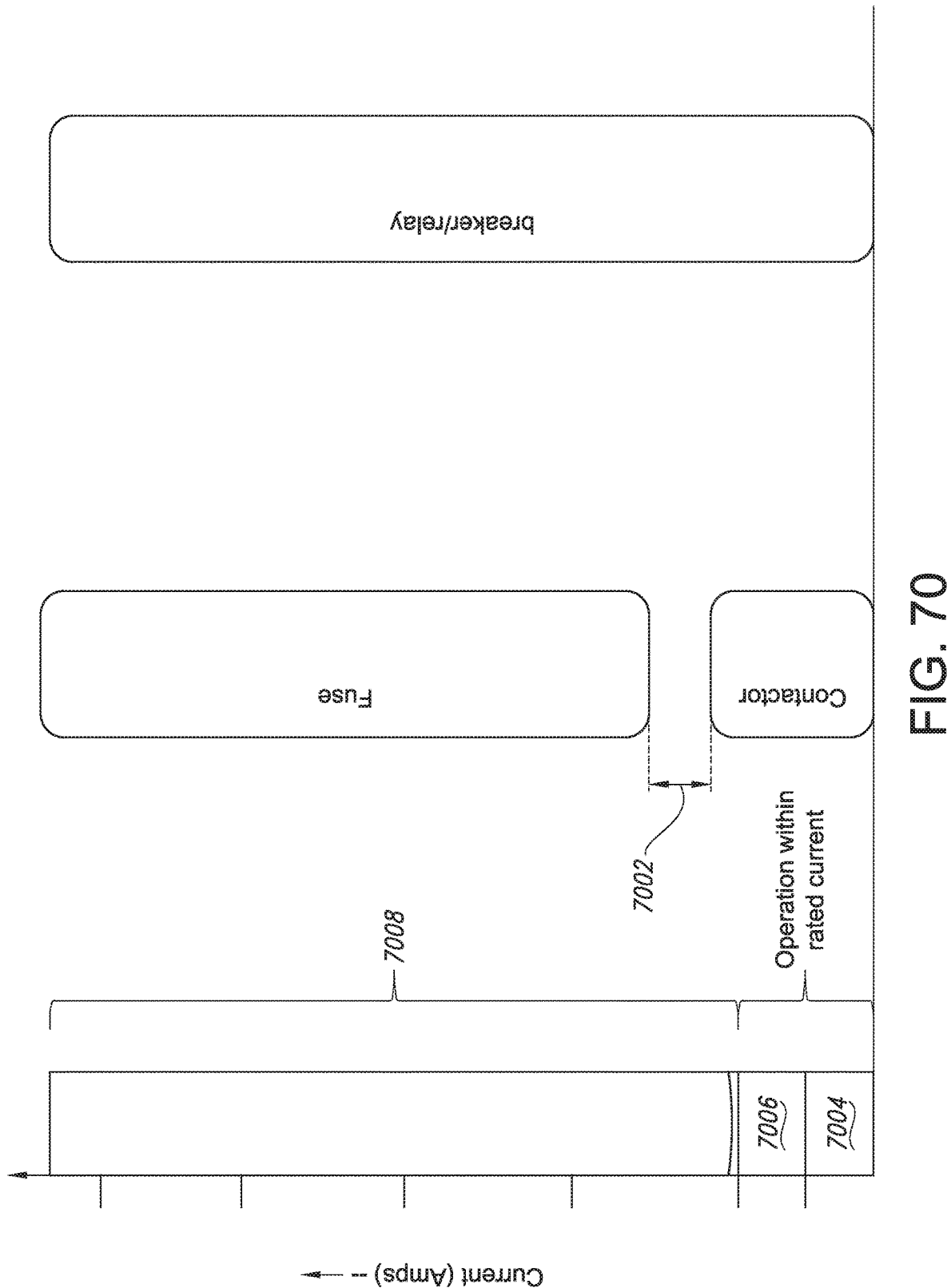
FIG. 70 depicts a current plot for a contactor-fuse and breaker-relay.

Referencing FIG. 70, an operating diagram for a previously known contactor-fuse system and a breaker/relay system consistent with embodiments of the present disclosure are depicted schematically. In the example of FIG. 70, an operating current bar is depicted at the left, having two general operating regimes—operation within rated current values (e.g., within designed current limits for a system, such as regions 7004, 7006) and operation above rated current values (e.g., region 7008). Additionally, in the example of FIG. 70, operations within the rated current are sub-divided into a lower region 7004 and an upper region 7006. In the example of FIG. 70, the lower region 7004 and upper region 7006 are illustrative examples to depict operating modes within the rated current region—for example the lower region 7004 may be associated with lower power operation such as operation of accessories and the upper region 7006 may be associated with higher power operation such as provision of motive power or pumping power. The regions 7004, 7006 provide for a notional distinction between operating conditions, and the actual operations that occur within the lower region 7004 and upper region 7006 are not important for the illustration of FIG. 70. For example, an upper region 7006 for one illustrative system may be motive power to move a vehicle (e.g., where the lower region 7004 is another function such as power to communications or accessories), where a lower region 7004 for another illustrative system may be motive power to move a vehicle (e.g., where the upper region 7006 is another function such as charging or high performance motive power).

In the example of FIG. 70, an operation region for the contactor-fuse system is depicted in the middle. The contactor provides for full operation up to the rated power. A design choice may allow for the contactor to provide operation slightly above rated power (e.g., where system risk is accepted to provide higher capability) or slightly below rated power (e.g., where system performance is compromised to protect the system components). The contactor-fuse system further includes an operating region for the fuse, where the fuse activates at a selected current value. It can be seen that an operational gap 7002 occurs, where the fuse does not activate due to the low current value, but the contactor also does not support operations in the gap 7002 region. The gap 7002 can only be closed by overlapping operation of the contactor and/or the fuse, necessarily compromising the system risk profile or performance. If the fuse region is extended lower, then rated operation under certain duty cycles may trigger a fuse event and loss of mission. Additionally, as the contactor and fuse experience wear or degradation, the operating region for the contactor-fuse system will move, resulting in inconsistent system performance, loss of protection, and/or unnecessary fuse events. Additionally, the failure mode of a fuse results in extended exposure of the system to high currents due to the fuse melt period and extended arcing time through the activating fuse. Finally, operations of the contactor at the upper range of the contactor operating region results in undesirable heating and degradation of the contactor.

In the example of FIG. 70, an operating region for a breaker/relay consistent with certain embodiments of the present disclosure is depicted. The breaker/relay provides for a smooth and selectable functionality throughout the operating current bar. The breaker/relay provides for a highly capable contact that does not operate near the upper region of its current capacity, reducing heating and degradation from high, within rated range, operations, such as in the upper region 7006. Additionally, the current sensor and related disconnect operations allow for a selectable disconnection when operation is above the rated current for the system. Further, a physical disconnect current is available (e.g., reference FIG. 68 and the associated disclosure) that provides for immediate disconnection of the power bus at very high current values. In certain embodiments, arc dissipation features of the breaker/relay additionally provide for a faster and less damaging disconnect event than experienced by previously known contactor-fuse arrangements. Additionally, the breaker/relay provides for a recoverable disconnect operation, where a mere command to the breaker/relay will again provide connection without a service event. Accordingly, if the system failure causing the high current event is resolved or consistent with a restart, the system can resume operations with the breaker/relay as soon as desired, without having to diagnose a fuse event or change out the fuse.

Figure 71:
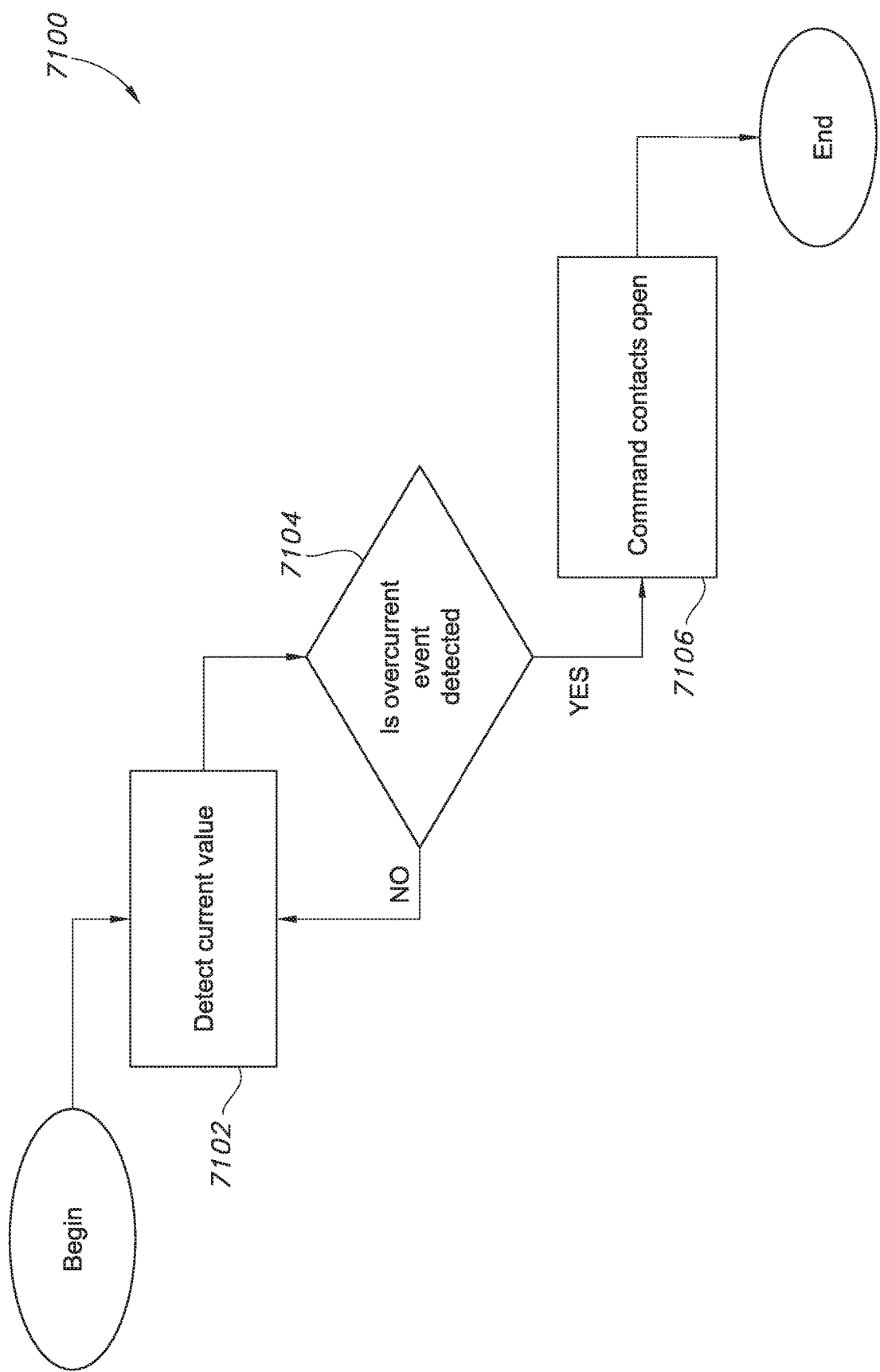
FIG. 71 depicts an embodiment flow diagram for current protection.

Referencing FIG. 71, an example procedure 7100 is depicted to disconnect a power bus. The example procedure 7100 includes an operation 7102 to detect a current value, for example utilizing a current sensor (reference FIG. 68). The procedure 7100 further includes an operation 7104 to determine if an overcurrent event is detected. For example, the detected current value, a function thereof, or a calculated parameter determined in response to the current value, can be compared to a threshold value to determine if an overcurrent event is detected. The example procedure 7100 further includes an operation 7106 to command the contacts open, for example by de-energizing a coil and thereby moving an armature to a position that opens the contacts. The overcurrent threshold may be any value, and may be modified in real-time and/or in accordance with operating conditions. The value for the overcurrent threshold depends upon the application and the components in the system. Example and non-limiting overcurrent values include 100 A, 200 A, 400 A, 1 kA (1,000 amps), 1.5 kA, 3 kA, and 6 kA.

Figure 72:
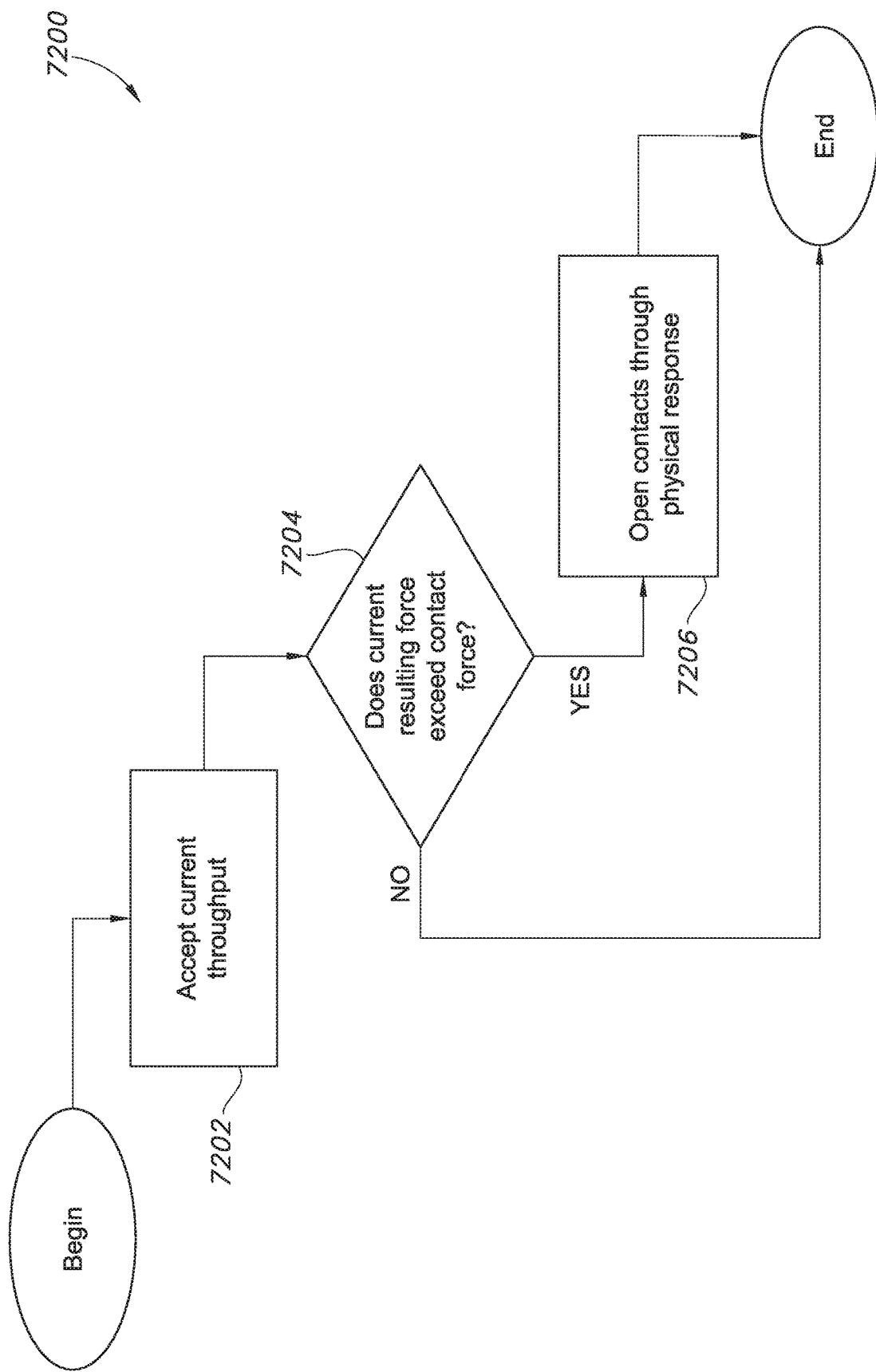
FIG. 72 depicts an embodiment flow diagram for current protection.

Referencing FIG. 72, an example procedure 7200 is depicted to perform a physical disconnect. The example procedure 7200 includes an operation 7202 to accept current throughput, for example as current passing through coupled contacts in a power bus. The example procedure 7200 further includes an operation 7204 to determine whether the current resulting force (e.g., a Lorentz force between a movable contact and a fixed contact) exceeds a contact force (e.g., as provide by a contact force spring). The example procedure 7200 further includes an operation 7206 to open the contacts through a physical response—for example as the Lorentz force overcoming the contact force spring and moving the movable contact away from the fixed contact. The physical disconnect current may be any value, and depends upon the application and the components in the system. Example and non-limiting physical disconnect currents include 400 A, 1 kA, 2 kA, 4.5 kA, 9 kA, and 20 kA.

Figure 73:
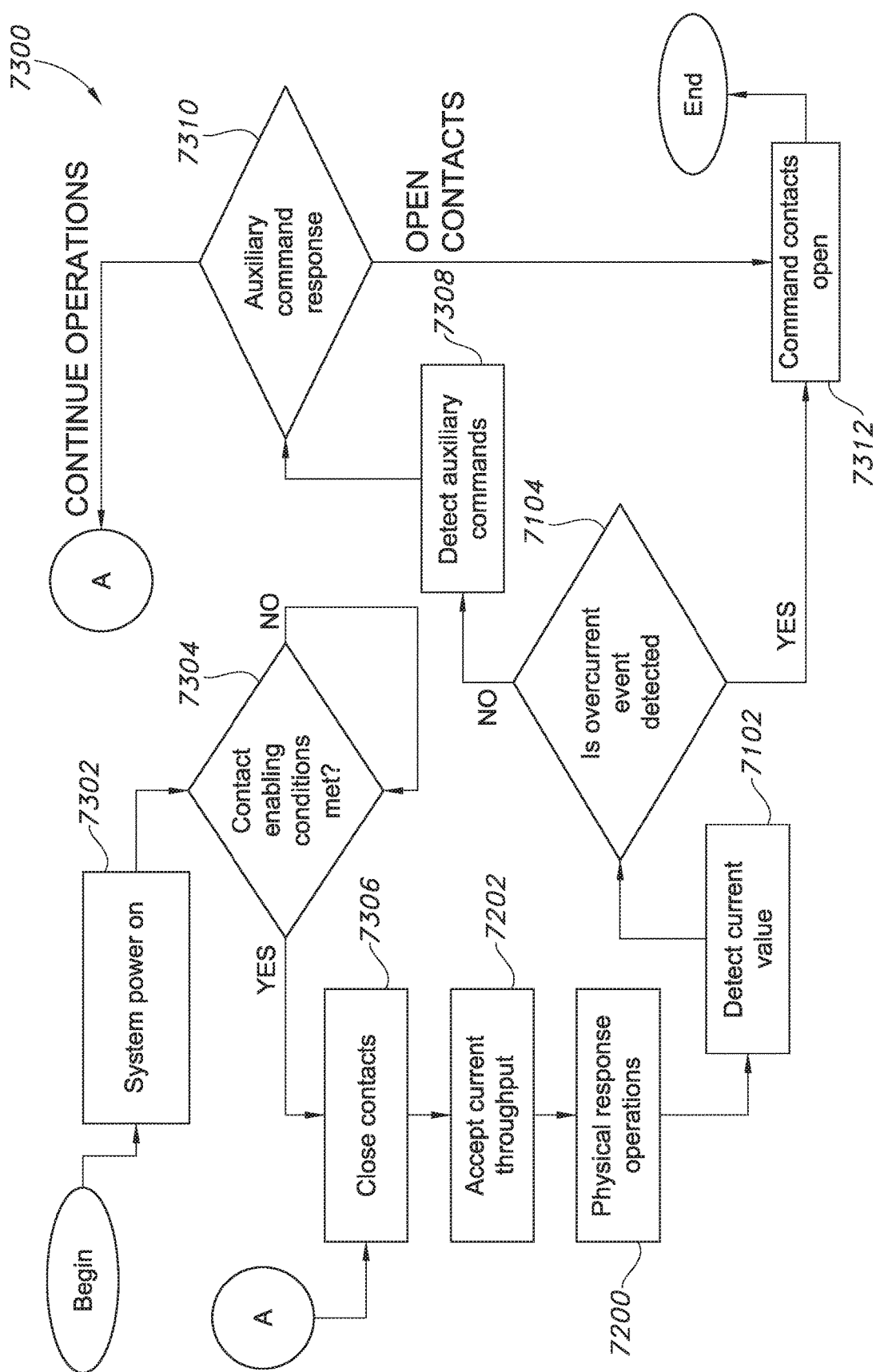
FIG. 73 depicts an embodiment flow diagram for current protection.

Referencing FIG. 73, an example procedure 7300 is depicted to open contacts in response to an overcurrent event, and/or in response to any other selected parameters. The example procedure 7300 includes an operation 7302 to power a system on, for example via a keyswitch or other circuit, and/or via recognition of a keyswitch ON condition. The procedure 7300 further includes an operation 7304 to determine whether contact enabling conditions are met, for example immediately after the keyswitch ON, after a selected time period, after a system pre-charge event is determined to be completed, and/or according to any other selected conditions. In certain embodiments, where the operation 7304 determines that contact enabling conditions are not met, the procedure 7300 holds on operation 7304 until contact enabling conditions are met. Any other response to operation 7304 determining that contact enabling conditions are not met is contemplated herein, including requesting a permission to enable contact conditions, setting a fault code, or the like. In response to operation 7304 determining that contact conditions are met, procedure 7300 further includes an operation 7306 to close the contacts (e.g., energizing a coil to move an armature), and an operation 7202 to accept current throughput. The example procedure 7300 further includes operation 7200 performing a physical disconnect if the accepted current is high enough, and proceeds to operation 7102 to detect a current value through the power bus. The procedure 7300 further includes an operation 7104 to determine if an overcurrent event is detected (operation 7104, in certain embodiments, may be set at a lower current value than the physical disconnect current tested at operation 7200). In response to the operation 7104 determining that an overcurrent event is detected, procedure 7300 includes an operation 7312 to command the contacts open. In response to operation 7104 determining that an overcurrent event is not detected, procedure 7300 includes an operation 7308 to detect auxiliary commands (e.g., an auxiliary off input), and an operation 7310 to determine if an auxiliary command is present to open the contacts (e.g., a logical high, logical low, specified value, lack of a specified value, etc.). In response to the operation 7310 determining that an auxiliary command is present to open the contacts, procedure 7300 includes the operation 7312 to command the contacts open. In response to the operation 7310 determining that an auxiliary command is not present to open the contacts (e.g., branch "CONTINUE OPERATIONS" in the example of FIG. 73) procedure returns to operation 7306.

Figure 74:
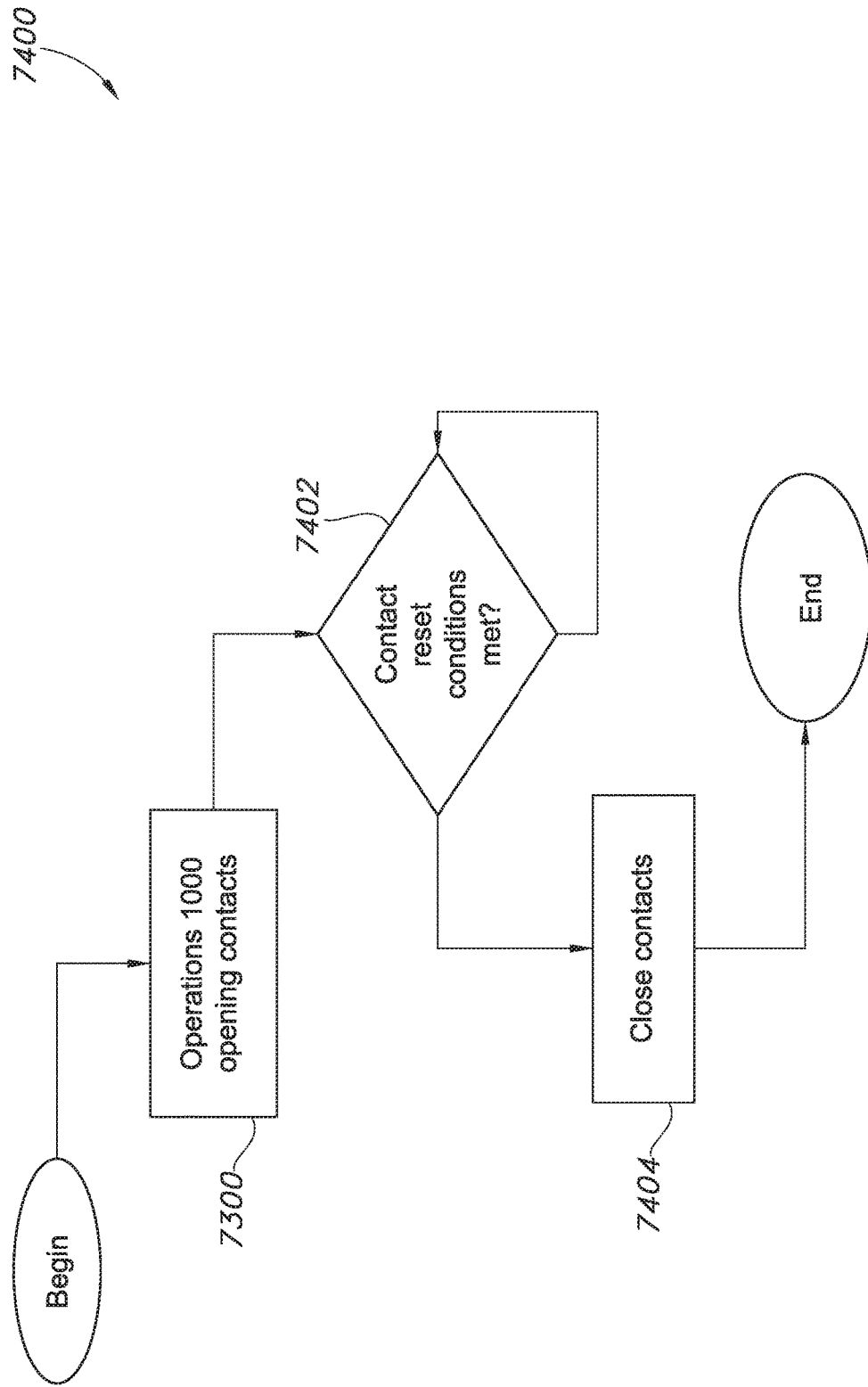
FIG. 74 depicts an embodiment flow diagram for current protection.

Referencing FIG. 74, an example procedure 7400 to restore operations of a breaker/relay after a contact opening event. The example procedure 7400 includes an operation 7300 to open the contacts of the breaker/relay, for example an operation wherein the contacts are opened due to a physical disconnect, an overcurrent detection, and/or an auxiliary off command. The procedure 7400 further includes an operation 7402 to determine if contact reset conditions are present. Example and non-limiting operations 7402 include determining that contact enabling conditions are met, determining that a fault code value has been reset, determining that a system controller is requesting a contact reset, and/or any other contact reset conditions. The procedure 7400 further includes an operation 7404 to close the contacts, for example by providing power to the coil to move the armature.

Figure 75:
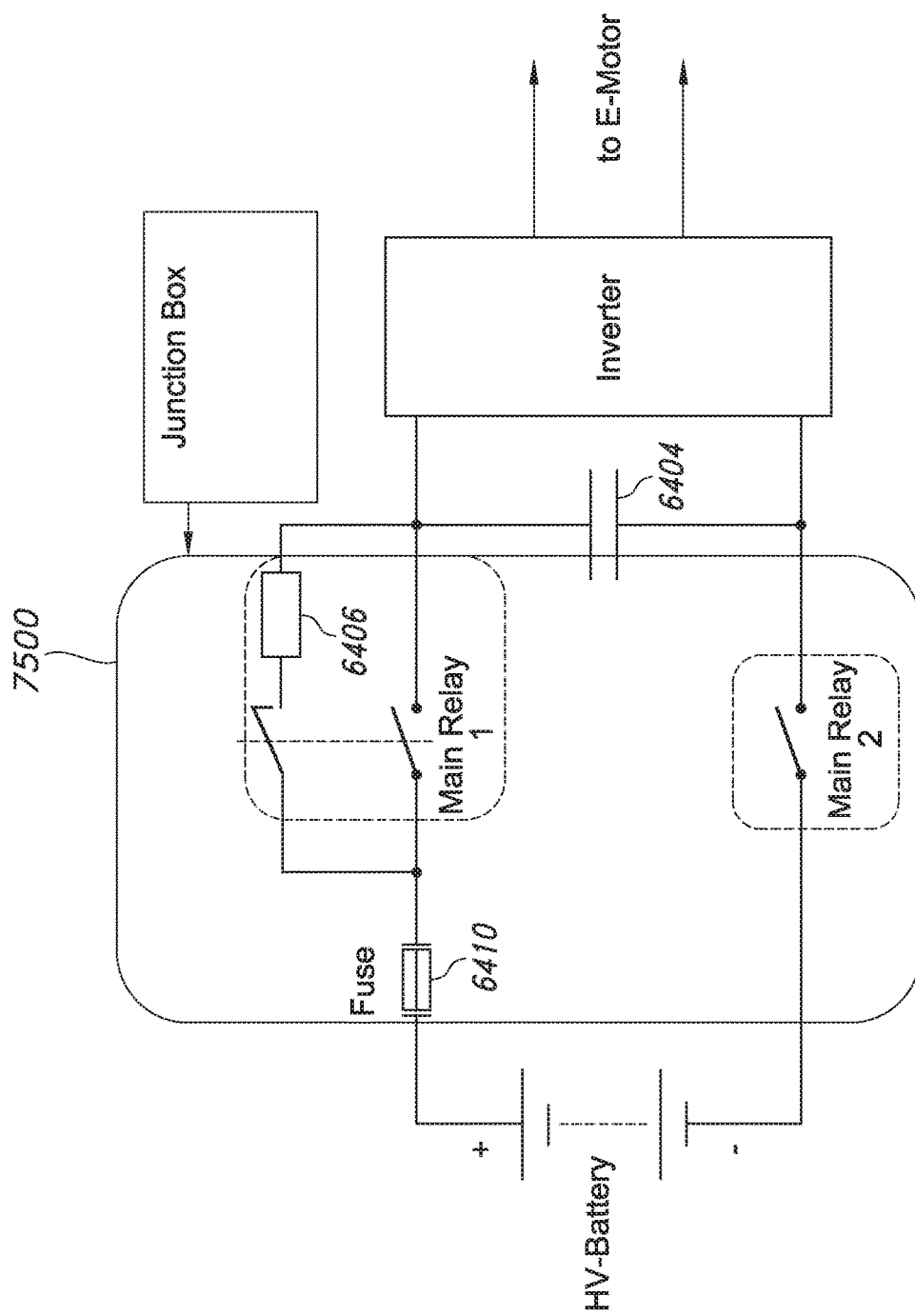
FIG. 75 depicts a schematic diagram of a power protection configuration between a battery and an inverter.

Referencing FIG. 75, an example previously known mobile power circuit is depicted. The example mobile power circuit is similar to the mobile power circuit depicted in FIG. 64. The example of FIG. 75 includes a junction box housing the pre-charge circuit, a high side relay, and a low side relay. In certain embodiments, the pre-charge circuit and the high side relay are provided in a housing within the junction box. In the example of FIG. 75, a fuse 6410 provides overcurrent protection on the high side, and is housed with the main relays and the precharge resistor 6406 within a PDU housing 7500.

Figure 76:
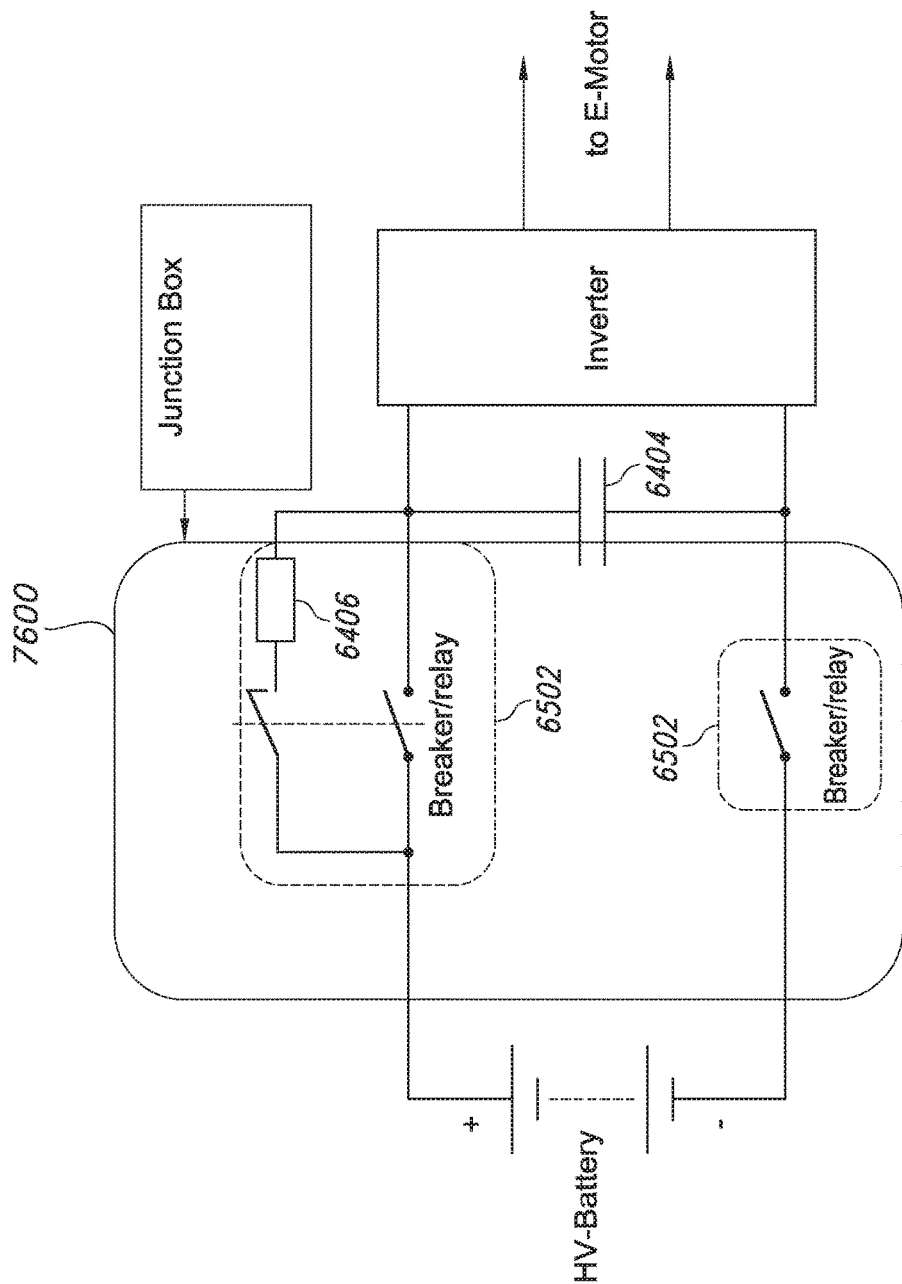
FIG. 76 depicts a schematic diagram of a power protection configuration between a battery and an inverter.

Referencing FIG. 76, an example mobile power circuit including a breaker/relay 6502 disposed in the high side circuit, and a second breaker/relay 6502 positioned in the low side circuit. Each breaker/relay 6502, in certain embodiments, provides continuous overcurrent control throughout the operating region of the mobile application as described throughout the present disclosure. Additionally, it can be seen that the low side breaker/relay 6502 provides for overcurrent protection in all operating conditions, including during a pre-charge operation when the high side breaker/relay 6502 may be bypassed so the mobile power circuit can pre-charge through the pre-charge resistor 6406. In certain embodiments, both the high side breaker/relay 6502 and the low side breaker/relay 6502 provide additional benefits such as rapid arc dispersion, low wear during connection and disconnection events, and improved heating characteristics during high, but in rated range, current operation of the mobile circuit.

Figure 77:
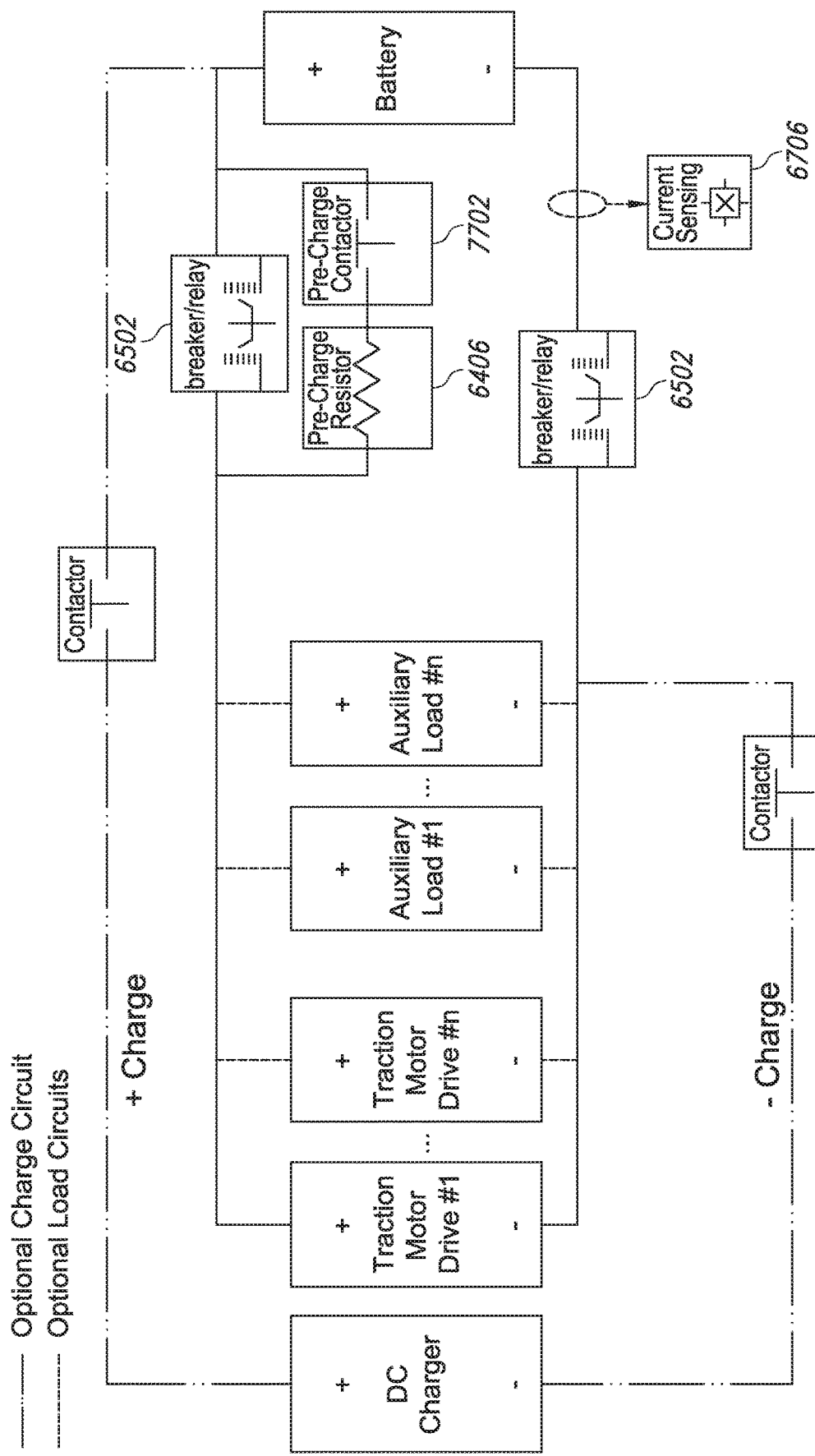
FIG. 77 depicts a schematic diagram of a power protection configuration between a battery and loads.

Referencing FIG. 77, an example power distribution arrangement for a mobile application is depicted. The embodiment of FIG. 77 is similar to the embodiment of FIG. 76, with a high side breaker/relay 6502 and a low side breaker/relay 6502. Four operating regimes of the embodiment of FIG. 77 are described herein, including pre-charge operations (e.g., at system power-on for the mobile application), powering operations for loads (e.g., providing motive power or auxiliary power for the mobile application), regeneration operations (e.g., recovering power from a motive load or auxiliary load), and charging operations (e.g., connection of a dedicated charger to the system). In the example of FIG. 77, the low side breaker/relay 6502 has an associated current sensor 6706. In the example of FIG. 77, the low side breaker/relay 6502 is in the loop during all operations, and can provide current protection for any operating conditions. To save costs, a current sensor for the high side breaker/relay 6502 can be omitted. In certain embodiments, for protection of the breaker/relay contacts 6502, a local current sensor may be included for each breaker/relay 6502, to provide for operations to protect the contacts in the event of a physical current disconnection (e.g., reference FIG. 70). It can be seen that additional contactors and/or breaker/relays may be provided beyond those shown—for example to isolate the charge circuit, to route power through selected ones of the motive loads and/or auxiliary loads, and/or to prevent power flow through an inverter (not shown) during charging operations. Additionally or alternatively, certain components depicted in FIG. 77 may not be present in certain embodiments. For example, a low-side contactor on the charge circuit may not be present, and any one or more of the motive loads (traction motor drive) or auxiliary loads may not be present. During a pre-charge operation, a pre-charge contactor 7702 may be closed while the high-side breaker/relay 6502 is open, where the low-side breaker/relay 6502 provides for current protection (in addition or as an alternative to a pre-charge fuse) during pre-charge operations. During charging operations, the low-side breaker/relay 6502 provides current protection, while the high-side breaker/relay 6502 is bypassed by the charging circuit.

Figure 78:
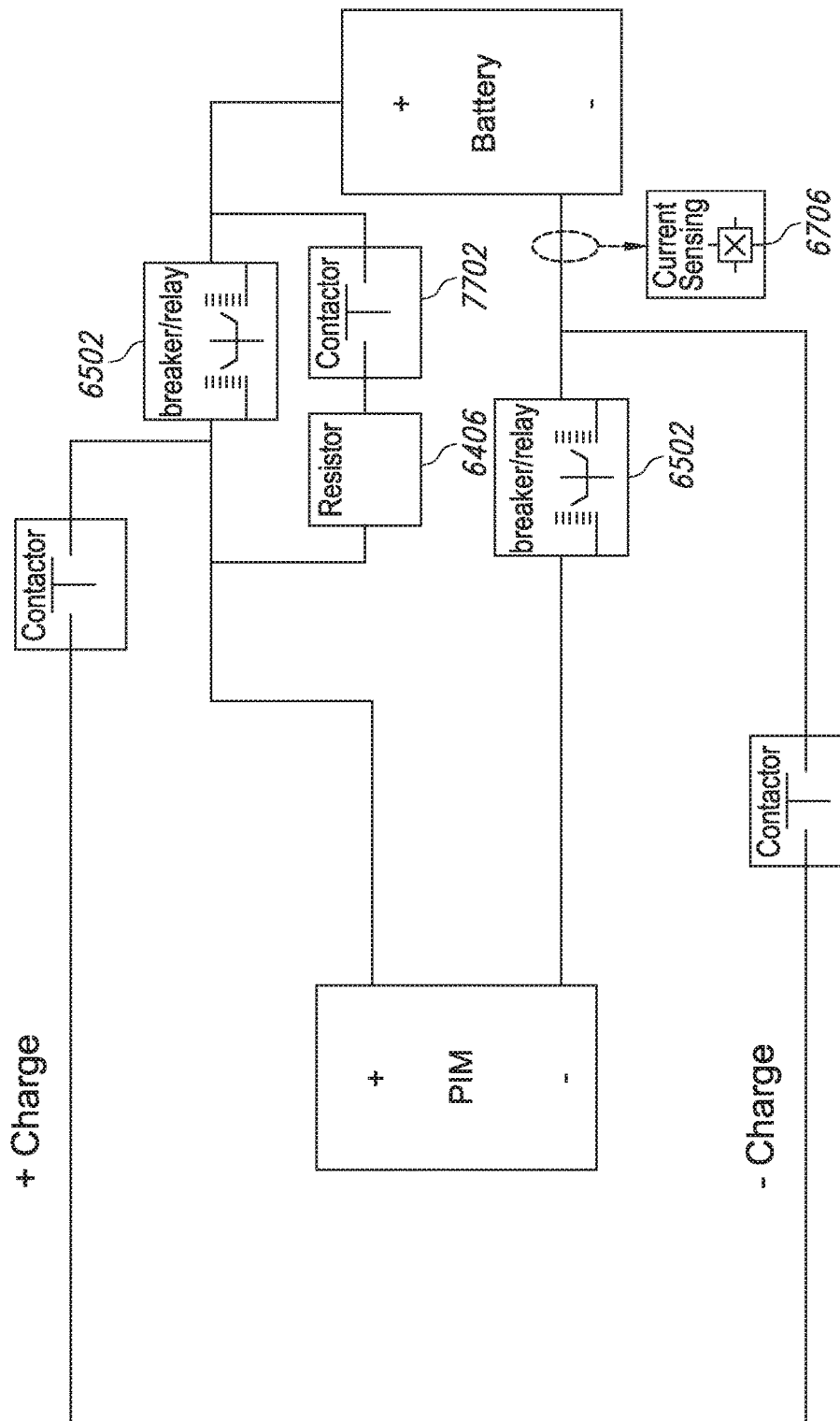
FIG. 78 depicts a schematic diagram of a power protection configuration.

Referencing FIG. 78, an example power distribution management for a mobile application is depicted. The embodiment of FIG. 78 is similar to the embodiment of FIG. 77, except that the high side breaker/relay 6502 is in the loop during all operations, and the low side breaker/relay 6502 is not in the loop during charging operations. In the example of FIG. 78, the high side breaker/relay 6502 may include current sensing associated therewith to provide protection for the contacts during a physical current disconnection. In certain embodiments, depending upon the circuit dynamics of the mobile application, the current sensor 6706 depicted on the low side may be sufficient to provide protection for the contacts of the high side breaker/relay 6502 without a dedicated current sensor for the high side breaker/relay 6502. During pre-charge operations for the embodiment of FIG. 78, current protection is not present, or is provided by a pre-charge fuse. During charging operations for the embodiment of FIG. 78, current protection is provided by the high-side breaker/relay 6502.

Figure 79:
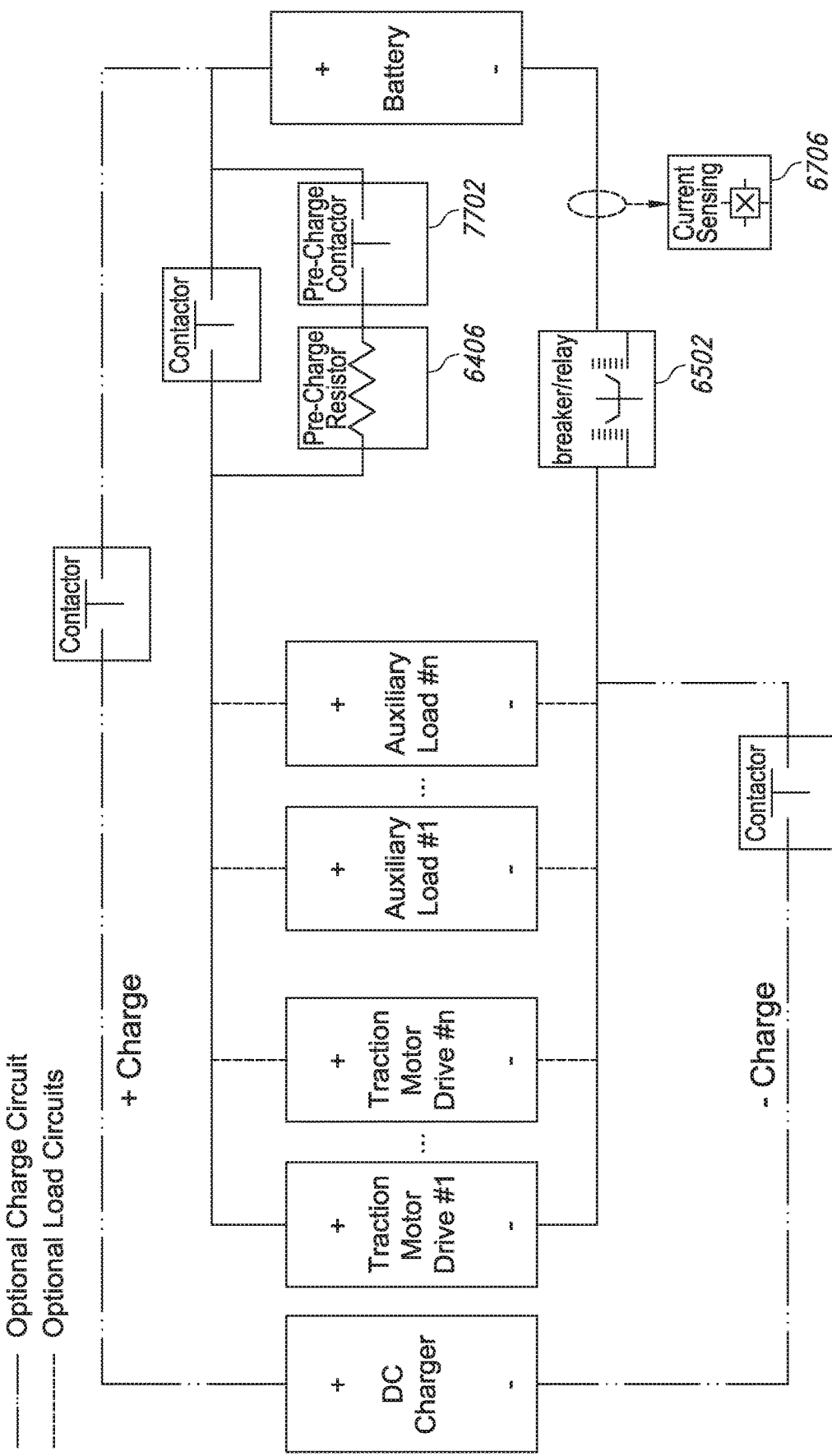
FIG. 79 depicts a schematic diagram of a power protection configuration between a battery and loads.

Referencing FIG. 79, an example power distribution management for a mobile application is depicted. The embodiment of FIG. 79 is similar to the embodiment of FIG. 77, except that the high side breaker/relay 6502 is exchanged for a standard contactor. In the example of FIG. 79, the low side breaker/relay 6502 provides for current protection during all operating conditions, and the system otherwise uses conventional components. In certain embodiments, improved current protection capability is desirable, but contactor wear may not be as much of a concern, and a trade-off for inexpensive contactors at other positions in the mobile power circuit away from the low side breaker/relay 6502 may be an acceptable solution. Additionally, the presence of the low side breaker/relay 6502 in the circuit for all operating conditions can reduce the wear on the conventional contactors in the mobile power circuit through timing of connections such that the low side breaker/relay 6502 reduces the number of connection and disconnection events on other contactors while the system is charged.

Figure 80:
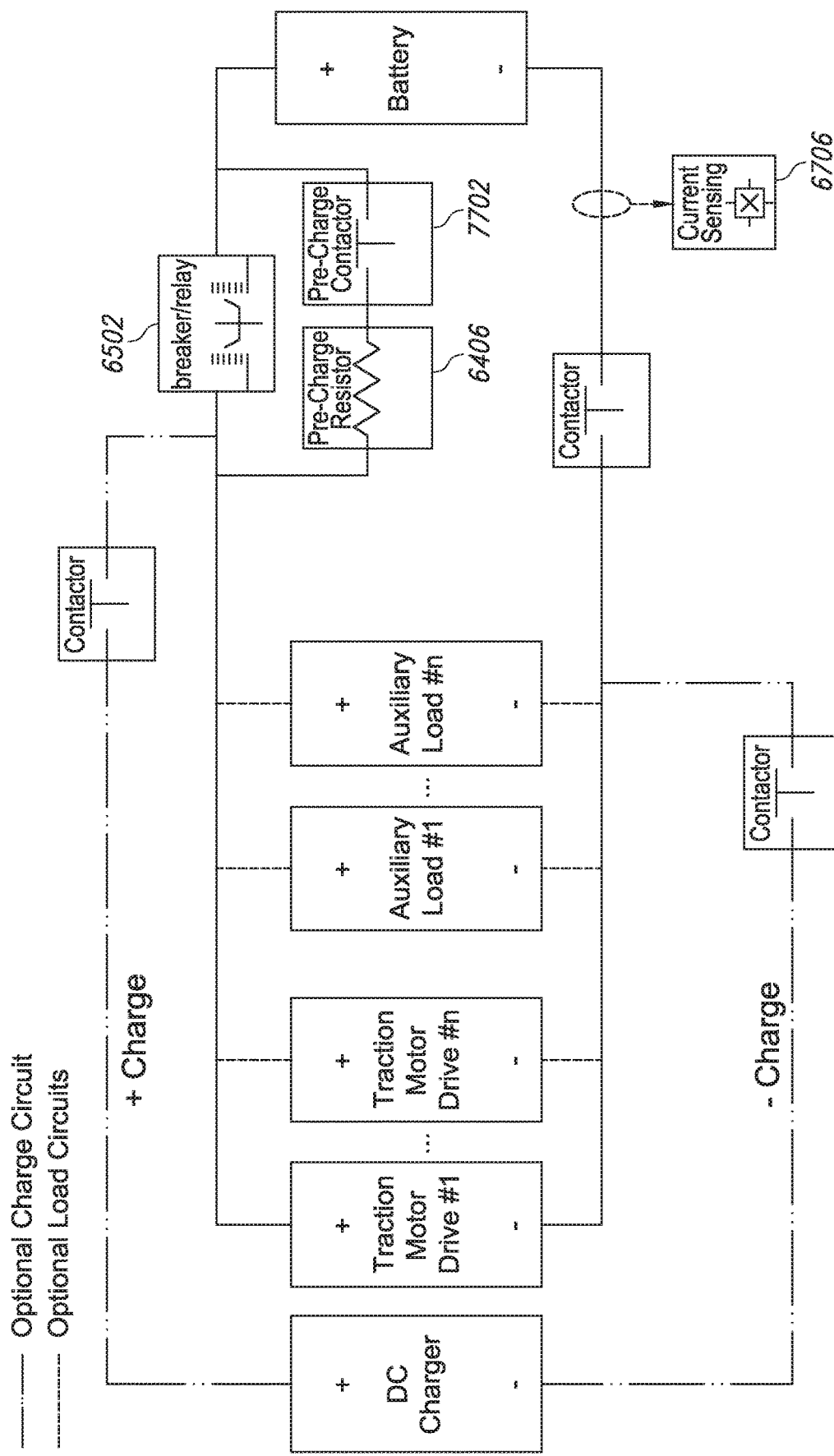
FIG. 80 depicts a schematic diagram of a power protection configuration between a battery and loads.

Referencing FIG. 80, an example power distribution management for a mobile application is depicted. The embodiment of FIG. 80 is similar to the embodiment of FIG. 78, except that the low side breaker/relay is replaced with a contactor, and the low side charging circuit is routed through the low side contactor. The low side charging circuit may bypass the low side contactor in certain embodiments, similar to the embodiment of FIG. 78. It can be seen in FIG. 80 that a circuit path lacking short-circuit protection exists through the pre-charge circuit during pre-charging operations when the high side breaker/relay 6502 is being bypassed, unless protection is provided by a pre-charge fuse. In certain embodiments, a fuse in the pre-charge circuit (not shown) may be provided to provide for short-circuit protection during the pre-charge operating condition, and/or the unprotected pre-charge operation may be an acceptable risk. In any of the embodiments depicted throughout the present disclosure, fuses may be included, potentially in-line with a breaker/relay 6502, depending upon the benefits sought from the breaker/relay 6502 for the particular embodiment. In certain embodiments, an included fuse with a breaker/relay 6502 may be configured to activate at a very high current value that is expected to be higher than the physical disconnection current of the breaker/relay 6502, for example as a redundant protection for the circuit, and/or to provide for a long-life fuse that is expected to last for a selected period, such as the service life of the electric mobile application.

Figure 81:
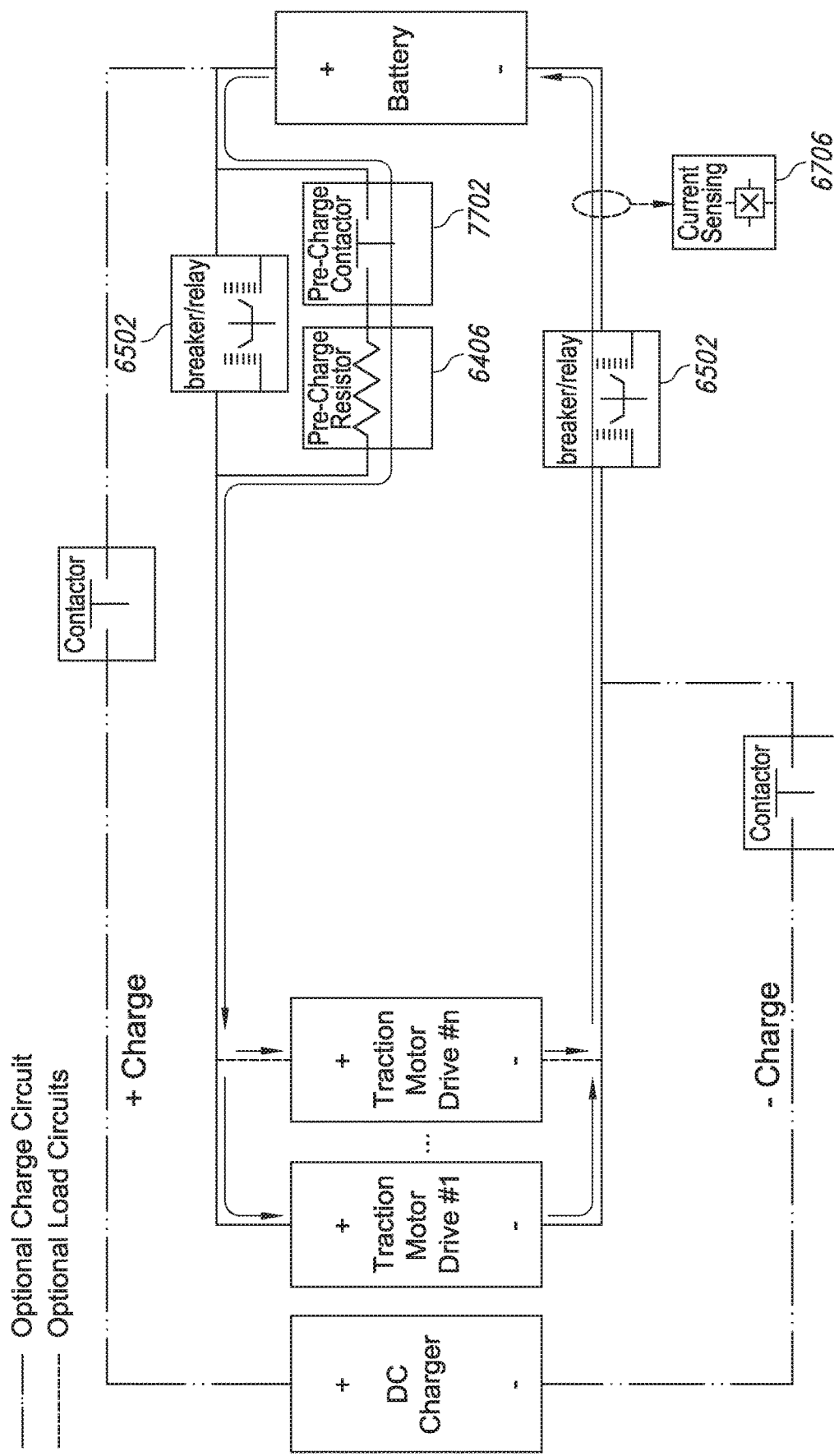
FIG. 81 depicts a schematic diagram of a power protection configuration between a battery and loads with current path depiction.

Referencing FIG. 81, an example power distribution management for a mobile application is depicted, consistent with the embodiment depicted in FIG. 77. Power flow during pre-charge operations is depicted schematically in FIG. 81, with arrows showing the power flow path. The operations described in relation to FIG. 81 can be understood in the context of any of the embodiments described throughout the present disclosure. During pre-charge operations, the pre-charge contactor 7702 is closed and the low side breaker/relay 6502 is closed, providing power through the mobile circuit and through the pre-charge resistor 6406. The pre-charge operation allows for capacitive elements of the mobile circuit to be charged before the high side breaker/relay 6502 is closed. During pre-charge operations in the embodiment of FIG. 81, the low side breaker/relay 6502 provides for overcurrent protection of the circuit. After the pre-charge operation is complete, which may be determined in an open loop (e.g. using a timer) manner or in a closed loop (e.g., detecting a voltage drop across the batter terminals, or detecting the current through the circuit), the high side breaker/relay 6502 is closed and the pre-charge contactor 7702 may be opened.

Figure 82:
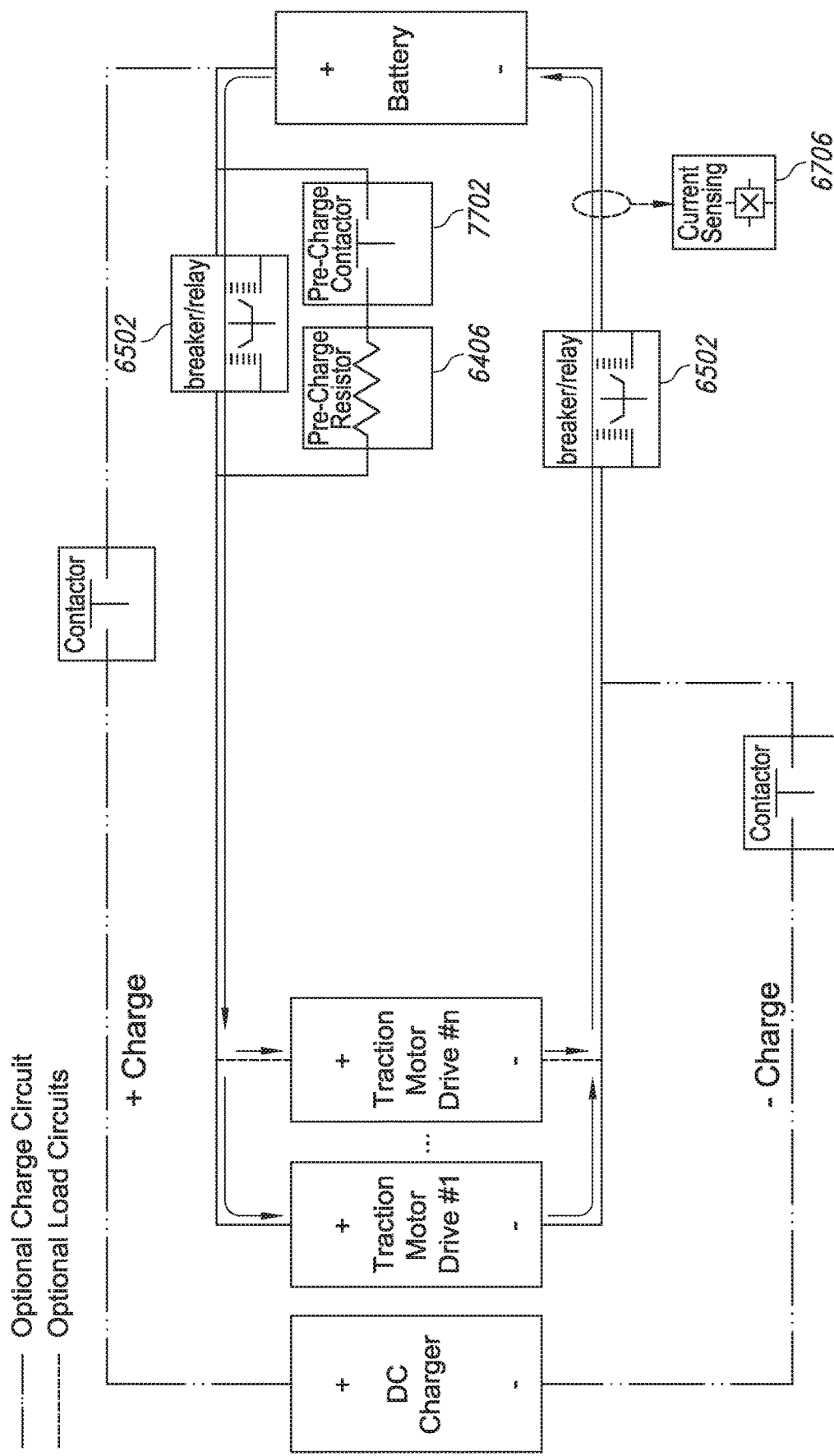
FIG. 82 depicts a schematic diagram of a power protection configuration between a battery and loads with current path depiction.

Referencing FIG. 82, an example power distribution management for a mobile application is depicted, consistent with the embodiment depicted in FIG. 77. Power flow during load powering operations is depicted in FIG. 82, with arrows showing the power flow path. The operations described in relation to FIG. 82 can be understood in the context of any of the embodiments described throughout the present disclosure. During load powering operations, in the example the pre-charge contactor 7702 is open, and power flows through the high side breaker/relay 6502 and the low side breaker/relay 6502. The embodiment of FIG. 82 depicts a traction motor load being powered, but one or more auxiliary loads may additionally or alternatively be powered in a similar manner. During load powering operations, both the high side breaker/relay 6502 and the low side breaker/relay 6502 provide overcurrent protection. In certain embodiments, the high side breaker/relay 6502 and the low side breaker/relay 6502 may have the same or distinct current ratings. For example, where one of the high side breaker/relay 6502 or low side breaker/relay 6502 are easier to service or less expensive, that one of the breaker/relays 6502 may have a lower overall current rating to provide for a system where a predictable one of the breaker/relays 6502 fails first. Additionally or alternatively, certain operations on the system may have a higher current rating—for example charging operations where the charging circuit is routed only through one of the breaker/relays 6502 (e.g., the low side breaker/relay in the embodiment of FIG. 82), and thus one of the breaker/relays 6502 may have a higher current rating than the other. In certain embodiments, a breaker/relay 6502 current rating may be reflected in the contact materials of the movable contact and the fixed contact, by a contact surface area of the movable contact and the fixed contact, by threshold settings for the controlled operations in response to detected current, by a number or arrangement of splitter plates, by splitter plate materials and geometry, by the magnet strength and geometry of the permanent magnet system around the splitter plates, by the contact force of the contact force spring, and/or by the breaker/relay design elements (e.g., contact surface area and contact spring force)

determining the physical disconnection current due to the Lorentz force on the contacts.

Figure 83:
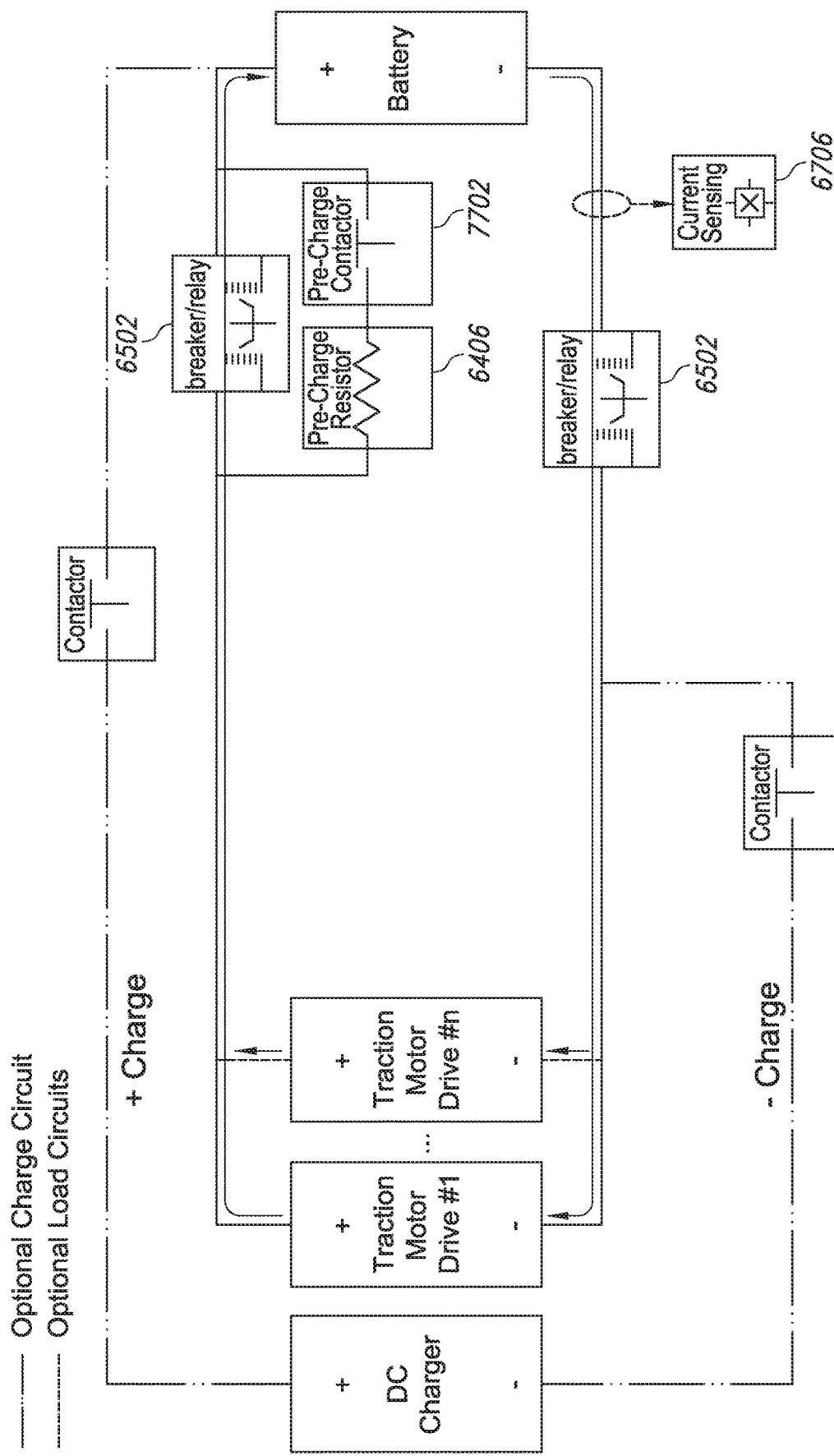
FIG. 83 depicts a schematic diagram of a power protection configuration between a battery and loads with current path depiction.

Referencing FIG. 83, an example power distribution management for a mobile application is depicted, consistent with the embodiment depicted in FIG. 77. Power flow during regeneration operations is depicted in FIG. 83, with arrows showing the flow path. Regenerative operations from motive loads are depicted, for example as might be experienced during regenerative braking, but any regenerative operations from any loads in the system are contemplated herein. During regeneration operations, the high side breaker/relay 6502 and the low side breaker/relay 6502 are closed, and the pre-charge contactor 7702 may be open. Accordingly, both the high side breaker/relay 6502 and the low side breaker/relay 6502 provide overcurrent protection during regeneration operations of the system.

Figure 84:
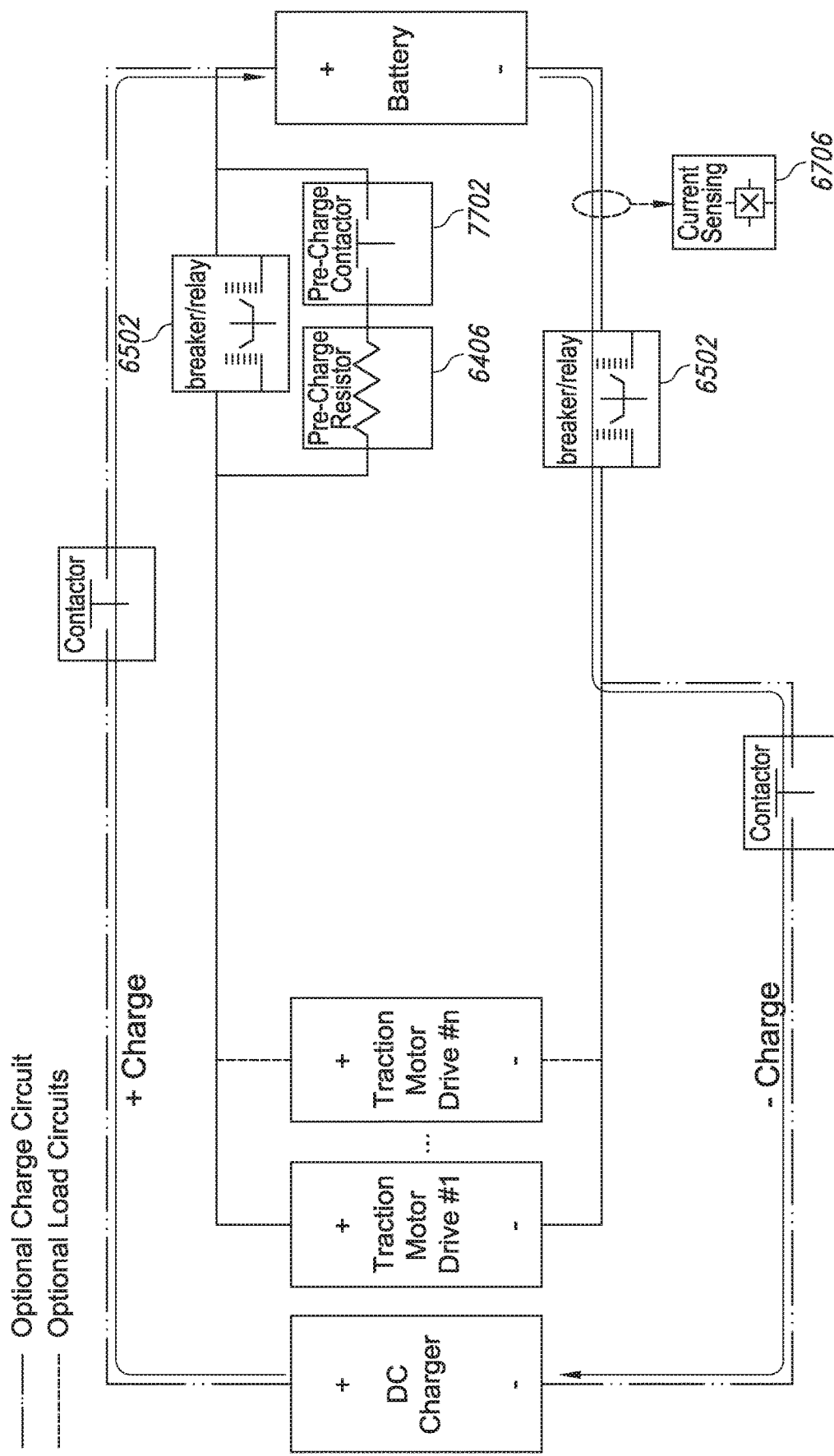
FIG. 84 depicts a schematic diagram of a power protection configuration between a battery and loads with current path depiction.

Referencing FIG. 84, an example power distribution management for a mobile application is depicted, consistent with the embodiment depicted in FIG. 77. Power flow during charging operations is depicted in FIG. 84, with arrows showing the flow path. Charging may be with an external charging device, and may include a high current quick charging operation which may provide for higher current operations than is associated with a rated power for the load(s). In the operations depicted in FIG. 84, the low side breaker/relay 6502 is closed, and contactors in the charging circuit are closed, providing the power flow path as depicted. In certain embodiments, the high side breaker/relay 6502 and the pre-charge relay 7702 may be open, for example to isolate an inverter (not shown) from the circuit during charging operations. In certain embodiments, the high side breaker/relay 6502 may be closed, for example where isolation of the inverter during charging operations is not required, and/or where rapid operation without a pre-charging cycle after the charging may be desired. During charging operations, the low side breaker/relay 6502 provides overcurrent protection in the example of FIG. 84.

Figure 85:
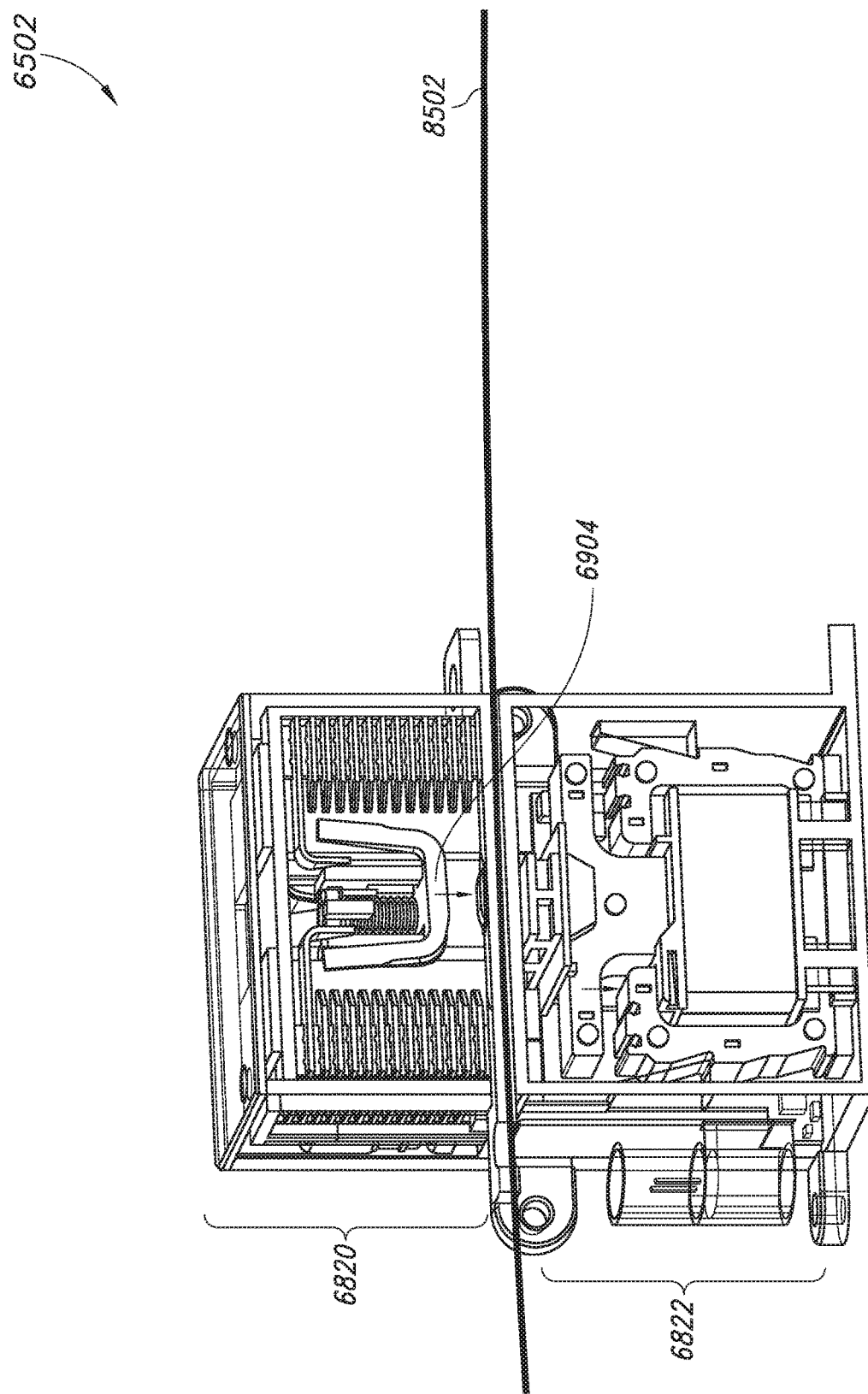
FIG. 85 depicts an embodiment detail of a breaker-relay component.

Referencing FIG. 85, another cutaway schematic view of a breaker/relay is depicted. In the example of FIG. 85, circuit breaking and connecting components are depicted on the breaker side 6820, and contactor operation components are depicted on the relay side 6822. The depicted breaker/relay is an example and depicts a single pole, single throw breaker relay. Additionally or alternatively, a breaker/relay may be a dual pole (e.g., operating two distinct circuits, a parallel path for one of the circuits to provide additional current capability, and/or one pole providing high-side coupling and the other pole providing low-side coupling). In certain embodiments, a breaker/relay having more than one pole can control the poles independently, or they may be operated together utilizing the same armature. In certain embodiments, both poles have arc diffusion protection provided by the same splitter plates, or by independent sets of splitter plates. In certain embodiments, both poles have arc diffusion protection provided by the same permanent magnet system, or by independent permanent magnet systems.

Figure 86:
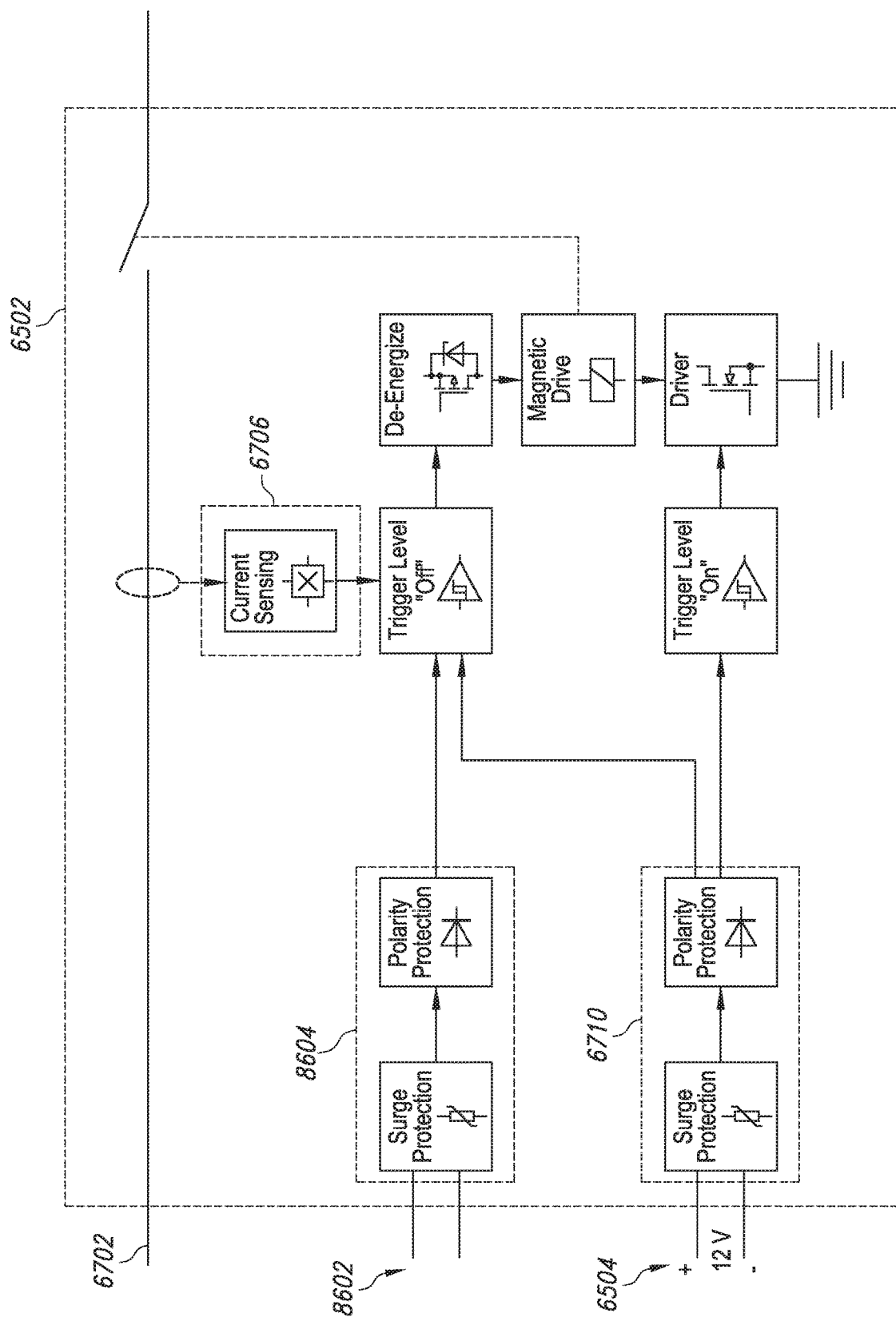
FIG. 86 depicts a schematic diagram of a power bus protection configuration.

Referencing FIG. 86, another example of a schematic logic diagram for a breaker/relay is depicted. The example of FIG. 86 includes an emergency or auxiliary input 8602, which is processed by an input isolation 8604. The emergency or auxiliary input 8602 may replace or be in addition to any other auxiliary input, and provides for the capability of a particular application to control operations of the breaker/relay for a selected response to any desired aspect of the system—including without limitation, allowing for a disconnect assurance during service, during an emergency, and/or according to any desired control logic.

Figure 87:
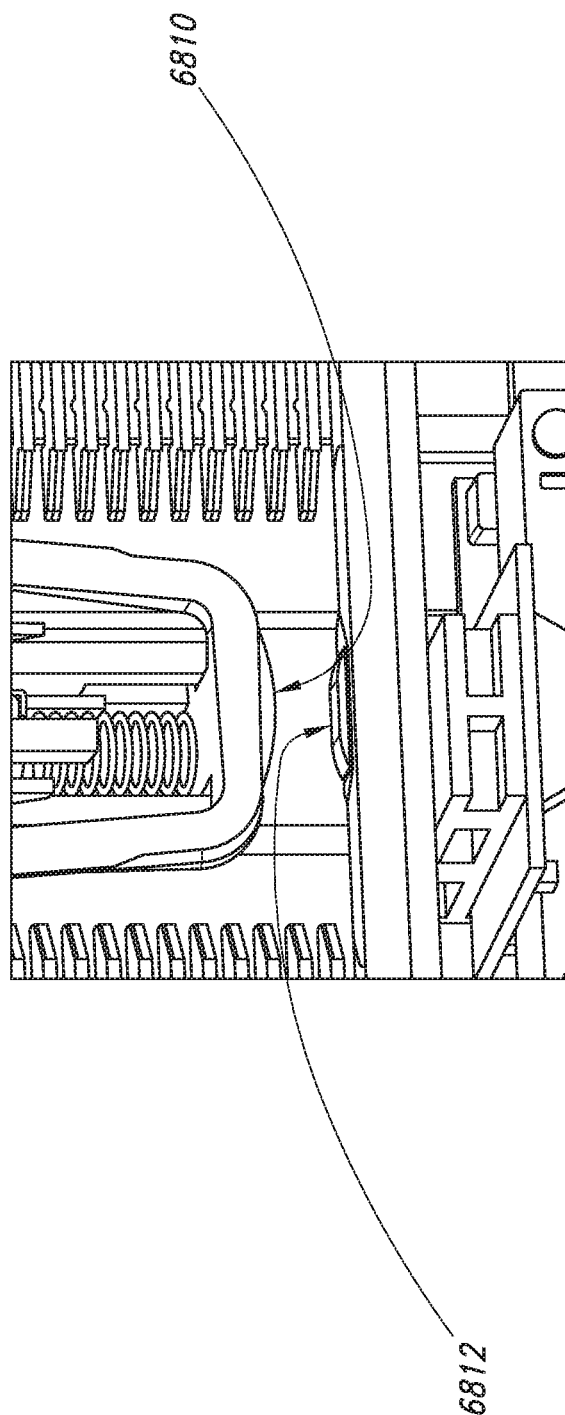
FIG. 87 depicts an embodiment detail of a contact in a breaker-relay component.

Referencing FIG. 87, a detailed cutaway view of a contact portion of an example breaker/relay is depicted. The contact portion of FIG. 87 includes an example configuration for the contact surface of the moveable contact 6810 and the fixed contact 6812. The configuration of the contacts is a part of the system that contributes to the physical opening force of the contacts, and can be configured with any shape or area to provide the desired response to high currents occurring in the associated circuit.

Figure 88:
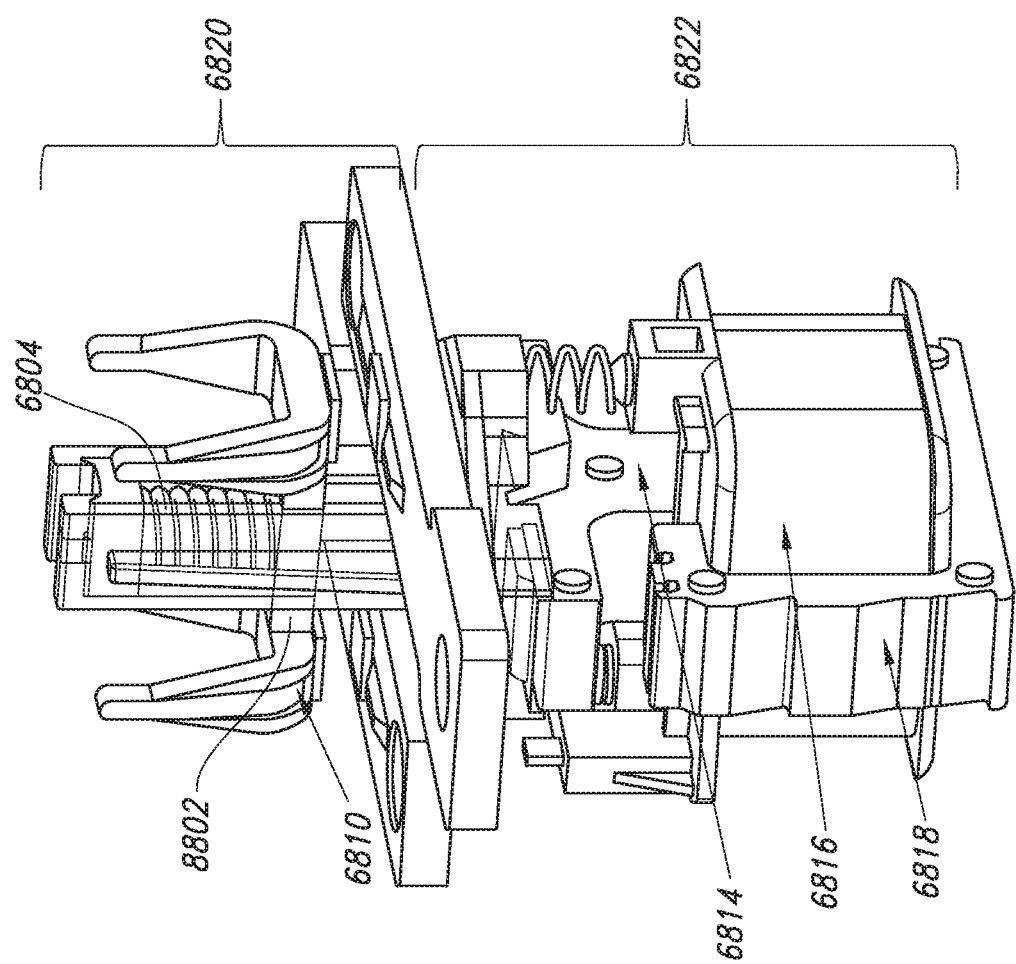
FIG. 88 depicts an embodiment detail of a breaker-relay component.

Referencing FIG. 88, an example breaker/relay is depicted with portions of the housing removed for illustration. The example breaker/relay includes two moveable contacts engaging two fixed contacts. In the example of FIG. 88, the moveable contacts are coupled and operated by the same armature 6814, with contact force provided by the contact spring 6804. In the example of FIG. 88, the contacts are electrically coupled through a bus bar 8802. In the example, the bus bar 8802 transitions directly between the contacts, and is not significantly exposed to the current carrying portion of the bus bar including the fixed contacts. In certain embodiments, the bus bar 8802 can include a trajectory that exposes a portion of the bus bar 8802 into proximity with the current carrying member of the fixed contacts, thereby contributing to the Lorentz force that provides the physical disconnect of the breaker/relay. In certain embodiments, both of the area of the bus bar 8802 exposed to the fixed contact current carrying portion, and the proximity of the bus bar 8802 to the fixed contact current carrying portion are design elements that allow for configuration of the Lorentz force response.

Figure 89:
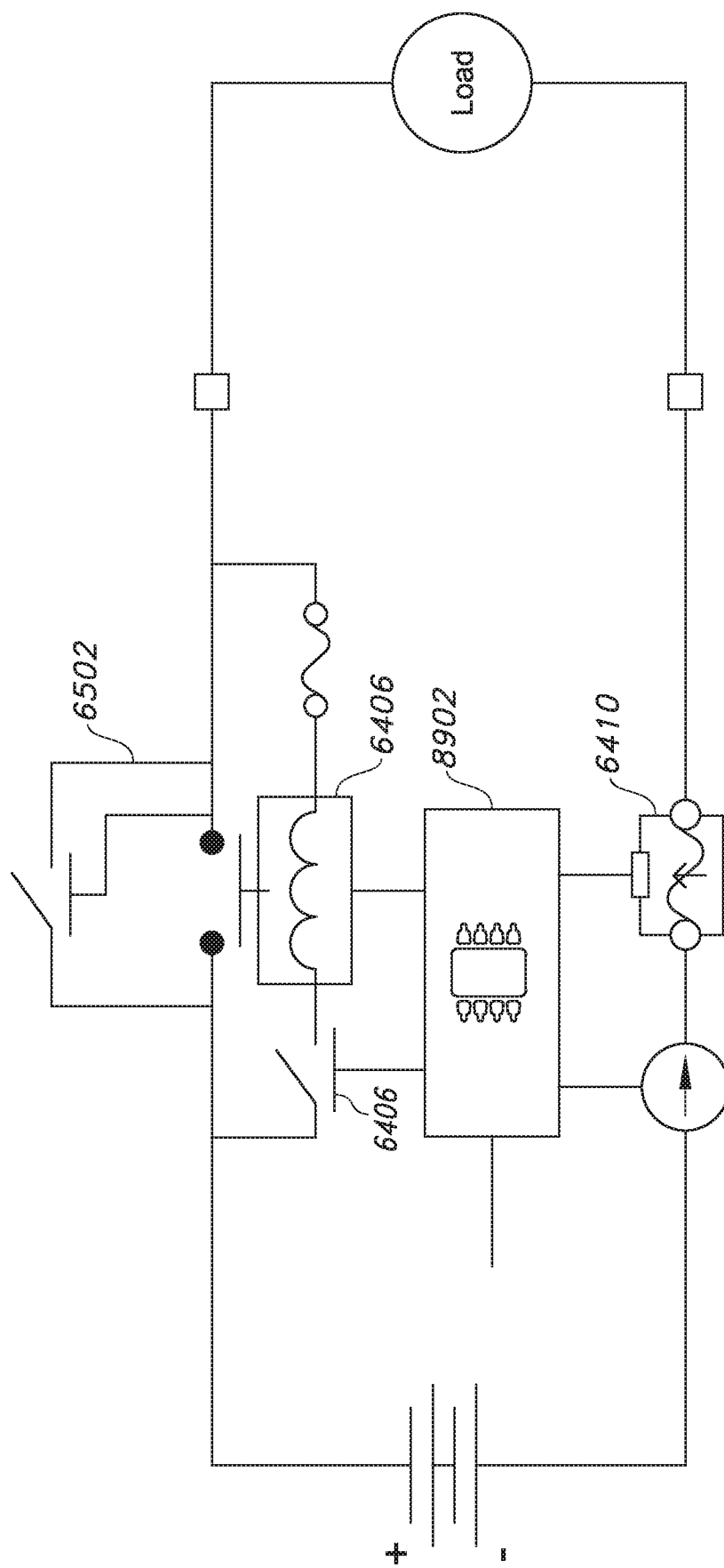
FIG. 89 depicts a schematic diagram of a power protection configuration with controller.

Referencing FIG. 89, an example power management arrangement for a mobile application is depicted. The example of FIG. 89 includes a breaker/relay 6502 disposed on the high side of the power circuit, and a pre-charge contactor, resistor, and fuse, coupled in parallel to the high side breaker/relay 6502. In the example of FIG. 89, the breaker/relay 6502 is a dual pole breaker/relay 6502, for example to provide additional current capability through the contacts for the power circuit. In the example of FIG. 89, a controller 8902 is depicted that performs control functions for the breaker/relay 6502 and for the power management arrangement. For example, the controller 8902 receives a keyswitch input, performs pre-charge operations, operates the closing of the breaker/relay, and responds to a high current event by opening the contacts of the breaker/relay. In another example, the controller 8902 performs shutdown operations of the power management arrangement, such as opening the breaker/relay after the keyswitch is off, or in response to an auxiliary, emergency, or other input requesting that power be disconnected.

Further referencing FIG. 89, an example power distribution management for a mobile application is depicted schematically, which may be utilized in whole or part with any other systems or aspects of the present disclosure. An example power distribution management system includes a dual pole breaker/relay—the example of FIG. 89 includes a dual pole breaker/relay (e.g., using one set of contacts per pole) having a single magnetic drive (e.g., a magnetic actuator). In certain embodiments, both contacts are mechanically linked such that they open or close together (e.g., operating as a dual pole single throw contactor). In certain embodiments, the contactors may share one or more arc suppression aspects (e.g., splitter plates and/or permanent magnet), and/or may have individual arc suppression aspects. In certain embodiments, arc suppression aspects may be partially shared (e.g., some splitter plates in proximity to both contacts) and/or partially individual (e.g., some splitter plates in proximity to only one or the other of the contacts). In certain embodiments, various features of the contactors may be shared and other features of the contactors individually supplied—such as control commands or actuation (e.g., a dual pole, dual throw arrangement), arc suppression aspects, and/or housings. The example of FIG. 89 additionally depicts a separate contactor (e.g., the lower left of the three (3) depicted contacts) which is separately controllable to provide contact management for a pre-charge circuit for the power distribution management system. In certain embodiments, the pre-charge contactor may be integrated with the dual pole contacts—for example within a same housing as the dual pole contacts and/or with pre-charge coupling provided as one of the dual pole contacts. The example of FIG. 89 depicts a fuse on the pre-charge circuit, and a further overall fuse on a battery low side. The presence of fuses depicted is optional and non-limiting, and fuses may be present in other locations, omitted, and/or replaced (e.g., by a breaker/relay as described throughout the present disclosure, and/or as a pole on a dual pole or multi-pole breaker/relay). In certain embodiments, a pre-charge circuit may be contained within a power distribution unit separate from the breaker/relay and/or containing the breaker/relay, as a solid state pre-charge circuit, and/or as a mechanical/electrical circuit positioned elsewhere in the system and/or within the breaker/relay housing.

The electrical arrangement of poles in FIG. 89 is a schematic example, and not limiting to arrangements of the system for particular embodiments. In certain embodiments, each pole of the dual pole breaker/relay (and/or each pole or a subset of poles in a multi pole breaker/relay) may provide selectable electrical coupling for a same circuit, for separate circuits, and/or for a selected circuit (e.g., using controllable switches or connectors elsewhere in the system—not depicted). In certain embodiments, the power distribution management system further includes a high resolution current sensor, and/or current sensing on more than one pole of the dual pole or multi pole breaker/relay. In certain embodiments, a controller is communicatively coupled to the one or more high resolution current sensors, and utilizes the one or more high resolution current sensors for any operations described throughout the present disclosure (e.g., to command one or more of the contacts to an open position to avoid re-contact after opening) and/or to communicate information determined from the current sensor (e.g., the electrical current, or other information derived therefrom) to another controller in the system such as a vehicle controller. In certain embodiments, each contactor of the dual pole or multi-pole breaker/relay includes an arrangement configured to open the contact with a Lorentz force response due to high current through the circuit of the contactor as described throughout the present disclosure. In certain embodiments, one contact has an arrangement to open with a Lorentz force response, and the other contactor opens due to mechanical linkage to the responding contactor. In certain embodiments, each contact has an arrangement to open with a Lorentz force response, for example to provide circuit protection redundancy. In certain embodiments, each contact has an arrangement to open with a Lorentz force response, where each contact has a separate configured threshold for opening response, and/or where each contact is separably controllable (e.g., with a separate magnetic actuator or other controlled actuator).

Figure 90:
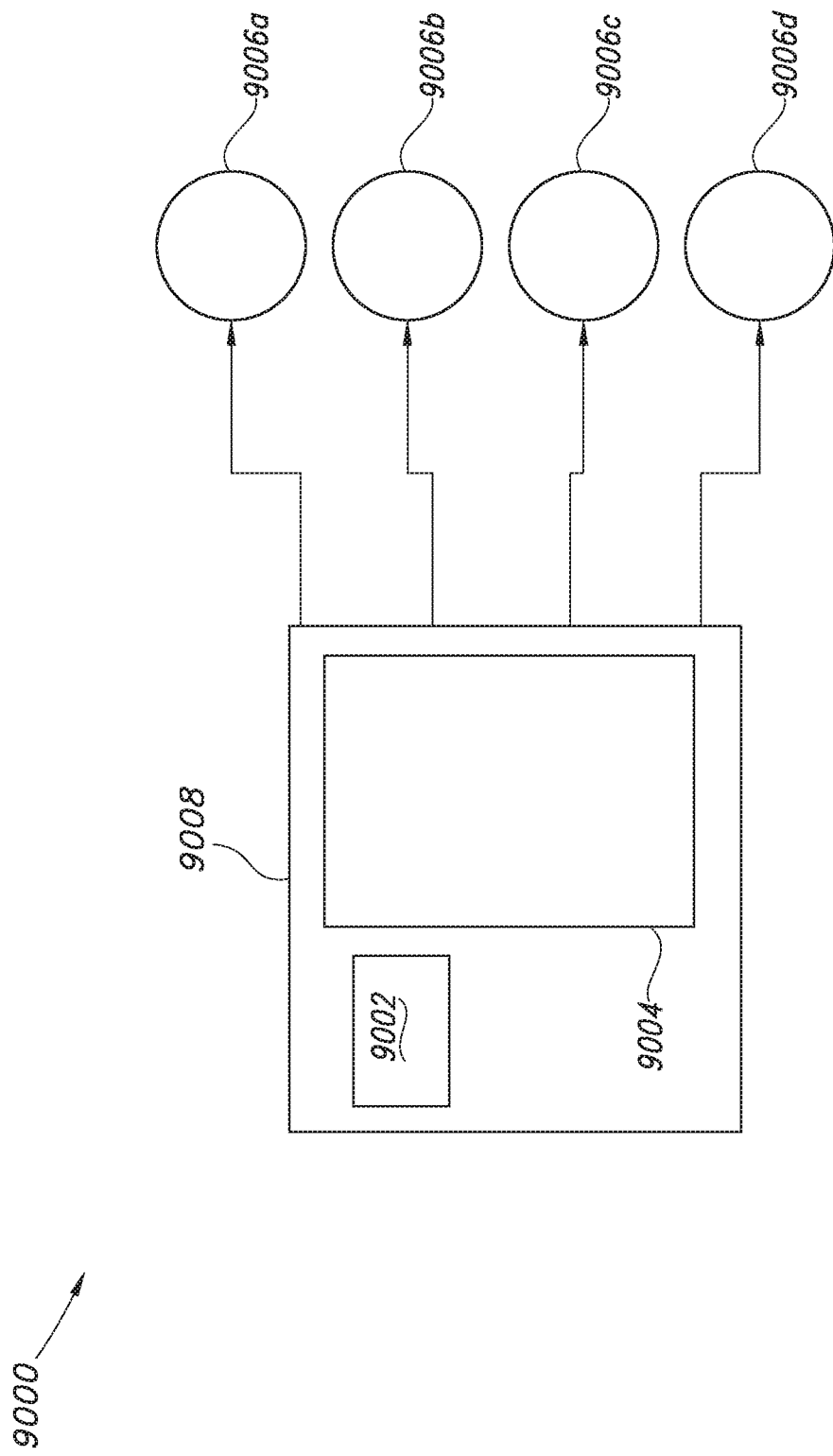
FIG. 90 depicts a schematic diagram of an adaptive system using a multi-port power converter.

Referencing FIG. 90, a schematic depiction of an adaptive system using a multi-port power converter is depicted for hybrid vehicles. The utilization of the terms multi-port, X port, and/or X-in-1 port indicate that a power converter includes one or more ports that can serve distinct power loads and/or power sources with one or more varying electrical characteristics. A configurable power converter may have one or more fixed ports, one or more configurable ports, or combinations of these. The example system 9000 includes a multi-port power converter 9008, having a number of ports structured to connect to electrical sources and/or loads. The multi-port power converter 9008 in the example of FIG. 90 is coupled to four electrical loads/sources 9006 (9006a-9006d), although any number of loads and/or sources may be connected to as described throughout the present disclosure. In the example, each load/source 9006a to 9006d has a distinct electrical characteristic, for example current type (e.g., AC, DC), frequency components (phase (s) and/or frequencies), and/or voltage. In certain embodiments, the load/source 9006 may have additional electrical characteristics or requirements—for example a load which is a motor may have rise time and/or response time requirements. The example multi-port power converter 9008 is able to configure the electrical characteristics to the multi-port connections without a change to the hardware of the multi-port power converter 108, and further is able to support configuration changes for the multi-port power converter 108 at various selectable stages of manufacture, application selection, and/or in-use operation as described throughout the present disclosure.

The example system 9000 includes a converter/inverter bank 9004. The converter/inverter bank 9004 includes a plurality of solid state components that can be converted to various configurations of DC/DC conversion interfaces, and/or DC/AC conversion interfaces, to selected ones of the ports on the multi-port power converter 9008. An example configuration includes a plurality of half-bridge components having connectivity selected by a plurality of solid state switches in the converter/inverter bank 9004. Accordingly, each of the ports on the multi-port power converter 9008 can be configured for the selected DC/DC and/or DC/AC interface according to the electrical load/sources 9006 in the application. In certain embodiments, the half-bridge components include silicon carbide (SiC) half-bridges. SiC half-bridges, in certain embodiments, can operate at very high switching frequencies and high efficiencies with low electrical losses in the converter/inverter components.

The selection of the components in the converter/inverter bank 9004 may be made according to the number of different load types to be supported. Accordingly, one of skill in the art can design a particular converter/inverter bank 9004 to support a wide variety of contemplated applications, each of which can be supported by manipulating only solid state switches and drive controls for the components of the converter/inverter bank 9004, without changes to the hardware of the multi-port power converter 9008. For example, if a given class of off-road vehicles can be supported by 4 distinct DC voltage interactions for loads and power sources (e.g., a high voltage battery, a 12-V circuit, a 24-V circuit, and a 48-V circuit), and 2 distinct AC voltage interactions (including potentially driving the load and accepting regenerative inputs), then a configurable bank of components for the converter/inverter bank 9004 and a sufficient number of ports are packaged that will support the entire class of off-road vehicles without changes to the hardware of the multi-port power converter 9008. Accordingly, a given application can be supported at a selected point in the manufacturing cycle—either through calibration in a controller 9002 at design time of the multi-port power converter 9008 (e.g., before integration with an OEM), by an OEM assembling a vehicle and/or driveline for the vehicle, and/or by a bodybuilder assembling a final vehicle for a particular application. The controller 9002 may be accessible by the use of a manufacturing tool, a service tool, or the like, to configure the component bank 9004 in the multi-port power converter 9008, and/or to define the drive controls for the components in the component bank 9004 to meet the electrical characteristics of the loads/sources 9006 in the application.

In certain embodiments, a DC/DC conversion can be supported by a half-bridge having 4 MOSFET switches, and an AC/DC conversion can be supported by a half-bridge having 6 MOSFET switches. In certain embodiments, the half-bridges may be modular and can be combined as needed to support a particular electrical input, output, or interface. Additionally or alternatively, H-bridge circuits, H-bridge circuits supporting a three-phase output, or other components may be included in the component bank 9004, depending upon the requirements for the class of applications to be supported by a particular multi-port power converter 9008.

The utilization of a multi-port power converter 9008 provides for a number of benefits and features that allow for integration of a system 9000 with a wide variety of applications without changes to the hardware. For example, the multi-port power converter 9008 allows for centralization of power management on a given application, rather than having a number of converters and/or inverters distributed throughout the vehicle or application. Accordingly, cooling requirements can be reduced, especially in the number of interfaces and connections for cooling to be supplied. Additionally, the electrical connections for power conversion throughout the vehicle or application can be standardized, and the number of connections reduced. Each connection drives a point of potential failure or environmental intrusion, and requires specification, testing, and other integration requirements. The use of a multi-port power converter 9008 greatly simplifies integration, and allows for electrification and hybridization of many applications, such as off-road applications with a wide variety of load types, that have not adopted electrification and/or hybridization in previously known systems. Further, the ability of the multi-port power converter 108 to configure port outputs and inputs allows for a wider variety of loads on a particular system to be readily integrated into an electrification and/or hybridization scheme, increasing the overall efficiency gains that can be achieved for the application, and enabling use cases for electrification and hybridization that would otherwise be prohibitive to due design and integration challenges that do are not commercially justifiable for complex designs and/or low volume applications. The ability to configure the multi-port power converter 108 without changes to hardware, interfaces, and at selected points in the manufacturing cycle additionally supports providing electrification and/or hybridization for many applications where design control and integration responsibilities may vary across the industry. Further, the multi-port power converter 9008 is configurable after initial use by an end user—for example to allow changes to a power rating or other systemic change for the vehicle or application (which could be accomplished remotely via an update to the controller 9002), changes in electrical components on the vehicle or application that a customer may implement, and/or changes in electrical components made during service, remanufacture, or other post-use events.

Figure 91:
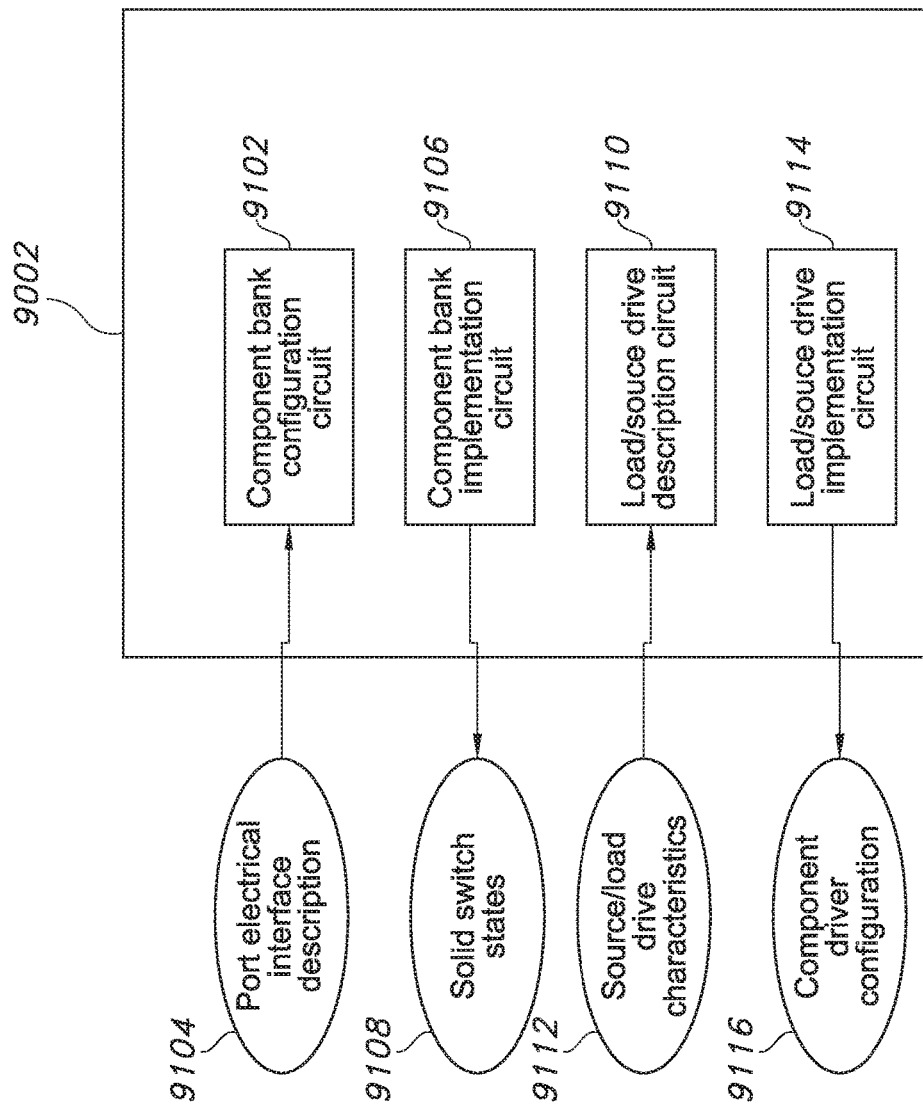
FIG. 91 depicts a schematic diagram of a controller.

Referencing FIG. 91, an example controller 9002 is depicted having a number of circuits structured to functionally execute certain operations and aspects of the controller 9002. The controller 9002 is depicted as a single device positioned on the multi-port power converter 108, but the controller 9002 may be a distributed device having portions positioned on a vehicle controller, in a manufacturing or service tool, on a server (e.g., a cloud-based or internet accessible server), or combinations of these. In certain embodiments, aspects of the controller 9002 may be implemented as computer readable instructions stored on a memory, as logic circuits or other hardware devices structured to perform certain operations of the controller 9002, and/or as sensors, data communications, electrical interfaces, or other aspects not depicted. The example controller 9002 includes a component bank configuration circuit 9102 structured to interpret a port electrical interface description 9104. The example of FIG. 91 depicts the port electrical interface description 9104 communicated to the component bank configuration circuit 9102, but the port electrical interface description 9104 may additionally or alternatively be stored in a memory on or in communication with the controller 9002. The example controller 9002 further includes a component bank implementation circuit 9106 that provides solid switch states 9108 in response to the port electrical interface description 9104, where the component bank 9004 is responsive to the solid switch states 9108, thereby setting up the connections between components on the component bank and the ports on the multi-port power converter 9008 to provide the desired electrical interfaces, including varying DC voltage inputs/outputs and/or varying AC voltage inputs/outputs.

The example controller 9002 further includes a load/source drive description circuit 9110 structured to interpret source/load drive characteristics 9112. The source/load drive characteristics 9112 are depicted as being communicated to the controller 9002, but may additionally or alternatively be stored in a memory on or in communication with the controller 9002. The source/load drive characteristics 9112 provide for any characteristics for driving a particular load, such as required phases, frequencies, rise time parameters, and/or may include qualitative functions such as emergency shutoff commands required to be supported or the like. The example controller 9002 further includes a load/source drive implementation circuit 9114 that provides a component driver configuration 9116. The component driver configuration 9116 may be, for example, the actual gate driver controls utilized to drive the components of the component bank 9004. In certain embodiments, components of a component bank 9004, such as SiC solid state inverter/converter components, are provided with gate driver controls from the manufacturer. In certain embodiments, the component driver configuration 9116 provides interface commands and requests that are passed to the manufacturer gate driver controls to make appropriate requests for driving the components such that the source/load drive characteristics 9112 are met. The actual arrangement and location of the gate driver controls is not limiting, and any arrangement is contemplated herein and can be accommodated for a particular system. It can be seen that the example controller 9002 of FIG. 91 provides for rapid configuration of electrical characteristics at the ports of a multi-port power converter 9008, including configured driver controls that are motor agnostic (e.g., able to scale across a range of motor capabilities, and meet the mechanical requirements of the motor), without hardware changes to the multi-port power converter 9008.

Referencing FIG. 151, an example component bank configuration circuit 9102 may be further structured to interpret a port configuration service request value (e.g., port configuration request 15102), and wherein the component bank implementation circuit 9106 further provides the solid switch states 9108 in response to the port configuration service request value 15102. The component bank configuration circuit 9102 may be further structured to interpret a port configuration definition value 15104, and wherein the component bank implementation circuit 9106 further provides the solid switch states in response to the port configuration definition value 15104. Accordingly, the controller 9002 for a system may be responsive to configuration requests and/or configuration definitions for events such as: service, integration, manufacture, remanufacture, upgrades, upfits, and/or changes to an application of the of the system.

Figure 92:
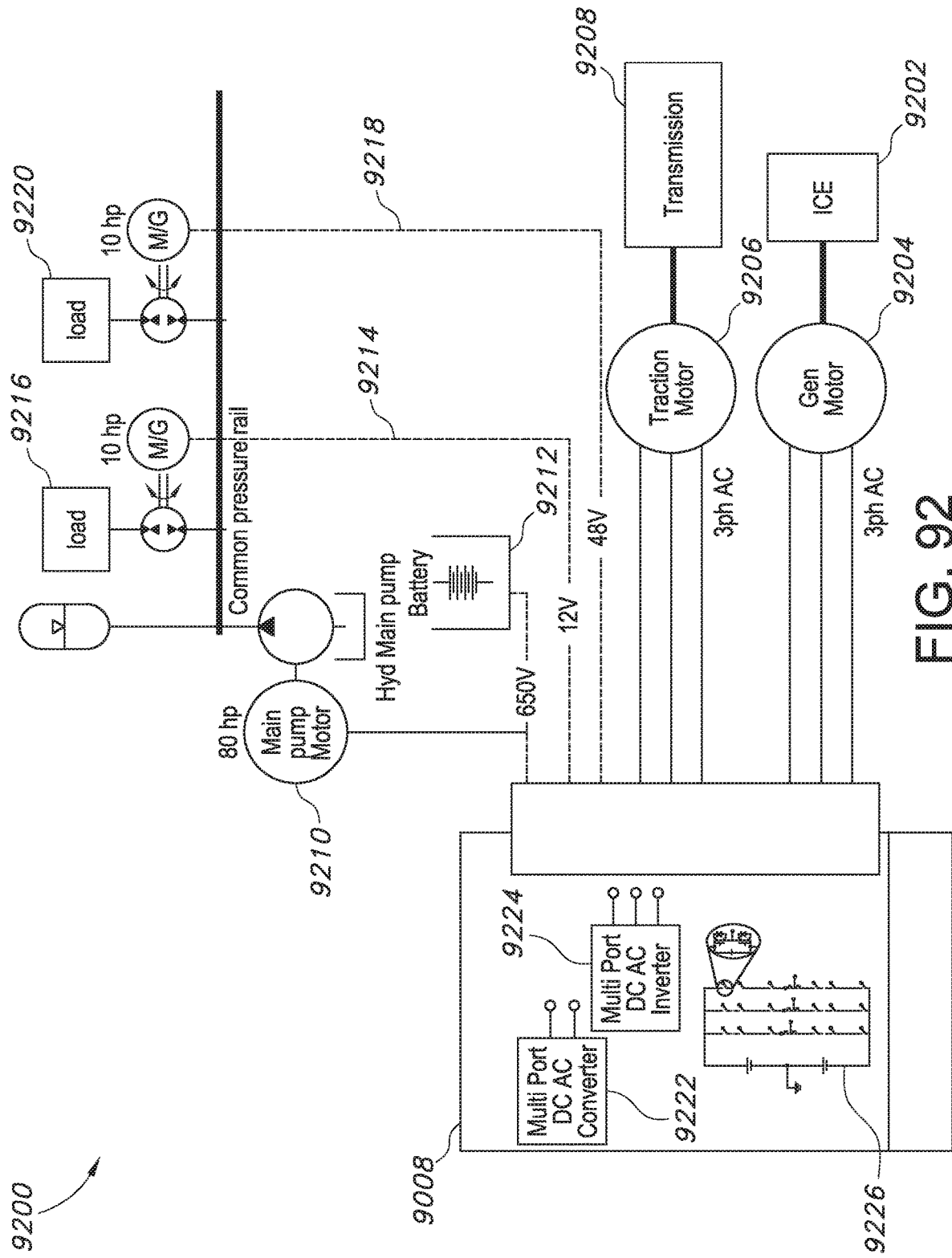
FIG. 92 depicts a schematic diagram of a controller with multi-port power converter.

Referencing FIG. 92, an example system 9200 is depicted including a multi-port power converter 9008. The example system 9200 may be an actual contemplated system—for example a serial hybrid vehicle having a plurality of DC loads, a traction motor, an internal combustion engine with a motor/generator interface to the multi-port power converter 9008, and a high voltage battery. In certain embodiments, a system 9200 may be a representative system for a class of applications—for example including a sufficient number of interfaces and loads such that, if the example system 9200 can be sufficiently supported, then a multi-port power converter 9008 to support that system would be capable to support an entire class of applications without hardware changes. In certain embodiments, a multi-port power converter 9008 may be designed in more than one version, for example to support a similar number of electrical interfaces and number of types of interfaces, but have distinct components such as to support a high voltage level in one version, and a lower voltage level in another version. It can be seen that an example system 9200 will still be useful as an actual system to be built that can be repeated with few hardware changes to support similar classes of applications, or as a representative system where a limited number of selected hardware changes in the multi-port power converter 9008 can support a large class of applications.

The example system 9200 includes an internal combustion engine 9202. The internal combustion engine 9202 represents any prime mover or power source, and may additionally or alternatively include a grid power connector, fuel cell, or other device. In certain embodiments, the internal combustion engine 9202 provides power to the multi-port power converter 9008 during certain operating conditions, and can accept power from the multi-port power converter 9008 during other operating conditions. The example system 9200 further includes a motor/generator 9204 that electrically interfaces the internal combustion engine 9202 with the multi-port power converter 9008, and is typically (but may not be) an AC device having a relatively high power rating (e.g., 80 hp in the example). Where necessary for the application or the class of applications under consideration, the motor/generator 9204 is capable to transfer power in either direction—accepting power from the internal combustion engine 9202 and/or returning power to the internal combustion engine 9202. The example depicts the multi-port power converter 9008 having a 3-wire interface to the motor/generator 9204, although any interface may be supported.

The example system 9200 further includes a traction motor 9206, which may be an AC motor and/or motor/generator, and is depicted with a 3-wire interface to the multi-port power converter 9008. In the example of FIG. 92, the traction motor 9206 drives a transmission 9208, but the traction motor 9206 may drive any traction device, for example providing motive power to the vehicle or other device. The transmission 9208 represents conceptually any primary powered component for the system 9200, and may additionally or alternatively be a pump or other high power requirement device in the system. Additionally, the transmission 9208 may not be present, and the traction motor 9206 may interface directly with the primary powered component. The example of FIG. 92 is a "serial hybrid" example, where the prime mover 9202 and the primary load 9208 are electrically separated, although a given system 9200 (whether an actual designed system or a representative system for designing in appropriate capability to a multi-port power converter 9008) may be a "parallel hybrid" (e.g., the prime mover 9202 is capable to fully or partially drive the primary load 9208 directly, at least intermittently), a fully electrical system (e.g., where the prime mover 9202 is not present, and/or is only utilized as a backup power supply), and/or any other arrangement (e.g., where shaft power from some other source is provided in addition to or at the position of the prime mover 9202 depicted in FIG. 92). In certain embodiments, an arrangement such as the serial hybrid arrangement of FIG. 92 is contemplated for a system or a representative system, because the serial hybrid arrangement provides a number of interface requirements to the multi-port power converter 9008 that are sufficient to also support other systems (e.g., serial hybrid or fully electric), and accordingly a multi-port power converter 9008 capable to support a serial hybrid arrangement is capable to support a large class of systems, vehicles, and applications without hardware changes to the multi-port power converter 9008.

The example system 9200 of FIG. 92 further depicts a number of DC loads and sources. In the example of FIG. 92, a high voltage DC interface (650 V, in the example) couples to a high voltage battery 9212 and a main pump motor 9210 (e.g., supporting a hydraulic pump for an off-road vehicle having a large hydraulic system). The main pump motor 9210 and the high voltage battery 9212 are depicted as coupled to the same 650V circuit, although a large DC load (e.g., the main pump motor 9210) and a high voltage battery 9212 need not be at the same voltage on a particular system. In the example of FIG. 92, the main pump motor 9210 is also rated at 80 hp—which in the example allows for the motor/generator 9204 to fully support either traction loads or main pump loads, which may be a contemplated arrangement for a particular system or a contemplated system to support a class of applications. However, in certain embodiments, a main DC load and/or the traction load may differ, and the motor/generator 9204 may support only a highest one of the available loads, all of the available loads simultaneously, and/or support some other load value (e.g., an expected average load over the operating cycle of the application, a load value that is expected to rely upon net battery 9212 discharging during some operating periods, or the like). In certain embodiments, the motor/generator 9204 may not be present, or may have a load capability unrelated to the DC and/or traction loads on the application.

In the example of FIG. 92, a 12 V DC interface 9214 is depicted, which in the example of FIG. 92 drives an actuator to operate a load 9216 using the hydraulic pressure from the main pump motor 9210. In the example, the 12 V DC interface 9214 is coupled to the load 9216 allowing for both actuation and regenerative recovery from the load 9216. The directional operation of power on the 12 V DC interface 9214 drives a configuration of the components in the multi-port power converter 9008 to allow for both powering the 12 V DC interface 9214 and recovering energy from the 12 V DC interface 9214, and can be utilized for any 12 V DC operations (e.g., vehicle accessories, low power devices, etc.). In certain embodiments, power recovered on the 12 V DC interface 9214 may be returned to the high voltage battery 9212, provided to a low voltage battery interface (not shown), and/or used for other loads in the system.

In the example of FIG. 92, a 48 V DC interface 9218 is depicted, which in the example of FIG. 92 drives an actuator to operate a second load 9220 using the hydraulic pressure from the main pump motor 9210. In the example, the 48 V DC interface 9218 is coupled to the load 9220 allowing for both actuation and regenerative recovery from the load 9220. The directional operation of power on the 48 V DC interface 9218 drives a configuration of the components in the multi-port power converter 9008 to allow for both powering the 48 V DC interface 9218 and recovering energy from the 48 V DC interface 9218, and can be utilized for any 48 V DC operations (e.g., vehicle accessories, refrigeration, PTO devices, etc.). In certain embodiments, power recovered on the 48 V DC interface 9218 may be returned to the high voltage battery 9212, provided to a low voltage battery interface (not shown), and/or used for other loads in the system.

It can be seen that a system 9200 such as depicted in FIG. 92 can readily provide for integration and support to a large number of applications with minimal changes for design of the interface to the multi-port power converter 9008, and with no changes to hardware or selected versions from a small number of hardware versions of the multi-port power converter 9008. Certain application differences can be supported without changes—for example the types of loads on a 12 V interface 9214 can be changed without any hardware or even calibration changes in the controller 9002. Certain application differences can be supported with only calibration changes in the controller 9002—for example switching a 12 V interface 9214 to a 24 V interface (or some other value). Certain application differences can be supported with only a minor hardware version change—for example switching a high voltage DC from 650 V to 900 V may require only a different version of the multi-port power converter 9008 having a more capable SiC component that can interface with the higher voltage. It can also be seen that many application changes can be accommodated at selected points in the manufacturing cycle, including at design time of the multi-port power converter 9008, at a OEM phase (e.g., integrating the multi-port power converter 9008 with a selected driveline), at a bodybuilder phase (e.g., integrating a particular vehicle or specific loads with the multi-port power converter 9008), and/or after the application has been in use (e.g., changing or upgrading an electrical system of the vehicle, changing a power rating, performing a remanufacture or upgrade of the application, and/or changing a basic use scenario or duty cycle for the system, vehicle, or application). Additionally or alternatively, versions of the multi-port power converter 9008 may be configured for different applications that are electrically similar (e.g., the same or similar number of distinct voltages, electrical types, and power ratings required) but have different certifications or regulations applicable, where the configuration of the multi-port power converter 9008 is otherwise similar, but the components, diagnostics, or other aspects of the multi-port power converter 9008 are configured in each version for the different certifications, regulations, or other requirements of each class of applications. For example, an electrically similar on-road and off-road application may have distinct requirements for certifications and/or a different regulatory requirement for components on the multi-port power converter 9008.

Figure 107:
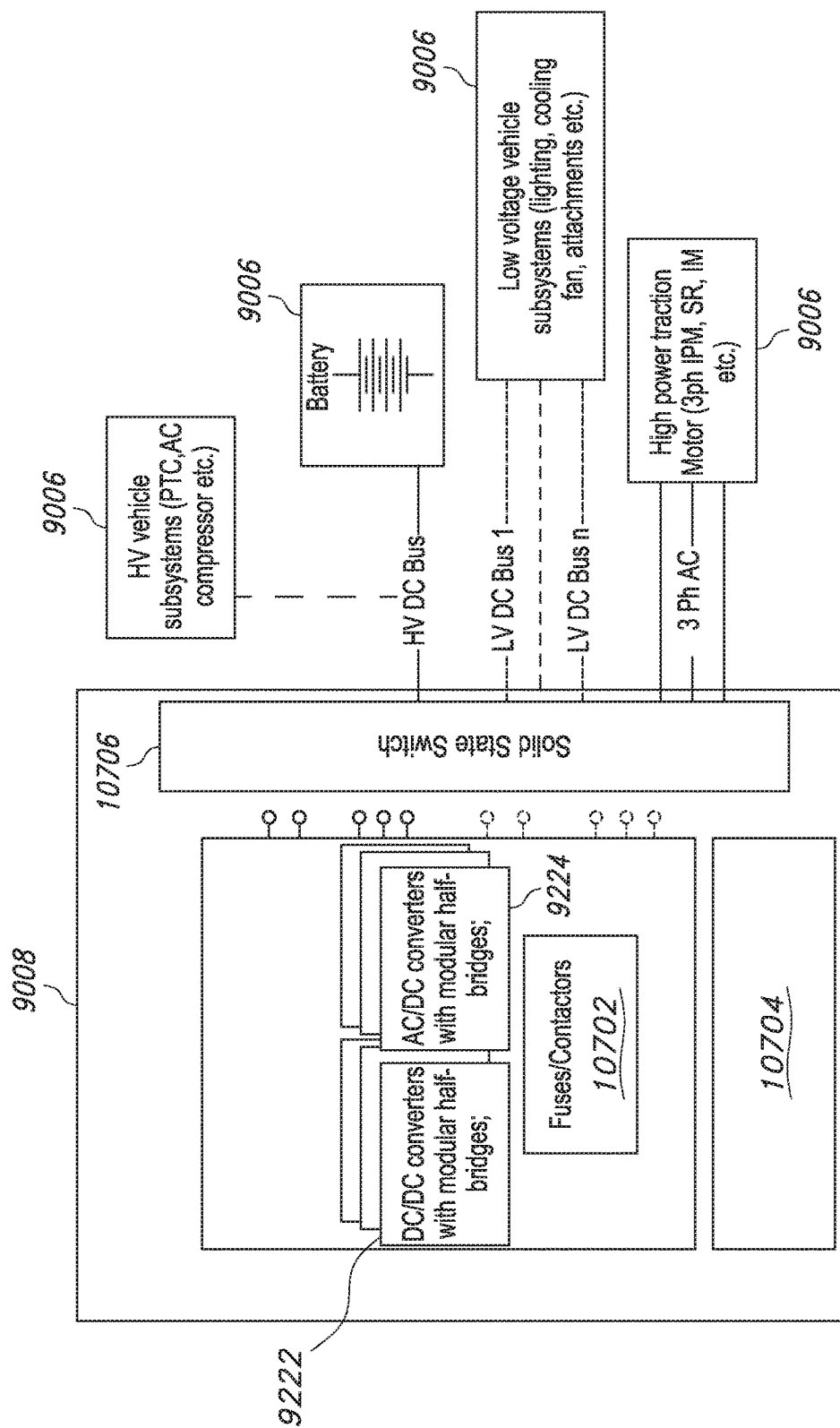
FIG. 107 depicts a schematic diagram of a multi-port converter with solid state switch.
Figure 108:
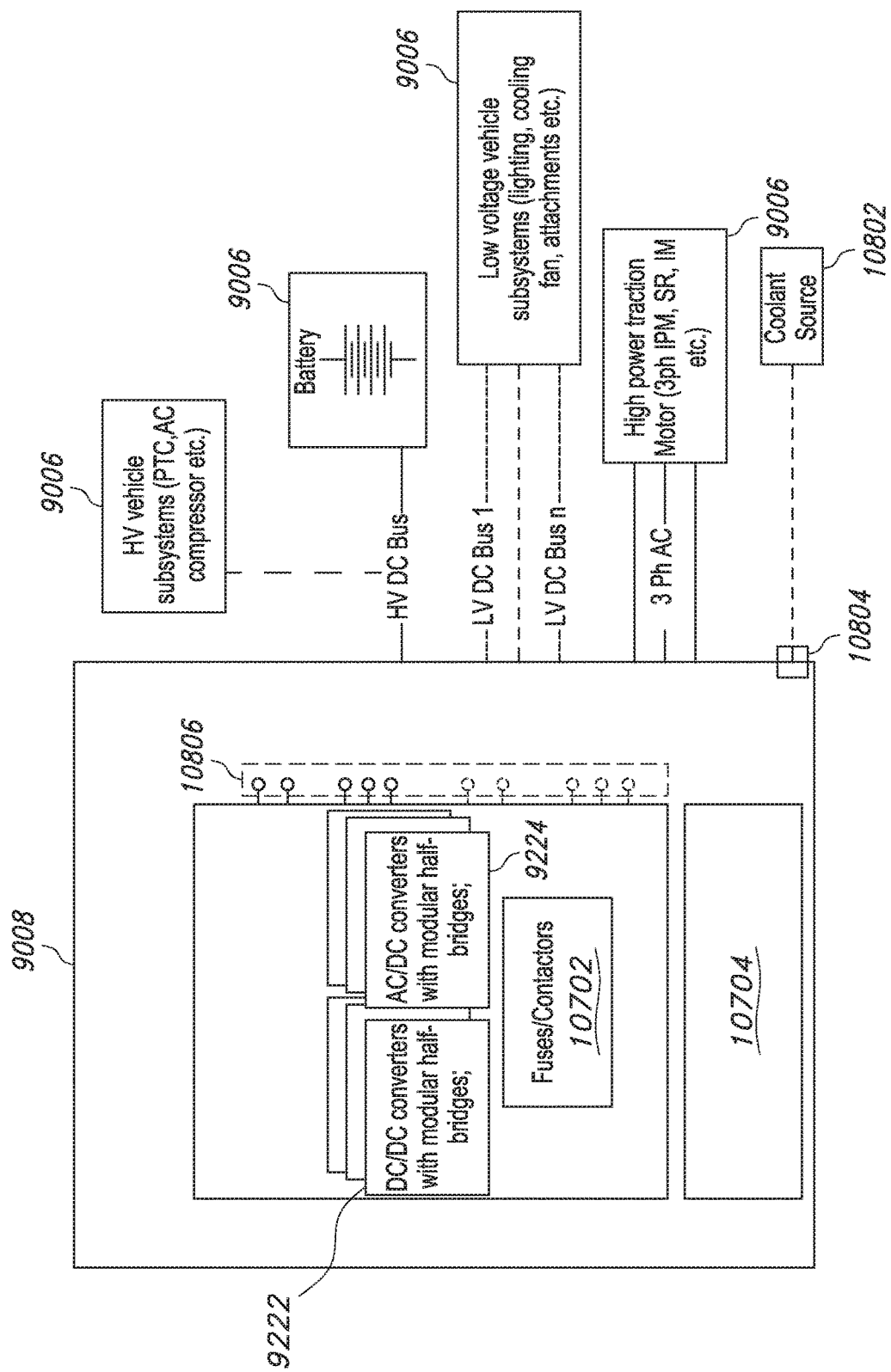
FIG. 108 depicts a schematic diagram of a multi-port converter.

Referencing FIG. 107, an example X-port converter 9008 is depicted, which is similar to the embodiment depicted in FIG. 92. In the example of FIG. 107, the X-port converter 9008 further includes fuses/contactors 10702, which may be provided on circuits to be used for power connections, and/or may be configured to be coupled into selected circuits by solid state switches. The example X-port converter 9008 further includes a solid state switch bank 10706 positioned between the power electronics 9222, 9224 and coupling ports on the housing of the X-port converter 10706, allowing for configured power electronics, fuses, and/or contactors to be directed into the circuit associated with any selected port. The example X-port converter 9008 further includes a controller 10704, which may be responsive to commands to configure the converter, to interrogate electrical sources and loads to determine their electrical characteristics, and/or to determine power exchange parameters (e.g., regenerative loads received, etc.) and improve the efficiency of operations of the converter to support the loads and sources. Referencing FIG. 108, an example X-port converter 9008 is depicted, which is similar to the embodiment depicted in FIG. 107. In the example of FIG. 108, the port bank 10806 may not include a solid state switch bank. In the example of FIG. 108, ports of the converter 9008 have configurable electrical characteristics, but may have less flexibility than the example of FIG. 107. For example, a given port may be a dedicated AC port in the example of FIG. 108, with configurable voltage, frequency, and phase ratings, where in the example of FIG. 107 a given port may be switchable between AC and DC. The example converter 9008 of FIG. 108 additionally includes a coolant port (e.g., a coolant inlet coupling and a coolant outlet coupling) for coupling to a coolant source 10802 (e.g., the primary cooling system for an electric mobile application). In the example, the coolant coupling 10804 provides for a consistent cooling interface to all power electronics. The coolant coupling 10804 may be present in any embodiment of the converter 9008.

It can be seen that the systems described herein provide for a high machine level efficiency for systems, vehicles, and applications at a lower cost than previously known systems. Additionally, the ease and selectability of integration of the systems herein enable the use of hybrid, fully electric, and/or regenerative systems for applications not previously available due to the difficulty of integration and/or low volumes of such applications that prohibit development of a hybrid, fully electric, and/or regenerative system for such applications. The systems described herein are scalable to different power ratings and voltage levels on both DC and AC portions of the system. Additionally, energy recovery systems for a wide variety of loads, such as for hydraulic loads, motive loads, PTO loads, pneumatic loads, and/or any other type of load that is capable of interfacing with an electrical system of any type can readily be supported, including as a class of applications that are supported without hardware changes to a multi-port power converter 9008. Additionally, the systems herein are agnostic to the motor and/or motor/generator requirements for a particular application, and can support any type of electrical interface without hardware changes and/or with only minimal calibration changes in a controller 9002 at a selected point in a manufacturing cycle, and including post-use changes such as for upgrades, remanufacture, service, and/or maintenance. The systems herein provide for a ready interface and integration with prime movers or power sources, traction drive, and system loads. Both load support and energy recovery are readily supported on any interface of the multi-port power converter 9008. A wide variety of previously known applications do not utilize hybridization and/or electrification due to the integration, certification, and/or number of diverse loads on those systems that prohibit reasonable integration of hybrid and/or electrified actuation and energy recovery of various loads—such as pumps, cranes, heavy-duty work vehicles, wheel loaders, aerial lift trucks, and tractors. The systems herein provide for ease of design and integration with any such applications, including the support of classes of applications with a configurable multi-port power converter 9008 able to accommodate the classes of applications without hardware changes, and/or using a small selected number of hardware versions. The use of SiC components in a multi-port power converter 9008 can provide 5-10% power conversion efficiency improvement in electrical conversion, and the addition of energy recovery and prime mover optimization (e.g., operating a prime mover in efficient operating regions a greater percentage of the time during operations) can result in overall machine level efficiency gains of >50% for applications where previously known systems do not enable adoption of hybridization and/or electrification of loads and energy recovery. The systems herein provide for ready adoption of hybridization and electrification of loads on an application where previously known systems are not feasible for integration, and provides for selected engagement of the design of the multi-port power converter 9008 in the manufacturing and supply chain to further improve ease of integration and enable adoption for applications where previously known systems are not viable.

Figure 93:
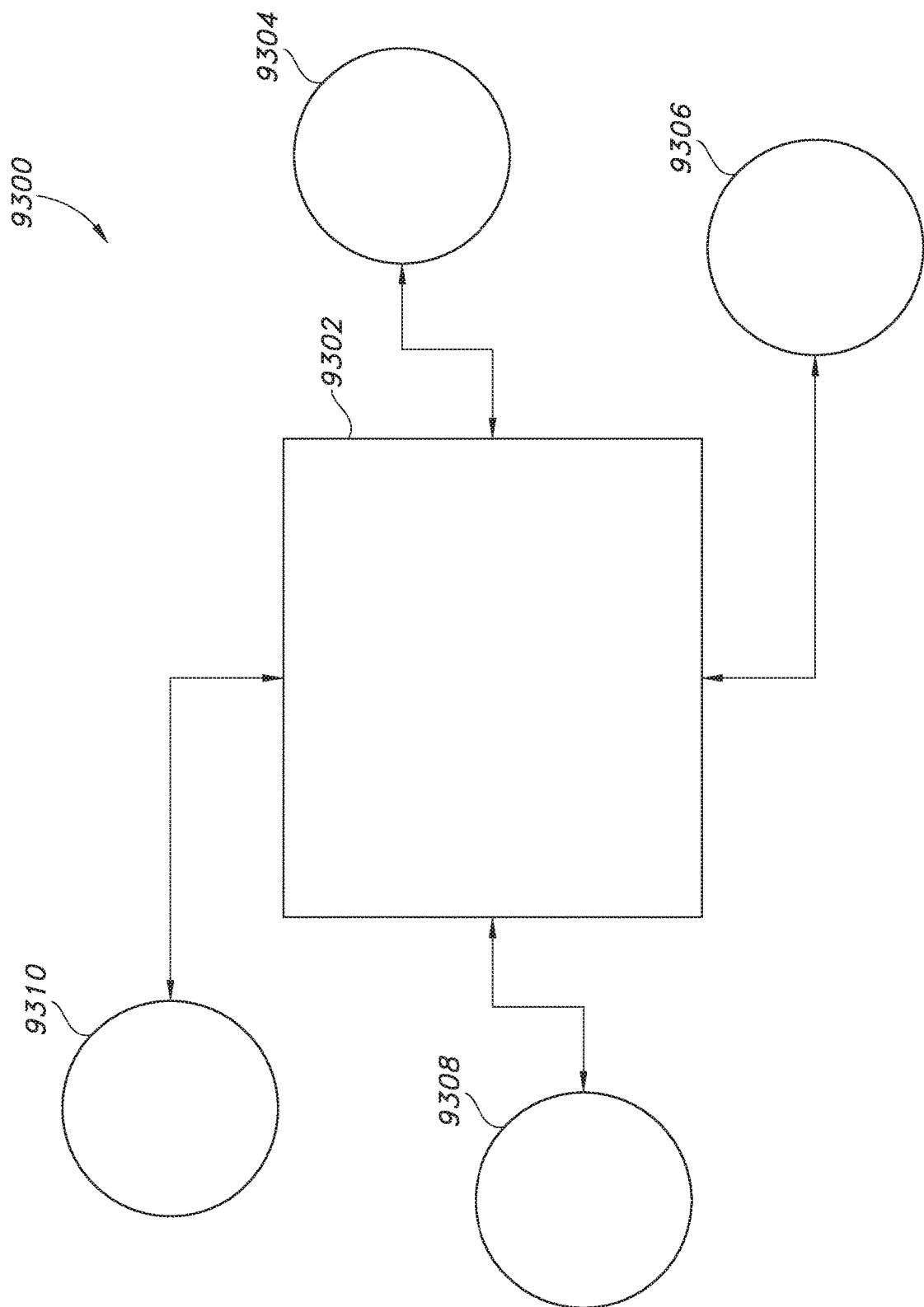
FIG. 93 depicts an embodiment functional diagram of a breaker-relay.

Referencing FIG. 93, an example breaker/relay 9302 is schematically depicted in a context 9300. The example context 9300 includes a regulatory interface 9304, for example including legal or industry regulations, policies, or other enforceable frameworks for which the breaker/relay 9302 is responsible to maintain certain performance characteristics. The example regulatory interface 9304 may be physically manifested during run-time operations of an application having the breaker/relay 9302 thereon—for example as a network communication, calibrated value for a response, selection of a sizing of a component of the breaker/relay 9302 or the like, and/or the regulatory interface 9304 may represent one or more design time considerations made during the selection, installation, repair, maintenance, and/or replacement of a breaker/relay 9302 that are not physically manifested during run-time operations of the application having the breaker/relay 9302 thereon.

The example context 9300 further includes a command and/or control interface 9306, which may include signals, voltages, electrical couplings, and/or network couplings over which commanded functions (e.g., connector open or closed commands) are received by the breaker/relay 9302. In certain embodiments, the breaker/relay 9302 includes only electromechanical components—for example where the breaker/relay 9302 does not include a microprocessor, controller, printed circuit board, or other "intelligent" features. In certain embodiments, the breaker/relay 9302 includes some functions controller locally on the breaker/relay 9302, and other functions controller elsewhere on an application having the breaker/relay 9302 thereon—for example on a battery management system controller, vehicle controller, power electronics controller, and/or having aspects distributed across one or more controllers. In certain embodiments, certain command or control aspects are provided as physical or electrical commands, and other command or control aspects are provided as communicative elements (e.g., datalink or network commands) and/or as intelligent aspects of the breaker/relay 9302 determined in accordance with programmed logic in response to detected or otherwise determined parameters during run-time operations.

The example context 9300 further includes an environmental interface 9308, such as the vibration, temperature events, shock, and other environmental parameters experienced by the breaker/relay 9302. Aspects of the environmental interface 9308 may be physically manifested in the breaker/relay 9302, for example through material design selections, sizing and location of parts, connector selections, active or passive cooling selections, and the like. Additionally or alternatively, the planned or experienced duty cycle, power throughput, or the like may be a part of the environmental interface 9308 of the breaker/relay 9302.

The example context 9300 further includes a high voltage interface 9310, for example a coupling to the high voltage battery of a system, to system loads, to a charger, or the like. In certain embodiments, the high voltage interface 9310 is physically manifested on the breaker/relay 9302, for example with voltage ratings, sizes of components, ratings of current sensors (where present), material selections, and the like. Any example features of a breaker/relay as described throughout the present disclosure may be included herein for an example breaker/relay 9302, including without limitation arc extinguishing features, contactor design elements, connector contact force affecting aspects, and the like. Any aspects of the context 9300 may be included or omitted, and the described aspects of the context 9300 are not limiting to the contemplated context 9300 of a particular breaker/relay 9302. Additionally, it will be understood that the organization of context 9300 aspects is an example for clarity of description, but that particular aspects 9304, 9306, 9308, 9310 may be omitted, separated, and/or present on other aspects 9304, 9306, 9308, 9310 in certain embodiments. For example, a voltage limit, time limit for response, etc. may be understood to originate from a regulatory interface 9304 in one embodiment, from a command/control interface 9306 in another embodiment, and from both interfaces 9304, 9306 in yet another embodiment.

Figure 94:
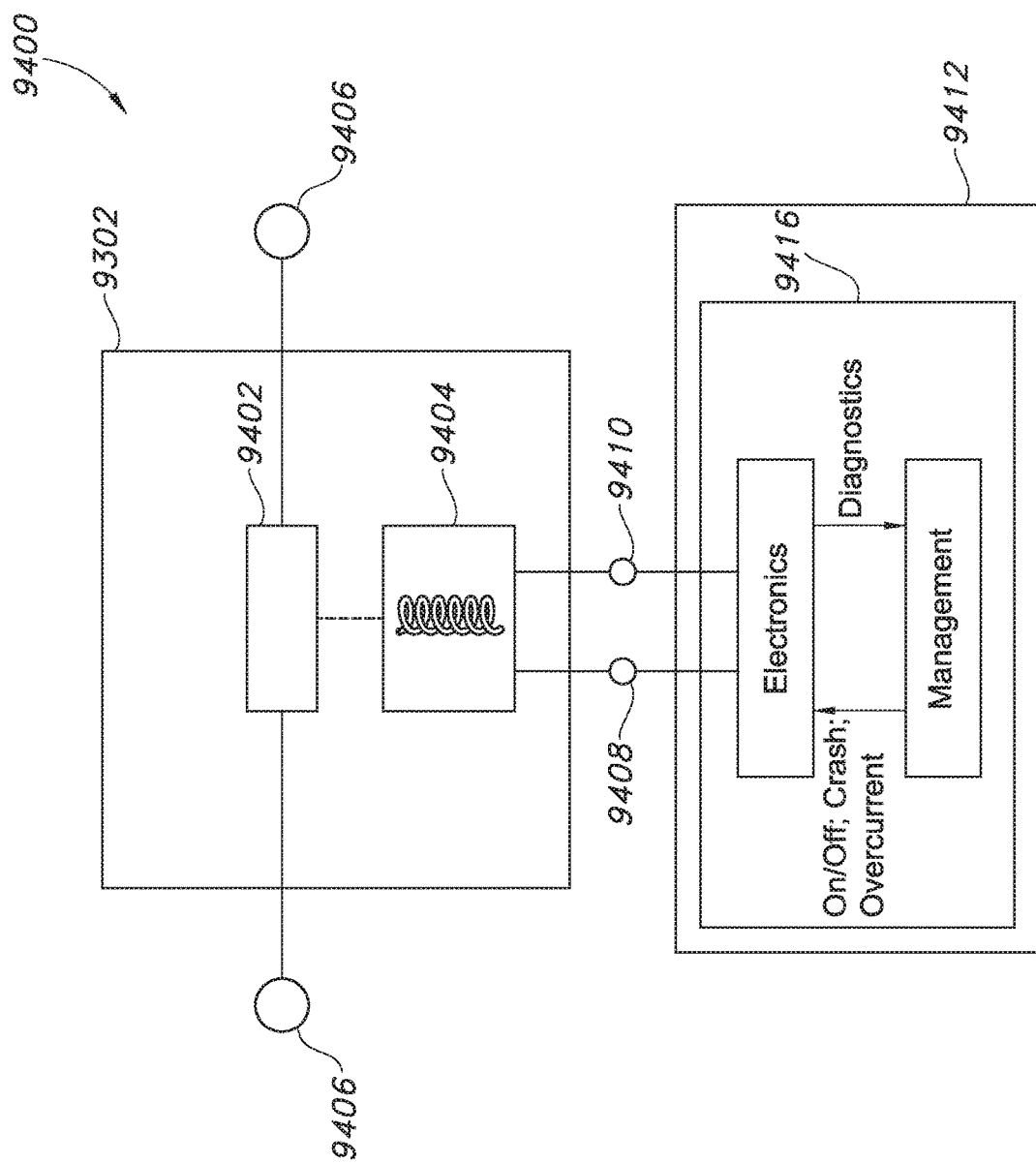
FIG. 94 depicts an embodiment schematic diagram of a breaker-relay.
Figure 96:
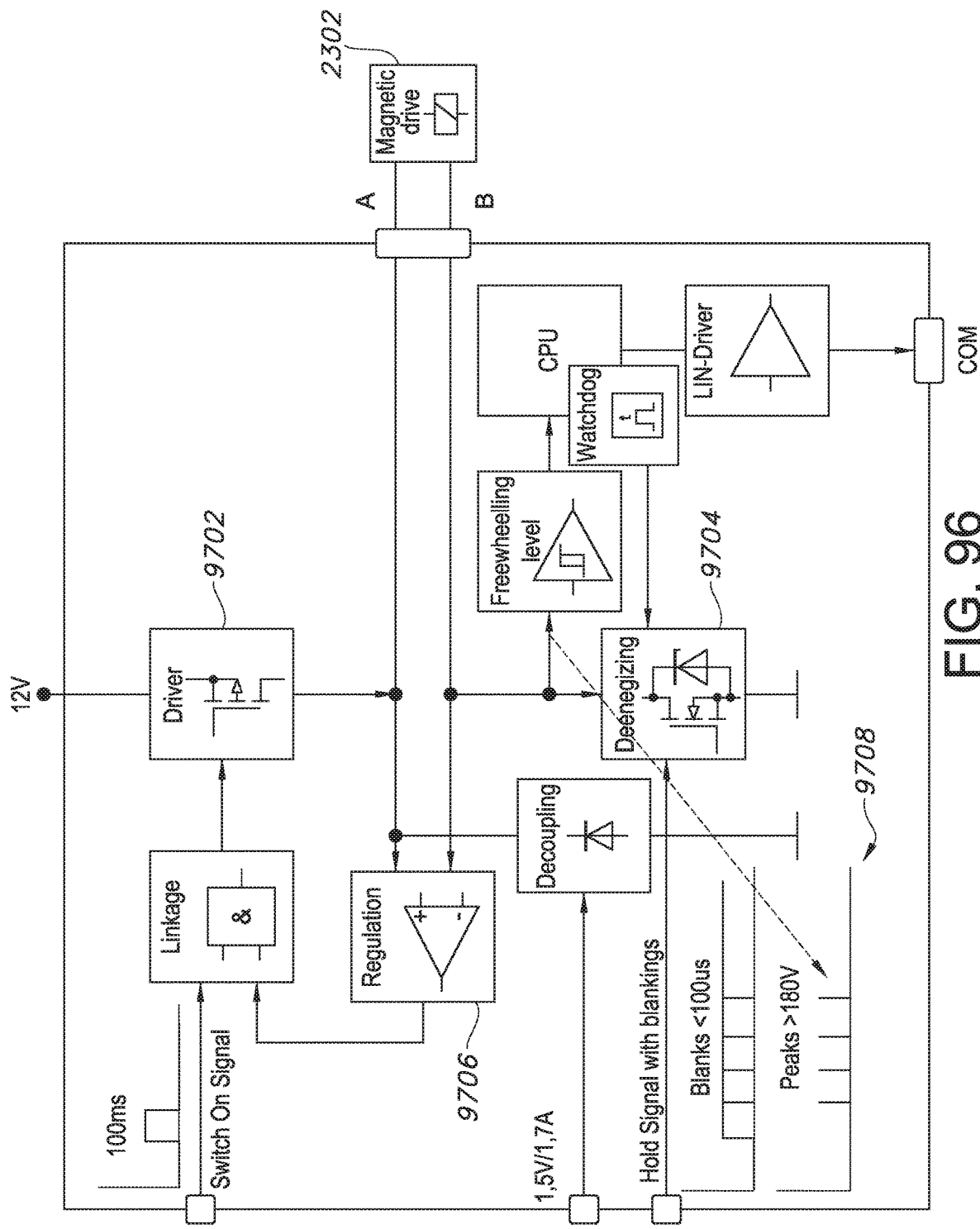
FIG. 96 depicts an embodiment schematic diagram of breaker-relay operations.

Referencing FIG. 94, an example breaker/relay architecture 9400 is depicted. The example breaker/relay 9302 includes all electronic control functions positioned away from the breaker/relay 9302, with only electro-mechanical hardware remaining on the breaker/relay 9302. The example breaker/relay 9302 includes a contactor 9402 movably operated by a coil 9404, for example a high voltage contactor that is normally open or normally closed, and wherein power to the coil 9404 provides for opening or closing force to the contactor 9402. In certain embodiments, the contactor 9402 is normally open, and power to the coil 9404 closes the contactor 9402. The example architecture 9400 further includes a high voltage circuit 9406 switched by the contactor 9402, and a pair of input signals—for example an A input 9408 and a B input 9410, although any number and type of input signal is contemplated herein. An example system is depicted in FIG. 96 showing example operations of the Electronics to control the example breaker/relay 9302 (Magnetic drive 2302 in the depiction of FIG. 96). The example architecture 9400 further includes an external controller 9412, for example a battery management controller, vehicle controller, or other controller present on an application, the external controller 9412 including the Electronics portion and a Management portion. For the example architecture 9400, the Electronics portion schematically depicts a controller configured to manage direct opening and closing control of the breaker/relay 9302 and to communicate diagnostic information about the breaker/relay 9302. The Management portion schematically depicts the sourcing of external commands to the breaker/relay 9302, for example to command the breaker/relay 9302 on or off, to implement an over-current shutdown, and/or to implement an auxiliary or safety shutdown (e.g., a crash signal, service event signal, or the like). The Electronics and Management portions are depicted in an arrangement for clarity of description, but it is understood that aspects of the Electronics and Management portions may be distributed throughout a system, and/or portions of the Electronics may be positioned on a breaker/relay 9302.

Figure 95:
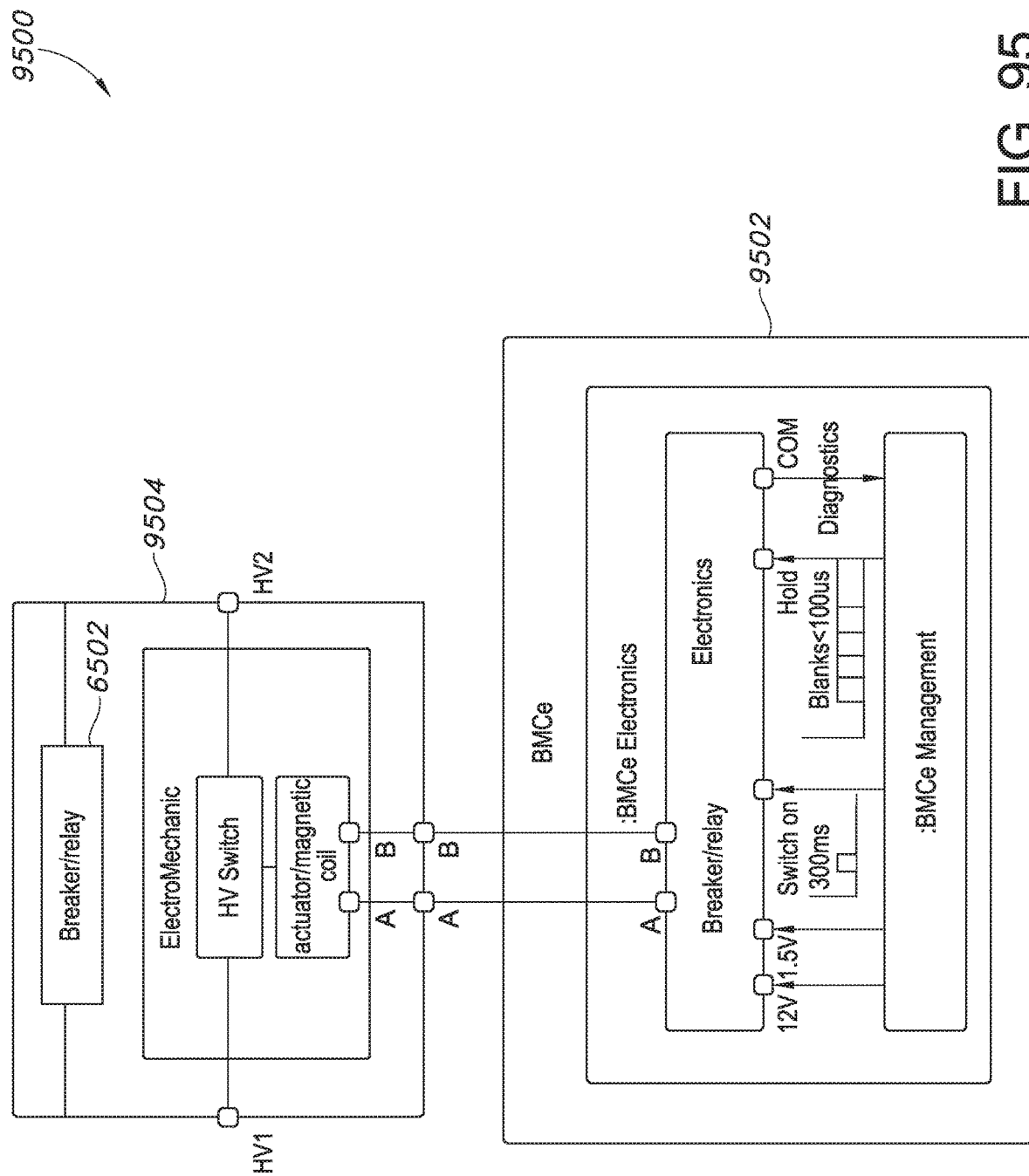
FIG. 95 depicts an embodiment schematic diagram of a breaker-relay configuration showing certain voltage, amperage, and time-based values.

Referencing FIG. 95, an example system 9500 is depicted showing certain voltage, amperage, and time-based values for an example system. The example system 9500 includes a switch on signal having certain electrical characteristics and a hold signal having certain electrical characteristics, which are non-limiting examples. The example system 9500 is consistent with certain embodiments of the architecture 9400 depicted in FIG. 94. An example breaker/relay consistent with certain embodiments of the system of FIG. 95 is responsive to an 8.2V switch-on voltage, a holding voltage of 1.5V, and includes a 3 Ohm resistance in the actuating coil.

Referencing FIG. 96, operations of an example Electronics portion of an architecture 9400 such as that depicted in FIG. 94 are shown for purposes of illustration. It will be understood that components of a system such as in FIG. 96 may be implemented in hardware, software, logic circuits, and/or may be combined or distributed about a system. The example Electronics include a Switch On response, with a 12 V control voltage applied to the module. The actual drive coil of the breaker/relay can be switched to the control voltage via a deenergizing circuit and driver. The switch-on driver 9702 is controlled at approximately 65% of the minimum nominal voltage (e.g., rated value <70% or 8.2 V) for 100 ms. The timing, voltage, and switching logic of Switch On operations are non-limiting examples. During Switch On operations, the drive coil is energized with the pull-in current, so that the drive can switch on.

An example Electronics includes a Regulation response. An example Regulation response includes linearly regulating the voltages during the Switch On process, for example using a control circuit (Regulation) and Linkage for the duration of the switch-on process (e.g., 100 ms) thereby applying a selected actuating voltage to the drive coil.

An example Electronics includes a Hold response. The example Hold response includes disabling the Driver after the Switch-on time period, and providing the drive coil with a hold signal (e.g., 1.5 V) that remains on constantly, and/or constantly with diagnostic interruptions (e.g., see schematic voltage graph 9708).

In certain embodiments, the deenergizing transistor is checked at selected intervals (e.g., depending upon the Fault Tolerant Time Interval, a regulatory or policy interval, and/or an interval of interest). If the deenergizing transistor is defective (e.g., if it is permanently conductive), the breaker/relay will be reliant on turning off the 1.5V supply to de-energize the magnetic drive. While the system can still be turned off, the operations with a defective deenergizing relay may be slower than anticipated, and/or too slow for the breaker/relay to be compliant. In certain embodiments, the frequent blanking pulses (or diagnostic interruptions) lead to cut-off voltage peaks at the coil connection (Freewheeling level, approx. 180V in the example system). If the voltage peaks remain off, the deenergizing transistor can be diagnosed as defective. In certain embodiments, the blanking pulses are kept short, thereby keeping the energy in the freewheeling circuit low, reducing waste energy and heating, and also keeping the holding energy low to reduce noise emissions. In certain embodiments, 100 micro-second blanking pulses are sufficient. In certain embodiments, faster or slower blanking pulses may be utilized. In certain embodiments, diagnostics of the deenergizing relay and/or system responses (e.g., a more conservative shut-off to account for slower response) may be utilized, in the Electronics, the Management, or elsewhere in the system.

An example Electronics includes a Switch-off and/or deenergizing response. In the example, turning off the 1.5V holding voltage deactivates the deenergizing circuit above a trigger voltage of about 4.5V (nominal<50%*Urated=6V).

Certain further example embodiments of systems having a breaker/relay device incorporated therein are set forth following. Any one or more aspects of the following systems may be included within any other systems or portions of a system described throughout the present disclosure. Any one or more aspects of the following systems may be utilized in performing any procedure, operations, or methods herein.

Figure 97:
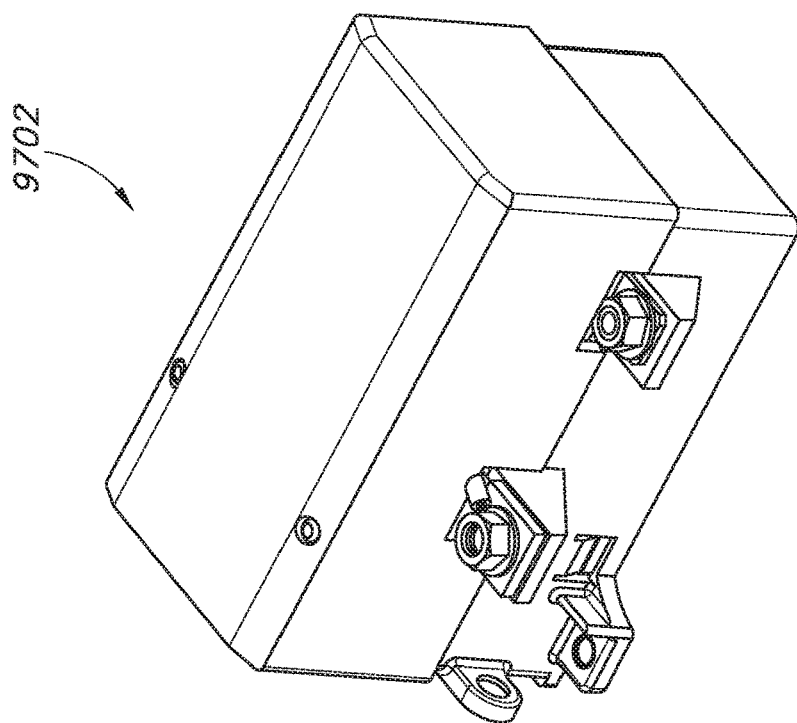
FIG. 97 depicts an embodiment breaker-relay device with pre-charge circuit.

Referencing FIG. 97, an example system 9702 includes a breaker/relay device having a pre-charge circuit, a current sensor, and a pyro-switch device positioned within a single housing. Referencing FIG. 98, the system 9207 is depicted with a transparent housing for convenience of illustration. The example system 9702 includes the breaker/relay 6502, a current sensor 6706, a pre-charge fuse 6406, and a pre-charge contactor 6408 positioned within the housing and arranged to electrically interface with a power circuit, such as a mobile power circuit for a mobile electric application.

Figure 98:
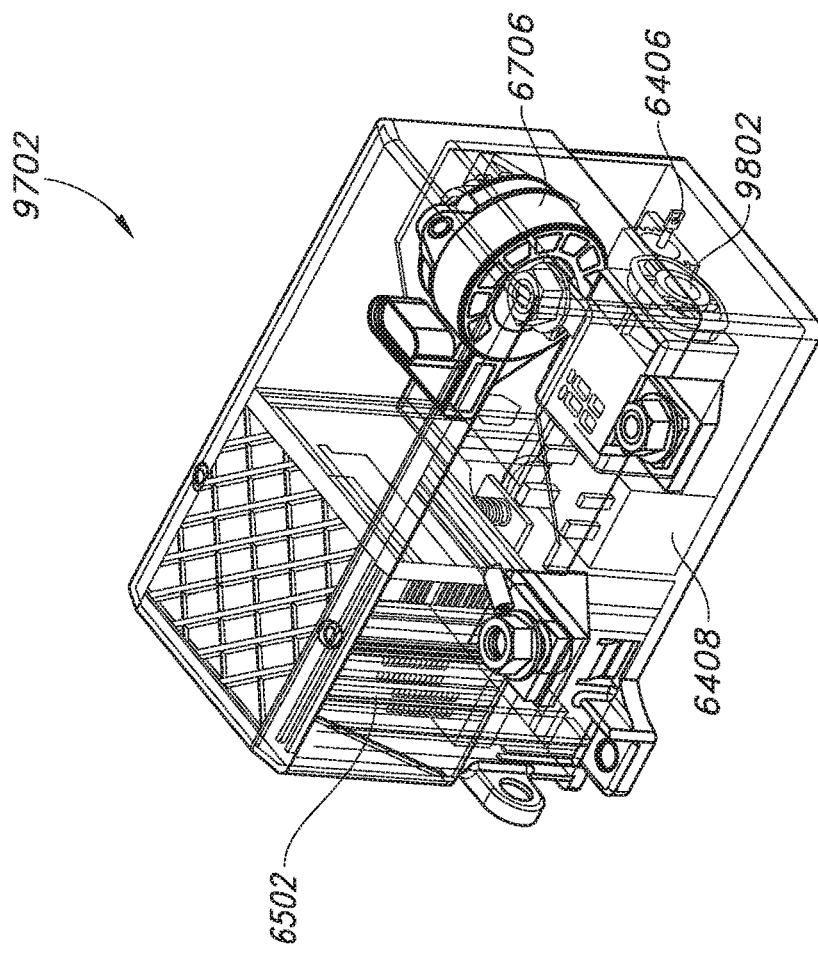
FIG. 98 depicts an embodiment breaker-relay device with pre-charge circuit.
Figure 99:
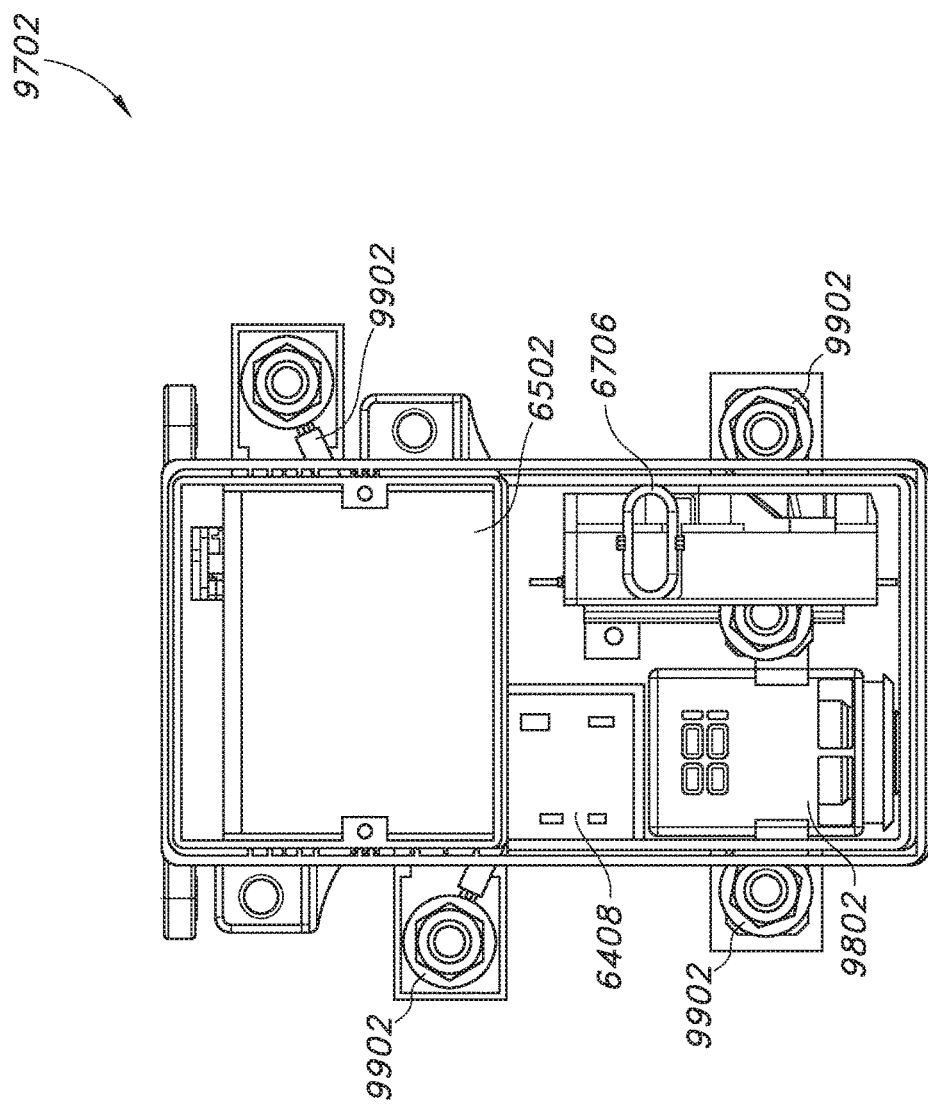
FIG. 99 depicts an embodiment breaker-relay device with pre-charge circuit.
Figure 100:
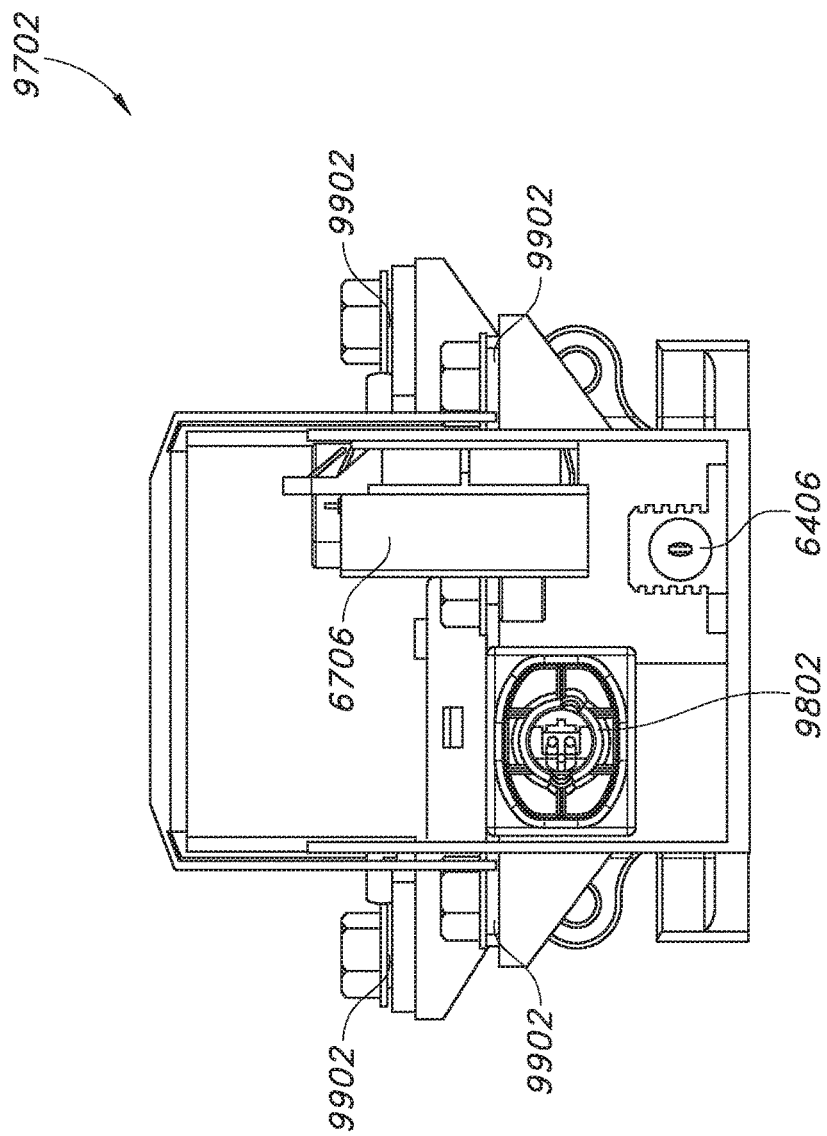
FIG. 100 depicts an embodiment breaker-relay device with pre-charge circuit.

In certain embodiments, the breaker/relay device includes any combined breaking and contacting device, for example as described throughout the present disclosure. In certain embodiments, the breaker/relay device includes a single contact (e.g., as compared with a dual contact embodiment). In certain embodiments, the breaker/relay device includes two contacts operated utilizing a single actuator. In certain embodiments, the system includes a fuse, which in the embodiment of FIG. 98 is depicted as a pyro-switch 9802 (or pyro-fuse), such as a pyrotechnically activated fuse (e.g., a fuse separated at a selected time by operating a small explosive device to break the circuit). In certain embodiments, the pyro-switch is operated on a circuit in line with one leg of the circuits controlled by the breaker/relay device 6502, for example to provide pyro-switch protection for a high side or a low side of a circuit. For convenience of illustration, the pre-charge circuit wiring is not depicted. The pre-charge circuit may be wired in parallel with a contactor of the breaker/relay 6502, and/or in parallel with the pyro-switch 9802. Referencing FIG. 99, a top schematic view of the system 9702 is depicted, showing an illustrative arrangement of the components in the system. The example system 9702 includes high voltage connections 9902, such as a low and high side connection to a power source (e.g., a high voltage battery) and a low and high side connection to a load (e.g., a motor providing motive power). Referencing FIG. 100, a side schematic view of the system is depicted, from an end having the pyro-switch 9802 and the pre-charge fuse 6406.

In certain embodiments, the system 6702 (e.g., a "breaker/relay PDU") has a mass that does not exceed 5 kg, and/or does not exceed 1.5 kg. In certain embodiments, a dimension of the breaker/relay PDU is smaller than one or more of: a 600 mm length, a 140 mm width, and/or a 110 mm height. In certain embodiments, a dimension of the breaker/relay PDU is smaller than one or more of: a 160 mm length, a 135 mm width, and/or a 105 mm height. In certain embodiments, the breaker/relay PDU is capable to support operating at 300

A or greater continuous current flow. In certain embodiments, the breaker/relay PDU is capable to interrupt 1100 A and/or over 400 V without assistance. In certain embodiments, breaker/relay PDU is capable to interrupt 8,000 A and/or over 400 V. In certain embodiments, the breaker/relay PDU is capable to passively interrupt a short circuit condition (e.g., no outside control signal or communication required), and/or is further capable to actively interrupt other operating conditions (e.g., an active trigger command for any reason). In certain embodiments, the pyro-switch 9802 is on the negative leg of the overall circuit, although the pyro-switch may be anywhere it is desirable. In certain embodiments, the pyro-switch is actively controlled with a trigger to command an interrupt. In certain embodiments, the breaker/relay, the pyro-switch 9802, and/or both may be actively commanded to interrupt the circuit. In certain embodiments, the breaker/relay PDU is capable to support dual amp ratings, such as 90 A and 1000 A (non-limiting example).

Figure 101:
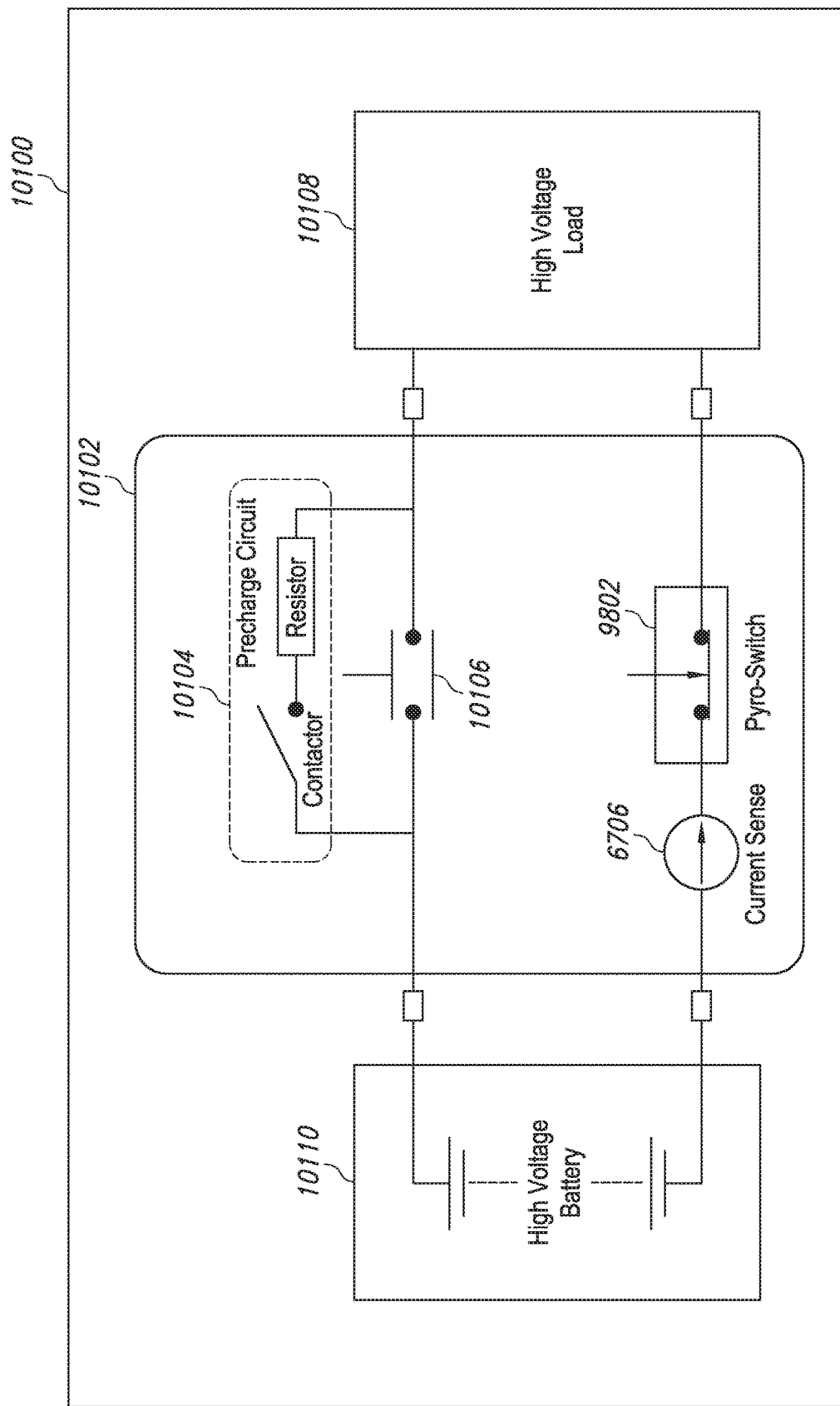
FIG. 101 depicts an embodiment schematic diagram of a single-pole breaker/relay device.

Referencing FIG. 101, an example system 10100 includes a power circuit protection arrangement for a high-voltage load, such as for a motive power circuit for a mobile application. The example system 10100 includes a breaker/relay PDU 10102, where the breaker/relay 10106 is disposed in the high-side of the motive power circuit. The example system 10100 includes a pre-charge circuit 10104, including a pre-charge resistor and a pre-charge contactor, positioned within the housing of the breaker/relay PDU 10102. The example system further includes a current sensor 6706 and a pyro-switch 9802 positioned within the housing of the breaker/relay PDU 10102. The system includes the breaker/relay PDU 10102 interfaced with a high-voltage battery 10110 on a first side, and with a high-voltage load 10108 on a second side.

Figure 102:
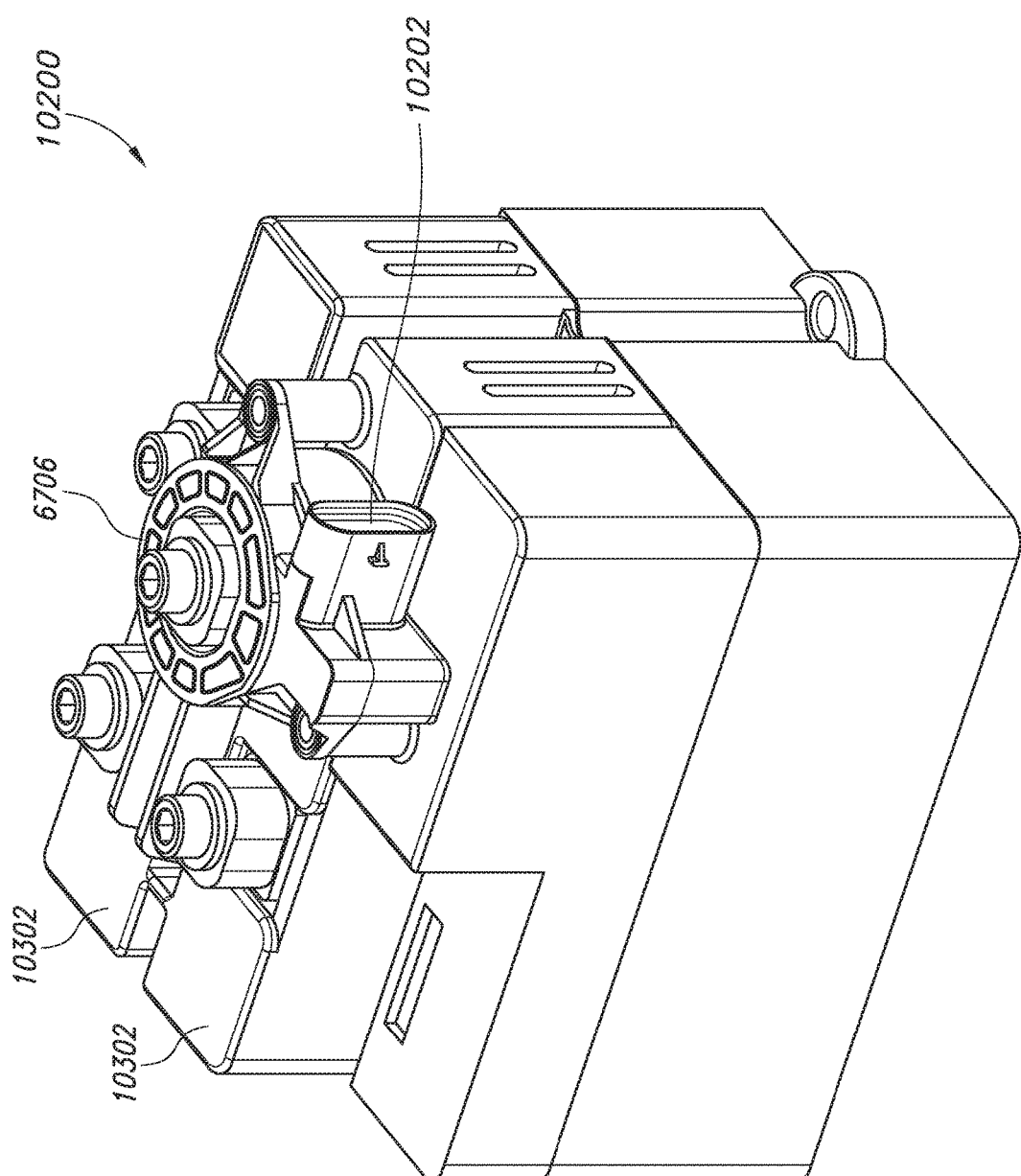
FIG. 102 depicts detail of an embodiment dual-pole breaker/relay device.
Figure 103:
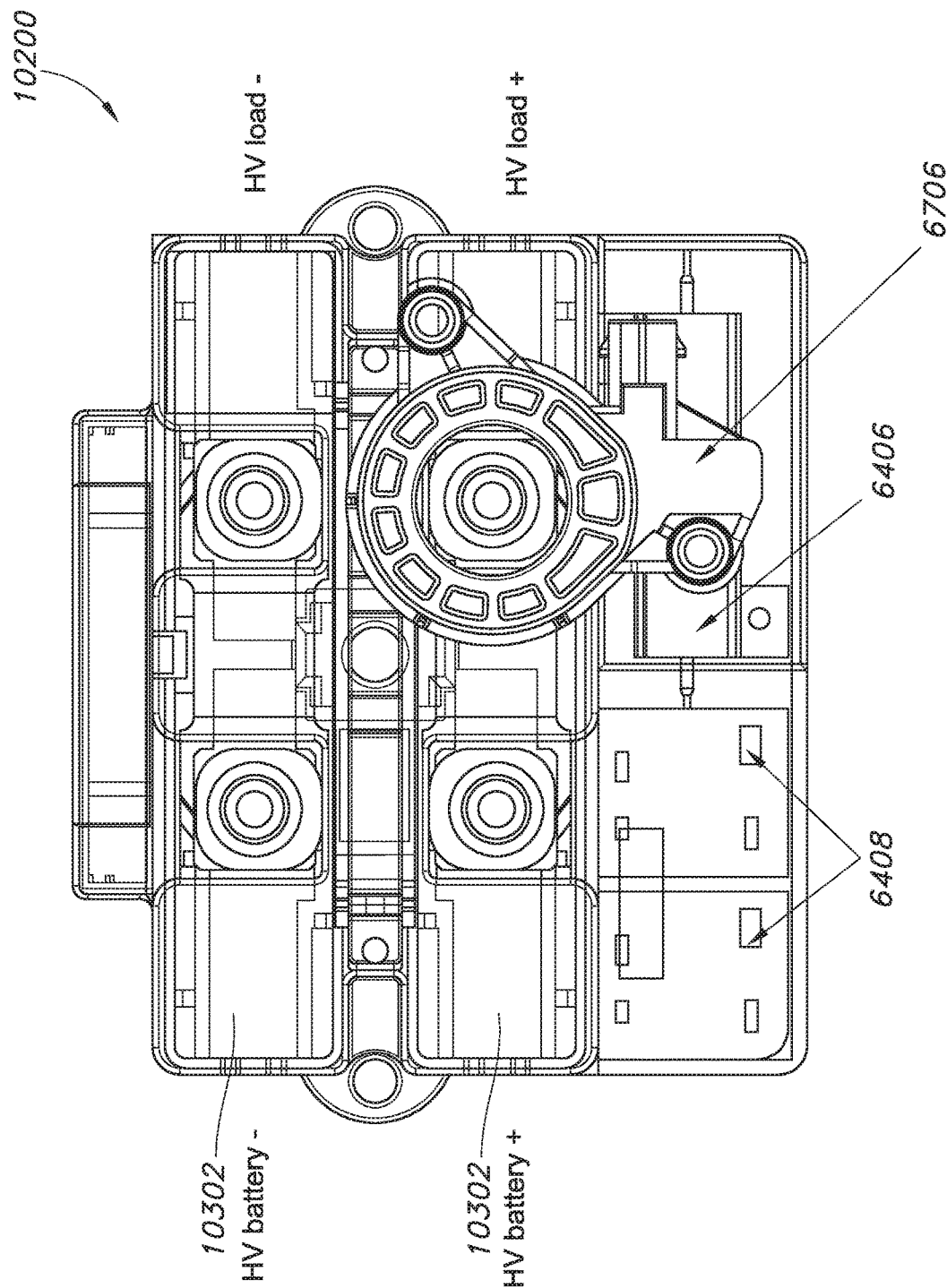
FIG. 103 depicts detail of an embodiment dual-pole breaker/relay device.
Figure 104:
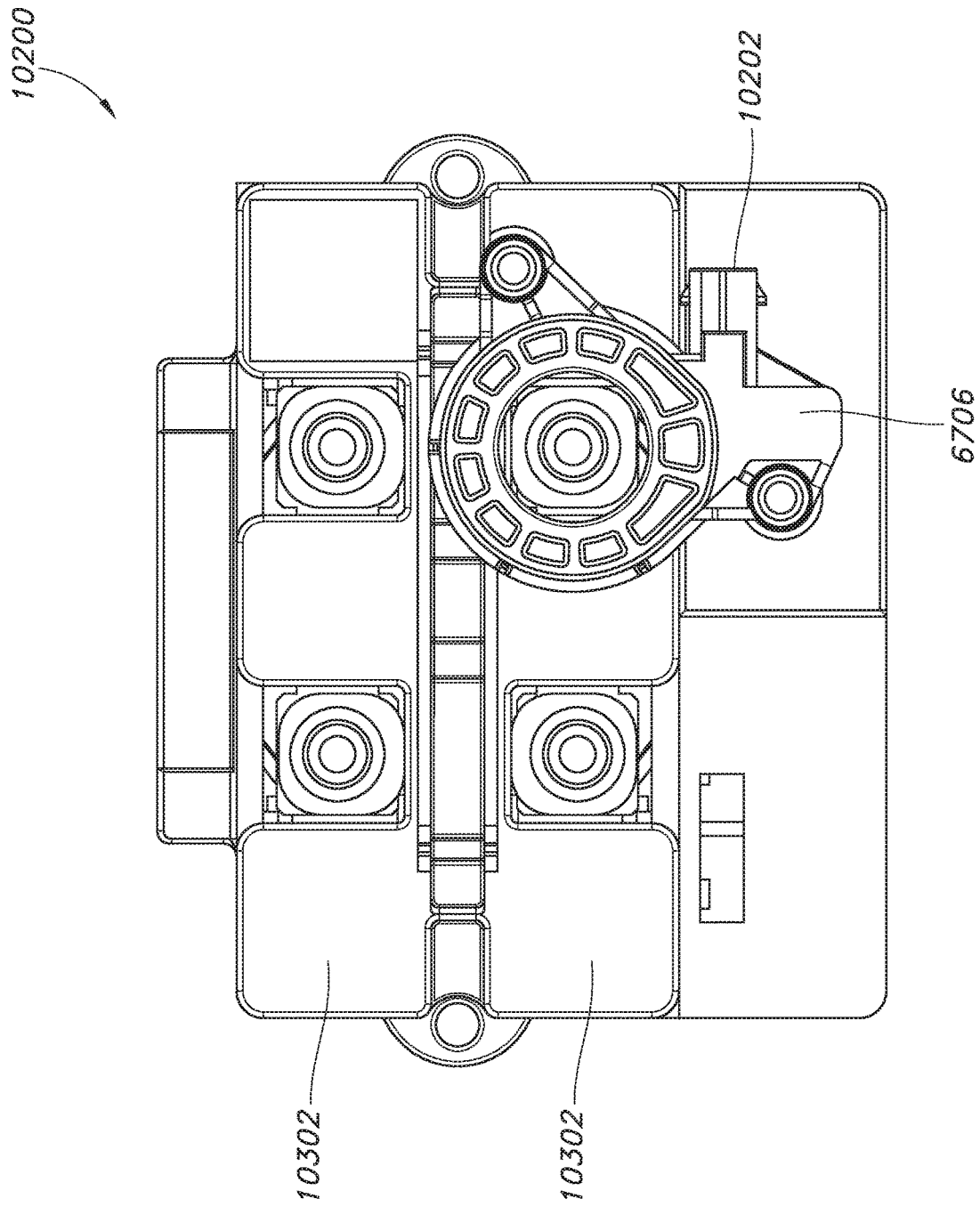
FIG. 104 depicts detail of an embodiment dual-pole breaker/relay device.
Figure 105:
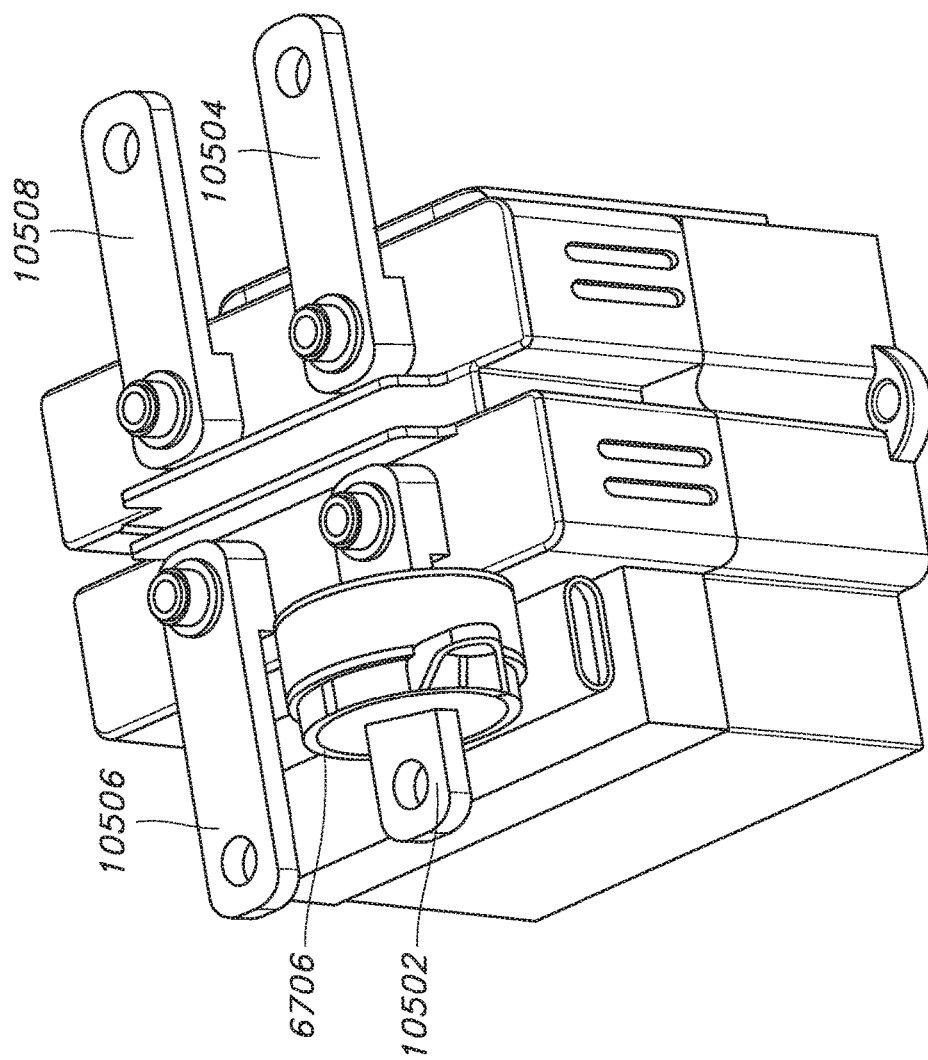
FIG. 105 depicts detail of an embodiment dual-pole breaker/relay device depicting current connection components.

Referencing FIG. 102, an oblique view of a system 10200 having a dual pole breaker/relay 10302 is depicted, with a coupled current sensor 6706 connected thereto. The example current sensor 6706 is shown with a connector 10202 for communicative coupling to a controller. Referencing FIG. 103, a top view of the system 10200 is depicted having a partially transparent top side of a housing of the system 10200. Example positions for the pre-charge fuse 6406 and pre-charge connector 6408 are shown, and coupling locations for a high voltage battery (HV battery+ and −) and for a high voltage load (HV load+ and −) are illustrated. Referencing FIG. 104, a system 10200 consistent with the system of FIG. 103 is depicted, with the top side of the housing of the system normally positioned. Referencing FIG. 105, an example breaker/relay PDU is depicted showing high voltage bus bar couplings 10502, 10504, 10506, 10508 to the breaker/relay PDU. In the example of FIG. 105, connection 10508 is the battery low side, connection 10506 is the battery high side, connection 10502 is the high voltage load high side, and connection 10504 is the high voltage low side. However, any arrangement of high voltage source and load connections is contemplated herein.

Figure 106:
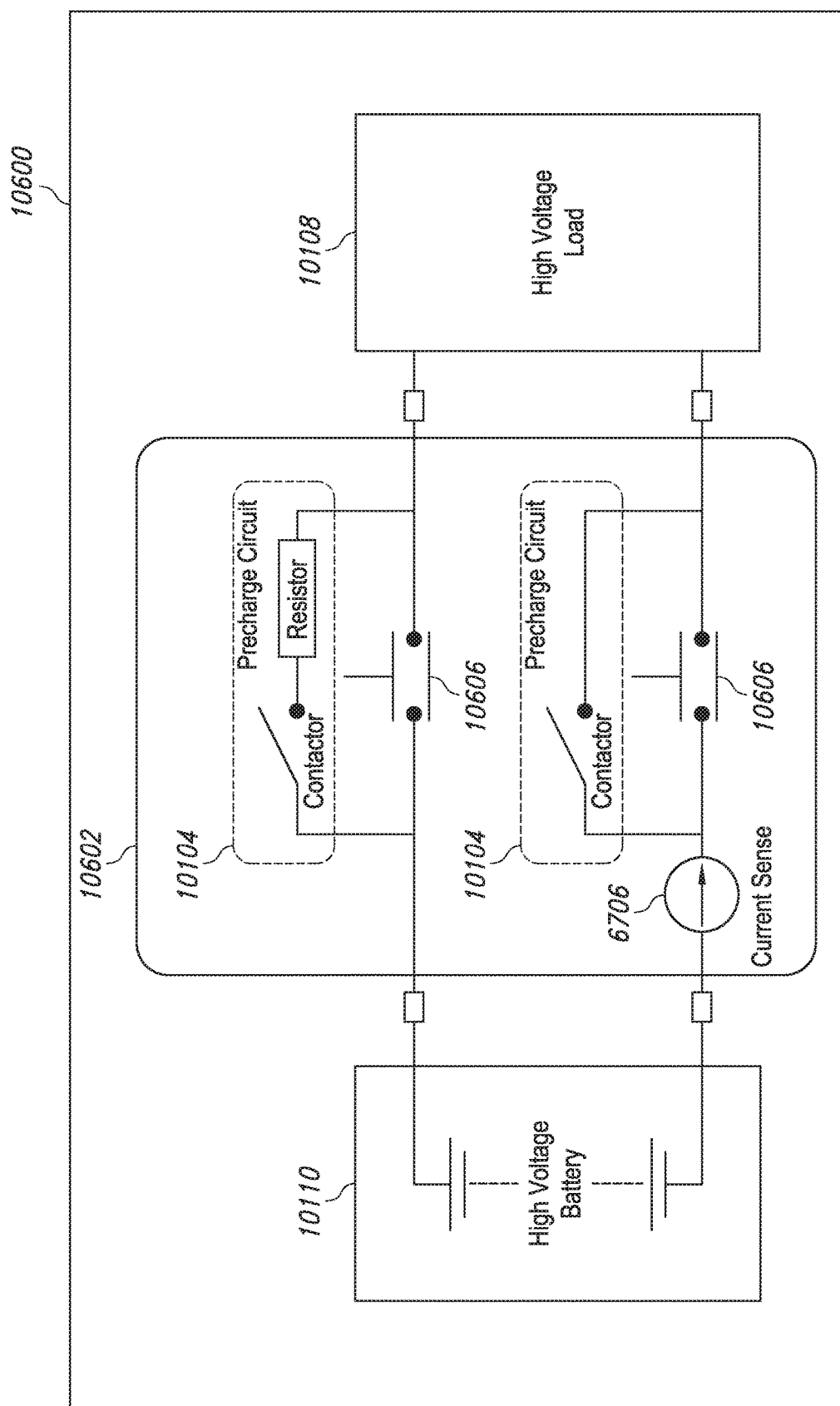
FIG. 106 depicts a schematic diagram of a breaker/relay device.

Referencing FIG. 106, an example system 10600 includes a power circuit protection arrangement for a high-voltage load, such as for a motive power circuit for a mobile application. The example system 10600 includes a dual pole breaker/relay PDU 10602, where the breaker/relay 10606 includes a first pole disposed on the high-side of the motive power circuit, and a second pole disposed on the low-side of the motive power circuit. The example system 10600 includes a pre-charge circuit 10104, including a pre-charge resistor and a pre-charge contactor, positioned within the housing of the breaker/relay PDU 10602. The example system further includes a current sensor 6706. The example system 10600 does not include a fuse or a pyro-switch, although a fuse or pyro-switch may be present in certain embodiments. The system includes the breaker/relay PDU 10602 interfaced with a high-voltage battery 10110 on a first side, and with a high-voltage load 10108 on a second side.

The example dual-pole breaker/relay device includes separate breaker/relay contactors responsive to active and passive interruption operations, having arc suppression, and/or one or more of the poles having a current sensor. In certain embodiments, each pole is disposed in a high side or a low side circuit of a system. In certain embodiments, one or more of the poles includes an integrated precharge circuit in parallel therewith.

It can be seen that the example single-pole and dual-pole breaker/relay devices provide for highly capable interruption systems, as well as systems with high flexibility on the capability. Additionally, the systems have resettable interruption (with the breaker/relay), and the integration as depicted significantly reduces the footprint from previously known systems.

Example embodiments include a high voltage electric vehicle battery power distribution system architecture that includes a breaker/relay with a precharge circuit integrated in the same housing. These two elements distribute power from one side of the battery. In addition to these two elements, the housing also contains a current sensor and pyro disconnect (e.g., pyro-switch), that are in series with each other on the opposite side of the battery.

High voltage batteries in mobile applications contain a large amount of energy, making it desirable that the rest of the vehicle and operators to be protected in the event of overload, short circuit, or emergency conditions. Previously known systems include a contactor and a fuse on the high side of the battery, a precharge circuit in parallel of the high side contactor, and a contactor and current sensor on the low side of the battery. Certain example systems of the present disclosures have at least one or more of the following benefits over previously known systems: Efficiency (e.g., power transfer, losses, reduced cooling requirements) by reducing the number of contactor poles from two to one; providing active and passive protection in overcurrent, short circuit, or emergency events, because the breaker/relay or pyro can both be actively triggered; additional break protection in an overload or short circuit event, such as physical breaking operations that do not rely upon an active and properly operating controller, size and weight advantages, because of the shared housing and combined component footprint being smaller, and the like.

Figure 109B:
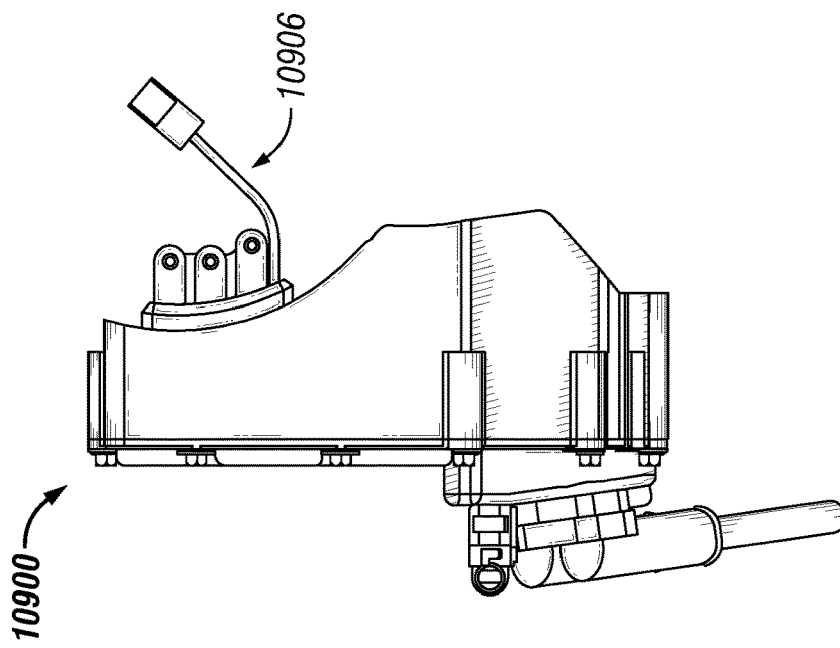
FIGS. 109A and 109B depict an integrated inverter assembly.
Figure 109A:
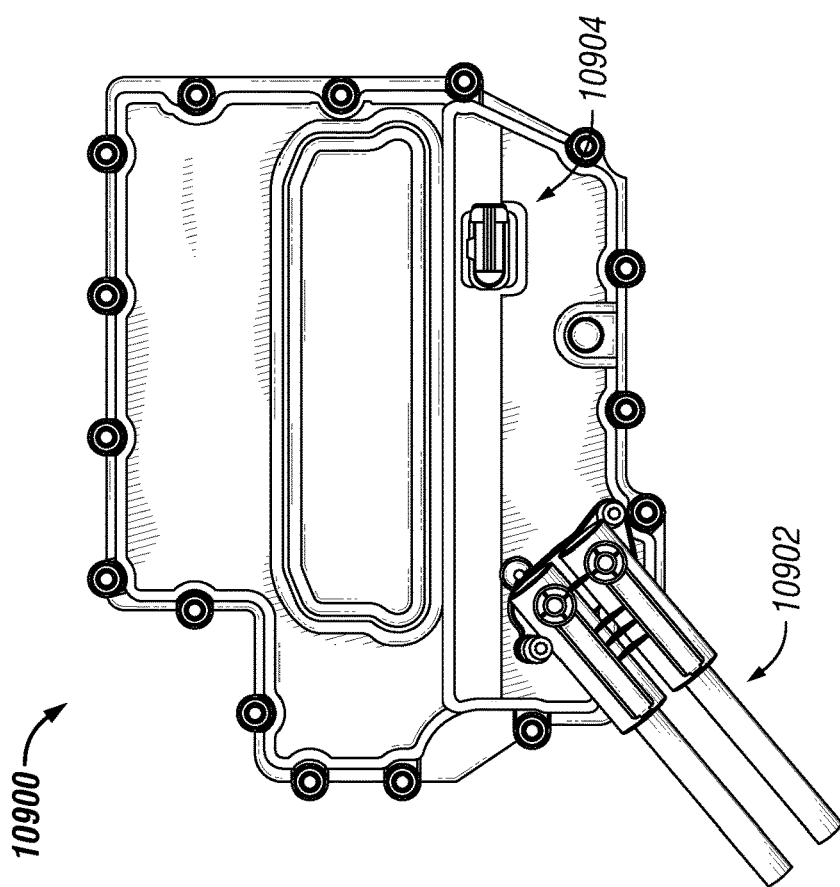

Referencing FIG. 109A, a top view and in FIG. 109B a side view (right) of an example embodiment of an integrated inverter assembly 10900 is schematically depicted. The example of FIG. 109A, 109B includes a high voltage DC battery coupling 10902 and a vehicle (or mobile application) coupling 10904. The vehicle coupling 10904 provides for data communications, keyswitch state, sensor communications, and/or any other desired coupling aspects. Referencing FIG. 109A, 109B, a battery connector 10902 and vehicle connector 10904 are provided, which may be any type of connector known in the art and selected for the particular application. An example battery connector 10902 includes a Rosenberger HPK series connector, however any battery connector may be utilized. An example vehicle connector 10904 includes a Yazaki connector part number 7282885330, however any vehicle connector may be utilized. In the example of FIGS. 109A, 109B the main cover is visible, which may be on the vertically upper portion of the integrated inverter assembly 10900 as installed on a vehicle or mobile application, although other orientations of the integrated inverter assembly 10900 are contemplated in certain embodiments of the present disclosure. In the example of FIG. 109A, 109B, a harness 10906 is depicted, which provides a connection for a motor temperature and/or position sensor. The harness 10906 may be shielded as determined according to the specific EMI environment, sensor characteristics, and/or communication mechanism between the sensor(s) and the integrated inverter assembly 10900. In the side view of FIG. 109B, the base (or back cover) can be seen.

Figure 110:
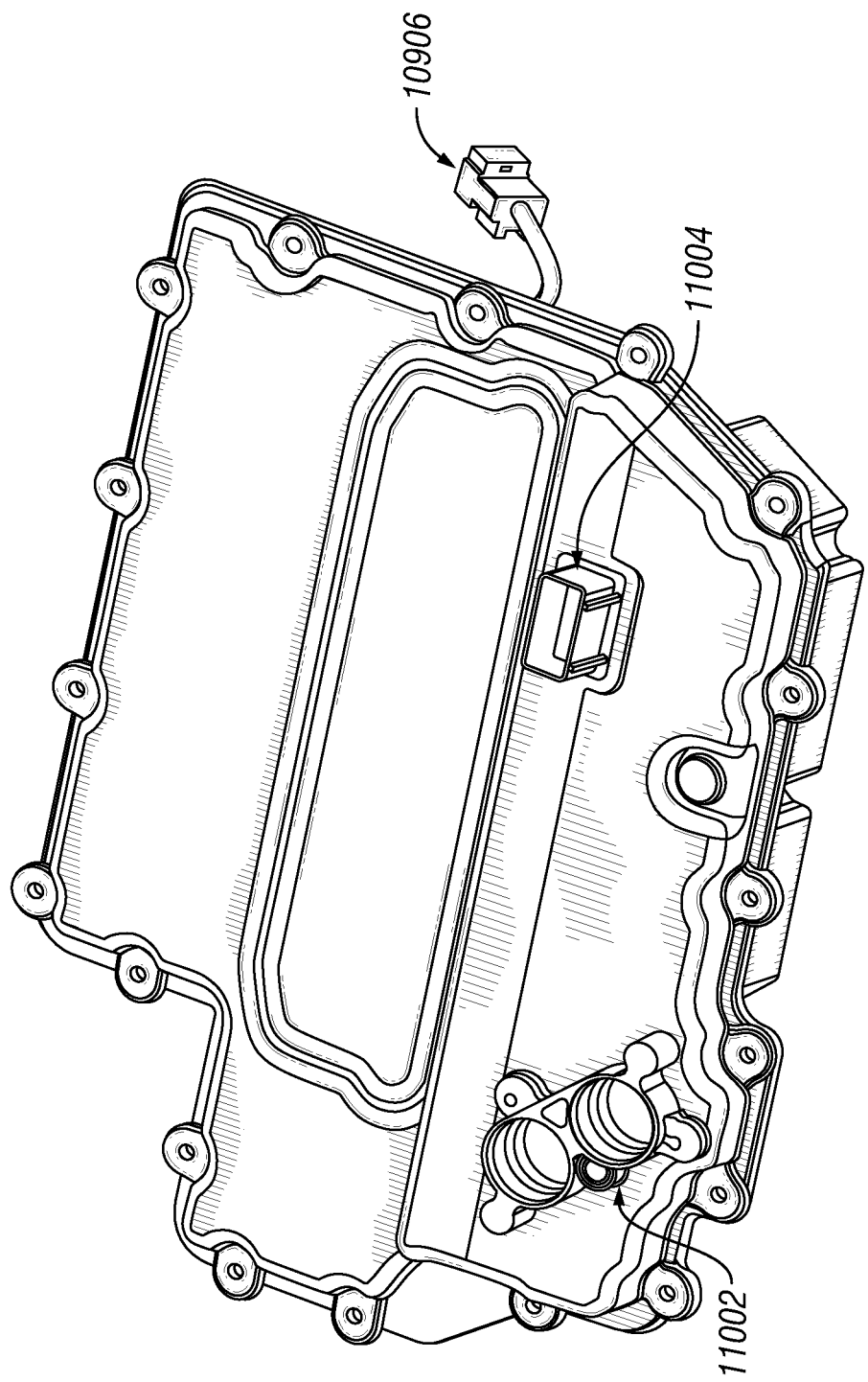
FIG. 110 depicts an integrated inverter assembly with a battery connector and vehicle connector.

Referencing FIG. 110, an underside view of the main cover of the integrated inverter assembly 10900 is schematically depicted, with certain aspects removed for clarity of the description. The integrated inverter assembly 10900 includes coolant inlet and outlet connections 11002, which may be blind connections, and/or which may be sized to accommodate an SAEJ2044 Quick Connect Coupling. The coolant connections provide for coolant flow through one or more coolant channels, as described in the present disclosure. In the example of FIG. 110, the main cover is coupled to the back cover using a cure-in-place-gasket.

Figure 111:
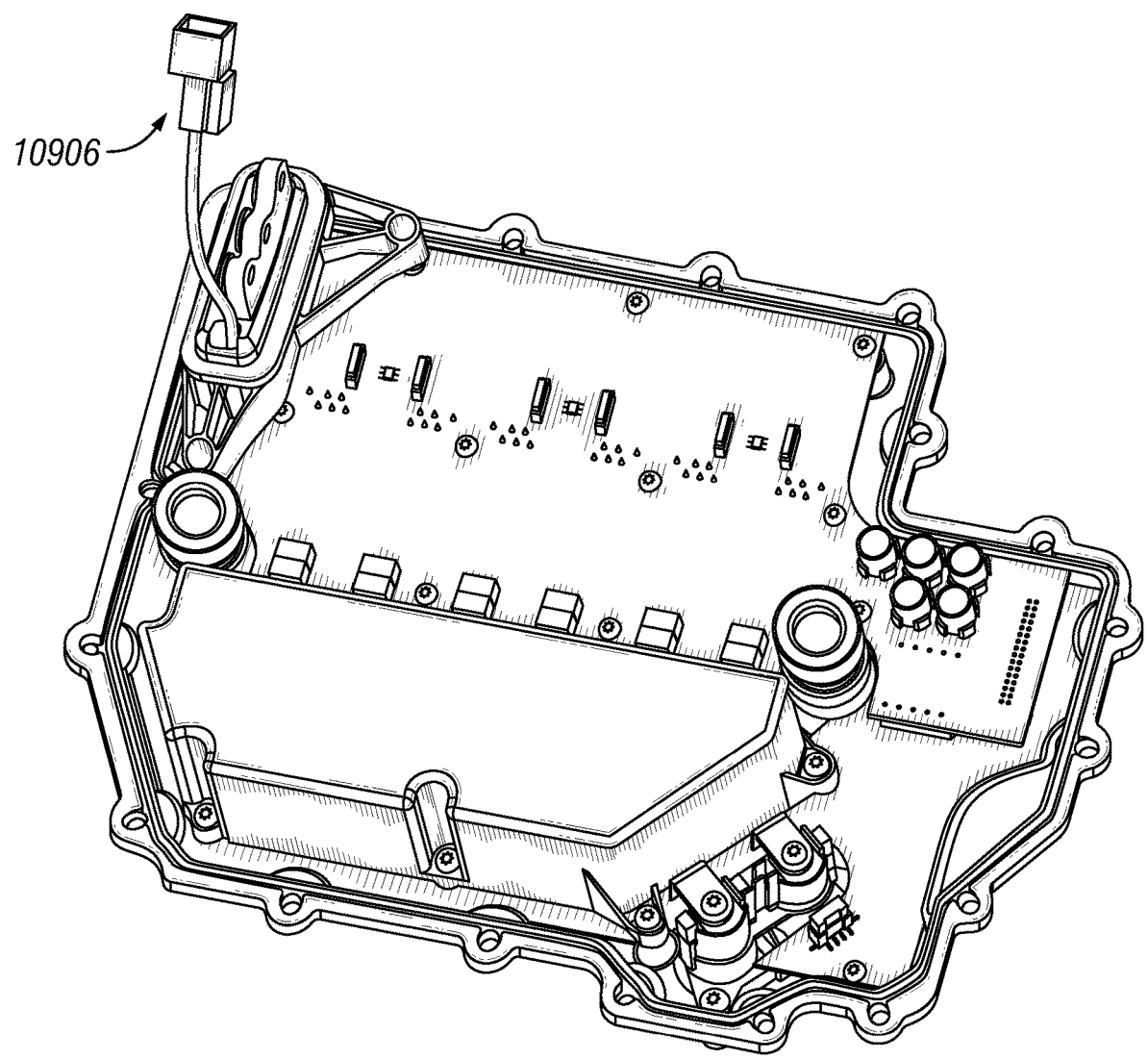
FIG. 111 depicts a view of an integrated inverter assembly.
Figure 112:
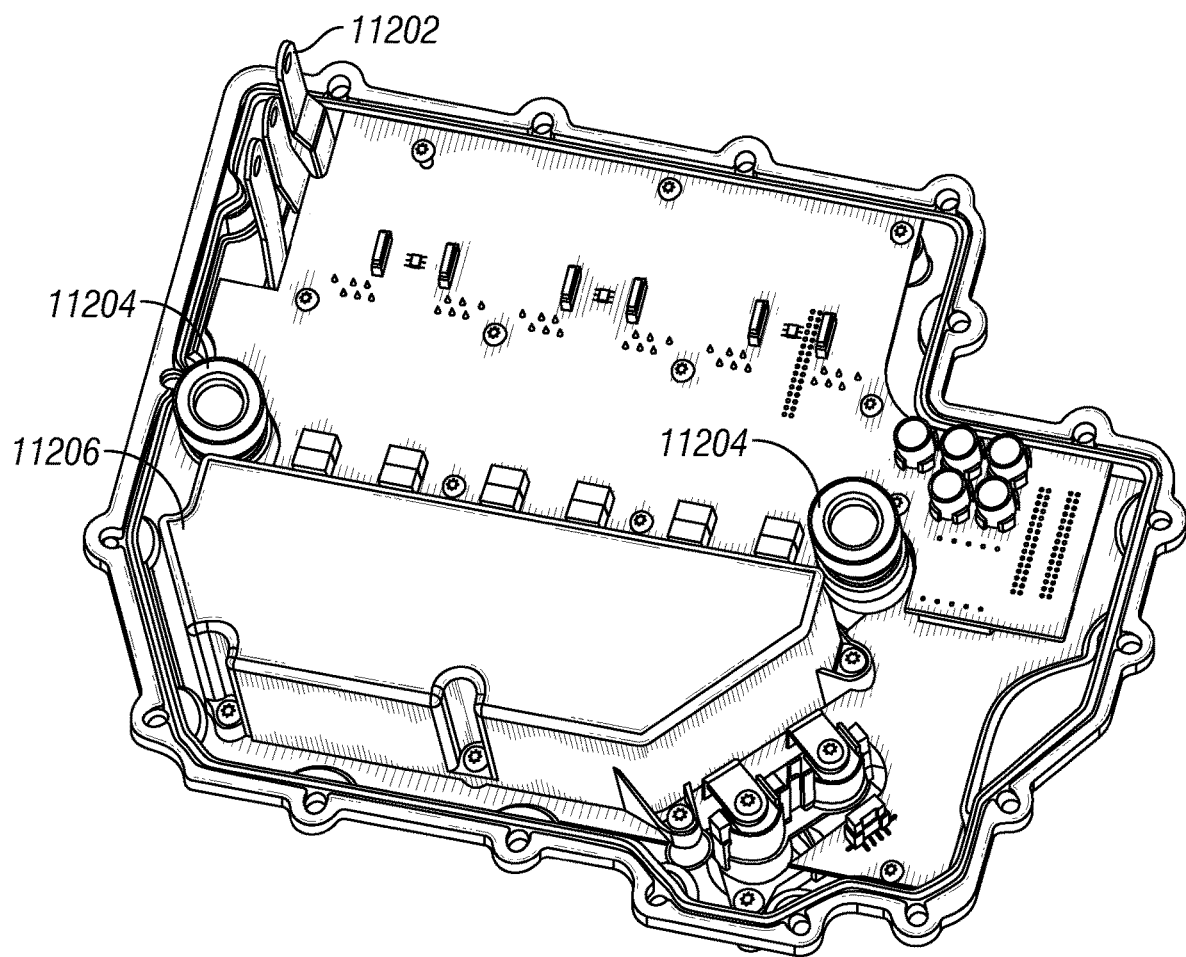
FIG. 112 depicts a view of an integrated inverter assembly.

Referencing FIG. 111, the underside view of the main cover of the integrated inverter assembly 10900 is schematically depicted, with certain aspects of the electronics packaging of the integrated inverter assembly 10900 included for reference. Referencing FIG. 112, motor connections 11202 configured for a 3-phase high voltage motor connection, for example as blades that interface with the motor connector 10906 of FIG. 111. The example of FIG. 112 depicts a printed circuit board (PCB) where the gate drivers for the inverter are mounted, as well as a current sensor corresponding to each phase of the gate drivers. The example of FIG. 112 depicts a second PCB (partially obscured by the DC link capacitor 11206) for control of the inverter, including interfaces with the vehicle, power control operations, diagnostics, and the like. The DC link capacitor 11206 provides for coupling between the DC high voltage system (e.g., the battery) and the gate drivers. In certain embodiments, the DC link capacitor 11206 may include certain power conditioning aspects, such as a capacitor, a bus bar, and/or a choke. Referencing FIG. 113, an embodiment having a coolant channel 11304 is depicted, with connector 11306 for an inverter drive of the inverter assembly 10900.

Figure 113:
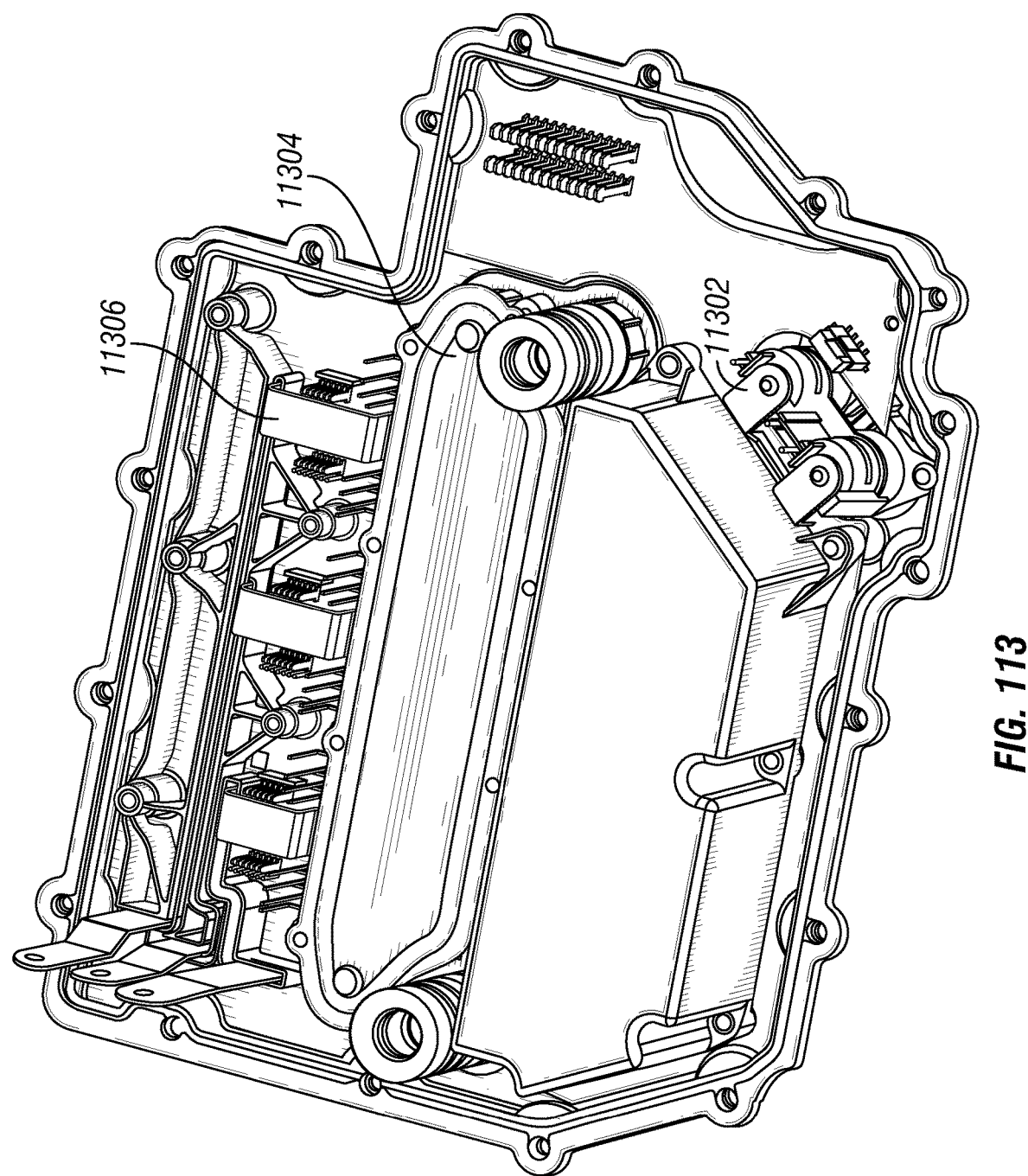
FIG. 113 depicts a view of an integrated inverter assembly with coolant channel.

Referencing FIG. 113, a top surface 11402 of a coolant channel (the upper coolant channel in the example of FIG. 113) is depicted. The gate drivers (e.g., IGBTs) are mounted in thermal contact with the coolant channel, such that coolant flowing through the coolant channel thermally communicates with the inverter power electronics.

Figure 114:
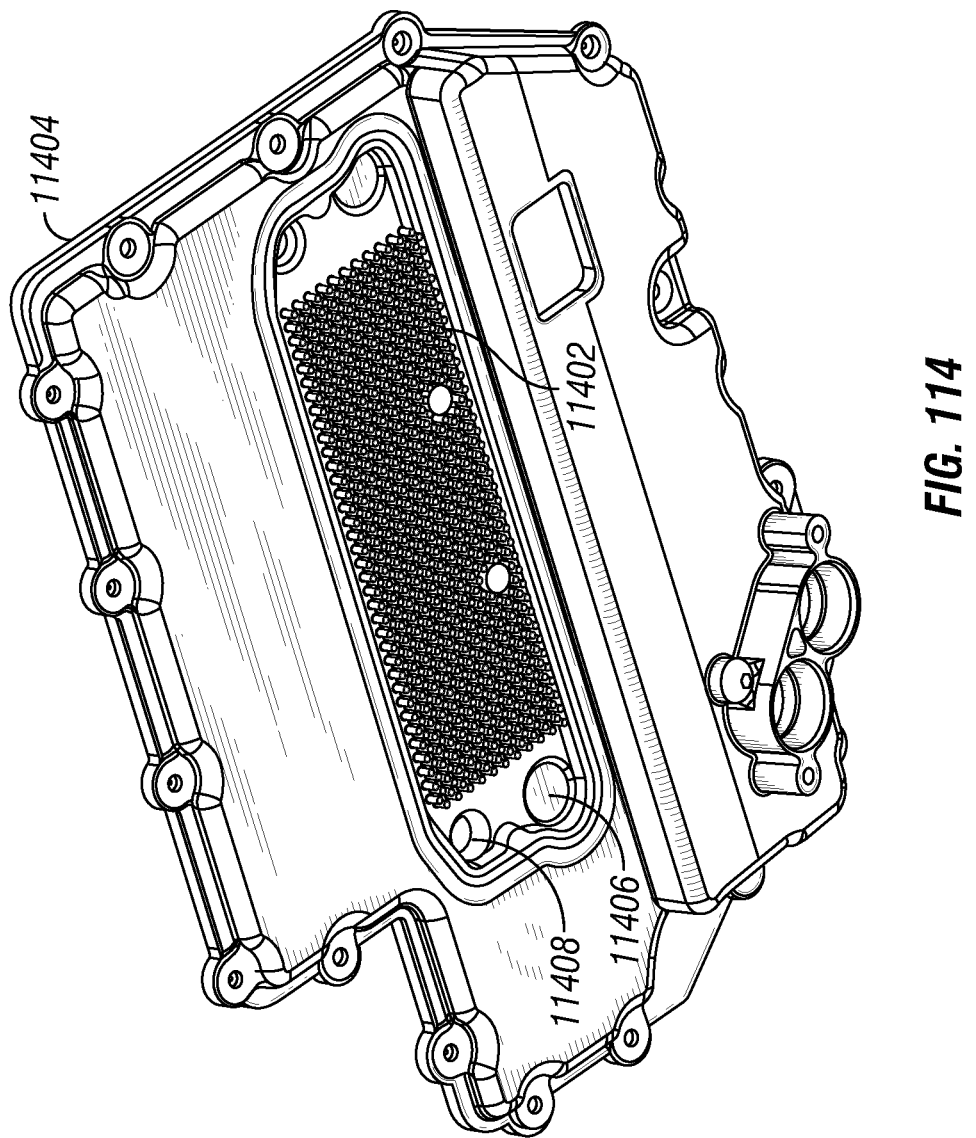
FIG. 114 depicts a view of an integrated inverter assembly with coolant channel.
Figure 115:
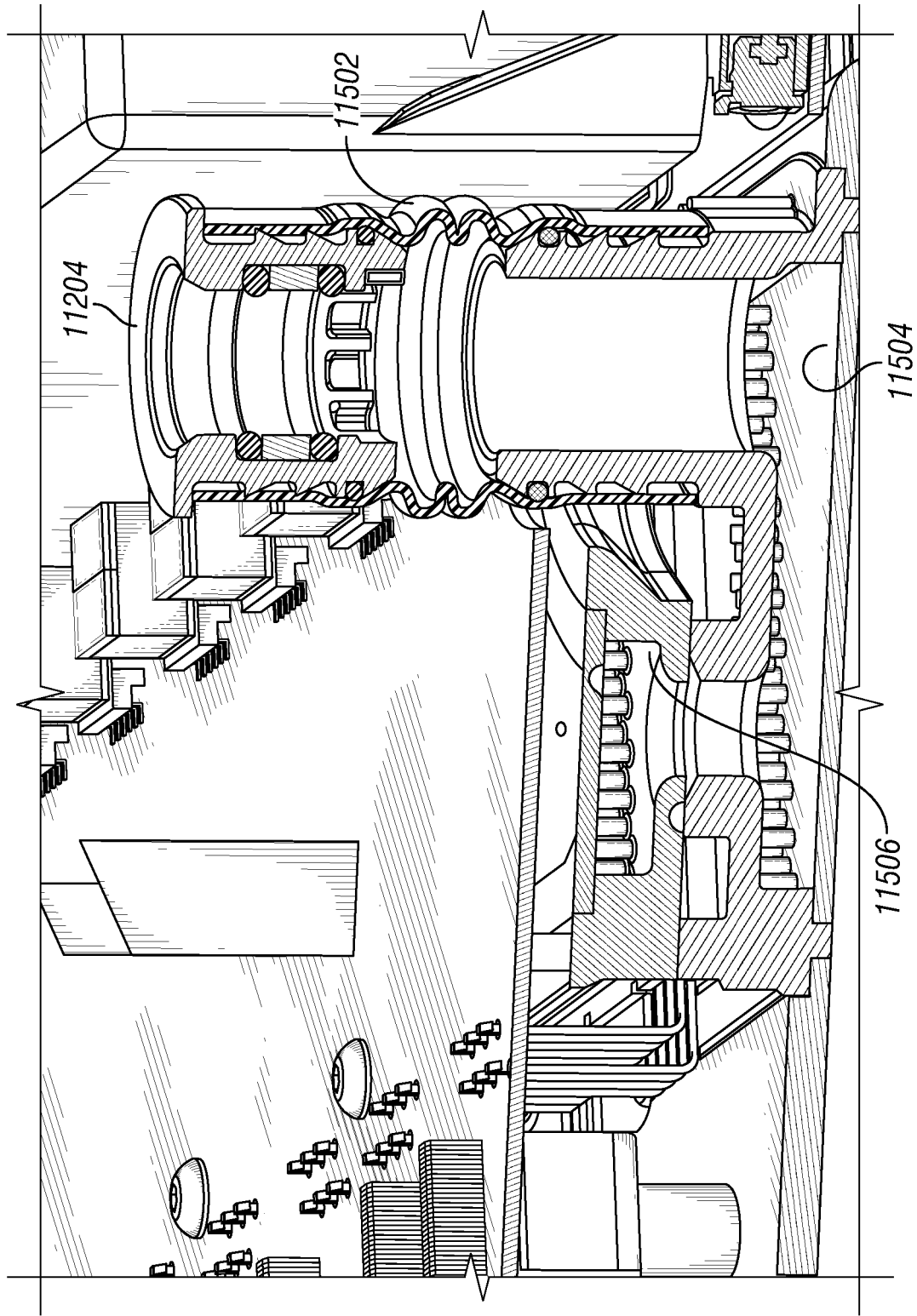
FIG. 115 depicts a view of an integrated inverter assembly with coolant channels.

Referencing FIG. 114, an underside (relative to FIG. 113) of the main cover is depicted to show aspects of the coolant channels 11402, with the lower coolant channel being depicted in FIG. 114. The coolant channel includes heat transfer features (pins, in the example of FIG. 114) to provide the desired heat transfer environment between the coolant flowing in the channel and cooled components of the integrated inverter assembly 10900. Two of the holes defined in the lower coolant channel of FIG. 114 provide inlet and outlet communication to coolant into the inverter. Two of the holes defined in the lower coolant channel of FIG. 114 provide fluid communication between an upper coolant channel and a lower coolant channel. Referencing FIG. 115, an example relationship between the upper coolant channel 11506 and the lower coolant channel 11504 is depicted. In the example of FIG. 115, each of the coolant channels includes heat transfer features such as pins. The utilization of two parallel coolant channels provides for increased heat transfer capacity and greater ease in communication with all cooled components within a compact integrated package. The description of coolant channels as "upper" and "lower" is for convenience and clarity of description to identify the separate channels. The actual vertical positioning of channels may vary with the specific design of the integrated inverter assembly, and the orientation of the integrated inverter assembly as installed. FIG. 115 additionally depicts an external coolant coupling port 11204, having a baffled stem 11502 in the example of FIG. 115.

Figure 116:
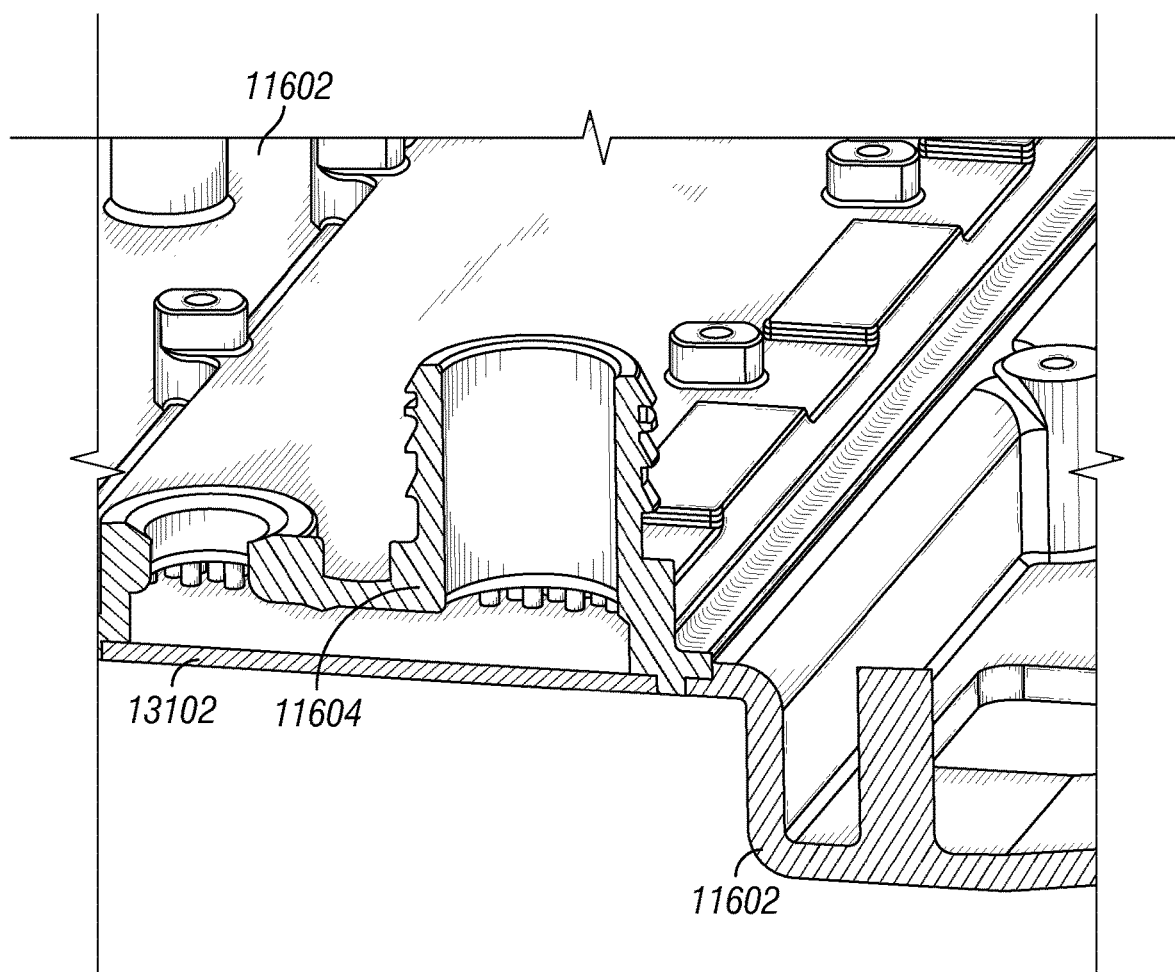
FIG. 116 depicts a view of an integrated inverter assembly with coolant channels.
Figure 131:
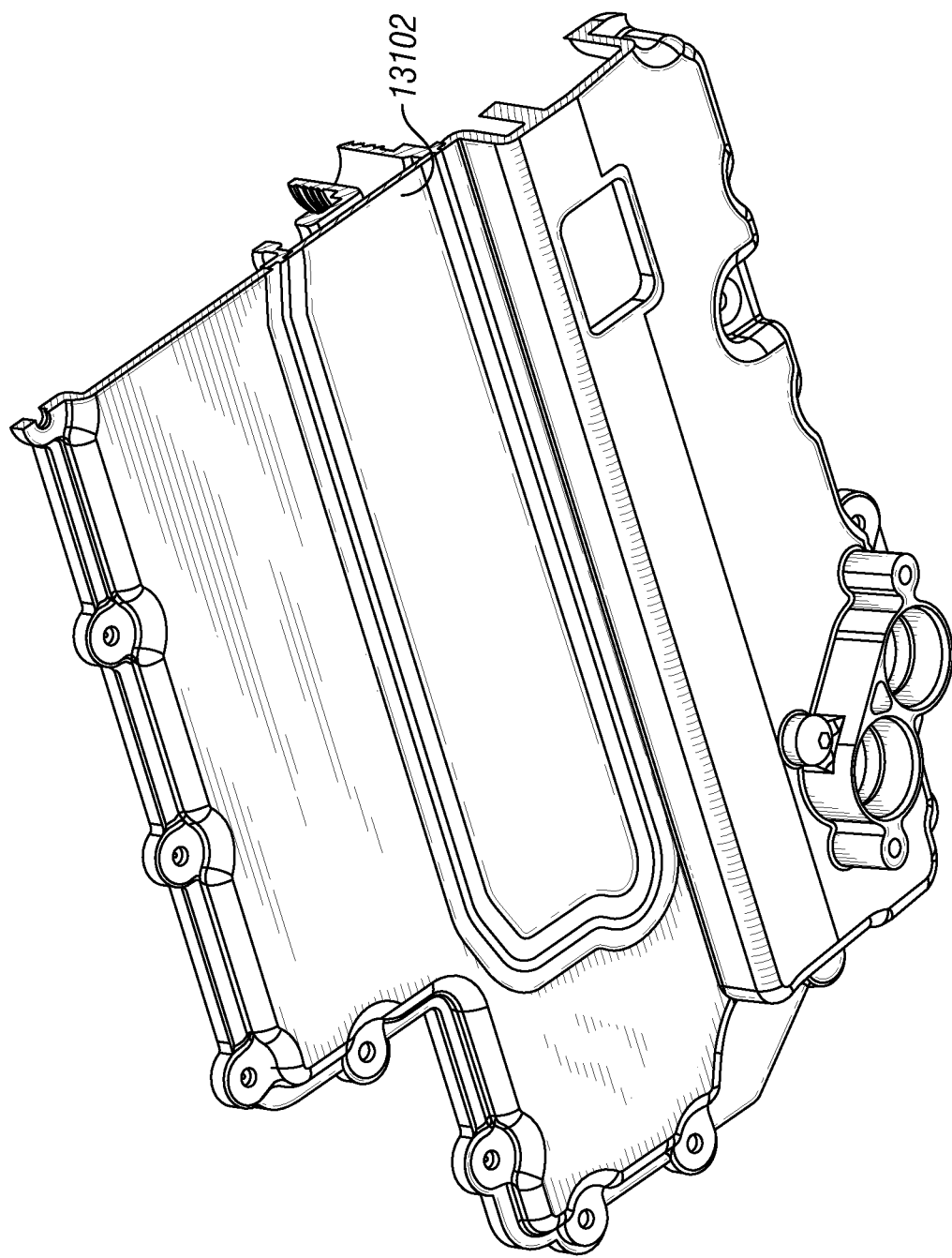

Referencing FIG. 116, an assembly example for coupling the coolant channels with the main cover is depicted. In the example, a coolant channel separating body 11604 (having the lower coolant channel on the underside, and the upper coolant channel on the upper side) is assembled with a lower coolant channel cover 13102 (e.g., the portion of the coolant channel visible in FIG. 109A) and the main cover body. In certain embodiments, the assembly of FIG. 116 is formed using friction-stir welding (FSW), which is a low cost process that provides for sealed seams forming the coolant channel. Other assembly techniques are contemplated herein. Each component of the assembly may be formed by any known techniques. It is desirable that the coolant channel separating body be thermally conductive, and may be formed, for example, from aluminum. In certain embodiments, the coolant channel separating body is forged, although it may be cast, machined, or formed by any other technique. In certain embodiments, the lower coolant channel cover is stamped. In certain embodiments, the main cover body is cast. Referencing FIG. 131, an example embodiment is depicted with the lower coolant channel cover depicted in position, integrated with the main cover and the coolant channel separating body.

Figure 117:
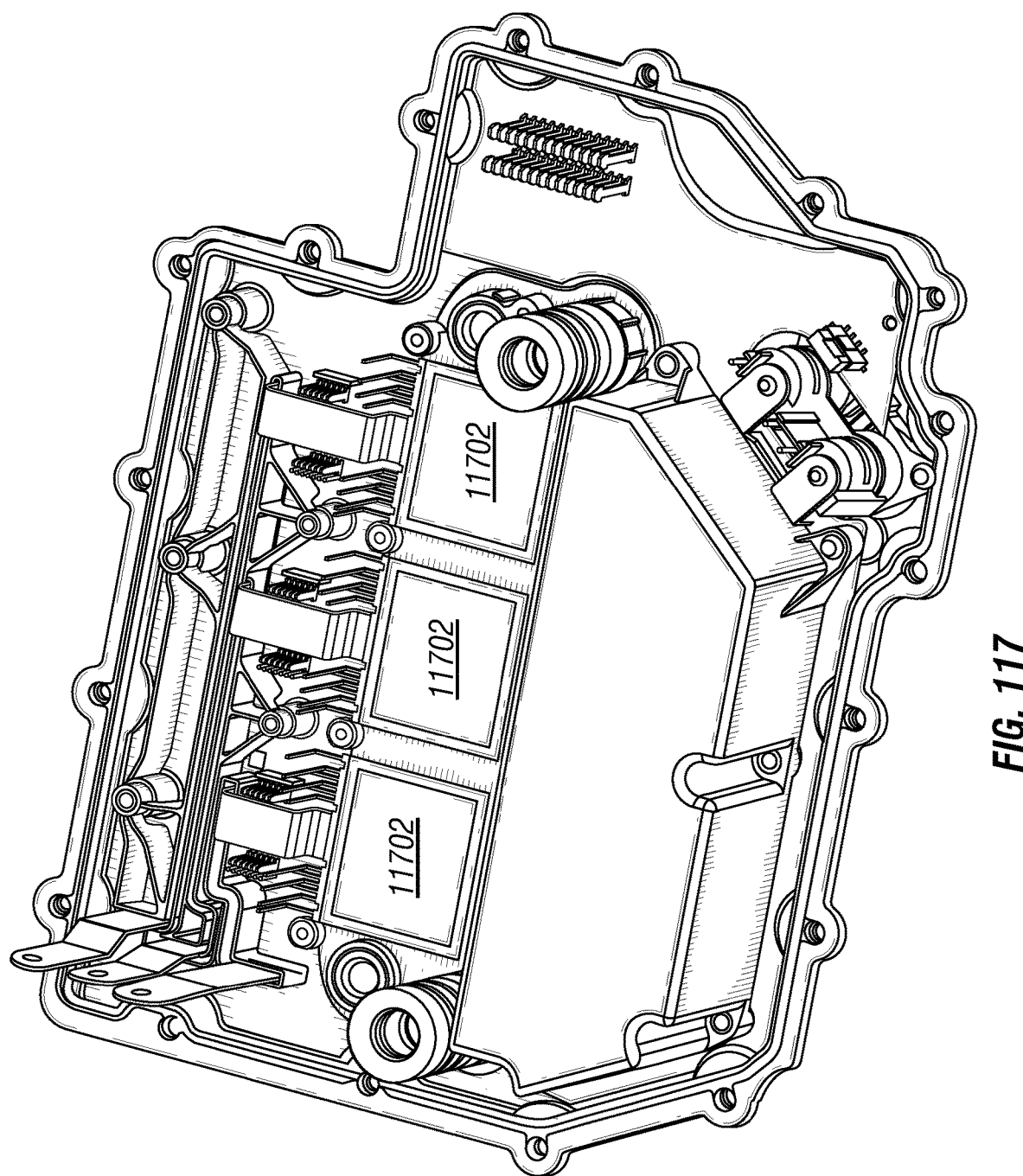
FIG. 117 depicts a view of an integrated inverter assembly with insulated-gate bipolar transistors (IGBTs).

Referencing FIG. 117, the underside of the main cover is depicted with insulated-gate bipolar transistors 11702 (IGBTs) installed. The IGBTs 11702 are thermally coupled (e.g., using thermal adhesive) to the surface of the upper cooling channel, and accordingly have a high heat transfer capacity to the coolant to support high power density installations.

Figure 118B:
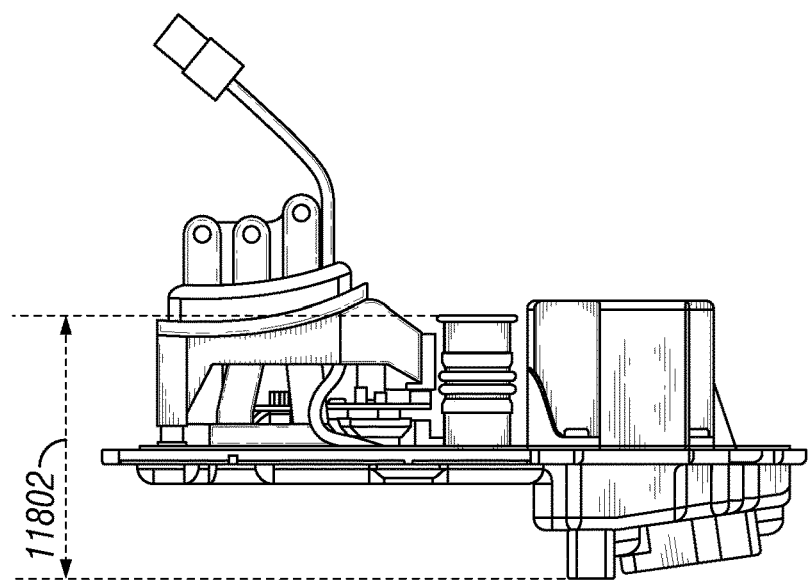
Figure 118A:
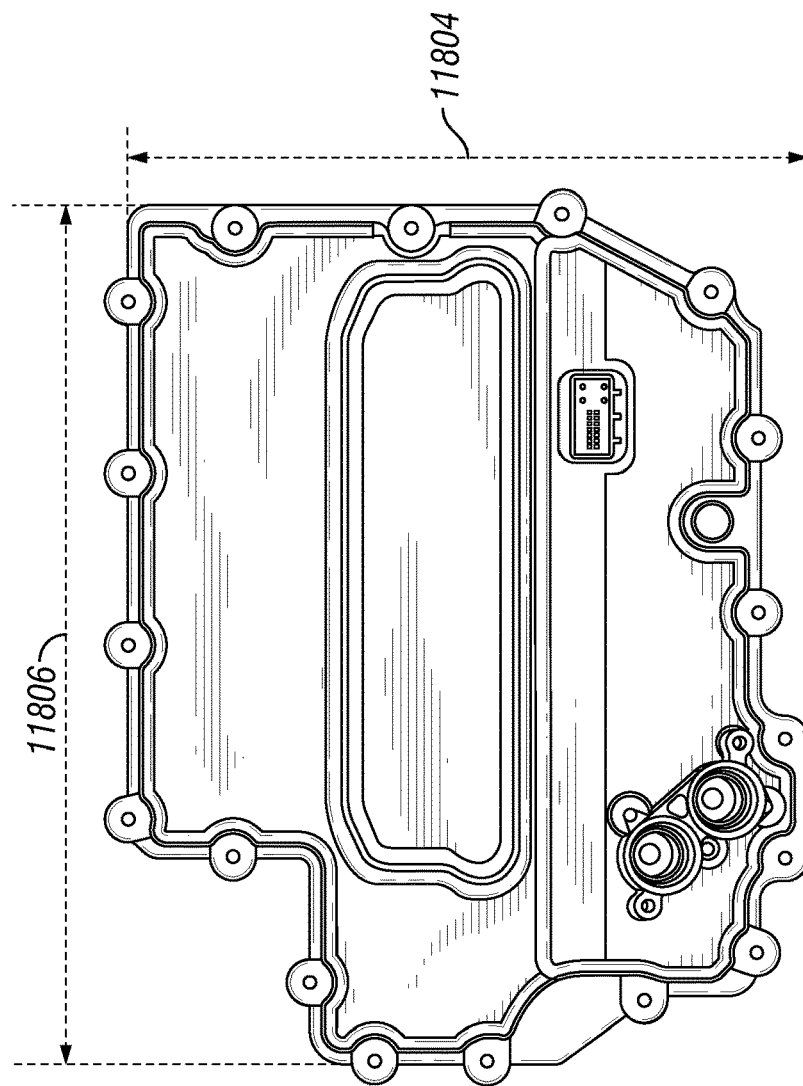

Referencing FIG. 118A, the dimensions and weight of an example integrated inverter assembly 10900 are shown, where a width 11806 is about 118 mm, and wherein a length 11804 is about 277 mm. Referencing FIG. 118B, an example embodiment includes a depth 11802 of about 87 mm. An overall mass of an example inverter assembly 10900 is below about 5 kg. The example of FIG. 118A is based upon various aspects of the present disclosure, and is believed to describe one example of achievable dimensions having sufficient power capacity for an automotive passenger car application.

Figure 119:
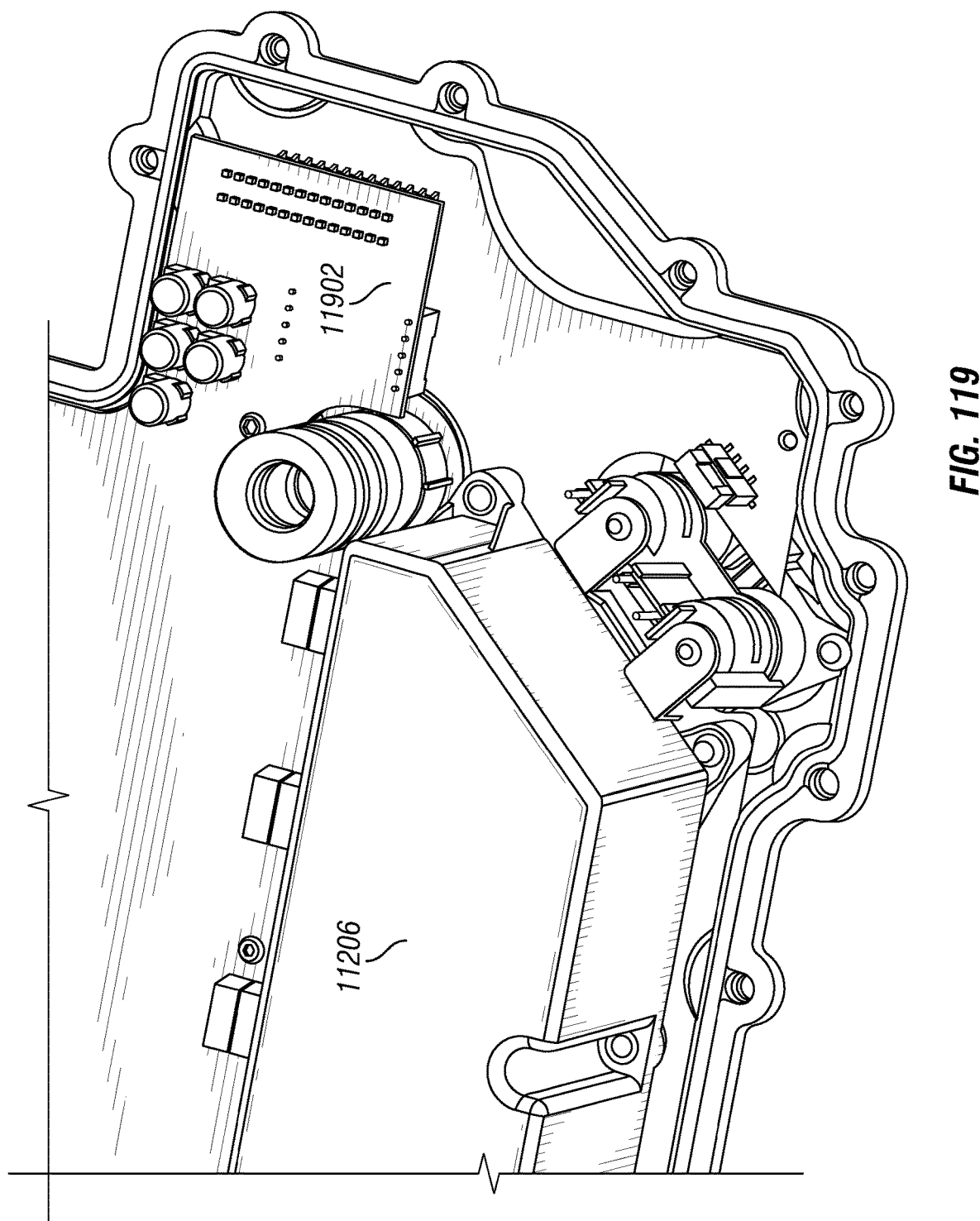
Figure 120:
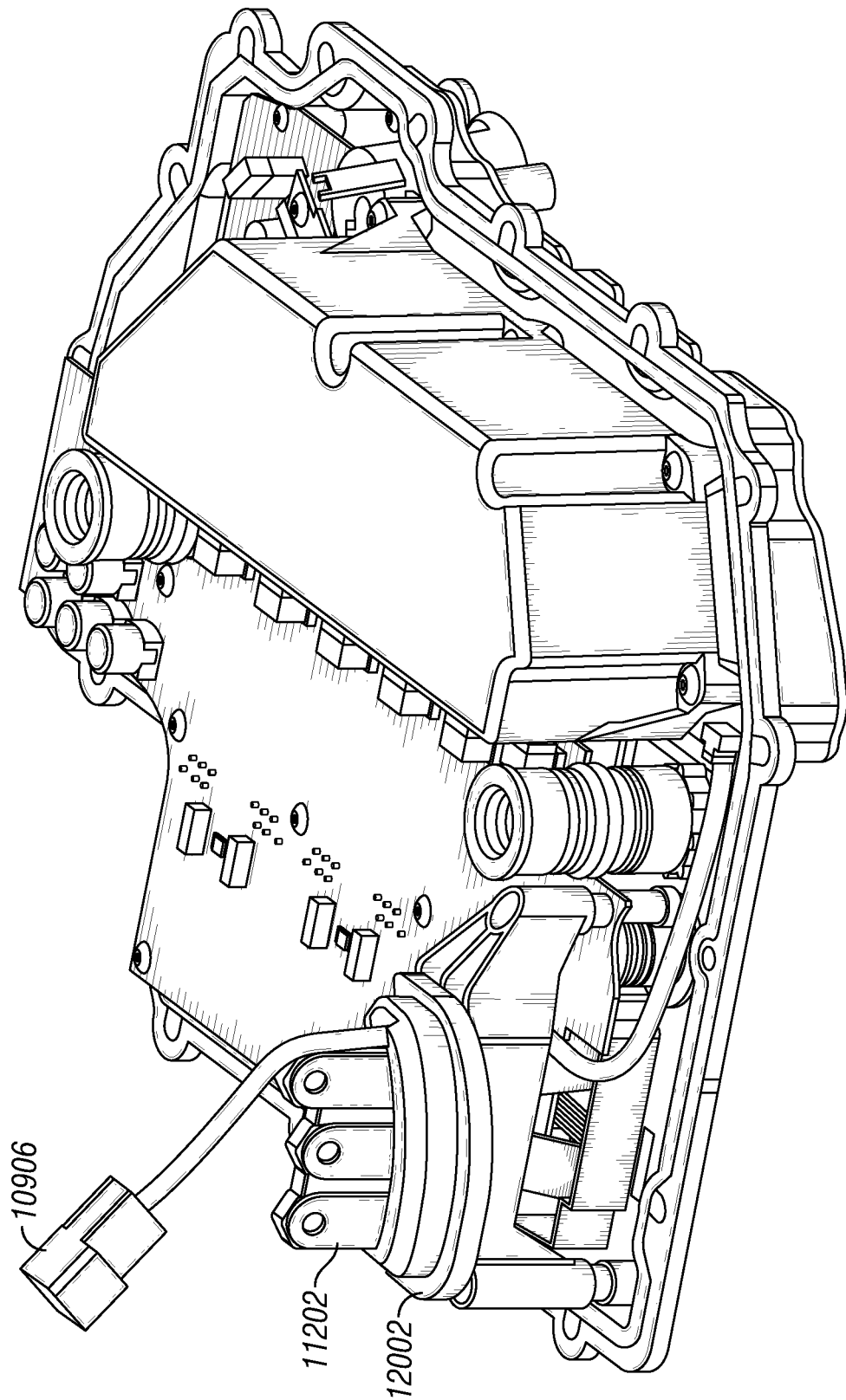
Figure 121:
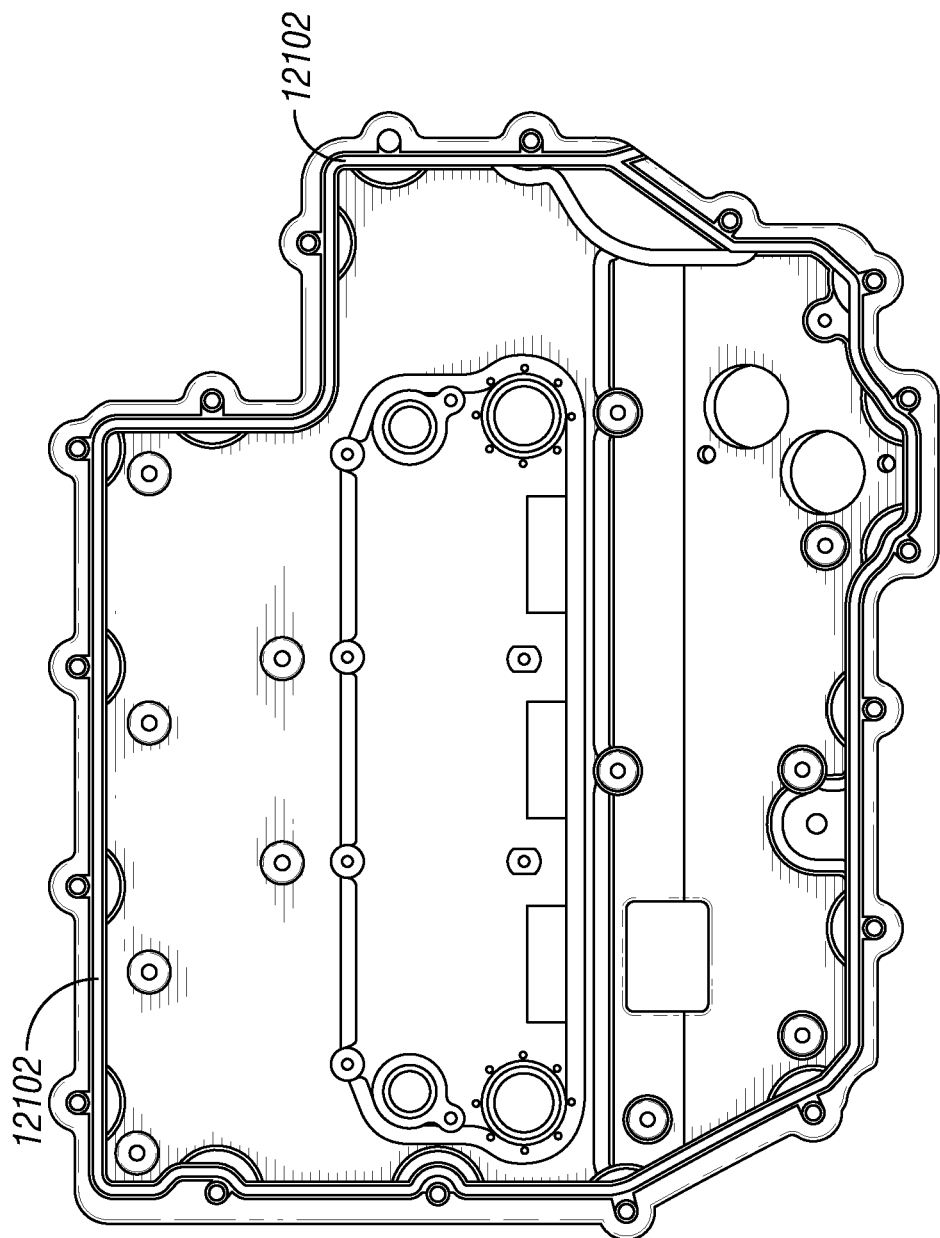

Referencing FIG. 119, a perspective view depicting the gate driver PCB 11902 and the DC link capacitor 11206 is shown. Referencing FIG. 120, a perspective view for an example embodiment depicts the AC bus bars 11202, the motor temperature/position sensor 10906. The AC connection utilizes two foam seals 12002 and replaceable captive nuts 13502 (also reference FIG. 35). Referencing FIG. 121, an underside view of the main cover is depicted. In the example of FIG. 121, a curable in-place gasket (CIPG) 12102 is dispensed and cured on the cover, and is reusable after a service event if the gasket is not damaged during the service event.

Figure 122:
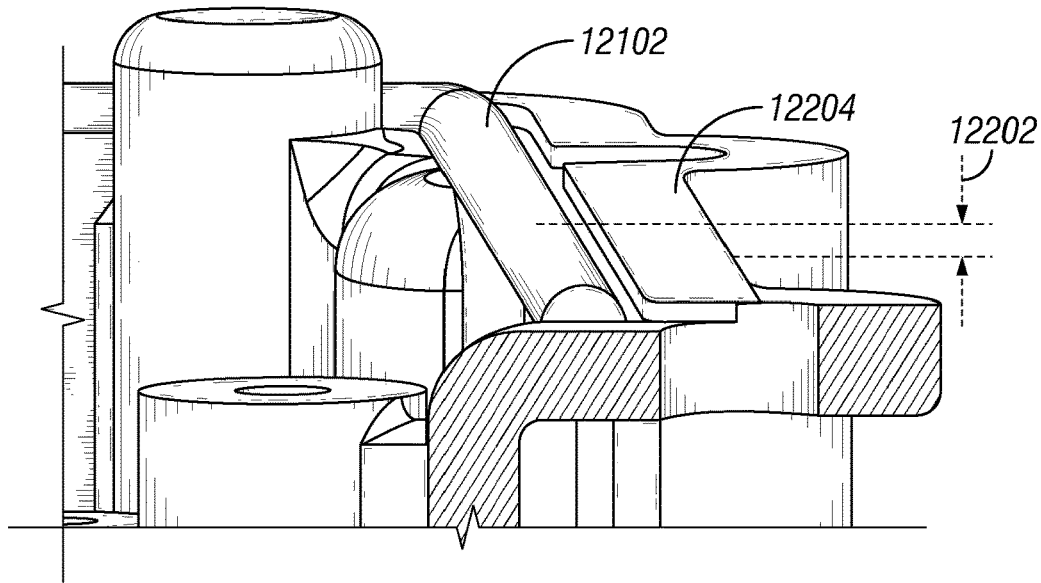
Figure 123:
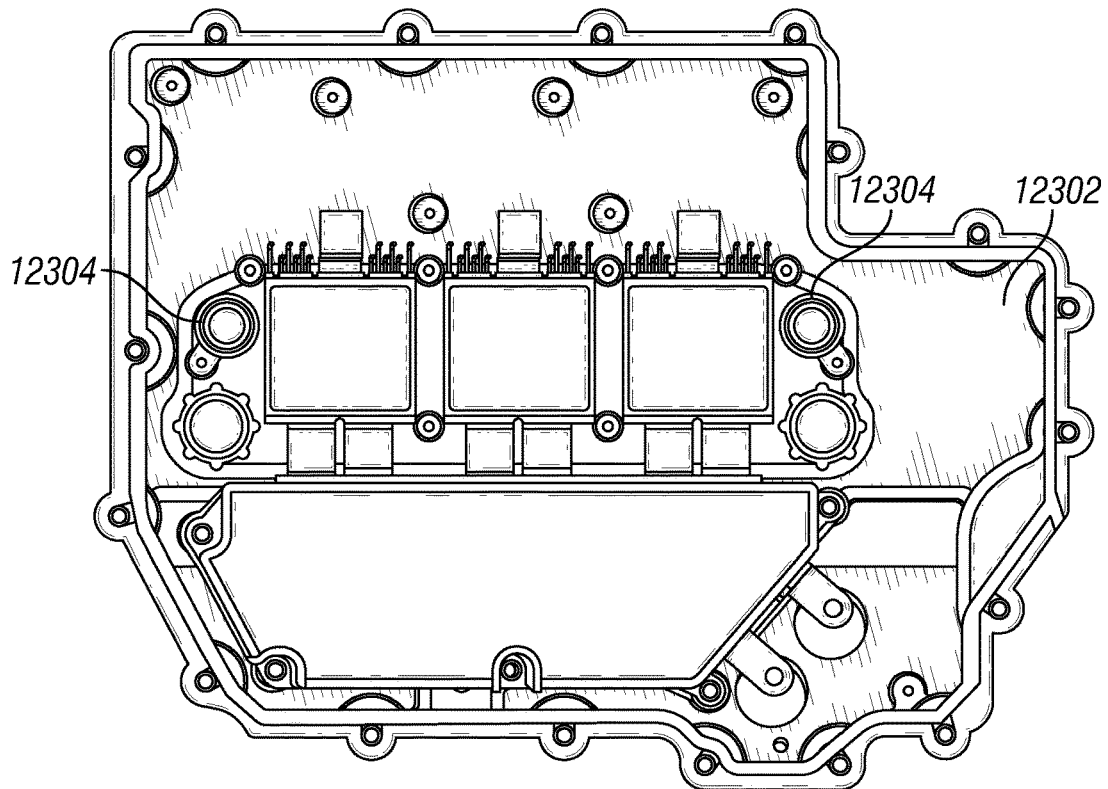
Figure 124:
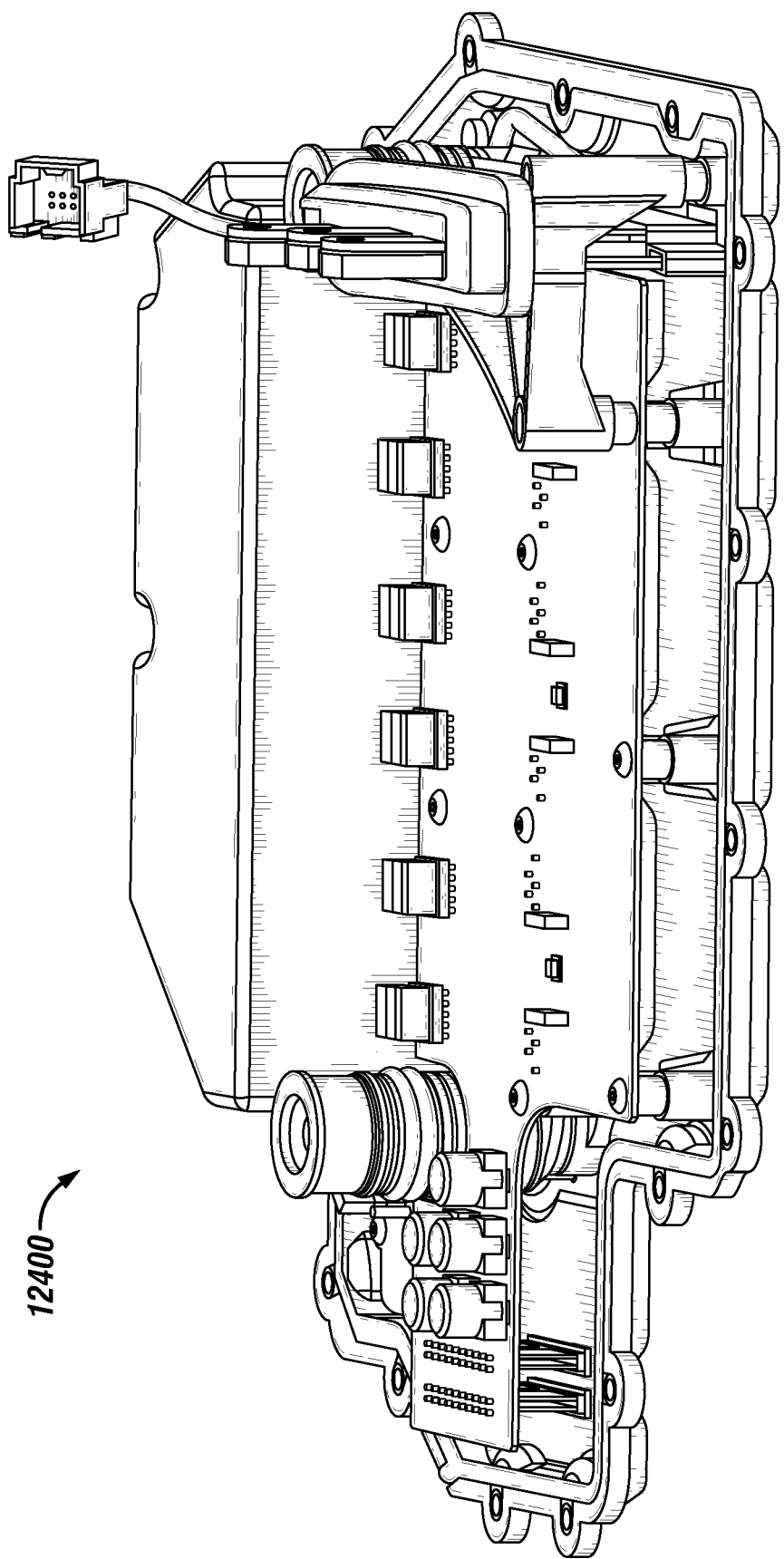
Figure 125:
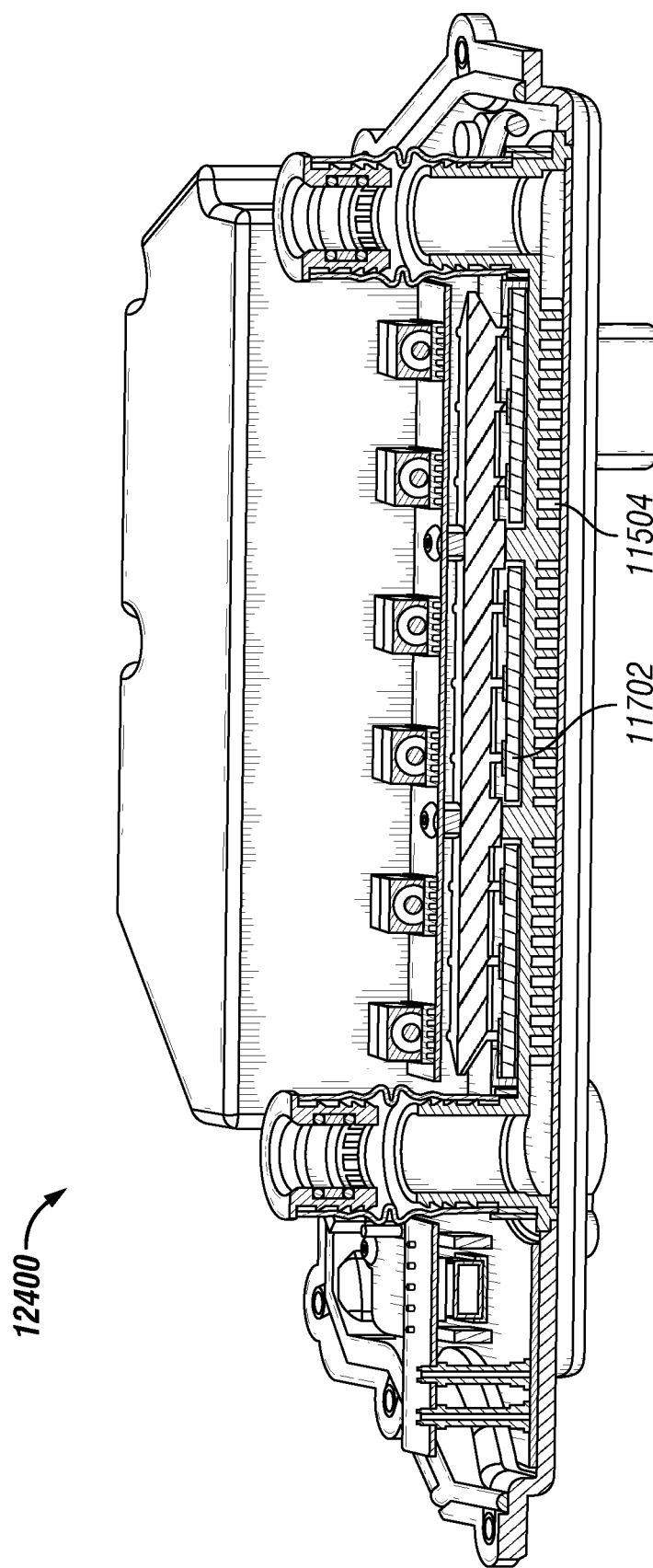
Figure 126:
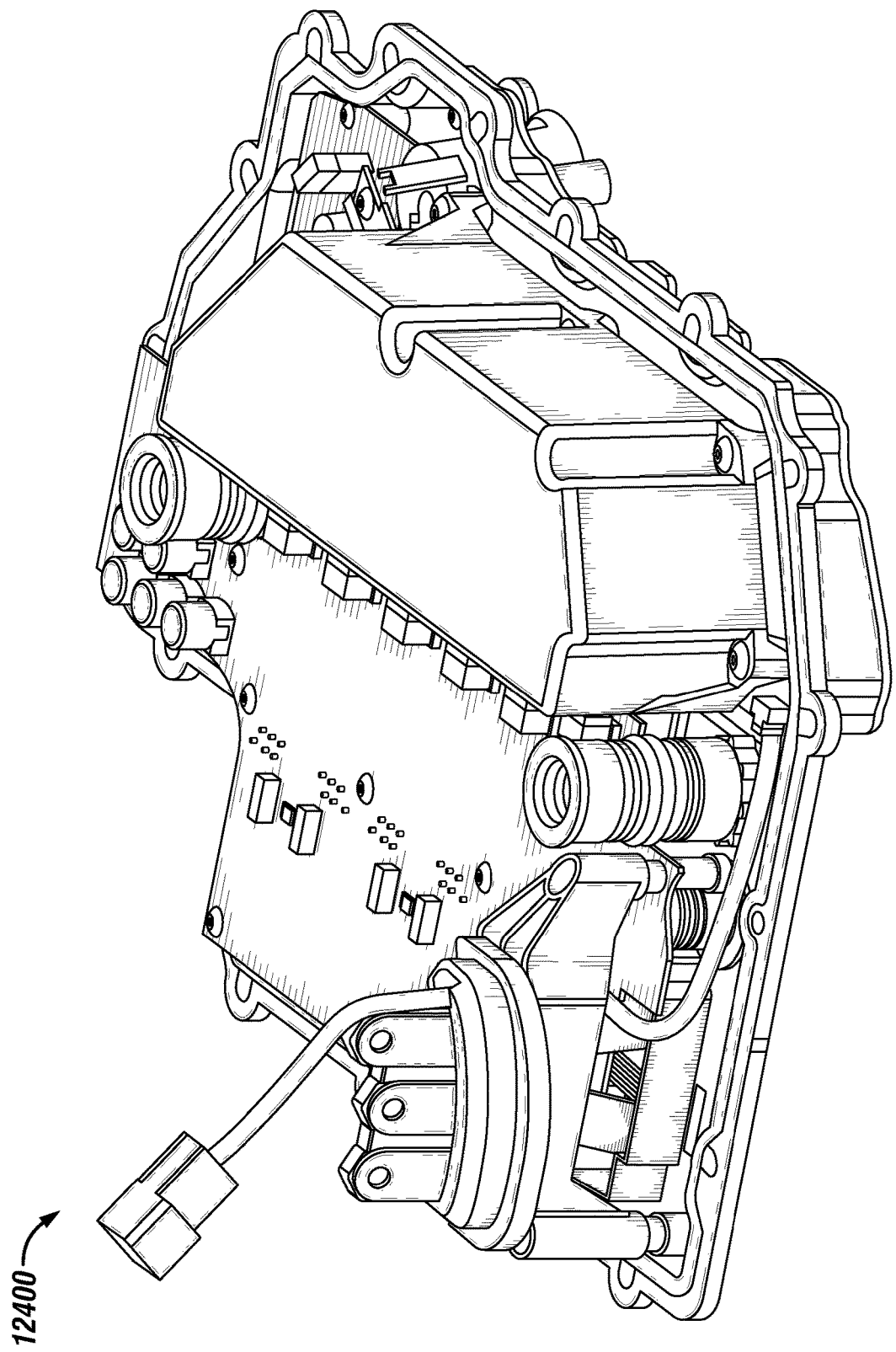
Figure 127:
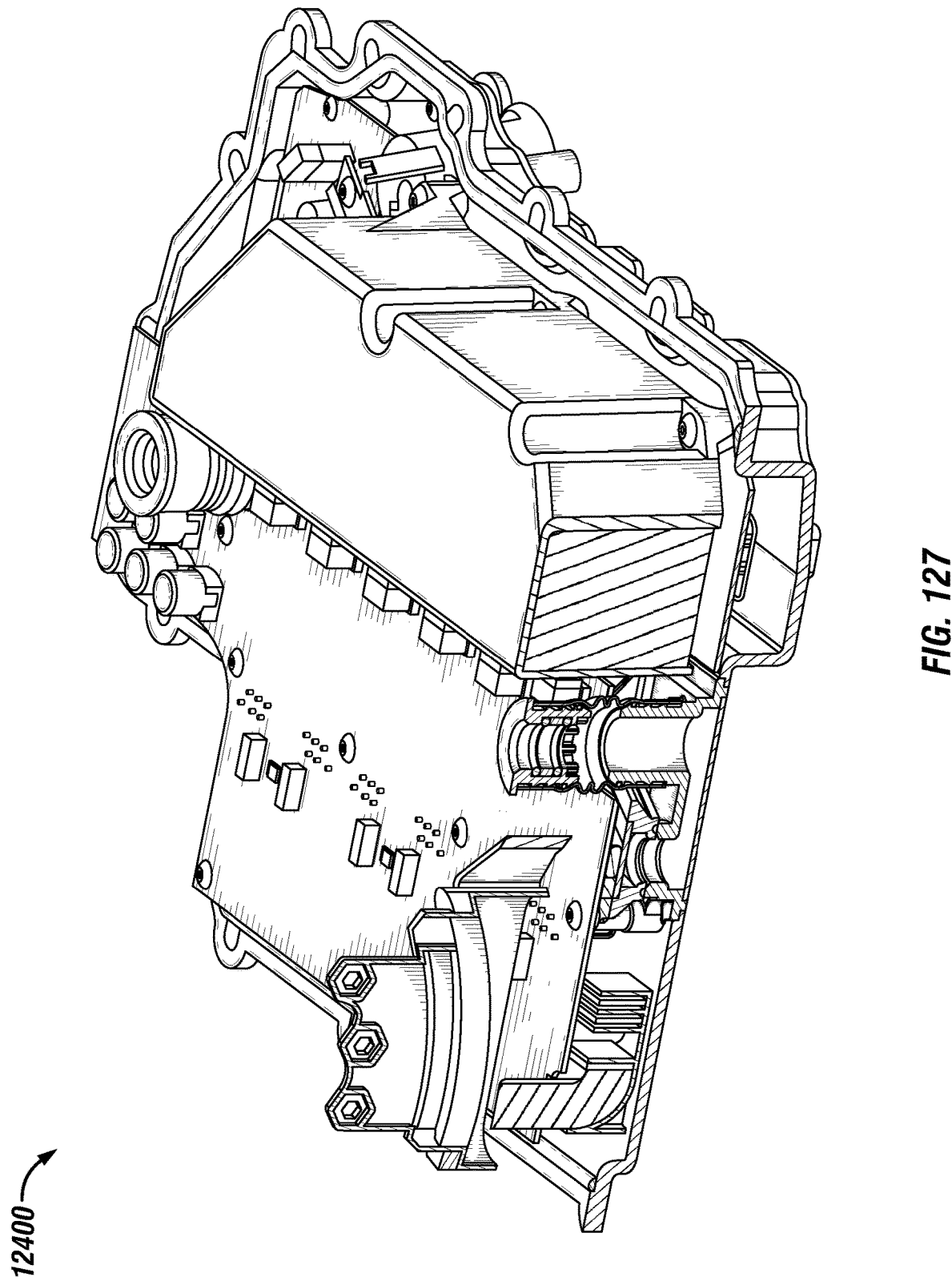
Figure 128:
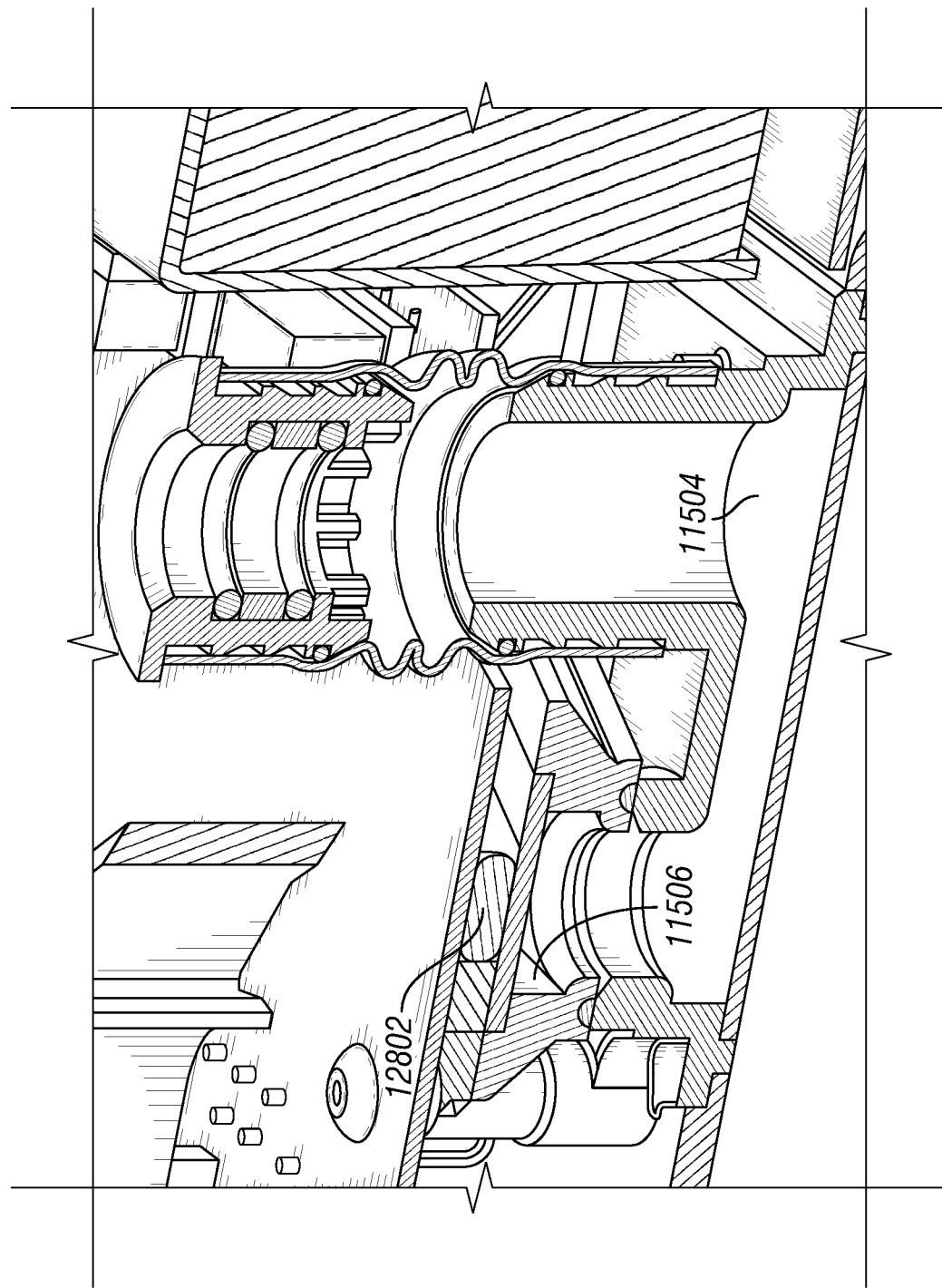

Referencing FIG. 122, a close-up of one corner of the example main cover is depicted. In the example of FIG. 122, a ledge 12204 is provided that provides for controlled compression of the CIPG 12102, through selection of the ledge height and CIPG dispensation (height difference 12202 provides selectable compression), and accordingly provides for ease and reliability in proper installation and sealing of the main cover. Referencing FIG. 123, certain aspects of an example installation for the IGBTs is depicted, with thermal paste 12302 providing thermal coupling for the IGBTs and the PCBs, and with formed-in-place-gaskets 12304 providing reliable sealing for coolant flows between the cooling channels. FIGS. 124-127 depict a number of views of an example embodiment of a main cover portion, with installed components, of an integrated inverter assembly 12400 consistent with various aspects of the present disclosure. Referencing FIG. 125, a lower cooling channel 11504 and side cutaway view of an IGBT 11702 provides an illustrative heat transfer environment for the IGBTs 11702 of the integrated inverter assembly. Referencing FIG. 128, an example embodiment depicts the upper 11506 and lower 11504 cooling channels, with an example location for a temperature sensor 12802 (a thermistor, in the example) which may be utilized, for example, to control active cooling, and/or to monitor the power electronics.

An example IGBT consistent with certain embodiments of the present disclosure is a dual side cooling half-bridge power module, capable of 750V, 800 A operation, and having an operating temperature capability of 175° C. for continuous operation. Certain commercially available FS4 IGBTs using a half-bridge configuration exhibit low losses at light loads, and in certain embodiments are favorable to applications tending to have a low duty cycle, such as passenger car applications.

Figure 129:
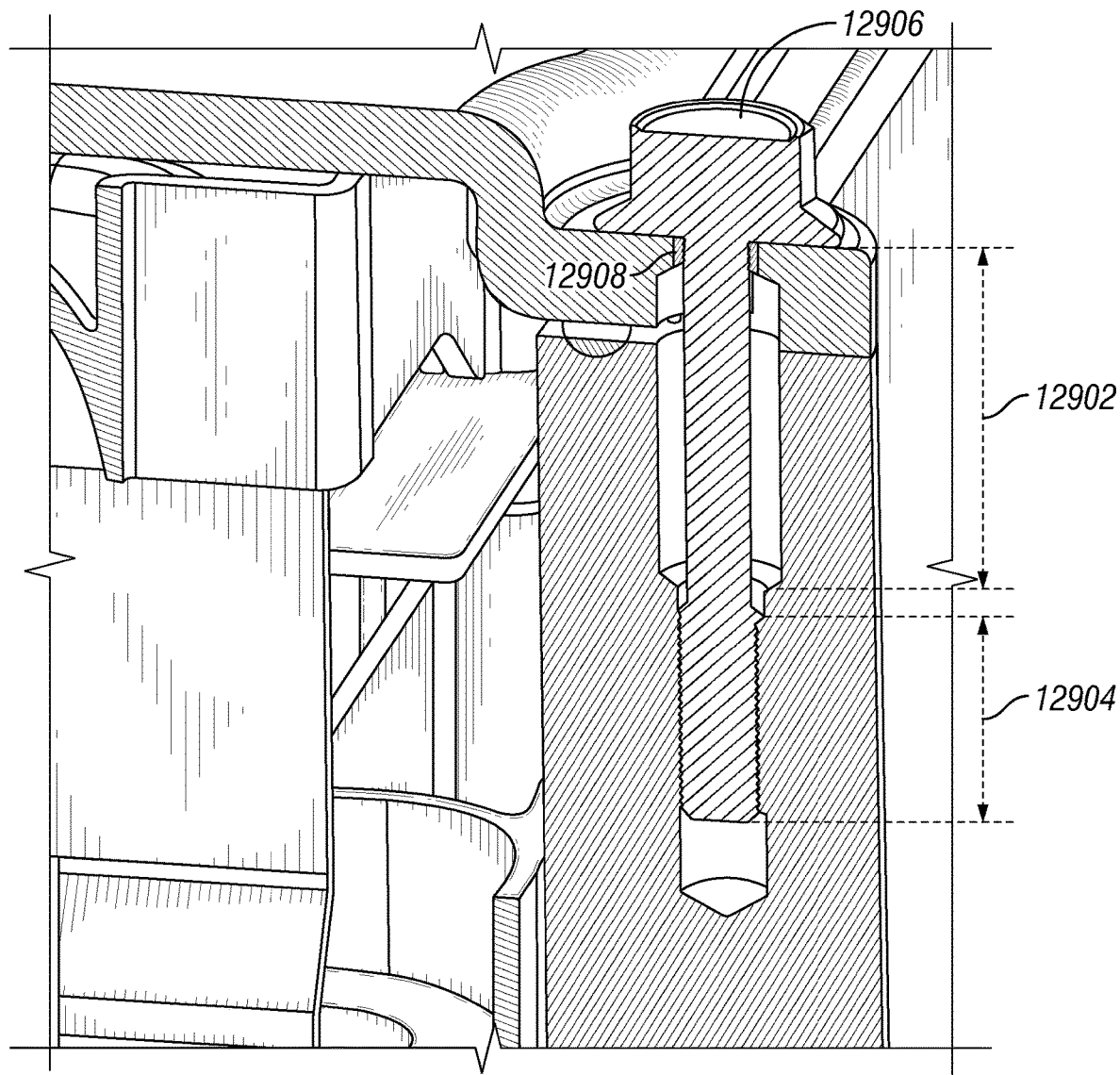
Figure 130:
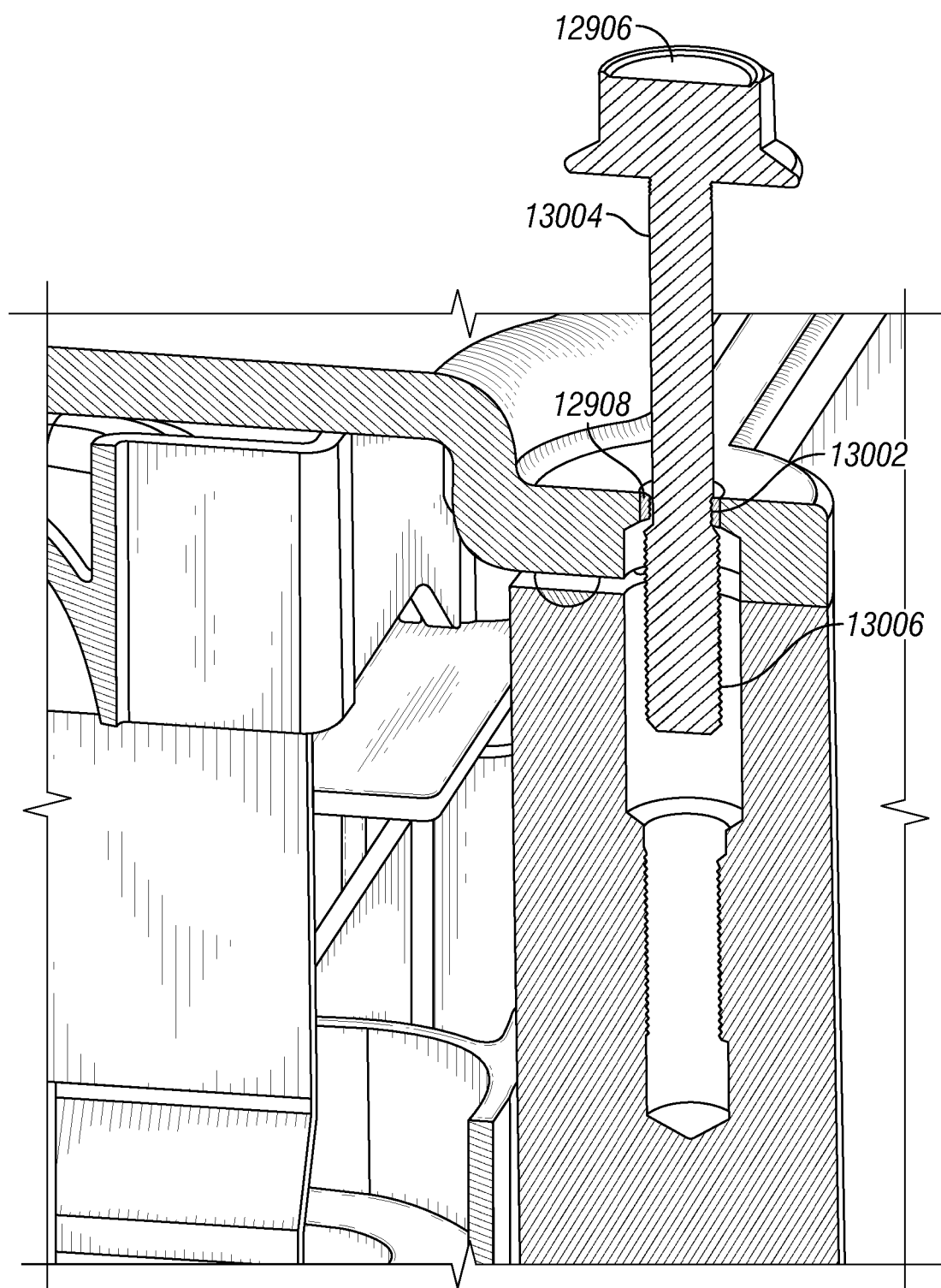

Referencing FIG. 129, an example coupling mechanism for the main cover to the back cover is depicted. The example coupling mechanism includes a threaded area 12908 in the main cover to retain the coupling screw 12906 when disengaged, and where the height 12902 of the unthreaded portion in the motor casting (back cover) is greater than the threaded engagement portion 12904 of the screw 12906. Thus, the screw can be backed into the threaded area 12908 in the main cover, and ensure that the threads remain disengaged from the motor casting. Referencing FIG. 130, the example coupling mechanism includes a reduced diameter portion 13004 for a portion of the coupling screw, providing for a convenient captive screw mechanism. In the example of FIG. 130, the screw main threads 13006 are disengaged from the motor casting, and a second threaded portion 13002 of the screw is engaged with the threaded area 12908 of the main cover. Referencing FIG. 131, a cutaway side view depicting Referencing FIG. 132, a previously known DC Link Capacitor is depicted. The DC Link Capacitor includes a bus bar, common-mode choke, and capacitors (Y-caps) as external elements to the DC Link Capacitor. The bus bar is a laminated bus bar to provide isolation of the three AC phases, and the bus bar external to the DC Link Capacitor housing is required to be as long as the housing, with a full thickness along the length of the housing.

Referencing FIG. 133, an example DC Link Capacitor 11206 is depicted, with the bus bar, common-mode choke, and Y-caps included in the housing of the DC Link Capacitor 11206. The bus bar, choke, and Y-caps are potted within the DC Link Capacitor, providing for a compact design and enhanced mechanical integrity. In certain embodiments, the DC Link Capacitor 11206 of the example in FIG. 133 can be utilized in an integrated inverter assembly 10900 consistent with any other aspect of the present disclosure. The DC Link Capacitor 11206 further includes an IGBT interface 13302 providing power to each of the IGBTs, and a DC interface 13304 providing an interface to DC power, such as to the battery. Referencing FIG. 134, an example embodiment depicts the potted DC Link Capacitor 11206 coupled to the three phases of the AC motor connector through the IGBTs 11702. In the example of FIG. 134, the connections are welded, providing for reduced assembly complexity and reduced contact resistance. In certain embodiments, the utilization of an integrated inverter assembly 10900, with a fixed, small, footprint, and with limited external interfaces to the rest of the vehicle and/or electrical drive system, enables one or both of the potted DC Link Capacitor 11209 and the welded connections—for example by providing a consistent geometric positioning allowing the parts to be assembled using potting and welding without having to arrange or assemble the positioning of the DC Link Capacitor, the bus bar, the common-mode choke, the Y-caps, and/or the spatial arrangement of the IGBTs and AC connector blades. Referencing FIG. 135, another view of the embodiment depicted in FIG. 126, where FIG. 135 is a cutaway view of the embodiment of FIG. 126, and can be used to reference the positioning of the DC Link Capacitor assembly within the example integrated inverter assembly 10900.

Referencing FIG. 136, a previously known quick connector consistent with the SAEJ2044 quick connect coupling standard is depicted. The quick connector of FIG. 136 includes a lock 13608 with a retaining spring, and two internal o-rings 13602 for sealing the fluid coupling. A spacer is provided between the two internal o-rings. The quick connector of FIG. 136 is configured to receive a fluid coupling such as an end piece having an end form (13702) such as that depicted in FIG. 26. The quick connector of FIG. 136 includes ribbing ("fir tree") 13606 on the outer diameter of the tube connection, with an external o-ring 13604 on the tube-side for sealing.

Referencing FIG. 138, a first embodiment of a fluid connector of the present disclosure is depicted. The fluid connector of FIG. 138 does not include a locking element, but is configured to receive an end piece having a standard SAEJ2044 end form. The example fluid connection includes two internal o-rings 13804 and a spacer 13806 therebetween. The connector further includes a shaped receiving portion 13802 and does not include a lock. the connector further includes an external o-ring 13808. In certain embodiments, fluid connections within the integrated inverter assembly 10900 have a tight spacing and poor access (or no access) to portions of a quick connector to manipulate the lock and thereby operate the quick connector. Additionally, in certain embodiments, the integrated inverter assembly 10900 provides for a fixed geometry of fluid coupling positions, which are at least partially internal to the housing of the integrated inverter assembly 10900, and thereby provide for a secure fluid connection without the lock. Accordingly, it can be seen that a quick connector embodiment such as that depicted in FIG. 138, improves and/or enables certain aspects of the integrated inverter assembly 10900.

Referencing FIG. 139, a second embodiment of a fluid connector of the present disclosure is depicted. The fluid connector of FIG. 139 does not include a locking element, but is configured to receive an end piece having a standard SAEJ2044 end form. Additionally, it can be seen that the fluid connector of the example in FIG. 139 omits the right extension, utilizing the housing of the fluid connector to form the ribbing 13902 and support the seal. The fluid connector of the example in FIG. 139 further includes the o-ring 13808 on the outer body. Again referencing FIG. 115, it can be seen that the fluid connector for the coolant outlet depicted in FIG. 115 is consistent with the quick connector embodiment of FIG. 139. It can further be seen that the quick connector depicted in FIG. 139 provides for a greatly reduced vertical footprint of the fluid connection, allowing for a more compact footprint of the integrated inverter assembly. The embodiment of FIG. 115 additionally depicts a hose coupled to the quick connector that provides for compliance in the horizontal and vertical planes (using baffled hose 11502), further enhancing the ease of installation of the coolant connection. It can further be seen that the coolant channel separating body 11604 (e.g. reference FIG. 116) includes an integrated hose nipple configured to couple with the quick connector, thereby further reducing the footprint and the assembly complexity of the integrated inverter assembly 10900. A given embodiment of the integrated inverter assembly 10900 may utilize one or both of the quick connector embodiments of FIGS. 138 and 139, or neither of these.

An example breaker/relay may include a fixed contact electrically coupled to a power bus for a mobile application, a moveable contact selectively electrically coupled to the fixed contact, an armature operationally coupled to the moveable contact, such that the armature in a first position prevents electrical coupling between the moveable contact and the fixed contact, and the armature in a second position allows electrical coupling between the moveable contact and the fixed contact. The example breaker/relay further includes a first biasing member biasing the armature into one of the first position or the second position, a standard on/off circuit having at least two states, wherein the standard on/off circuit in a first state provides an actuating signal and in a second state prevents the actuating signal. Referencing FIG. 40, an example current response circuit 14002 is depicted that may be utilized with any system or to perform any operations described throughout the present disclosure. The example current response circuit 14002, determines a current in the power bus 14004, and further blocks an actuating signal 14006 of the standard on/off circuit in response to the current in the power bus 14006 indicating a high current value 14003. The actuating signal may be provided as an armature position command 14008, where an armature is responsive to the actuating signal to electrically couple the moveable contact to the fixed contact. In embodiments, the mobile application may include at least two electrical current operating regions. The current response circuit 14002 may be further structured to adjust the high current value 14003 in response to an active one of the at least two electrical current operating regions.

Referencing FIG. 141, an example procedure 14100 for opening a contact is schematically depicted. Operations of the procedure 14100 may be performed by any controllers, circuits, and/or hardware arrangements as described throughout the present disclosure, and further may be performed in relation to any of the systems or hardware arrangements described throughout the present disclosure. In an aspect, the procedure 14100 includes an operation 14102 to select contact force for a breaker/relay such that the opening the contacts occurs at a selected current flow value of the electrical current flow through the contacts. The procedure 14100 further includes an operation 14104 to apply a contact force to the moveable contact of the breaker/relay, and an operation 14106 to determine a current value through the contacts. The procedure 14100 further includes an operation 14108 to determine whether the current value exceeds a threshold value, and an operation 14110 to command an armature or actuator to open the contacts in response to the current value exceeding the threshold. The example procedure 14100 further includes an operation 14112 to open the contacts in response to a repulsive force on the contacts—for example as a physical response of the moveable contact at the selected current flow value. In certain embodiments, the operation 14110 may be commenced before the operation 14112. In certain embodiments, the operation 14110 is performed such that the moveable contact does not return to the closed position after the operation 14112 to open the contacts (e.g., relieving the return force of the moveable contact that may otherwise drive the contact back to a closed position after the physical opening operation 14112).

Referencing FIG. 142, an example procedure 14200 for opening a contact is schematically depicted. Operations of the procedure 14200 may be performed by any controllers, circuits, and/or hardware arrangements as described throughout the present disclosure, and further may be performed in relation to any of the systems or hardware arrangements described throughout the present disclosure. The example procedure 14200 includes an operation 14202 to determine a first threshold (for current in an electric load circuit) in response to a first physical current opening value (e.g., based on the opening characteristics for a contactor), an operation 14204 to determine a second threshold in response to a second physical current opening value, an operation 14206 to determine a first current value in a first electric load circuit, and an operation 14208 to determine a second current value in a second electric load circuit. The procedure 14200 further includes an operation 14210 to determine whether the first current value exceeds the first threshold, and/or whether the second current value exceeds the second threshold. The example procedure 14200 includes an operation 14214 to command an armature (or actuator) for the first contactor to open if the first threshold is exceeded, and an operation 14212 to diffuse an arc from the first contact (e.g., using splitter plates and/or a magnet). The example procedure 14200 includes an operation 14216 to command an armature for the second contactor to open if the second threshold is exceeded, and an operation 14218 to diffuse an arc of the second contactor. In certain embodiments, determining the first or second threshold includes providing components configured to provide a selected value for the first or second threshold (e.g., selected contact areas, contact force values, and/or bus bar configurations). In certain embodiments, procedure 14200 is utilized in relation to a system having more than one contactor, where each contactor is separately controllable.

In an aspect, a system may include a housing; a breaker/relay device positioned in the housing, wherein the breaker/relay device may be configured to interrupt a motive power circuit for an electrical vehicle system, where the housing may be disposed on the electrical vehicle system; wherein the breaker/relay device may include a physical opening response portion responsive to a first current value in the motive power circuit, and a controlled opening response portion responsive to a second current value in the motive power circuit; and a precharge circuit electrically coupled in parallel to the breaker/relay device. In embodiments, the precharge circuit may be positioned within the housing. The first current value may be greater than the second current value. The physical opening response portion may include a first biasing member biasing an armature of the breaker/relay device into an open position for a contactor of the motive power circuit, and a selected difference between a first force of the armature closing the contactor and a second force of the first biasing member opening the contactor. The controlled opening response portion may include a current sensor providing a current value through the motive power circuit, and a current response circuit 14304 (reference FIG. 143) structured to command an armature to open a contactor in response to the current value 14314 exceeding the second current value 14316. The breaker/relay device may include a dual-pole breaker/relay device. The breaker/relay device may include a single-pole breaker/relay device. The breaker/relay device may be positioned on one of a high side circuit or a low side circuit of the motive power circuit. The system may further include a pyro-switch device positioned on the other of the high side circuit or the low side circuit.

Referencing FIG. 43, an example system includes a physical opening response adjustment circuit 14302 that determines a first current value adjustment 14312, and adjusts the physical opening response portion in response to the first current value adjustment 14312. The physical opening response adjustment circuit 14302 may be further structured to adjust the physical opening response portion by providing an adjustment implementation command 14310, which may include adjusting a compression of the first biasing member, adjusting the first force (e.g., the force applied by the armature); and/or adjusting the second force (e.g., the force of the compression spring). The physical opening response adjustment circuit 14302 may be further structured to adjust the physical opening response portion in response to an operating condition 14308 of the electrical vehicle system. Example and non-limiting operating conditions 14302 include a time-current profile of the motive power circuit; a time-current trajectory of the motive power circuit; a time-current area value of the motive power circuit; a rate of change of a current value through the motive power circuit; and/or a difference between a current value through the motive power circuit and the second current value.

Referencing FIG. 144, an example procedure 14400 for opening a contact is schematically depicted. Operations of the procedure 14400 may be performed by any controllers, circuits, and/or hardware arrangements as described throughout the present disclosure, and further may be performed in relation to any of the systems or hardware arrangements described throughout the present disclosure. The example procedure 14400 includes an operation 14402 to determine a physical opening response adjustment for a contactor—for example where operating conditions of an electric mobile application indicate that the current flow through a load circuit should be permitted to be increased, or reduced, including during high performance operation, charging operation, and/or emergency operation. The example procedure 14400 further includes an operation 14404 to adjust a physical opening response value for a contactor, and an operation 14406 to determine a current in a load circuit (e.g., a motive power circuit) of the electric mobile application. The example procedure 14400 further includes an operation 14408 to determine whether a current value in the load circuit exceeds a controlled open threshold value, and an operation 14410 to command an armature (or actuator) of the contactor to an open position in response to the current exceeding the controlled open threshold value. In certain embodiments, the controlled open threshold value is distinct from, and may be lower than, the physical open threshold value. The example procedure 14400 further includes an operation 14412 to determine whether the current value exceeds a physical open threshold, and an operation 14414 to open the contacts in response to a repulsive force in the contactor in response to the determination 14412 indicating a YES value. In certain embodiments, operations described throughout the present disclosure to determine whether a physical open current value is exceeded include operation to configure a contactor (e.g., within a breaker/relay) to open at a selected current value, to expose the contactor to a load current, where the contact responds to the load current according to the configuration made in response to the selected current value. The order of determinations 14408, 14412 may be reversed, and/or one or more determinations 14408, 14412 may be omitted. Operations 14402 to determine a physical opening response adjustment may be performed during run-time operations or design-time operations of a system, and similarly operations 14404 to adjust the physical opening response may be performed during run-time operations or design-time operations.

Referencing FIG. 145, an example procedure 14500 for opening a contact is schematically depicted. Operations of the procedure 14500 may be performed by any controllers, circuits, and/or hardware arrangements as described throughout the present disclosure, and further may be performed in relation to any of the systems or hardware arrangements described throughout the present disclosure. The example procedure 14500 includes an operation 14502 to configure a physical response opening portion of a breaker/relay of a mobile power circuit to provide for an opening of the contactor of the breaker/relay based on a physical opening response threshold current. Example and non-limiting operations 14502 include an operation 14502A to select a mass (e.g., of the moving portion of a moveable contact), a Lorentz force area (e.g., contact area, bus bar area in the region of the contact, etc.), and/or to select a contact force (e.g., adjust a strength or number of engaged biasing members, and/or to change an amount of compression on a biasing member, and/or to change a movement position of an actuator for the moveable contact). In certain embodiments, configuring the physical opening response portion may include selecting a bus bar configuration, wherein the bus bar couples two moveable contacts, and wherein the bus bar configuration may include at least one of a bus bar area in proximity to a current providing portion of the mobile power circuit or a positioning of a portion of the bus bar in proximity to the current providing portion of the mobile power circuit. The example procedure 14500 further includes an operation 14504 to operate a moveable contact of the breaker/relay between open and/or closed positions—for example moving to the closed position to allow for power flow through the contactor, and to the open position to prevent power flow through the contactor. The example procedure 14500 further includes an operation 14506 to determine a current value in the mobile power circuit, and an operation 14508 to command the moveable contact to an open position based on a separate current threshold from the physical opening current threshold. In certain embodiments, the separate current threshold utilized in operation 14508 is a lower current threshold than the configured physical opening response threshold current.

In an aspect, referencing FIG. 146, a system may include a vehicle having a motive electrical power circuit 14600 (or power path) between a power source 14601 and a load 14608, and a power distribution unit 14698 having a current protection circuit 14696 disposed in a motive electrical power circuit 14600. an example current protection circuit includes a breaker/relay 14602, a breaker/relay including a fixed contact 14686 electrically coupled to a motive power circuit for a mobile application, a moveable contact 14604 selectively electrically coupled to the fixed contact, and where the moveable contact in a first position allows power to flow through the motive power circuit, and the moveable contact in a second position does not allow power to flow through the motive power circuit, and a physical opening response portion responsive to a current value in the motive power circuit, wherein the physical opening response portion may be configured to move the moveable contact to the second position in response to the current value exceeding a threshold current value. The example current protection circuit 14696 includes a contactor 14604 in parallel with the breaker/relay 14602; a pair of breaker/relays 14602, 14702 in parallel (e.g., reference FIG. 147) and/or a dual pole breaker relay 14602 providing two parallel electrical paths; and/or a breaker/relay 14602 in parallel with a contactor 14604 and a fuse 14802 (e.g. reference FIG. 148). In certain embodiments, the current protection circuit 14696 includes a contactor in series with a breaker/relay.

In an aspect, referencing FIG. 146, a system may include a vehicle having a motive electrical power circuit 14600 (or power path) between a power source 14601 and a load 14608, and a power distribution unit having a current protection circuit 14696 disposed in a motive electrical power circuit 14600. an example current protection circuit includes a breaker/relay 14602, a breaker/relay including a fixed contact electrically coupled to a motive power circuit for a mobile application, a moveable contact selectively electrically coupled to the fixed contact, and where the moveable contact in a first position allows power to flow through the motive power circuit, and the moveable contact in a second position does not allow power to flow through the motive power circuit, and a physical opening response portion responsive to a current value in the motive power circuit, wherein the physical opening response portion may be configured to move the moveable contact to the second position in response to the current value exceeding a threshold current value. The example current protection circuit 14696 includes a contactor 14604 in parallel with the breaker/relay 14602; a pair of breaker/relays 14602, 14702 in parallel (e.g., reference FIG. 147) and/or a dual pole breaker relay 14602 providing two parallel electrical paths; and/or a breaker/relay 14602 in parallel with a contactor 14604 and a fuse 14802 (e.g. reference FIG. 148). In certain embodiments, the current protection circuit 14696 includes a contactor 14604 in series with a breaker/relay 14902 (e.g., reference FIG. 149). The utilization of a breaker/relay in series with a contactor allows the breaker/relay to open the circuit, thereby allowing the contactor to open when the circuit is not powered. The utilization of a breaker/relay in parallel with a contactor allows the contactor to open when the circuit is powered, and to allow the breaker/relay to open the circuit.

The power distribution unit further may include a plurality of breaker/relay devices disposed therein, and wherein the current source circuit 15002 may be further electrically coupled to the plurality of breaker/relay devices, and to sequentially inject a current across each fixed contact of the plurality of breaker/relay devices; and wherein the voltage determination circuit 15006 may be further electrically coupled to each of the plurality of breaker/relay devices (as also depicted in FIG. 146), and further structured to determine at least one of an injected voltage amount and a contactor impedance value for each of the plurality of breaker/relay devices (e.g., voltage drop determinations 15008). The current source circuit 15002 may be further structured to sequentially inject the current across each of the plurality of breaker/relay devices in a selected order of the breaker/relay devices. The current source circuit 15002 may be further structured to adjust the selected order in response to one or more operating conditions 15016 or stored properties 15018 such as: a rate of change of a temperature of each of the fixed contacts of the breaker/relay devices; an importance value of each of the breaker/relay devices; a criticality of each of the breaker/relay devices; a power throughput of each of the breaker/relay devices; and/or a fault condition or a contactor health condition of each of the breaker/relay devices. The current source circuit 15002 may be further structured to adjust the selected order in response to an operating condition 15016 such as a planned duty cycle and/or an observed duty cycle of the vehicle. The current source circuit 15002 may be further structured to sweep the injected current through a range of injection frequencies. The current source circuit 15002 may be further structured to inject the current across the fixed contact at a plurality of injection frequencies. The current source circuit 15002 may be further structured to inject the current across the fixed contact at a plurality of injection voltage amplitudes. The current source circuit 15002 may be further structured to inject the current across the fixed contact at an injection voltage amplitude determined in response to an operating condition 15106 such as a power throughput of the breaker/relay devices. The current source circuit 15002 may be further structured to inject the current across the fixed contact at an injection voltage amplitude determined in response to a duty cycle of the vehicle.

In an aspect, a system may include a vehicle having a motive electrical power path; a power distribution unit including a current protection circuit disposed in the motive electrical power path, the current protection circuit including breaker/relay, the breaker/relay including a fixed contact electrically coupled to a motive power circuit for a mobile application; a moveable contact selectively electrically coupled to the fixed contact, wherein the moveable contact in a first position allows power to flow through the motive power circuit, and the moveable contact in a second position does not allow power to flow through the motive power circuit; and a physical opening response portion responsive to a current value in the motive power circuit, wherein the physical opening response portion may be configured to move the moveable contact to the second position in response to the current value exceeding a threshold current value; a current source circuit 15002 electrically coupled to the breaker/relay and structured to inject a current (injection command 15004) across the fixed contact; and a voltage determination circuit 15006 electrically coupled to the breaker/relay and structured to determine an injected voltage amount and a contactor impedance value (voltage drop determination 15008), wherein the voltage determination circuit 15006 may be structured to perform a frequency analysis operation to determine the injected voltage amount. In embodiments, the voltage determination circuit 15006 may be further structured to determine the injected voltage amount by determining an amplitude of a voltage across the fixed contact at a frequency of interest. The frequency of interest may be determined in response to a frequency of the injected voltage. The current source circuit 15002 may be further structured to sweep the injected current through a range of injection frequencies. The current source circuit 15002 may be further structured to inject the current across the fixed contact at a plurality of injection frequencies. The current source circuit 15002 may be further structured to inject the current across the fixed contact at a plurality of injection voltage amplitudes. The current source circuit 15002 may be further structured to inject the current across the fixed contact at an injection voltage amplitude determined in response to a power throughput of the breaker/relay. The current source circuit 15002 may be further structured to inject the current across the fixed contact at an injection voltage amplitude determined in response to a duty cycle of the vehicle.

Referencing FIG. 152, an example procedure 15200 for configuring an X-in-1 power converter is schematically depicted. Operations of the procedure 15200 may be performed by any controllers, circuits, and/or hardware arrangements as described throughout the present disclosure, and further may be performed in relation to any of the systems or hardware arrangements described throughout the present disclosure. In certain embodiments, the procedure 152 may be utilized with any system having configurable power electronics, a multi-port power converter, an "X" port power converter, and/or an X-in-1 port power converter. The utilization of the terms multi-port, X port, and/or X-in-1 port indicate that a power converter includes one or more ports that can serve distinct power loads and/or power sources with one or more varying electrical characteristics. A configurable power converter may have one or more fixed ports, one or more configurable ports, or combinations of these.

The example procedure 15200 includes an operation to interpret a port electrical interface description (or specification), where the port electrical interface description includes a description of (or a specification of) electrical characteristics for at least one of a plurality of ports of a power converter for an electric mobile application. The example procedure 15200 further includes an operation 15204 to provide solid switch states in response to the port electrical interface description, thereby configuring at least one of an AC inverter or a DC/DC converter to provide power to the at least one of the plurality of ports according to the port electrical interface description. In certain embodiments, operation 15204 provides solid switch states to configure at least one of a rectifier or a DC/DC converter to interface with a power source (e.g., a battery, capacitor, regenerative state of a load, or the like), and/or to configure a port to accept power under certain operating conditions, and to provide power under other operating conditions. Without limitation, configurable electrical characteristics include voltage levels, frequency values, phase values (including a number and arrangement of phases), and/or tolerances to one or more of these.

The example procedure 15200 further includes an operation 15206 to interpret a source/load drive characteristic (e.g., frequency, phase, or other characteristics of an electric motor, motor/generator, or other device), and an operation 15208 to provide a component driver configuration (e.g., gate drivers for an insulated-gate bipolar transistor) in response to the source/load drive characteristic. In certain embodiments, one or more aspects of the procedure 15200 may be performed at various periods in the life cycle of the power converter and/or an electric mobile application having the power converter, such as: design time (e.g., specifying setting for a power converter), at installation time (e.g., configuring settings for the power converter according to a specification and/or needs of a particular installation), as a service operation (e.g., adjusting the configuration as a part of a test, to correct a failed or faulted component, and/or as a diagnostic operation), as a remanufacture operation (e.g., testing and/or confirming operations of the power converter, configuring the power converter to a standard state or a planned state for installation, etc.), as an upfit operation (e.g., providing an electric mobile application with an uprated capability such as a greater power rating, changing of a voltage and/or current rating through a port, addition of power inputs or outputs, changing one of the power inputs or outputs, and/or addition of phases or other capabilities to interface with loads or power sources), at a manufacture time (e.g., configuring settings for the power converter according to a specification and/or needs of a particular installation, testing and/or confirming operations of the power converter, configuring the power converter to a standard state or a planned state for installation, etc.), and/or as an application change operation (e.g., a conversion of an electric mobile platform to a different service operation, duty cycle, and/or the addition or removal of one or more loads or power sources).

Referencing FIG. 153, an example procedure 15300 for integrating a power converter into an electric mobile application is depicted. Operations of the procedure 15300 may be performed by any controllers, circuits, and/or hardware arrangements as described throughout the present disclosure, and further may be performed in relation to any of the systems or hardware arrangements described throughout the present disclosure. The example procedure 15300 includes an operation 15302 to provide a power converter having a number of ports for interfacing to electrical loads and/or sources, an operation 15304 to determine an electrical interface description for an electric mobile application, and an operation 15306 to provide solid state switch states in response to the electrical interface description. The example procedure 15300 further includes an operation 15308 to install the power converter in the electric mobile application, and an operation 15310 to couple coolant ports of the power converter to a cooling system of the electric mobile application. It can be seen that procedure 15300 provides for rapid and low cost integration with a number of electric mobile applications, including both the design and engineering for the integration, as well as simplified installation operations. The example procedure 15300 provides for the capability to meet multiple applications with a single power converter device, and/or with a small number of power converter devices having a similar (or identical) footprint and interface locations. The procedure 15300 further includes the capability to provide for a simple cooling interface to power electronics for the electric mobile application without having a number of cooling connections and cooling fluid routing challenges to provide cooling for multiple power electronics components distributed around the electric mobile application.

Referencing FIG. 154, an example procedure 15400 for adjusting motor operations in response to a motor temperature is schematically depicted. Operations of the procedure 15400 may be performed by any controllers, circuits, and/or hardware arrangements as described throughout the present disclosure, and further may be performed in relation to any of the systems or hardware arrangements described throughout the present disclosure. The example procedure 15400 includes an operation 15402 to operate a motor for an electric mobile application, and an operation 15404 to determine a motor temperature value (e.g., a modeled motor temperature, inferred motor temperature, and/or a motor temperature determined from a virtual sensor). Example operations 15404 to determine the motor temperature include, without limitation, determining and considering parameters such as: a power throughput of the motor, determining a voltage and/or current input value to the motor, adjusting the motor temperature value based on ambient temperature values, determining a motor efficiency value at the current operating conditions (e.g., to separate useful work energy from potentially heat generating energy throughput), and/or utilizing the rates of change of these.

The example procedure 15400 further includes an operation 15406 to determine a sensed temperature value for the motor. Example operations 15406 to determine the sensed motor temperature include, without limitation: determining a temperature from a sensor positioned to provide a temperature representative of the motor, determining a temperature from a sensor positioned to provide a temperature associated with the motor (e.g., having a known offset from the motor temperature, and/or from which the motor temperature can be derived); and/or determining a temperature from a sensor positioned to provide a temperature from which a temperature of interest of the motor is determined. For example, an operation 15406 includes applying a hot spot adjustment correction to the sensed motor temperature (e.g., where a temperature of interest is of a hottest location in the motor, which may not be reflected in a bulk temperature reading by a sensor). In certain embodiments, a hot spot adjustment correction may be calibrated as an offset from a detected temperature (which may be scheduled, e.g., as a function of the detected temperature), and/or from a calibrated relationship between the detected temperature and the hot spot temperature. In certain embodiments, the hot spot adjustment correction may further include dynamic information related to the sensed temperature, such as rates of change of the sensed temperature or power through the motor, and/or integration based parameters of the sensed temperature or power through the motor (e.g., accumulators, time values relative to threshold values, etc.).

The example procedure 15400 further includes an operation 15408 to adjust an operating parameter for the motor in response to the temperature values (e.g., the motor temperature value and the sensed motor temperature value). Example and non-limiting operations 15408 include: adjusting a rating of the motor (e.g., de-rating the motor, allowing greater power output of the motor, adjusting a voltage parameter of the motor to reduce heat production, etc.); adjusting a rating of a load of the electric mobile application (e.g., limiting the requested power and/or torque based on a temperature-induced limitation of the motor); adjusting an active cooling amount for the motor (e.g., engaging active cooling and/or changing a flow rate of active cooling to the motor); and/or adjusting an operating space of the motor based on an efficiency map of the motor (e.g., shifting the motor to a more efficient operating point to reduce heat generation, allowing the motor to operate at a less efficient operating point—for example to allow for a system-level optimization or efficiency routine, etc.).

Referencing FIG. 155, an example procedure 15500 to determine reliability values for the sensed motor temperature value and/or the modeled/estimated motor temperature value is schematically depicted. The procedure 15500 includes an operation 15502 to determine a first reliability value for the motor temperature value (e.g., the modeled, estimated, or virtual motor temperature value) in response to a first operating condition for the motor. For example, a model or estimator may have a valid range, a known relationship to uncertainty based on operating condition regions, and/or depend upon other sensors or determined values having a fault or failure condition. The example procedure 15500 further includes an operation 15504 to determine a second reliability for the sensed motor temperature value. For example, the sensed motor temperature value may have a fault condition or a failure condition for the associated sensor, the sensor may have a time constant that is slower than currently observed temperature changes, and/or the sensor may be saturated, have a low resolution, and/or have a reduced accuracy in certain temperature or other operating conditions. Example and non-limiting operating conditions to determine the first reliability value include: a power throughput of the motor, a rate of change of power throughput of the motor, a defined range value for a model used to determine the motor temperature value; and/or a rate of change of one of the motor temperature value or the effective motor temperature value. Example and non-limiting operating conditions to determine the second reliability value include: a power throughput of the motor, a rate of change of power throughput of the motor, a defined range value for a temperature sensor providing the sensed motor temperature value; a defined temperature-accuracy relationship for a temperature sensor providing the sensed motor temperature value; a response time for a temperature sensor providing the sensed motor temperature value; and a fault condition for a temperature sensor providing the sensed motor temperature value.

The example procedure 15500 further includes an operation 15506 to determine an effective motor temperature value in response to the motor temperature value and the sensed motor temperature value, and in certain embodiments the operation 15506 further determined the effective motor temperature in response to the first reliability value and the second reliability value. An example operation 15506 includes choosing one or the other of the motor temperature value or the sensed motor temperature value as the effective motor temperature value based on the first reliability value and the second reliability value; and/or utilizing one or the other of the motor temperature value or the sensed motor temperature value as a target for the effective motor temperature value based on the first reliability value and the second reliability value (e.g., where the effective motor temperature value is a filtered value moving toward the target). In certain embodiments, the effective motor temperature value, or the target for the effective motor temperature value, use a mixing of the motor temperature value and/or the sensed motor temperature value (e.g., a weighted average as a function of the reliability values). In certain embodiments, for example where one or the other of the motor temperature value or the sensed motor temperature value are utilized to drive the effective motor temperature value, the operation 15506 may further include hysteresis or other processing (e.g., filtering, averaging, rate-limiting, etc.), for example to avoid dithering of the effective motor temperature value. In certain embodiments, procedure 15500 is utilized in combination with procedure 15400—for example utilizing the effective motor temperature value as an input to operation 15408, and adjusting an operating parameter of the motor in response to the effective motor temperature value.

The term a motor temperature value, or a temperature of the motor, should be understood broadly. A motor temperature value may be any temperature value of interest that is related to the motor—for example a hottest position within the motor, a component of the motor that is most prone to failure in response to temperature excursions, a component of the motor that is most prone to affect some other component of the system in response to temperature excursions, and/or a temperature related to the motor that correlates with an effective efficient power conversion of the motor. Example and non-limiting motor temperature values include, without limitation: a winding temperature of the motor, a bus bar temperature for a bus bar providing power to the motor, a connector temperature related to the motor, and/or a hot spot temperature of the motor.

Referencing FIG. 156, in an aspect, an apparatus 15600 may include a motor control circuit 15602 structured to operate a motor for an electric mobile application; an operating conditions circuit 15604 structured to interpret a sensed motor temperature value 15608 for the motor, and further structured to interpret at least motor temperature relevant operating condition 15620 such as: a power throughput of the motor, a voltage input value to the motor, a current input value to the motor, an ambient temperature value; and/or an active cooling amount for the motor. An example apparatus 15600 includes a motor temperature determination circuit 15606 structured to determine a motor temperature value 15614 in response to the motor temperature relevant operating condition(s) 15620. An example motor temperature determination circuit 15606 further determines a motor effective temperature value 15612 in response to the motor temperature value 15614 and the sensed motor temperature value 15608; where the motor control circuit 15602 may be further structured to adjust at least one operating parameter for the motor (e.g., as an updated motor command 15610) in response to the motor effective temperature value 15614. In embodiments, the motor temperature determination circuit 15606 may be further structured to determine a first reliability value for the motor temperature value in response to a first operating condition for the motor and determine a second reliability value for the sensed motor temperature value in response to a second operating condition for the motor (reliability values 15616), and determine the motor effective temperature value 15612 further in response to the reliability values 15616.

The motor temperature determination circuit 15606 may be further structured to use the sensed motor temperature value 15608 as the motor effective temperature value in response to the second reliability value exceeding a threshold value. The motor temperature determination circuit 15606 may be further structured to apply a temperature adjustment 15618 such as an offset component adjustment or a hot spot adjustment to the sensed motor temperature value 15608, and determine the motor effective temperature value 15612 further in response to the adjusted sensed motor temperature value. The motor temperature determination circuit 15606 may be further structured to determine the first reliability value in response to at least one operating condition 15620 such as: the power throughput of the motor, a rate of change of power throughput of the motor, a defined range value for a model used to determine the motor temperature value; and a rate of change of one of the motor temperature value or the effective motor temperature value. The motor temperature determination circuit 15606 may be further structured to determine the second reliability value in response to at least one operating condition 15620 such as: the power throughput of the motor, a rate of change of power throughput of the motor, a defined range value for a temperature sensor providing the sensed motor temperature value; a response time for a temperature sensor providing the sensed motor temperature value; and a fault condition for a temperature sensor providing the sensed motor temperature value. The motor control circuit 15606 may be further structured to adjust at least one operating parameter (e.g., an adjusted motor command 15610) for the motor such as: a rating of the motor, a rating of a load of the electric mobile application; the active cooling amount for the motor, and an operating space of the motor based on an efficiency map of the motor.

In an aspect, a system may include an electric mobile application having a motor and an inverter, wherein the inverter may include a plurality of driving elements for the motor. Referencing FIG. 157, the example system further includes a controller 15700 having a motor control circuit 15702 structured to provide driver commands (driving element commands 15704), and where the plurality of driving elements may be responsive to the driver commands 15704. The controller 15700 further includes an operating conditions circuit 15706 structured to interpret a motor performance request value 15708 such as a power, speed, and/or torque request for the motor. The controller 15700 further includes a driver efficiency circuit 15710 that interprets a driver activation value 15712 for each of the plurality of driving elements of the inverter in response to the motor performance request value 15708, and where the motor control circuit 15702 may be further structured to provide the driver commands 15704 to de-activate at least one of the driving elements for the motor in response to the driver activation value 15712 for each of the plurality of driving elements of the inverter. In embodiments, the motor may include a three-phase AC motor, wherein the plurality of driving elements include six driving elements, and wherein the driver efficiency circuit 15710 provides the driver activation value 15712 to de-activate three of the six driving elements in response to the motor performance request value 15708 being below a threshold value.

Referencing FIG. 158, an example procedure 15800 for selectively de-activating portions of a power inverter for an electric mobile application is depicted. Operations of the procedure 15800 may be performed by any controllers, circuits, and/or hardware arrangements as described throughout the present disclosure, and further may be performed in relation to any of the systems or hardware arrangements described throughout the present disclosure. The example procedure 15800 includes an operation 15802 to provide driver commands to a plurality of driving elements of an inverter electrically coupled to a motor for an electric mobile application, and an operation 15804 to interpret a motor performance request value for the electric mobile application. Example and non-limiting motor performance request values include, without limitation, a power, a speed, and/or or a torque request for a motor powered by the power inverter. The example procedure 15800 further includes an operation 15806 to interpret a driver activation value for each of the plurality of driving elements in response to the motor performance request value. For example, if the motor performance request value includes a power request requiring all of the driving elements (e.g., IGBTs on an inverter) to be active to accommodate the power request, then operation 15806 may determine that the driver activation value for each driving element is "TRUE". In another example, if the motor performance request value includes a power request where only a portion of the driving elements are required to meet the power request, the operation 15806 may include determining whether some of the driving elements may be deactivated. In a further example, the operation 15806 may include determining an efficiency of the driving elements in a first condition (e.g., all driving elements active), and the efficiency of the driving elements in a second condition (e.g., some driving elements inactive), and determining the driver activation values that meet the desired goals (e.g., power conversion efficiency, temperature targets for driving elements, planned life cycle of the driving elements, noise or electrical characteristic requirements of the motor or load, etc.). The example procedure 15800 further includes an operation 15806 to provide driver commands to the driving elements in response to the driver activation values, including deactivating one or more driving elements in response to the driver activation value(s). An example procedure 15800 includes the operation 15806 to deactivate three out of six total driving elements (e.g., retaining capability to support three balanced phases to drive a motor). A further example procedure 15800 includes the operation 15806 to deactivate a first three out of six total driving elements during a first de-activation operation, and de-activating a second three out of the six total driving elements during a second de-activation (e.g., to balance the life cycles of driving elements, to balance heat generation within the inverter over time, to utilize banks of driving elements having distinct capabilities such as power ratings, etc.).

Referencing FIG. 159, an example system 15900 may include an electric mobile application having a plurality of electric motors 15904, 15908, 15912, 15916, each one of the plurality of electric motors operationally coupled to a corresponding one of a plurality of electric loads 15906, 15910, 15914, 15918. The example system 15900 includes four motors coupled to four loads, although a system may include any number of motors coupled to any number of loads, and the motors and loads may have more than one motor for a given load, and/or more than one load for a given motor. The system includes a controller 15902, where the controller 15902 includes (Reference FIG. 160) an application load circuit 16002 structured to interpret an application performance request value 16010; a performance servicing circuit 16004 structured to determine a plurality of motor commands 16020 in response to a motor capability description (motor performance capability 16016), and the application performance request value 16010. The controller 15902 further includes a motor control circuit 16006 structured to provide the plurality of motor commands 16014 to corresponding motors 15904, 15908, 15912, 15916 of the plurality of electric motors; and wherein the plurality of electric motors 15904, 15908, 15912, 15916 may be responsive to the plurality of motor commands 16014. The determined motor commands 16020 may differ from the communicated motor commands 16014, for example to account for system dynamics, rate change limits, and/or other constraints not related to meeting performance requests of the system.

In embodiments, the performance servicing circuit 16004 may be further structured to determine the plurality of motor commands 16020 in response to one of a fault condition or a failure condition 16012 for at least one of the plurality of electric motors, and/or for a component related to one of the plurality of electric motors (e.g., a local inverter, local controller, sensor, and/or the load). The performance servicing circuit 16004 may be further structured to determine the plurality of motor commands 16020 to meet the application performance request value 16010 by at least partially redistributing load requirements from one of the plurality of electric motors having the fault condition or the failure condition 16012, to at least one of the plurality of electric motors having available performance capacity (but which may have a separate fault condition or failure condition 16012). The performance servicing circuit 16004 may be further structured to derate one of the plurality of electric motors in response to the one of the fault condition or the failure condition 16012. The system may further include a first data store 16024 associated with a first one of the plurality of electric motors, a second data store 16026 associated with a second one of the plurality of electric motors, and wherein the controller 15902 further may include a data management circuit 16008 structured to command at least partial data redundancy (e.g., redundant data value(s) 16022) between the first data store 16024 and the second data store 16026, and/or between one of the data stores 16024, 16026, and another data store in the system (not shown) and/or to an external data store. The at least partial data redundancy may include at least one data value selected from the data values consisting of: a fault value, a system state, and a learning component value. The data management circuit 16008 may be further structured to command the at least partial data redundancy in response to one of a fault condition or a failure condition 16012 related to, without limitation, at least one of: one of the plurality of electric motors, an inverter operationally coupled to one of the plurality of electric motors; a sensor operationally coupled to one of the plurality of electric motors; and/or a local controller operationally coupled to one of the plurality of electric motors. The performance servicing circuit 16004 may be further structured to determine the plurality of motor commands 16020 in response to the one of the fault condition or the failure condition 16012, and further in response to data 16022 from the at least partial data redundancy. The performance servicing circuit 16004 may be further structured to suppress an operator notification 16018 of one of a fault condition or a failure condition 16012 in response to a performance capability 16016 of the plurality of electric motors being capable of delivering the application performance request value 16010. The performance servicing circuit 16004 may be further structured to communicate the suppressed operator notification 16018 to at least one of a service tool 16030 or an external controller 16028, wherein the external controller 16028 and/or the service tool 16030 may be at least intermittently communicatively coupled to the controller 15902. The performance servicing circuit 16004 may be further structured to adjust the application performance request value 16010 in response to a performance capability 16016 of the plurality of electric motors being incapable of delivering the application performance request value 16010.

Referencing FIG. 161, an example procedure 16100 for controlling an electric mobile application having a number of distributed motors is schematically depicted. In certain embodiments, the procedure 16100 may be utilized with an electric mobile application having one or more distributed driving elements (e.g., inverters) associated with one or more of the distributed motors, and/or one or more distributed controllers for the inverters and/or motors. The distributed motors may be configured to power various loads within the electric mobile application, and in certain embodiments, more than one motor may be capable to provide power to a particular load (e.g., motors associated with the wheels may be combined to provide overall motive power). Operations of the procedure 16100 may be performed by any controllers, circuits, and/or hardware arrangements as described throughout the present disclosure, and further may be performed in relation to any of the systems or hardware arrangements described throughout the present disclosure. The example procedure 16100 includes an operation 16102 to interpret an application performance request value. Example and non-limiting application performance request values include a motive or load power request, a motive or load torque request, and/or a motive or load speed request. The application performance request may be related to the entire application (e.g., a vehicle speed) and/or any portion of the application (e.g., a pump speed, a fan torque, etc.). The example procedure 16100 includes an operation 16104 to determine a fault and/or failure condition for one or more motors, inverters, and/or local controllers of the electric mobile application. The determination of a fault and/or failure condition may further include determining a capability for the faulted or failed component (e.g., a de-rated motor may still be capable to provide some increment of power, and/or a motor having a failed inverter related to that motor may have some capability to receive power provided by another inverter in the system). In certain embodiments, for example where a motor is related to a local controller for the motor, and the local controller has failed, the motor may nevertheless be able to be controlled by another controller in the system and/or another local controller related to another motor in the system. In certain embodiments, the control of the motor by another controller in the system may be de-rated—for example where the distant controller does not have one or more parameters available such a temperature value, a speed value, or another feedback value for the motor, and/or has a degraded version of any such parameter (e.g., slower, lower resolution, and/or lower certainty), the distant controller may control the motor at a reduced power limit to protect the motor and/or the electric mobile application.

The example procedure 16100 further includes an operation 16106 to determine motor commands in response to a motor capability description (e.g., motor ratings, including de-rates according to fault or failure conditions for related components, and/or due to the type of control such as when a distant controller is operating the motor), the application performance request value, and the fault/failure conditions of the motors. In certain embodiments, operation 16106 includes providing sufficient performance across the available motors such that the application performance request value can be met. In certain embodiments, operation 16106 further includes providing commands to one or more of the motors, local controllers, and/or related inverters in response to the determined motor commands.

In certain embodiments, the procedure 16100 further includes an operation 16108 to command a data redundancy storage operation. For example, critical operating information such as motor or inverter calibrations, operating states, limitations, or the like, may be stored in more than one location. In certain embodiments, the operation 16108 is responsive to fault or failure conditions in the electric mobile application, for example where a local controller, sensor, or other component has a fault or failure condition, the operation 16108 may include commanding data redundancy storage related to the component (or related components) having the fault or failure condition. In certain embodiments, the operation 16108 may include commanding data redundancy storage for components that do not have a fault or failure condition, and further enhancing the data redundancy storage in response to the occurrence of a fault or failure condition. In certain embodiments, the operation 16108 provides for data redundancy storage regardless of the fault or failure condition of components in the electric mobile application. Accordingly, operation 16108 provides for protection from the loss of data in response to the loss of a data storage component (e.g., parameters stored on a local controller), and provides for improved control of components (e.g., inverters and/or motors) if an associated local controller has a fault or failure and is not able to control the related component and/or communicate out control parameters for the local component after the fault or failure. In certain embodiments, data redundancy may include at least one data value selected from the data values consisting of: a fault value, a system state, and a learning component value (e.g., control parameters related to a machine learning operation and/or real-time calibration values). In certain embodiments, operation 16106 includes determining the motor, inverter, or local controller commands in response to the data in the data redundancy storage. The operation 16108 to provide for data redundancy storage includes distributing data in any manner within a data store available beyond the host data store, including at least a data store associated with any one or more of the following: another local controller, a master controller and/or a distributed (e.g., virtual) controller, a powertrain controller, a vehicle controller, and/or an external controller (e.g., a manufacturer server, a fleet server, a cloud-based server, a personal device such as an operator's smart phone, etc.).

The example procedure 16100 includes an operation 16110 to suppress an operator notification (e.g., a warning or maintenance light, a vehicle response based notification, an app-based notification, or the like) of a failure or fault (e.g., as determined in operation 16104) in response to the available motor commands being capable to meet the application performance request value. For example, if a motor derate occurs where the mission of the electric mobile application can still be met (e.g., rated power is achievable, and/or a power request exceeding the current capability of the motors has not occurred or is not likely to occur), then operation 16110 may suppress the operator notification of the fault or failure indication that would normally occur. The example procedure 16100 further includes an operation 16112 to communicate the suppressed operator notifications (and/or the underlying fault or failure condition(s)) to a service tool or external controller. For example, if a motor derate occurs where the mission of the electric mobile application can still be met, the procedure 16100 may include suppressing an operator notification, and notifying an external controller (e.g., a fleet maintenance server, manufacturer server, or other external server) and/or a service tool (e.g., an OBD device connecting to a communications port of the electric mobile application, a Wi-Fi based device in a service shop, etc.). Accordingly, inconvenient and/or expensive service events can be avoided, and/or servicing parties can be notified such that the fault or failure can be addressed at a convenient time and/or when the electric mobile application is already being serviced. In certain embodiments, the procedure 16100 includes an operation (not shown) to receive parameters defining the types of faults and/or failures that can be suppressed from operator notification, and/or performance limits and/or component types (relating to the faults/failures) that can be suppressed from operator notification. Additionally or alternatively, the procedure 16100 includes an operation (not shown) to receive parameters defining the types of faults and/or failures that are to be communicated to an external controller, and/or performance limits and/or component types that are to be communicated to the external controller. Additionally or alternatively, the procedure 16100 includes an operation (not shown) defining operator notification types that should be suppressed (e.g., where one type of operator notification is suppressed and another is executed), and/or the timing or locations of external controller notifications.

The methods and systems described herein may be deployed in part or in whole through a machine having a computer, computing device, processor, circuit, and/or server that executes computer readable instructions, program codes, instructions, and/or includes hardware configured to functionally execute one or more operations of the methods and systems disclosed herein. The terms computer, computing device, processor, circuit, and/or server, as utilized herein, should be understood broadly.

Any one or more of the terms computer, computing device, processor, circuit, and/or server include a computer of any type, capable to access instructions stored in communication thereto such as upon a non-transient computer readable medium, whereupon the computer performs operations of systems or methods described herein upon executing the instructions. In certain embodiments, such instructions themselves comprise a computer, computing device, processor, circuit, and/or server. Additionally or alternatively, a computer, computing device, processor, circuit, and/or server may be a separate hardware device, one or more computing resources distributed across hardware devices, and/or may include such aspects as logical circuits, embedded circuits, sensors, actuators, input and/or output devices, network and/or communication resources, memory resources of any type, processing resources of any type, and/or hardware devices configured to be responsive to determined conditions to functionally execute one or more operations of systems and methods herein.

Network and/or communication resources include, without limitation, local area network, wide area network, wireless, internet, or any other known communication resources and protocols. Example and non-limiting hardware, computers, computing devices, processors, circuits, and/or servers include, without limitation, a general purpose computer, a server, an embedded computer, a mobile device, a virtual machine, and/or an emulated version of one or more of these. Example and non-limiting hardware, computers, computing devices, processors, circuits, and/or servers may be physical, logical, or virtual. A computer, computing device, processor, circuit, and/or server may be: a distributed resource included as an aspect of several devices; and/or included as an interoperable set of resources to perform described functions of the computer, computing device, processor, circuit, and/or server, such that the distributed resources function together to perform the operations of the computer, computing device, processor, circuit, and/or server. In certain embodiments, each computer, computing device, processor, circuit, and/or server may be on separate hardware, and/or one or more hardware devices may include aspects of more than one computer, computing device, processor, circuit, and/or server, for example as separately executable instructions stored on the hardware device, and/or as logically partitioned aspects of a set of executable instructions, with some aspects of the hardware device comprising a part of a first computer, computing device, processor, circuit, and/or server, and some aspects of the hardware device comprising a part of a second computer, computing device, processor, circuit, and/or server.

A computer, computing device, processor, circuit, and/or server may be part of a server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more threads. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer readable instructions on a server, client, firewall, gateway, hub, router, or other such computer and/or networking hardware. The computer readable instructions may be associated with a server that may include a file server, print server, domain server, internet server, intranet server and other variants such as secondary server, host server, distributed server and the like. The server may include one or more of memories, processors, computer readable transitory and/or non-transitory media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, and the like. Additionally, this coupling and/or connection may facilitate remote execution of instructions across the network. The networking of some or all of these devices may facilitate parallel processing of program code, instructions, and/or programs at one or more locations without deviating from the scope of the disclosure. In addition, all the devices attached to the server through an interface may include at least one storage medium capable of storing methods, program code, instructions, and/or programs. A central repository may provide program instructions to be executed on different devices. In this implementation, the remote repository may act as a storage medium for methods, program code, instructions, and/or programs.

The methods, program code, instructions, and/or programs may be associated with a client that may include a file client, print client, domain client, internet client, intranet client and other variants such as secondary client, host client, distributed client and the like. The client may include one or more of memories, processors, computer readable transitory and/or non-transitory media, storage media, ports (physical and virtual), communication devices, and interfaces capable of accessing other clients, servers, machines, and devices through a wired or a wireless medium, and the like. The methods, program code, instructions, and/or programs as described herein and elsewhere may be executed by the client. In addition, other devices utilized for execution of methods as described in this application may be considered as a part of the infrastructure associated with the client.

The client may provide an interface to other devices including, without limitation, servers, other clients, printers, database servers, print servers, file servers, communication servers, distributed servers, and the like. Additionally, this coupling and/or connection may facilitate remote execution of methods, program code, instructions, and/or programs across the network. The networking of some or all of these devices may facilitate parallel processing of methods, program code, instructions, and/or programs at one or more locations without deviating from the scope of the disclosure. In addition, all the devices attached to the client through an interface may include at least one storage medium capable of storing methods, program code, instructions, and/or programs. A central repository may provide program instructions to be executed on different devices. In this implementation, the remote repository may act as a storage medium for methods, program code, instructions, and/or programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules, and/or components as known in the art. The computing and/or non-computing device(s) associated with the network infrastructure may include, apart from other components, a storage medium such as flash memory, buffer, stack, RAM, ROM and the like. The methods, program code, instructions, and/or programs described herein and elsewhere may be executed by one or more of the network infrastructural elements.

The methods, program code, instructions, and/or programs described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like.

The methods, program code, instructions, and/or programs described herein and elsewhere may be implemented on or through mobile devices. The mobile devices may include navigation devices, cell phones, mobile phones, mobile personal digital assistants, laptops, palmtops, netbooks, pagers, electronic books readers, music players, and the like. These mobile devices may include, apart from other components, a storage medium such as a flash memory, buffer, RAM, ROM and one or more computing devices. The computing devices associated with mobile devices may be enabled to execute methods, program code, instructions, and/or programs stored thereon. Alternatively, the mobile devices may be configured to execute instructions in collaboration with other devices. The mobile devices may communicate with base stations interfaced with servers and configured to execute methods, program code, instructions, and/or programs. The mobile devices may communicate on a peer to peer network, mesh network, or other communications network. The methods, program code, instructions, and/or programs may be stored on the storage medium associated with the server and executed by a computing device embedded within the server. The base station may include a computing device and a storage medium. The storage device may store methods, program code, instructions, and/or programs executed by the computing devices associated with the base station.

The methods, program code, instructions, and/or programs may be stored and/or accessed on machine readable transitory and/or non-transitory media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, stand-alone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

Certain operations described herein include interpreting, receiving, and/or determining one or more values, parameters, inputs, data, or other information. Operations including interpreting, receiving, and/or determining any value parameter, input, data, and/or other information include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first operation to interpret, receive, and/or determine a data value may be performed, and when communications are restored an updated operation to interpret, receive, and/or determine the data value may be performed.

Certain logical groupings of operations herein, for example methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g. where the time delay of data for an operation to achieve a certain effect is important), but may not be required before that operation step in other contexts (e.g. where usage of the value from a previous execution cycle of the operations would be sufficient for those purposes). Accordingly, in certain embodiments an order of operations and grouping of operations as described is explicitly contemplated herein, and in certain embodiments re-ordering, subdivision, and/or different grouping of operations is explicitly contemplated herein.

The methods and systems described herein may transform physical and/or or intangible items from one state to another.

The methods and systems described herein may also transform data representing physical and/or intangible items from one state to another.

The elements described and depicted herein, including in flow charts, block diagrams, and/or operational descriptions, depict and/or describe specific example arrangements of elements for purposes of illustration. However, the depicted and/or described elements, the functions thereof, and/or arrangements of these, may be implemented on machines, such as through computer executable transitory and/or non-transitory media having a processor capable of executing program instructions stored thereon, and/or as logical circuits or hardware arrangements. Example arrangements of programming instructions include at least: monolithic structure of instructions; standalone modules of instructions for elements or portions thereof; and/or as modules of instructions that employ external routines, code, services, and so forth; and/or any combination of these, and all such implementations are contemplated to be within the scope of embodiments of the present disclosure Examples of such machines include, without limitation, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements described and/or depicted herein, and/or any other logical components, may be implemented on a machine capable of executing program instructions. Thus, while the foregoing flow charts, block diagrams, and/or operational descriptions set forth functional aspects of the disclosed systems, any arrangement of program instructions implementing these functional aspects are contemplated herein. Similarly, it will be appreciated that the various steps identified and described above may be varied, and that the order of steps may be adapted to particular applications of the techniques disclosed herein. Additionally, any steps or operations may be divided and/or combined in any manner providing similar functionality to the described operations. All such variations and modifications are contemplated in the present disclosure. The methods and/or processes described above, and steps thereof, may be implemented in hardware, program code, instructions, and/or programs or any combination of hardware and methods, program code, instructions, and/or programs suitable for a particular application. Example hardware includes a dedicated computing device or specific computing device, a particular aspect or component of a specific computing device, and/or an arrangement of hardware components and/or logical circuits to perform one or more of the operations of a method and/or system. The processes may be implemented in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and computer readable instructions, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or computer readable instructions described above. All such permutations and combinations are contemplated in embodiments of the present disclosure.

While the methods and systems described herein have been disclosed in connection with certain preferred embodiments shown and described in detail, various modifications and improvements thereon may become readily apparent to those skilled in the art. Accordingly, the spirit and scope of the methods and systems described herein is not to be limited by the foregoing examples, but is to be understood in the broadest sense allowable by law.

All documents referenced herein are hereby incorporated by reference.

What is claimed is:

1. A breaker/relay, comprising
a fixed contact electrically coupled to a motive power circuit for a mobile application;
a movable contact selectively electrically coupled to the fixed contact, wherein the movable contact in a first position allows power to flow through the motive power circuit, and the movable contact in a second position does not allow power to flow through a motive power circuit; and
a physical opening response portion responsive to a current value in the motive power circuit, wherein the physical opening response portion is configured to move the movable contact to the second position in response to the current value exceeding a threshold current value;
a current source circuit electrically coupled to the breaker/relay and structured to inject a current across the fixed contact; and
a voltage determination circuit electrically coupled to the breaker/relay and structured to determine at least one of an injected voltage amount and a contactor impedance value, wherein the voltage determination circuit comprises a high pass filter having a cutoff frequency selected in response to a frequency of the injected current.

2. The breaker/relay of claim 1, wherein the current source circuit is further electrically coupled to a plurality of breaker/relay devices, and to sequentially inject a current across each fixed contact of the plurality of breaker/relay devices; and
wherein the voltage determination circuit is further electrically coupled to each of the plurality of breaker/relay devices, and further structured to determine at least one of an injected voltage amount and a contactor impedance value for each of the plurality of breaker/relay devices.

3. The breaker/relay of claim 2, wherein the current source circuit is further structured to sequentially inject the current across each of the plurality of breaker/relay devices in a selected order of the plurality of breaker/relay devices.

4. The breaker/relay of claim 3, wherein the current source circuit is further structured to adjust the selected order in response to at least one of: a rate of change of a temperature of each of the fixed contacts of the breaker/relay; an importance value of each of the breaker/relay; a criticality of each of the breaker/relay; a power throughput of each of the breaker/relay; and one of a fault condition or a contactor health condition of each of the breaker/relay.

5. The breaker/relay of claim 3, wherein the current source circuit is further structured to adjust the selected order in response to one of a planned duty cycle and an observed duty cycle of a vehicle.

6. The breaker/relay of claim 1, wherein the current source circuit is further structured to sweep the injected current through a range of injection frequencies.

7. The breaker/relay of claim 1, wherein the current source circuit is further structured to inject the current across the fixed contact at a plurality of injection frequencies.

8. The breaker/relay of claim 1, wherein the current source circuit is further structured to inject the current across the fixed contact at a plurality of injection voltage amplitudes.

9. The breaker/relay of claim 1, wherein the current source circuit is further structured to inject the current across the fixed contact at an injection voltage amplitude determined in response to a power throughput of the breaker/relay.

10. The breaker/relay of claim 1, wherein the current source circuit is further structured to inject the current across the fixed contact at an injection voltage amplitude determined in response to a duty cycle of a vehicle.

* * * * *